US012555628B2

(12) United States Patent
Lee et al.

(10) Patent No.: US 12,555,628 B2
(45) Date of Patent: Feb. 17, 2026

(54) MULTI-OUTPUT LOOK-UP TABLE (LUT) FOR USE IN COARSE-GRAINED FIELD-PROGRAMMABLE-GATE-ARRAY (FPGA) INTEGRATED-CIRCUIT (IC) CHIP

(71) Applicant: iCometrue Company Ltd., Zhubei (TW)

(72) Inventors: Jin-Yuan Lee, HsinChu (TW); Mou-Shiung Lin, Hsinchu (TW)

(73) Assignee: iCometrue Company Ltd., Hsinchu County (TW)

( * ) Notice: Subject to any disclaimer, the term of this patent is extended or adjusted under 35 U.S.C. 154(b) by 315 days.

(21) Appl. No.: 17/952,248

(22) Filed: Sep. 24, 2022

(65) Prior Publication Data

US 2023/0095330 A1 Mar. 30, 2023

Related U.S. Application Data

(60) Provisional application No. 63/279,672, filed on Nov. 15, 2021, provisional application No. 63/248,386, filed on Sep. 24, 2021.

(51) Int. Cl.

*G11C 11/418* (2006.01)
*G11C 11/419* (2006.01)
(Continued)

(52) U.S. Cl.

CPC .......... *G11C 11/418* (2013.01); *G11C 11/419* (2013.01); *H01L 21/76898* (2013.01);
(Continued)

(58) Field of Classification Search

CPC ....... G11C 11/418; G11C 11/419; G11C 8/16; G11C 11/412; H01L 21/76898;
(Continued)

(56) References Cited

U.S. PATENT DOCUMENTS

| | | | |
|---|---|---|---|
| 4,870,302 | A | 9/1989 | Freeman |
| 5,272,368 | A | 12/1993 | Turner et al. |

(Continued)

FOREIGN PATENT DOCUMENTS

| | | |
|---|---|---|
| CN | 103681367 | 3/2014 |
| CN | 104078453 | 10/2014 |

(Continued)

*Primary Examiner* — Amir Zarabian
(74) *Attorney, Agent, or Firm* — Min-Lee Teng

(57) ABSTRACT

A semiconductor integrated-circuit (IC) chip comprises a memory cell including: a latch circuit comprising first and second inverters coupling to each other, a first latch node coupling to an input point of the first inverter and an output point of the second inverter and a second latch node coupling to an input point of the second inverter and an output point of the first inverter; a first N-type MOS transistor having a first terminal coupling to the first latch node, a second terminal coupling to a first output point of the memory cell, and a first gate terminal for controlling coupling between the first latch node and the first output point of the memory cell; a second N-type MOS transistor having a third terminal coupling to the second latch node, a fourth terminal coupling to a second output point of the memory cell, and a second gate terminal for controlling coupling between the second latch node and the second output point of the memory cell; and a P-type MOS transistor having a fifth terminal coupling to the first latch node, a sixth terminal coupling to a third output point of the memory cell, and a third gate terminal for controlling coupling between the first latch node and the third output point of the memory cell.

21 Claims, 46 Drawing Sheets

(51) Int. Cl.

| | |
|---|---|
| ***H01L 21/768*** | (2006.01) |
| ***H01L 23/48*** | (2006.01) |
| ***H01L 23/538*** | (2006.01) |
| ***H01L 25/065*** | (2023.01) |
| ***H03K 3/037*** | (2006.01) |
| ***H03K 17/687*** | (2006.01) |
| ***H10B 80/00*** | (2023.01) |

(52) U.S. Cl.
CPC ........ *H01L 23/481* (2013.01); *H01L 23/5384* (2013.01); *H01L 25/0657* (2013.01); *H03K 3/037* (2013.01); *H03K 17/6872* (2013.01); *H03K 17/6874* (2013.01); *H10B 80/00* (2023.02); *H01L 2225/06541* (2013.01)

(58) Field of Classification Search
CPC ............... H01L 23/481; H01L 23/5384; H01L 25/0657; H01L 2225/06541; H03K 3/037; H03K 17/6872; H03K 17/6874; H03K 19/1776; H10B 80/00
USPC .......................................................... 365/154
See application file for complete search history.

(56) References Cited

U.S. PATENT DOCUMENTS

| | | | |
|---|---|---|---|
| 5,587,603 | A | 12/1996 | Kowshik |
| 5,592,102 | A | 1/1997 | Lane et al. |
| 5,689,195 | A | 11/1997 | Cliff et al. |
| 5,796,662 | A | 8/1998 | Kalter et al. |
| 6,020,633 | A | 2/2000 | Erikson |
| 6,034,542 | A | 3/2000 | Ridgeway |
| 6,167,558 | A | 12/2000 | Trimberger |
| 6,356,478 | B1 | 3/2002 | McCollum |
| 6,388,466 | B1 | 5/2002 | Wittig et al. |
| 6,404,226 | B1 | 6/2002 | Schadt |
| 6,687,167 | B2 | 2/2004 | Guaitini et al. |
| 6,798,240 | B1 | 9/2004 | Pedersen |
| 6,812,086 | B2 | 11/2004 | Murthy et al. |
| 6,828,823 | B1 | 12/2004 | Tsui |
| 6,943,580 | B2 | 9/2005 | Lewis et al. |
| 6,952,114 | B2 | 10/2005 | Turner |
| 6,998,872 | B1 | 2/2006 | Chirania et al. |
| 7,030,652 | B1 | 4/2006 | Lewis et al. |
| 7,061,271 | B1 | 6/2006 | Young et al. |
| 7,126,214 | B2 | 10/2006 | Huppenthal |
| 7,190,190 | B1 | 3/2007 | Camarota et al. |
| 7,193,433 | B1 | 3/2007 | Young |
| 7,219,237 | B1 | 5/2007 | Trimberger |
| 7,366,306 | B1 | 4/2008 | Trimberger |
| 7,385,417 | B1 | 6/2008 | Agrawal et al. |
| 7,420,390 | B1 | 9/2008 | Hutton et al. |
| 7,511,299 | B1 | 3/2009 | Alexander et al. |
| 7,550,994 | B1 | 6/2009 | Camarota |
| 7,579,681 | B2 | 8/2009 | Chia et al. |
| 7,598,555 | B1 | 10/2009 | Papworth Parkin |
| 7,653,891 | B1 | 1/2010 | Anderson et al. |
| 7,747,025 | B1 | 6/2010 | Trimberger |
| 7,853,799 | B1 | 12/2010 | Trimberger |
| 7,933,140 | B2 | 4/2011 | Wang et al. |
| 7,944,231 | B2 | 5/2011 | Javerliac |
| 7,948,266 | B2 | 5/2011 | Schmit et al. |
| 7,973,556 | B1 | 7/2011 | Noguera Serra et al. |
| 7,977,783 | B1 | 7/2011 | Park et al. |
| 8,064,224 | B2 | 11/2011 | Mahajan et al. |
| 8,081,079 | B1 | 12/2011 | Camarota |
| 8,159,268 | B1 | 4/2012 | Madurawe |
| 8,243,527 | B2 | 8/2012 | Hung et al. |
| 8,354,297 | B2 | 1/2013 | Pagaila et al. |
| 8,378,407 | B2 | 2/2013 | Audzeyeu et al. |
| 8,531,032 | B2 | 9/2013 | Yu et al. |
| 8,546,955 | B1 | 10/2013 | Wu |
| 8,592,886 | B2 | 11/2013 | Hsu et al. |
| 8,709,865 | B2 | 4/2014 | Hu et al. |
| 8,742,579 | B2 | 6/2014 | Pagaila et al. |
| 8,786,060 | B2 | 7/2014 | Yen et al. |
| 8,796,137 | B2 | 8/2014 | Pagaila et al. |
| 8,866,292 | B2 | 10/2014 | Beer et al. |
| 8,872,349 | B2 | 10/2014 | Chiu et al. |
| 8,878,360 | B2 | 11/2014 | Meyer et al. |
| 8,883,561 | B2 | 11/2014 | Park et al. |
| 8,885,334 | B1 | 11/2014 | Baxter |
| 8,895,440 | B2 | 11/2014 | Choi et al. |
| 8,912,822 | B2 | 12/2014 | Yasuda |
| 8,916,421 | B2 | 12/2014 | Gong et al. |
| 8,941,230 | B2 | 1/2015 | Kyozuka et al. |
| 8,952,489 | B2 | 2/2015 | Elian et al. |
| 8,952,521 | B2 | 2/2015 | Wojnowski et al. |
| 8,987,918 | B2 | 3/2015 | Razdan et al. |
| 8,993,377 | B2 | 3/2015 | Koo et al. |
| 9,003,221 | B1 | 4/2015 | Abugharbieh et al. |
| 9,082,806 | B2 | 7/2015 | Lin et al. |
| 9,106,229 | B1 | 8/2015 | Hutton |
| 9,111,637 | B1 * | 8/2015 | Sahu ..................... G11C 11/417 |
| 9,135,185 | B2 | 9/2015 | Loh et al. |
| 9,147,638 | B2 | 9/2015 | Liu et al. |
| 9,224,647 | B2 | 12/2015 | Koo et al. |
| 9,225,512 | B1 | 12/2015 | Trimberger |
| 9,252,127 | B1 | 2/2016 | Shen et al. |
| 9,263,370 | B2 | 2/2016 | Shenoy et al. |
| 9,281,254 | B2 | 3/2016 | Yu et al. |
| 9,281,292 | B2 | 3/2016 | Hu et al. |
| 9,324,672 | B2 | 4/2016 | Pagaila et al. |
| 9,331,060 | B2 | 5/2016 | Otremba et al. |
| 9,343,442 | B2 | 5/2016 | Chen et al. |
| 9,349,703 | B2 | 5/2016 | Chiu et al. |
| 9,349,713 | B2 | 5/2016 | Kim et al. |
| 9,362,187 | B2 | 6/2016 | Ossimitz |
| 9,368,458 | B2 | 6/2016 | Wu et al. |
| 9,385,006 | B2 | 7/2016 | Lin |
| 9,385,009 | B2 | 7/2016 | Lin et al. |
| 9,385,105 | B2 | 7/2016 | Meyer et al. |
| 9,396,998 | B2 | 7/2016 | Kurita et al. |
| 9,397,050 | B2 | 7/2016 | Shin et al. |
| 9,406,619 | B2 | 8/2016 | Pagaila et al. |
| 9,406,658 | B2 | 8/2016 | Lee et al. |
| 9,437,260 | B2 | 9/2016 | Prenat et al. |
| 9,449,930 | B2 | 9/2016 | Kim et al. |
| 9,455,218 | B2 | 9/2016 | Doi et al. |
| 9,508,626 | B2 | 11/2016 | Pagaila et al. |
| 9,524,955 | B2 | 12/2016 | Huang et al. |
| 9,543,276 | B2 | 1/2017 | Jee et al. |
| 9,583,431 | B1 | 2/2017 | Rahman |
| 9,593,009 | B2 | 3/2017 | Fuergut et al. |
| 9,601,471 | B2 | 3/2017 | Zhai et al. |
| 9,607,967 | B1 | 3/2017 | Shih |
| 9,627,365 | B1 | 4/2017 | Yu et al. |
| 9,640,259 | B2 | 5/2017 | Li et al. |
| 9,679,863 | B2 | 6/2017 | Lin et al. |
| 9,704,843 | B2 | 7/2017 | Kilger et al. |
| 9,722,584 | B1 | 8/2017 | Chang et al. |
| 9,735,113 | B2 | 8/2017 | Chi et al. |
| 9,763,329 | B1 | 9/2017 | Mason |
| 9,768,145 | B2 | 9/2017 | Yu et al. |
| 9,773,757 | B2 | 9/2017 | Yu et al. |
| 9,806,058 | B2 | 10/2017 | Wei et al. |
| 9,812,337 | B2 | 11/2017 | Chen et al. |
| 9,818,720 | B2 | 11/2017 | Wei et al. |
| 9,831,148 | B2 | 11/2017 | Yu et al. |
| 9,859,896 | B1 | 1/2018 | Gaide et al. |
| 9,881,850 | B2 | 1/2018 | Yu et al. |
| 9,887,206 | B2 | 2/2018 | Su et al. |
| 9,893,732 | B1 | 2/2018 | Lewis |
| 9,899,248 | B2 | 2/2018 | Yu et al. |
| 9,899,355 | B2 | 2/2018 | Yuan et al. |
| 9,935,113 | B2 | 4/2018 | Wu et al. |
| 9,966,325 | B2 | 5/2018 | Beyne |
| 9,985,006 | B2 | 5/2018 | Jeng et al. |
| 9,997,464 | B2 | 6/2018 | Hsieh et al. |
| 10,015,916 | B1 | 7/2018 | Karp |
| 10,026,681 | B2 | 7/2018 | Ko et al. |
| 10,033,383 | B1 | 7/2018 | Richter et al. |
| 10,037,963 | B2 | 7/2018 | Chen et al. |

(56) References Cited

U.S. PATENT DOCUMENTS

| | | | |
|---|---|---|---|
| 10,038,647 | B1 | 7/2018 | Lesea |
| 10,043,768 | B2 | 8/2018 | Meyer et al. |
| 10,056,351 | B2 | 8/2018 | Yu et al. |
| 10,056,907 | B1 | 8/2018 | Asnaashari |
| 10,062,648 | B2 | 8/2018 | Hsieh et al. |
| 10,062,651 | B2 | 8/2018 | Liang et al. |
| 10,079,243 | B2 | 9/2018 | Ramkumar |
| 10,109,559 | B2 | 10/2018 | Lin et al. |
| 10,109,588 | B2 | 10/2018 | Jeong et al. |
| 10,109,617 | B2 | 10/2018 | Lee et al. |
| 10,153,222 | B2 | 12/2018 | Yu et al. |
| 10,153,239 | B2 | 12/2018 | Wang et al. |
| 10,157,828 | B2 | 12/2018 | Hsu et al. |
| 10,157,849 | B2 | 12/2018 | Huang et al. |
| 10,162,139 | B1 | 12/2018 | Wang et al. |
| 10,163,798 | B1 | 12/2018 | Alur et al. |
| 10,163,802 | B2 | 12/2018 | Lin et al. |
| 10,177,188 | B2 | 1/2019 | Kang et al. |
| 10,204,684 | B2 | 2/2019 | Widjaja et al. |
| 10,211,070 | B2 | 2/2019 | Lee et al. |
| 10,211,182 | B2 | 2/2019 | Meyer et al. |
| 10,256,219 | B2 | 4/2019 | Chew |
| 10,262,974 | B2 | 4/2019 | Yeh et al. |
| 10,276,382 | B2 | 4/2019 | Hunt et al. |
| 10,290,611 | B2 | 5/2019 | Yu et al. |
| 10,325,882 | B2 | 6/2019 | Kang et al. |
| 10,333,623 | B1 | 6/2019 | Liao et al. |
| 10,340,249 | B1 | 7/2019 | Yu et al. |
| 10,347,606 | B2 | 7/2019 | Yu et al. |
| 10,373,885 | B2 | 8/2019 | Yu et al. |
| 10,419,001 | B2 | 9/2019 | Jo et al. |
| 10,431,536 | B2 | 10/2019 | Kim et al. |
| 10,447,274 | B2 | 10/2019 | Lee et al. |
| 10,476,505 | B2 | 11/2019 | Ngai |
| 10,490,521 | B2 | 11/2019 | Hu et al. |
| 10,490,540 | B2 | 11/2019 | Yu et al. |
| 10,504,835 | B1 | 12/2019 | Wang et al. |
| 10,510,634 | B2 | 12/2019 | Lin et al. |
| 10,510,650 | B2 | 12/2019 | Yu et al. |
| 10,510,721 | B2 | 12/2019 | Bhagavat et al. |
| 10,522,449 | B2 | 12/2019 | Chen et al. |
| 10,529,666 | B2 | 1/2020 | Yu et al. |
| 10,535,638 | B2 | 1/2020 | Yeh et al. |
| 10,541,227 | B2 | 1/2020 | Yeh et al. |
| 10,541,228 | B2 | 1/2020 | Chen et al. |
| 10,622,321 | B2 | 4/2020 | Yu et al. |
| 10,741,537 | B2 | 8/2020 | Lu et al. |
| 10,784,248 | B2 | 9/2020 | Yu et al. |
| 10,797,031 | B2 | 10/2020 | Liao et al. |
| 10,867,965 | B2 | 12/2020 | Shih et al. |
| 10,867,978 | B2 | 12/2020 | Bhagavat et al. |
| 10,892,011 | B2 | 1/2021 | Lin et al. |
| 10,892,291 | B2 | 1/2021 | Chhun et al. |
| 10,943,869 | B2 | 3/2021 | Zhai et al. |
| 11,056,463 | B2 | 7/2021 | Takahashi et al. |
| 11,114,408 | B2 | 9/2021 | Shen et al. |
| 11,211,334 | B2 | 12/2021 | Lin et al. |
| 11,217,368 | B2 | 1/2022 | Choa et al. |
| 11,276,661 | B2 | 3/2022 | Fang |
| 11,545,438 | B2 | 1/2023 | Hsieh et al. |
| 11,587,894 | B2 | 2/2023 | Chen et al. |
| 11,728,254 | B2 | 8/2023 | Hou et al. |
| 2001/0045844 | A1 | 11/2001 | New et al. |
| 2001/0051426 | A1 | 12/2001 | Pozder et al. |
| 2002/0092307 | A1 | 7/2002 | Ghoshal |
| 2003/0122578 | A1 | 7/2003 | Masui et al. |
| 2004/0041584 | A1 | 3/2004 | Sunaga et al. |
| 2004/0145850 | A1 | 7/2004 | Fukumoto et al. |
| 2004/0222817 | A1 | 11/2004 | Madurawe |
| 2005/0046002 | A1 | 3/2005 | Lee et al. |
| 2005/0185457 | A1 | 8/2005 | Kim et al. |
| 2005/0218929 | A1 | 10/2005 | Wang et al. |
| 2006/0138509 | A1 | 6/2006 | Lee et al. |
| 2007/0037379 | A1 | 2/2007 | Enquist et al. |
| 2007/0164279 | A1 | 7/2007 | Lin et al. |
| 2007/0166912 | A1 | 7/2007 | Fenigstein et al. |
| 2007/0279987 | A1 | 12/2007 | Fang et al. |
| 2009/0114971 | A1 | 5/2009 | Cai et al. |
| 2009/0243650 | A1 | 10/2009 | Madurawe |
| 2009/0243652 | A1 | 10/2009 | Dorairaj et al. |
| 2009/0267238 | A1 | 10/2009 | Joseph |
| 2010/0039136 | A1 | 2/2010 | Chua-Eoan et al. |
| 2010/0133704 | A1 | 6/2010 | Marimuthu et al. |
| 2010/0157669 | A1 | 6/2010 | Audzeyeu |
| 2010/0283085 | A1 | 11/2010 | Bemanian |
| 2011/0026232 | A1 | 2/2011 | Lin et al. |
| 2011/0026289 | A1* | 2/2011 | Liaw .................... G11C 11/412 365/51 |
| 2011/0221470 | A1 | 9/2011 | Javerliac et al. |
| 2012/0193785 | A1 | 8/2012 | Lin et al. |
| 2012/0217549 | A1 | 8/2012 | Widjaja |
| 2013/0082399 | A1 | 4/2013 | Kim et al. |
| 2013/0257477 | A1 | 10/2013 | Yasuda et al. |
| 2013/0285253 | A1 | 10/2013 | Aoki et al. |
| 2014/0017882 | A1 | 1/2014 | Lei |
| 2014/0056050 | A1* | 2/2014 | Yang ........................ G11C 7/20 365/103 |
| 2014/0070380 | A1 | 3/2014 | Chiu et al. |
| 2014/0070403 | A1 | 3/2014 | Pan et al. |
| 2014/0112066 | A1 | 4/2014 | Chow et al. |
| 2014/0131858 | A1 | 5/2014 | Pan et al. |
| 2014/0183731 | A1 | 7/2014 | Lin et al. |
| 2014/0185264 | A1 | 7/2014 | Chen et al. |
| 2014/0203412 | A1 | 7/2014 | Wang et al. |
| 2014/0210097 | A1 | 7/2014 | Chen |
| 2014/0254232 | A1 | 9/2014 | Wu |
| 2014/0302659 | A1 | 10/2014 | Phatak |
| 2014/0339692 | A1 | 11/2014 | Kim et al. |
| 2015/0008957 | A1 | 1/2015 | Olgiati et al. |
| 2015/0014844 | A1 | 1/2015 | Wu et al. |
| 2015/0085560 | A1 | 3/2015 | Candelier et al. |
| 2015/0116965 | A1 | 4/2015 | Kim et al. |
| 2015/0227662 | A1 | 8/2015 | Lepercq |
| 2015/0287672 | A1 | 10/2015 | Yazdani |
| 2015/0327367 | A1 | 11/2015 | Shen |
| 2016/0079205 | A1 | 3/2016 | Lin et al. |
| 2016/0093572 | A1 | 3/2016 | Chen |
| 2016/0118390 | A1 | 4/2016 | Liaw |
| 2016/0133571 | A1 | 5/2016 | Lee et al. |
| 2016/0141228 | A1 | 5/2016 | Leobandung |
| 2016/0173101 | A1 | 6/2016 | Gao et al. |
| 2016/0190113 | A1 | 6/2016 | Sharan et al. |
| 2016/0217835 | A1 | 7/2016 | Blott et al. |
| 2016/0351626 | A1 | 12/2016 | McCollum |
| 2016/0372449 | A1 | 12/2016 | Rusu et al. |
| 2017/0071552 | A1 | 3/2017 | Harpe et al. |
| 2017/0117263 | A1 | 4/2017 | Yeh et al. |
| 2017/0271248 | A1 | 9/2017 | Chen et al. |
| 2017/0301650 | A1 | 10/2017 | Yu |
| 2017/0358557 | A1 | 12/2017 | Che et al. |
| 2018/0053730 | A1 | 2/2018 | Shao |
| 2018/0061742 | A1 | 3/2018 | Ananiev |
| 2018/0068937 | A1 | 3/2018 | Marimuthu et al. |
| 2018/0076179 | A1 | 3/2018 | Hsu et al. |
| 2018/0102776 | A1 | 4/2018 | Chandrasekar et al. |
| 2018/0150667 | A1 | 5/2018 | Yu et al. |
| 2018/0151477 | A1 | 5/2018 | Yu et al. |
| 2018/0151501 | A1 | 5/2018 | Yu et al. |
| 2018/0158746 | A1 | 6/2018 | Lin |
| 2018/0165396 | A1 | 6/2018 | Lin et al. |
| 2018/0174865 | A1 | 6/2018 | Yu et al. |
| 2018/0204810 | A1 | 7/2018 | Yu et al. |
| 2018/0204828 | A1 | 7/2018 | Yu et al. |
| 2018/0210799 | A1 | 7/2018 | Gao |
| 2018/0226349 | A1 | 8/2018 | Yu et al. |
| 2018/0226371 | A1 | 8/2018 | Enquist |
| 2018/0247905 | A1 | 8/2018 | Yu et al. |
| 2018/0269188 | A1 | 9/2018 | Yu et al. |
| 2018/0275193 | A1 | 9/2018 | Rouge et al. |
| 2018/0284186 | A1 | 10/2018 | Chadha |
| 2018/0286776 | A1 | 10/2018 | Yu et al. |
| 2018/0301185 | A1* | 10/2018 | Lin ...................... G11C 11/419 |
| 2018/0301351 | A1 | 10/2018 | Yu et al. |
| 2018/0301376 | A1 | 10/2018 | Shih et al. |

(56) References Cited

U.S. PATENT DOCUMENTS

| | | | |
|---|---|---|---|
| 2018/0350629 A1 | 12/2018 | Liu et al. | |
| 2018/0350763 A1 | 12/2018 | Yu et al. | |
| 2018/0358312 A1 | 12/2018 | Yu et al. | |
| 2018/0374824 A1 | 12/2018 | Yu et al. | |
| 2019/0013276 A1 | 1/2019 | Lee et al. | |
| 2019/0019756 A1 | 1/2019 | Yu et al. | |
| 2019/0020343 A1 | 1/2019 | Lin et al. | |
| 2019/0051641 A1 | 2/2019 | Lin et al. | |
| 2019/0057931 A1 | 2/2019 | Hsu et al. | |
| 2019/0057932 A1 | 2/2019 | Wu et al. | |
| 2019/0067152 A1 | 2/2019 | Wuu et al. | |
| 2019/0097304 A1 | 3/2019 | Hsiao et al. | |
| 2019/0129817 A1 | 5/2019 | Zhuo | |
| 2019/0164834 A1 | 5/2019 | Or-Bach et al. | |
| 2019/0221547 A1 | 7/2019 | Drab et al. | |
| 2019/0238134 A1 | 8/2019 | Lin et al. | |
| 2019/0238135 A1 | 8/2019 | Lin et al. | |
| 2019/0245543 A1 | 8/2019 | Lin et al. | |
| 2019/0253056 A1 | 8/2019 | Lin et al. | |
| 2019/0304516 A1* | 10/2019 | Shimizu | G11C 29/52 |
| 2019/0304803 A1 | 10/2019 | Hu et al. | |
| 2019/0333871 A1 | 10/2019 | Chen et al. | |
| 2019/0347790 A1 | 11/2019 | Lin et al. | |
| 2019/0363715 A1 | 11/2019 | Lin et al. | |
| 2019/0371763 A1 | 12/2019 | Agarwal et al. | |
| 2019/0372574 A1 | 12/2019 | Lin et al. | |
| 2020/0006274 A1 | 1/2020 | Chiang et al. | |
| 2020/0043853 A1 | 2/2020 | Kim et al. | |
| 2020/0058617 A1 | 2/2020 | Wu et al. | |
| 2020/0058626 A1 | 2/2020 | Tai et al. | |
| 2020/0082885 A1 | 3/2020 | Lin et al. | |
| 2020/0111734 A1 | 4/2020 | Lin et al. | |
| 2020/0144224 A1 | 5/2020 | Lin et al. | |
| 2020/0161242 A1 | 5/2020 | Lin et al. | |
| 2020/0243422 A1 | 7/2020 | Kim et al. | |
| 2020/0294923 A1 | 9/2020 | Bhagavat et al. | |
| 2020/0373215 A1 | 11/2020 | Wu et al. | |
| 2020/0395350 A1 | 12/2020 | Wu et al. | |
| 2020/0411443 A1 | 12/2020 | Guo et al. | |
| 2021/0005592 A1 | 1/2021 | Lin et al. | |
| 2021/0043557 A1 | 2/2021 | Lin et al. | |
| 2021/0050300 A1 | 2/2021 | Lin et al. | |
| 2021/0090983 A1 | 3/2021 | Lin et al. | |
| 2021/0098051 A1* | 4/2021 | Pao | G11C 11/419 |
| 2021/0159180 A1 | 5/2021 | Zhai et al. | |
| 2021/0217702 A1 | 7/2021 | Dabral et al. | |
| 2021/0232744 A1 | 7/2021 | Lin et al. | |
| 2021/0265335 A1* | 8/2021 | Liaw | G11C 7/1075 |
| 2022/0013504 A1 | 1/2022 | Dabral et al. | |
| 2022/0020729 A1 | 1/2022 | Gao et al. | |
| 2022/0230678 A1* | 7/2022 | Chakraborty | G11C 11/419 |
| 2023/0014913 A1 | 1/2023 | Chen et al. | |
| 2023/0197154 A1* | 6/2023 | Chen | G11C 15/04<br>365/49.11 |
| 2023/0352439 A1 | 11/2023 | Chen et al. | |
| 2023/0352471 A1 | 11/2023 | Yu et al. | |
| 2023/0387038 A1 | 11/2023 | Hsieh et al. | |
| 2024/0014111 A1 | 1/2024 | Han et al. | |

FOREIGN PATENT DOCUMENTS

| | | |
|---|---|---|
| CN | 104282650 | 1/2015 |
| CN | 105745752 | 7/2016 |
| CN | 104064556 | 4/2019 |
| TW | 200623398 | 7/2006 |
| TW | 201413842 | 4/2014 |
| WO | WO00/36748 | 6/2000 |
| WO | WO2005010976 | 2/2005 |
| WO | WO2016160063 | 10/2016 |
| WO | 2018004092 | 1/2018 |

* cited by examiner

2014

2014

300

MULTI-OUTPUT LOOK-UP TABLE (LUT) FOR USE IN COARSE-GRAINED FIELD-PROGRAMMABLE-GATE-ARRAY (FPGA) INTEGRATED-CIRCUIT (IC) CHIP

PRIORITY CLAIM

This application claims priority benefits from U.S. provisional application No. 63/248,386, filed on Sep. 24, 2021 and entitled "MULTICHIP PACKAGE COMPRISING FIELD PROGRAMMABLE IC CHIP BASED ON COARSE-GRAINED RECONFIGURABLE ARCHITECTURE", and U.S. provisional application No. 63/279,672, filed on Nov. 15, 2021 and entitled "LOGIC DRIVE BASED ON MULTICHIP PACKAGE COMPRISING FIELD PROGRAMMABLE IC CHIP AND NON-VOLATILE MEMORY IC CHIP".

BACKGROUND OF THE DISCLOSURE

Field of the Disclosure

The present invention relates to a cryptography method, I/O or control circuits, hard macros and power supply for a programmable logic IC chip in a chip package (including single-chip or multichip package) based on the coarse-grained reconfigurable architecture.

Brief Description of the Related Art

The Field Programmable Gate Array (FPGA) semiconductor integrated circuit (IC) has been used for development of new or innovated applications, or for small volume applications or business demands. When an application or business demand expands to a certain volume and extends to a certain time period, the semiconductor IC supplier may usually implement the application in an Application Specific IC (ASIC) chip, or a Customer-Owned Tooling (COT) IC chip. The switch from the FPGA design to the ASIC or COT design is because the current FPGA IC chip, for a given application and compared with an ASIC or COT chip, (1) has a larger semiconductor chip size, lower fabrication yield, and higher fabrication cost, (2) consumes more power, and (3) gives lower performance. When the semiconductor technology nodes or generations migrate, following the Moore's Law, to advanced nodes or generations (for example below 20 nm), the Non-Recurring Engineering (NRE) cost for designing an ASIC or COT chip increases greatly (more than US $5M or even exceeding US $10M, US $20M, US $50M or US $100M), FIG. 34. The cost of a photo mask set for an ASIC or COT chip at the 16 nm technology node or generation may be over US $1M, US $2M, US $3M, or US $5M. The high NRE cost in implementing the innovation and/or application using the advanced IC technology nodes or generations slows down or even stops the innovation and/or application using advanced and powerful semiconductor technology nodes or generations. A new approach or technology is needed to inspire the continuing innovation and to lower down the barrier for implementing the innovation in the semiconductor IC chips using the advanced and powerful semiconductor technology nodes or generations.

SUMMARY OF THE DISCLOSURE

One aspect of the disclosure provides a logic package, logic package drive, logic device, logic module, logic drive, logic disk, logic storage, logic storage drive, logic disk drive, logic solid-state disk, logic solid-state drive, Field Programmable Gate Array (FPGA) logic disk, or FPGA logic drive (to be abbreviated as "logic drive" or "logic storage" below, that is when "logic drive" is mentioned below, it means and reads as "logic package, logic package drive, logic device, logic module, logic drive, logic disk, logic disk drive, logic storage, logic storage drive, logic solid-state disk, logic solid-state drive, FPGA logic disk, or FPGA logic drive") comprising plural FPGA IC chips for field programming purposes. The logic drive is a standardized commodity device or product formed by a multichip packaging method using one or a plurality of standardized commodity FPGA IC chips or chiplets, one or a plurality of non-volatile memory IC chips and/or one or a plurality of cooperating or supporting (CS) IC chips. In some cases, the logic drive further comprises one or a plurality of volatile memory IC chip in the multichip package. The logic drive is to be used for different specific applications when field programmed or user programmed. The abbreviated "logic drive" may be alternatively referred to as "logic storage", or "logic storage drive".

Another aspect of the disclosure provides a standardized commodity logic drive in a multichip package comprising one or a plurality of standardized commodity FPGA IC chips or chiplets and one or a plurality of non-volatile memory IC chips for use in different algorithms, architectures and/or applications requiring logic, computing and/or processing functions by field programming, wherein data stored in the one or a plurality of non-volatile memory IC chips are used for configuring the one or a plurality of standardized commodity FPGA IC chips or chiplets in the same multichip package. Uses of the standardized commodity logic drive is analogues to uses of a standardized commodity data storage device or drive, for example, solid-state disk (drive), data storage hard disk (drive), data storage floppy disk, Universal Serial Bus (USB) flash drive, USB drive, USB stick, flash-disk, or USB memory, and differs in that the latter has memory functions for data storage, while the former has logic functions for processing and/or computing. The multichip package may be in a 2D format with IC chips disposed on the same horizontal plane or in a 3D stacked format with chips stacked vertically with at least two stacking layers. The multichip package may be in a format with IC chips both disposed in a horizontal plane (the 2D format) and stacked in the vertical direction (the 3D format), wherein the 2D and 3D formats include all types of multichip packages disclosed and specified in this invention, and each of the one or the plurality of non-volatile memory IC chips may comprise NAND flash memory cells, NOR flash memory cells, Magnetoresistive Random Access Memory (MRAM) cells, Resistive Random Access Memory (RRAM) cells, or Ferroelectric Random Access Memory (FRAM) cells, (as described and specified in details below). The standardized commodity logic drive in a multichip package may further comprise one or a plurality of cooperating or supporting (CS) IC chips (as described and specified below), and/or computing and processing units comprising Digital Signal Processor (DSP), Graphic Processing Unit (GPU), Data Processing Unit (DPU), Tensor flow Processing Unit (TPU), Micro-Control Unit (MCU), Artificial Intelligent Unit (AIU), Machine Learning Unit (MLU), and/or Application Specific IC chip (ASIC) (as described and specified below).

Another aspect of the disclosure provides a method to reduce Non-Recurring Engineering (NRE) expenses for implementing (i) an innovation, (ii) an innovation process or application, and/or (iii) accelerating workload processing or application in semiconductor IC chips by using the standardized commodity logic drive, FIG. 34, wherein the standardized commodity logic drive is implemented in the multichip package using the 2D and 3D formats including all types of multichip packages disclosed in this invention. A person, user, or developer with an innovation and/or an application concept or idea or an aim for accelerating workload processing may purchase the standardized commodity logic drive and develop or write software codes or programs to load into the standardized commodity logic drive to implement his/her innovation and/or application concept or idea; wherein said innovation and/or application (maybe abbreviated as innovation below) comprises (i) innovative algorithms and/or architectures of computing, processing, learning and/or inferencing, and/or (ii) innovative and/or specific applications. The developed software codes or programs related to the innovation are used for configuring the one or a plurality of FPGA IC chips in the multichip package, and may be stored in the one or a plurality of non-volatile memory IC chips in the same multichip package. With non-volatile memory cells in the one or a plurality of non-volatile memory IC chips in the multichip package, the logic drive may be used as an alternative of the ASIC chip fabricated using advanced technology nodes. The standard commodity logic drive comprises one or a plurality of FPGA IC chips or chiplets fabricated by advanced technology nodes or generations more advanced than 20 nm or 10 nm using FIN Field Effective Transistors (FINFETs) or Gate-All-Around Field Effective Transistors (GAAFETs). The innovation is implemented in the logic drive by configuring the hardware of FPGA IC chips by altering or changing the data in the 5T or 6T SRAM cells of the programmable interconnection (configurable switches including pass/no-pass switching gates and multiplexers) and/or programmable logic circuits, cells or blocks (including LUTs and multiplexers) therein using the data stored in the non-volatile memory cells in (i) the one or the plurality of non-volatile memory IC chips (in the multichip package using the 2D and 3D formats), and/or, (ii) the one or the plurality of FPGA IC chips in the multichip package. Compared to the implementation by developing a logic ASIC or COT IC chip, implementing the same or similar innovation and/or application using the logic drive may reduce the NRE cost down to smaller than US $1M by developing a software and installing it in the purchased or rented standard commodity logic drive. The standardized commodity logic drive having the configured data or information (for configuring the one or the plurality of FPGA IC chips) non-volatily stored in the non-volatile memory cells in the one or the plurality of non-volatile memory IC chips, and/or in the one or a plurality of FPGA IC chips, the configured standardized commodity logic drive may be sold to a user as an ASIC chip. Alternatively, an un-configured standardized commodity logic drive without the configured data or information (for configuring the one or the plurality of FPGA IC chips) non-volatily stored in the non-volatile memory cells in the one or the plurality of non-volatile memory IC chips, and/or the one or the plurality of FPGA IC chips may be sold to a user directly, and the user may configure/reconfigure the bought standardized commodity logic drive by himself or herself. The aspect of the disclosure inspires the innovation and lowers the barrier for implementing the innovation in IC chips designed and fabricated using an advanced IC technology node or generation, for example, a technology node or generation more advanced than or below 20 nm or 10 nm.

Another aspect of the disclosure provides a "public innovation platform" by using logic drives for innovators to easily and cheaply implement or realize their innovation (algorithms, architectures and/or applications) in semiconductor IC chips fabricated using advanced IC technology nodes more advanced than 20 nm or 10 nm, and for example, using a technology node of 16 nm, 10 nm, 7 nm, 5 nm or 3 nm, FIG. 34. In early days, 1990's, innovators could implement their innovation (algorithms, architectures and/or applications) by designing IC chips and fabricate their designed IC chips in a semiconductor foundry fab using technology nodes at 1 μm, 0.8 μm, 0.5 μm, 0.35 μm, 0.18 μm or 0.13 μm, at a cost of about several hundred thousands of US dollars. The IC foundry fab was then the "public innovation platform". However, when IC technology nodes migrate to a technology node more advanced than 20 nm or 10 nm, and for example to the technology node of 16 nm, 10 nm, 7 nm, 5 nm or 3 nm, only a few giant system or IC design companies, not the public innovators, can afford to use the semiconductor IC foundry fab. It costs about or over 5 million US dollars to develop and implement an IC chip using these advanced technology nodes. The semiconductor IC foundry fab is now not "public innovation platform" anymore, it is "club innovation platform" for club innovators only. The concept of the disclosed logic drives, comprising standard commodity FPGA IC chips or chiplets, provides public innovators "public innovation platform" back to semiconductor IC industry again; just as in 1990's. The innovators can implement or realize their innovation (algorithms, architectures and/or applications) by using logic drives (comprising FPGA IC chips or chiplets fabricated using advanced than 20 nm or 10 nm technology nodes) and writing software programs in common programming languages, for example, C, Java, C++, C#, Scala, Swift, Matlab, Assembly Language, Pascal, Python, Visual Basic, PL/SQL or JavaScript languages, at a cost of less than 500K or 300K US dollars. The innovators can install their developed software using their own standard commodity logic drives or rented standard commodity logic drives in data centers or clouds through networks.

Another aspect of the disclosure provides a method to change the current logic ASIC or COT IC chip business into a commodity logic IC chip business, like the current commodity DRAM, or commodity NAND flash memory IC chip business, by using the standardized commodity logic drive. Since the performance, power consumption, and engineering and manufacturing costs of the standardized commodity logic drive may be better that of the ASIC or COT IC chip for a same innovation (algorithms, architectures and/or applications) or an aim for accelerating workload processing, the standardized commodity logic drive may be used as an alternative for designing an ASIC or COT IC chip. The current logic ASIC or COT IC chip design, manufacturing and/or product companies (including fabless IC design and product companies, IC foundry or contracted manufactures (may be product-less), and/or vertically-integrated IC design, manufacturing and product companies) may become companies like the current commodity DRAM, or NAND flash memory IC chip design, manufacturing, and/or product companies; or like the current DRAM module design, manufacturing, and/or product companies; or like the current flash memory module, flash USB stick or drive, or flash solid-state drive or disk drive design, manufacturing, and/or product companies.

Another aspect of the disclosure provides the standardized commodity logic drive, wherein a person, user, customer, or software developer, or algorithm/architecture/application developer may purchase the standardized commodity logic drive and write software codes to program the logic drive for his/her desired algorithms, architectures and/or applications, for example, in algorithms, architectures and/or applications of Artificial Intelligence (AI), machine learning, deep learning, big data, Internet Of Things (IOT), Virtual Reality (VR), Augmented Reality (AR), car electronics, Graphic Processing (GP), Digital Signal Processing (DSP), Micro Controlling (MC), and/or Central Processing (CP).

Another aspect of the disclosure provides the standardized commodity logic drive for use as an edge device or a personal device for a user or client, wherein the user or client may install or download configuration data or information from developers or suppliers to configure the FPGA IC chips in his or her personal logic drive for applications of Artificial Intelligence (AI), machine learning, deep learning, big data, Internet Of Things (IOT), Virtual Reality (VR), Augmented Reality (AR), car electronics, Graphic Processing (GP), Digital Signal Processing (DSP), Micro Controlling (MC), and/or Central Processing (CP). The installed or downloaded configuration data or information from the developers or suppliers may be based on tiny machine learning algorithm or architecture implemented in ultra-low power machine learning technologies and approaches dealing with machine intelligence at the edge devices of the cloud. The tiny machine learning applications include machine learning architectures, techniques, tools, and approaches capable of performing on-device analytics. As an example, the on-device analytics may use a machine training mode or parameters being pruned as small as possible, and retraining is just updating the machine training model or parameters for a simple training process. The logic drive may be formatted or partitioned for configured applications using methods similar to that of formatting, assigning addresses or locations of a data storage hard disc or solid-state memory disc. The on-device analytics using logic drive at the edge of clouds provides security and privacy for the user or client. The user or client does not need to buy 10 different devices, instead, he or she just needs to buy a logic drive and decide what to install or load onto it for an application, for example, image recognition or speech recognition. When the user or client needs a smart home device, he or she does not need to keep buying new hardware for the new need. One benefit of the on-device analytics using the logic drive is that the user or client does not have to connect with the cloud so your data is private. Each configured application in the edge device (the logic drive with applications installed or downloaded therein) has a model or parameters that becomes personalized by training with the user's or client's data locally.

Another aspect of the disclosure provides a standard commodity FPGA IC chip or chiplet comprising logic blocks. The logic blocks comprise (i) logic gate arrays comprising Boolean logic gates or operators, for example, NAND, NOR, AND, and/or OR logic gates or circuits; (ii) computing units comprising, for examples, adder, multiplication, shift register, floating point circuits, and/or division circuits; (iii) Look-Up-Tables (LUTs) and multiplexers. The Boolean operators, the functions of logic gates, logic operations, or a certain computing, operation or process, if reused from a previous design, may be carried out using hard wired circuits, for example, hard macros (for example, DSP slices for multiplication or division, phase locked loop (PLL) for clock generation, digital clock manager (DCM), floating-point calculator, block static random-access memory (SRAM) cells for cache memory of the logic operation, intellectual property (IP) cores and/or CPU cores based on ARM Cortex processor/controller cores. The ARM Cortex processor/controller cores may be 8, 16, 32, 64-bit or greater than 64-bit Reduced Instruction Set Computing (RISC) ARM processor/controller cores licensed from ARM Holdings. The hard macros are targeted for specific IC manufacturing technology. The hard macros are block level designs which are optimized for power or area or timing and silicon tested. While accomplishing physical design it is possible to only access I/O points of the hard macros unlike soft macros which allows us to manipulate the RTL. The hard macros are blocks that are generated using full custom design methodology and are imported into the physical design database as a Graphic Design System $GDS_2$ file. The hard macros are used in the FPGA IC chip to accelerate the FPGA compilation by reducing the FPGA compilation time. The FPGA compilation time can be reduced by using pre-compiled circuit blocks (hard macros). Hard macros consist of previously synthesized, mapped, placed and routed circuitry that can be relatively placed with short tool runtimes and that make it possible to reuse previous computational effort. In the FPGA IC chip, the hard macro circuits couple to the logic cells or elements to perform a logic, computing or processing function. The field programmable logic cells or elements may be used for the smart interfaces or coupling (including field programmability and artificial intelligent networking) between two of the hard macro circuits on the FPGA IC chip. As an application example, the FPGA IC chip may be used as a Data Process Unit (DPU) when comprising a sea of (i) a plurality of the logic cells or elements which are field programmable, and (ii) a plurality of Central Process Unit (CPU) cores which are hard macros implemented with hard and fixed metal wires, lines or traces; wherein each CPU core is designed using one or a plurality of the ARM Cortex cores based on a Reduced Instruction Set Computing (RISC) architecture, or using a x86 CPU cores based on Complex Instruction Set Computing (CISC) architecture. The number of the plurality of Central Process Unit (CPU) cores may be 4, 8, 16, 32, 64, 128, 256, 512, or greater than 512. A CPU core couples to one or a plurality of the logic cells or elements to perform a computing or processing function. In the DPU (FPGA) IC chip, the logic cells or elements may be used for the smart interfaces or coupling (including field programmability and artificial intelligent networking) between CPU cores of the plurality of CPU cores on the DPU (FPGA) IC chip. The logic cells or elements may be configured to provide smart interfaces, couplings or interactions (including field programmability and artificial intelligent networking) between CPU cores of the plurality of CPU cores on the DPU (FPGA) IC chip. In the DPU (FPGA) IC chip, a logic cell or element couples to first and second CPU cores through first and second interconnection schemes of the DPU (FPGA) IC chip, respectively. That is, the first CPU core couples or interfaces with the second CPU core through, in sequence, the first interconnection scheme, the logic cell or element, and the second interconnection schemes. The DPU IC chip is an embedded-FPGA (e-FPGA) IC chip and becoming a field programmable multi-core CPU, which provides a general-purpose CPU having high parallel computing or processing capability and high flexibility with artificial intelligent networking.

The hard macros couple to an input or output of the logic operator or circuit comprising a look-up table and multiplexer. Alternatively, the Boolean gates, operators or circuits, the functions of logic operators or circuits, or a certain computing, logic operation or logic process may be carried out using, for example, Look-Up-Tables (LUTs) and/or multiplexers. The Look-Up-Tables (LUTs) and/or multiplexers can also be programmed or configured as functions of, for example, DSP, microcontroller, adders, and/or multipliers. The LUTs store or memorize (i) the processing or computing results of logic functions or logic operations, for example, based on logic gates, (ii) computing results of calculations, decisions of decision-making processes, or (iii) results of operations, events or activities, for example, functions of DSP, GPU, DPU, TPU, MCU, MU, MLU and/or ASIC. For example, LUTs and multiplexers may be configured for functions of adders, and/or multipliers. The LUTs can be used to carry out logic functions based on truth tables. In general, a logic gate, or circuit may comprise n inputs, a LUT for storing or memorizing $2^n$ corresponding data, resulting values or results, a multiplexer for selecting the right (corresponding) resulting value or result for the given n-input data set inputting at the n inputs, and 1 output. The LUTs may store or memorize data, resulting values or results in, for example, SRAM cells. The data, resulting values or results for the LUTs in the SRAM cells of the FPGA IC chip may be backed up and stored in the non-volatile memory cells on the FPGA IC chip or in the one or a plurality of non-volatile memory IC chips in a multichip package. One or a plurality of LUTs and multiplexers (the selection circuits) may form a logic cell or element. A FPGA IC chip may comprise one or a plurality of logic arrays each comprises a plurality of logic cells or elements.

The logic cell or element may provide freedom and flexibility to implement logic function or operation, and/or computing or processing. For a first example, the logic cell or element may comprise: (i) a logic operator or circuit comprising (a) first and second basic logic gates or circuits, each comprises a LUT and a multiplexer. Each LUT comprises 8 SRAM cells for storing 8 ($2^3$) resulting values, data or information; and each LUT is followed by a corresponding multiplexer to select a resulting value, data or information from the each LUT according to the three input data of the corresponding multiplexer, as an output data for the each LUT/multiplexer. Each basic logic gate or circuit may be configured as, for example, a NAND, NOR, AND, OR or Exclusive-OR Boolean gate, operator or circuit. Each of the first and second basic logic gates or circuits may have the output data at an output point thereof; (b) a full adder (FA) having two input data (at its input points) from the two output data of the first and second basic logic gates or circuits respectively. The full adder may have a third input point for a carry-in data from another logic cell or element at a prior computing stage. The full adder (FA) comprises two output points, one for an output data of addition computing, and the other one for carry-out for another logic cell or element at a following computing stage; (c) a LUT-selection multiplexer to select one from the two output data of the first and second basic logic gates or circuits as an output data of the LUT-selection multiplexer. The LUT-selection multiplexer comprises two input points for two input data from the two output data of the first and second basic logic gates or circuits, and selects a data from its two input data, according to a control data from an input data of the logic cell or element, as an output data at its output point; (d) an addition-selection multiplexer to select a data path (in the logic cell or element) to go through full adder or not. The addition-selection multiplexer comprises two input points for two input data from the output data of the LUT-selection multiplexer and the full adder, and selects a data from its two input data, according to a configuration data stored in a SRAM cell of the logic cell or element, as an output data at its output point. In summary, the logic operator or circuit in the first example has 5 input data (3 for the two first and second basic logic gates or circuits, 1 for the LUT-selection multiplexer and 1 for the carry-in). The logic operator or circuit in the first example has 2 output data (1 for the logic operator or circuit and 1 for the carry-out). The logic operator or circuit in the first example comprises 16 SRAM cells for storing 16 resulting values for the two LUTs and 1 SRAM cell for the addition-selection multiplexer. (ii) a flip-flop for synchronizing the output of the operator or circuits. The flip-flop has two input points, including a first input point for the output data from the operator or circuit and a second input point for the clock signal, wherein the flip-flop may generate an output data by synchronizing the output of the operator or circuits with the clock signal. (iii) a synchronization-selection multiplexer to select synchronization or asynchronization of the output data of the logic operator or circuit. The synchronization-selection multiplexer comprises two input points, including a first input point for data from the output data of the logic operator or circuit and a second input point for the output data from the flip-flop, and selects a data from its two input data, according to a configuration data stored in a SRAM cell of the logic cell or element, as an output data thereof at its output point. In summary, the logic cell or element in the first example has 6 input data (3 for the two multiplexers for the LUTs, 1 for the LUT-selection multiplexer, 1 for the carry-in and 1 for the clock signal). The logic cell or element in the first example has 2 output data (1 for the logic cell or element and 1 for the carry-out). The logic cell or element in the first example comprises 16 SRAM cells for storing 16 resulting values for the two LUTs, 1 SRAM cell for the addition-selection multiplexer and 1 SRAM cell for the synchronization-selection multiplexer.

For a second example, the logic cell or element may comprise: (i) a logic operator or circuit comprising a basic logic gate or circuit comprising a LUT and a multiplexer. The LUT comprises 16 SRAM cells for storing 16 ($2^4$) resulting values, data or information; and the LUT is followed by a corresponding multiplexer to select a resulting value, data or information from the LUT according to the four input data of the corresponding multiplexer, as an output data of the basic logic gate or circuit. The basic logic gate or circuit may be configured as, for example, a NAND, NOR, AND, OR or Exclusive-OR Boolean gate, circuit or operator. The basic logic gate or circuit may have the output data at an output point thereof. The logic operator or circuit may further comprise an input point for a carry-in data and an output point for a carry-out data; (ii) a cascade circuit comprising, for example, an AND or OR logic gate or circuit to perform an AND or OR logic operation. The cascade circuit has a first input point for the output data of the basic logic gate or circuit and a second input point for a cascade-in data from another logic cell or element at a prior computing stage. The cascade circuit may generate a cascade-out data based on performing the AND or OR logic operation on the two input data at the first and second input points of the cascade circuit; (iii) a flip-flop for synchronizing the cascade-out data. The flip-flop has two input points, including a first input point for the cascade-out data from the cascade circuit and a second input point for the clock signal, wherein the flip-flop may generate an output data by synchronizing the cascade-out data with the clock signal; (iv) a synchronization-selection multiplexer to select synchronization or asynchronization of the cascade-out data of the cascade circuit. The synchronization-selection multiplexer comprises two input points, including a first input point for the cascade-out data of the cascade circuit and a second input point for the output data from the flip-flop, and selects a data from its two input data at its first and second input points, according to a configuration data stored in a SRAM cell of the logic cell or element, as an output data thereof at its output point. The output data at the output point of the synchronization-selection multiplexer is synchronizing with the clock signal. The logic cell or element may further comprise an output point (cascade-out point), wherein the cascade-out data is bypassing the flip-flop and is not synchronizing with the clock signal. The cascade-out point may couple to the second input point for a cascade-in data of the cascade circuit of another logic cell or element in the next computing stage through fixed metal wires, lines or traces. In summary, the logic cell or element in the second example has 6 input data (4 for the LUT and multiplexer, 1 for the carry-in and 1 for the clock signal). The logic cell or element in the second example has 3 output data (1 for the logic cell or element and 1 for the carry-out and 1 for cascade-out). The logic cell or element in the second example comprises 16 SRAM cells for storing 16 resulting values for the LUT and 1 SRAM cell for the synchronization-selection multiplexer.

In the first and second examples, the flip-flop may further comprise a set input point and a reset input point for set and reset data from a set/reset circuit to control setting, resetting or no-change of the flip-flop. The clock signal is controlled by a clock circuit to control on, off or inverse of the clock signal. In the second example, the logic operator or circuit may be a look-up table (LUT) comprising 16 SRAM cells for storing 16 resulting values and a multiplexer to select a resulting value according to four inputs thereof, wherein the look-up table (LUT) and multiplexer may be configured as a full adder.

Another aspect of the disclosure provides a standard commodity FPGA IC chip with programmable interconnection, comprising cross-point switches in the middle of interconnection metal lines or traces. For example, N metal lines or traces are connected to the input terminals of the cross-point switches, and M metal lines or traces are connected to the output terminals of the cross-point switches, and the cross-point switches are located between the N metal lines or traces and the M metal lines and traces. The cross-point switches are designed such that each of the N metal lines or traces may be programmed to connect to anyone of the M metal lines or traces. Each of the cross-point switches may comprise, for example, a pass/no-pass circuit comprising a n-type and a p-type transistor, in pair, wherein one of the N metal lines or traces are connected to the connected source terminals of the N-type and P-type transistor pairs in the pass-no-pass circuit, while one of the M metal lines and traces are connected to the connected drain terminal of the N-type and P-type transistor pairs in the pass-no-pass circuit. The connection or disconnection (pass or no pass) of the cross-point switch is controlled by the data (0 or 1) stored or latched in a SRAM cell. The data for the cross-point switch in the SRAM cells of the FPGA IC chip may be backed up and stored in the non-volatile memory cells in the one or a plurality of non-volatile memory IC chips in a multichip package.

Alternatively, each of the cross-point switches may comprise, for example, a pass/no-pass circuit comprising a switch buffer, wherein the switch buffer comprises two-stages of inverters (buffers), a control N-MOS, and a control P-MOS. Wherein one of the N metal lines or traces is connected to the common (connected) gate terminal of an input-stage inverter of the buffer in the pass-no-pass circuit, while one of the M metal lines and traces is connected to the common (connected) drain terminal of output-stage inverter of buffer in the pass-no-pass circuit. The output-stage inverter is stacked with the control P-MOS at the top (between $V_{cc}$ and the source of the P-MOS of the output-stage inverter) and the control N-MOS at the bottom (between $V_{ss}$ and the source of the N-MOS of the output-stage inverter). The connection or disconnection (pass or no pass) of the cross-point switch is controlled by the data (0 or 1) stored in a 5T or 6T SRAM cell. The data for the cross-point switch in the SRAM cells of the FPGA IC chip may be backed up and stored in the non-volatile memory cells in the one or a plurality of non-volatile memory IC chips in a multichip package.

Alternatively, the cross-point switches may comprise, for example, multiplexers and switch buffers. The multiplexer selects one of the N inputting data from the N inputting metal lines based on the data stored in the 5T or 6T SRAM cells (for the multiplexer); and outputs the selected one of inputs to a switch buffer. The switch buffer passes or does not pass the output data from the multiplexer to one metal line connected to the output of the switch buffer based on the data stored in the 5T or 6T SRAM cells (for the switch buffer). The switch buffer comprises two-stages of inverters (buffer), a control N-MOS, and a control P-MOS. Wherein the selected data from the multiplexer is connected to the common (connected) gate terminal of input-stage inverter of the buffer, while said one of the M metal lines or traces is connected to the common (connected) drain terminal of output-stage inverter of the buffer. The output-stage inverter is stacked with the control P-MOS at the top (between Vcc and the source of the P-MOS of the output-stage inverter) and the control N-MOS at the bottom (between Vss and the source of the N-MOS of the output-stage inverter). The connection or disconnection of the switch buffer is controlled by the data (0 or 1) stored in the 5T or 6T SRAM cell (for the switch buffer). One latched node of the 5T or 6T SRAM cell is connected or coupled to the gate of the control N-MOS transistor in the switch buffer circuit, and the other latched node of the 5T or 6T SRAM cell is connected or coupled to the gate of the control P-MOS transistor in the switch buffer circuit. The data for the multiplexer and the switch buffer in the SRAM cells of the FPGA IC chip may be backed up and stored in the non-volatile memory cells in the one or a plurality of non-volatile memory IC chips in a multichip package.

Another aspect of the disclosure provides a method and device enabling innovators in to realize or implement their innovation using the advanced semiconductor technology nodes (for example, more advanced than 20 nm or 10 nm), without a need to develop an expensive ASIC or COT chip using the advanced semiconductor technology nodes. The method provides a logic drive in a multichip package comprising one or a plurality of standard commodity FPGA IC chips and one or a plurality of NVM IC chips. Each of the one or a plurality of standard commodity FPGA IC chips comprising an encryption/decryption circuit (cryptography circuit or a security circuit). The hardware of circuits of the cryptography circuits provides a cryptography method for the innovators (the FPGA developers) to protect their developed software or firmware for implementing their innovation or applications. As described above, the innovators may implement their innovation, architecture, algorithm and/or applications by configuring the data or information in the memory cells (for example, SRAM cells) of LUTs for logic operations and/or of configurable switches for programmable interconnections in the one or the plurality of FPGA chips. The encrypted configuration data or information for the FPGA IC chip may be input or loaded from outside of the FPGA IC chip, for example, from a NAND or NOR flash IC chip packaged in the same logic drive, or may be from circuits or devices outside of the logic drive. A cryptography technique is required to protect the developed configuration data or information (related to the innovation, architecture, algorithm and/or applications) for the one or a plurality of FPGA IC chips in the logic drive. The logic drive in the multichip package becomes a nonvolatile programmable device with security when comprising (i) one or a plurality of NVM IC chips to store and back the configuration data for configuring the one or a plurality of standard commodity FPGA IC chips in the same multichip package; and (ii) the one or a plurality of standard commodity FPGA IC chips comprising the cryptography or security circuits.

Another aspect of the disclosure provides a standard commodity FPGA IC chip comprising an encryption/decryption circuit (cryptography circuit or a security circuit), wherein the encryption/decryption circuit comprises a cryptography cross-point switch in a matrix format in the middle of interconnection metal lines or traces. The hardware of circuits of the cryptography cross-point switches in a matrix format provides a cryptography method for FPGA developers to protect their developed software or firmware for implementing their innovation or applications. As described above, the innovators may implement their innovation, architecture, algorithm and/or applications by configuring the data or information in the memory cells (for example, SRAM cells) of LUTs for logic operations and/or cross-point switches for programmable interconnections in the FPGA chips. The configuration data or information for a FPGA IC chip may be input or loaded from outside of the FPGA IC chip, for example, from a NAND or NOR flash IC chip packaged in the same logic drive, or may be from circuits or devices outside of the logic drive. A cryptography technique is required to protect the developed configuration data or information (related to the innovation, architecture, algorithm and/or applications) for a FPGA IC chip. For example, the stream of configuration data or information is input into the FPGA IC chip through N I/O pads/circuits. There are N metal lines or traces each coupling to one of the N I/O pads/circuits. The N metal lines or traces are connected to the input terminals of the cryptography cross-point switch matrix, and M metal lines or traces are connected to the output terminals of the cryptography cross-point switch matrix, and the cryptography cross-point switches are located between the N metal lines or traces and the M metal lines and traces, wherein N=M. The cryptography cross-point switches are designed such that each of the N metal lines or traces may be programmed to connect to one and only one of the M metal lines or traces. The cryptography cross-point switches are bi-directional, the signals or data may propagate in the reverse direction, that is, from the output terminal of the cryptography cross-point switches to the input terminals of the cryptography cross-point switches. The cryptography cross-point switch matrix re-organizes the order or sequence of the input signals or data at its outputs based on the on-off (pass/no-pass) state of the cryptography cross-point switch at the intersection of an input interconnect and an output interconnect, wherein the on-off (pass/no-pass) state of the cryptography cross-point switch is controlled by the data or information stored in the corresponding non-volatile memory cell. The corresponding non-volatile memory cell may be the floating-gate non-volatile memory cell, the FGMOS NVM cell, as the three types of FGMOS NVM cells described above. Alternatively, the corresponding non-volatile memory cell may be the MRAM cell, as the two types of MRAM cells (STT MRAM or SOT MRAM) as described above. Alternatively, the corresponding non-volatile memory cell may be a Resistive Random Access Memory cell, abbreviated as "RRAM" cell, for non-volatile storage of data or information for configuring or controlling the cryptography circuits. The data or information of the corresponding non-volatile memory cells may be used as a password or a key to encrypt or decrypt the signal and data stream at two terminals of the cryptography cross-point switch matrix. The data or information stored in the nonvolatile memory cells for use in controlling the pass/no-pass of the cryptography cross-point switches is the password or key for the FPGA IC chip. The encrypted N input signals or data stream are inputting to the cryptography cross-point switch matrix, and are decrypted by the cryptography cross-point switch matrix, and are output as the decrypted M output signals or data stream for use as configuration data or information to program the SRAM cells in the LUTs (for logic operations) or programmable interconnection of a FPGA IC chip. In a reverse direction, the decrypted signals or data stream from the SRAM cells in the LUTs (for logic operations) or programmable interconnection of a FPGA IC chip are input at the M metal lines or traces and encrypted by the cryptography cross-point switch matrix, and are output as encrypted signals or data stream at the N metal lines or traces for circuits outside the FPGA IC chip. The cryptography cross-point switches may be represented by a N×N matrix. For a case that the cryptography cross-point switches in a N×N matrix format, there are (N!-1) possible choices or selections of the passwords or keys. For N=8, there are 40,319 (=8!-1) possible passwords or keys. The key or password comprises $N^2$ ($8^2$) bits of data stored in the on-chip non-volatile memory cells, for example FGMOS non-volatile memory cells, MRAM memory cells, RRAM memory cells or FRAM cells.

Another aspect of the disclosure provides a standard commodity FPGA IC chip comprising an encryption/decryption circuit (cryptography circuit or a security circuit), wherein the encryption/decryption circuit comprises a cryptography inverter in a N×1 or 1×N matrix in the middle of interconnection metal lines or traces. The hardware of circuits of the cryptography inverters in a N×1 or 1×N matrix format provides a cryptography method for FPGA developers to protect their developed software or firmware for implementing their innovation or applications. As described above, the innovators may implement their innovation, architecture, algorithm and/or applications by configuring the data or information in the memory cells (for example, SRAM cells) of LUTs for logic operations and/or switches for programmable interconnections in the FPGA chips. The configuration data or information for a FPGA IC chip may be input or loaded from outside of the FPGA IC chip, for example, from a NAND or NOR flash IC chip packaged in the same logic drive, or may be from circuits or devices outside of the logic drive. A cryptography technique is required to protect the developed configuration data or information (related to the innovation, architecture, algorithm and/or applications) for a FPGA IC chip. For example, the configuration data or information is input into the FPGA IC chip through N I/O pads/circuits. There are N metal lines or traces each coupling to one of the N I/O pads/circuits. The N metal lines or traces are connected to the input terminals of the cryptography inverter matrix, and M metal lines or traces are connected to the output terminals of the cryptography inverter matrix, and the cryptography inverters are located between the N metal lines or traces and the M metal lines and traces, wherein N=M. The cryptography inverters are designed such that each of the N metal lines or traces may be programmed to have input signals or data from the N metal lines inverted or non-inverted at the output to the corresponding one of the M metal lines or traces. The cryptography inverters are bi-directional, the signals or data may propagate in the reverse direction, that is, from the output terminal of the cryptography inverter matrix to the input terminals of the cryptography inverter matrix. The cryptography inverter matrix re-configures the states of the input signals or data at its outputs based on the inverted state or non-inverted state of the cryptography inverter, wherein the inverted or non-inverted state of the cryptography inverter is controlled by the data or information stored in the corresponding non-volatile memory cell. The corresponding non-volatile memory cell may be the floating-gate non-volatile memory cell, the FGMOS NVM cell, as described above. Alternatively, the corresponding non-volatile memory cell may be the MRAM cell, as the two types of MRAM cells (STT MRAM or SOT MRAM) described above. Alternatively, the corresponding non-volatile memory cell may be a Resistive Random Access Memory cell, abbreviated as "RRAM" cell, for non-volatile storage of data or information for configuring or controlling the cryptography circuits. Alternatively, the corresponding non-volatile memory cell may be a Ferroelectric Random Access Memory cell, abbreviated as "FRAM" cell, for non-volatile storage of data or information for configuring or controlling the cryptography circuits. The data or information of the corresponding non-volatile memory cells may be used as a password or a key to encrypt or decrypt the signals and data at two terminals of the cryptography inverter matrix. The data or information stored in the nonvolatile memory cells for use in controlling the invert/non-invert of the cryptography inverters is the password or key for the FPGA IC chip. The encrypted N input signals or data stream are inputting to the cryptography inverter matrix through the N metal lines or traces, and are decrypted by the cryptography inverter matrix, and are then output as the M output signals or data stream for use as configuration data or information to program the SRAM cells in the LUTs (for logic operations) or configuration switches for programmable interconnection of a FPGA IC chip. In a reverse direction, the decrypted signals or data stream from the SRAM cells in the LUTs (for logic operations) or configuration switches for programmable interconnection of a FPGA IC chip are input at the M metal lines or traces and are encrypted by the cryptography inverter matrix, and are output as encrypted signals or data stream at the N metal lines or traces for circuits outside the FPGA IC chip. The cryptography inverters may be represented by a 1×N or N×1 matrix. For a case that the cryptography inverters in a N×1 or 1×N matrix format, there are ($2^N$-1) possible choices or selections of the passwords or keys. For N=8, there are 255 (=$2^8$-1) possible passwords or keys. The key or password comprises N (8) bits of data stored in the on-chip non-volatile memory cells, for example FGMOS non-volatile memory cells, MRAM memory cells, RRAM memory cells or FRAM cells.

Another aspect of the disclosure provides a standard commodity FPGA IC chip comprising an encryption/decryption circuit (cryptography circuit or a security circuit), wherein the encryption/decryption circuit comprises the cryptography cross-point switches in a matrix format in series with the cryptography inverters in a N×1 or 1×N matrix format in the middle of interconnection metal lines or traces. The cryptography cross-point switches in a matrix format and the cryptography inverters in a N×1 or 1×N matrix format are as described above. The cryptography cross-point switches in a matrix format may be placed in series before the cryptography inverters in a N×1 or 1×N matrix format, that is, the inputs of cryptography cross-point switches are connected to the inputting N-metal line, and the outputs of cryptography inverters are connected to the M-metal line, wherein N=M. Alternatively, the cryptography cross-point switches in a matrix format may be placed in series after the cryptography inverters in a N×1 or 1×N matrix format, that is, the inputs of cryptography inverters are connected to the inputting N-metal line, and the outputs of cryptography cross-point switches are connected to the M-metal line, wherein N=M. The hardware of circuits of the cryptography cross-point switches in a matrix format in series with cryptography inverters in a N×1 or 1×N matrix format provide a cryptography method for FPGA developers to protect their developed software or firmware for implementing their innovation or applications. For a case that the cryptography cross-point switches in a N×N matrix format are placed in series with the cryptography inverters in a N×1 or 1×N matrix format, there are (N! $2^N$-1) possible choices or selections of the passwords or keys. For N=8, there are 10,321,919 (8!$2^8$-1) possible passwords or keys. The key or password comprises $N^2$+N ($8^2$+8) bits of data stored in the on-chip non-volatile memory cells, for example FGMOS non-volatile memory cells, MRAM memory cells, RRAM memory cells or FRAM cells. The FPGA IC chip in the logic drive may have the encryption logic (based on the on-chip cryptography or security circuit) using a 128, 256, 512 or 1024-bit encryption key.

Another aspect of the disclosure provides logistics and procedures in encrypting/decrypting FPGA IC chips in the standard commodity logic drive. The logic drive comprises a FPGFA IC chip with cryptography circuits and a non-volatile memory (NVM) IC chip, and is packaged in a multichip package. The logic drive in the multichip package is a non-volatile programmable logic device with security. The non-volatile memory IC chip may be a NOR or NAND flash chip, MRAM IC chip, RRAM IC chip or FRAM IC chip. The multichip package may be in a 2D format with the FPGA IC chip and the NVM IC chip disposed on the same horizontal plane or in a stacked format with the FPGA IC chip and the NVM IC chip stacked vertically. The current semiconductor IC companies, when facing the presence of the standard commodity logic drive, may adapt the following business models: (1) still keeping as hardware companies by selling the hardware of software-loaded standard commodity logic drives without performing ASIC or COT IC chip design and/or production. They may purchase the standard commodity logic drives, and develop software or firmware to configure the standard commodity FPGA IC chips in the logic drives; and/or (2) become software companies to develop and sell software or firmware to configure the standard commodity FPGA IC chips in the logic drives for their innovation or application, and let their customers or users to install the purchased software or firmware in the customers' or users' own standard commodity logic drive.

In the business model (1), the developers may adapt following procedures when using the cross-point switches as the cryptography circuit: (i) during the developing stage of the FPGA IC chip in the developers' own standard commodity logic drive, the developers may set up a cryptography key or password in a N×N matrix with 1's in the diagonal, and all other elements are 0's, wherein the a cryptography key or password (the N×N matrix) is stored in the NVM cells (FGMOS, MRAM or RRAM as mentioned or described above) on the FPGA IC chip. The data used to configure the FPGA IC chip are stored and backed-up in the NVM IC chip in the same multichip package; (ii) After the FPGA IC chip is completely developed and before selling the logic drive to customers or users, the developers may encrypt/decrypt the FPGA IC chip by setting up a cryptography key or password in a N×N matrix having only one 1's randomly in each row and each column, wherein the cryptography key or password (the N×N matrix) is stored in the NVM cells (FGMOS, MRAM, RRAM or FRAM as mentioned or described above) on the FPGA IC chip. Alternatively, wherein the cryptography key or password (the N×N matrix) is stored, by one-time programming, in the NVM cells comprising the e-fuses or anti-fuses on the FPGA IC chip or chiplet. The encrypted configuration data are stored in the NVM IC chip in the multichip package, and are decrypted by the cryptography circuit on the FPGA IC chip using the on-chip cryptography key or password. The decrypted configuration data is loaded to the SRAM cells for configuring the LUTs and/or programmable switches of the FPGA IC chip or chiplet. Therefore, there are (N!-1) possible choices or selections of the N×N matrixes determined by the passwords or keys in the non-volatile memory cells on the FPGA IC chip or chiplet. For N=8, there are 40,319 (8!-1) possible N×N matrixes, passwords or keys.

Alternatively, the developers may adapt following procedures when using the inverters as the cryptography circuit: (i) during the developing stage of the FPGA IC chip or chiplet in the developers' own standard commodity logic drive, the developers may set up a cryptography key or password in a 1×N or N×1 matrix with 1's for all elements; (ii) After the FPGA IC chip is completely developed and before selling to the customers or users, the FPGA IC chip is encrypted/decrypted by setting up a cryptography key or password in a 1×N or N×1 matrix having randomly 1 or 0 for any element, wherein the cryptography key or password (the 1×N or N×1 matrix) is stored in the NVM cells (FGMOS, MRAM, RRAM or FRAM as mentioned or described above) on the FPGA IC chip. Alternatively, wherein the cryptography key or password (the 1×N or N×1 matrix) is stored, by one-time programming, in the NVM cells comprising the e-fuses or anti-fuses on the FPGA IC chip or chiplet. Therefore, there are ($2^N$-1) possible choices or selections of the 1×N or N×1 matrixes for the cryptography passwords or keys. For N=8, there are 255 ($2^8$-1) possible 1×N or N×1 matrixes, cryptography passwords or keys. All other specification for using the inverters as the cryptography circuit are the same as that described for using the cross-point switches as the cryptography circuit. In case that the cryptography cross-point switches in a matrix format is in series with the cryptography inverters in a N×1 or 1×N matrix format, the logistics and procedures in encrypting/decrypting the FPGA IC chip in the logic drive is the combination of that for using the cross-point switches as the cryptography circuit (described and specified above) and that for using the inverters as the cryptography circuit (described and specified above). There are (N!$2^N$-1) possible cryptography passwords or keys for the case. For N=8, there are 10,321,919 (8!$2^8$-1) possible cryptography passwords or keys. Only using the correct cryptography password or key, the users can operate the FPGA IC chip by obtaining the correct function of the LUTs and the programmable interconnection. Since the cryptography password or key is chosen and stored in the non-volatile memory cells of the FPGA IC chip by the FPGA developers, the configuration data or information are securely protected. The developers may sell the standard commodity logic drive with loaded (encrypted) configuration data or information in the NVM IC chip in the logic drive and with the cryptography password or key installed in the non-volatile memory cells of the FPGA IC chip in the same logic drive.

Alternatively, the developers may adapt following procedures when using the inverters as the cryptography circuit: (i) during the developing stage of the FPGA IC chip or chiplet in the developers' own standard commodity logic drive, the developers may set up a cryptography key or password in a 1×N or N×1 matrix with 1's for all elements; (ii) After the FPGA IC chip or chiplet is completely developed and before selling to the customers or users, the FPGA IC chip is encrypted/decrypted by setting up a cryptography key or password in a 1×N or N×1 matrix having randomly 1 or 0 for any element. Therefore, there are ($2^N$-1) possible choices or selections of the 1×N or N×1 matrixes for the cryptography passwords or keys. For N=8, there are 255 ($2^8$-1) possible 1×N or N×1 matrixes, cryptography passwords or keys. All other specification for using the inverters as the cryptography circuit are the same as that described for using the cross-point switches as the cryptography circuit. In case that the cryptography cross-point switches in a matrix format is in series with the cryptography inverters in a N×1 or 1×N matrix format, the logistics and procedures in encrypting/decrypting the FPGA IC chip in the logic drive is the combination of that for using the cross-point switches as the cryptography circuit (described and specified above) and that for using the inverters as the cryptography circuit (described and specified above). There are (N!$2^N$-1) possible cryptography passwords or keys for the case. For N=8, there are 10,321,919 (8!$2^8$-1) possible cryptography passwords or keys. Only using the correct cryptography password or key, the users can operate the FPGA IC chip by obtaining the correct function of the LUTs and the programmable interconnection. Since the cryptography password or key is chosen and stored in the non-volatile memory cells of the FPGA IC chip by the FPGA developers, the configuration data or information are securely protected. The developers may sell the standard commodity logic drive with loaded (encrypted) configuration data or information in the NVM IC chip in the logic drive and with the cryptography password or key installed in the non-volatile memory cells of the FPGA IC chip in the same logic drive In the business model (2), the developers may develop the configuration data, information, software or firmware using the FPGA IC chip in their own standard commodity logic drive. After completed the development, the developers may sell to the user or customer the software or firmware comprising encrypted configuration data or information for configuring the FPGA IC chip in the user's own standard commodity logic drive. The user or customer may configure the FPGA IC chips in the user's own standard commodity logic drive through network installation by, for example, downloading a file or executable program comprising (a) a user-specific password or key to be installed in the non-volatile memory cells for cryptography circuits (cryptography cross-point switches and/or cryptography inverters) of the FPGA IC chips in the user's own standard commodity logic drive; and (b) the configuration data or information to be installed in the NAND or NOR flash memory IC chip in the user's own standard commodity logic drive, wherein the configuration data or information are encrypted according to the user-specific password or key. The downloaded file or executable program may be a temporary file temporarily stored in the user's own terminal device (for example, computers or mobile phones) and maybe deleted after finishing the above installations.

The FPGA IC chip in the logic drive comprises the cryptography password or key stored in the on-chip non-volatile memory cells, for example FGMOS non-volatile memory cells, MRAM memory cells, RRAM memory cells or FRAM cells. Alternatively, the FPGA IC chip in the logic device may store the cryptography password or key in dedicated RAM cells on the FPGA IC chip, wherein the dedicated RAM cells may be backed up by a small externally connected battery. Alternatively, an e-fuse or anti-fuse on the FPGA IC chip may be used to store the cryptography password or key. The e-fuse or the anti-fuse is a one-time programming memory, and may be programmed to store the cryptography password or key. The e-fuse comprises a narrow neck in a metal trace or line of the interconnection metal lines or traces in the metal interconnection scheme of the FPGA IC chip. When programming the cryptography password or key, selected fuse is cut and broken at the narrow neck by applying high currents through the selected e-fuse. A first type anti-fuse comprises a thin oxide window between two terminals or electrodes. when programming the cryptography password or key, the two terminals or electrodes of the selected first type anti-fuse are shorted by applying high voltage between two terminals or electrodes of the anti-fuse to break the oxide in the oxide window. A second type anti-fuse comprises a short channel between the source and drain of a MOSFET on the FPGA IC chip of the logic drive. When programming the cryptography password or key, the source and drain of the selected second type anti-fuse is shorted by a punch-through current by applying high voltage between source and drain. The purposes, usages, functions and applications of the dedicated RAMs with battery, e-fuses and the first and second types of anti-fuses are the same or similar to that of FGMOS NVM cells, MRAM cells, RRAM cells and FRAM cells on the FPGA IC chip in the multichip logic drive.

Another aspect of the disclosure provides a logic drive in a multichip package comprising a standard commodity FPGA IC chip, an NVM IC chip, and a cooperating or supporting (CS) IC chip, wherein the cooperating or supporting IC chip is a cryptography or security IC chip. The cryptography or security circuits (encryption/decryption circuits, cryptography key or password) on the FPGA IC chip (as described and specified above) may be separated from the FPGA IC chip to form as the cooperating or supporting IC chip. The cryptography or security IC chip comprises non-volatile memory cells comprising the FGMOS NVM cells, MRAM cells, RRAM cells, FRAM cells, e-fuses or anti-fuses; the functions, purposes of the above non-volatile memory cells are the same as that described and specified on the FPGA IC chip. The FPGA IC chip, NVM IC chip, and cooperating or supporting IC chip may be disposed on a same horizontal plane in the 2D multichip package or may be stacked vertically in 2 layers or 3 layers in the 3D multichip package. The cooperating or supporting IC chip (the cryptography or security IC chip) may be designed and implemented using a technology node more mature or less advanced than the FPGA IC chip. For example, the FPGA IC chip may be designed and implemented using a technology node more advanced than 20 nm or 10 nm, while the cryptography or security IC chip may be designed and implemented using a technology node less advanced than 20 nm or 30 nm. The semiconductor technology node used to fabricate the FPGA IC chip is more advanced than that used to fabricate the cryptography or security IC chip. For example, the FPGA IC chip may be designed and implemented using FINFET or Gate-All-Around FET (GAAFET) transistors, while the cryptography or security IC chip may be designed and implemented using conventional planar MOSFET transistors. The cryptography or security circuits (encryption/decryption circuits, cryptography key or password, as described and specified above) on the cryptography or security IC chip are used for security of the configuration data or information in the SRAM cells of the FPGA IC chip in the same multichip package. The purposes, functions and specifications of the FPGA IC chip, NVM IC chip and the cryptography or security IC chip in the multichip package are as described above. The logic drive in the multichip package becomes a nonvolatile programmable device with security when comprising (i) then FPGA IC chip; (ii) the NVM IC chips to store and back the configuration data for configuring the standard commodity FPGA IC chip in the same multichip package; and (iii) the cryptography or security IC chip comprising the cryptography or security circuits for security of the configuration data or information in the SRAM cells of the FPGA IC chip.

Another aspect of the disclosure provides a logic drive in a multichip package comprising a standard commodity FPGA IC chip, an NVM IC chip, and a cooperating or supporting IC chip, wherein the cooperating or supporting IC chip is an I/O or control chip. The I/O or control circuits on the FPGA IC chip (as described and specified above) may be separated from the FPGA IC chip to form as the cooperating or supporting IC or control chip. The FPGA IC chip, NVM IC chip, and cooperating or supporting IC chip may be disposed on a same horizontal plane in the 2D multichip package or may be stacked vertically in 2 layers or 3 layers in the 3D multichip package. The cooperating or supporting IC chip (the I/O or control chip) may be designed and implemented using a technology node more mature or less advanced than the FPGA IC chip. For example, the FPGA IC chip may be designed and implemented using a technology node more advanced than 20 nm or 10 nm, while the I/O or control IC chip may be designed and implemented using a technology node less advanced than 20 nm or 30 nm. The semiconductor technology node used to fabricate the FPGA IC chip is more advanced than that used to fabricate the I/O or control chip. For example, the FPGA IC chip may be designed and implemented using FINFET or GAAFET transistors, while the I/O or control IC chip may be designed and implemented using conventional planar MOSFET transistors. The purposes, functions and specifications of the FPGA IC chip, NVM IC chip and the I/O or control chip in the multichip package are as described above.

When the I/O or control circuits on the FPGA IC chip (as described and specified above) are separated from the FPGA IC chip to form as the cooperating or supporting IC chip, the I/O or control chip, the FPGA IC chip may become a standard commodity product. The standard commodity FPGA IC chip is designed, implemented and fabricated using an advanced semiconductor technology node or generation, for example more advanced than or equal to, or below or equal to 20 nm or 10 nm, and for example using the technology node of 16 nm, 14 nm, 12 nm, 10 nm, 7 nm, 5 nm or 3 nm; with a chip size and manufacturing yield optimized with the minimum manufacturing cost for the used semiconductor technology node or generation. The I/O or control chip may be fabricated used mature or less advanced technology nodes, for example, less advanced than 20 nm or 30 nm. Transistors used in the advanced semiconductor technology node or generation for the FPGA IC chip may be a FIN Field-Effect-Transistor (FINFET), a FINFET on Silicon-On-Insulator (FINFET SOI) or a GAAFET. The standard commodity FPGA IC chip may only communicate or couple directly with other chips in or of the logic drive only; its I/O circuits may require only small I/O drivers or receivers, and small or none Electrostatic Discharge (ESD) devices. The driving capability, loading, output capacitance, or input capacitance of I/O drivers or receivers, or I/O circuits may be between 0.05 pF and 2 pF or 0.05 pF and 1 pF. Each of the small input/output (I/O) circuits may have an I/O power efficiency smaller than 0.5 pico-Joules per bit, per switch or per voltage swing, or between 0.01 and 0.5 pico-Joules per bit, per switch or per voltage swing. The size of the ESD device may be between 0.05 pF and 2 pF or 0.05 pF and 1 pF. All or most control and/or Input/Output (I/O) circuits or units (for example, the off-logic-drive I/O circuits, i.e., large I/O circuits, communicating with circuits or components external or outside of the logic drive) are outside of, or not included in, the standard commodity FPGA IC chip, but are included in the I/O or control chip packaged in the same logic drive. None or minimal area of the standard commodity FPGA IC chip is used for the control or I/O circuits, for example, less than 15%, 10%, 5%, 2% or 1% area (not counting the seal ring and the dicing area of the chip; that means, only including area upto the inner boundary of the seal ring) is used for the control or IO circuits; or, none or minimal transistors of the standard commodity FPGA IC chip are used for the control or I/O circuits, for example, less than 15%, 10%, 5%, 2% or 1% of the total number of transistors are used for the control or I/O circuits; or all or most area of the standard commodity FPGA IC chip is used for (i) logic blocks comprising logic gate arrays, computing units or operators, and/or Look-Up-Tables (LUTs) and multiplexers, and/or (ii) programmable interconnection. For example, greater than 85%, 90%, 95% or 99% area (not counting the seal ring and the dicing area of the chip; that means, only including area upto the inner boundary of the seal ring) is used for logic blocks, and/or programmable interconnection; or, all or most transistors of the standard commodity FPGA IC chip are used for logic blocks or repetitive arrays, and/or programmable interconnection, for example, greater than 85%, 90%, 95% or 99% of the total number of transistors are used for logic blocks, and/or programmable interconnection.

The cooperating or supporting chip (the I/O or control chip) is designed, implemented and fabricated using varieties of semiconductor technology nodes or generations, including old or matured technology notes or generations, for example, a semiconductor node or generation less advanced than or equal to, or above or equal to 20 nm, 30 nm, 40 nm, 50 nm, 90 nm, 130 nm, 250 nm, 350 nm, or 500 nm. The semiconductor technology node or generation used in the I/O or control chip is 1, 2, 3, 4, 5 or greater than 5 notes or generations older, more matured or less advanced than that used in the standard commodity FPGA IC chip packaged in the same logic drive. Transistors used in the I/O or control chip may be a Fully Depleted Silicon-on-insulator (FDSOI) MOSFET, a Partially Depleted Silicon-on-insulator (PDSOI) MOSFET or a conventional planar MOSFET. Transistors used in the I/O or control chip may be different from that used in the standard commodity FPGA IC chips packaged in the same logic drive; for example, the I/O or control chip may use the conventional planar MOSFET, while the standard commodity FPGA IC chip packaged in the same logic drive may use the FINFET or GAAFET. The power supply voltage (Vcc) used in the I/O or control chip may be greater than or equal to 1.0V, 1.5V, 2.0 V, 2.5V, 3 V, 3.5V, 4V, or 5V, while the power supply voltage (Vcc) used in the standard commodity FPGA IC chips packaged in the same logic drive may be smaller than or equal to 2.5V, 2V, 1.8V, 1.5V, 1 V, 0.5V or 0.4V. The power supply voltage used in the I/O or control chip may be different from that used in the standard commodity FPGA IC chip packaged in the same logic drive; for example, the I/O or control chip may use a power supply of 2V, while the standard commodity FPGA IC chip packaged in the same logic drive may use a power supply voltage of 0.75V; or the I/O or control chip may use a power supply of 1.0 V, while the standard commodity FPGA IC chip packaged in the same logic drive may use a power supply of 0.5V. The gate oxide (physical) thickness of the Field-Effect-Transistors (FETs) may be thicker than or equal to 5 nm, 6 nm, 7.5 nm, 10 nm, 12.5 nm, or 15 nm, while the gate oxide (physical) thickness of FETs used in the standard commodity FPGA IC chip packaged in the same logic drive may be thinner than 4.5 nm, 4 nm, 3 nm or 2 nm. The gate oxide (physical) thickness of FETs used in the I/O or control chip may be different from that used in the standard commodity FPGA IC chip packaged in the same logic drive; for example, the I/O or control chip may use a gate oxide (physical) thickness of FETs of 10 nm, while the standard commodity FPGA IC chip packaged in the same logic drive may use a gate oxide (physical) thickness of FETs of 3 nm; or the I/O or control chip may use a gate oxide (physical) thickness of FETs of 7.5 nm, while the standard commodity FPGA IC chip packaged in the same logic drive may use a gate oxide (physical) thickness of FETs of 2 nm. The I/O or control chip provides inputs and outputs, and ESD protection for the logic drive. The I/O or control chip provides (i) large drivers or receivers, or I/O circuits for communicating or coupling with external or outside (of the logic drive), and (ii) small drivers or receivers, or I/O circuits for communicating or coupling with chips in or of the logic drive; wherein the large drivers or receivers, or I/O circuits for communicating or coupling with external or outside (of the logic drive) have driving capability, loading, output capacitance or input capacitance lager or bigger than that of the small drivers or receivers, or I/O circuits for communicating or coupling with chips (for example, the FPGA IC chip in the same multichip package) in or of the logic drive; wherein the driving capability, loading, output capacitance, or input capacitance of the large I/O drivers or receivers, or I/O circuits for communicating or coupling with external or outside (of the logic drive) may be between 2 pF and 100 pF, 2 pF and 50 pF, 2 pF and 30 pF, 2 pF and 20 pF, 2 pF and 15 pF, 2 pF and 10 pF, or 2 pF and 5 pF, or 1 pF and 5 pF; or larger than 1 pF, 2 pF, 5 pF, 10 pF, 15 pF or 20 pF. Each of the large input/output (I/O) circuits may have an I/O power efficiency greater than 3, 5 or 10 pico-Joules per bit, per switch or per voltage swing. The driving capability, loading, output capacitance, or input capacitance of the small I/O drivers or receivers, or I/O circuits, in the I/O or control chip, for communicating or coupling with chips (for example, the FPGA IC chip in the same multichip package) in or of the logic drive may be between 0.05 pF and 5 pF, 0.05 pF and 2 pF, 0.05 pF and 1 pF; or smaller than 5 pF, 3 pF, 2 pF or 1 pF. Each of the small input/output (I/O) circuits may have an I/O power efficiency smaller than 0.5 pico-Joules per bit, per switch or per voltage swing, or between 0.01 and 0.5 pico-Joules per bit, per switch or per voltage swing. The size of ESD protection device on the I/O or control chip is larger than that on other standard commodity FPGA IC chip in the same logic drive. The size of the ESD device in the large I/O circuits may be between 0.5 pF and 20 pF, 0.5 pF and 15 pF, 0.5 pF and 10 pF 0.5 pF and 5 pF or 0.5 pF and 2 pF; or larger than 0.5 pF, 1 pF, 2 pF, 3 pF, 5 pF or 10 pF. For example, a bi-directional (or tri-state) I/O pad or circuit may be used for the large I/O drivers or receivers, or I/O circuits for communicating or coupling with external or outside circuits (of the logic drive), and may comprise an ESD circuit, a receiver, and a driver, and may have an input capacitance or output capacitance between 2 pF and 100 pF, 2 pF and 50 pF, 2 pF and 30 pF, 2 pF and 20 pF, 2 pF and 15 pF, 2 pF and 10 pF, 2 pF and 5 pF, or 1 pF and 5 pF; or larger than 1 pF, 2 pF, 5 pF, 10 pF, 15 pF or 20 pF. For example, a bi-directional (or tri-state) I/O pad or circuit may be used for the small I/O drivers or receivers, or I/O circuits for communicating or coupling with chips in or of the logic drive, and may comprise an ESD circuit, a receiver, and a driver, and may have an input capacitance or output capacitance between 0.05 pF and 5 pF, 0.05 pF and 2 pF, 0.05 pF and 1 pF; or smaller than 10 pF, 5 pF, 3 pF, 2 pF or 1 pF.

Furthermore, the power supply voltage (Vcc) used in the I/O or control chip may have a voltage at the same level as that of the FPGA IC chip in addition to the voltage (as mentioned and described above) higher than that of the FPGA IC chip. The higher voltage in the I/O or control chip is for use in the large drivers or receivers, or I/O circuits for communicating or coupling with external or outside circuits (of the logic drive), while the lower voltage in the I/O or control chip is for use in the small drivers or receivers, or I/O circuits for communicating or coupling with chips (for example the FPGA IC chip) in or of the logic drive.

Alternatively, the I/O or control chip may have two different gate oxide thicknesses. For example, one is a thick gate oxide (as mentioned and described above) thicker than that of the FPGA IC chip and the other is a thin gate oxide thinner than the thick gate oxide. The thicker gate oxide in the I/O or control chip is for use in the large drivers or receivers, or I/O circuits for communicating or coupling with external or outside circuits (of the logic drive), while the thinner gate oxide in the I/O or control chip is for use in the small drivers or receivers, or I/O circuits for communicating or coupling with chips (for example the FPGA IC chip) in or of the logic drive.

The I/O or control chip in the multichip package of the standard commodity logic drive may comprise a buffer and/or driver circuits for (1) downloading the programming codes from the non-volatile IC chip in the logic drive to the 5T or 6T SRAM cells of the programmable interconnection on the standard commodity FPGA IC chip. The programming codes from the non-volatile IC chip in the logic drive may go through a buffer or driver in or of the I/O or control chip before getting into the 5T or 6T SRAM cells of the programmable interconnection on the standard commodity FPGA IC chips. The buffer in or of the I/O or control chip may latch the data from the non-volatile chip and increase the bit-width of the data. For example, the data bit-width (in a SATA standard) from the non-volatile chip is 1 bit, and the buffer may latch the 1 bit data in each of the multiple SRAM cells in the buffer, and output the data stored or latched in the multiple SRAM cells in parallel and simultaneously to increase the data bit-width; for example, equal to or greater than 4, 8, 16, 32, or 64 data bit-width. For another example, the data bit-width (in a PCIe standard) from the non-volatile chip is 32 bits, the buffer may increase the data bit-width to equal to or greater than 64, 128, or 256 data bit-width. The driver in or of the I/O or control chip may amplify the data signals from the non-volatile chip; (2) downloading data from the non-volatile IC chip in the logic drive to the 5T or 6T SRAM cells of the LUTs on the standard commodity FPGA IC chip. The data from the non-volatile IC chip in the logic drive may go through a buffer or driver in or of the I/O or control chip before getting into the 5T or 6T SRAM cells of LUTs on the standard commodity FPGA IC chip. The buffer in or of the I/O or control chip may latch the data from the non-volatile chip and increase the bit-width of the data. For example, the data bit-width (in a SATA standard) from the non-volatile chip is 1 bit, the buffer may latch the 1 bit data in each of the multiple SRAM cells in the buffer, and output the data stored or latched in the multiple SRAM cells in parallel and simultaneously to increase the data bit-width; for example, equal to or greater than 4, 8, 16, 32, or 64 data bit-width. For another example, the data bit-width (in a PCIe standard) from the non-volatile chip is 32 bits, the buffer may increase the data bit-width to equal to or greater than 64, 128, or 256 data bit-width. The driver in or of the I/O or control chip may amplify the data signals from the non-volatile chip.

The I/O or control chip in the multichip package of the standard commodity logic drive may comprise I/O circuits or pads (or micro copper pillars or bumps) for I/O ports comprising one or more than one (2, 3, 4, or more than 4) Universal Serial Bus (USB) ports, one or more than one wide-bit I/O ports, one or more than one SerDes ports, one or more than one Serial Advanced Technology Attachment (SATA) ports, one or more than one Peripheral Components Interconnect express (PCIe) ports, one or more IEEE 1394 ports, one or more Ethernet ports, one or more than one audio ports or serial ports, RS-232 or COM (communication) ports, wireless transceiver I/O ports, and/or Bluetooth transceiver I/O ports. The I/O or control chip may comprise I/O circuits or pads (or micro copper pillars or bumps) for connecting or coupling to Serial Advanced Technology Attachment (SATA) ports, or Peripheral Components Interconnect express (PCIe) ports for communicating, connecting or coupling with the memory storage drive.

Another aspect of the disclosure provides a logic drive in a multichip package comprising a standard commodity FPGA IC chip, an NVM IC chip, and a cooperating or supporting IC chip, wherein the cooperating or supporting IC chip is a hard macro IC chip. The hard macro circuits (originally on the standard commodity original FPGA IC chip, as described and specified above) may be hard macros, for example, DSP slices for multiplication or division, phase locked loop (PLL) for analog clock generation, digital clock manager (DCM), block random-access memory (RAM) cells for logic operation, ARM Cortex processor/controller cores and/or CPU cores. The ARM Cortex processor/controller cores are 8, 16, 32, 64-bit or greater than 64-bit Reduced Instruction Set Computing (RISC) ARM processor/controller cores licensed from the ARM Holdings. A hard macro circuit couple to one or a plurality of logic cells or elements to perform a logic, computing or processing function. The field programmable logic cells or elements may be used for smart interfaces or coupling (including field programmability and artificial intelligent networking) between the hard macro circuits. As described and specified above, the original FPGA IC chip may be used as a Data Process Unit (DPU) when comprising the logic cells or elements and the hard macro circuits of multi-core Central Process Units (CPUs), wherein each CPU core is based on one or a plurality of the ARM Cortex cores using a Reduced Instruction Set Computing (RISC) architecture or a Complex Instruction Set Computing (CISC) architecture. A CPU core couple to one or a plurality logic cells or elements to perform a logic, computing or processing function. The logic cells or elements may be used for the smart interfaces or coupling (including field programmability and artificial intelligent networking) between the CPU cores of the multi-CPU-cores on the original FPGA IC chip. One or a plurality of the hard macro circuits (hard macros, for example DSP slices for multiplication or division, phase locked loop (PLL) for clock generation, digital clock manager (DCM), block random-access memory (RAM) cells for logic operation, ARM Cortex processor/controller cores and/or CPU cores) on the original FPGA IC chip may be separated from the original FPGA IC chip to form the hard macro IC chip as the cooperating or supporting IC chip. The hard macro circuits on the hard macro IC chip provide the same or similar functions and purposes as that on the original FPGA IC chip. As an application example, the original FPGA (DPU) IC chip may be split into two IC chips (i) a (new) FPGA IC chip comprising a sea of the plurality of logic cells or elements which are field programmable, and (ii) a hard macro IC chip of the multi-core CPU comprising a sea of the plurality of Central Process Unit (CPU) cores which are hard macros implemented with hard and fixed metal wires, lines or traces; wherein each CPU core is designed using the ARM Cortex cores based on a Reduced Instruction Set Computing (RISC) architecture, or using a x86 CPU cores based on Complex Instruction Set Computing (CISC) architecture. The number of the plurality of Central Process Unit (CPU) cores of the hard macro IC chip of the multi-core CPU may be 4, 8, 16, 32, 64, 128, 256, 512, or greater than 512. The new FPGA IC chip and hard macro IC chip are packaged in a 2D or 3D multichip package (to be described and specified below). The CPU cores of the hard macro IC chips couple to the logic cells or elements of the new FPGA IC chip through interconnection schemes of the multichip package. The field programmable logic cells or elements of the new FPGA IC chip may be used for the smart (artificial intelligent) networks, interfaces, coupling or interactions between the CPU cores of a plurality of CPU cores of the hard macro IC chip. The logic cells or elements of the new FPGA IC chip may be configured to provide smart (artificial intelligent) networks, interfaces, couplings or interactions between CPU cores of the plurality of CPU cores of the hard macro IC chip through interconnection schemes of the multichip package. In the multichip package, a logic cell or element of the new FPGA IC chip couples to first and second CPU cores of the hard macro IC chip through first and second interconnection schemes of the multichip package, respectively. That is, the first CPU core of the hard macro IC chip couples or interfaces with the second CPU core of the hard macro IC chip through, in sequence, the first interconnection scheme of the multichip package, the logic cell or element of the new FPGA IC chip, and the second interconnection scheme of the multichip package. The multichip package comprising the new FPGA IC chip and the hard macro IC chip provides the function of the original FPGA (DPU) IC chip, and provides a general-purpose CPU having high parallel computing or processing capability and high flexibility (field programmability). Both the hard macro IC chip comprising the CPU cores and the new FPGA IC chip comprising a plurality of logic cells or elements may be standardized, and become standard commodity IC products.

The cooperating or supporting chip (the hard macro IC chip) is designed, implemented and fabricated using varieties of semiconductor technology nodes or generations, including old or matured technology notes or generations, for example, a semiconductor node or generation less advanced than or equal to, or above or equal to 20 nm, 30 nm, 40 nm, 50 nm, 90 nm, 130 nm, 250 nm, 350 nm, or 500 nm. The semiconductor technology node or generation used in the hard macro IC chip is 1, 2, 3, 4, 5 or greater than 5 notes or generations older, more matured or less advanced than that used in the standard commodity FPGA IC chip packaged in the same logic drive. Transistors used in the hard macro IC chip may be a Fully Depleted Silicon-on-insulator (FDSOI) MOSFET, a Partially Depleted Silicon-on-insulator (PDSOI) MOSFET or a conventional planar MOSFET. Transistors used in the hard macro IC chip may be different from that used in the standard commodity FPGA IC chips packaged in the same logic drive; for example, the hard macro IC chip may use the conventional planar MOSFET, while the standard commodity FPGA IC chip packaged in the same logic drive may use the FINFET or GAAFET. The power supply voltage (Vcc) used in the hard macro IC chip may be greater than or equal to 1V, 1.5V, 2.0 V, 2.5V, 3 V, 3.5V, 4V, or 5V, while the power supply voltage (Vcc) used in the standard commodity FPGA IC chips packaged in the same logic drive may be smaller than or equal to 2.5V, 2V, 1.8V, 1.5V, 1 V, 0.5V, or 0.4V. The power supply voltage used in the hard macro IC chip may be different from that used in the standard commodity FPGA IC chip packaged in the same logic drive; for example, the hard macro IC may use a power supply of 2V, while the standard commodity FPGA IC chip packaged in the same logic drive may use a power supply voltage of 0.75V; or the hard macro IC chip may use a power supply of 1.0 V, while the standard commodity FPGA IC chip packaged in the same logic drive may use a power supply of 0.5 V. The gate oxide (physical) thickness of the Field-Effect-Transistors (FETs) used in the hard macro IC chip may be thicker than or equal to 5 nm, 6 nm, 7.5 nm, 10 nm, 12.5 nm, or 15 nm, while the gate oxide (physical) thickness of FETs used in the standard commodity FPGA IC chip packaged in the same logic drive may be thinner than 4.5 nm, 4 nm, 3 nm or 2 nm. The gate oxide (physical) thickness of FETs used in the hard macro IC chip may be different from that used in the standard commodity FPGA IC chip packaged in the same logic drive; for example, the hard macro IC chip may use a gate oxide (physical) thickness of FETs of 10 nm, while the standard commodity FPGA IC chip packaged in the same logic drive may use a gate oxide (physical) thickness of FETs of 3 nm; or the hard macro IC chip may use a gate oxide (physical) thickness of FETs of 7.5 nm, while the standard commodity FPGA IC chip packaged in the same logic drive may use a gate oxide (physical) thickness of FETs of 2 nm. The hard macro IC chip comprises small drivers or receivers, or I/O circuits for communicating or coupling with chips (for example, the FPGA IC chip) in or of the logic drive. The driving capability, loading, output capacitance, or input capacitance of the small I/O drivers or receivers, or I/O circuits for communicating or coupling with chips (for example, the FPGA IC chip) in or of the logic drive may be between 0.1 pF and 5 pF, 0.1 pF and 2 pF or 0.1 pF and 1 pF; or smaller than 10 pF, 5 pF, 3 pF, 2 pF or 1 pF. Each of the small input/output (I/O) circuits may have an I/O power efficiency smaller than 0.5 pico-Joules per bit, per switch or per voltage swing, or between 0.01 and 0.5 pico-Joules per bit, per switch or per voltage swing. Furthermore, the power supply voltage (Vcc) used in the hard macro IC chip may have a voltage at the same level as that of the FPGA IC chip in addition to the voltage (as mentioned and described above) higher than that of the FPGA IC chip. The higher voltage in the hard macro IC chip is for use in the on-chip circuit operation or function, or for large drivers or receivers, or I/O circuits for communicating or coupling with external or outside circuits (of the logic drive), while the lower voltage in the hard macro IC chip is for use in the small drivers or receivers, or I/O circuits for communicating or coupling with chips (for example the FPGA IC chip) in or of the logic drive. Alternatively, the hard macro IC chip may have two different gate oxide thicknesses. For example, one is a thick gate oxide (as mentioned and described above) thicker than that of the FPGA IC chip and the other is a thin gate oxide thinner than the thick gate oxide. The thicker gate oxide in the hard macro IC chip is for use in the large drivers or receivers, or I/O circuits for on-chip circuit operation or function, or for communicating or coupling with external or outside circuits (of the logic drive), while the thinner gate oxide in the hard macro IC chip is for use in the small drivers or receivers, or I/O circuits for communicating or coupling with chips (for example the FPGA IC chip) in or of the logic drive. Alternatively, the semiconductor technology node or generation used in the hard macro IC chip may be the same as or similar to that used in the standard commodity FPGA IC chip packaged in the same logic drive, in terms of transistors, gate oxide thickness, power supply voltage and drivers, receiver or I/O circuits. For example, the hard macro IC chip comprising the multi-CPU-cores, DSP hard macros, and/or block RAMs may be fabricated using advanced technology nodes same as or similar to that used in the standard commodity FPGA IC chip packaged in the same logic drive.

By moving the hard macros from the FPGA IC chip to the hard macro IC chip, the FPGA IC chip may have all or most area of the standard commodity FPGA IC chip used for (i) arrays of logic blocks comprising logic cells or elements comprising Look-Up-Tables (LUTs) and multiplexers, and/or (ii) programmable interconnection, in regular repetitive arrays. If the hard macro circuits are included in the FPGA IC chip, the hard macro circuits need redesigning or recompilation when the FPGA IC chip is redesigned or recompiled using a different technology node or a different manufacturing fab. By moving the hard macros from the FPGA IC chip to the hard macro IC chip, the hard macro IC chip implemented using a certain specific technology node in a specific manufacturing fab may be used for the different FPGA IC chips designed, compiled and implemented in several different technology nodes or manufacturing fabs. In this case, the hard macro circuits do not need redesign or recompilation. The hard macro IC chip provides high speed, high efficiency computing, processing or logic operation collectively with the LUTs/multiplexers and programmable interconnections of the FPGA IC chip, resulting in high yield, low manufacturing cost for the FPGA IC chip. Therefore, the FPGA IC chip may be easily becoming standard commodity products.

Another aspect of the disclosure provides a logic drive in a multichip package comprising a standard commodity FPGA IC chip, an NVM IC chip, and a cooperating or supporting IC chip, wherein the cooperating or supporting IC chip is a power management IC chip. The power management IC chip provides power supply and power management for the FPGA IC chip, and comprises a voltage regulator. The FPGA IC chip, NVM IC chip, and cooperating or supporting IC chip may be disposed on a same horizontal plane in the 2D multichip package or may be stacked vertically in 2 layers or 3 layers in the 3D multichip package. The cooperating or supporting IC chip (the power management IC chip) may be designed and implemented using a technology node more mature or less advanced than the FPGA IC chip. For example, the FPGA IC chip may be designed and implemented using a technology node more advanced than 20 nm or 10 nm, while the power management IC chip may be designed and implemented using a technology node less advanced than 20 nm or 30 nm. The semiconductor technology node used to fabricate the FPGA IC chip is more advanced than that used to fabricate the power management IC chip. For example, the FPGA IC chip may be designed and implemented using FINFET or GAAFET transistors, while the power management IC chip may be designed and implemented using conventional planar MOSFET transistors. The purposes, functions and specifications of the FPGA IC chip, NVM IC chip and the power management IC chip in the multichip package are as described above.

Another aspect of the disclosure provides a logic drive in a multichip package comprising a standard commodity FPGA IC chip, an NVM IC chip, and a cooperating or supporting IC chip, wherein the cooperating or supporting IC chip is an Innovated ASIC or COT (abbreviated as IAC below) chip. The FPGA IC chip, NVM IC chip and IAC chip, may be disposed on a same horizontal plane in the 2D multichip package or may be stacked vertically in 2 layers or 3 layers in the 3D multichip package. As described above, the innovators may implement their innovation using the standard commodity FPGA IC chip (fabricated in the advanced technology nodes more advanced than 20 nm or 10 nm). The IAC chip, in addition to the standard commodity FPGA IC chip, provides innovators to implement their innovation with further customized or personalized capability using less expensive technology nodes less advance than 20 nm or 30 nm. The semiconductor technology node used to fabricate the FPGA IC chip is more advanced than that used to fabricate the IAC chip. For example, the IAC chip provides innovators in implement their innovated Intellectual Property (IP) circuits, Application Specific (AS) circuits, analog circuits, mixed-mode signal circuits, Radio-Frequency (RF) circuits, and/or transmitter, receiver, transceiver circuits, etc. The FPGA IC chip, NVM IC chip, and cooperating or supporting IC chip may be disposed on a same horizontal plane in the multichip package or may be stacked vertically in 2 layers or 3 layers. The cooperating or supporting IC chip (the IAC chip) may be designed and implemented using a technology node more mature or less advanced than the FPGA IC chip. For example, the FPGA IC chip may be designed and implemented using a technology node more advanced than 20 nm or 10 nm, while the IAC chip may be designed and implemented using a technology node less advanced than 20 nm or 10 nm. For example, the FPGA IC chip may be designed and implemented using FINFET or GAAFET transistors, while the IAC chip may be designed and implemented using conventional planar MOSFET transistors. The purposes, functions and specifications of the FPGA IC chip, NVM IC chip and the IAC chip in the multichip package are as described above.

The IAC chip is designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the IAC chip is 1, 2, 3, 4, 5 or greater than 5 nodes or generations older, more matured or less advanced than that used in the standard commodity FPGA IC chips packaged in the same logic drive. Transistors used in the IAC chip may be a FINFET, a GAAFET, a Fully Depleted Silicon-on-insulator (FDSOI) MOSFET, a Partially Depleted Silicon-On-Insulator (PDSOI) MOSFET or a conventional MOSFET. Transistors used in the IAC chip may be different from that used in the standard commodity FPGA IC chips packaged in the same logic drive; for example, the IAC chip may use the conventional MOSFET, while the standard commodity FPGA IC chips packaged in the same logic drive may use the FINFET or GAAFET; or the IAC chip may use the Fully Depleted Silicon-on-insulator (FDSOI) MOSFET, while the standard commodity FPGA IC chips packaged in the same logic drive may use the FINFET or GAAFET. Since the IAC chip in this aspect of disclosure may be designed and fabricated using older or less advanced technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm, its NRE cost is cheaper than or less than that of the current or conventional ASIC or COT chip designed and fabricated using an advanced IC technology node or generation, for example, more advanced than or below 20 nm or 10 nm, and for example using the technology node of 16 nm, 14 nm, 12 nm, 10 nm, 7 nm, 5 nm or 3 nm. The NRE cost for designing a current or conventional ASIC or COT chip using an advanced IC technology node or generation, for example, more advanced than or below 20 nm or 10 nm, may be more than US $5M, US $10M, US $20M or even exceeding US $50M, or US $100M. The cost of a photo mask set for an ASIC or COT chip at the 16 nm technology node or generation is over US $2M, US $5M, or US $10M. Implementing the same or similar innovation and/or application using the logic drive including the IAC chip designed and fabricated using older or less advanced technology nodes or generations may reduce NRE cost down to less than US $10M, US $7M, US $5M, US $3M or US $1M. Compared to the implementation by developing the current conventional logic ASIC or COT IC chip, the NRE cost of developing the IAC chip for use in the standard commodity logic drive to achieve the same or similar innovation and/or application may be reduced by a factor of larger than 2, 5, 10, 20, or 30.

Another aspect of the disclosure provides a Field Programmable IC (FPIC) chip based on a Coarse-Grained Reconfigurable Architecture (CGRA) for use in the non-volatile programmable logic device (the nonvolatile programmable 2D-horizontal or 3D-stacked logic drive) based on the logic drive described and specified in this patent application. The CGRA semiconductor IC chip comprises an array of a large number of function unit blocks, cells or elements (FUBs), wherein each of the FUBs is programmable, configurable and reconfigurable by: (i) programming software or codes comprising operation instructions in an instruction set stored in the on-chip instruction memory cells, wherein the operation instructions in the instruction set are written in assembly language, or based on machine language or code. The on-chip memory cells may be on-chip volatile memory cells (for example, SRAM cells) or on-chip non-volatile memory cells (for example, floating-gate non-volatile memory cells, resistive RAM (RRAM) cells, Magnetoresistive RAM (MRAM) cells, Ferroelectric RAM (FRAM) cells); or (ii) same as the FPGA IC chip described and specified in this patent application, using the configuration data stored in the on-chip volatile memory cells (for example, SRAM cells) or on-chip non-volatile memory cells (for example, floating-gate non-volatile memory cells, resistive RAM (RRAM) cells, Magnetoresistive RAM (MRAM) cells, Ferroelectric RAM (FRAM) cells).

The CGRA IC chip comprises the array of a large number of function unit blocks, cells or elements (FUBs), each FUB comprises (i) a function unit (FU). The function unit (FU) is designed, compiled and implemented with fixed hard wires (metal lines or traces) for circuits therein. The FU is programmed, configured or reconfigured using programming software or codes comprising the operation instructions in the instruction set stored in the on-chip instruction memory cells. The operation instructions in the instruction set may be written in assembly language (for example, MOV, ADD or SUB), and the assembly language is then converted, using an assembler, to machine language or code in binary digits (ones or zeros). The machine language or code in binary digits (ones or zeros) are stored in the on-chip instruction memory cells. The on-chip memory cells may be on-chip volatile memory cells (for example, SRAM cells) or on-chip non-volatile memory cells, for example, floating-gate non-volatile memory cells, resistive RAM (RRAM) cells, Magnetoresistive RAM (MRAM) cells, Ferroelectric RAM (FRAM) cells. The FU is programmed, configured or reconfigured for different functions or applications depending on different instruction sets stored in the on-chip volatile or non-volatile memory cells of the instruction memory cells, respectively. A FU is programmed, configured or reconfigured using a first specific instruction set stored in the on-chip volatile or non-volatile memory cells of the instruction memory cells for a first specific function or application. When a second specific instruction set is loaded and stored in the on-chip volatile or non-volatile memory cells of the instruction memory cells, the FU is programmed, configured or reconfigured to perform a second specific function or application. The hardware or circuit of the function unit (FU) may be one or more than one of the hard macros described and specified above for the FPGA IC chip. The hard macros comprises, for example, digital signal process (DSP) slices, graphic process unit (GPU) macros, Data Process Unit (DPU) macros, microcontroller unit (MCU) macros, multiplexer macros, adder macros, multiplier macros, arithmetic logic unit (ALU) macros, shift circuit macros, comparison circuit macros, floating-point computing macros, register or flip-flops macros, and/or I/O interfacing macros, wherein each of the hard macros is designed, compiled and implemented with fixed hard wiring for circuits; (ii) a register or flip-flop for temporarily storing the computing or processing output or result of the FU. The data stored in the register may be distributed to or accessed by only a certain (not all) FUBs in the FUB array within a certain clock cycles using control circuits with artificial intelligence; (iii) a register files for temporarily storing, updating, recycling or looping the computing or processing output data or result of the FU for use as input data at the FU input points. The register files may be further used for storing, updating and preparing in advance the data or results required for the computing or processing of the FU for use as input data at the FU input points, so that the FU has data nearby and ready in-time for executing an instruction of computing and processing. Therefor the speed and performance of the FU is greatly improved; (iv) the instruction memory section comprising a plurality of volatile (for example, SRAM) or non-volatile memory cells for storing programming software or codes comprising operation instructions for the FU. The instruction memory section is in the same FUB comprising the FU, that is the instruction memory cells are distributed in each FUB of the FUB array for programming, configuring or reconfiguring the FU, wherein the instruction memory cells are used for storing the machine language or code in binary digits (ones or zeros) for the FU. The instruction memory cells may be on-chip volatile memory cells (for example, SRAM cells) or on-chip non-volatile memory cells, for example, floating-gate non-volatile memory cells, resistive RAM (RRAM) cells, Magnetoresistive RAM (MRAM) cells, Ferroelectric RAM (FRAM) cells; (v) a program counter (PC) used as an instruction address or an address pointer, wherein the program counter (PC) contains the address (location) of the instruction in the instruction memory section. The program (PC) is used for controlling the execution sequence of the instructions stored in the memory cells in the instruction memory section. As each instruction gets fetched, the program counter increases its stored value by 1. After each instruction is fetched, the program counter points to the next instruction in the sequence.

Each FUB in the FUB array is interconnected or not interconnected using a mesh style network comprising configurable and reconfigurable interconnection circuits, same as described and specified in the FPGA IC chip or chips. The FUs can execute common word-level operations, including addition, subtraction, and multiplication. In contrast to FPGAs, CGRAs have short reconfiguration times, low delay characteristics, and low power consumption as the CGRAs are constructed from standard cell implementations. Thus, gate-level reconfigurability is sacrificed, but the result is a large increase in hardware efficiency.

The CGRA IC chip comprises the configurable and reconfigurable interconnection circuits, and volatile (for example, SRAMs) or non-volatile memory cells for storing data therein, wherein the data is used for configuring or reconfiguring the configurable and reconfigurable interconnection circuits. The interconnection (connecting or not-connecting) between each of FUBs in the FUB array is configured or reconfigured by the data stored in the volatile or non-volatile memory cells. When FUs in the FUB array of the CGRA IC chip are configured or reconfigured for a specific function and application, the configurable and reconfigurable interconnection circuits may be meanwhile configured or reconfigured by changing the corresponding configuration or reconfiguration interconnection data stored in the volatile or non-volatile memory cells. When FUs in the FUB array of the CGRA IC chip are configured or reconfigured for a first specific function and application, their corresponding configurable and reconfigurable interconnection circuits may be configured or reconfigured using a first specific configuration or reconfiguration interconnection data stored in the on-chip volatile or non-volatile memory cells; the CGRA IC chip is then configured or reconfigured to perform the first specific function or application. When the FUs in the FUB array of the CGRA IC chip are configured or reconfigured for a second specific function or application, a second specific configuration or reconfiguration interconnection data are loaded and stored in the on-chip volatile or non-volatile memory cells for the corresponding configurable and reconfigurable interconnection circuit, the CGRA IC chip is configured or reconfigured to perform the second specific function or application.

Same as the FPGA IC chip or chips, the CGRA IC chip comprises a programmable, configurable and reconfigurable interconnection circuit and a first volatile memory cell for storing first data therein, wherein the first data is used for configuring the programmable, configurable and reconfigurable interconnection circuit, wherein the programmable, configurable and reconfigurable interconnection circuit comprises first and second conductive interconnects and a programmable, configurable and reconfigurable switch circuit having a first input point coupling to the first conductive interconnect, a first output point coupling to the second conductive interconnect, and a second input point for input data associated with the first data, wherein the programmable, configurable and reconfigurable switch circuit is programmed, configured or reconfigured to control, in accordance with the input data at the second input point, coupling between the first and second conductive interconnects. The programmable, configurable and reconfigurable interconnection circuit is programmed, configured or reconfigured using a first specific data stored in the on-chip volatile or non-volatile memory cells of the instruction memory cells for a first specific function. When a second specific instruction set is loaded and stored in the on-chip volatile or non-volatile memory cells of the instruction memory cells, the FU is programmed, configured or reconfigured to perform a second specific function.

Same as the FPGA IC chip, the CGRA IC chip further comprises a second volatile memory cell for storing second data therein, wherein the programmable, configurable and reconfigurable interconnection circuit further comprises a programmable, configurable and reconfigurable selection circuit coupling to the programmable, configurable and reconfigurable switch circuit through the first conductive interconnect, wherein the programmable, configurable and reconfigurable selection circuit comprises third and fourth conductive interconnects, a third input point coupling to the third conductive interconnect, a fourth input point coupling to the fourth conductive interconnect, a second output point coupling to the first conductive interconnect, and a fifth input point for input data associated with the second data, wherein the programmable, configurable and reconfigurable selection circuit is programmed, configured or reconfigured to select, in accordance with the input data at the fifth input point, one of the third and fourth conductive interconnects to couple with the second output point.

The CGRA IC chip may, in addition, comprise (in the same chip) the field programmable, configurable and reconfigurable logic and interconnection circuits of the FPGA IC chip or chips, as described and specified above. By doing this, the CGRA IC chip provides both the fine-grain and coarse-grain field programmable, configurable and reconfigurable capability or functions on the same IC chip.

All description, specification, function and application related to the FPGA IC chip or chips in this patent application are applied to the CGRA IC chip or chips, except those described and specified for the CGRA IC chip or chips.

All the 2D-horizontal and/or 3D-stacked chip package or logic drive, or, multichip package or logic drive, comprising the FPGA IC chip or chips, described and/or specified in this patent application are applied to the CGRA IC chip or chips, including one or a plurality of non-volatile memory IC chips and/or one or a plurality of cooperating or supporting (CS) IC chips in the same chip package or multichip, wherein one or a plurality of non-volatile memory IC chip is used to store the programming, configuration or reconfiguration data for programming, configuring or reconfiguring the FPGA IC chip or chips. The purposes, relations and functions of the one or the plurality of non-volatile memory IC chips and/or the one or the plurality of cooperating or supporting (CS) IC chips (in the same chip package or multichip) related to the CGRA IC chip or chips are the same as those related to the FPGA IC chip or chips. The nonvolatile memory IC chip or chips in the same chip package or multichip package comprising the CGRA IC chip is used to store and backup: (i) programming software or codes, comprising operation instructions for each FU of the FUB array on the CGRA IC chip, stored in the on-chip volatile memory cells (for example, SRAMs) in the instruction memory section in each FUB of the FUB array on the CGRA IC chip; and (ii) programming, configuration or reconfiguration interconnection data for programming, configuring or reconfiguring the programmable, configurable and reconfigurable interconnection circuit of the CGRA IC chip. The non-volatile memory IC chip may be a NAND flash memory chip or NOR flash memory chip. The non-volatile memory IC chip may be used to store a plurality of instruction sets for a plurality of functions or applications of the CGRA IC chip. For example, the FU is programmed, configured or reconfigured using a first specific instruction set stored in the on-chip volatile memory cells of the instruction memory cells for a first specific function or application. When a second specific instruction set is loaded and stored in the on-chip volatile memory cells of the instruction memory cells, the FU is programmed, configured or reconfigured to perform a second specific function or application. The first and second specific instruction sets stored in the volatile memory cells of the CGRA IC chip may be downloaded from those stored and backed up in a plurality of non-volatile memory cells in the non-volatile memory IC chip in the same chip package or multichip package comprising the CGRA IC chip. A user may program, configure or reconfigure the CGRA IC chip for performing the first or second specific function or application by selecting the first or second specific instruction set respectively stored in the non-volatile memory cells of the non-volatile memory IC chip and loading it to the volatile memory cells of the CGRA IC chip.

Another aspect of the disclosure provides the 2D-horizontal and/or 3D-stacked chip package or logic drive, or, multichip package or logic drive, comprising the FPGA IC chip or chips (as described and/or specified above) and the CGRA IC chip or chips (as described and/or specified above) in the same multichip package, wherein the multichip package may be that: (i) the CGRA IC chip or chip-package is packaged on a same horizontal plane as the FPGA IC chip or chip-package in the same 2D-horizontal multichip package, as described and specified above; (ii) the CGRA IC chip or chip-package is packaged on or over the FPGA IC chip or chips in the same 3D-stacked multichip package, as described and specified above; (iii) the FPGA IC chip or chip-package is packaged on or over the CGRA IC chip or chip-package in the same 3D-stacked multichip package, as described and specified above. The FPGA chip-package or the CGGA chip-package may further comprise one or a plurality of non-volatile memory IC chips and/or one or a plurality of cooperating or supporting (CS) IC chips in the same chip package or multichip, wherein one or a plurality of non-volatile memory IC chip is used to store the programming, configuration or reconfiguration data for programming, configuring or reconfiguring the FPGA or CGRA IC chip or chips. The purposes, relations and functions of the one or the plurality of non-volatile memory IC chips and/or the one or the plurality of cooperating or supporting (CS) IC chips (in the same chip-package) related to the FPGA or CGRA IC chip or chips are the same as those described and specified for the FPGA IC chip or chips. By doing this, the 2D-horizontal and/or 3D-stacked chip package or logic drive, or, multichip package or logic drive provides both the fine-grain and coarse-grain field programmable, configurable and reconfigurable capability or functions.

Another aspect of the disclosure provides a Field programmable IC (FPIC) chip for programmable, configurable and reconfigurable capability based on Coarse-Grained Field Programmable (CGFP) circuits for use in the nonvolatile programmable logic drive or device (the 2D-horizontal or 3D-stacked nonvolatile programmable logic drive or device) based on the logic drive or device described and specified in this patent application; this type of Field Programmable IC (FPIC) chip is named as a Coarse-Grained FP (CGFP) IC chip. The FPGA IC chip described and specified above may be named as Fine-Grained FPGA (FGFPGA) IC chip for differentiation from the CGFP IC chip. The Coarse-Grained FP (CGFP) IC chip is programmable, configurable and reconfigurable same as the FGFPGA IC chip described and specified above, except that: (i) the CGFP IC chip comprises a Coarse-Grained Look-Up-Table (CGLUT) instead of the LUT described and specified above; and (ii) Programmable Interconnection Network (PINet) instead of the programmable interconnection described and specified above.

The Coarse-Grained Look-Up-Table (CGLUT) in the Coarse-Grained FP (CGFP) IC chip provides multiple bits of data (for example, 8 bits for a word) at its output points. The Coarse-Grained Look-Up-Table (CGLUT) in the Coarse-Grained FP (CGFP) IC chip is based on a plurality of dual-port SRAM cells arranged in an array with m rows by n columns (m×n), wherein m and n are positive integer numbers. The dual port SRAM cells are used for storing resulting values of a logic operation or processing. The dual port SRAM cell comprises (i) a 6T SRAM cell, as described and specified above, with 4 transistors for latching data therein, and 2 transistors for data transfer, wherein the gates of 2 transfer transistors are connecting to the global word lines, and the drain of one of the 2 transfer transistors is connecting to a global bitline, and the drain of another of the 2 transfer transistors is connecting to a global bit-bar line; and (ii) a read circuit for reading the resulting data stored in the dual port SRAM cell for the logic operation. The read circuit comprises a LUT transfer transistor with its gate connecting to a local wordline, its source connecting to the latched bit node, and its drain connecting to a local bitline. Alternatively, the read circuit may further comprise an inverter between the LUT transfer transistor and the latched bit-bar node, wherein the common gates of the inverter is connecting to the latched bit-bar node and the common drains of the inverter is connecting to the drain of the LUT transfer transistor. During configuration and/or reconfiguration, the resulting data is written and stored in the dual port SRAM cell from the global wordline, the global bitline and the bit-bar line and through 2 transfer transistors in the 6T SRAM cell (of the dual port SRAM cell), same as in the writing process of the conventional 6T SRAM cell. The dual port SRAM cell in the CGLUT may be also used as a cache SRAM cell same as the convention 6T cache SRAM cell, wherein the writing and reading processes are the same as the convention 6T cache SRAM cell, wherein the cache data is written to or read from the dual port SRAM cell from the global wordline, the global bitline and the bit-bar line and through 2 transfer transistors in the 6T SRAM cell (of the dual port SRAM cell).

The CGLUT comprises: (i) the plurality of dual-port SRAM cells, as described and specified above, in an array with m rows and n columns; (ii) a local row decoder and a local column decoder for selecting a group or set of resulting data stored in the Dual-Port SRAM cells located in the array at (x, y) addresses of the CGLUT. The row (Y) decoder has (a) r input points each coupling to an input interconnect, wherein the r input points may provide $2^r$ possible input data, wherein r is a positive integer number, and (b) m output points each coupling to one of the m rows of dual-port SRAM cells through one of the local wordlines, m equals to $2^r$. The row (Y) decoder selects a row (out of m rows), thereby all the dual-port SRAM cells in the selected row, based on input data (related to Y addresses of Dual-Port SRAM cells) at the input points of the row (Y) decoder. The column (X) decoder has (a) c input points for providing $2^c$ possible input data, wherein c is a positive integer number, (b) n interfacing points each coupling to one of the n columns of dual-port SRAM cells through one of the local bitlines, and (c) j output points each coupling to an output interconnect, wherein j is a positive integer number, wherein the column decoder selects output data at the j output points from the data at the n interfacing points; (iii) a selection circuit programmed, configured or reconfigured for selecting resulting data or values stored in the CGLUT through and by the local row and column decoders as output data of a logic operation. The selection circuit comprises: (a) k input points coupling to k input interconnects for the $2^k$ possible input data, wherein k is a positive integer number, (b) r output points coupling to the r input points of the row local decoder through the r interconnects, (c) c output points coupling to the c input points of the local column decoder through the c interconnects, (d) (r+c) multiplexers, each multiplexer comprises k first input points, one or a plurality second input points and 1 output point, wherein each of the multiplexer is configured to select data from data at one of the k first input points, in accordance with data at the one or the plurality second input points, as output data at the output point, wherein the data at the one or the plurality second input points for configuring each of the (r+c) multiplexers are stored in 6T SRAM cell or cells or the dual port SRAM cell or cells. The output data of r multiplexers of the (r+c) multiplexers are used for the local row decoder, and the output data of c multiplexers of the (r+c) multiplexers are used for the local column decoder. Overall, the CGLUT is configured to select j resulting data stored in the dual port SRAM cells in the array, in accordance with the input data at k input points of the configured selection circuit, as its output data at the j output points of the local column decoder. j may be equal to or greater than 2, 4, 8 16 or 32. When j=8, the CGLUT is configured for a logic operation in a byte, instead of a bit; when j=16, the CGLUT is configured for a logic operation in a word, instead of a bit.

A CGFP IC chip comprises a Coarse Grained Function Section (CGFS) comprising an array arranged with M rows and N columns of a plurality of CGLUTs each comprising the array arranged with m rows and n columns of a plurality of dual port SRAM cells. The CGFS further comprises a global row decoder coupling to the global wordlines and a global column decoder coupling to the global bitlines and bit-bar lines, wherein the global row and column decoders are for selecting (a) location addresses to write the resulting data or cache memory data into selected locations for look-up table application or cache memory application, respectively; (b) location addresses to read cache memory data from the selected locations for the cache memory application. The circuits, functions and operation of the global row and column decoders and global wordlines, bitlines and bit-bar lines are the same as that of a conventional cache SRAM memory array.

Another aspect of the disclosure provides a method and circuits for interconnecting or coupling between the CGLUTs in the array of the CGFS by a Neighbor Interfacing Circuit (NIC). The Neighbor Interfacing Circuit (NIC) couples a CGLUT to its four nearest neighboring CGLUTs. The NIC is around the peripheral of the CGLUT and comprises: (i) four selection circuit units each comprising: (a) (3w+j) input points coupling to (3w+j) input interconnects for $2^{(3w+j)}$ possible input data, (b) w output points coupling to a nearest-neighboring CGLUT through w interconnects, wherein w may be equal to j, (c) w multiplexers, each multiplexer comprises (3w+j) first input points, one or a plurality second input points and 1 output point, wherein each of the multiplexer is configured to select data from data at one of the (3w+j) first input points, in accordance with data at the one or the plurality second input points, as output data at the output point, wherein data at the one or the plurality second input points for configuring each of the w multiplexers are stored in 6T SRAM cell or cells or dual port SRAM cell or cells; (ii) 4 interconnection nets each for coupling data or signals from four directions (at w interconnects in top, left, bottom and right directions, respectively, with respect to the CGLUT) to the CGLUT and to the selection circuits in the other 3 directions. As specified above, the CGLUT has k input points, therefore k=4w. For example, the top-interconnection net couples the input data from the w interconnects in the top direction to: (a) the CGLUT, (b) the input points of the selection circuit in the left direction, (c) the input points of the selection circuit in the bottom direction, and (d) the input points of the selection circuit in the right direction. The left, bottom and right-interconnection nets each has similar interconnection scheme as that of the top-interconnection scheme; (iii) 1 interconnection net for coupling data or signals output from the CGLUT (j interconnects coupling to the CGLUT) to the selection circuits in right, top, left and bottom directions. Therefore, the selection circuits in right, top, left and bottom directions each couples to (3w+j) interconnects at its input points, as described and specified above for the selection circuit. As described and specified above for the selection circuit, the selection circuits in right, top, left and bottom directions each couples to (3w+j) interconnects at its input points, wherein each selection circuit is configured to select data from the (3w+j) input points, in accordance to the configuration data stored in 6T SRAM cell or cells or dual port SRAM cell or cells, as output data at the j output points. The Neighbor Interfacing Circuit (NIC) can be configured for a CGLUT (a) to select data or signals from its four nearest-neighbors as its input data or signals, (b) to select one or more from its four nearest neighbors, to which its output data or signals are delivered, (c) to bypass data or signals from its four nearest-neighbors, and transfer the bypassed data or signals from one to the other of its four nearest-neighbors.

Another aspect of the disclosure provides a method and circuits for interconnecting or coupling between the CGLUTs in the array of the CGFS by a Neighbor Interfacing Circuit (NIC) and Global Interconnection Circuit (GIC). The Neighbor Interfacing Circuit (NIC) is as described and specified above. The global interconnection circuit (GIC) in the CGFS array couples a CGLUT (Global CGLUT, GCGLUT) directly to another CGLUT (also a GCGLUT) not located at its nearest neighbors, for example, separated by s CGLUTs in x direction, and by t CGLUTs in y direction, wherein s and t are positive integers and s may be equal to t in some designs, wherein s>=1, 2, 3, 4, 5, 8, or 16 and t>=1, 2, 3, 4, 5, 8 or 16. Each of the GCGLUTs couples to a global interconnection scheme comprising a plurality of first groups of global interconnects running in x-direction, and a second groups of global interconnects running in y-direction. Each of the plurality of global interconnects running in x-direction: (a) comprises g interconnects, wherein g is a positive integer; (b) is separated from its nearest neighboring group of global interconnects by t CGLUTs in y direction; and (c) coupling to GCGLUTs located along and under the group of g global interconnects. Similarly, each of the plurality of global interconnects miming in y-direction (a) comprises g interconnects; (b) is separated from its nearest neighboring group of global interconnects by s CGLUTs in x direction; and (c) coupling to GCGLUTs located along and under the group of g global interconnects. The locations of the GCGLUTs may be located in the CGFS array at (1+p (s+1), 1+q(t+1)), wherein p and q are positive integers. For example, a CGFS comprising an array of CGLUTs at locations from (1,1) to (M, N), wherein GCGLUTs are at locations of (1,1), (1+s+1, 1), (1+2(s+1), 1), (1+3(s+1), 1), . . . , (1, 1+t+1), (1+s+1, 1+t+1), (1+2(s+1), 1+t+1), (1+3(s+1), 1+t+1), . . . , (1, 1+2(t+1)), (1+s+1, 1+2(t+1)), (1+2(s+1), 1+2(t+1)), (1+3(s+1), 1+2(t+1)), . . . , The rest of CGLUTs are associated with an NIC, and not directly couple to the global interconnects of the global interconnection scheme.

The method and design for a GCGLUT couples to the g global interconnects is described and specified in the following. The GCGLUT is the same as the CGLUT, as described and specified above, except adding capability to couple to other GCGLUTs not located at its nearest neighbors. The g global interconnects miming in x-direction and y-direction couple to k input points of the GCGLUT, therefore k=4w+2g for the GCGLUT. The selection circuit of the GCGLUT selects from input data at the 4w+2g input points, in accordance with the configuration data stored in 6T SRAM cell or cells or dual port SRAM cell or cells, as output data at r output interconnects for the row decoder, and at c output interconnects for the column decoder. The j output interconnects for the GCGLUT couple to g global interconnects running in x-direction through a programmable switch, and couple to g global interconnects running in y-direction through another programmable switch, wherein the programmable switches are as described and specified for the FPGA (FGFPGA) IC chip above. Each of the programmable switches is configured for pass or not-pass of the data at the j output interconnects. The GCGLUT may couple to its four nearest neighboring CGLUTs and/or GCGLUTs at a distance.

Alternatively, all the CGLUTs in the CGFS array are the GCGLUTs and couples to the global interconnects; that means, s and t are equal to zero, and each of the CGLUTs in the CGFS array is around the periphery of the GIC and NIC.

A Long Distance Programmable Interconnection Unit (LDPIU) is used, alternatively, to provide a long distance interconnection for a CGLUT directly coupling to another CGLUT not located at its nearest neighbors and at a long distance away from the CGLUT, for example, separated by u CGLUTs in x direction, and by v CGLUTs in y direction, wherein u and v are positive integers and u may be equal to v in some designs, wherein u>=8, 16, 32, 64, 128 or 256 and v>=8, 16, 32, 64, 128 or 256. The LDPIUs are distributed in the CGFS array same as GCGLUTs in a CGFS array except (a) that the separating distance between two LDPIUs is greater than that between two GCGLUTs, wherein u>s, and v>t; (b) the GCGLUTs are replaced by LDPIUs and (c) the global interconnects in the global interconnection scheme are replaced by a plurality of segments of Long Distance Interconnects. A LDPIU by-passes or passes the data and signals coming from one direction of top, left, bottom and right directions to any one of the other 3 directions.

The LDPIU comprises 8 selection circuit units with 2 units at the top, left, bottom and right directions, respectively. Among them, four selection circuit units at top, left, bottom and right couple to the Neighbor Interfacing Circuits (NIC) associated with four nearest neighboring CGLUTs, respectively, for delivering data or signals to the four nearest neighboring CGLUTs from f long distance interconnects in each direction. Each of the four selection circuit units has (4f+3w) input points, and configured to select from input data or signals at its (4f+3w) input points, in accordance with the configuration data stored in 6T SRAM cell or cells or dual port SRAM cell or cells, as output data at its w output points, wherein the output data at its w output points couple to the Neighbor Interfacing Circuit (NIC) associated with its nearest neighboring CGLUT. Each of the other four among the 8 selection circuit units at top, left, bottom and right of the LDPIUs couples to f long distance interconnects for delivering data or signals to a nearest neighboring LDPIU. Each of the four other selection circuit units has (4w+3f) input points, and configured to select form input data or signals at its (4w+3f) input points, in accordance with the configuration data stored in 6T SRAM cell or cells or dual port SRAM cell or cells, as output data at its f output points, wherein the f output points couple to the nearest neighboring LDPIU through the f long distance interconnects for delivering data or signals to four CGLUTs located at the top, left, bottom and right of its nearest neighboring LDPIU located at a distance from the LDPIU.

A CGFS may comprise an array of CGLUTs with M rows and N columns with a plurality of LDPIUs replacing some of the CGLUTs and at a location of (1+p(u+1), 1+q(v+1)). For example, a CGFS comprising an array of CGLUTs at locations from (1,1) to (M, N), wherein LDPIUs are at locations of (1,1), (1+s+1, 1), (1+2(s+1), 1), (1+3(s+1), 1), . . . , (1, 1+t+1), (1+s+1, 1+t+1), (1+2(s+1), 1+t+1), (1+3(s+1), 1+t+1), . . . , (1, 1+2(t+1)), (1+s+1, 1+2(t+1)), (1+2(s+1), 1+2(t+1)), (1+3(s+1), 1+2(t+1)), . . . . Therefore, a CGLUT in the array may couple to its four nearest neighboring CGLUTs through the NIC circuits and/or other CGLUTs at a distance through LDPIUs.

The CGFP IC chip comprises the configurable and reconfigurable CGLUTs and interconnection circuits, and volatile (for example, SRAMs) and/or non-volatile memory cells for storing data therein, wherein the data is used for configuring or reconfiguring the configurable and reconfigurable CGLUTs and interconnection circuits. The configurable and reconfigurable CGLUTs and interconnection circuits are configured or reconfigured by the data stored in the volatile and/or non-volatile memory cells. When CGLUTs in the CGFS array of the CGFP IC chip are configured or reconfigured for a specific function and application, the configurable and reconfigurable interconnection circuits may be meanwhile configured or reconfigured by changing the corresponding configuration or reconfiguration interconnection data stored in on-chip the volatile and/or non-volatile memory cells. When CGLUTs in the CGFS array of the CGFP IC chip are configured or reconfigured for a first specific function and application, their corresponding configurable and reconfigurable interconnection circuits may be configured or reconfigured using a first specific configuration or reconfiguration interconnection data stored in the on-chip volatile and/or non-volatile memory cells; the CGFP IC chip is then configured or reconfigured to perform the first specific function or application. When the CGLUTs in the CGFS array of the CGFP IC chip are configured or reconfigured for a second specific function or application, a second specific configuration or reconfiguration interconnection data are loaded and stored in the on-chip volatile and/or non-volatile memory cells for the corresponding configurable and reconfigurable interconnection circuit, the CGFP IC chip is configured or reconfigured to perform the second specific function or application.

The CGFP IC chip may, in addition, comprise (in the same chip) the field programmable, configurable and reconfigurable logic and interconnection circuits of the FPGA IC chip or chips, as described and specified above. By doing this, the CGFP IC chip provides both the fine-grain and coarse-grain field programmable, configurable and reconfigurable capability or functions on the same IC chip.

All description, specification, function and application related to the FPGA IC chip or chips in this patent application are applied to the CGFP IC chip or chips, except for those described and specified for the CGFP IC chip or chips.

All the 2D-horizontal and/or 3D-stacked chip package or logic drive, or, multichip package or logic drive, comprising the FPGA IC chip or chips, described and specified in this patent application are applied to those comprising the CGFP IC chip or chips. The 2D-horizontal and/or 3D-stacked chip package or logic drive, or, multichip package or logic drive may comprise the CGFP IC chip or chips, one or a plurality of non-volatile memory IC chips and/or one or a plurality of cooperating or supporting (CS) IC chips in the same chip package or multichip, wherein one or a plurality of non-volatile memory IC chip is used to store the programming, configuration or reconfiguration data for programming, configuring or reconfiguring the CGFP IC chip or chips. The nonvolatile memory IC chip or chips in the same chip package or multichip package comprising the CGFP IC chip is used to store and backup: (i) programming, configuration and re-configuration data for each CGLUT of the CGFS array on the CGFP IC chip, stored in the on-chip volatile memory cells (for example, SRAMs); and (ii) programming, configuration or reconfiguration interconnection data for programming, configuring or reconfiguring the programmable, configurable and reconfigurable interconnection circuit of the CGFP IC chip, stored in the on-chip volatile memory cells (for example, SRAMs). The non-volatile memory IC chip may be a NAND flash memory chip or NOR flash memory chip. The non-volatile memory IC chip may be used to store data for configurable and reconfigurable CGLUTs and interconnection circuits on the CGFP IC chip or chips. For example, a CGLUT is programmed, configured or reconfigured using a first specific data stored in the on-chip volatile memory cells for a first specific function or application. When a second specific instruction set is loaded and stored in the on-chip volatile memory cells of the CGLUT, the CGLUT is programmed, configured or reconfigured to perform a second specific function or application. The first and second specific data stored in the volatile memory cells of the CGFP IC chip may be downloaded from those stored and backed up in a plurality of non-volatile memory cells in the non-volatile memory IC chip in the same chip package or multichip package comprising the CGFP IC chip. A user may program, configure or reconfigure the CGFP IC chip for performing the first or second specific function or application by selecting the first or second specific data respectively stored in the non-volatile memory cells of the non-volatile memory IC chip and loading it to the volatile memory cells of the CGFP IC chip.

Another aspect of the disclosure provides the 2D-horizontal and/or 3D-stacked chip package or logic drive, or, multichip package or logic drive, comprising the FPGA IC chip or chips (as described and/or specified above) and the CGFP IC chip or chips (as described and/or specified above) in the same multichip package, wherein the multichip package may be: (i) the CGFP IC chip or chip-package is packaged on a same horizontal plane as the FPGA IC chip or chip-package in the same 2D-horizontal multichip package, as described and specified above; (ii) the CGFP IC chip or chip-package is packaged on or over the FPGA IC chip or chips in the same 3D-stacked multichip package, as described and specified above; (ii) the FPGA IC chip or chip-package is packaged on or over the CGFP IC chip or chip-package in the same 3D-stacked multichip package, as described and specified above. The FPGA chip-package or the CGFP chip-package may further comprise one or a plurality of non-volatile memory IC chips and/or one or a plurality of cooperating or supporting (CS) IC chips in the same chip package or multichip, wherein one or a plurality of non-volatile memory IC chip is used to store the programming, configuration or reconfiguration data for programming, configuring or reconfiguring the FPGA or CGFP IC chip or chips. The purposes, relations and functions of the one or the plurality of non-volatile memory IC chips and/or the one or the plurality of cooperating or supporting (CS) IC chips (in the same chip-package) related to the FPGA or CGFP IC chip or chips are the same as those described and specified for the FPGA IC chip or chips. By doing this, the 2D-horizontal and/or 3D-stacked chip package or logic drive, or, multichip package or logic drive provides both the fine-grain and coarse-grain field programmable, configurable and reconfigurable capability or functions.

Another aspect of the disclosure provides a method and circuits for interconnecting or coupling between the FUBs in the FUB array in the CGRA IC chip by a Neighbor Interfacing Circuit (NIC), as an alternative of the programmable, configurable and reconfigurable interconnection circuit described and specified for interconnecting FUBs. The description and specification of the Neighbor Interfacing Circuit (NIC) are the same as in the CGFS of the CGFP IC chip. For coupling to the NIC, each of the FUBs in the FUB array needs to add a selection circuit programmed, configured or reconfigured for selecting data from the four nearest neighbors (in the NIC network). The selection circuit is added between the input points of the FUB and the input points of the Function Unit (FU). The selection circuit is the same as that in the CGLUT in the CGFP IC chip, comprising: (a) k input points coupling to k input interconnects for $2^k$ possible input data, k=4w, (w is the number of input interconnects from each of the four nearest neighboring FUBs; (b) h output points coupling to h input points of the FU, wherein h is a positive integer; (c) h multiplexers, each multiplexer comprises k first input points, one or a plurality second input points and 1 output point, wherein each of the multiplexer is configured to select data at one from the k first input points, in accordance with data at the one or the plurality second input points, as output data at the output point, wherein data at the one or the plurality second input points for configuring each of the h multiplexers are stored in 6T SRAM cell or cells or dual port SRAM cell or cells. As described and specified above, the FUB has output data at its j output points from the output points of the register or flip-flop of the FUB. The j output points of the FUB are coupling to the Neighbor Interfacing Circuit (NIC) in the same way as in the CGFS of the CGFP IC chip.

Another aspect of the disclosure provides a method and circuits for interconnecting or coupling between the FUBs in the FUB array in the CGRA IC chip by a Neighbor Interfacing Circuit (NIC) and Global Interconnection Circuit (GIC), as an alternative of the programmable, configurable and reconfigurable interconnection circuit described and specified for interconnecting FUBs. The description and specification of the Neighbor Interfacing Circuit (NIC) and Global Interconnection Circuit (GIC) are the same as in the CGFS of the CGFP IC chip. For coupling to the NIC and GIC circuits, each of the FUBs in the FUB array needs to add a selection circuit programmed, configured or reconfigured for selecting data from the four nearest neighbors (in the NIC network) and from other FUBs at distance and not at its nearest neighbors. (in the GIC network). The selection circuit is added between the input points of the FUB and the input points of the Function Unit (FU). The selection circuit is the same as that in the CGLUT in the CGFP IC chip, comprising: (a) k input points coupling to k input interconnects for $2^k$ possible input data, k=4w+2g, (w is the number of input interconnects from each of the four nearest neighboring FUBs and g is the number of input interconnects from FUBs at distance and not at the nearest neighbors, for NIC and GIC respectively. Therefore, the FUB now has k=4w+2g input points; (b) h output points coupling to h input points of the FU; (c) h multiplexers, each multiplexer comprises k first input points, one or a plurality second input points and 1 output point, wherein each of the multiplexer is configured to select data at one from the k first input points, in accordance with data at the one or the plurality second input points, as output data at the output point, wherein data at the one or the plurality second input points for configuring each of the u multiplexers are stored in 6T SRAM cell or cells or dual port SRAM cell or cells. As described and specified above, the FUB has output data at its j output points from the output points of the register or flip-flop of the FUB. The j output points of the FUB are coupling to the Neighbor Interfacing Circuit (NIC) and Global Interconnection Circuit (GIC) in the same way as in the CGFS of the CGFP IC chip.

Another aspect of the disclosure provides a method and circuits for interconnecting or coupling between the FUBs in the FUB array in the CGRA IC chip by a Neighbor Interfacing Circuit (NIC) and the Long Distance Programmable Interconnection Unit (LDPIU), as an alternative of the programmable, configurable and reconfigurable interconnection circuit described and specified above for interconnecting FUBs. The description and specification of the Neighbor Interfacing Circuit (NIC) and the Long Distance Programmable Interconnection Unit (LDPIU) are the same as in the CGFS of the CGFP IC chip. For coupling to the NIC and GIC circuits, each of the FUBs in the FUB array needs to add a selection circuit programmed, configured or reconfigured for selecting data from the four nearest neighbors (in the NIC network) and from other FUBs at distance and not at its nearest neighbors, (in the GIC network). The selection circuit is added between the input points of the FUB and the input points of the Function Unit (FU). The selection circuit is the same as that in the CGLUT in the CGFP IC chip, comprising: (a) k input points coupling to k input interconnects for $2^k$ possible input data, k=4w, (w is the number of input interconnects from each of the nearest neighbors or from other FUBs at distance and not at its nearest neighbors). Therefore, the FUB now has k=4w input points; (b) h output points coupling to h input points of the FU; (d) h multiplexers, each multiplexer comprises k first input points, one or a plurality second input points and 1 output point, wherein each of the multiplexer is configured to select data at one from the k first input points, in accordance with data at the one or the plurality second input points, as output data at the output point, wherein data at the one or the plurality second input points for configuring each of the u multiplexers are stored in 6T SRAM cell or cells or dual port SRAM cell or cells. As described and specified above, the FUB has output data at its j output points from the j output points of the register or flip-flop of the FUB. The j output points of the FUB are coupling to the Neighbor Interfacing Circuit (NIC) and the Long Distance Programmable Interconnection Unit (LDPIU), in the same way as in the CGFS of the CGFP IC chip. All description and/or specification related to the FPGA IC chip or chips in this patent application are applied to the CGRA IC chip or chips (described and specified above), except those described and specified for the CGRA IC chip or chips. All the 2D-horizontal and/or 3D-stacked chip package or logic drive, or, multichip package or logic drive, comprising the FPGA IC chip or chips, described and/or specified in this patent application are applied to those comprising the CGFP IC chip or chips. The 2D-horizontal and/or 3D-stacked chip package or logic drive, or, multichip package or logic drive may comprise the CGFP IC chip or chips, one or a plurality of non-volatile memory IC chips and/or one or a plurality of cooperating or supporting (CS) IC chips in the same chip package or multichip, wherein one or a plurality of non-volatile memory IC chip is used to store the programming, configuration or reconfiguration data for programming, configuring or reconfiguring the CGFP IC chip or chips.

Another aspect of the disclosure provides a standard general-purpose commonalty system, device or logic drive based on a method, algorithm and/or architecture to optimize its performance in the 2D or 3D multichip package, wherein the 2D or 3D multichip package is as described and specified above, and comprises the one or the plurality of standard commodity field programmable IC (FPIC) chips (comprising the FGFPGA, CGRA and CGFP IC chips), the one or the plurality of NVM IC chips, the one or the plurality of cooperating or supporting IC chips (as described and specified above), and/or one or a plurality of processing and/or computing IC chips, for example, a Central Processing Unit (CPU) chip, Graphic Processing Unit (GPU) chip, Data Processing Unit (DPU) chip, Digital Signal Processing (DSP) chip, Tensor Processing Unit (TPU) chip, Application Processing Unit (APU) chip, Artificial Intiligent Unit (AIU), Machine Learning Unit (MLU) and/or Application Specific IC (ASIC) chip, wherein the one or the plurality of standard commodity FPIC chips comprise FGFPGA, CGRA and/or CGFP IC chips, as described and specified above. The performance optimization may be exercised on the CPU, GPU, DPU and FPGA IC chips in the above 2D or 3D multichip package. The 2D or 3D multichip package may be operated based on the CPU chip therein using a CPU common programming language used in programming the CPU operations/processes, for example, the CPU common language may comprise python, JavaScript, Java, C#, C, or C++, Scala, Swift, Matlab, Assembly Language, Pascal, Visual Basic, or PL/SQL language. The CPU IC chip: (a) analyzes and assesses an incoming software program for a requested job, written in one of the common programming languages, and comprising a plurality of operation/process steps, and (b) decides which IC chip (among the CPU, GPU, DPU and FPIC chips in the 2D or 3D multichip package) is adequate to perform an operation/process step of the plurality of operation/process steps. For example, the requested job may comprise 6 operation/process steps, with operation/process Step 1, 2, 3 and 4 in series, and operation/process Step 1a and 1b in parallel with Steps 1-4. After analysis and assessment, the CPU may perform operation/process Step 1 to Step 4 itself as the usual CPU operation/process based on one of the CPU common programming languages, while assign and dispatch: (i) operation/process Step 1a and Step 2 to the GPU or DPU IC chip in the same 2D or 3D multichip package by translating the CPU common language to a language CUDA for the GPU or DPU IC chip. The CUDA language is developed for a GPU or DPU IC chip used for general purpose (General Purpose GPU or DPU, GPGPU or GPDPU), wherein the CUDA language comprises RISC instructions in an instruction set for highly-parallel operation/process, for example a computing operation/process with a bit width equal to or greater than 256, 512, 1024, 2048, 5120, 10,240 bits, as compared to CPU with operation/process (in series) with a bit width equal to or smaller than 32, 64, 128 or 256. The operation/process Step 1a does not require the computing/Process (C/P) result from operation/process Step 1 to Step 3. The CPU performs the translation of the common CPU programming language in the CPU software program for the operation/process Step 1a into the GPU CUDA language. The GPU or DPU IC chip preforms the operation/process Step 1a, based on the translated CUDA language of instructions, in parallel with the operation/process Step 1 to Step 3, and returning the computing/Process (C/P) result out of the operation/process Step 1a to the CPU IC chip for use at operation/process Step 4. The operation/process Step 2 requires computing/Process (C/P) result from operation/process Step 1. The GPU or DPU IC chip waits until the CPU finishes the operation/process Step 1, and then preforms the operation/process Step 2, and returning the computing/Process (C/P) result out of the operation/process Step 2 to the CPU IC chip for use at operation/process Step 3, wherein the CPU performs the translation of the common CPU programming language in the CPU software program for the operation/process Step 2 into the GPU CUDA language, and the GPU or DPU IC chip preforms the operation/process Step 1a, based on the translated CUDA language of instructions; (ii) operation/process Step 1b and Step 3 to the FPIC chip in the same 2D or 3D multichip package, wherein the FPIC chip comprises FGFPGA, CGRA and CGFP IC chips. The FPIC chip is configured for use as a computing/processing accelerator to speed up the operation/processes. In order to execute the operation/process Step 1b, the FPIC chip needs to configured first. The CPU requests a NVM IC chip in the same 2D or 3D multichip package to send a first specific configuration set stored therein to configuring the FPIC chip; wherein the first specific configuration set is selected from a plurality of specific configuration sets stored in the NVM IC chip based on the operation/process Step 1b. Each of the plurality of specific configuration sets for the FPIC chip was developed, compiled, verified and debugged for a specific purpose or application before installed and stored in the NVM IC chip in the 2D or 3D package. The number of the plurality of configuration sets may be equal to or greater than 2, 3, 4, 5, 10, 20, 50, 100. The CPU translates the CPU common program language of the operation/process Step 1b into an OpenCL language, and the FPIC chip executes the operation/process Step 1b based on the translated OpenCL software, in parallel with the operation/process Step 1 to Step 3, and returning the computing/Process (C/P) result out of the operation/process Step 1b to the CPU IC chip for use at operation/process Step 4. The OpenCL software is a software written in a standard open computing language (OpenCL, Open Computing Language) for parallel programming of heterogeneous systems. The operation/process Step 3 requires computing/Process (C/P) result from operation/process Step 2. The FPIC chip waits until the CPU finishes the operation/process Step 2, and then preforms the operation/process Step 3, and returning the computing/Process (C/P) result out of the operation/process Step 3 to the CPU IC chip for use at operation/process Step 3 and 4. Similar to that in the operation/process Step 1b, in order to execute the operation/process Step 3, the FPIC chip needs to be configured again. The CPU requests a NVM IC chip in the same 2D or 3D multichip package to send a second specific configuration set stored therein to configure the FPIC chip; wherein the second specific configuration set is selected from the plurality of specific configuration sets stored in the NVM IC chip based on the operation/process Step 3; the plurality of specific configuration sets are described and specified above. The CPU translates the CPU common program language of the operation/process Step 3 into an OpenCL language, and the FPIC chip executes the operation/process Step 3 based on the translated OpenCL software, and returning the computing/Process (C/P) result out of the operation/process Step 3 to the CPU IC chip for use at operation/process Step 4.

Alternatively, the FPIC chip may be configured using a configuration language Verilog sequentially, not in advance, at the time of performing the operation/process Step 1b and Step 3, described in (ii) above. The FPIC chip is not configured, as described above, using a specific configuration data set stored in the NVM IC chip in the same 2D or 3D package as the FPIC chip. For example, at the time to perform the operation/process Step 1b, the FPIC chip is configured based on the operation/process Step 1b using the Verilog instruction language. After the FPIC chip is configured, the CPU translates the CPU common program language of the operation/process Step 1b into an OpenCL language, and the FPIC chip executes the operation/process Step 1b based on the translated OpenCL software, in parallel with the operation/process Step 1 to Step 3, and returning the computing/Process (C/P) result out of the operation/process Step 1b to the CPU IC chip for use at operation/process Step 4. The operation/process Step 3 may be performed similarly as the operation/process Step 1b. At the time to perform the operation/process Step 3, the FPIC chip is configured based on the operation/process Step 3 using the Verilog instruction language. After the FPIC chip is configured, the CPU translates the CPU common program language of the operation/process Step 3 into an OpenCL language, and the FPIC chip executes the operation/process Step 3 based on the translated OpenCL software and returning the computing/Process (C/P) result out of the operation/process Step 3 to the CPU IC chip for use at operation/process Step 4.

As an example for the standard general-purpose commodity system, device or logic drive in the 2D or 3D multichip package comprising multichip packages (a CPU multichip package, a CPU multichip package, and a FPIC multichip package) on the silicon interposer (similar to Chip-On-InterPoser), wherein the CPU and GPU/DPU multichip packages comprising the CPU and GPU/DPU IC chips respectively are the same as the 2D or 3D multichip package for the FPGA chip, as described and specified above, just having the CPU and GPU/DPU IC chips therein respectively instead of having the FPGA chip.

The CPU, GPU/DPU and FPIC chips may be standard commodity products each having only one or a few versions of standard designs and products in a technology node (more advanced than 20 nm or 10 nm) of semiconductor IC manufacturing processes. The general-purpose system, device or logic drive, comprising standard general-purpose commodity CPU, GPU/DPU and FPIC chips, provides a method to reduce the cost of Non-Recurring-Expense (NRE) in developing, designing and implementing the IC chips, as compared to developing, designing and implementing in an Application-Specific IC (ASIC) chip.

The standard general-purpose commonalty system, device or logic drive using the disclosed method, algorithm and/or architecture to optimize its performance in the 2D or 3D multichip package utilizes: (i) the general-purpose, high flexibility property of the CPU IC chip, wherein the CPU IC chip may be programmed by a variety of software programs each for executing a specific application; (ii) the high-efficiency and highly-parallel processing capability of the GPU IC chip programmed by software programs; and (iii) the computing/process acceleration and high flexibility property of the FPIC chip by configurating or reconfiguration the hardware circuits in the FPIC chip using configuration/reconfiguration software programs.

The performance optimization method described and specified above may be also applied to a system comprising CPU, GPU/DPU and FPIC chips, wherein the system may be in physical assembly or package formats, other than the 2D or 3D multichip packages, described and specified above. For example, the system may be on a printed circuit board (PCB), on a ball-Grid-Array (BGA) substrate, in a computer, in a processor device, in a mobile phone, an Artificial Intelligent (AI) machines, and/or in a communication device.

The separated non-volatile memory chip packaged in the same multichip package for configuring and/or reconfiguring the FPIC chip packaged in the same multichip package in Case (v) above has I/O pins (metal pads, bumps or pillars) comprising: (i) configuration/reconfiguration data or signal IO pins for (a) writing data into the non-volatile memory chip from external circuits (of the multichip package) and coupling to the external circuits through I/O pins of the multichip package, and (b) writing data into the FPIC chip from the non-volatile memory chip, wherein the configuration/reconfiguration data or signal IO pins couple to I/O pins of the multichip package and configuration/reconfiguration data or signal IO pins of the FPIC chip; (ii) Power/Ground (P/G) I/O pins for the non-volatile memory chip coupling to P/G I/O pins of the multichip package connecting or coupling to external P/G supply; (iii) control signal pins for the non-volatile memory chip coupling to I/O pins of the multichip package coupling or connecting to external circuits; (iv) write enable pins of the non-volatile memory chip coupling to I/O pins of the multichip package coupling or connecting to external circuits; (v) address pins for (a) receiving address data from I/O pins of the multichip package during a writting stage or cycle and (b) receiving address data from the FPIC chip during a reading stage or cycle, wherein the address pins connect or couple to address I/O pins of the FPIC chip and to I/O pins of the multichip package; and (vi) read enable pins connecting or coupling to the FPIC chip and not exposed at the surfaces of the multichip package, that is, the read enable pins can not be accessed or read from the external or outside of the multichip package.

The FPIC chip or chiplet packaged in the same multichip package in Case (v) above has I/O pins (metal pads, bumps or pillars) comprising: (i) configuration/reconfiguration data or signal IO pins for reading or receiving data from the non-volatile memory chip and coupling or connecting to the configuration/reconfiguration data or signal IO pins of the non-volatile memory chip; (ii) P/G I/O pins for the FPIC chip coupling to P/G I/O pins of the multichip package coupling or connecting to external P/G supply; (iii) control signal pins for the FPIC chip coupling to I/O pins of the multichip package and coupling or connecting to external circuits; (iv) operational data or signals I/O pins of FPIC chip (for use when the FPIC chip is in the operation mode) coupling to I/O pins of the multichip package; (v) address pins for sending address data to the non-volatile memory chip during a reading stage or cycle, wherein the address pins connect or couple to the address pins of the non-volatile memory chip and to the I/O pins of the multichip package; (vi) read enable pin connecting or coupling to the non-volatile memory chip and not exposed at the surfaces of the multichip package, that is, the read enable pin can not be accessed or read from the external or outside of the multichip package.

The read enable pins of the non-volatile memory chip and FPIC chip (in the same multichip package) are coupled to each other through metal interconnects of the multichip package, wherein all of the read enable pins of the non-volatile memory chip and FPIC chip and the metal interconnects are embedded, buried, covered or sealed by a material or materials of the multichip package, for example, a molding compound, polyimide, underfill material, or insulsting dielectric material; and can not be accessed or read from the external or outside of the multichip package. The read enable function of the non-volatile memory chip is controlled by FPIC only. The FPIC chip sends read enable signal to the non-volatile memory chip during FPIC configuration/reconfiguration mode; and read disable signal to the non-volatile memory chip all the time except processing FPIC configuration/reconfiguration. Therefore, the configuration/reconfiguration data or information stored in the non-volatile memory cells are protected and can not be copied, read, accessed or stolen from external or outside of the multichip package.

These, as well as other components, steps, features, benefits, and advantages of the present application, will now become clear from a review of the following detailed description of illustrative embodiments, the accompanying drawings, and the claims.

BRIEF DESCRIPTION OF THE DRAWINGS

The drawings disclose illustrative embodiments of the present application. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings.

Figure 1A:
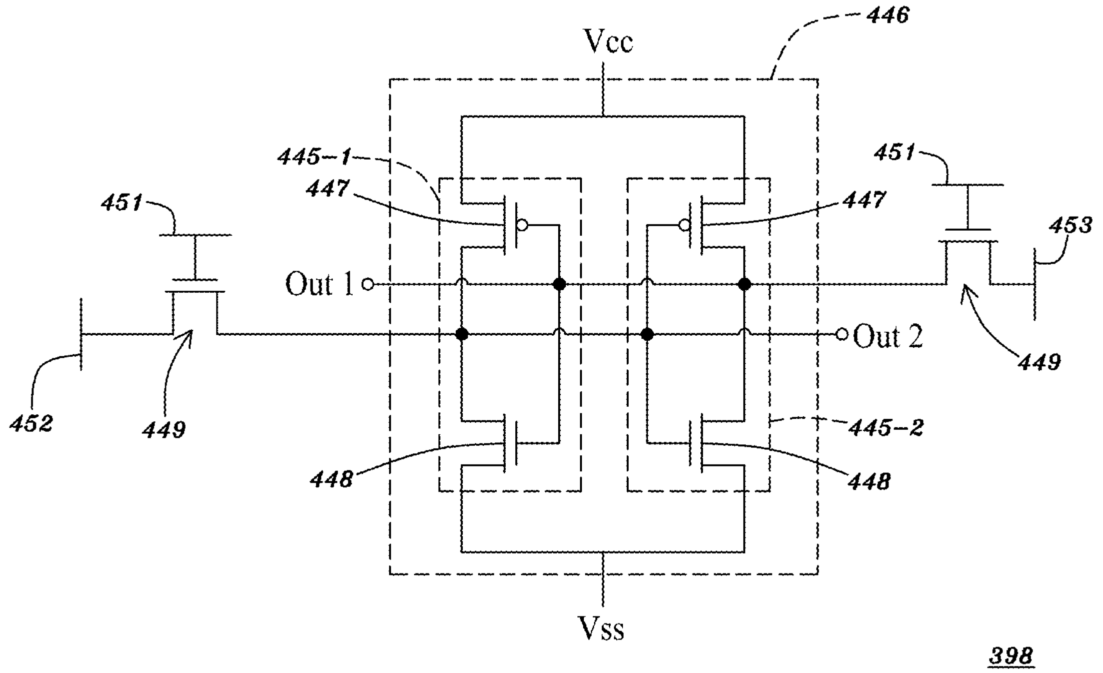
FIGS. 1A-1G are circuit diagrams illustrating various types of memory cells in accordance with an embodiment of the present application.

While certain embodiments are depicted in the drawings, one skilled in the art will appreciate that the embodiments depicted are illustrative and that variations of those shown, as well as other embodiments described herein, may be envisioned and practiced within the scope of the present application.

DETAILED DESCRIPTION OF THE DISCLOSURE

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Specification for Static Random-Access Memory (SRAM) Cells (1) First Type of SRAM Cell (6T SRAM Cell)

FIG. 1A is a circuit diagram illustrating a first type of static random-access memory (SRAM) cell in accordance with an embodiment of the present application. Referring to FIG. 1A, a first type of static random-access memory (SRAM) cell 398, i.e., 6T SRAM cell, may have a memory unit 446 composed of 4 data-latch transistors 447 and 448, that is, two pairs of a P-type MOS transistor 447 and N-type MOS transistor 448 both having respective drain terminals coupled to each other, respective gate terminals coupled to each other and respective source terminals coupled to the voltage Vcc of power supply and to the voltage Vss of ground reference, wherein the voltage Vcc of power supply may be less than 0.5 volts. The gate terminals of the P-type and N-type MOS transistors 447 and 448 in the left pair are coupled to the drain terminals of the P-type and N-type MOS transistors 447 and 448 in the right pair at a first latch node, acting as a first output point of the memory unit 446 for a first data output Out1 of the memory unit 446. The gate terminals of the P-type and N-type MOS transistors 447 and 448 in the right pair are coupled to the drain terminals of the P-type and N-type MOS transistors 447 and 448 in the left pair at a second latch node, acting as a second output point of the memory unit 446 for a second data output Out2 of the memory unit 446. In the other words, the P-type and N-type MOS transistors 447 and 448 in each of the left and right pairs may compose a latch inverter 445-1 or 445-2, wherein the drain terminals of the P-type and N-type MOS transistors 447 and 448 of each of the latch inverters 445-1 and 445-2 may be considered as an output terminal thereof and the gate terminals of the P-type and N-type MOS transistors 447 and 448 of each of the latch inverters 445-1 and 445-2 may be considered as an input terminal thereof. Thereby, the first type of static random-access memory (SRAM) cell 398 may be composed of two latch inverters 445-1 and 445-2, wherein the output terminal of each of its latch inverters 445-1 and 445-2 may couple to the input terminal of the other of its latch inverters 445-1 and 445-2. A voltage level at the first latch node is reversed to a voltage level at the second latch node.

Referring to FIG. 1A, the first type of SRAM cell 398 may further include two switches or transfer transistor 449, such as N-type or P-type MOS transistors, a first one of which has a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair, i.e., the output terminal of its latch inverter 445-1 and the input terminal of its latch inverter 445-2, and a second one of which has a gate terminal coupled to the word line 451 and a channel having a terminal coupled to a bit-bar line 453 and another terminal coupled to the drain terminals of the P-type and N-type MOS transistors 447 and 448 in the right pair and the gate terminals of the P-type and N-type MOS transistors 447 and 448 in the left pair, i.e., the output terminal of its latch inverter 445-2 and the input terminal of its latch inverter 445-1. A logic level on the bit line 452 is opposite a logic level on the bit-bar line 453. The switch 449 may be considered as a programming transistor for writing a programming code or data into storage nodes of the 4 data-latch transistors 447 and 448, i.e., at the drains and gates of the 4 data-latch transistors 447 and 448. The switches 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair, i.e., the output terminal of its latch inverter 445-1 and the input terminal of its latch inverter 445-2, via the channel of the first one of the switches 449, and thereby the logic level on the bit line 452 may be reloaded into the conductive line between the gate terminals of the P-type and N-type MOS transistors 447 and 448 in the right pair, the conductive line between the drain terminals of the P-type and N-type MOS transistors 447 and 448 in the left pair and the conductive line between the output terminal of its latch inverter 445-1 and the input terminal of its latch inverter 445-2. Further, the bit-bar line 453 may be coupled to the drain terminals of the P-type and N-type MOS transistors 447 and 448 in the right pair and the gate terminals of the P-type and N-type MOS transistors 447 and 448 in the left pair, i.e., the output terminal of its latch inverter 445-2 and the input terminal of its latch inverter 445-1, via the channel of the second one of the switches 449, and thereby the logic level on the bit line 453 may be reloaded into the conductive line between the gate terminals of the P-type and N-type MOS transistors 447 and 448 in the left pair, the conductive line between the drain terminals of the P-type and N-type MOS transistors 447 and 448 in the right pair and the conductive line between the output terminal of its latch inverter 445-2 and the input terminal of its latch inverter 445-1. Thus, the logic level on the bit line 452 may be registered or latched in the conductive line between the gate terminals of the P-type and N-type MOS transistors 447 and 448 in the right pair, in the conductive line between the drain terminals of the P-type and N-type MOS transistors 447 and 448 in the left pair and in the conductive line between the output terminal of its latch inverter 445-1 and the input terminal of its latch inverter 445-2; a logic level on the bit line 453 may be registered or latched in the conductive line between the gate terminals of the P-type and N-type MOS transistors 447 and 448 in the left pair, in the conductive line between the drain terminals of the P-type and N-type MOS transistors 447 and 448 in the right pair and in the conductive line between the output terminal of its latch inverter 445-2 and the input terminal of its latch inverter 445-1. Each of the P-type MOS transistor 447, N-type MOS transistor 448 and switches 449 may be a fin field-effect transistor (FET), gate-all-around (GAA) field-effect transistor (FET) or planar field-effect transistor (FET).

(2) Second Type of SRAM Cell (5T SRAM Cell)

Figure 1B:
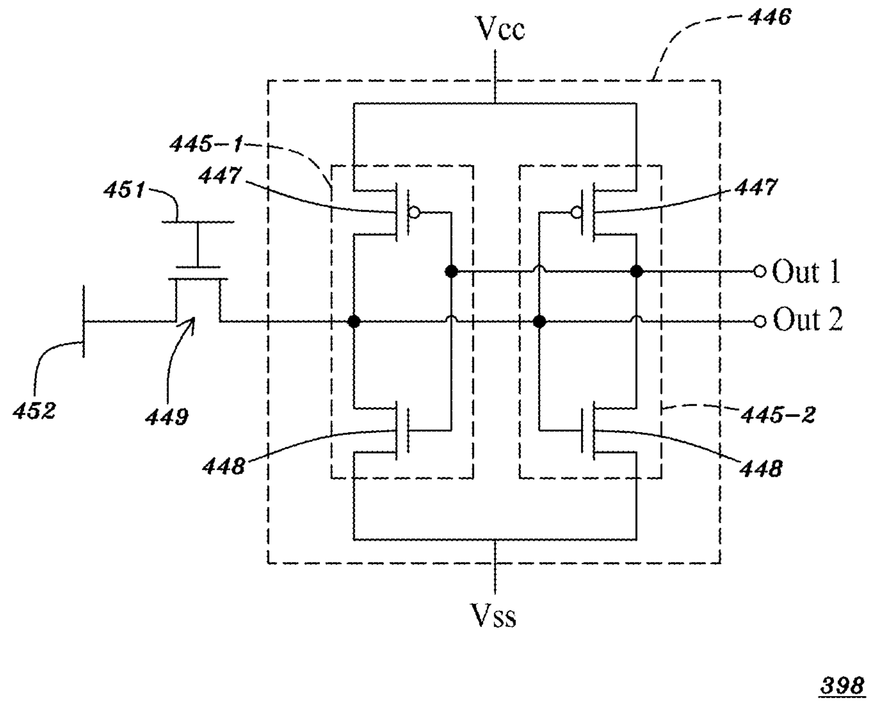

FIG. 1B is a circuit diagram illustrating a second type of static random-access memory (SRAM) cell in accordance with an embodiment of the present application. Referring to FIG. 1B, a second type of static random-access memory (SRAM) cell 398, i.e., 5T SRAM cell, may have the memory unit 446 as illustrated in FIG. 1A. The second type of static random-access memory (SRAM) cell 398 may further have a switch or transfer transistor 449, such as N-type or P-type MOS transistor, having a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair, i.e., the output terminal of its latch inverter 445-1 and the input terminal of its latch inverter 445-2. The switch 449 may be considered as a programming transistor for writing a programming code or data into storage nodes of the 4 data-latch transistors 447 and 448, i.e., at the drains and gates of the 4 data-latch transistors 447 and 448. The switch 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair, i.e., the output terminal of its latch inverter 445-1 and the input terminal of its latch inverter 445-2, via the channel of the switch 449, and thereby a logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair and the conductive line between the output terminal of its latch inverter 445-1 and the input terminal of its latch inverter 445-2. Thus, the logic level on the bit line 452 may be registered or latched in the conductive line between the gate terminals of the P-type and N-type MOS transistors 447 and 448 in the right pair, in the conductive line between the drain terminals of the P-type and N-type MOS transistors 447 and 448 in the left pair and in the conductive line between the output terminal of its latch inverter 445-1 and the input terminal of its latch inverter 445-2; a logic level, opposite to the logic level on the bit line 452, may be registered or latched in the conductive line between the gate terminals of the P-type and N-type MOS transistors 447 and 448 in the left pair and in the conductive line between the drain terminals of the P-type and N-type MOS transistors 447 and 448 in the right pair and in the conductive line between the input terminal of its latch inverter 445-1 and the output terminal of its latch inverter 445-2. Each of the P-type MOS transistor 447, N-type MOS transistor 448 and switch 449 may be a fin field-effect transistor (FET), gate-all-around (GAA) field-effect transistor (FET) or planar field-effect transistor (FET).

(3) Third Type of SRAM Cell (Dual-Port SRAM Cell)

Figure 1C:
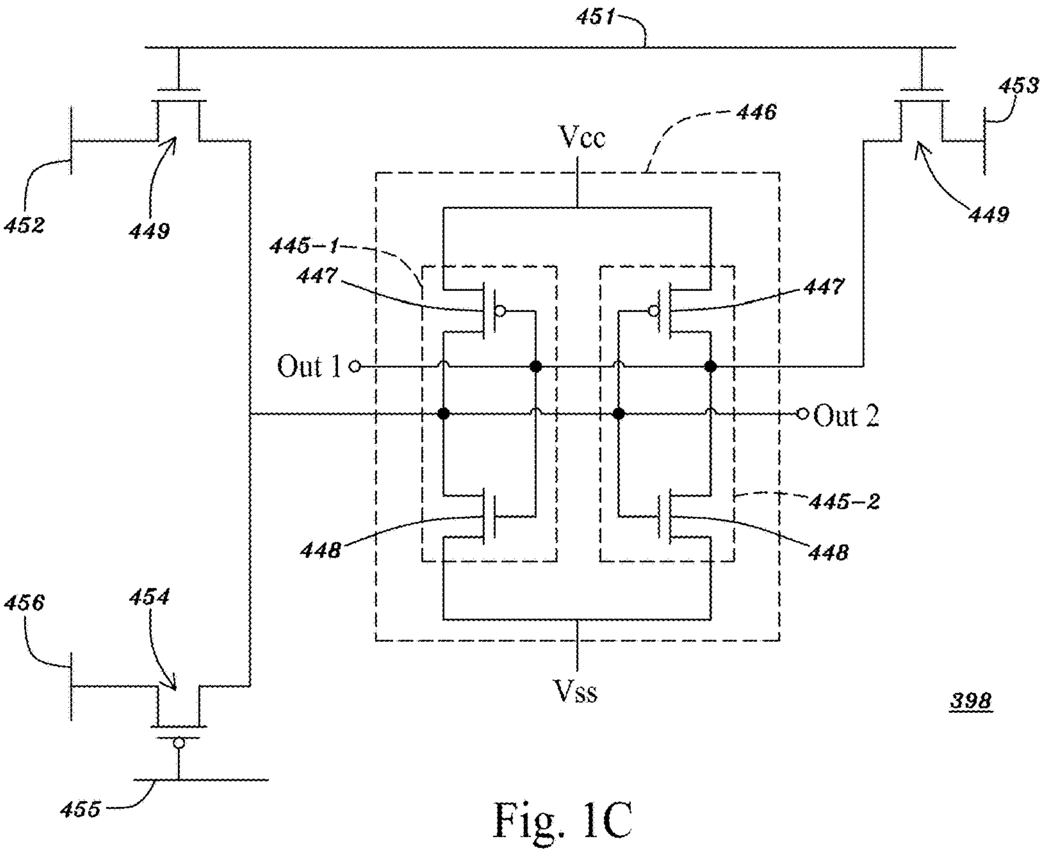
Figure 1D:
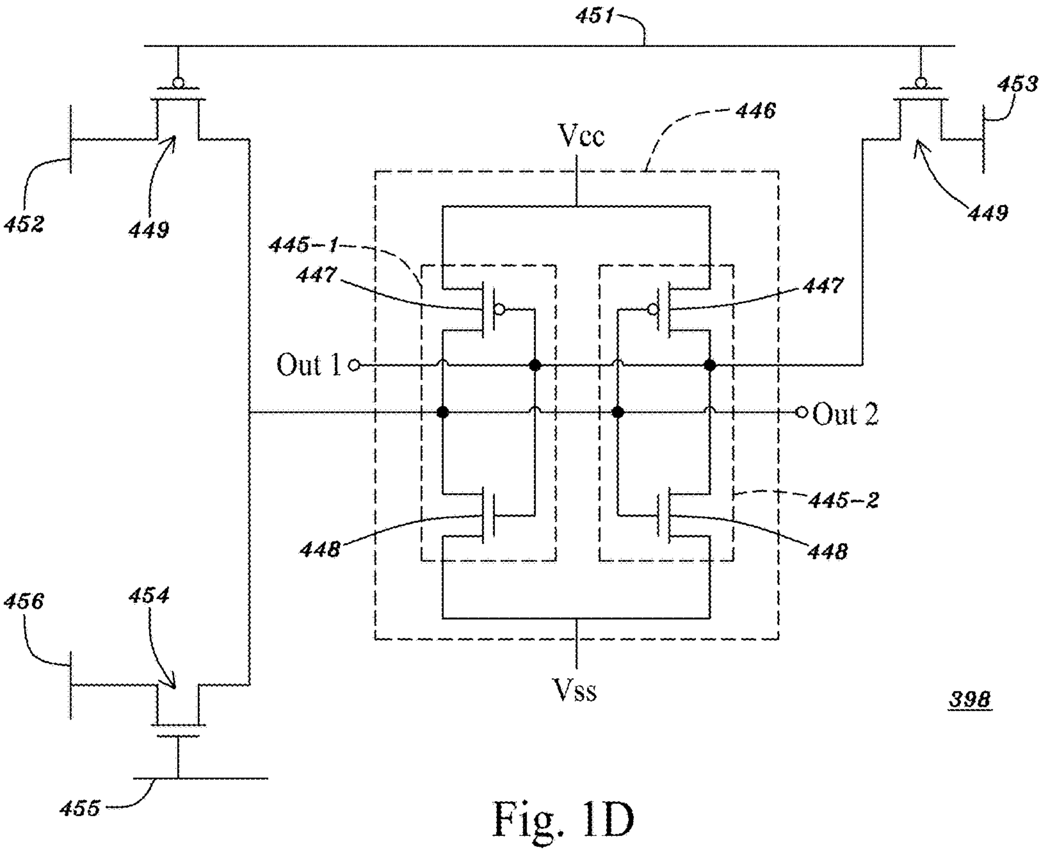
Figure 1E:
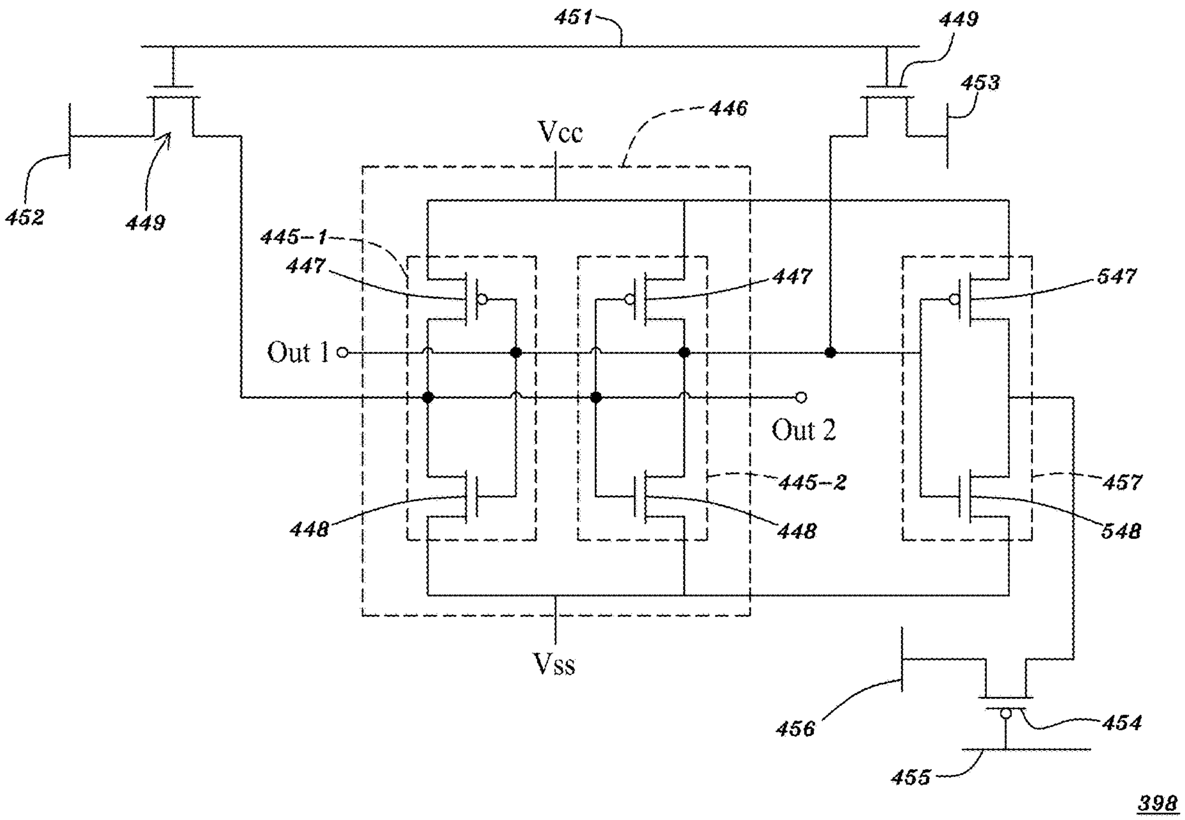
Figure 1G:
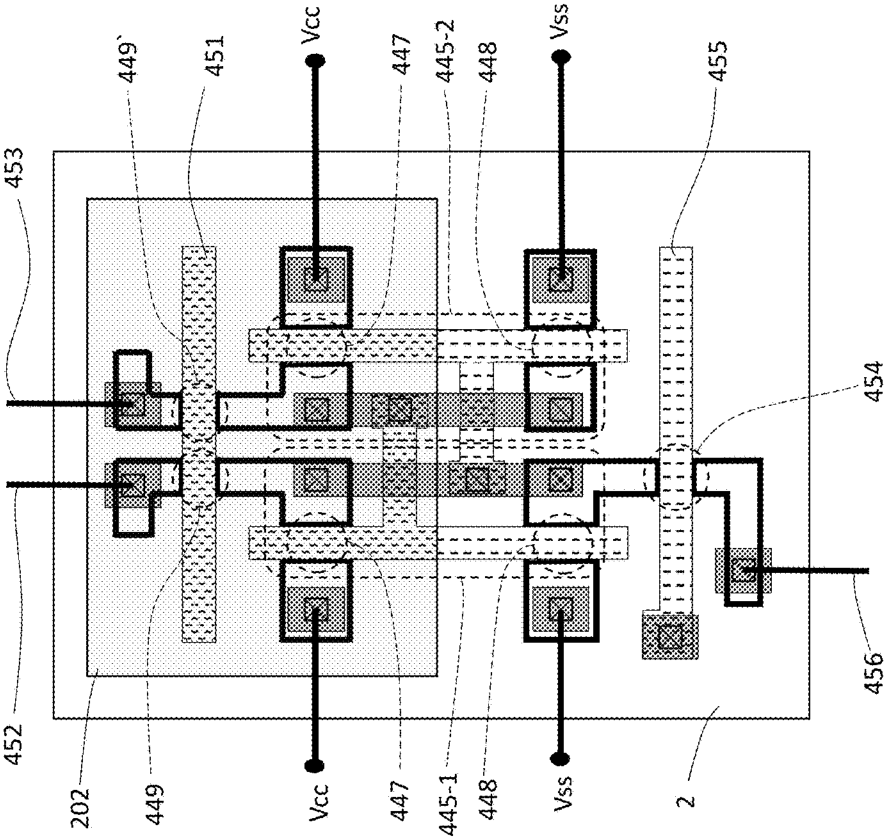
Figure 1F:
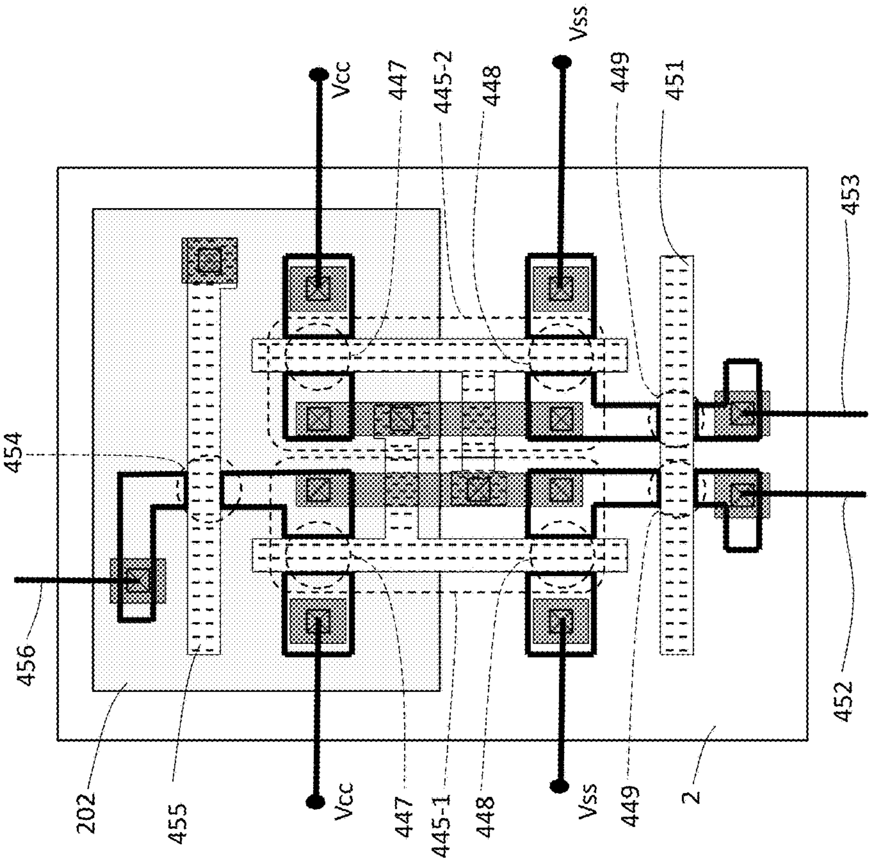

FIGS. 1C-1E are circuit diagrams illustrating a third type of static random-access memory (SRAM) cell for various alternatives in accordance with an embodiment of the present application. FIG. 1F is a top view of a circuit layout for a third type of static random-access memory (SRAM) cell for a first alternative in FIG. 1C in accordance with an embodiment of the present application. Referring to FIGS. 1C and 1F, a third type of static random-access memory (SRAM) cell 398 for a first alternative may be formed at a top surface of a semiconductor substrate 2, such as P-type substrate, of a semiconductor integrated-circuit (IC) chip 100 as seen in FIGS. 26A-26F, and a N-type well 202 is formed in the P-type substrate 2. Each region with dashes therein as seen in FIG. 1F indicates a layer of gate for a gate terminal of each of the P-type MOS transistors 447 and 454 and N-type MOS transistors 448 and 449 for the third type of static random-access memory (SRAM) cell 398 for the first alternative, each region enclosed by thick lines in the N-type well 202 as seen in FIG. 1F is a diffusion region of one of the P-type MOS transistors 447 and 454 for the third type of static random-access memory (SRAM) cell 398 for the first alternative, and each region enclosed by thick lines in the P-type substrate 2 and outside the N-type well 202 as seen in FIG. 1F is a diffusion region of one of the N-type MOS transistors 448 and 449 for the third type of static random-access memory (SRAM) cell 398 for the first alternative. Each gray region as seen in FIG. 1F indicates a metal line or pad of a bottommost one of the interconnection metal layers 6 over the semiconductor substrate 2 as seen in FIGS. 26A-26F for coupling to one or more of the diffusion regions or the layer of gate through one or more metal contacts each indicated by a square with a cross therein as seen in FIG. 1F. The third type of static random-access memory (SRAM) cell 398 for the first alternative may have a similar scheme to that for the first type of static random-access memory (SRAM) cell 398 as seen in FIG. 1A and may be referred to the illustration for FIG. 1A, but the difference between the schemes for the first and third types of static random-access memory (SRAM) cells 398 is that the third type of static random-access memory (SRAM) cell 398 as seen in FIG. 1C for the first alternative may be provided with the P-type MOS transistor 454 used as a switch or pass gate in case that each of its two switches or transfer transistors 449 is an N-type MOS transistor, which has a gate terminal coupling to a word line 455 and two diffusion regions configured to couple to each other by applying a voltage to the gate terminal of its switch or pass gate 454, wherein one of the two diffusion regions of its switch or pass gate 454 couples to a bit line 456 and the other of the two diffusion regions of its switch or pass gate 454 couples to the drain terminals of the P-type and N-type MOS transistors 447 and 448 in the left pair and the gate terminals of the P-type and N-type MOS transistors 447 and 448 in the right pair at a first latch node, i.e., the output terminal of its latch inverter 445-1 and the input terminal of its latch inverter 445-2, to control, in accordance with a voltage on the word line 455 at the gate terminal of its switch or pass gate 454, coupling between the two diffusion regions of its switch or pass gate 454. For an element indicated by the same reference number shown in FIGS. 1A and 1C, the specification of the element as seen in FIG. 1C may be referred to that of the element as illustrated in FIG. 1A. Accordingly, the third type of static random-access memory (SRAM) cell 398 may have two ports, one of which is provided by the combination of its two nodes coupling to the bit line 452 and bit-bar line 453 respectively and the other of which is provided by its node coupling to the bit line 456, to be access in different operation modes respectively.

Alternatively, for the third type of static random-access memory (SRAM) cell 398 as seen in FIG. 1C, its switch or pass gate 454 may be provided by an N-type MOS transistor in case that each of its two switches or transfer transistors 449 is provided by a P-type MOS transistor, as seen in FIG. 1D for a second alternative. FIG. 1G is a top view of a circuit layout for a third type of static random-access memory (SRAM) cell for a second alternative in FIG. 1D in accordance with an embodiment of the present application. Referring to FIGS. 1D and 1G, the third type of static random-access memory (SRAM) cell 398 for the second alternative may be formed at a top surface of a semiconductor substrate 2, such as P-type substrate, of a semiconductor integrated-circuit (IC) chip 100 as seen in FIGS. 34A-34D, and a N-type well 202 is formed in the P-type substrate 2. Each region with dashes therein as seen in FIG. 1G indicates a layer of gate for a gate terminal of each of the P-type MOS transistors 447 and 449 and N-type MOS transistors 448 and 454 for the third type of static random-access memory (SRA1M) cell 398 for the second alternative, each region enclosed by thick lines in the N-type well 202 as seen in FIG. 1G is a diffusion region of one of the P-type MOS transistors 447 and 449 for the third type of static random-access memory (SRAM) cell 398 for the second alternative, and each region enclosed by thick lines in the P-type substrate 2 and outside the N-type well 202 as seen in FIG. 1G is a diffusion region of one of the N-type MOS transistors 448 and 454 for the third type of static random-access memory (SRAM) cell 398 for the second alternative. Each gray region as seen in FIG. 1G indicates a metal line or pad of a bottommost one of the interconnection metal layers 6 over the semiconductor substrate 2 as seen in FIGS. 26A-26F for coupling to one or more of the diffusion regions or the layer of gate through one or more metal contacts each indicated by a square with a cross therein as seen in FIG. 1G.

Alternatively, a third type of static random-access memory (SRAM) cell 398 as seen in FIG. 1E for a third alternative may have a similar scheme to that for the first type of static random-access memory (SRAM) cell 398 as seen in FIG. 1A and may be referred to the illustration for FIG. 1A, but the difference between the schemes for the first and third types of static random-access memory (SRAM) cells 398 is that the third type of static random-access memory (SRAM) cell 398 as seen in FIG. 1E for the third alternative may further include a pair of a P-type MOS transistor 547 and N-type MOS transistor 548 both having respective drain terminals coupling to each other, respective gate terminals coupling to each other and respective source terminals coupling to the voltage Vcc of power supply and to the voltage Vss of ground reference, wherein the voltage Vcc of power supply may be less than 0.5 volts. In the other words, the P-type and N-type MOS transistors 547 and 548 may compose an inverter-based driver or inverter 457, wherein the drain terminals of the P-type and N-type MOS transistors 547 and 548 of the inverter-based driver or inverter 457 may be considered as an output terminal of the inverter-based driver or inverter 457, and the gate terminals of the P-type and N-type MOS transistors 547 and 548 of the inverter-based driver or inverter 457 may be considered as an input terminal of the inverter-based driver or inverter 457. The input terminal of the inverter-based driver or inverter 457 may couple to the drain terminals of the P-type and N-type MOS transistors 447 and 448 in the right pair and the gate terminals of the P-type and N-type MOS transistors 447 and 448 in the left pair at a second latch node, i.e., the output terminal of its latch inverter 445-2 and the input terminal of its latch inverter 445-1, wherein its inverter-based driver or inverter 457 is configured to invert its input data at its input terminal as its output data at its output terminal. Further, the third type of static random-access memory (SRAM) cell 398 for the third alternative may include a switch or pass gate 454, such as P-type or N-type MOS transistor, which has a gate terminal coupling to a word line 455 and two diffusion regions configured to couple to each other by applying a voltage to the gate terminal of the switch or pass gate 454, wherein one of the two diffusion regions of its switch or pass gate 454 couples to the output terminal of its inverter-based driver or inverter 457 and the other of the two diffusion regions of the switch or pass gate 454 couples to a bit line 456, to control, in accordance with a voltage on the word line 455 at the gate terminal of its switch or pass gate 454, coupling between the two diffusion regions of its switch or pass gate 454. For an element indicated by the same reference number shown in FIGS. 1A and 1E, the specification of the element as seen in FIG. 1E may be referred to that of the element as illustrated in FIG. 1A. Accordingly, the third type of static random-access memory (SRAM) cell 398 for the third alternative may have two ports, one of which is provided by the combination of its two nodes coupling to the bit line 452 and bit-bar line 453 respectively and the other of which is provided by its node coupling to the bit line 456, to be access in different operation modes respectively. A voltage level at the first latch node, i.e., Out 2, is reversed to a voltage level at the second latch node, i.e., Out 1, and thus a voltage level at an output point of the third type of static random-access memory (SRAM) cell 398, that is, a voltage level at the bit line 452, is reversed to a voltage level at another output point of the third type of static random-access memory (SRAM) cell 398, that is, a voltage level at the bit-bar line 453, and is the same as a voltage at the other output point of the third type of static random-access memory (SRAM) cell 398, that is, a voltage level at the bit line 456. Each of the P-type MOS transistor 447, N-type MOS transistor 448 and switches 449 and 454 may be a fin field-effect transistor (FET), gate-all-around (GAA) field-effect transistor (FET) or planar field-effect transistor (FET).

Specification for Fined-Grained Field Programmable Logic Blocks

1. First Type of Fined-Grained Field Programmable Logic Cell or Element (LCE)

Figure 2A:
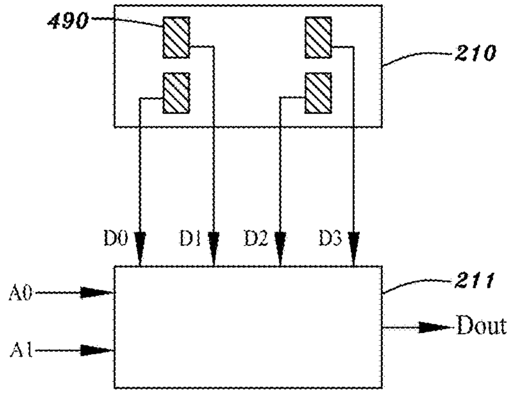
FIGS. 2A-2C are schematic view showing block diagrams of various types of fined-grained field programmable logic cell or element (LCE) in accordance with an embodiment of the present application.

FIG. 2A is a schematic view showing a block diagram of a first type of fined-grained field programmable logic cell or element (LCE) in accordance with an embodiment of the present application. Referring to FIG. 2A, the first type of fined-grained field programmable logic cell or element (LCE) 2014, i.e., first type of fined-grained field configurable logic cell or element, may be configured to perform logic operation on its input data set, i.e., A0 and A1. The first type of fined-grained field programmable logic cell or element (LCE) 2014 may be a logic gate or circuit including (1) multiple memory cells 490, i.e., configuration-programming-memory (CPM) cells, each configured to save or store one of resulting values or programming codes, e.g., D0, D1, D2 and D3, of its look-up table (LUT) 210, i.e., CPM data, and (2) a selection circuit 211, such as multiplexer, coupling to its memory cells 490 and configured to receive the resulting values of its look-up table (LUT) 210. For the first type of fined-grained field programmable logic cell or element (LCE) 2014, its selection circuit 211 may include a first set of two input points arranged in parallel for a first input data set of its selection circuit 211 associated with the input data set, i.e., A0 and A1, of the first type of fined-grained field programmable logic cell or element (LCE) and a second set of four input points arranged in parallel for a second input data set, e.g., D0, D1, D2 and D3, of its selection circuit 211 each associated with one of the resulting values or programming codes of its look-up table (LUT) 210 saved or stored in its memory cells 490. Its selection circuit 211 is configured to select, in accordance with the first input data set, e.g., A0 and A1, of its selection circuit 211, a data input from the second input data set, e.g., D0, D1, D2 and D3, of its selection circuit 211 as a data output, i.e., Dout, of its selection circuit 211 for output data of the first type of fined-grained field programmable logic cell or element (LCE) 2014. Each of its memory cells 490 may be (1) a volatile memory cell, such as static-random-access-memory (SRAM) cell having the specification as illustrated in any of FIGS. 1A-1G, or (2) a non-volatile memory cell, such as magnetoresistive random-access-memory (MRAM) cell, resistive random-access-memory (RRAM) cell or floating-gate containing memory cell.

2. Second Type of Fined-Grained Field Programmable Logic Cell or Element (LCE)

Figure 2B:
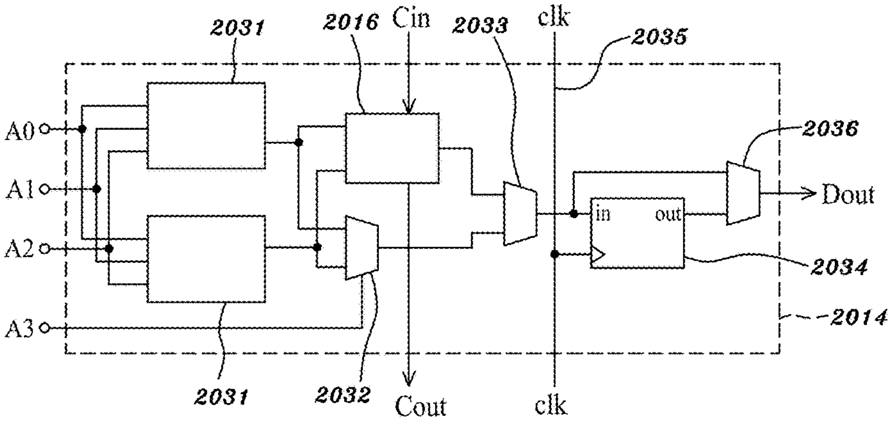

FIG. 2B is a schematic view showing a block diagram of a second type of fined-grained field programmable logic cell or element (LCE) in accordance with an embodiment of the present application. Referring to FIG. 2B, a second type of fined-grained field programmable logic cell or element (LCE) 2014 may be configured to perform logic operation on its input data set, i.e., A0-A3, including (1) two logic gates or circuits 2031 each provided with (i) a selection circuit (not shown), such as multiplexer, having a first set of three data inputs coupling respectively to three data inputs A0-A2 of the input data set A0-A3 of the second type of fined-grained field programmable logic cell or element (LCE) 2014 and (ii) multiple memory cells, i.e., configuration-programming-memory (CPM) cells, (not shown) for storing multiple resulting values, i.e., CPM data, therein respectively, coupling to a second set of data inputs of the selection circuit, wherein each of the memory cells of each of its two logic gates or circuits 2031 may be a volatile memory cell, such as static-random-access-memory (SRAM) cell having the specification as illustrated in any of FIGS. 1A-1G, or a non-volatile memory cell, such as magnetoresistive random-access-memory (MRAM) cell, resistive random-access-memory (RRAM) cell or floating-gate containing memory cell, wherein the selection circuit may select, in accordance with the first set of three data inputs of the selection circuit, input data from the second set of data inputs of the selection circuit as a data output of the selection circuit, (2) a fixed-wired adding unit 2016, i.e., full adder, having two-bit data inputs each coupling to the data output of the selection circuit of one of its two logic gates or circuits 2031, wherein its fixed-wired adding unit 2016 may be configured to take a carry-in data input of its fixed-wired adding unit 2016 coupling to a data input Cin of the second type of fined-grained field programmable logic cell or element (LCE) 2014, which passes from a carry-out data output, i.e., Cout, of another fixed-wired adding unit 2016 of another second type of field programmable logic cell or element (LCE) 2014 in a previous stage, into account to add the two-bit data inputs of its fixed-wired adding unit 2016 as a first data output of its fixed-wired adding unit 2016 for a sum of addition and a second data output, i.e., carry-out data output, of its fixed-wired adding unit 2016 for a carry of addition coupling to a data output Cout of the second type of fined-grained field programmable logic cell or element (LCE) 2014, which passes to a carry-in data input, i.e., Cin, of another adding unit 2016 of another second type of fined-grained field programmable logic cell or element (LCE) 2014 in a next stage, (3) a multiplexer 2032, i.e., LUT selection multiplexer, having a first set of data input coupling to a data input A3 of the input data set A0-A3 of the second type of fined-grained field programmable logic cell or element (LCE) 2014 and a second set of two data inputs each coupling to the data output of the selection circuit of one of its two logic gate or circuits 2031, wherein its multiplexer 2032 may select, in accordance with the first set of data input of its multiplexer 2032, input data from the second set of two data inputs of its multiplexer 2032 as a data output of its multiplexer 2032, (4) a multiplexer 2033, i.e., addition-selection multiplexer, having a first set of data input coupling to a programming code stored in a memory cell (not shown) of the second type of fined-grained field programmable logic cell or element (LCE) 2014, which may be a volatile memory cell, such as static-random-access-memory (SRAM) cell having the specification as illustrated in any of FIGS. 1A-1G, or a non-volatile memory cell, such as magnetoresistive random-access-memory (MRAM) cell, resistive random-access-memory (RRAM) cell or floating-gate containing memory cell, and a second set of two data inputs coupling to the first data output of its fixed-wired adding unit 2016 and the data output of its multiplexer 2032 respectively, wherein its multiplexer 2033 may select, in accordance with the first set of data input of its multiplexer 2033, input data from the second set of two data inputs of its multiplexer 2033 as a data output of its multiplexer 2033 that may be asynchronous, (5) a D-type flip-flop circuit 2034 having a first data input coupling to the data output of its multiplexer 2033 to be registered or stored therein and a second data input coupling to a clock signal clk on a clock bus 2035, wherein its D-type flip-flop circuit 2034 may synchronously generate, in accordance with the second data input of its D-type flip-flop circuit 2034, a data output associated with the first data input of its D-type flip-flop circuit 2034, wherein the data output of its D-type flip-flop circuit 2034 may be synchronous with the clock signal clk, and (6) a multiplexer 2036, i.e., synchronization-selection multiplexer, having a first set of data input coupling to a memory cell (not shown) of the second type of fined-grained field programmable logic cell or element (LCE) 2014, which may be a volatile memory cell, such as static-random-access-memory (SRAM) cell having the specification as illustrated in any of FIGS. 1A-1G, or a non-volatile memory cell, such as magnetoresistive random-access-memory (MRAM) cell, resistive random-access-memory (RRAM) cell or floating-gate containing memory cell, and a second set of two data inputs coupling to the data output of its multiplexer 2033 and the data output of its D-type flip-flop circuit 2034 respectively, wherein its multiplexer 2036 may select, in accordance with the first set of data input of its multiplexer 2036, input data from the second set of two data inputs of its multiplexer 2036 as a data output, i.e., Dout, of its multiplexer 2036 for output data of the second type of fined-grained field programmable logic cell or element (LCE) 2014.

3. Third Type of Fine-Grained Field Programmable Logic Cell or Element

Figure 2C:
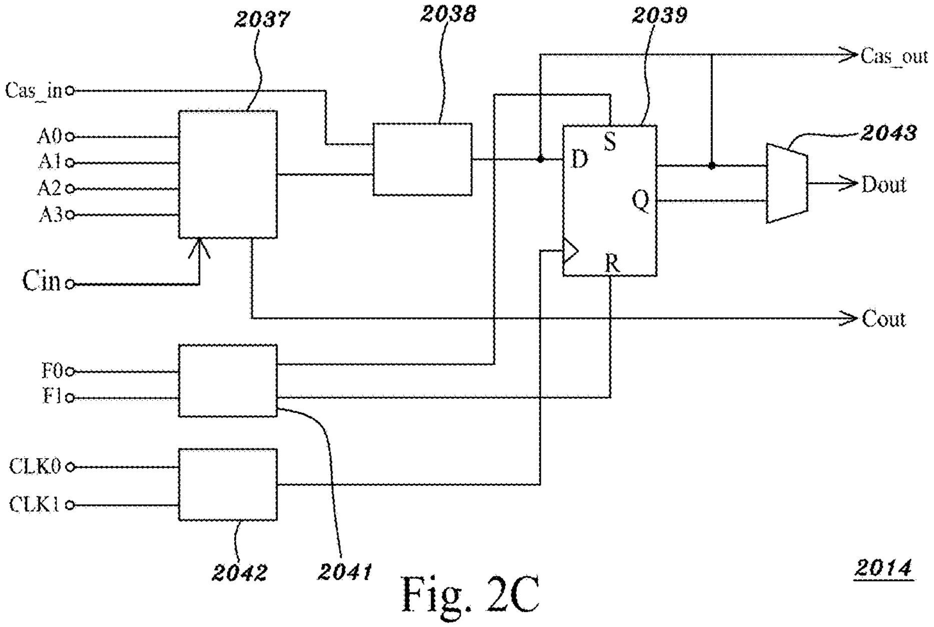

FIG. 2C is a schematic view showing a block diagram of a third type of fine-grained field programmable logic cell or element (LCE) in accordance with an embodiment of the present application. Referring to FIG. 2C, a third type of fine-grained field programmable logic cell or element (LCE) 2014 may be configured to perform logic operation on its input data set, i.e., A0-A3 and Cin, including a logic operator or circuit 2037 having (1) a selection circuit (not shown), such as multiplexer, having a first set of data inputs coupling to four-bit data inputs, i.e., A0-A3, of the input data set of the third type of fine-grained field programmable logic cell or element (LCE) 2014 and a carry-in data input, i.e., Cin, of the input data set of the third type of field programmable logic cell or element (LCE) 2014 respectively, (2) a first set of memory cells, i.e., configuration-programming-memory (CPM) cells, (not shown), for storing multiple resulting values, i.e., CPM data, therein respectively, coupling to a second set of data inputs of the selection circuit and (3) a second set of memory cells, i.e., configuration-programming-memory (CPM) cells, (not shown), for storing multiple resulting values, i.e., CPM data, therein respectively, coupling to a third set of data inputs of the selection circuit, wherein each of the first and second sets of memory cells of the logic operator or circuit 2037 may be a volatile memory cell, such as static-random-access-memory (SRAM) cell having the specification as illustrated in any of FIGS. 1A-1G, or a non-volatile memory cell, such as magnetoresistive random-access-memory (MRAM) cell, resistive random-access-memory (RRAM) cell or floating-gate containing memory cell, wherein the selection circuit is configured to select, in accordance with the first set of data inputs of the selection circuit, input data from the second set of data inputs of the selection circuit as a first data output of the selection circuit and select, in accordance with the first set of data inputs of the selection circuit, input data from the third set of data inputs of the selection circuit as a second data output of the selection circuit. In an example, when its logic operator or circuit 2037 performs an addition operation, its logic operator or circuit 2037 may be configured to take the carry-in data input, i.e., Cin, of the input data set of the third type of fine-grained field programmable logic cell or element (LCE) 2014 from a carry-out data output Cout of another third type of fine-grained field programmable logic cell or element (LCE) 2014 in a previous stage into account to add two-bit digits (A0, A1) of the input data set of the fine-grained third type of field programmable logic cell or element (LCE) 2014 and two-bit digits (A2, A3) of the input data set of the input data set of the third type of fine-grained field programmable logic cell or element (LCE) 2014 as a sum of addition of the two two-bit digits (A0, A1) and (A2, A3) at the first data output of the selection circuit and a carry of addition of the two two-bit digits (A0, A1) and (A2, A3) at the second data output of the selection circuit for a carry-out data output, i.e., Cout, of output data of the third type of fine-grained field programmable logic cell or element (LCE) 2014, which may be associated with a carry-in data input Cin of another third type of fine-grained field programmable logic cell or element (LCE) 2014 in a next stage. In another example, when its logic operator or circuit 2037 performs a logic operation, its logic operator or circuit 2037 may be configured to select, in accordance with the four-bit data inputs, i.e., A0-A3, of the input data set of the third type of fine-grained field programmable logic cell or element (LCE) 2014, input data from the second set of data inputs of the selection circuit as a data output of the logic operation at the first data output of the selection circuit.

Referring to FIG. 2C, the third type of fine-grained field programmable logic cell or element (LCE) 2014 may further include (1) a cascade circuit 2038 provided with a logic gate having a first data input associated with a data input, i.e., Cas_in, of the third type of fine-grained field programmable logic cell or element (LCE) 2014 for cascade data passed through one or more hard wires from a data output, i.e., Cas_out, of another third type of fine-grained field programmable logic cell or element (LCE) 2014 in a previous stage and a second data input associated with the first data output of the selection circuit of its logic operator or circuit 2037, wherein the logic gate of its cascade circuit 2038 may perform AND or OR logic operation on the first and second data inputs of its cascade circuit 2038 as a data output of its cascade circuit 2038, wherein the data output of its cascade circuit 2038 may be asynchronous, (2) a D-type flip-flop circuit 2039 having a first data input coupling to the data output of its cascade circuit 2038 to be registered or stored therein and a second data input coupling to a clock signal on a clock bus 2040, wherein its D-type flip-flop circuit 2039 may synchronously generate, in accordance with the second data input of its D-type flip-flop circuit 2039, a data output associated with the first data input of its D-type flip-flop circuit 2039, wherein the data output of its D-type flip-flop circuit 2039 may be synchronous with the clock signal, (3) a set-reset control circuit 2041 coupling to its D-type flip-flop circuit 2039 to set, reset or unchange its D-type flip-flop circuit 2039 in accordance with two data inputs of its set-reset control circuit 2041 coupling respectively to two data inputs, i.e., F0 and F1, of the third type of fine-grained field programmable logic cell or element (LCE) 2014, and (4) a clock control circuit 2042 coupling to its D-type flip-flop circuit 2039 through the clock bus 2040, wherein its clock control circuit 2042 is configured to generate, in accordance with two data inputs of its clock control circuit 2042 coupling to two data inputs, i.e., CLK0 and CLK1, of the third type of fine-grained field programmable logic cell or element (LCE) 2014 respectively, the clock signal on the clock bus 2040 in one of various modes. For example, its clock control circuit 2042 may be controlled to be enabled or disabled in accordance with the data input, i.e., CLK0, of the third type of fine-grained field programmable logic cell or element (LCE) 2014. The clock signal may be controlled in a mode to be the same as a reference clock in accordance with the data input, i.e., CLK1, of the third type of fine-grained field programmable logic cell or element (LCE) 2014, or the clock signal may be controlled in another mode to be inverted to the reference clock in accordance with the data input, i.e., CLK1, of the third type of fine-grained field programmable logic cell or element (LCE) 2014.

Referring to FIG. 2C, the third type of fine-grained field programmable logic cell or element (LCE) 2014 may further include a multiplexer 2043, i.e., synchronization-selection multiplexer, having a first set of data input coupling to a memory cell (not shown) of the third type of fine-grained field programmable logic cell or element (LCE) 2014, which may be a volatile memory cell, such as static-random-access-memory (SRAM) cell having the specification as illustrated in any of FIGS. 1A-1G, or a non-volatile memory cell, such as magnetoresistive random-access-memory (MRAM) cell, resistive random-access-memory (RRAM) cell or floating-gate containing memory cell, and a second set of two data inputs coupling to the data output of its cascade circuit 2038 and the data output of its D-type flip-flop circuit 2039 respectively, wherein its multiplexer 2043 may select, in accordance with the first set of data input of its multiplexer 2043, input data from the second set of two data inputs of its multiplexer 2043 as a data output, i.e., Dout, of its multiplexer 2043 for output data of the third type of fine-grained field programmable logic cell or element (LCE) 2014. The third type of fine-grained field programmable logic cell or element (LCE) 2014 may further include a data output, i.e., Cas_out, for cascade data coupling to the data output of its cascade circuit 2038, wherein the data output, i.e., Cas_out, of the third type of fine-grained field programmable logic cell or element (LCE) 2014 may be passed through one or more hard wires to the data input, i.e., Cas_in, of another third type of fine-grained field programmable logic cell or element (LCE) 2014 in a next stage.

Specification for Field Programmable Switch Cell

1. First Type of Field Programmable Switch Cell

Figure 3A:
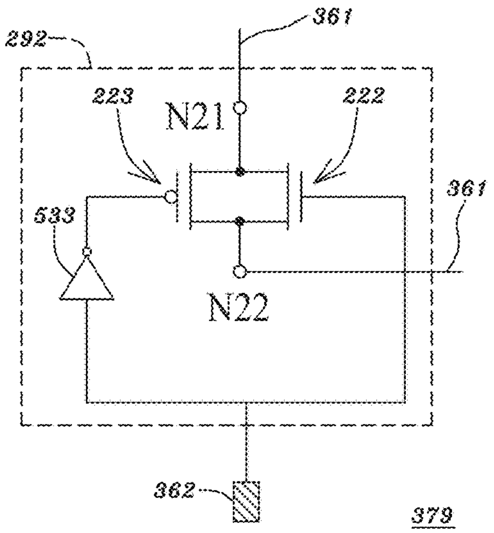
FIGS. 3A and 3B are circuit diagrams illustrating various types of field programmable switch cells in accordance with an embodiment of the present application.

FIG. 3A is a circuit diagram illustrating programmable interconnects controlled by a first type of field programmable switch cell in accordance with an embodiment of the present application. Referring to FIG. 3A, a first type of field programmable switch cell 379, i.e., field-programmable interconnection (FPI) circuits or configurable switch cell, is configured to control coupling of its multiple nodes, i.e., N21 and N22, including (1) a pass/no-pass switch 292 composed of an N-type metal-oxide-semiconductor (MOS) transistor 222, a P-type metal-oxide-semiconductor (MOS) transistor 223 coupling in parallel to the N-type metal-oxide-semiconductor (MOS) transistor 222, wherein each of the N-type and P-type metal-oxide-semiconductor (MOS) transistors 222 and 223 may be configured to form a channel between two opposites nodes N21 and N22 of the first type of field programmable switch cell 379 coupling to two programmable interconnects 361 respectively, and an inverter 533 having an input point coupling to a gate terminal of the N-type MOS transistor 222 and an output point coupling to a gate terminal of the P-type MOS transistor 223, wherein the inverter 533 is configured to invert a data input of the inverter 533 at the input point of the inverter 533 as a data output of the inverter 533 at the output point of the inverter 533, and (2) a memory cell 362, i.e., configuration-programming-memory (CPM) cell, which may be a volatile memory cell, such as static-random-access-memory (SRAM) cell having the specification as illustrated in any of FIGS. 1A-1G, or a non-volatile memory cell, such as magnetoresistive random-access-memory (MRAM) cell, resistive random-access-memory (RRAM) cell or floating-gate containing memory cell, wherein its memory cell 362 is configured for storing or saving a programming code, i.e., CPM data, therein and couples to the input point of the inverter 533 of its pass/no-pass switch 292 and the gate terminal of the N-type MOS transistor 222 of its pass/no-pass switch 292. Thereby, its pass/no-pass switch 292 is configured to control, in accordance with a data input of its pass/no-pass switch 292 associated with the programming code stored or saved in its memory cell 362, coupling between the two programmable interconnects 361 to pass its data input at one of the two programmable interconnects 361 as its data output at the other of the two programmable interconnects 361.

2. Second Type of Field Programmable Switch Cell

Figure 3B:
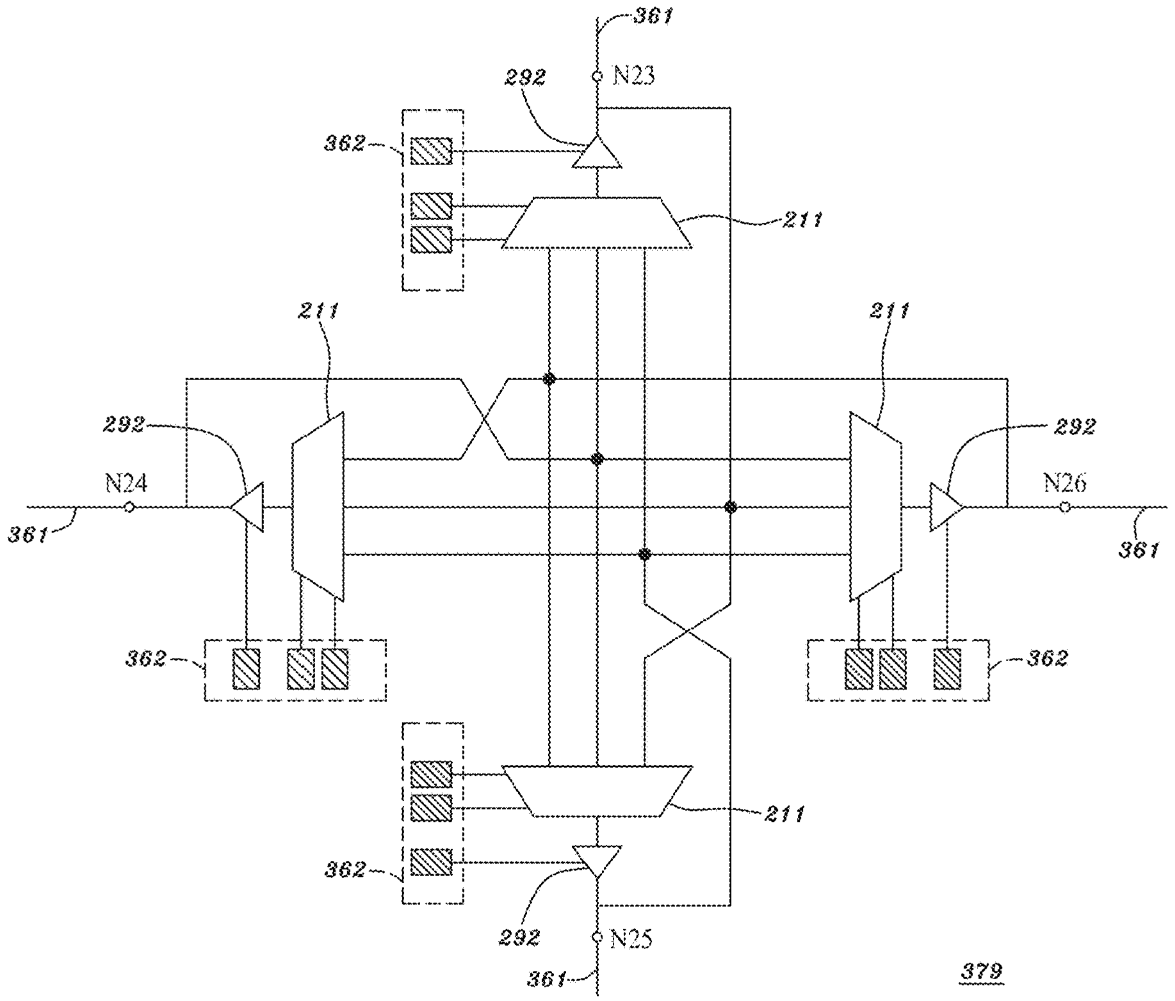

FIG. 3B is a circuit diagram illustrating programmable interconnects controlled by a second type of field programmable switch cell in accordance with an embodiment of the present application. Referring to FIG. 3B, a second type of field programmable switch cell 379, i.e., field-programmable interconnection (FPI) circuits or configurable switch cell, is configured to control coupling of its multiple nodes, i.e., N23-N26, including (1) four sets of memory cells 362, i.e., configuration-programming-memory (CPM) cells, at its front, rear, left and right sides respectively, wherein each set of its four sets of memory cells 362 is configured to store or save first and second sets of programming code, i.e., CPM data, (2) four selection circuits 211, such as multiplexer, at its front, rear, left and right sides respectively, wherein each of its four selection circuits 211 may be configured to select, in accordance with a first input data set thereof at a first set of input points thereof associated with a first set of programming codes saved or stored in a set of its four sets of memory cells 362, a data input from a second input data set thereof at a second set of three input points thereof as a data output thereof at an output point thereof, and (2) four pass/no-pass switches 292 at its front, rear, left and right sides respectively, wherein each of its four pass/no-pass switches 292 may have an input point coupling to the output point of one of its four selection circuits 211 to be configured to control, in accordance with a first data input thereof associated with a second set of programming codes saved or stored in a set of its four sets of memory cells 362, coupling between the input point thereof for a second data input thereof associated with the data output of said one of its four selection circuits 211 and an output point thereof for a data output thereof and amplify the second data input thereof as the data output thereof at the output point thereof to act as a data output of the second type of field programmable switch cell 379 at one of its four nodes N23, N24, N25 and N26. Each of the second set of three input points of each of its four selection circuits 211 may couple to one of the second set of three input points of each of another two of its four selection circuits 211 and to the output point of one of its four pass/no-pass switches 292, the input point of which couples to the output point of the other of its four pass/no-pass switches 292. Thereby, each of its four selection circuits 211 may select, in accordance with the first input data set thereof at the first set of input points thereof associated with a first set of programming codes saved or stored in a specific set of its four sets of memory cells 362, a data input, i.e., a data input of the second type of field programmable switch cell 379, from the second input data set thereof at the second set of three input points thereof coupling respectively to three of its four nodes N23, N24, N25 and N26 coupling respectively to four programmable interconnects 361 extending in four different directions respectively, and one of its four pass/no-pass switches 292, the input point of which couples to the output point of said each of its four pass/no-pass switches 292, may be switched, in accordance with the first data input thereof associated with a second set of programming codes saved or stored in the specific set of its four sets of memory cells 362, to pass the second data input thereof as the data output thereof at the other of its four nodes N23, N24, N25 and N26. For example, a front one of its selection circuits 211 may select, in accordance with the first input data set thereof at the first set of input points thereof associated with a first set of programming codes saved or stored in a front set of its four sets of memory cells 362, a data input from the second input data set thereof at the second set of three input points thereof coupling respectively to three nodes N24, N25 and N26 of its four nodes N23, N24, N25 and N26 at its left, rear and right sides, and a front one of its four pass/no-pass switches 292 may be switched, in accordance with the first data input thereof associated with a second set of programming codes saved or stored in the front set of its four sets of memory cells 362, to pass the second data input thereof as the data output thereof at the other node N23 of its four nodes N23, N24, N25 and N26. Accordingly, data from one of the four programmable interconnects 361 coupling respectively to its four nodes N23, N24, N25 and N26 may be switched by the second type of field programmable switch cell 379 to be passed to another one, two or three of the four programmable interconnects 361. Thereby, Each of its four sets of memory cells 362 may be (1) a volatile memory cell, such as static-random-access-memory (SRAM) cell having the specification as illustrated in any of FIGS. 1A-1G, or (2) a non-volatile memory cell, such as magnetoresistive random-access-memory (MRAM) cell, resistive random-access-memory (RRAM) cell or floating-gate containing memory cell.

Coarse-Grained Reconfigurable Architecture (CGRA)

Figure 4:
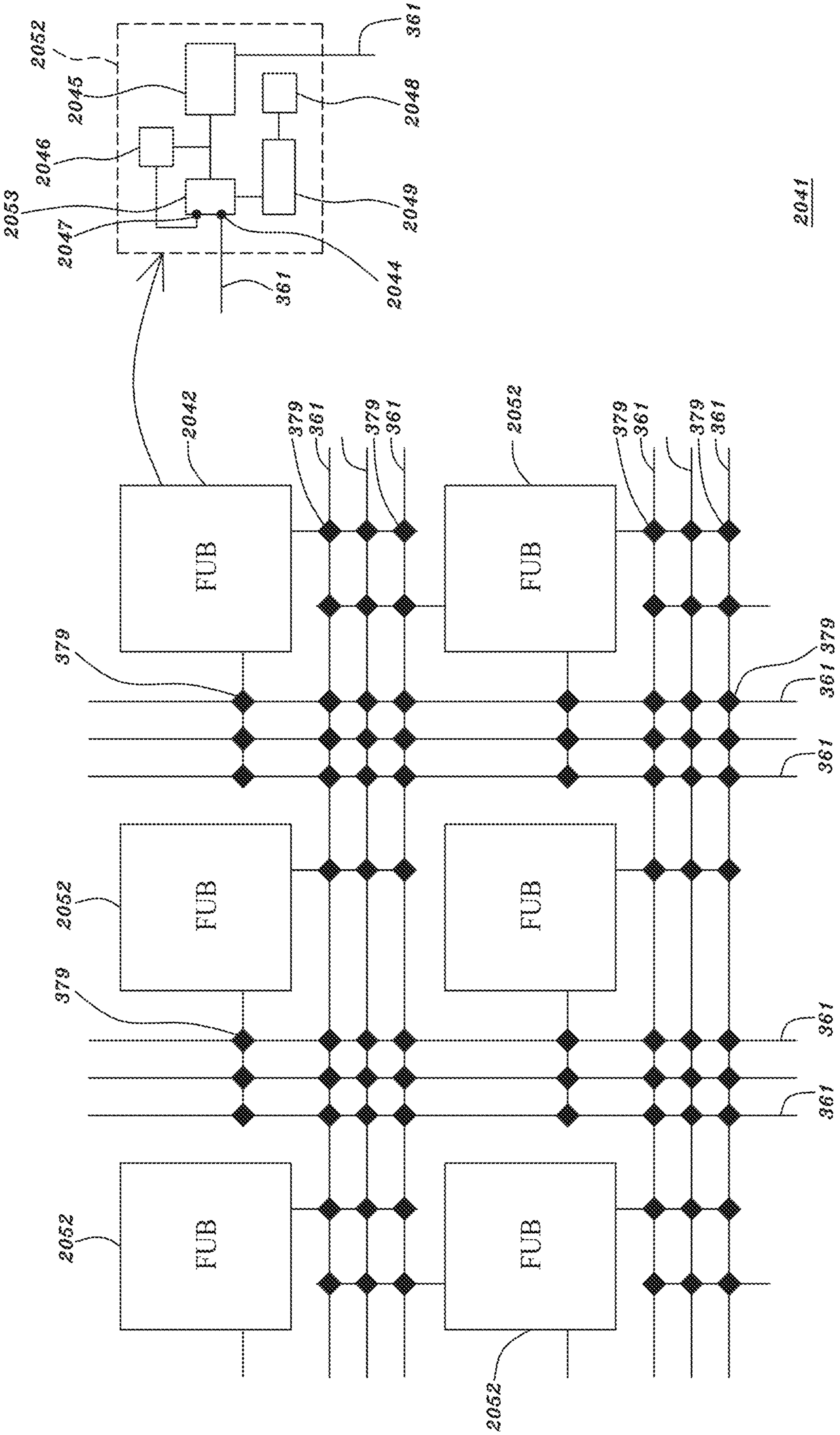
FIG. 4 is a schematic view showing a coarse-grained reconfigurable architecture (CGRA) in accordance with another embodiment of the present application.

FIG. 4 is a schematic view showing a coarse-grained reconfigurable architecture (CGRA) in accordance with another embodiment of the present application. Referring to FIG. 4, a coarse-grained reconfigurable architecture (CGRA) 2041 may include multiple coarse-grained reconfigurable (CGR) units 2052, i.e., functional unit blocks (FUBs), cells or elements, arranged in an array, a plurality of programmable interconnects 361 each between neighboring two of the coarse-grained reconfigurable (CGR) units 2052 and a plurality of the second type of field programmable switch cells 379 each having the specification as illustrated in FIG. 3B and having top, left, bottom and right terminals coupling to four of its programmable interconnects 361 at top, left, bottom and right sides thereof. Referring to FIG. 4, for the coarse-grained reconfigurable architecture (CGRA) 2041, each of its coarse-grained reconfigurable (CGR) units 2052 may include (1) a functional unit (FU) 2053 including a plurality of hard macros such as digital signal process DSP slices, graphic process GPU macros, DPU macros, microcontroller (MCU) macros, multiplexer macros, adder macros, multiplier macros, arithmetic logic unit (ALU) macros, shift circuit macros, comparison circuit macros, floating-point computing macros, register or flip-flops macros, and/or I/O interfacing macros, wherein each of the hard macros is designed, compiled and implemented with fixed hard wires (metal lines or traces) for circuits, wherein the functional unit 2053 thereof may have multiple data inputs at a first set of input points 2044 of the functional unit 2053, i.e., an input data set of said each of its coarse-grained reconfigurable (CGR) units 2052 at a set of input points of said each of its coarse-grained reconfigurable (CGR) units 2052, each coupling to one of its cross-point switches 379 through one of its programmable interconnects 361, (2) a registering block 2045 having multiple registers or D-type flip-flop circuits each for registering or temporally storing data therein associated with a data output of the functional unit 2053 thereof and passing, in accordance with a clock signal, the data stored in said each of the registers or D-type flip-flop circuits, i.e., data outputs of said each of its coarse-grained reconfigurable (CGR) units 2052 at output points of said each of its coarse-grained reconfigurable (CGR) units 2052, to one or more of its cross-point switches 379 through one or more of the programmable interconnects 361 to be distributed to or accessed by another one or more of the coarse-grained reconfigurable (CGR) units 2052 in the next stage, wherein the first set of input points 2044 of the functional unit 2053 thereof may receive data from the registering block(s) 2045 of another one or more of the coarse-grained reconfigurable (CGR) units 2052 in the previous stage through one or more of its cross-point switches 379 coupled by one or more of its programmable interconnects 361, (3) a register-file memory block 2046 having multiple first memory cells, each of which may be a static random-access memory (SRAM) cell having the specification as illustrated in any of FIGS. 1A-1G for temporally storing register files therein associated with a data output of the functional unit 2053 thereof within one of time periods and passing, in accordance with the clock signal, the register files stored in the static random-access memory (SRAM) cell to one of a second set of input points 2047 of the functional unit 2053 thereof, wherein each of the first memory cells may alternatively be a magnetoresistive-random-access-memory (MRAM) cell or resistive-random-access-memory (RRAM) cell for storing, in a non-volatile fashion, the register files therein associated with the data output of the functional unit 2053 thereof within one of time periods and passing, in accordance with the clock signal, the register files stored in the magnetoresistive-random-access-memory (MRAM) cell or resistive-random-access-memory (RRAM) cell to one of the second set of input points 2047 of the functional unit 2053 thereof, (4) a program counter (PC) 2048, i.e., instruction pointer, having multiple second memory cells such as instruction address registers, each of which may be a static random-access memory (SRAM) cell having the specification as illustrated in any of FIGS. 1A-1G for temporally storing multiple instruction addresses therein to point one or more of the arithmetic logic cells of the functional unit 2053 thereof in a program sequence, wherein each of the second memory cells may alternatively be a magnetoresistive-random-access-memory (MRAM) cell or resistive-random-access-memory (RRAM) cell for storing, in a non-volatile fashion, the instruction addresses therein to point one or more of the arithmetic logic cells of the functional unit 2053 thereof in a program sequence, and (5) an instruction memory block or section 2049 having multiple third memory cells, each of which may be a static random-access memory (SRAM) cell having the specification as illustrated in any of FIGS. 1A-1G, for temporally storing multiple instruction sets therein, wherein each of the third memory cells may alternatively be a magnetoresistive-random-access-memory (MRAM) cell or resistive-random-access-memory (RRAM) cell for storing, in a non-volatile fashion, the instruction sets therein, wherein the instruction sets, i.e., configuration-programming-memory (CPM) data, may be a kind of machine language or code in binary digits which may be translated from an assembly language such as MOV, ADD or SUB, each to be fetched by the functional unit 2053 thereof to instruct, in accordance with data associated with the instruction addresses stored in the program counter (PC) 2048, one or more of the arithmetic logic cells in the functional unit 2053 thereof to perform specific one or more of the operation or logic functions on the data at the first and second sets of input points 2044 and 2047.

Coarse-Grained Field Programmable Logic Cell or Element (LCE) or Look-Up Table (LUT)

Figure 5A:
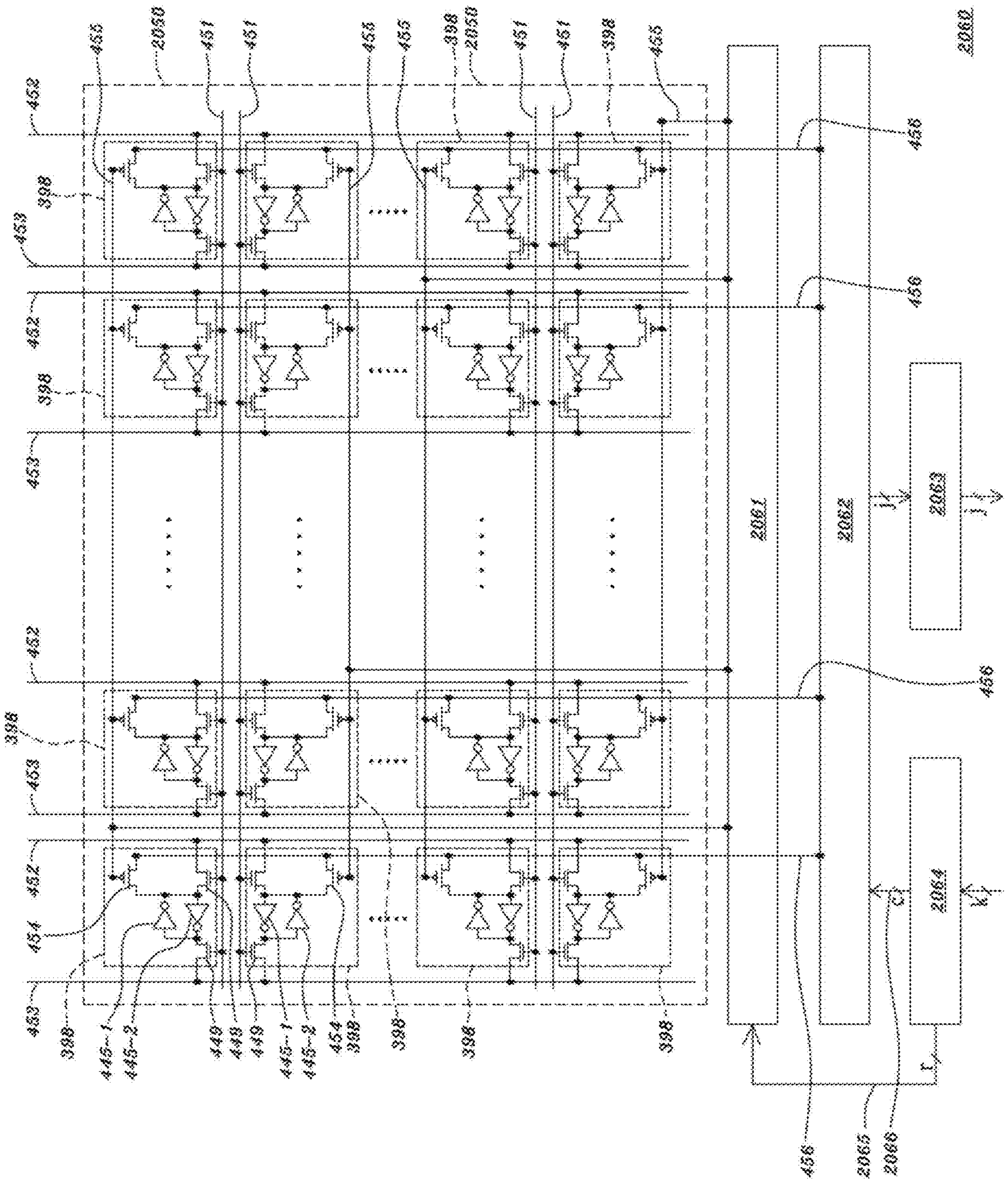
FIG. 5A is a schematic view showing an array of memory cells for coarse-grained field programmable logic cells or elements (LCEs) and for cache memory storage in accordance with another embodiment of the present application.
Figure 5C:
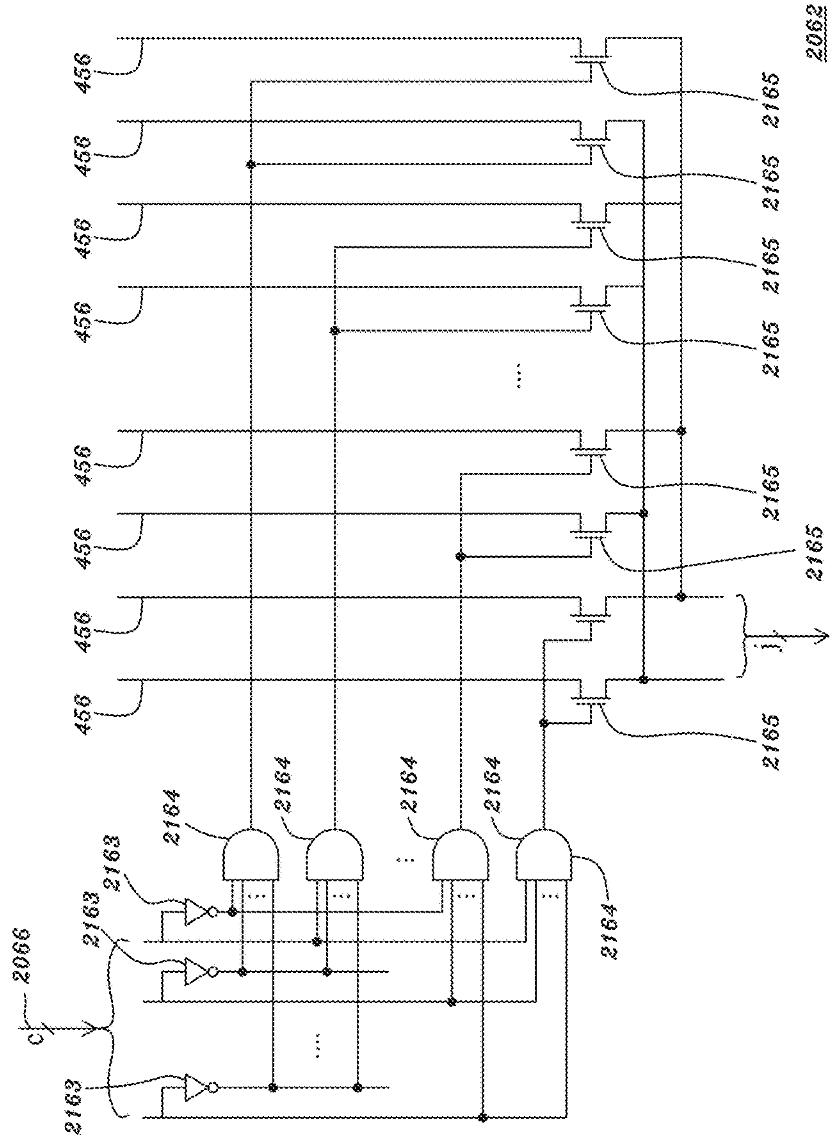
FIG. 5C is a circuit diagram showing a local column decoder in accordance with an embodiment of the present application.
Figure 5B:
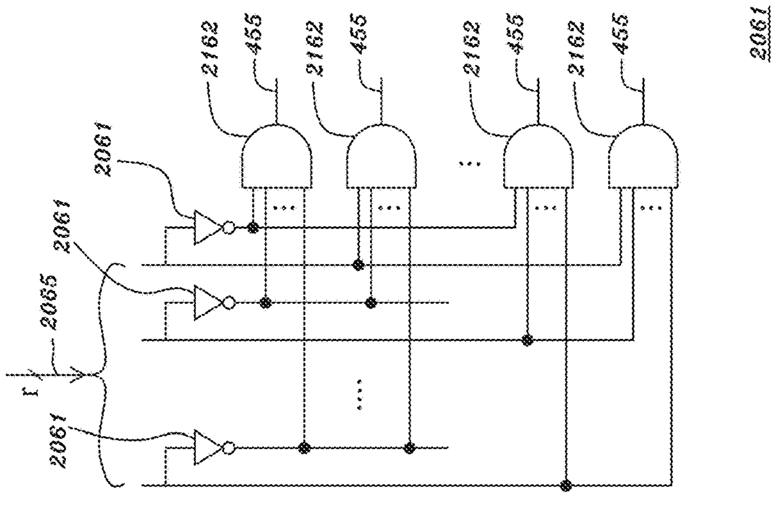
FIG. 5B is a circuit diagram showing a local row decoder in accordance with an embodiment of the present application.
Figure 6:
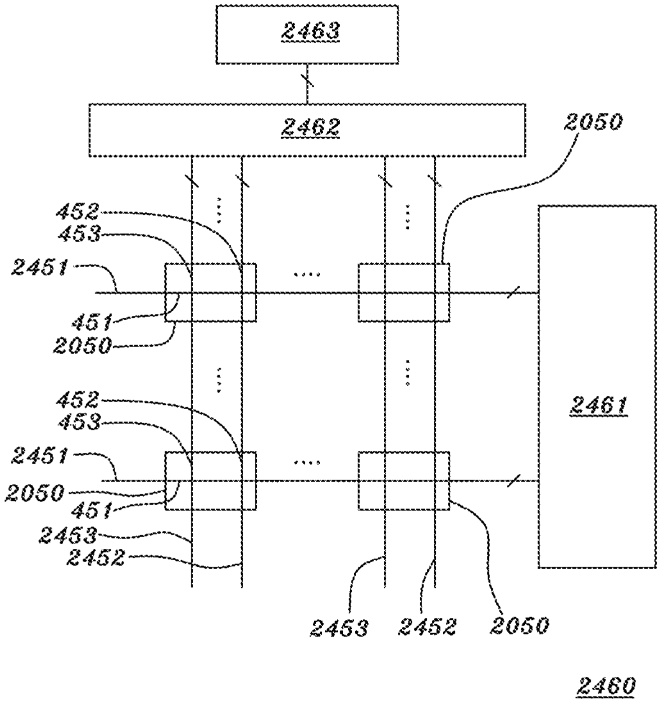
FIG. 6 is a schematic view showing an array of memory cells for cache memory storage in accordance with another embodiment of the present application.

FIG. 5A is a schematic view showing an array of memory cells for coarse-grained field programmable logic cells or elements (LCEs) and for cache memory storage in accordance with another embodiment of the present application. FIG. 5B is a circuit diagram showing a local row decoder in accordance with an embodiment of the present application. FIG. 5C is a circuit diagram showing a local column decoder in accordance with an embodiment of the present application. FIG. 6 is a schematic view showing an array of memory cells for cache memory storage in accordance with another embodiment of the present application. Referring to FIG. 5A, a coarse-grained programmable logic cell or element (LCE) 2060, i.e., coarse-grained look-up table (CGLUT) or multi-output look-up table (LUT), may include a plurality of the third type of static random-access memory (SRAM) cells 398, each as seen in any of FIG. 1C-1G, which are arranged in a first array in its memory section 2050. In particular, FIG. 5A shows the coarse-grained programmable logic cell or element 2060 is provided with the third type of static random-access memory (SRAM) cells 398, each as seen in FIG. 1C, which are arranged in the first array. Referring to FIG. 5A, a common N-type well formed in the semiconductor substrate 2 as illustrated in FIGS. 26A-26F may be provided for forming the third type of static random-access memory (SRAM) cells 398 in neighboring two rows of the first array, and thus a pair of the third type of static random-access memory (SRAM) cells 398 in each column in the neighboring two rows of the first array may have two respective layouts for their diffusion regions and gate regions in reflection symmetry to each other with respect to a symmetry line between the pair of the third type of static random-access memory (SRAM) cells 398. The coarse-grained programmable logic cells or elements 2060 may include (1) multiple word lines 451, i.e., global word lines, each coupling to the gate terminal of each of the two switches or transfer transistors 449 of each of its third type of static random-access memory (SRAM) cells 398 in one row of the first array, (2) multiple word lines 455, i.e., local word lines, each coupling to the gate terminal of the switch or pass gate 454 of each of its third type of static random-access memory (SRAM) cells 398 in one row of the first array, (3) multiple pairs of the bit line 452, i.e., global bit line, and bit-bar line 453, i.e., global bit-bar line, each pair of which couples to the channels of the respective two switches or transfer transistors 449 of each of its third type of static random-access memory (SRAM) cells 398 in one column of the first array, and (4) multiple bit lines 456, i.e., local bit lines, each coupling to one of the two diffusion regions of the switch or pass gate 454 of each of the third type of static random-access memory (SRAM) cells 398 in one column of the first array. In an example, the coarse-grained programmable logic cell or element (LCE) 2060 may be arranged in a field-programmable-gate-array (FPGA) integrated-circuit (IC) chip or central-processing-unit (CPU) integrated-circuit (IC) chip.

Further, referring to FIG. 5A, the coarse-grained programmable logic cell or element 2060 may include (1) a local row decoder 2061 as seen in FIG. 5B coupling to each of its word lines 455, (2) a local column decoder 2062 as seen in FIG. 5C coupling to each of its bit lines 456 each coupling to one of the two diffusion regions of the switch or pass gate 454 of each of its third type of static random-access memory (SRAM) cells 398 in one column of the first array, and (3) a block 2063 for registers or flip-flop circuits coupling to one or more output points of its local column decoder 2062, wherein its local row decoder 2061 is configured to select, in accordance with an input data set 2065 of its local row decoder 2061 at a set of input points of its local row decoder 2061 having the number of r, one by one from its word lines 455 having the number of $2^r$ to access a resulting value or data or programming code, i.e., configuration-programming-memory (CPM) data, stored in each of its third type of static random-access memory (SRAM) cells 398 in one row of the first array coupling to said one of its word lines 455 to be passed to one of its bit lines 456 coupling to one of the two diffusion regions of the switch or pass gate 454 of said each of its third type of static random-access memory (SRAM) cells 398, wherein the number of r is a positive integer, and its local column decoder 2062 is configured to select, in accordance with a first input data set 2066 of its local column decoder 2062 at a set of input points of its local column decoder 2062 having the number of c, one or more data inputs from a second input data set of its local column decoder 2062 passed from each of its bit lines 456 having the number of "$2^c$" as one or more data outputs of its local column decoder 2062 at the one or more output points of its local column decoder 2062, having the number of j, to be registered or stored in its block 2063 for registers or flip-flop circuits, wherein the number of j may be a positive integer equal to or greater than 2, 4, 8, 16 or 32. The data registered or stored in its block 2063 for registers or flip-flop circuits may be passed therefrom as multiple data outputs of the coarse-grained programmable logic cell or element 2060. When the number of j is equal to 8, the coarse-grained programmable logic cell or element 2060 is configured for a logic operation in a byte; when the number of j is equal to 16, the coarse-grained programmable logic cell or element 2060 is configured for a logic operation in a word. For more elaboration, referring to FIGS. 5A and 5B, its local row decoder 2061 may include (1) multiple inverters 2161 each having an input point configured to receive a data input of the input data set 2065 of its local row decoder 2061, wherein the data input of the input data set 2065 of its local row decoder 2061 is configured to be inverted by said each of the inverters 2161 as a data output of said each of the inverters 2161 at a output point of said each of the inverters 2161, and (2) multiple AND gates 2162 each having an input data set at input points of said each of the AND gates 2162, which is associated with the input data set 2065 of its local row decoder 2061, wherein each of the input points of each of the AND gates 2162 of its local row decoder 2061 couples to one of the input and output points of one of the inverters 2161 of its local row decoder 2061, and said each of the AND gates 2162 is configured to perform AND logic operation on the input data set of said each of the AND gates 2162 as a data output of said each of the AND gates 2162 at an output point of said each of the AND gates 2162 coupling to one of its word lines 455. Referring to FIGS. 5A and 5C, its local column decoder 2062 may include (1) multiple inverters 2163 each having an input point configured to receive a data input of the first input data set 2066 of its local column decoder 2062, wherein the data input of the first input data set 2066 of its local column decoder 2062 is configured to be inverted by said each of the inverters 2163 as a data output of said each of the inverters 2163 at an output point of said each of the inverters 2163, (2) multiple AND gates 2164 each having an input data set at input points of said each of the AND gates 2164, which is associated with the first input data set 2066 of its local column decoder 2062, wherein each of the input points of said each of the AND gates 2164 couples to one of the input and output points of one of the inverters 2163 of its local column decoder 2062, and said each of the AND gates 2164 is configured to perform AND logic operation on the input data set of said each of the AND gates 2164 as a data output of said each of the AND gates 2164 at an output point of said each of the AND gates 2164, and (3) multiple switches or pass gates 2165, each of which may be an N-type or P-type metal-oxide-semiconductor (MOS) transistor, coupling to the AND gates 2164 of its local column decoder 2062, wherein the switches or pass gates 2165 of its local column decoder 2062 may be divided into multiple groups, and each of the switches or pass gates 2165 of its local column decoder 2062 in each of the groups may have a gate terminal coupling to the output point of one of the AND gates 2164 of its local column decoder 2062 and two diffusion regions configured to couple to each other by applying a voltage to the gate terminal of said each of the switches or pass gates 2165, wherein one of the two diffusion regions of said each of the switches or pass gates 2165 couples to one of its bit lines 456 and the other of the two diffusion regions of said each of the switches or pass gates 2165 couples to the other of the two diffusion regions of one of the switches or pass gates 2165 of its local column decoder 2062 in each of the others of the groups and to one of the one or more output points of its local column decoder 2062 to control, in accordance with the data output of said one of the AND gates 2164 at the gate terminal of said each of the switches or pass gates 2165, coupling between the two diffusion regions of said each of the switches or pass gates 2165.

Figure 5D:
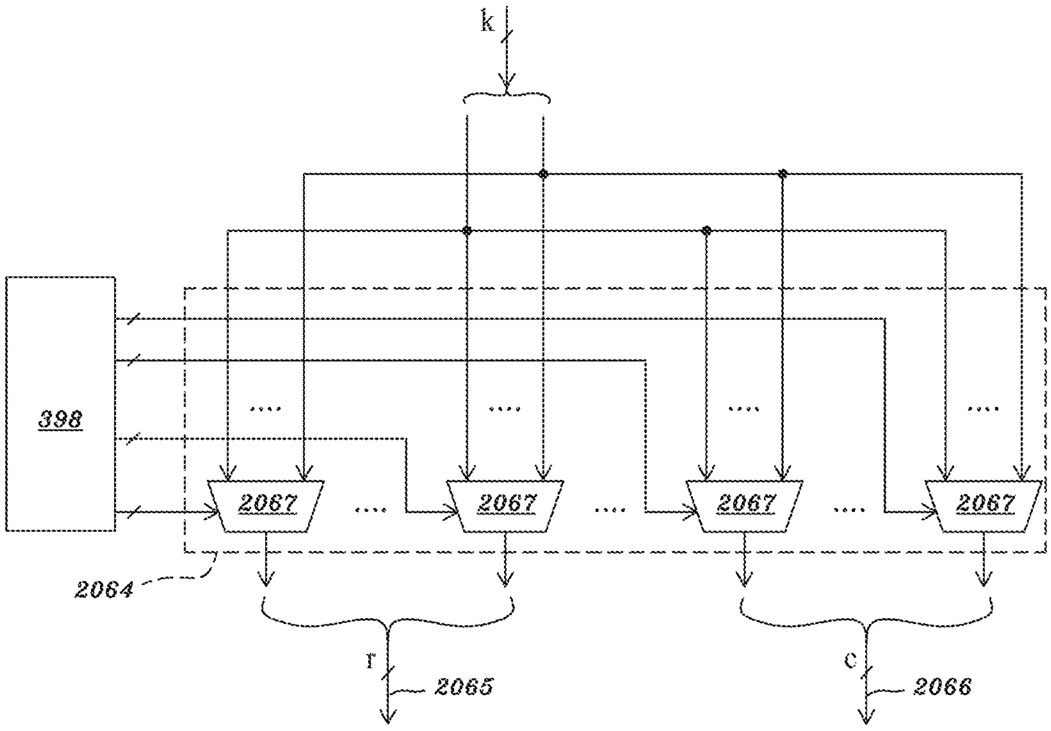
FIG. 5D is a circuit diagram of a selection circuit in accordance with an embodiment of the present application.

FIG. 5D is a circuit diagram of a selection circuit in accordance with an embodiment of the present application. Referring to FIGS. 5A and 5D, the coarse-grained programmable logic cell or element 2060 may include a selection circuit 2064 having a set of input points having the number of k, a first set of output points having the number of r coupling to the set of input points of its local row decoder 2061, and a second set of output points having the number of c coupling to the set of input points of its local column decoder 2062, wherein each of the numbers of k, r and c is a positive integer. Its selection circuit 2064 may have reading address data having k bits at the set of input points thereof, wherein the reading address data includes row-address data having r bits and column-address data having c bits, wherein its selection circuit 2064 is configured for selecting the row-address data from the reading address data as first output data at the first set of output points thereof to be passed to its local row decoder 2061, and its local row decoder 2061 is configured for selecting, in accordance with the row-address data, a local word line 455 from its local word lines 455 to pass data at the local word line 455 to turn on a portion of its third type of static random-access memory (SRAM) cells 398 in one row of the first array through the selected local word line 455, wherein the selected local word line 455 couples to the gate terminal of the P-type MOS transistor 454 of each of the portion of its third type of static random-access memory (SRAM) cells 398, and wherein its selection circuit 2064 is configured for selecting the column-address data from the reading address data as second output data at the second set of output points thereof to be passed to its local column decoder 2062, and its local column decoder 2062 is configured for selecting, in accordance with the column-address data, a local bit line 456 from its local bit lines 456 to read the resulting value or data or programming code, i.e., CPM data, stored in one of the portion of its third type of static random-access memory (SRAM) cells 398 through the selected local bit line 456, wherein the selected local bit line 456 couples to an output point of the channel of the P-type MOS transistor 454 of said one of the portion of its third type of static random-access memory (SRAM) cells 398. Its selection circuit 2064 is configured to select, in accordance with a first input data set of its selection circuit 2064 associated with data stored in its memory cells, e.g., the memory cells 398 as illustrated in any of FIGS. 1A-1G, multiple first data inputs from a second input data set of its selection circuit 2064 at the set of input points of its selection circuit 2064, i.e., an input data set of the coarse-grained programmable logic cell or element 2060, as a first output data set of its selection circuit 2064 at the first set of output points of its selection circuit 2064 associated with the input data set 2065 of its local row decoder 2061 and to select multiple second data inputs from the second input data set of its selection circuit 2064 as a second output data set of its selection circuit 2064 at the second set of output points of its selection circuit 2064 associated with the first input data set 2066 of its local column decoder 2062. For more elaboration, referring to FIGS. 5A and 5D, its selection circuit 2064 may include multiple multiplexers 2067 having the number of (r+c) arranged in parallel each having a set of input points coupling to the set of input points of its selection circuit 2064 respectively and an output point coupling to one of the first and second sets of output points of its selection circuit 2064, wherein said each of the multiplexers 2067 of its selection circuit 2064 is configured to select, in accordance with one or more data inputs of a first input data set of said each of the multiplexers 2067 associated with data stored in its memory cells, e.g., the memory cells 398 as illustrated in any of FIGS. 1A-1G, a data input from a second input data set of said each of the multiplexers 2067 at the set of input points of its selection circuit 2064 as a data output of said each of the multiplexers 2067 for a data output of the first and second output data sets of its selection circuit 2064 at one of the first and second sets of output points of its selection circuit 2064.

Referring to FIG. 6, a memory bank 2460 may include multiple memory sections 2050 in a second array each composed of the third type of static random-access memory (SRAM) cells 398 in the first array for the coarse-grained programmable logic cell or element 2060 as illustrated in FIG. 5A. The memory bank 2460 may include (1) multiple global word lines 2451 each formed by connecting in series a portion of the global word lines 451 at the same ($j^{th}$) row of the first arrays in the same ($q^{th}$) row of the second array, wherein n≥j≥1 and N≥q≥1, wherein each of the portion of the global word lines 451 couples to the two gate terminals of the two switches or transfer transistors 449 of each of the third type of static random-access memory (SRAM) cells 398 in the same ($j^{th}$) row of one of the first arrays in the same ($q^{th}$) row of the second array, (2) multiple global bit lines 2452 each formed by connecting in series a portion of the global bit lines 452 at the same ($i^{th}$) column of the first arrays in the same ($p^{th}$) column of the second array, wherein m≥i≥1 and M≥p≥1, wherein each of the portion of the global bit lines 452 couples to the channel (output) of one of the two switches or transfer transistors 449 of each of the third type of static random-access memory (SRAM) cells 398 in the same ($i^{th}$) column of one of the first arrays in the same ($p^{th}$) column of the second array, and (3) multiple global bit-bar lines 2453 each formed by coupling a portion of the global bit-bar lines 453 at the same ($i^{th}$) column of the first arrays in the same ($p^{th}$) column of the second array, wherein each of the portion of the global bit-bar lines 453 couples to the channel (output) of the other of the two switches or transfer transistors 449 of each of the third type of static random-access memory (SRAM) cells 398 in the same ($i^{th}$) column of one of the first arrays in the same ($p^{th}$) column of the second array. The memory bank 2460 may further include (1) a global row decoder 2461 coupling to each of its global word lines 2451, (2) a sense-amplifier block 2462 including multiple sense amplifiers each coupling to a pair of its global bit line 2452 and global bit-bar line 2453 coupling to the two channels of the respective two switches or transfer transistors 449 of each of the third type of static random-access memory (SRAM) cells 398 in one column of the first array in each of its memory sections 2050 in one column of the second array, and (3) a global column decoder 2463 coupling to an output point of each of the sense amplifiers of its sense-amplifier block 2462. Its global row decoder 2461 is configured to select, in accordance with an input data set of its global row decoder 2461, one by one from its global word lines 2451 to access data stored in each of the third type of static random-access memory (SRAM) cells 398 in one row of the first array in each of its memory sections 2050 in one row of the second array coupling to said one of its global word lines 2451 to be passed to a pair of its global bit line 2452 and global bit-bar line 2453 coupling to the two channels of the respective two switches or transfer transistors 449 of said each of the third type of static random-access memory (SRAM) cells 398. One of the sense amplifiers of its sense-amplifier block 2462 is configured to sense two voltages at the pair of its global bit line 2452 and global bit-bar line 2453 and then to amplify a difference between the two voltages as a data output of said one of the sense amplifiers at the output point of said one of the sense amplifiers to be passed to its global column decoder 2463. Its global column decoder 2463 is configured to select, in accordance with a first input data set of its global column decoder 2463, one or more data inputs from a second input data set of its global column decoder 2463 passed from the output point of each of the sense amplifiers of its sense-amplifier block 2462 as one or more data outputs of its global column decoder 2463 at one or more output points of its global column decoder 2463. Its global column decoder 2463 is configured for writing data into each of the third type of static random-access memory (SRAM) cells 398 in each of its memory sections 2050 to be stored therein through a pair of its global bit line 2452 and global bit-bar line 2453.

Thereby, referring to FIG. 6, for the memory bank 2460, its global row decoder 2461 is configured to select, in accordance with an input data set of its global row decoder 2461, one by one from its global word lines 2451 to allow data to be passed from each pair of its global bit line 2452 and global bit-bar line 2453 to the memory cell 446 of one of the third type of static random-access memory (SRAM) cells 398 in one row of the first array in each of its memory sections 2050 in one row of the second array through the two channels of the respective two switches or transfer transistors 449 of said one of the third type of static random-access memory (SRAM) cells 398 to be written or stored in the memory cell 446 of said one of the third type of static random-access memory (SRAM) cells 398. Further, its global row decoder 2461 is configured to select, in accordance with the input data set of its global row decoder 2461, one by one from the global word lines 2451 of its global row decoder 2461 to allow data to be passed or read from the memory cell 446 of each of the third type of static random-access memory (SRAM) cells 398 in one row of the first array in each of its memory sections 2050 in one row of the second array through the two channels of the respective two switches or transfer transistors 449 of said each of the third type of static random-access memory (SRAM) cells 398 to a pair of its global bit line 2452 and global bit-bar line 2453.

Accordingly, referring to FIGS. 5A-5D and 6, in a mode for logic operation, each of the coarse-grained programmable logic cells or elements 2060 arranged in the second array may select, in accordance with address data associated with the input data set of its local row decoder 2061 and the first input data set of its local column decoder 2062 as illustrated in FIG. 5A, data inputs from the resulting values or data or programming codes stored in its third type of static random-access memory (SRAM) cells 398 in the first array as its data outputs at the one or more output points of its local column decoder 2062 to be registered or stored in its block 2063 for registers or flip-flop circuits. In another mode for configuration or reconfiguration operation, the memory bank 2460 may allow data, i.e., resulting values or data or programmable codes, to be written or stored, in accordance with address data associated with the input data set of its global row decoder 2461 as illustrated in FIGS. 5A-5D and 6, into the memory cell 446 of each of the third type of static random-access memory (SRAM) cells 398 in one by one row of the first array in each of its memory sections 2050 in one by one row of the second array through each of its global bit lines 2452 or each of its global bit-bar lines 2453. In another mode for data writing operation, the memory bank 2460 may allow data to be written or stored, in accordance with address data associated with the input data set of its global row decoder 2461 as illustrated in FIGS. 5A-5D and 6, into the memory cell 446 of each of the third type of static random-access memory (SRAM) cells 398 in one by one row of the first array in each of its memory sections 2050 in one by one row of the second array through each of its global bit lines 2452 or each of its global bit-bar lines 2453. In another mode for data reading operation, the memory bank 2460 may select, in accordance with address data associated with the input data set of its global row decoder 2461 and the first input data set of its global column decoder 2463 as illustrated in FIGS. 5A-5D and 6, data inputs from data stored in the third type of static random-access memory (SRAM) cells 398 of each of its memory sections 2050 as data outputs thereof at one or more output points of its global column decoder 2463.

First Type of Coarse-Grained Field Programmable (CGFP) Architecture

Figure 7:
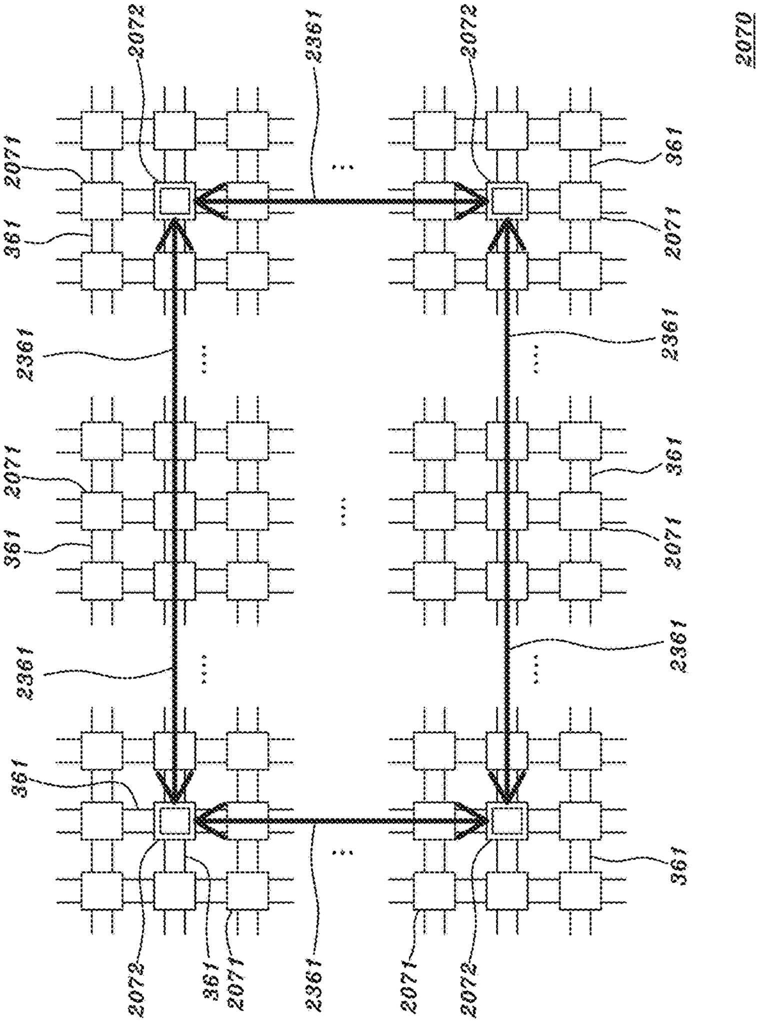
FIG. 7 is a block diagram showing a first type of coarse-grained field programmable (CGFP) architecture in accordance with an embodiment of the present application.

FIG. 7 is a block diagram showing a first type of coarse-grained field programmable (CGFP) architecture in accordance with an embodiment of the present application. Referring to FIG. 7, a first type of coarse-grained field programmable (CGFP) architecture 2070, i.e., a first type of coarse-grained functional section (CGFS), may include multiple programmable-interconnection-combined functional units 2071 and programmable-interconnection networking units 2072 arranged in an array with multiple rows by multiple columns, wherein multiple of its programmable-interconnection-combined functional units 2071, having the number of u, distributed in a line in an x direction may be arranged between neighboring two of its programmable-interconnection networking units 2072 distributed in a line in the x direction, and multiple of its programmable-interconnection-combined functional units 2071, having the number of v, distributed in a line in a y direction may be arranged between neighboring two of its programmable-interconnection networking units 2072 distributed in a line in the y direction, wherein each of the numbers of u and v may be a positive integer equal to or greater than 8, 16, 32, 64, 128 or 256. In an aspect, the number of u may be equal to the number of v. Neighboring two of its programmable-interconnection-combined functional units 2071 and programmable-interconnection networking units 2072 may couple to each other through its programmable interconnects 361.

Figure 8A:
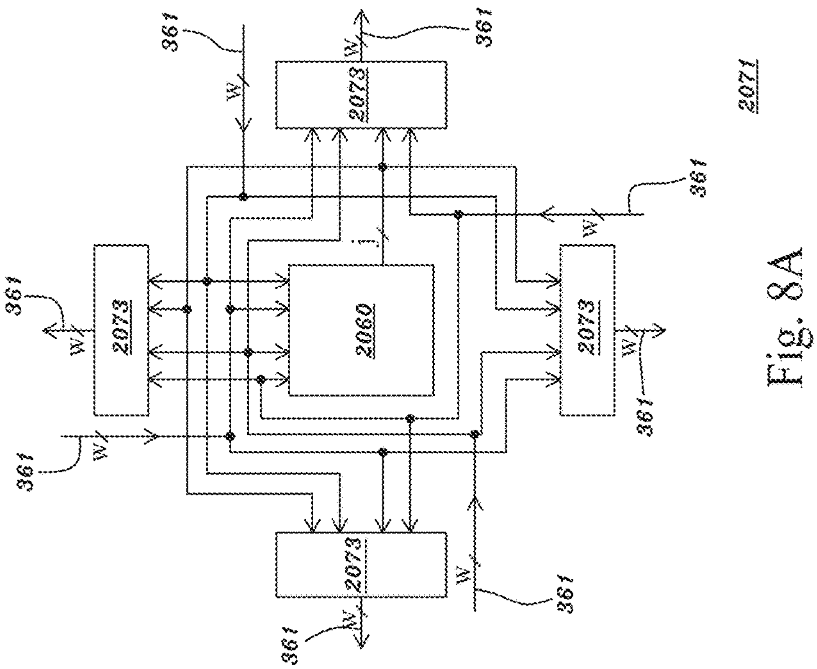
FIG. 8A is a block diagram showing a programmable-interconnection-combined functional unit for a first type of coarse-grained field programmable (CGFP) architecture in accordance with an embodiment of the present application.
Figure 8B:
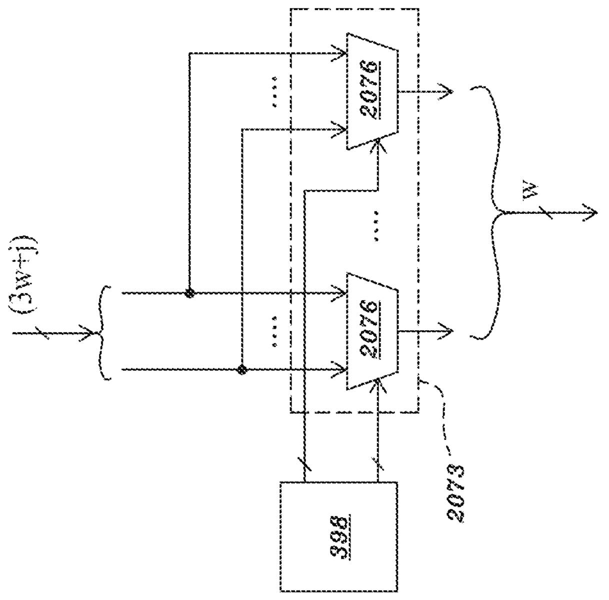
FIG. 8B is a circuit diagram of a selection circuit in accordance with an embodiment of the present application.

FIG. 8A is a block diagram showing a programmable-interconnection-combined functional unit for a first type of coarse-grained field programmable (CGFP) architecture in accordance with an embodiment of the present application. FIG. 8B is a circuit diagram of a selection circuit in accordance with an embodiment of the present application. Referring to FIGS. 7 and 8A, for the first type of coarse-grained field programmable (CGFP) architecture 2070, each of its programmable-interconnection-combined functional units 2071 may include the coarse-grained programmable logic cell or element 2060 as illustrated in FIG. 5A and a programmable interconnection network (PINet), i.e., neighbor interfacing circuits (NIC), around the coarse-grained programmable logic cell or element 2060 of said each of its programmable-interconnection-combined functional units 2071, wherein the programmable interconnection network of said each of its programmable-interconnection-combined functional units 2071 may include four selection circuits 2073, i.e., switch boxes, at front, back, left and right respective sides of the coarse-grained programmable logic cell or element 2060 of said each of its programmable-interconnection-combined functional units 2071, wherein each of the four selection circuits 2073 thereof at one side of the front, back, left and right sides of the coarse-grained programmable logic cell or element 2060 of said each of its programmable-interconnection-combined functional units 2071 may have a group of output points, having the number of w, coupling to another of its programmable-interconnection-combined functional units 2071 adjacent to said each of its programmable-interconnection-combined functional units 2071 and at said one side. For example, the selection circuit 2073 of said each of its programmable-interconnection-combined functional units 2071 at the right side of the coarse-grained programmable logic cell or element 2060 of said each of its programmable-interconnection-combined functional units 2071 may have a group of output points coupling to another of its programmable-interconnection-combined functional units 2071 adjacent to said each of its programmable-interconnection-combined functional units 2071 and at the right side of the coarse-grained programmable logic cell or element 2060 of said each of its programmable-interconnection-combined functional units 2071. Further, each of the four selection circuits 2073 of said each of its programmable-interconnection-combined functional units 2071 at one side of the front, back, left and right sides of the coarse-grained programmable logic cell or element 2060 of said each of its programmable-interconnection-combined functional units 2071 may have (1) three groups of input points, each group of which may have the number of w and couple to the group of output points of one of the four selection circuits 2073 of one of another three of its programmable-interconnection-combined functional units 2071 adjacent to said each of its programmable-interconnection-combined functional units 2071 and at the other respective three sides of the front, back, left and right sides of the coarse-grained programmable logic cell or element 2060 of said each of its programmable-interconnection-combined functional units 2071 through one of three groups of its programmable interconnects 361 therebetween to receive data associated with an output data set of said one of the four selection circuits 2073 at the group of output points of said one of the four selection circuits 2073, and (2) another group of input points, having the number of j, coupling to the block 2063 for registers or flip-flop circuits of the coarse-grained programmable logic cell or element 2060 of said each of its programmable-interconnection-combined functional units 2071 to receive data associated with the data outputs of the coarse-grained programmable logic cell or element 2060 of said each of its programmable-interconnection-combined functional units 2071, which are stored in the block 2063 for registers or flip-flop circuits of the coarse-grained programmable logic cell or element 2060 of said each of its programmable-interconnection-combined functional units 2071. Further, the set of input points of the selection circuit 2064 of the coarse-grained programmable logic cell or element 2060, as seen in FIG. 5A, of said each of its programmable-interconnection-combined functional units 2071 may be divided into four groups each coupling to the group of output points of one of the four selection circuits 2073 of one of another four of its programmable-interconnection-combined functional units 2071 adjacent to and at the respective front, back, left and right sides of said each of its programmable-interconnection-combined functional units 2071 through one group of respective four groups of its programmable interconnects 361 therebetween to receive data associated with an output data set at the group of output points of said one of the four selection circuits 2073, wherein said one of the selection circuits 2073 is adjacent to and at one of the front, back, left and right sides of said each of its programmable-interconnection-combined functional units 2071. In an example, the number of j may be equal to the number of w, and the number of k may be equal to the number of 4w.

Referring to FIGS. 7 and 8A, for the first type of coarse-grained field programmable (CGFP) architecture 2070, each of the four selection circuits 2073 of each of its programmable-interconnection-combined functional units 2071 is configured to select, in accordance with a first input data set thereof associated with programming codes stored in its interconnection-programming memory cells, e.g., the memory cells 398 as illustrated in any of FIGS. 1A-1G, multiple data inputs from a second input data set thereof at the three and another groups of input points thereof as an output data set thereof at the group of output points thereof. For more elaboration, referring to FIGS. 8A and 8B, said each of the four selection circuits 2073 may include multiple multiplexers 2076, having the number of w, arranged in parallel each having a set of input points coupling to the three and another groups of input points thereof respectively and an output point coupling to one of the group of output points thereof, wherein each of the multiplexers 2076 thereof is configured to select, in accordance with one or more data inputs of the first input data set of said each of the four selection circuits 2073 associated with programming codes stored in its interconnection-programming memory cells, e.g., the memory cells 398 as illustrated in any of FIGS. 1A-1G, a data input from multiple data inputs at the set of input points of said each of the multiplexers 2076 thereof as a data output at the output point of said each of the multiplexers 2076 thereof in the output data set of said each of the four selection circuits 2073.

Thereby, referring to FIGS. 7, 8A and 8B, for the first type of coarse-grained field programmable (CGFP) architecture 2070, the selection circuit 2064 of the coarse-grained programmable logic cell or element 2060 of each of its programmable-interconnection-combined functional units 2071 may be configured for selecting the first and second data inputs from the second input data set thereof passed from the group of output points of one of the four selection circuits 2073 of each of another four of its programmable-interconnection-combined functional units 2071 adjacent to said each of its programmable-interconnection-combined functional units 2071 and at one side of the front, back, left and right sides of said each of its programmable-interconnection-combined functional units 2071, wherein said one of the four selection circuits 2073 is adjacent to said each of its programmable-interconnection-combined functional units 2071 and at said one side. Further, the four selection circuits 2073 of said each of its programmable-interconnection-combined functional units 2071 are configured for selecting a specific programmable-interconnection-combined functional unit 2071 from said another four of its programmable-interconnection-combined functional units 2071 to have one group of the three groups of input points of each of specific three selection circuits 2073 of the four selection circuits 2073 of the specific programmable-interconnection-combined functional unit 2071 and the set of input points of the selection circuit 2064 of the coarse-grained programmable logic cell or element 2060 of the specific programmable-interconnection-combined functional unit 2071 receive data associated with the data outputs of the coarse-grained programmable logic cell or element 2060 of said each of its programmable-interconnection-combined functional units 2071, which are stored in the block 2063 for registers or flip-flop circuits of the coarse-grained programmable logic cell or element 2060 of said each of its programmable-interconnection-combined functional units 2071, wherein the specific three selection circuits 2073 do not neighbor said each of its programmable-interconnection-combined functional units 2071. Further, the four selection circuits 2073 of said each of its programmable-interconnection-combined functional units 2071 are configured for bypassing the output data set of a specific selection circuit 2073 of the four selection circuits 2073 of each of said another four of its programmable-interconnection-combined functional units 2071, wherein the specific selection circuit 2073 neighbors said each of its programmable-interconnection-combined functional units 2071, to one group of the three groups of input points of each of specific three selection circuits 2073 of the four selection circuits 2073 of each of the others of said another four of its programmable-interconnection-combined functional units 2071, wherein the specific three selection circuits 2073 do not neighbor said each of its programmable-interconnection-combined functional units 2071, and to the set of input points of the coarse-grained programmable logic cell or element 2060 of said each of the others of said another four of its programmable-interconnection-combined functional units 2071.

Figure 9:
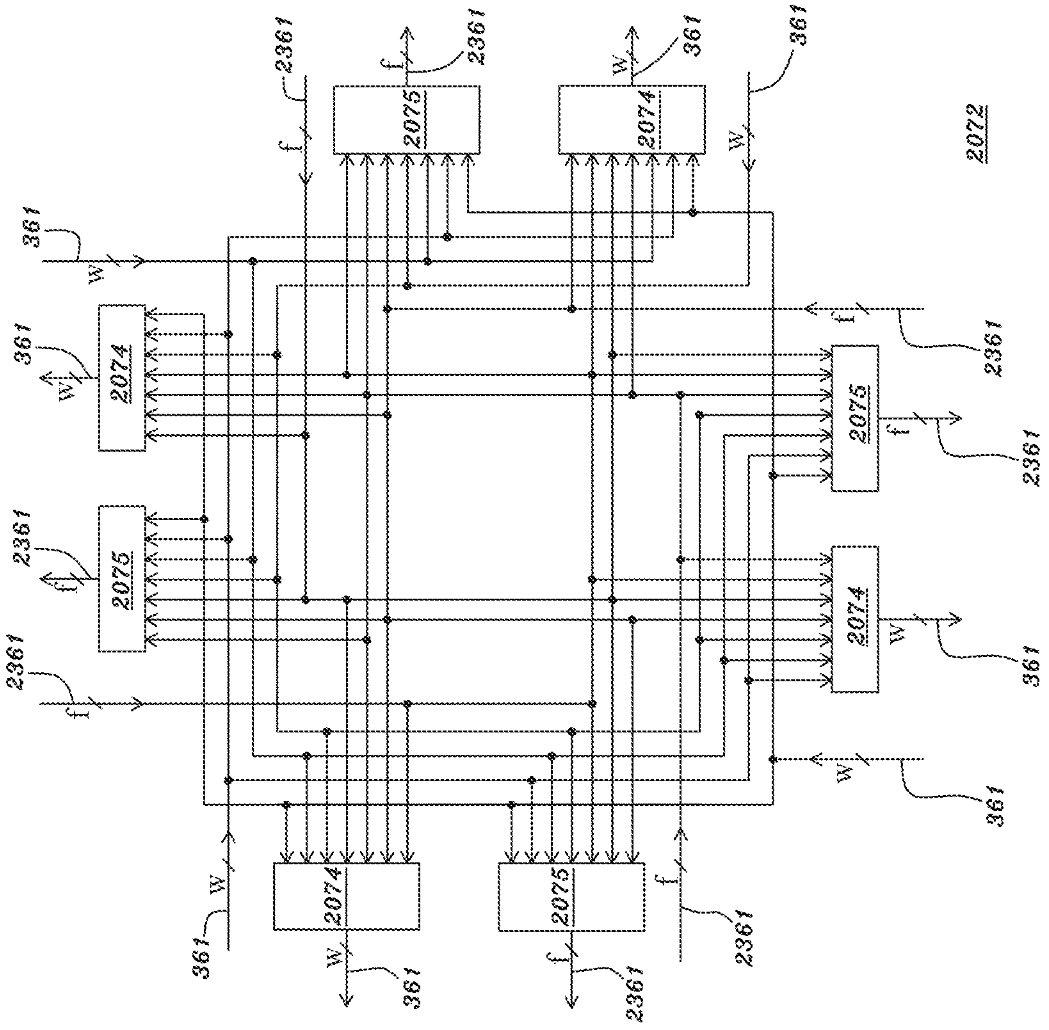
FIG. 9 is a circuit diagram showing a programmable-interconnection networking unit in accordance with an embodiment of the present application.

FIG. 9 is a circuit diagram showing a programmable-interconnection networking unit in accordance with an embodiment of the present application. Referring to FIGS. 7, 8A, 8B and 9, for the first type of coarse-grained field programmable (CGFP) architecture 2070, each of its programmable-interconnection networking units 2072, i.e., long distance programmable interconnection unit (LDPIU), may couple to four of its programmable-interconnection-combined functional units 2071 adjacent to said each of its programmable-interconnection networking units 2072 and at front, back, left and right respective sides of said each of its programmable-interconnection networking units 2072 through four respective groups of its programmable interconnects 361 therebetween. Each of its programmable-interconnection networking units 2072 may couple to another four of its programmable-interconnection networking units 2072 at front, back, left and right respective sides of said each of its programmable-interconnection networking units 2072 through four respective groups of its programmable bypass paths 2361. Each of its programmable-interconnection networking units 2072 may include four field-programmable local-interconnection selection circuits 2074, i.e., switch boxes, and field-programmable bypass-path selection circuits 2075, i.e., switch boxes, at front, back, left and right respective sides thereof, wherein each of the four field-programmable local-interconnection selection circuits 2074 thereof at one side of the front, back, left and right sides thereof may include (1) three first groups of input points, each group of which may have the number of w and couple to a group of its programmable interconnects 361 extending to another side of the front, back, left and right sides thereof, a group of input points of each of two of the four field-programmable local-interconnection selection circuits 2074 thereof at the other respective two sides of the front, back, left and right sides thereof, and a group of input points of each of the four field-programmable bypass-path selection circuits 2075 thereof at one side of the front, back, left and right sides thereof, and (2) four second groups of input points, each group of which may have the number off and couple to a group of input points of each of the other three of the four field-programmable local-interconnection selection circuits 2074 thereof at the other respective three sides of the front, back, left and right sides thereof, one group of the four groups of its programmable bypass paths 2361 extending to a first specific side of the front, back, left and right sides thereof and a group of input points of each of three of the four field-programmable bypass-path selection circuits 2075 thereof at respective three sides of the front, back, left and right sides thereof other than the first specific side, and each of the four field-programmable bypass-path selection circuits 2075 thereof, i.e., selection circuits, at one of the front, back, left and right sides thereof may include (1) three first groups of input points, each group of which may have the number of f and couple to a group of its programmable bypass paths 2361 extending to another side of the front, back, left and right sides thereof, a group of input points of each of two of the four field-programmable bypass-path selection circuits 2075 thereof at the other respective two sides of the front, back, left and right sides thereof, and a group of input points of each of the four field-programmable local-interconnection selection circuits 2074 thereof at one side of the front, back, left and right sides thereof, and (2) four second groups of input points, each group of which may have the number of w and couple to a group of input points of each of the other three of the four field-programmable bypass-path selection circuits 2075 thereof at the other respective three sides of the front, back, left and right sides thereof, one group of the four groups of its programmable interconnects 361 extending to a second specific side of the front, back, left and right sides thereof and a group of input points of each of three of the four field-programmable local-interconnection selection circuits 2074 thereof at respective three sides of the front, back, left and right sides thereof other than the second specific side.

Referring to FIGS. 7, 8A, 8B and 9, for the first type of coarse-grained field programmable (CGFP) architecture 2070, each of the four field-programmable local-interconnection selection circuits 2074 of each of its programmable-interconnection networking units 2072 at one side of the front, back, left and right sides of said each of its programmable-interconnection networking units 2072 is configured to select, in accordance with a first input data set thereof associated with programming codes stored in its interconnection-programming memory cells, e.g., the memory cells 398 as illustrated in any of FIGS. 1A-1G, multiple data inputs from a second input data set thereof associated with data at the three first groups of input points thereof and the four second groups of input points thereof as an output data set thereof at a group of output points thereof, having the number of w, coupling to the set of input points of the selection circuit 2064 of the coarse-grained programmable logic cell or element 2060 of one of its programmable-interconnection-combined functional units 2071 adjacent to said each of its programmable-interconnection networking units 2072 and at said one side and three of the four selection circuits 2073 of said one of its programmable-interconnection-combined functional units 2071 at respective three sides of the front, back, left and right sides of said one of its programmable-interconnection-combined functional units 2071, other than the other of the four selection circuits 2073 of said one of its programmable-interconnection-combined functional units 2071 at the other side of the front, back, left and right sides of said one of its programmable-interconnection-combined functional units 2071 facing said each of its programmable-interconnection networking units 2072, through a group of its programmable interconnects 361 therebetween. For example, the field-programmable local-interconnection selection circuit 2074 of each of its programmable-interconnection networking units 2072 at the front side of said each of its programmable-interconnection networking units 2072 is configured to select, in accordance with a first input data set thereof associated with programming codes stored in its interconnection-programming memory cells, e.g., the memory cells 398 as illustrated in any of FIGS. 1A-1G, multiple data inputs from a second input data set thereof associated with data at the three first groups of input points thereof and the four second groups of input points thereof as an output data set at a group of output points thereof coupling to the set of input points of the selection circuit 2064 of the coarse-grained programmable logic cell or element 2060 of one of its programmable-interconnection-combined functional units 2071 adjacent to said each of its programmable-interconnection networking units 2072 and at the front side of said each of its programmable-interconnection networking units 2072 and three of the four selection circuits 2073 of said one of its programmable-interconnection-combined functional units 2071 at the front, left and right respective sides of said one of its programmable-interconnection-combined functional units 2071 through a group of its programmable interconnects 361 therebetween.

Further, referring to FIGS. 7, 8A, 8B and 9, each of the four field-programmable bypass-path selection circuits 2075 of each of its programmable-interconnection networking units 2072 at one side of the front, back, left and right sides of said each of its programmable-interconnection networking units 2072 is configured to select, in accordance with a first input data set thereof associated with data stored in its memory cells, e.g., the memory cells 398 as illustrated in any of FIGS. 1A-1G, multiple data inputs from a second input data set thereof associated with data at the three first groups of input points thereof and the four second groups of input points thereof as an output data set at a group of output points thereof coupling to the four field-programmable local-interconnection selection circuits 2074 of another of its programmable-interconnection networking units 2072 at the front, back, left and right respective sides of said another of its programmable-interconnection networking units 2072 and three of the four field-programmable bypass-path selection circuits 2075 of said another of its programmable-interconnection networking units 2072 at respective three of the front, back, left and right sides of said another of its programmable-interconnection networking units 2072, other than the other of the four field-programmable bypass-path selection circuits 2075 of said another of its programmable-interconnection-combined functional units 2071 at the other side of the front, back, left and right sides of said another of its programmable-interconnection-combined functional units 2071 facing said each of its programmable-interconnection networking units 2072, through a group of its programmable bypass paths 2361 therebetween.

Alternatively, for the first type of coarse-grained field programmable (CGFP) architecture 2070, the coarse-grained programmable logic cell or element 2060 of each of its programmable-interconnection-combined functional units 2071 as seen in FIG. 8A may be replaced with the coarse-grained reconfigurable (CGR) unit 2052 as illustrated in FIG. 4. Referring to FIGS. 4, 7 and 8A, the programmable interconnection network of each of its programmable-interconnection-combined functional units 2071 may include the four selection circuits 2073 at front, back, left and right respective sides of the coarse-grained reconfigurable (CGR) unit 2052 of said each of its programmable-interconnection-combined functional units 2071, wherein each of the four selection circuits 2073 of said each of its programmable-interconnection-combined functional units 2071 at one side of the front, back, left and right sides of the coarse-grained reconfigurable (CGR) unit 2052 of said each of its programmable-interconnection-combined functional units 2071 may have a group of output points, having the number of w, coupling to another of its programmable-interconnection-combined functional units 2071 adjacent to said each of its programmable-interconnection-combined functional units 2071 and at said one side. Further, each of the four selection circuits 2073 of said each of its programmable-interconnection-combined functional units 2071 at one side of the front, back, left and right sides of the coarse-grained reconfigurable (CGR) unit 2052 of said each of its programmable-interconnection-combined functional units 2071 may have (1) three groups of input points, each group of which may have the number of w and couple to the group of output points of one of the four selection circuits 2073 of one of another three of its programmable-interconnection-combined functional units 2071 adjacent to said each of its programmable-interconnection-combined functional units 2071 and at the other respective three sides of the front, back, left and right sides of the coarse-grained reconfigurable (CGR) unit 2052 of said each of its programmable-interconnection-combined functional units 2071 through one of three groups of its programmable interconnects 361 therebetween to receive data associated with an output data set of said one of the four selection circuits 2073 at the group of output points of said one of the four selection circuits 2073, and (2) another group of input points, having the number of j, coupling to the registering block 2045 of the coarse-grained reconfigurable (CGR) unit 2052 of said each of its programmable-interconnection-combined functional units 2071 to receive data associated with data outputs of the coarse-grained reconfigurable (CGR) unit 2052 of said each of its programmable-interconnection-combined functional units 2071, which are stored in the registering block 2045 of the coarse-grained reconfigurable (CGR) unit 2052 of said each of its programmable-interconnection-combined functional units 2071. Further, the first set of input points 2044 of the functional unit 2053 of the coarse-grained reconfigurable (CGR) unit 2052 of said each of its programmable-interconnection-combined functional units 2071 may have the number of k and may be divided into four groups each coupling to the group of output points of one of the four selection circuits 2073 of one of another four of its programmable-interconnection-combined functional units 2071 adjacent to and at the respective front, back, left and right sides of said each of its programmable-interconnection-combined functional units 2071 through one group of four respective groups of its programmable interconnects 361 therebetween to receive data associated with an output data set at the group of output points of said one of the four selection circuits 2073, wherein said one of the selection circuits 2073 is adjacent to and at one of the front, back, left and right sides of said each of its programmable-interconnection-combined functional units 2071. In an example, the number of j may be equal to the number of w, and the number of k may be equal to the number of 4w.

Second Type of Coarse-Grained Field Programmable (CGFP) Architecture

Figure 10:
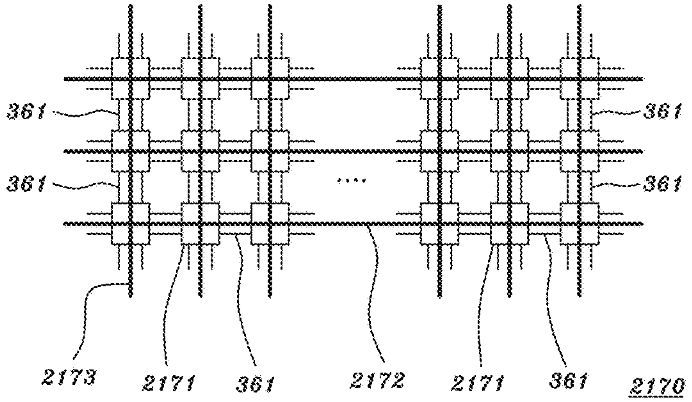
FIG. 10 is a block diagram showing a second type of coarse-grained field programmable (CGFP) architecture in accordance with an embodiment of the present application.

FIG. 10 is a block diagram showing a second type of coarse-grained field programmable (CGFP) architecture in accordance with an embodiment of the present application. Referring to FIG. 10, a second type of coarse-grained field programmable (CGFP) architecture 2170, i.e., a second type of coarse-grained functional section (CGFS), may include (1) multiple programmable-interconnection-combined functional units 2171, i.e., global coarse-grained look-up table (GCGLUT), arranged in an array with multiple rows by multiple columns, wherein neighboring two of the programmable-interconnection-combined functional units 2171 of its second type of coarse-grained field programmable (CGFP) architecture 2170 may couple to each other through multiple programmable interconnects 361, (2) multiple groups of programmable bypass paths 2172, each group of which may extend in a horizontal direction and couple to each of the programmable-interconnection-combined functional units 2171 of its second type of coarse-grained field programmable (CGFP) architecture 2170 in one row of the rows of the array, and (3) multiple groups of programmable bypass paths 2173, each group of which may extend in a vertical direction and couple to each of the programmable-interconnection-combined functional units 2171 of its second type of coarse-grained field programmable (CGFP) architecture 2170 in one column of the columns of the array.

Figure 11A:
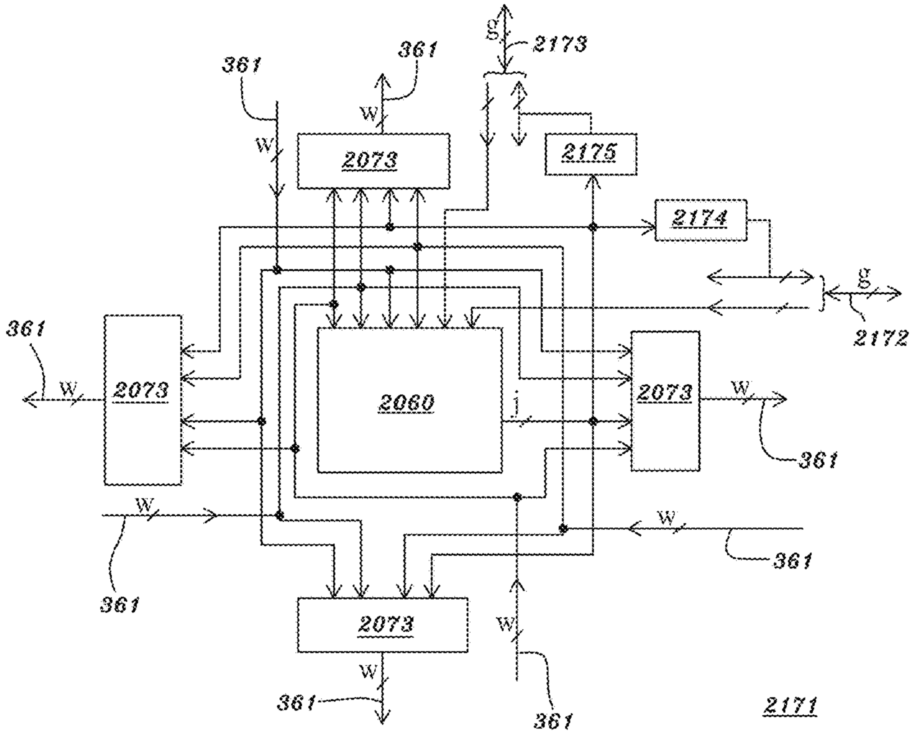
FIG. 11A is a block diagram showing a programmable-interconnection-combined functional unit for a second type of coarse-grained field programmable (CGFP) architecture in accordance with an embodiment of the present application.

FIG. 11A is a block diagram showing a programmable-interconnection-combined functional unit for a second type of coarse-grained field programmable (CGFP) architecture in accordance with an embodiment of the present application. Referring to FIGS. 10 and 11A, for the second type of coarse-grained field programmable (CGFP) architecture 2170, each of its programmable-interconnection-combined functional units 2171 may have a similar scheme as the programmable-interconnection-combined functional unit 2071 for the first type of coarse-grained field programmable (CGFP) architecture 2070 as illustrated in FIG. 8A, but the difference therebetween is that the set of input points of the selection circuit 2064 of the coarse-grained programmable logic cell or element 2060 of each of its programmable-interconnection-combined functional units 2171 may be divided into six groups, four groups of which each may couple to the group of output points of one of the selection circuits 2073 of one of another four of its programmable-interconnection-combined functional units 2171 adjacent to and at the respective front, back, left and right sides of said each of its programmable-interconnection-combined functional units 2171 through one group of four respective groups of its programmable interconnects 361 therebetween to receive data associated with an output data set at the group of output points of said one of the four selection circuits 2073, wherein said one of the selection circuits 2073 is adjacent to and at one side of the front, back, left and right sides of said each of its programmable-interconnection-combined functional units 2171. Another group of the six groups of the set of input points of the selection circuit 2064 of the coarse-grained programmable logic cell or element 2060 of said each of its programmable-interconnection-combined functional units 2171 may couple to one group of its multiple groups of programmable bypass paths 2172 having the number of g, and the other group of the six groups of the set of input points of the selection circuit 2064 of the coarse-grained programmable logic cell or element 2060 of said each of its programmable-interconnection-combined functional units 2171 may couple to one group of its multiple groups of programmable bypass paths 2173 having the number of g, wherein the number of g is a positive integer. Further, for the second type of coarse-grained field programmable (CGFP) architecture 2170, each of its programmable-interconnection-combined functional units 2171 may further include global interconnection circuits (GIC) around the coarse-grained programmable logic cell or element 2060 of said each of its programmable-interconnection-combined functional units 2171, wherein the global interconnection circuits (GIC) of said each of its programmable-interconnection-combined functional units 2171 may include (1) a field-programmable crossbar selection circuit 2174, i.e., switch box, having multiple output points each coupling to one group of its multiple groups of programmable bypass paths 2172 and (2) a field-programmable crossbar selection circuit 2175, i.e., switch box, having multiple output points $Out_0$-$Out_N$ each coupling to one group of its multiple groups of programmable bypass paths 2173.

Figure 11B:
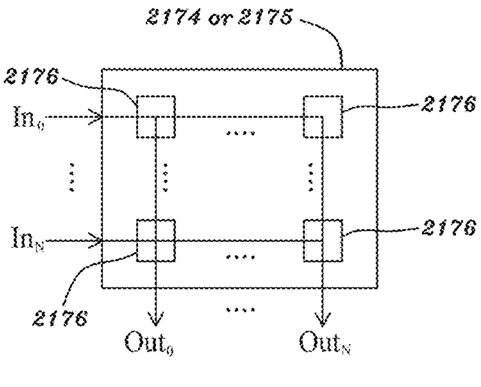
FIG. 11B is a circuit diagram of a field-programmable crossbar selection circuit in accordance with an embodiment of the present application.

Further, FIG. 11B is a circuit diagram of a field-programmable crossbar selection circuit in accordance with an embodiment of the present application. Referring to FIGS. 10, 11A and 11B, for the second type of coarse-grained field programmable (CGFP) architecture 2170, each of the field-programmable crossbar selection circuits 2174 and 2175 of each of its programmable-interconnection-combined functional units 2171 is configured to switch, in accordance with a first input data set thereof associated with programming codes stored in its multiple interconnection-programming memory cells, e.g., the memory cells 398 as illustrated in any of FIGS. 1A-1G, each of multiple data inputs of a second input data set thereof at one of multiple input points $In_0$-$In_N$ thereof as a data output at one of the output points $Out_0$-$Out_N$ thereof. Each of the four selection circuits 2073 of each of its programmable-interconnection-combined functional units 2171 at one side of the front, back, left and right sides of the coarse-grained programmable logic cell or element 2060 of said each of its programmable-interconnection-combined functional units 2171 may have (1) three groups of input points, each group of which may have the number of w and couple to the group of output points of one of the four selection circuits 2073 of one of another three of its programmable-interconnection-combined functional units 2171 adjacent to said each of its programmable-interconnection-combined functional units 2171 and at the other respective three sides of the front, back, left and right sides of the coarse-grained programmable logic cell or element 2060 of said each of its programmable-interconnection-combined functional units 2171 through three respective groups of its programmable interconnects 361 therebetween to receive data associated with an output data set of said one of the four selection circuits 2073 at the group of output points of said one of the four selection circuits 2073, and (2) another group of input points, having the number of j, coupling to the block 2063 for registers or flip-flop circuits of the coarse-grained programmable logic cell or element 2060 of said each of its programmable-interconnection-combined functional units 2171, the input points $In_0$-$In_N$ of the field-programmable crossbar selection circuit 2174 of said each of its programmable-interconnection-combined functional units 2171 and the input points $In_0$-$In_N$ of the field-programmable crossbar selection circuit 2175 of said each of its programmable-interconnection-combined functional units 2171, wherein the another group of input points of each of the four selection circuits 2073 of said each of its programmable-interconnection-combined functional units 2171, the input points $In_0$-$In_N$ of the field-programmable crossbar selection circuit 2174 of said each of its programmable-interconnection-combined functional units 2171 and the input points $In_0$-$In_N$ of the field-programmable crossbar selection circuit 2175 of said each of its programmable-interconnection-combined functional units 2171 may receive data associated with the data outputs of the coarse-grained programmable logic cell or element 2060 of said each of its programmable-interconnection-combined functional units 2171, which are stored in the block 2063 for registers or flip-flop circuits of the coarse-grained programmable logic cell or element 2060 of said each of its programmable-interconnection-combined functional units 2171. In an example, the number of j may be equal to the number of w, and the number of k may be equal to the number of (4w+2g). For an element indicated by the same reference number shown in FIGS. 5A-5D, 6 8A, 8B, 10 and 11A, the specification of the element as seen in FIGS. 10 and 11A may be referred to that of the element as illustrated in FIGS. 5A-5D, 6, 8A and 8B.

Thereby, referring to FIGS. 10 and 11A, for the second type of coarse-grained field programmable (CGFP) architecture 2170, each of its programmable-interconnection-combined functional units 2171 may transmit data to a distant one of its programmable-interconnection-combined functional units 2171 through one of the field-programmable crossbar selection circuits 2174 and 2175 of said each of its programmable-interconnection-combined functional units 2171, one of its programmable bypass paths 2172 or 2173 and one of the field-programmable crossbar selection circuits 2174 and 2175 of said distant one of its programmable-interconnection-combined functional units 2171, wherein between said each of its programmable-interconnection-combined functional units 2171 and said distant one of its programmable-interconnection-combined functional units 2171 may be one or more of its programmable-interconnection-combined functional units 2171.

Figure 11C:
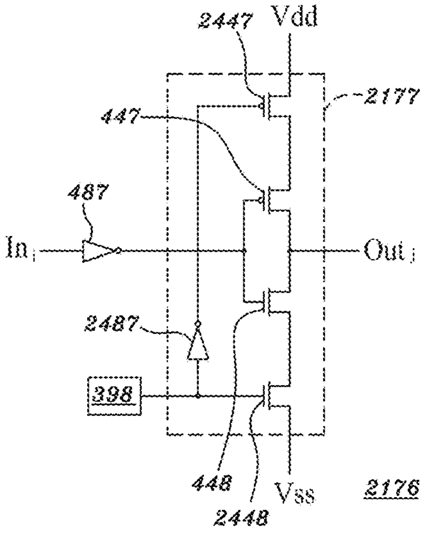
FIG. 11C is a circuit diagram of a switch cells of a field-programmable crossbar selection circuit in accordance with an embodiment of the present application.

For more details, FIG. 11C is a circuit diagram of a switch cells of a field-programmable crossbar selection circuit in accordance with an embodiment of the present application. Referring to FIG. 11A-11C, for the second type of coarse-grained field programmable (CGFP) architecture 2170, each of the field-programmable crossbar selection circuits 2174 and 2175 of each of its programmable-interconnection-combined functional units 2171 may include multiple switch cells 2176 arranged in an array with multiple rows by multiple columns, wherein each of the switch cells 2176 of said each of the field-programmable crossbar selection circuits 2174 and 2175 in each of the rows of the array may have an input point coupling to a same one of the input points $In_0$-$In_N$ of said each of the field-programmable crossbar selection circuits 2174 and 2175 and an output point coupling to a different one of the output points $Out_0$-$Out_N$ of said each of the field-programmable crossbar selection circuits 2174 and 2175, and each of the switch cells 2176 of said each of the field-programmable crossbar selection circuits 2174 and 2175 in each of the columns of the array may have the input point coupling to a different one of the input points $In_0$-$In_N$ of said each of the crossbar switch boxes 2174 and 2175 and the output point coupling to a same one of the output points $Out_0$-$Out_N$ of said each of the field-programmable crossbar selection circuits 2174 and 2175. Each of the switch cells 2176 of said each of the field-programmable crossbar selection circuits 2174 and 2175 is configured to control, in accordance with one of multiple data inputs of the first input data set of said each of the field-programmable crossbar selection circuits 2174 and 2175 associated with a programming code stored in one of its interconnection-programming memory cells, e.g., the memory cells 398 as illustrated in any of FIGS. 1A-1G, coupling between the input point of said each of the switch cells 2176 and the output point of said each of the switch cells 2176. Said each of the switch cells 2176 may include (1) a tristate inverter 2177 composed of a P-type MOS transistor 447 and N-type MOS transistor 448 both having respective drain terminals coupling to each other to act as an output point of the tristate inverter 2177 of said each of the switch cells 2176 and to an output point $Out_j$ of the output points $Out_0$-$Out_N$ of said each of the field-programmable crossbar selection circuits 2174 and 2175 and respective gate terminals coupling to each other to act as an input point of the tristate inverter 2177 of said each of the switch cells 2176, a P-type MOS transistor 2447 and N-type MOS transistor 2448 both having respective drain terminals coupling to respective source terminals of the P-type MOS transistor 447 and N-type MOS transistor 448 of the tristate inverter 2177 of said each of the switch cells 2176 and respective source terminals coupling to the voltage Vcc of power supply and to the voltage Vss of ground reference, and an inverter 2487 having an input point coupling to the gate terminal of the N-type MOS transistor 2448 of the tristate inverter 2177 of said each of the switch cells 2176 and receiving data associated with a programming code stored in one of its interconnection-programming memory cells 398 and an output point coupling to the gate terminal of the P-type MOS transistor 2447 of the tristate inverter 2177 of said each of the switch cells 2176, wherein the inverter 2487 is configured to invert a data input of the inverter 2487 at the input point of the inverter 2487 as a data output of the inverter 2487 at the output point of the inverter 2487, and (2) an inverter 487 having an input point coupling to an input point $In_i$ of the input points $In_0$-$In_N$ of said each of the field-programmable crossbar selection circuits 2174 and 2175 and an output point coupling to the respective gate terminals of the P-type MOS transistor 447 and N-type MOS transistor 448 of the tristate inverter 2177 of said each of the switch cells 2176, wherein the inverter 487 is configured to invert a data input of the inverter 487 at the input point of the inverter 487 as a data output of the inverter 487 at the output point of the inverter 487.

Alternatively, for the second type of coarse-grained field programmable (CGFP) architecture 2170, the coarse-grained programmable logic cell or element 2060 of each of its programmable-interconnection-combined functional units 2171 as seen in FIG. 11A may be replaced with the coarse-grained reconfigurable (CGR) unit 2052 as illustrated in FIG. 4. Referring to FIGS. 4, 10 and 11A, each of its programmable-interconnection-combined functional units 2171 may have a similar scheme to the programmable-interconnection-combined functional unit 2071 arranged with the coarse-grained reconfigurable (CGR) unit 2052 for the first type of coarse-grained field programmable (CGFP) architecture 2070 as illustrated in FIGS. 4 and 8A, but the difference therebetween is that the first set of input points 2044 of the functional unit 2053 of the coarse-grained reconfigurable (CGR) unit 2052 of each of its programmable-interconnection-combined functional units 2171 may be divided into six groups, four groups of which each may couple to the group of output points of one of the selection circuits 2073 of one of another four of its programmable-interconnection-combined functional units 2171 adjacent to and at the respective front, back, left and right sides of said each of its programmable-interconnection-combined functional units 2171 through one group of four respective groups of its programmable interconnects 361 therebetween to receive data associated with an output data set at the group of output points of said one of the four selection circuits 2073, wherein said one of the selection circuits 2073 is adjacent to and at one of the front, back, left and right sides of said each of its programmable-interconnection-combined functional units 2171. Another group of the six groups of the first set of input points 2044 of the functional unit 2053 of the coarse-grained reconfigurable (CGR) unit 2052 of said each of its programmable-interconnection-combined functional units 2171 may couple to one group of its multiple groups of programmable bypass paths 2172 having the number of g, and the other group of the six groups of the first set of input points 2044 of the functional unit 2053 of the coarse-grained reconfigurable (CGR) unit 2052 of said each of its programmable-interconnection-combined functional units 2171 may couple to one group of its multiple groups of programmable bypass paths 2173 having the number of g, wherein the number of g is a positive integer. Each of the four selection circuits 2073 of each of its programmable-interconnection-combined functional units 2171 at one side of the front, back, left and right sides of the coarse-grained reconfigurable (CGR) unit 2052 of said each of its programmable-interconnection-combined functional units 2171 may have (1) three groups of input points, each group of which may have the number of w and couple to the group of output points of one of the four selection circuits 2073 of one of another three of its programmable-interconnection-combined functional units 2171 adjacent to said each of its programmable-interconnection-combined functional units 2171 and at the other respective three sides of the front, back, left and right sides of the coarse-grained reconfigurable (CGR) unit 2052 of said each of its programmable-interconnection-combined functional units 2171 through three respective groups of its programmable interconnects 361 therebetween to receive data associated with an output data set of said one of the four selection circuits 2073 at the group of output points of said one of the four selection circuits 2073, and (2) another group of input points, having the number of j, coupling to the registering block 2045 of the coarse-grained reconfigurable (CGR) unit 2052 of said each of its programmable-interconnection-combined functional units 2171, the input points $In_0$-$In_N$ of the field-programmable crossbar selection circuit 2174 of said each of its programmable-interconnection-combined functional units 2171 and the input points $In_0$-$In_N$ of the field-programmable crossbar selection circuit 2175 of said each of its programmable-interconnection-combined functional units 2171, wherein the another group of input points of each of the four selection circuits 2073 of said each of its programmable-interconnection-combined functional units 2171, the input points $In_0$-$In_N$ of the field-programmable crossbar selection circuit 2174 of said each of its programmable-interconnection-combined functional units 2171 and the input points $In_0$-$In_N$ of the field-programmable crossbar selection circuit 2175 of said each of its programmable-interconnection-combined functional units 2171 may receive data associated with data outputs of the coarse-grained reconfigurable (CGR) unit 2052 of said each of its programmable-interconnection-combined functional units 2171, which are stored in the registering block 2045 of the coarse-grained reconfigurable (CGR) unit 2052 of said each of its programmable-interconnection-combined functional units 2171.

Figure 12A:
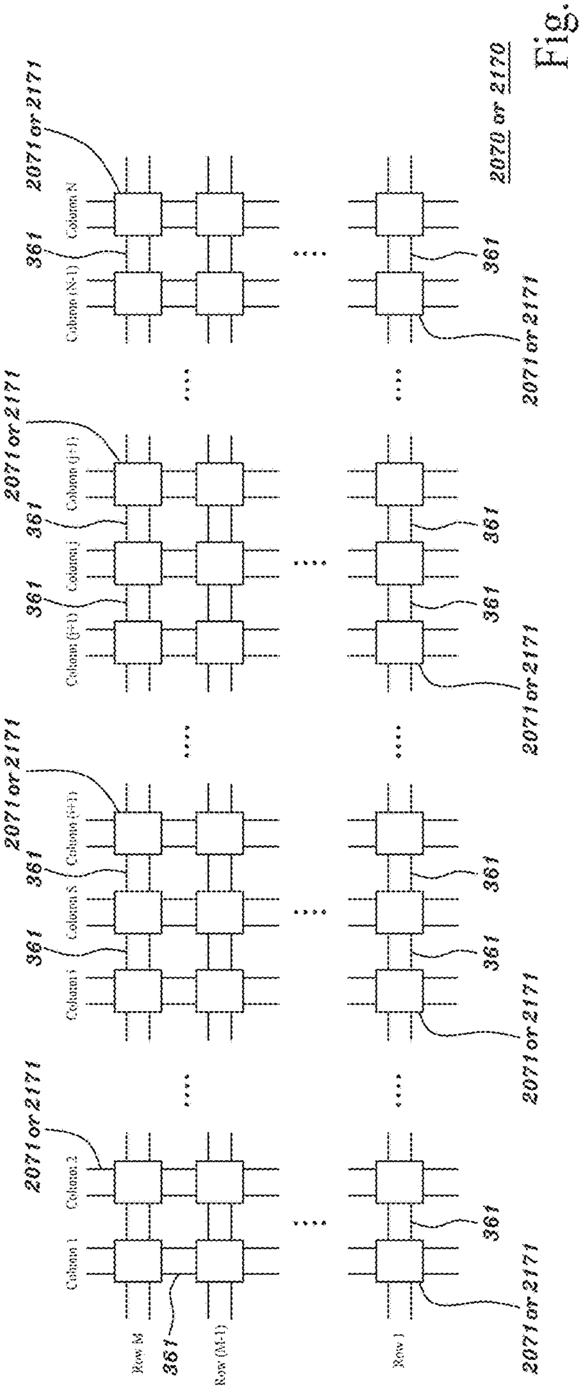
FIGS. 12A and 12B are schematic views showing a method for repairing either first or second type of programmable-interconnection-combined logic block in accordance with an embodiment of the present application.
Figure 12B:
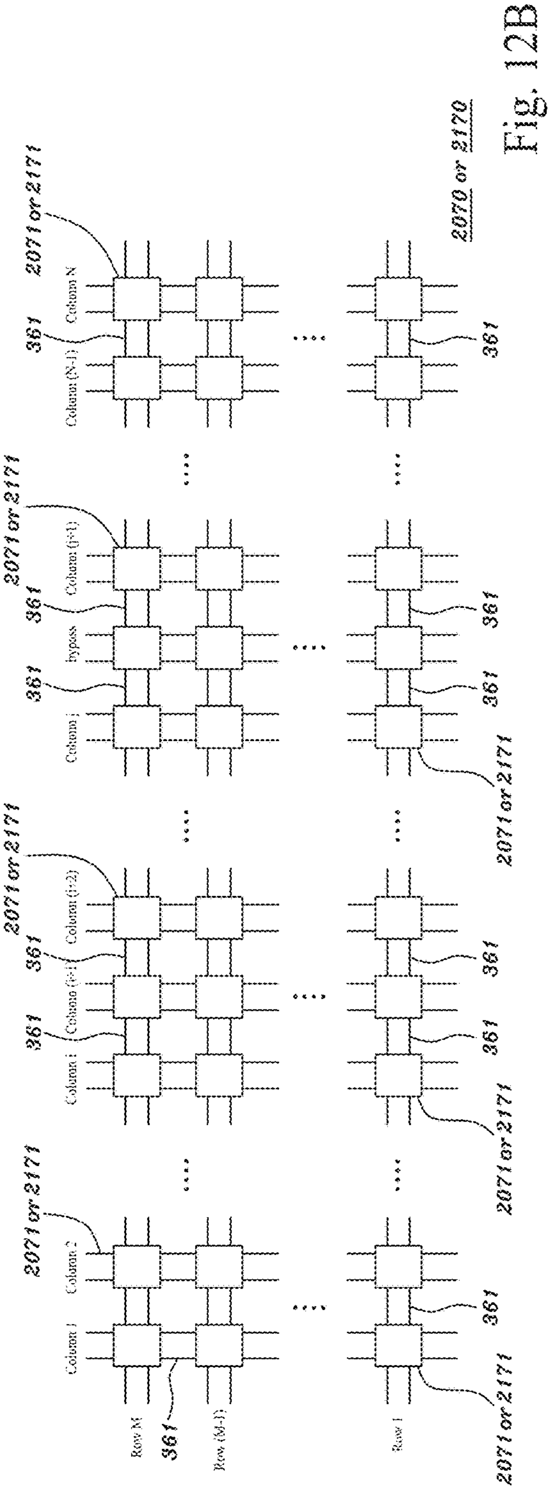
Figure 12C:
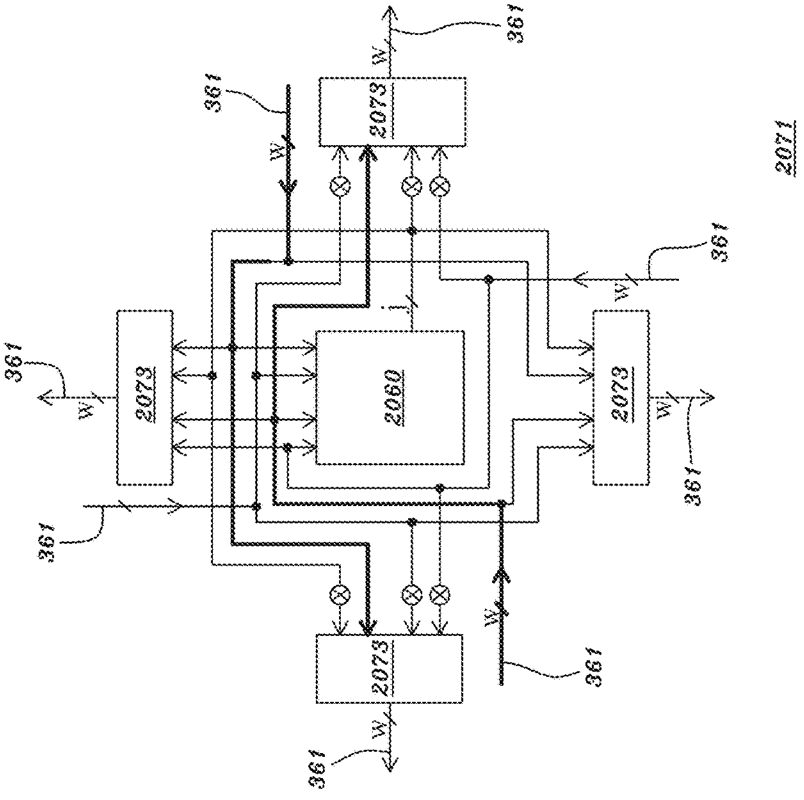
FIG. 12C is a schematic view showing selected paths in a programmable-interconnection-combined functional unit to be bypassed for a first type of programmable-interconnection-combined logic block before and after being repaired in accordance with an embodiment of the present application.
Figure 12D:
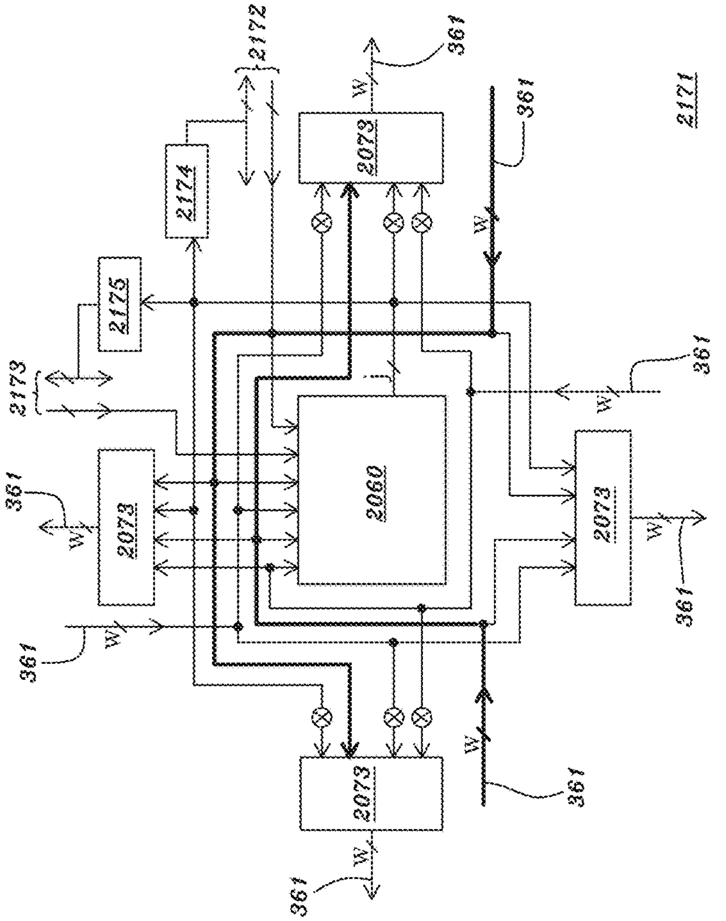
FIG. 12D is a schematic view showing selected paths in a programmable-interconnection-combined functional unit to be bypassed for a second type of programmable-interconnection-combined logic block before and after being repaired in accordance with an embodiment of the present application.

Method for Repairing First and Second Types of Programmable-Interconnection-Combined Logic Blocks FIGS. 12A and 12B are schematic views showing a method for repairing either first or second type of programmable-interconnection-combined logic block in accordance with an embodiment of the present application. FIG. 12C is a schematic view showing selected paths in a programmable-interconnection-combined functional unit to be bypassed for a first type of programmable-interconnection-combined logic block before and after being repaired in accordance with an embodiment of the present application. FIG. 12D is a schematic view showing selected paths in a programmable-interconnection-combined functional unit to be bypassed for a second type of programmable-interconnection-combined logic block before and after being repaired in accordance with an embodiment of the present application. Referring to FIGS. 12A and 12B, for each type of the first and second types of coarse-grained field programmable (CGFP) architectures 2070 and 2170 as illustrated in FIGS. 7 and 10, its programmable-interconnection-combined functional units 2071 or 2171 may be arranged in an array with M rows by (N+1) columns. Its programmable-interconnection-combined functional units 2071 or 2171 may have a first group for spare in one column of the (N+1) columns of the array, defined as column S hereinafter, and between two groups of its programmable-interconnection-combined functional units 2071 or 2171 in respective two columns i and (i+1) of the array, wherein its first group of programmable-interconnection-combined functional units 2071 or 2171 for spare in the column S are configured to be backed up for its second group of programmable-interconnection-combined functional units 2071 or 2171 in another column of the (N+1) columns of the array, defined as column j hereinafter. In this case, the coarse-grained programmable logic cell(s) or element(s) 2060 or coarse-grained reconfigurable (CGR) unit(s) 2052 of one, some or all of its second group of programmable-interconnection-combined functional units 2071 or 2171 in column j may be detected or determined in a broken state.

Referring to FIG. 12A, before repairing said each type of the first and second types of coarse-grained field programmable (CGFP) architectures 2070 and 2170, a first one of the four selection circuits 2073 of each of its programmable-interconnection-combined functional units 2071 or 2171 in the column S at the left side of the coarse-grained programmable logic cell or element 2060 or coarse-grained reconfigurable (CGR) unit 2052 of said each of its programmable-interconnection-combined functional units 2071 or 2171 may be configured or programmed to select, as seen in FIGS. 12C and 12D, the data inputs at one group of the three groups of input points of the first one of the four selection circuits 2073 coupling to the group of output points of a second one of the four selection circuits 2073 of another of its programmable-interconnection-combined functional units 2071 or 2171 in column (i+1) at the left side of the coarse-grained programmable logic cell or element 2060 or coarse-grained reconfigurable (CGR) unit 2052 of said another of its programmable-interconnection-combined functional units 2071 or 2171 in column (i+1) through a group of its programmable interconnects 361 as the output data set of the first one of the four selection circuits 2073 at the group of output points of the first one of the four selection circuits 2073; a third one of the four selection circuits 2073 of said each of its programmable-interconnection-combined functional units 2071 or 2171 in the column S at the right side of the coarse-grained programmable logic cell or element 2060 or coarse-grained reconfigurable (CGR) unit 2052 of said each of its programmable-interconnection-combined functional units 2071 or 2171 may be configured or programmed to select, as seen in FIGS. 12C and 12D, the data inputs at one group of the three groups of input points of the third one of the four selection circuits 2073 coupling to the group of output points of a fourth one of the four selection circuits 2073 of another of its programmable-interconnection-combined functional units 2071 or 2171 in column i at the right side of the coarse-grained programmable logic cell or element 2060 or coarse-grained reconfigurable (CGR) unit 2052 of said another of its programmable-interconnection-combined functional units 2071 or 2171 in column i through another group of its programmable interconnects 361 as the output data set of the third one of the four selection circuits 2073 at the group of output points of the third one of the four selection circuits 2073. Thereby, each of its programmable-interconnection-combined functional units 2071 or 2171 in the column S may be bypassed.

Referring to FIG. 12A, after repairing said each type of the first and second types of coarse-grained field programmable (CGFP) architectures 2070 and 2170, a fifth one of the four selection circuits 2073 of each of its programmable-interconnection-combined functional units 2071 or 2171 in the column j at the left side of the coarse-grained programmable logic cell or element 2060 or coarse-grained reconfigurable (CGR) unit 2052 of said each of its programmable-interconnection-combined functional units 2071 or 2171 may be configured or programmed to select, as seen in FIGS. 12C and 12D, the data inputs at one group of the three groups of input points of the fifth one of the four selection circuits 2073 coupling to the group of output points of a sixth one of the four selection circuits 2073 of another of its programmable-interconnection-combined functional units 2071 or 2171 in column (j+1) at the left side of the coarse-grained programmable logic cell or element 2060 or coarse-grained reconfigurable (CGR) unit 2052 of said another of its programmable-interconnection-combined functional units 2071 or 2171 in column (j+1) through a group of its programmable interconnects 361 as the output data set of the fifth one of the four selection circuits 2073 at the group of output points of the fifth one of the four selection circuits 2073; a seventh one of the four selection circuits 2073 of said each of its programmable-interconnection-combined functional units 2071 or 2171 in the column j at the right side of the coarse-grained programmable logic cell or element 2060 or coarse-grained reconfigurable (CGR) unit 2052 of said each of its programmable-interconnection-combined functional units 2071 or 2171 may be configured or programmed to select, as seen in FIGS. 53C and 53D, the data inputs at one group of the three groups of input points of the seventh one of the four selection circuits 2073 coupling to the group of output points of an eighth one of the four selection circuits 2073 of another of its programmable-interconnection-combined functional units 2071 or 2171 in column (j−1) at the right side of the coarse-grained programmable logic cell or element 2060 or coarse-grained reconfigurable (CGR) unit 2052 of said another of its programmable-interconnection-combined functional units 2071 or 2171 in column (j−1) through another group of its programmable interconnects 361 as the output data set of the seventh one of the four selection circuits 2073 at the group of output points of the seventh one of the four selection circuits 2073. Thereby, each of its programmable-interconnection-combined functional units 2071 or 2171 in the column j may be bypassed as seen in FIG. 12B. Next, the columns for its programmable-interconnection-combined functional units 2071 or 2171 may be renumbered column by column from the leftmost one of the columns as seen in FIG. 12B. In particular, its programmable-interconnection-combined functional units 2071 or 2171 in the column S defined before repairing is redefined as ones in column (i+1) after repairing; its programmable-interconnection-combined functional units 2071 or 2171 in the column (i+1) defined before repairing is redefined as ones in column (i+2) after repairing; its programmable-interconnection-combined functional units 2071 or 2171 in the column (j−1) defined before repairing is redefined as ones in column j after repairing.

Third Type of Coarse-Grained Field Programmable (CGFP) Architecture

Figure 13:
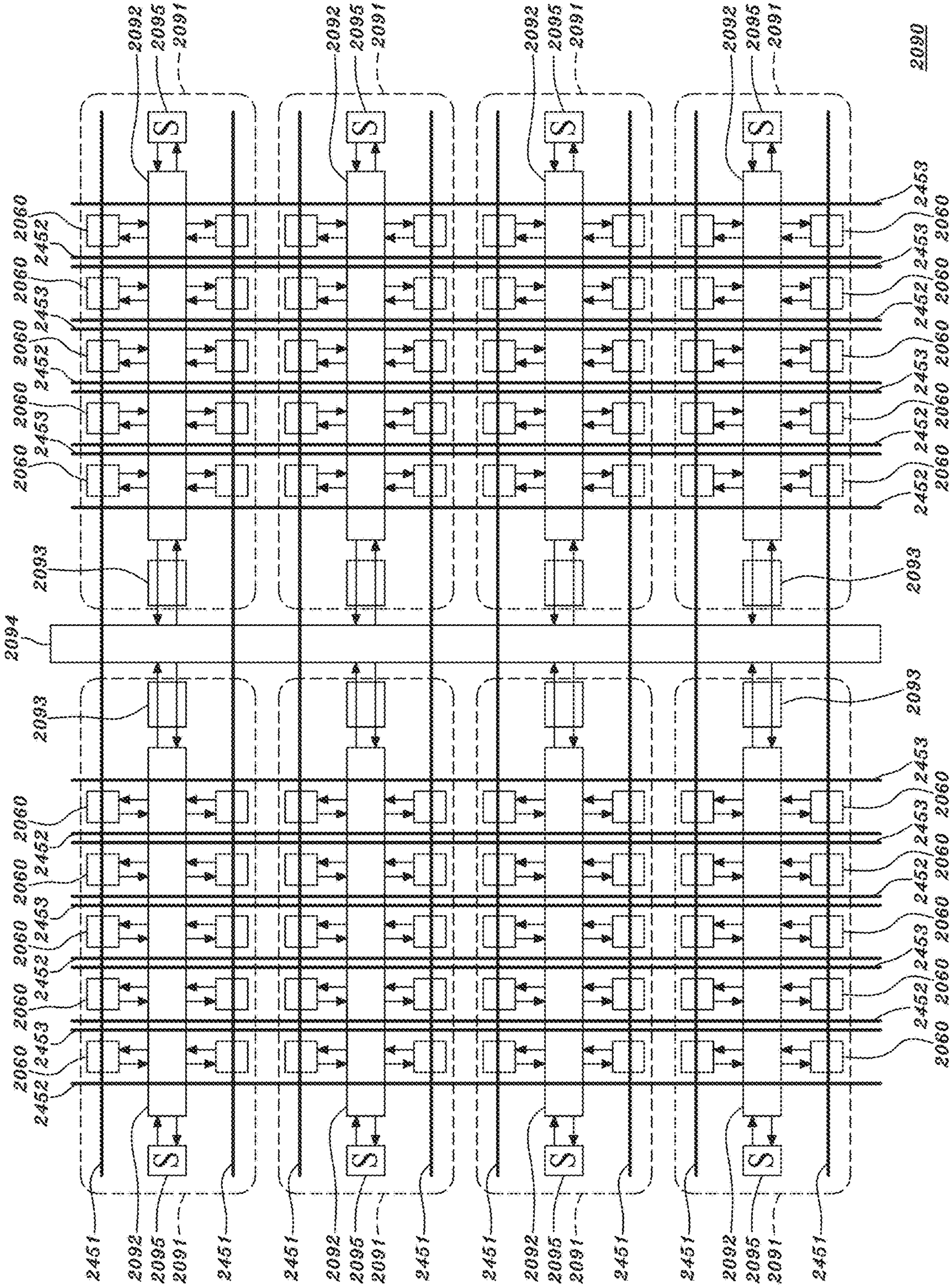
FIG. 13 is a block diagram showing a third type of coarse-grained field programmable (CGFP) architecture in accordance with an embodiment of the present application.

FIG. 13 is a block diagram showing a third type of coarse-grained field programmable (CGFP) architecture in accordance with an embodiment of the present application. Referring to FIG. 13, a third type of coarse-grained field programmable (CGFP) architecture 2090, i.e., a third type of coarse-grained functional section (CGFS), may include (1) multiple look-up table (LUT) banks 2091 arranged in a second array, wherein each of its look-up table (LUT) banks 2091 may include multiple coarse-grained programmable logic cells or elements 2060, each as illustrated in FIG. 5A, arranged in a third array, a local programmable interconnection network 2092 coupling to each of the coarse-grained programmable logic cells or elements 2060 of said each of its look-up table (LUT) banks 2091, and a field-programmable selection circuit 2093, i.e., switch box, having a first group of input points and first group of output points each coupling to the local programmable interconnection network 2092 of said each of its look-up table (LUT) banks 2091, and (2) a global programmable interconnection network 2094 coupling to a second group of input points and second group of output points of each of its field-programmable selection circuits 2093, wherein the field-programmable selection circuit 2093 of each of its look-up table (LUT) banks 2091 may be configured to select, in accordance with a first input data set thereof associated with programming codes stored in its interconnection-programming memory cells, e.g., the memory cells 398 as illustrated in any of FIGS. 1A-1G, one or more first data inputs from a second input data set thereof at the first group of input points thereof as a first output data set thereof at the second group of output points thereof, and select, in accordance with a third input data set thereof associated with programming codes stored in its interconnection-programming memory cells, e.g., the memory cells 398 as illustrated in any of FIGS. 1A-1G, one or more second data inputs from a fourth input data set thereof at the second group of input points thereof as a second output data set thereof at the first group of output points thereof. For the third type of coarse-grained field programmable (CGFP) architecture 2090, one of the coarse-grained programmable logic cells or elements 2060 of one of its look-up table (LUT) banks 2091 may be selected to receive data from the local programmable interconnection network 2092 of said one of its look-up table (LUT) banks 2091. One of the data outputs of a first one of the coarse-grained programmable logic cells or elements 2060 of a first one of its look-up table (LUT) banks 2091, stored in the block 2063 for registers or flip-flop circuits of the first one of the coarse-grained programmable logic cells or elements 2060, may be selected to be passed to the local programmable interconnection network 2092 of the first one of its look-up table (LUT) banks 2091. Thus, one of the data outputs of the first one of the coarse-grained programmable logic cells or elements 2060 of the first one of its look-up table (LUT) banks 2091, stored in the block 2063 for registers or flip-flop circuits of the first one of the coarse-grained programmable logic cells or elements 2060, may be selected to be passed through the local programmable interconnection network 2092 of the first one of its look-up table (LUT) banks 2091 as the input data set of the selection circuit 2064 of a second one of the coarse-grained programmable logic cells or elements 2060 of the first one of its look-up table (LUT) banks 2091. Further, said one of the data outputs of the first one of the coarse-grained programmable logic cells or elements 2060 of the first one of its look-up table (LUT) banks 2091 may be selected to be passed through, in sequence, the local programmable interconnection network 2092 of the first one of its look-up table (LUT) banks 2091, one of the first group of input points of the field-programmable selection circuit 2093 of the first one of its look-up table (LUT) banks 2091, one of the second group of output points of the field-programmable selection circuit 2093 of the first one of its look-up table (LUT) banks 2091, its global programmable interconnection network 2094, one of the second group of input points of the field-programmable selection circuit 2093 of a second one of its look-up table (LUT) banks 2091, one of the first group of output points of the field-programmable selection circuit 2093 of the second one of its look-up table (LUT) banks 2091 and the local programmable interconnection network 2092 of the second one of its look-up table (LUT) banks 2091 as the input data set of the selection circuit 2064 of a third one of the coarse-grained programmable logic cells or elements 2060 of the second one of its look-up table (LUT) banks 2091.

Figure 14:
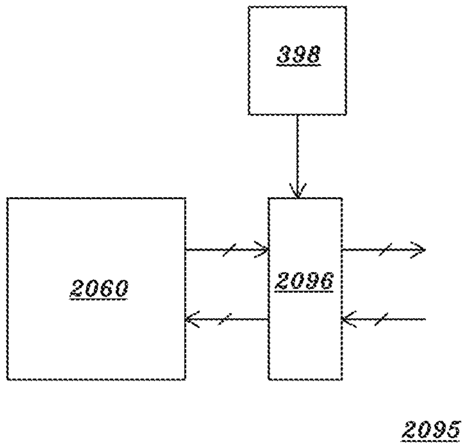
FIG. 14 is a block diagram showing a spare unit of a look-up table (LUT) bank for a third type of programmable-interconnection-combined logic block in accordance with an embodiment of the present application.

Referring to FIG. 13, for the third type of coarse-grained field programmable (CGFP) architecture 2090, each of its look-up table (LUT) banks 2091 may further include a spare unit 2095 backed up for any of the coarse-grained programmable logic cells or elements 2060 of said each of its look-up table (LUT) banks 2091 when being detected or determined in a broken state. FIG. 14 is a block diagram showing a spare unit of a look-up table (LUT) bank for a third type of programmable-interconnection-combined logic block in accordance with an embodiment of the present application. Referring to FIGS. 13 and 14, the spare unit 2095 of each of its look-up table (LUT) banks 2091 may include (1) a coarse-grained programmable logic cell or element 2060 as illustrated in FIG. 5A, and (2) a decoder

2096 having a first group of input points for receiving the data outputs of the coarse-grained programmable logic cell or element 2060 of the spare unit 2095 of said each of its look-up table (LUT) banks 2091, stored in the block 2063 for registers or flip-flop circuits of the coarse-grained programmable logic cell or element 2060 of the spare unit 2095 of said each of its look-up table (LUT) banks 2091, a first group of output points for passing data as the input data set 2065 of the local row decoder 2061 of the coarse-grained programmable logic cell or element 2060 of the spare unit 2095 of said each of its look-up table (LUT) banks 2091, a second group of input points coupling to the local programmable interconnection network 2092 of said each of its look-up table (LUT) banks 2091 and a second group of output points coupling to the local programmable interconnection network 2092 of said each of its look-up table (LUT) banks 2091, wherein the decoder 2096 of the spare unit 2095 of said each of its look-up table (LUT) banks 2091 may be configured to select, in accordance with a first input data set thereof associated with programming codes stored in its interconnection-programming memory cells, e.g., the memory cells 398 as illustrated in any of FIGS. 1A-1G, one or more output points thereof from the second group of output points thereof to pass a second input data set thereof at the first group of input points thereof, and select, in accordance with a third input data set thereof associated with programming codes stored in its interconnection-programming memory cells, e.g., the memory cells 398 as illustrated in any of FIGS. 1A-1G, one or more data inputs from a fourth input data set thereof at the second group of input points thereof as an output data set thereof at the first group of output points thereof.

Referring to FIG. 13, for the third type of coarse-grained field programmable (CGFP) architecture 2090, when a specific one of the coarse-grained programmable logic cells or elements 2060 of a specific one of its look-up table (LUT) banks 2091 is detected or determined in a broken state, the decoder 2096 of the spare unit 2095 of the specific one of its look-up table (LUT) banks 2091 may be configured to (1) select, in accordance with the first input data set thereof, one or more output points thereof from the second group of output points thereof to pass the second input data set thereof at the first group of input points thereof to one or more first programmable interconnects of the local programmable interconnection network 2092 of the specific one of its look-up table (LUT) banks 2091, wherein the one or more first programmable interconnects are selected to pass data from the block 2063 for registers or flip-flop circuits of the specific one of the coarse-grained programmable logic cells or elements 2060 if not being detected or determined in a broken state, and (2) select, in accordance with the third input data set thereof, one or more second data inputs from the fourth input data set thereof at the second group of input points thereof as an output data set thereof at the first group of output points thereof, wherein the second group of input points thereof couple to one or more second programmable interconnects of the local programmable interconnection network 2092 of the specific one of its look-up table (LUT) banks 2091, wherein the one or more second programmable interconnects are selected to pass data to the set of input points of the selection circuit 2064 of the specific one of the coarse-grained programmable logic cells or elements 2060 if not being detected or determined in a broken state.

For the third type of coarse-grained field programmable (CGFP) architecture 2090, the memory sections 2050 of the coarse-grained programmable logic cells or elements 2060 of all of its look-up table (LUT) banks 2091 may be used for a memory bank that may have the same specification as the memory bank 2460 illustrated in FIG. 6. For an element indicated by the same reference number shown in FIGS. 5A, 6 and 13, the specification of the element as seen in FIG. 13 may be referred to that of the element as illustrated in FIGS. 5A and 6. Referring to FIG. 13, the memory bank may include the global word lines 2451 each composed by coupling a portion of the word lines 451 of the coarse-grained programmable logic cells or elements 2060 in one row of the first array in each of the memory sections 2050 in one row of the third array in each of its look-up table (LUT) banks 2091 in one row of the second array, wherein each of its global word lines 2451 may couple to the two gate terminals of the two switches or transfer transistors 449 of each of the third type of static random-access memory (SRAM) cells 398 in one row of the first array in each of the memory sections 2050 in one row of the third array in each of its look-up table (LUT) banks 2091 in one row of the second array, (2) multiple global bit lines 2452 each composed by coupling a portion of the bit lines 452 of the coarse-grained programmable logic cells or elements 2060 in one column of the first array in each of the memory sections 2050 in one column of the third array in each of its look-up table (LUT) banks 2091 in one column of the second array, wherein each of its global bit lines 2452 may couple to the channel of one of the two switches or transfer transistors 449 of each of the third type of static random-access memory (SRAM) cells 398 in one column of the first array in each of the memory sections 2050 in one column of the third array in each of its look-up table (LUT) banks 2091 in one column of the second array, and (3) multiple global bit-bar lines 2453 each composed by coupling a portion of the bit-bar lines 453 of the coarse-grained programmable logic cells or elements 2060 in one column of the first array in each of the memory sections 2050 in one column of the third array in each of its look-up table (LUT) banks 2091 in one column of the second array, wherein each of its global bit-bar lines 2453 may couple to the channel of the other of two switches or transfer transistors 449 of each of the third type of static random-access memory (SRAM) cells 398 in one column of the first array in each of the memory sections 2050 in one column of the third array in each of its look-up table (LUT) banks 2091 in one column of the second array. For the memory bank as seen in FIG. 13, each of its global word lines 2451 may couple its global row decoder 2461 as illustrated in FIG. 6, and each pair of its global bit line 2452 and global bit-bar line 2453 may couple to its sense-amplifier block 2462 as illustrated in FIG. 6. Thereby, its global row decoder 2461 is configured to select, in accordance with an input data set thereof, one by one from its global word lines 2451 to allow data to be passed from each pair of its global bit line 2452 and global bit-bar line 2453 to the memory cell 446 of one of its third type of static random-access memory (SRAM) cells 398 in one row of the first array in one of the memory sections 2050 in one row of the third array in one of its look-up table (LUT) banks 2091 in one row of the second array through the two channels of the respective two switches or transfer transistors 449 of said one of its third type of static random-access memory (SRAM) cells 398 to be written or stored in the memory cell 446 of said one of its third type of static random-access memory (SRAM) cells 398. Further, for the memory bank as seen in FIG. 13, its global row decoder 2461 is configured to select, in accordance with the input data set thereof, one by one from its global word lines 2451 to allow data to be passed or read from the memory cell 446 of each of its third type of static random-access memory (SRAM) cells 398 in one row of the first array in each of the memory sections 2050 in one row of the third array in each of its look-up table (LUT) banks 2091 in one row of the second array through the two channels of the respective two switches or transfer transistors 449 of said each of its third type of static random-access memory (SRAM) cells 398 to a pair of its global bit line 2452 and global bit-bar line 2453.

Alternatively, for the third type of coarse-grained field programmable (CGFP) architecture 2090, each of the coarse-grained programmable logic cells or elements 2060 of each of its look-up table (LUT) banks 2091 as seen in FIG. 13 may be replaced with the coarse-grained reconfigurable (CGR) unit 2052 as illustrated in FIG. 4. Referring to FIGS. 4 and 13, the local programmable interconnection network 2092 of each of its look-up table (LUT) banks 2091 may couple to each of the coarse-grained reconfigurable (CGR) unit 2052 of said each of its look-up table (LUT) banks 2091. One of the coarse-grained reconfigurable (CGR) unit 2052 of one of its look-up table (LUT) banks 2091 may be selected to receive data from the local programmable interconnection network 2092 of said one of its look-up table (LUT) banks 2091. One of the data outputs of a first one of the coarse-grained reconfigurable (CGR) units 2052 of a first one of its look-up table (LUT) banks 2091, stored in the registering block 2045 of the first one of the coarse-grained reconfigurable (CGR) units 2052, may be selected to be passed to the local programmable interconnection network 2092 of the first one of its look-up table (LUT) banks 2091. Thus, one of the data outputs of the first one of the coarse-grained reconfigurable (CGR) units 2052 of the first one of its look-up table (LUT) banks 2091, stored in the registering block 2045 of the first one of the coarse-grained reconfigurable (CGR) units 2052, may be selected to be passed through the local programmable interconnection network 2092 of the first one of its look-up table (LUT) banks 2091 as the data inputs at the first set of input points 2044 of the functional unit 2053 of a second one of the coarse-grained reconfigurable (CGR) units 2052 of the first one of its look-up table (LUT) banks 2091. Further, said one of the data outputs of the first one of the coarse-grained reconfigurable (CGR) units 2052 of the first one of its look-up table (LUT) banks 2091 may be selected to be passed through, in sequence, the local programmable interconnection network 2092 of the first one of its look-up table (LUT) banks 2091, one of the first group of input points of the field-programmable selection circuit 2093 of the first one of its look-up table (LUT) banks 2091, one of the second group of output points of the field-programmable selection circuit 2093 of the first one of its look-up table (LUT) banks 2091, its global programmable interconnection network 2094, one of the second group of input points of the field-programmable selection circuit 2093 of a second one of its look-up table (LUT) banks 2091, one of the first group of output points of the field-programmable selection circuit 2093 of the second one of its look-up table (LUT) banks 2091 and the local programmable interconnection network 2092 of the second one of its look-up table (LUT) banks 2091 as the data inputs at the first set of input points 2044 of the functional unit 2053 of a third one of the coarse-grained reconfigurable (CGR) units 2052 of the second one of its look-up table (LUT) banks 2091. Further, the decoder 2096 of the spare unit 2095 of each of its look-up table (LUT) banks 2091 may have (1) the first group of input points for receiving the data outputs of the coarse-grained reconfigurable (CGR) units 2052 of the spare unit 2095 of said each of its look-up table (LUT) banks 2091, stored in the registering block 2045 of the coarse-grained reconfigurable (CGR) unit 2052 of the spare unit 2095 of said each of its look-up table (LUT) banks 2091 and (2) the first group of output points for passing data as the data inputs at the first set of input points 2044 of the functional unit 2053 of the coarse-grained reconfigurable (CGR) unit 2052 of the spare unit 2095 of said each of its look-up table (LUT) banks 2091. When a specific one of the coarse-grained reconfigurable (CGR) units 2052 of a specific one of its look-up table (LUT) banks 2091 is detected or determined in a broken state, the decoder 2096 of the spare unit 2095 of the specific one of its look-up table (LUT) banks 2091 may be configured to (1) select, in accordance with the first input data set thereof, one or more output points thereof from the second group of output points thereof to pass the second input data set thereof at the first group of input points thereof to one or more first programmable interconnects of the local programmable interconnection network 2092 of the specific one of its look-up table (LUT) banks 2091, wherein the one or more first programmable interconnects are selected to pass data from the registering block 2045 of the specific one of the coarse-grained reconfigurable (CGR) units 2052 if not being detected or determined in a broken state, and (2) select, in accordance with the third input data set thereof, one or more second data inputs from the fourth input data set thereof at the second group of input points thereof as an output data set thereof at the first group of output points thereof, wherein the second group of input points thereof couple to one or more second programmable interconnects of the local programmable interconnection network 2092 of the specific one of its look-up table (LUT) banks 2091, wherein the one or more second programmable interconnects are selected to pass data to the first set of input points 2044 of the functional unit 2053 of the specific one of the coarse-grained reconfigurable (CGR) units 2052 if not being detected or determined in a broken state.

Fourth Type of Coarse-Grained Field Programmable (CGFP) Architecture

Figure 15:
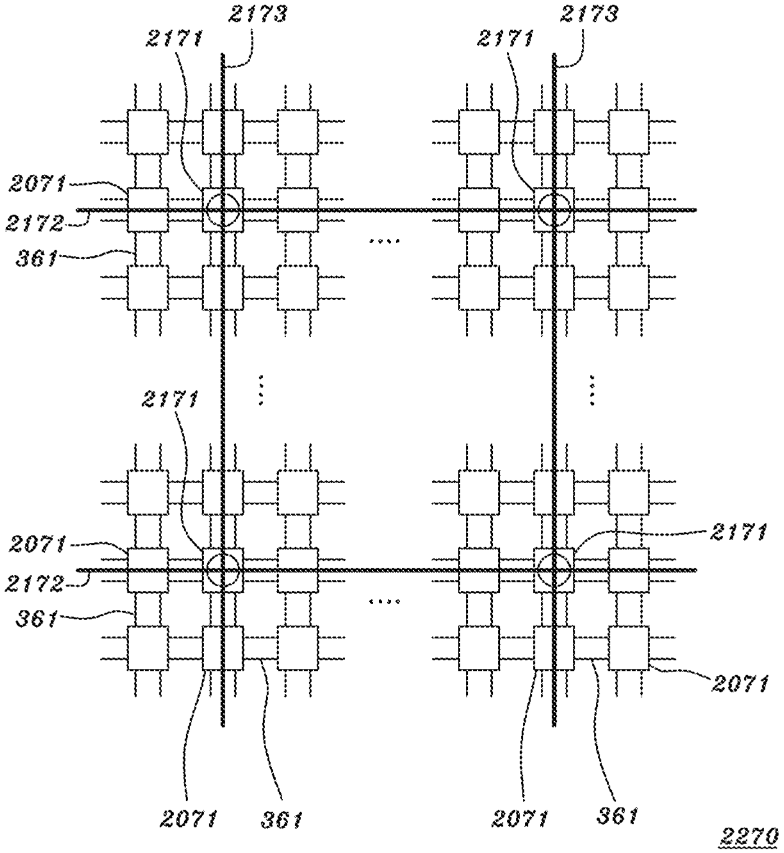
FIG. 15 is a block diagram showing a fourth type of coarse-grained field programmable (CGFP) architecture in accordance with an embodiment of the present application.

FIG. 15 is a block diagram showing a fourth type of coarse-grained field programmable (CGFP) architecture in accordance with an embodiment of the present application. Referring to FIG. 15, a fourth type of coarse-grained field programmable (CGFP) architecture 2270, i.e., a fourth type of coarse-grained functional section (CGFS), may include the programmable-interconnection-combined functional units 2071 and 2171, as illustrated in FIGS. 8A and 11A respectively, arranged in an array, wherein multiple of its programmable-interconnection-combined functional units 2071, having the number of s, distributed in a line in an x direction may be arranged between neighboring two of its programmable-interconnection-combined functional units 2171 distributed in a line in the x direction, multiple of its programmable-interconnection-combined functional units 2071, having the number of t, distributed in a line in a y direction may be arranged between neighboring two of its programmable-interconnection-combined functional units 2171 distributed in a line in the y direction, and neighboring two of its programmable-interconnection-combined functional units 2071 and 2171 may couple to each other through multiple programmable interconnects 361, wherein each of the numbers of s and t may be a positive integer equal to or greater than 1, 2, 3, 4, 5 or 8. In an aspect, the number of s may be equal to the number of t. For an element indicated by the same reference number shown in FIGS. 5, 8A, 11A, 11B, 11C and 15, the specification of the element as seen in FIG. 15 may be referred to that of the element as illustrated in FIG. 5, 8A, 11A, 11B and 11C. For the fourth type of coarse-grained field programmable (CGFP) architecture 2270, the coupling between neighboring two of its programmable-interconnection-combined functional units 2071 may be referred to that as illustrated in FIGS. 7, 8A and 8B for the first type of coarse-grained field programmable (CGFP) architecture 2070.

Referring to FIGS. 5, 8A, 11A, 11B, 11C and 15, for the fourth type of coarse-grained field programmable (CGFP) architecture 2270, the set of input points of the selection circuit 2064 of the coarse-grained programmable logic cell or element 2060 of each of its programmable-interconnection-combined functional units 2171 may be divided into six groups, four groups of which each may couple to the group of output points of one of the selection circuits 2073 of one of another four of its programmable-interconnection-combined functional units 2071 adjacent to and at the respective front, back, left and right sides of said each of its programmable-interconnection-combined functional units 2171 through one group of four respective groups of its programmable interconnects 361 therebetween to receive data associated with the output data set at the group of output points of said one of the selection circuits 2073, wherein said one of the selection circuits 2073 is adjacent to and at one of the front, back, left and right sides of said each of its programmable-interconnection-combined functional units 2171. Another group of the six groups of the set of input points of the selection circuit 2064 of the coarse-grained programmable logic cell or element 2060 of said each of its programmable-interconnection-combined functional units 2171 may couple to one group of its multiple groups of programmable bypass paths 2172, and the other group of the six groups of the set of input points of the selection circuit 2064 of the coarse-grained programmable logic cell or element 2060 of said each of its programmable-interconnection-combined functional units 2171 may couple to one group of its multiple groups of programmable bypass paths 2173.

Each of the four selection circuits 2073 of each of its programmable-interconnection-combined functional units 2171 at one of the front, back, left and right sides of the coarse-grained programmable logic cell or element 2060 of said each of its programmable-interconnection-combined functional units 2171 may have (1) three groups of input points, each group of which may couple to the group of output points of one of the four selection circuits 2073 of one of another three of its programmable-interconnection-combined functional units 2071 adjacent to said each of its programmable-interconnection-combined functional units 2171 and at the other respective three sides of the front, back, left and right sides of the coarse-grained programmable logic cell or element 2060 of said each of its programmable-interconnection-combined functional units 2171 through three respective groups of its programmable interconnects 361 therebetween to receive data associated with an output data set of said one of the four selection circuits 2073 at the group of output points of said one of the four selection circuits 2073, and (2) another group of input points coupling to the block 2063 for registers or flip-flop circuits of the coarse-grained programmable logic cell or element 2060 of said each of its programmable-interconnection-combined functional units 2171, the input points $In_0$-$In_N$ of the field-programmable crossbar selection circuit 2174 of said each of its programmable-interconnection-combined functional units 2171 and the input points $In_0$-$In_N$ of the field-programmable crossbar selection circuit 2175 of said each of its programmable-interconnection-combined functional units 2171, wherein the another group of input points of each of the four selection circuits 2073 of said each of its programmable-interconnection-combined functional units 2171, the input points $In_0$-$In_N$ of the field-programmable crossbar selection circuit 2174 of said each of its programmable-interconnection-combined functional units 2171 and the input points $In_0$-$In_N$ of the field-programmable crossbar selection circuit 2175 of said each of its programmable-interconnection-combined functional units 2171 may receive data associated with the data outputs of the coarse-grained programmable logic cell or element 2060 of said each of its programmable-interconnection-combined functional units 2171, which are stored in the block 2063 for registers or flip-flop circuits of the coarse-grained programmable logic cell or element 2060 of said each of its programmable-interconnection-combined functional units 2171.

Thereby, referring to FIGS. 5, 8A, 11A, 11B, 11C and 15, for the fourth type of coarse-grained field programmable (CGFP) architecture 2270, each of its programmable-interconnection-combined functional units 2171 may transmit data to a distant one of its programmable-interconnection-combined functional units 2171 through one of the field-programmable crossbar selection circuits 2174 and 2175 of said each of its programmable-interconnection-combined functional units 2171, one of its programmable bypass paths 2172 or 2173 and one of the field-programmable crossbar selection circuits 2174 and 2175 of said distant one of its programmable-interconnection-combined functional units 2171, wherein between said each of its programmable-interconnection-combined functional units 2171 and said distant one of its programmable-interconnection-combined functional units 2171 may be one or more of its programmable-interconnection-combined functional units 2071.

Alternatively, or the fourth type of coarse-grained field programmable (CGFP) architecture 2270, the coarse-grained programmable logic cell or element 2060 of each of its programmable-interconnection-combined functional units 2071 and 2171 as seen in FIG. 15 may be replaced with the coarse-grained reconfigurable (CGR) unit 2052 as illustrated in FIG. 4. Referring to FIGS. 4 and 15, the first set of input points 2044 of the functional unit 2053 of the coarse-grained reconfigurable (CGR) unit 2052 of each of its programmable-interconnection-combined functional units 2171 may be divided into six groups, four groups of which each may couple to the group of output points of one of the selection circuits 2073 of one of another four of its programmable-interconnection-combined functional units 2071 adjacent to and at the respective front, back, left and right sides of said each of its programmable-interconnection-combined functional units 2171 through one group of four respective groups of its programmable interconnects 361 therebetween to receive data associated with the output data set at the group of output points of said one of the selection circuits 2073, wherein said one of the selection circuits 2073 is adjacent to and at one of the front, back, left and right sides of said each of its programmable-interconnection-combined functional units 2171. Another group of the six groups of the first set of input points 2044 of the functional unit 2053 of the coarse-grained reconfigurable (CGR) unit 2052 of said each of its programmable-interconnection-combined functional units 2171 may couple to one group of its multiple groups of programmable bypass paths 2172, and the other group of the six groups of the first set of input points 2044 of the functional unit 2053 of the coarse-grained reconfigurable (CGR) unit 2052 of said each of its programmable-interconnection-combined functional units 2171 may couple to one group of its multiple groups of programmable bypass paths 2173. Each of the four selection circuits 2073 of each of its programmable-interconnection-combined functional units 2171 at one of the front, back, left and right sides of the coarse-grained reconfigurable (CGR) unit 2052 of said each of its programmable-interconnection-combined functional units 2171 may have (1) three groups of input points, each group of which may couple to the group of output points of one of the four selection circuits 2073 of one of another three of its programmable-interconnection-combined functional units 2071 adjacent to said each of its programmable-interconnection-combined functional units 2171 and at the other respective three sides of the front, back, left and right sides of the coarse-grained reconfigurable (CGR) unit 2052 of said each of its programmable-interconnection-combined functional units 2171 through three respective groups of its programmable interconnects 361 therebetween to receive data associated with an output data set of said one of the four selection circuits 2073 at the group of output points of said one of the four selection circuits 2073, and (2) another group of input points coupling to the registering block 2045 of the coarse-grained reconfigurable (CGR) unit 2052 of said each of its programmable-interconnection-combined functional units 2171, the input points $In_0$-$In_N$ of the field-programmable crossbar selection circuit 2174 of said each of its programmable-interconnection-combined functional units 2171 and the input points $In_0$-$In_N$ of the field-programmable crossbar selection circuit 2175 of said each of its programmable-interconnection-combined functional units 2171, wherein the another group of input points of each of the four selection circuits 2073 of said each of its programmable-interconnection-combined functional units 2171, the input points $In_0$-$In_N$ of the field-programmable crossbar selection circuit 2174 of said each of its programmable-interconnection-combined functional units 2171 and the input points $In_0$-$In_N$ of the field-programmable crossbar selection circuit 2175 of said each of its programmable-interconnection-combined functional units 2171 may receive data associated with the data outputs of the coarse-grained reconfigurable (CGR) unit 2052 of said each of its programmable-interconnection-combined functional units 2171, which are stored in the registering block 2045 of the coarse-grained reconfigurable (CGR) unit 2052 of said each of its programmable-interconnection-combined functional units 2171.

Specification for Large I/O Circuits

Figure 16A:
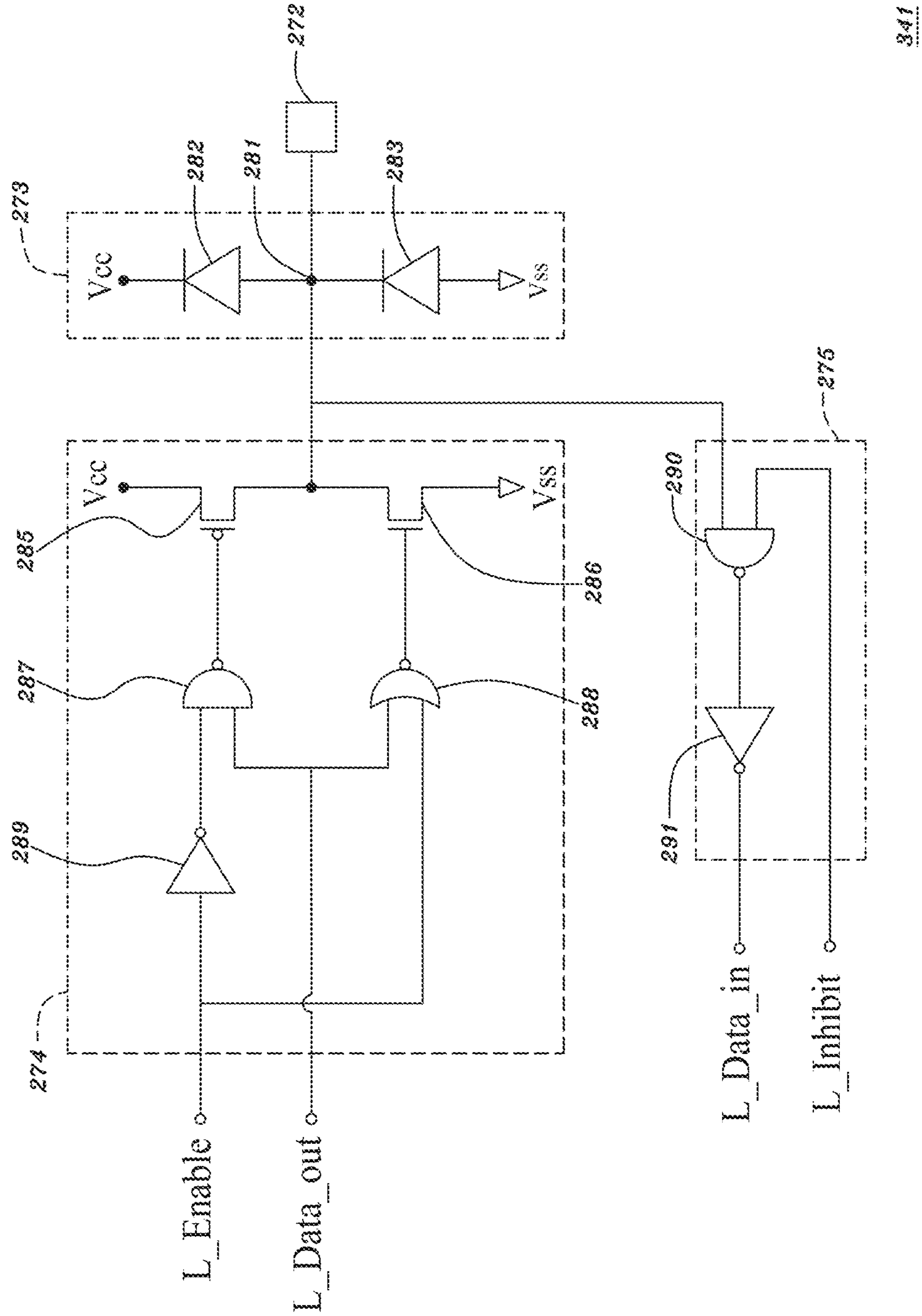
FIG. 16A is a circuit diagram of a large I/O circuit in accordance with an embodiment of the present application.

FIG. 16A is a circuit diagram of a large I/O circuit in accordance with an embodiment of the present application. Referring to FIG. 16A, a semiconductor integrated-circuit (IC) chip may include multiple I/O pads 272 each coupling to its large ESD protection circuit or device 273, its large driver 274 and its large receiver 275. The large driver 274, large receiver 275 and large ESD protection circuit or device 273 may compose a large I/O circuit 341. The large ESD protection circuit or device 273 may include a diode 282 having a cathode coupling to the voltage Vcc of power supply and an anode coupling to a node 281 and a diode 283 having a cathode coupling to the node 281 and an anode coupling to the voltage Vss of ground reference. The node 281 couples to one of the I/O pads 272.

Referring to FIG. 16A, the large driver 274 may have a first input point for a first data input L_Enable for enabling the large driver 274 and a second input point for a second data input L_Data_out, and may be configured to amplify or drive the second data input L_Data_out as its data output at its output point at the node 281 to be transmitted to circuits outside the semiconductor integrated-circuit (IC) chip through said one of the I/O pads 272. The large driver 274 may include a P-type MOS transistor 285 and N-type MOS transistor 286 both having respective drain terminals coupling to each other as its output point at the node 281 and respective source terminals coupling to the voltage Vcc of power supply and to the voltage Vss of ground reference. The large driver 274 may have a NAND gate 287 having a data output at an output point of the NAND gate 287 coupling to a gate terminal of the P-type MOS transistor 285 and a NOR gate 288 having a data output at an output point of the NOR gate 288 coupling to a gate terminal of the N-type MOS transistor 286. The NAND gate 287 may have a first data input at its first input point associated with a data output of its inverter 289 at an output point of an inverter 289 of the large driver 274 and a second data input at its second input point associated with the second data input L_Data_out of the large driver 274 to perform a NAND operation on its first and second data inputs as its data output at its output point coupling to the gate terminal of its P-type MOS transistor 285. The NOR gate 288 may have a first data input at its first input point associated with the second data input L_Data_out of the large driver 274 and a second data input at its second input point associated with the first data input L_Enable of the large driver 274 to perform a NOR operation on its first and second data inputs as its data output at its output point coupling to the gate terminal of the N-type MOS transistor 286. The inverter 289 may be configured to invert its data input at its input point associated with the first data input L_Enable of the large driver 274 as its data output at its output point coupling to the first input point of the NAND gate 287.

Referring to FIG. 16A, when the large driver 274 has the first data input L_Enable at a logic level of "1", the data output of the NAND gate 287 is always at a logic level of "1" to turn off the P-type MOS transistor 285 and the data output of the NOR gate 288 is always at a logic level of "0" to turn off the N-type MOS transistor 286. Thereby, the large driver 274 may be disabled by its first data input L_Enable and the large driver 274 may not pass the second data input L_Data_out from its second input point to its output point at the node 281.

Referring to FIG. 16A, the large driver 274 may be enabled when the large driver 274 has the first data input L_Enable at a logic level of "0". Meanwhile, if the large driver 274 has the second data input L_Data_out at a logic level of "0", the data outputs of the NAND and NOR gates 287 and 288 are at a logic level of "1" to turn off the P-type MOS transistor 285 and on the N-type MOS transistor 286, and thereby the data output of the large driver 274 at the node 281 is at a logic level of "0" to be passed to said one of the I/O pads 272. If the large driver 274 has the second data input L_Data_out is at a logic level of "1", the data outputs of the NAND and NOR gates 287 and 288 are at a logic level of "0" to turn on the P-type MOS transistor 285 and off the N-type MOS transistor 286, and thereby the data output of the large driver 274 at the node 281 is at a logic level of "1" to be passed to said one of the I/O pads 272. Accordingly, the large driver 274 may be enabled by its first data input L_Enable to amplify or drive its second data input L_Data_out at its second input point as its data output at its output point at the node 281 to be transmitted to circuits outside the semiconductor integrated-circuit (IC) chip through said one of the I/O pads 272.

Referring to FIG. 16A, the large receiver 275 may have a first data input L_Inhibit at its first input point and a second data input at its second input point coupling to said one of the I/O pads 272 to be amplified or driven by the large receiver 275 as its data output L_Data_in. The large receiver 275 may be inhibited by its first data input L_Inhibit from generating its data output L_Data_in associated with its second data input. The large receiver 275 may include a NAND gate 290 and an inverter 291 having a data input at an input point of the inverter 291 associated with a data output of the NAND gate 290. The NAND gate 290 has a first input point for its first data input associated with the second data input of the large receiver 275 and a second input point for its second data input associated with the first data input L_Inhibit of the large receiver 275 to perform a NAND operation on its first and second data inputs as its data output at its output point coupling to the input point of its inverter 291. The inverter 291 may be configured to invert its data input associated with the data output of the NAND gate 290 as its data output at its output point acting as the data output L_Data_in of the large receiver 275 at an output point of the large receiver 275.

Referring to FIG. 16A, when the large receiver 275 has the first data input L_Inhibit at a logic level of "0", the data output of the NAND gate 290 is always at a logic level of "1" and the data output L_Data_in of the large receiver 275 is always at a logic level of "0". Thereby, the large receiver 275 is inhibited from generating its data output L_Data_in associated with its second data input at the node 281.

Referring to FIG. 16A, the large receiver 275 may be activated when the large receiver 275 has the first data input L_Inhibit at a logic level of "1". Meanwhile, if the large receiver 275 has the second data input at a logic level of "1" from circuits outside the semiconductor integrated-circuit (IC) chip through said one of the I/O pads 272, the NAND gate 290 has its data output at a logic level of "0", and thereby the large receiver 275 may have its data output L_Data_in at a logic level of "1". If the large receiver 275 has the second data input at a logic level of "0" from circuits outside the semiconductor integrated-circuit (IC) chip through said one of the I/O pads 272, the NAND gate 290 has its data output at a logic level of "1", and thereby the large receiver 275 may have its data output L_Data_in at a logic level of "0". Accordingly, the large receiver 275 may be activated by its first data input L_Inhibit signal to amplify or drive its second data input from circuits outside the semiconductor integrated-circuit (IC) chip through said one of the I/O pads 272 as its data output L_Data_in.

Referring to FIG. 16A, the large I/O circuit 341 may have an I/O power efficiency greater than 3, 5 or 10 pico-Joules per bit, per switch or per voltage swing. The large driver 274 may have an output capacitance or driving capability or loading, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF. The output capacitance of the large driver 274 can be used as driving capability of the large driver 274, which is the maximum loading at the output point of the large driver 274, measured from said one of the I/O pads 272 to loading circuits external of said one of the I/O pads 272. The size of the large ESD protection circuit or device 273 may be between 0.1 pF and 3 pF or between 0.1 pF and 1 pF, or larger than 0.1 pF. Said one of the I/O pads 272 may have an input capacitance, provided by the large ESD protection circuit or device 273 and large receiver 275 for example, between 0.15 pF and 4 pF or between 0.15 pF and 2 pF, or greater than 0.15 pF. The input capacitance is measured from said one of the I/O pads 272 to circuits internal of said one of the I/O pads 272.

Specification for Small I/O Circuits

Figure 16B:
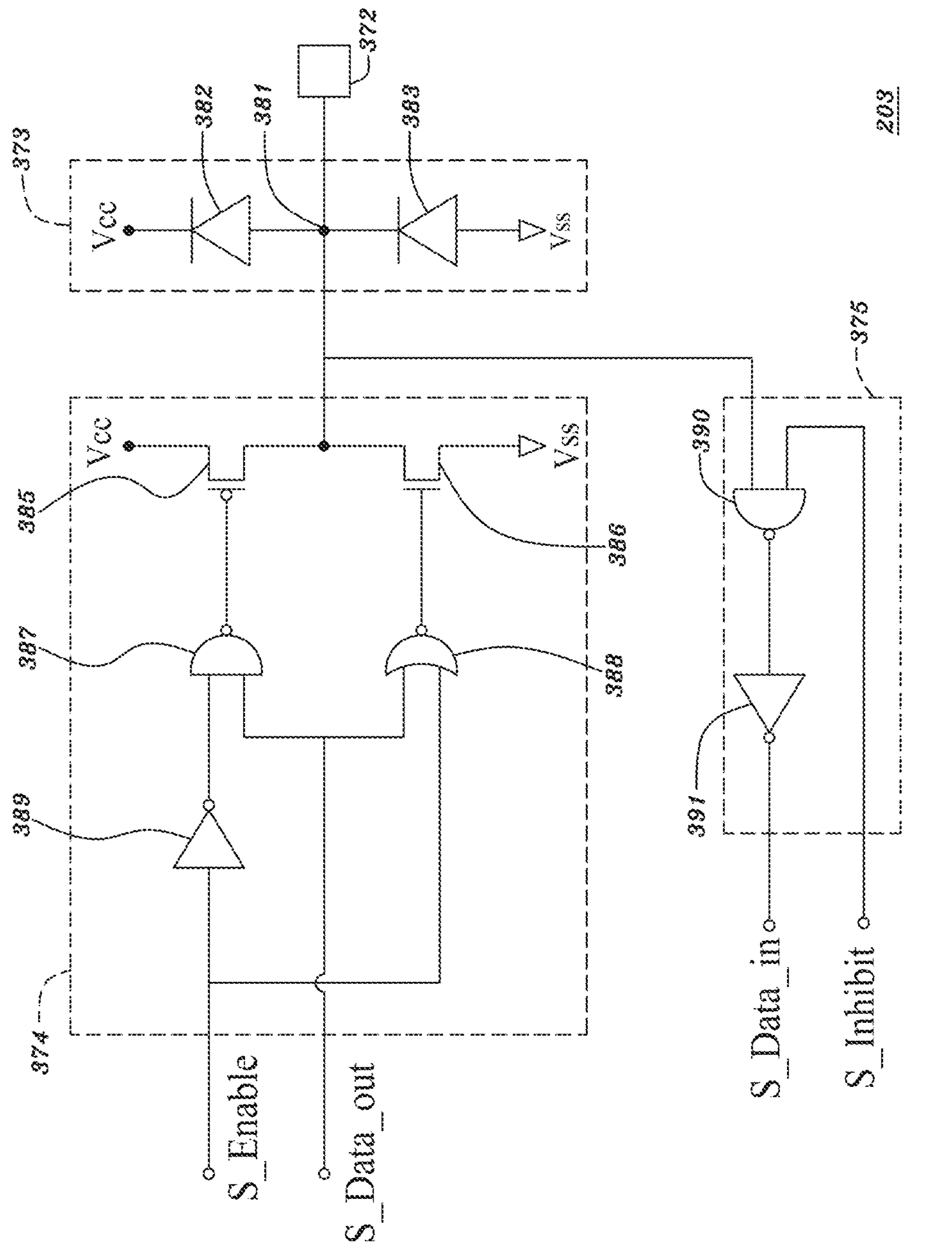
FIG. 16B is a circuit diagram of a small I/O circuit in accordance with an embodiment of the present application.

FIG. 16B is a circuit diagram of a small I/O circuit in accordance with an embodiment of the present application. Referring to FIG. 16B, a semiconductor integrated-circuit (IC) chip may include multiple I/O pads 372 each coupling to its small ESD protection circuit or device 373, its small driver 374 and its small receiver 375. The small driver 374, small receiver 375 and small ESD protection circuit or device 373 may compose a small I/O circuit 203. The small ESD protection circuit or device 373 may include a diode 382 having a cathode coupling to the voltage Vcc of power supply and an anode coupling to a node 381 and a diode 383 having a cathode coupling to the node 381 and an anode coupling to the voltage Vss of ground reference. The node 381 couples to one of the I/O pads 372.

Referring to FIG. 16B, the small driver 374 may have a first input point for a first data input S_Enable for enabling the small driver 374 and a second input point for a second data input S_Data_out, and may be configured to amplify or drive the second data input S_Data_out as its data output at its output point at the node 381 to be transmitted to circuits outside the semiconductor integrated-circuit (IC) chip through said one of the I/O pads 372. The small driver 374 may include a P-type MOS transistor 385 and N-type MOS transistor 386 both having respective drain terminals coupling to each other as its output point at the node 381 and respective source terminals coupling to the voltage Vcc of power supply and to the voltage Vss of ground reference. The small driver 374 may have a NAND gate 387 having a data output at an output point of the NAND gate 387 coupling to a gate terminal of the P-type MOS transistor 385 and a NOR gate 388 having a data output at an output point of the NOR gate 388 coupling to a gate terminal of the N-type MOS transistor 386. The NAND gate 387 may have a first data input at its first input point associated with a data output of its inverter 389 at an output point of an inverter 389 of the small driver 374 and a second data input at its second input point associated with the second data input S_Data_out of the small driver 374 to perform a NAND operation on its first and second data inputs as its data output at its output point coupling to the gate terminal of its P-type MOS transistor 385. The NOR gate 388 may have a first data input at its first input point associated with the second data input S_Data_out of the small driver 374 and a second data input at its second input point associated with the first data input S_Enable of the small driver 374 to perform a NOR operation on its first and second data inputs as its data output at its output point coupling to the gate terminal of the N-type MOS transistor 386. The inverter 389 may be configured to invert its data input at its input point associated with the first data input S_Enable of the small driver 374 as its data output at its output point coupling to the first input point of the NAND gate 387.

Referring to FIG. 16B, when the small driver 374 has the first data input S_Enable at a logic level of "1", the data output of the NAND gate 387 is always at a logic level of "1" to turn off the P-type MOS transistor 385 and the data output of the NOR gate 388 is always at a logic level of "0" to turn off the N-type MOS transistor 386. Thereby, the small driver 374 may be disabled by its first data input S_Enable and the small driver 374 may not pass the second data input S_Data_out from its second input point to its output point at the node 381.

Referring to FIG. 16B, the small driver 374 may be enabled when the small driver 374 has the first data input S_Enable at a logic level of "0". Meanwhile, if the small driver 374 has the second data input S_Data_out at a logic level of "0", the data outputs of the NAND and NOR gates 387 and 388 are at a logic level of "1" to turn off the P-type MOS transistor 385 and on the N-type MOS transistor 386, and thereby the data output of the small driver 374 at the node 381 is at a logic level of "0" to be passed to said one of the I/O pads 372. If the small driver 374 has the second data input S_Data_out at a logic level of "1", the data outputs of the NAND and NOR gates 387 and 388 are at a logic level of "0" to turn on the P-type MOS transistor 385 and off the N-type MOS transistor 386, and thereby the data output of the small driver 374 at the node 381 is at a logic level of "1" to be passed to said one of the I/O pads 372. Accordingly, the small driver 374 may be enabled by its first data input S_Enable to amplify or drive its second data input S_Data_out at its second input point as its data output at its output point at the node 381 to be transmitted to circuits outside the semiconductor integrated-circuit (IC) chip through said one of the I/O pads 372.

Referring to FIG. 16B, the small receiver 375 may have a first data input S_Inhibit at its first input point and a second data input at its second input point coupling to said one of the I/O pads 372 to be amplified or driven by the small receiver 375 as its data output S_Data_in. The small receiver 375 may be inhibited by its first data input S_Inhibit from generating its data output S_Data_in associated with its second data input. The small receiver 375 may include a NAND gate 390 and an inverter 391 having a data input at an input point of the inverter 391 associated with a data output of the NAND gate 390. The NAND gate 390 has a first input point for its first data input associated with the second data input of the large receiver 275 and a second input point for its second data input associated with the first data input S_Inhibit of the small receiver 375 to perform a NAND operation on its first and second data inputs as its data output at its output point coupling to the input point of its inverter 391. The inverter 391 may be configured to invert its data input associated with the data output of the NAND gate 390 as its data output at its output point acting as the data output S_Data_in of the small receiver 375 at an output point of the small receiver 375.

Referring to FIG. 16B, when the small receiver 375 has the first data input S_Inhibit at a logic level of "0", the data output of the NAND gate 390 is always at a logic level of "1" and the data output S_Data_in of the small receiver 375 is always at a logic level of "0". Thereby, the small receiver 375 is inhibited from generating its data output S_Data_in associated with its second data input at the node 381.

Referring to FIG. 16B, the small receiver 375 may be activated when the small receiver 375 has the first data input S_Inhibit at a logic level of "1". Meanwhile, if the small receiver 375 has the second data input at a logic level of "1" from circuits outside the semiconductor integrated-circuit (IC) chip through said one of the I/O pads 372, the NAND gate 390 has its data output at a logic level of "0", and thereby the small receiver 375 may have its data output S_Data_in at a logic level of "1". If the small receiver 375 has the second data input at a logic level of "0" from circuits outside the semiconductor integrated-circuit (IC) chip through said one of the I/O pads 372, the NAND gate 390 has its data output at a logic level of "1", and thereby the small receiver 375 may have its data output S_Data_in at a logic level of "0". Accordingly, the small receiver 375 may be activated by its first data input S_Inhibit to amplify or drive its second data input from circuits outside the semiconductor integrated-circuit (IC) chip through said one of the I/O pads 372 as its data output S_Data_in.

Referring to FIG. 16B, the small I/O circuit 203 may have an I/O power efficiency smaller than 0.5 pico-Joules per bit, per switch or per voltage swing, or between 0.01 and 0.5 pico-Joules per bit, per switch or per voltage swing. The small driver 374 may have an output capacitance or driving capability or loading, for example, between 0.05 pF and 2 pF, between 0.1 pF and 2 pF, between 0.05 pF and 1 pF or between 0.1 pF and 1 pF, or smaller than 2 pF or 1 pF. The output capacitance of the small driver 374 can be used as driving capability of the small driver 374, which is the maximum loading at the output point of the small driver 374, measured from said one of the I/O pads 372 to loading circuits external of said one of the I/O pads 372. The size of the small ESD protection circuit or device 373 may be between 0.05 pF and 2 pF, between 0.05 pF and 1 pF or between 0.01 pF and 0.1 pF or smaller than 2 pF, 1 pF, 0.5 pF or 0.1 pF. In some cases, no small ESD protection circuit or device 373 is provided in the small I/O circuit 203. In some cases, the small driver 374 or receiver 375 of the small I/O circuit 203 in FIG. 16B may be designed just like an internal driver or receiver, having no small ESD protection circuit or device 373 and having the same input and output capacitances as the internal driver or receiver. Said one of the I/O pads 372 may have an input capacitance, provided by the small ESD protection circuit or device 373 and small receiver 375 for example, between 0.15 pF and 4 pF or between 0.15 pF and 2 pF, or greater than 0.15 pF. The input capacitance is measured from said one of the I/O pads 372 to loading circuits internal of said one of the I/O pads 372.

Figure 17A:
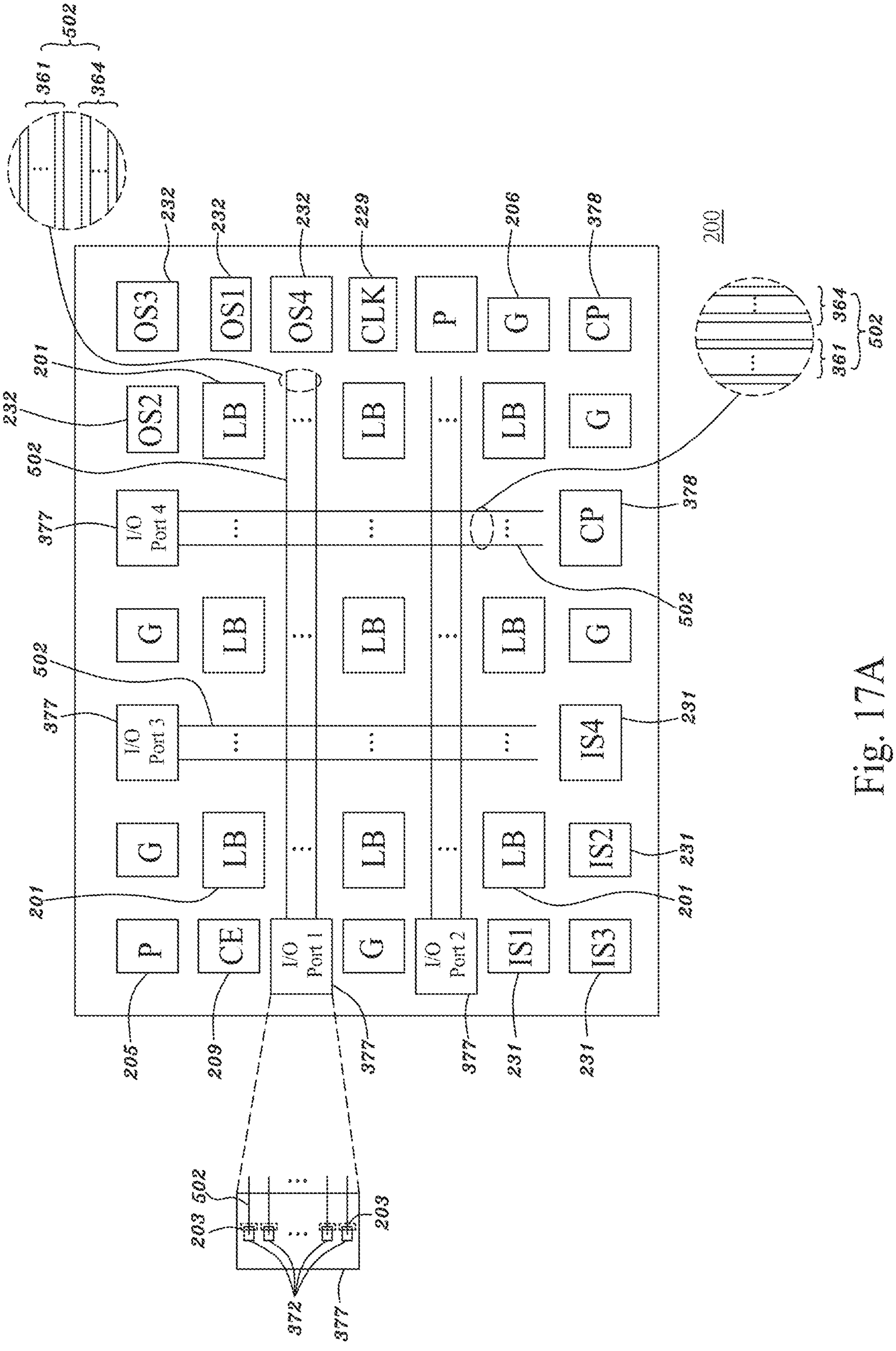
FIG. 17A is a schematically top view showing a block diagram of a first type of standard commodity field programmable integrated-circuit (FPIC) chip in accordance with an embodiment of the present application.

Specification for First Type of Standard Commodity Field-Programmable Integrated-Circuit (FPIC) Chip FIG. 17A is a schematically top view showing a block diagram of a first type of standard commodity field programmable integrated-circuit (FPIC) chip in accordance with an embodiment of the present application. Referring to FIG. 17A, a first type of standard commodity field programmable integrated-circuit (FPIC) chip or chiplet 200, i.e., field-programmable-gate-array (FPGA) integrated-circuit (IC) chip or chiplet, may include (1) multiple programmable logic blocks (LBs) 201, each of which may be the first, second or third type of fined-grained field programmable logic cell or element (LCE) 2014 as illustrated in FIGS. 2A-2C for a fined-grained (FG) field-programmable-gate-array (FPGA) integrated-circuit (IC) chip, the coarse-grained reconfigurable architecture (CGRA) 2041 as illustrated in FIG. 4 for a coarse-grained reconfigurable architecture (CGRA) integrated-circuit (IC) chip or the coarse-grained programmable logic cell or element 2060 as illustrated in FIGS. 5A-5D and 6 for a coarse-grained field programmable (CGFP) integrated-circuit (IC) chip, arranged in an array in a central region thereof, (2) multiple first or second type of field programmable switch cells 379 as illustrated in FIGS. 3A and 3B arranged around each of its programmable logic blocks (LBs) 201, and (3) multiple intra-chip interconnects 502 each extending over spaces between neighboring two of its programmable logic blocks (LBs) 201. For the first type of standard commodity field programmable integrated-circuit (FPIC) chip or chiplet 200, its intra-chip interconnects 502 may include the programmable interconnects 361 as seen in FIGS. 3A and 3B configured to be programmed for interconnection by its first or second type of field programmable switch cells 379 and multiple non-programmable interconnects 364 each for (1) passing the resulting values or programming codes to one of the memory cells 490 of one of its programmable logic blocks (LBs) 201 in case for the first type of fined-grained field programmable logic cell or element (LCE) 2014 as illustrated in FIG. 2A to be stored therein, (2) passing the resulting values to one of the memory cells of one of its programmable logic blocks (LBs) 201 in case for the second type of fined-grained field programmable logic cell or element (LCE) 2014 as illustrated in FIG. 2B to be stored therein, (3) passing the resulting values to one of the first and second sets of memory cells of one of its programmable logic blocks (LBs) 201 in case for the third type of fined-grained field programmable logic cell or element (LCE) 2014 as illustrated in FIG. 2C to be stored therein, (4) passing the instruction sets to one of the third memory cells of the instruction memory block or section 2049 of one of its programmable logic blocks (LBs) 201 in case for the coarse-grained reconfigurable architecture (CGRA) 2041 as illustrated in FIG. 4 to be stored therein, (5) passing the resulting values or data or programming codes to one of the third type of static random-access memory (SRAM) cells 398 of one of its programmable logic blocks (LBs) 201 in case for the coarse-grained programmable logic cells or elements (LCEs) 2060 as illustrated in FIGS. 5A-5D and 6 to be stored therein, or (6) passing the programming codes to one of the memory cells 362 of one of its first or second type of field programmable switch cells 379 as illustrated in FIGS. 3A and 3B to be stored therein. The first type of standard commodity field programmable integrated-circuit (FPIC) chip or chiplet 200 may further include multiple small input/output (I/O) circuits 203 as illustrated in FIG. 16B each providing the small driver 374 with the second data input S_Data_out at the second input point of the small driver 374 configured to couple to one of the programmable or non-programmable interconnects 361 or 364 of its intra-chip interconnects 502 and providing the small receiver 375 with the data output S_Data_in at the output point of the small receiver 375 configured to couple to one of the programmable or non-programmable interconnects 361 or 364 of its intra-chip interconnects 502. For the first type of standard commodity field programmable integrated-circuit (FPIC) chip or chiplet 200, each of its programmable logic blocks (LBs) 201 may have the input data set coupling to some of the programmable and non-programmable interconnects 361 and 364 of its intra-chip interconnects 502 and may be configured to perform logic operation or computation operation on the input data set thereof into the data output(s) thereof coupling to another or others of the programmable and non-programmable interconnects 361 and 364 of its intra-chip interconnects 502, wherein the computation operation may include an addition, subtraction, multiplication or division operation, and the logic operation may include a Boolean operation such as AND, NAND, OR or NOR operation.

In an alternative scenario, referring to FIG. 17A, for the first type of standard commodity field programmable integrated-circuit (FPIC) chip or chiplet 200, the combination of its programmable logic blocks (LBs) 201, field programmable switch cells 379 and intra-chip interconnects 502 as illustrated in FIG. 17A may be replaced with any type of the first through fourth types of coarse-grained field programmable (CGFP) architectures 2070, 2170, 2090 and 2270 as illustrated in FIGS. 5A-15.

Referring to FIG. 17A, the first type of standard commodity field programmable integrated-circuit (FPIC) chip or chiplet 200 may include multiple I/O pads 372 as seen in FIG. 16B each vertically over one of its small input/output (I/O) circuits 203. For example, in a first clock cycle, for one of the small input/output (I/O) circuits 203 of the first type of standard commodity field programmable integrated-circuit (FPIC) chip or chiplet 200, its small driver 374 may be enabled by the first data input S_Enable of its small driver 374 and its small receiver 375 may be inhibited by the first data input S_Inhibit of its small receiver 375. Thereby, its small driver 374 may amplify the second data input S_Data_out of its small driver 374, passed from one of the data output(s) of one of the programmable logic blocks (LBs) 201 of the first type of standard commodity field programmable integrated-circuit (FPIC) chip or chiplet 200 through first one or more of the programmable interconnects 361 of the intra-chip interconnects 502 of the first type of standard commodity field programmable integrated-circuit (FPIC) chip or chiplet 200 and/or one or more of the field programmable switch cells 379 of the first type of standard commodity field programmable integrated-circuit (FPIC) chip or chiplet 200 each coupled between two of said first one or more of the programmable interconnects 361, as the data output of its small driver 374 to be transmitted to one of the I/O pads 372 vertically over said one of the small input/output (I/O) circuits 203 for external connection to circuits outside the first type of standard commodity field programmable integrated-circuit (FPIC) chip or chiplet 200.

In a second clock cycle, for said one of the small input/output (I/O) circuits 203 of the first type of standard commodity field programmable integrated-circuit (FPIC) chip or chiplet 200, its small driver 374 may be disabled by the first data input S_Enable of its small driver 374 and its small receiver 375 may be activated by the first data input S_Inhibit of its small receiver 375. Thereby, its small receiver 375 may amplify the second data input of its small receiver 375 transmitted from circuits outside the first type of standard commodity field programmable integrated-circuit (FPIC) chip or chiplet 200 through said one of the I/O pads 372 as the data output S_Data_in of its small receiver 375 to be passed as a data input of the input data set of one of the programmable logic blocks (LBs) 201 of the first type of standard commodity field programmable integrated-circuit (FPIC) chip or chiplet 200 through second one or more of the programmable interconnects 361 of the intra-chip interconnects 502 of the first type of standard commodity field programmable integrated-circuit (FPIC) chip or chiplet 200 and/or one or more of the field programmable switch cells 379 of the first type of standard commodity field programmable integrated-circuit (FPIC) chip or chiplet 200 each coupled between two of said second one or more of the programmable interconnects 361.

Referring to FIG. 17A, the first type of standard commodity field programmable integrated-circuit (FPIC) chip or chiplet 200 may include multiple I/O ports 377 having the number ranging from 2 to 64 for example, such as I/O Port 1, I/O Port 2, I/O Port 3 and I/O Port 4 for this case. Each of the I/O ports 377 may include (1) the small I/O circuits 203 as seen in FIG. 16B having the number ranging from 4 to 256, such as 64 for this case, arranged in parallel for data transmission with bit width ranging from 4 to 256, such as 64 for this case, and (2) the I/O pads 372 as seen in FIG. 16B having the number ranging from 4 to 256, such as 64 for this case, arranged in parallel and vertically over the small I/O circuits 203 respectively.

Referring to FIG. 17A, the first type of standard commodity field programmable integrated-circuit (FPIC) chip or chiplet 200 may further include a chip-enable (CE) pad 209 configured for enabling or disabling the first type of standard commodity field programmable integrated-circuit (FPIC) chip or chiplet 200. For example, when the chip-enable (CE) pad 209 is at a logic level of “0”, the first type of standard commodity field programmable integrated-circuit (FPIC) chip or chiplet 200 may be enabled to process data and/or operate with circuits outside of the first type of standard commodity field programmable integrated-circuit (FPIC) chip or chiplet 200; when the chip-enable (CE) pad 209 is at a logic level of “1”, the first type of standard commodity field programmable integrated-circuit (FPIC) chip or chiplet 200 may be disabled not to process data and/or operate with circuits outside of the first type of standard commodity field programmable integrated-circuit (FPIC) chip or chiplet 200.

Figure 22:
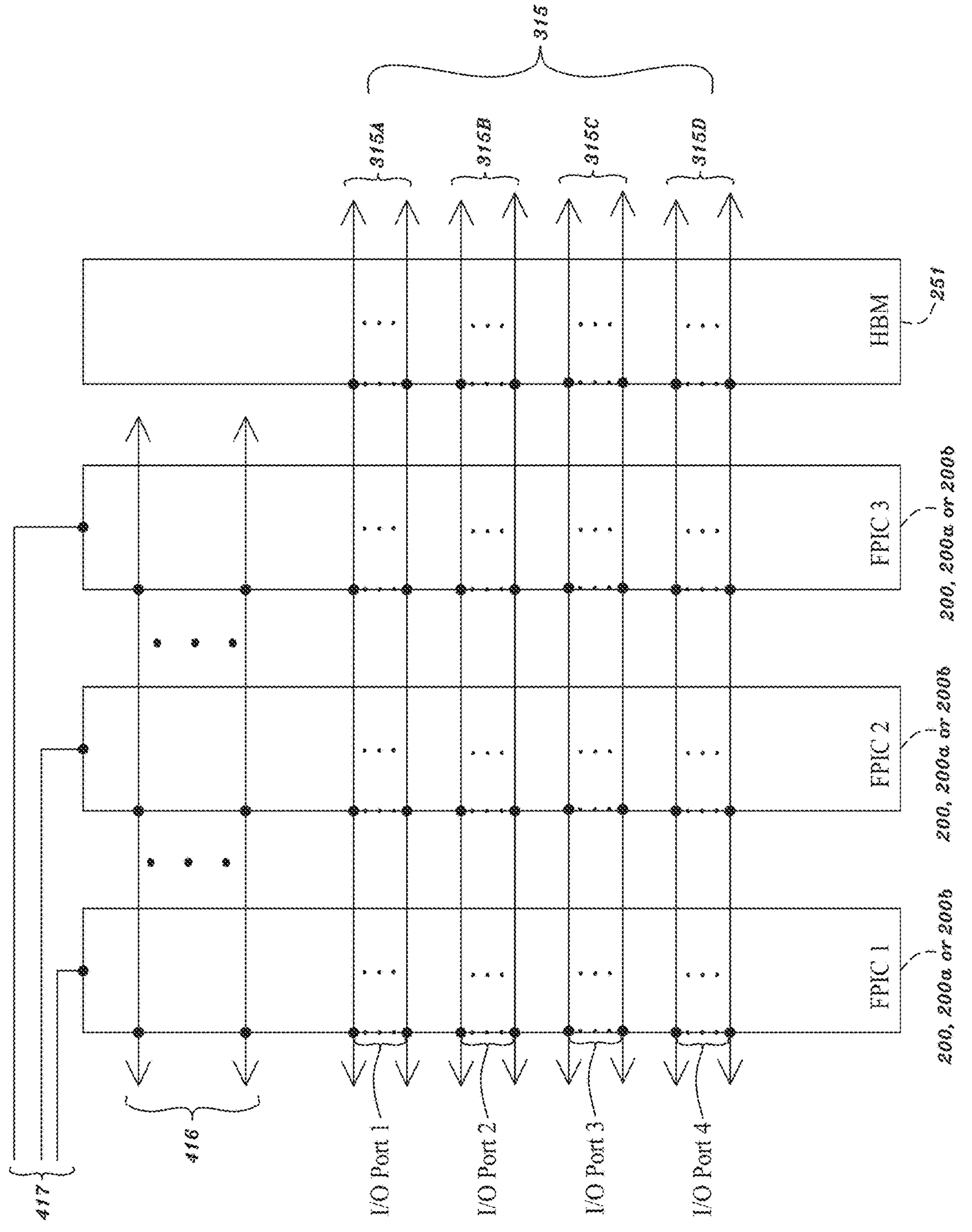
FIG. 22 is a block diagram illustrating multiple control buses for one or more standard commodity field programmable integrated-circuit (FPIC) chips and multiple data buses for an expandable logic scheme based on one or more standard commodity field programmable integrated-circuit (FPIC) chips and high bandwidth memory (HBM) IC chips in accordance with the present application.

Referring to FIG. 17A, the first type of standard commodity field programmable integrated-circuit (FPIC) chip or chiplet 200 may include multiple input selection (IS) pads 231, e.g., IS1, IS2, IS3 and IS4 pads, each configured to receive data to be passed as the first data input S_Inhibit of the small receiver 375 of each of the small I/O circuits 203 of one of its I/O ports 377, e.g., I/O Port 1, I/O Port 2, I/O Port 3 and I/O Port 4. For more elaboration, the IS1 pad 231 may receive data to be passed as the first data input S_Inhibit of the small receiver 375 of each of the small I/O circuits 203 of its I/O Port 1 through a first one of its small I/O circuits 203; the IS2 pad 231 may receive data to be passed as the first data input S_Inhibit of the small receiver 375 of each of the small I/O circuits 203 of I/O Port 2 through a second one of its small I/O circuits 203; the IS3 pad 231 may receive data to be passed as the first data input S_Inhibit of the small receiver 375 of each of the small I/O circuits 203 of I/O Port 3 through a third one of its small I/O circuits 203; and the IS4 pad 231 may receive data to be passed as the first data input S_Inhibit of the small receiver 375 of each of the small I/O circuits 203 of I/O Port 4 through a fourth one of its small I/O circuits 203. The first type of standard commodity field programmable integrated-circuit (FPIC) chip or chiplet 200 may select, in accordance with logic levels at the input selection (IS) pads 231, e.g., IS1, IS2, IS3 and IS4 pads, one or more from its I/O ports 377, e.g., I/O Port 1, I/O Port 2, I/O Port 3 and I/O Port 4 to pass data for its input operation. For each of the small I/O circuits 203 of one of the I/O ports 377 selected in accordance with the logic level at one of the input selection (IS) pads 231 of the first type of standard commodity field programmable integrated-circuit (FPIC) chip or chiplet 200, its small receiver 375 may be activated by the first data input S_Inhibit of its small receiver 375 associated with the logic level at said one of the input selection (IS) pads 231 of the first type of standard commodity field programmable integrated-circuit (FPIC) chip or chiplet 200 to amplify or pass the second data input of its small receiver 375, transmitted from a data path of one of data buses 315 as illustrated in FIG. 22 outside the first type of standard commodity field programmable integrated-circuit (FPIC) chip or chiplet 200 through one of the I/O pads 372 of said one of the I/O ports 377 selected in accordance with the logic level at said one of the input selection (IS) pads 231 of the first type of standard commodity field programmable integrated-circuit (FPIC) chip or chiplet 200, as the data output S_Data_in of its small receiver 375 to be passed as a data input of the input data set of one of the programmable logic blocks (LBs) 201 of the first type of standard commodity field programmable integrated-circuit (FPIC) chip or chiplet 200 through one or more of the programmable interconnects 361 of the intra-chip interconnects 502 of the first type of standard commodity field programmable integrated-circuit (FPIC) chip or chiplet 200, for example. For each of the small I/O circuits 203 of the other one or more of the I/O ports 377, not selected in accordance with the logic level at the other(s) of the input selection (IS) pads 231, of the first type of standard commodity field programmable integrated-circuit (FPIC) chip or chiplet 200, its small receiver 375 may be inhibited by the first data input S_Inhibit of its small receiver 375 associated with the logic level at one of the other(s) of the input selection (IS) pads 231.

For example, referring to FIG. 17A, provided that the first type of standard commodity field programmable integrated-circuit (FPIC) chip or chiplet 200 may have (1) the chip-enable (CE) pad 209 at a logic level of "0", (2) the IS1 pad 231 at a logic level of "1", (3) the IS2 pad 231 at a logic level of "0", (4) the IS3 pad 231 at a logic level of "0" and (5) the IS4 pad 231 at a logic level of "0", the first type of standard commodity field programmable integrated-circuit (FPIC) chip or chiplet 200 may be enabled in accordance with the logic level at its chip-enable (CE) pad 209 and may select, in accordance with the logic levels at its IS1, IS2, IS3 and IS4 pads 231, one or more I/O port, i.e., I/O Port 1, from its I/O ports 377, i.e., I/O Port 1, I/O Port 2, I/O Port 3 and I/O Port 4, to pass data for the input operation. For each of the small I/O circuits 203 of the selected I/O port 377, i.e., I/O Port 1, of the first type of standard commodity field programmable integrated-circuit (FPIC) chip or chiplet 200, its small receiver 375 may be activated by the first data input S_Inhibit of its small receiver 375 associated with the logic level at the IS1 pad 231 of the first type of standard commodity field programmable integrated-circuit (FPIC) chip or chiplet 200. For each of the small I/O circuits 203 of the unselected I/O ports, i.e., I/O Port 2, I/O Port 3 and I/O Port 4, of the first type of standard commodity field programmable integrated-circuit (FPIC) chip or chiplet 200, its small receiver 375 may be inhibited by the first data input S_Inhibit of its small receiver 375 associated respectively with the logic levels at the IS2, IS3 and IS4 pads 231 of the first type of standard commodity field programmable integrated-circuit (FPIC) chip or chiplet 200.

For example, referring to FIG. 17A, provided that the first type of standard commodity field programmable integrated-circuit (FPIC) chip or chiplet 200 may have (1) the chip-enable (CE) pad 209 at a logic level of "0", (2) the IS1 pad 231 at a logic level of "1", (3) the IS2 pad 231 at a logic level of "1", (4) the IS3 pad 231 at a logic level of "1" and (5) the IS4 pad 231 at a logic level of "1", the first type of standard commodity field programmable integrated-circuit (FPIC) chip or chiplet 200 may be enabled in accordance with the logic level at its chip-enable (CE) pad 209 and may select, in accordance with the logic levels at its IS1, IS2, IS3 and IS4 pads 231, all from its I/O ports 377, i.e., I/O Port 1, I/O Port 2, I/O Port 3 and I/O Port 4, to pass data for the input operation at the same clock cycle. For each of the small I/O circuits 203 of the selected I/O ports 377, i.e., I/O Port 1, I/O Port 2, I/O Port 3 and I/O Port 4, of the first type of standard commodity field programmable integrated-circuit (FPIC) chip or chiplet 200, its small receiver 375 may be activated by the first data input S_Inhibit of its small receiver 375 associated respectively with the logic levels at the IS1, IS2, IS3 and IS4 pads 231 of the first type of standard commodity field programmable integrated-circuit (FPIC) chip or chiplet 200.

Referring to FIG. 17A, the first type of standard commodity field programmable integrated-circuit (FPIC) chip or chiplet 200 may include multiple output selection (OS) pads 232, e.g., OS1, OS2, OS3 and OS4 pads, each configured to receive data to be passed as the first data input S_Enable of the small driver 374 of each of the small I/O circuits 203 of one of its I/O ports 377, e.g., I/O Port 1, I/O Port 2, I/O Port 3 and I/O Port 4. For more elaboration, the OS1 pad 232 may receive data to be passed as the first data input S_Enable of the small driver 374 of each of the small I/O circuits 203 of I/O Port 1 through a fifth one of its small I/O circuits 203; the OS2 pad 232 may receive data to be passed as the first data input S_Enable of the small driver 374 of each of the small I/O circuits 203 of I/O Port 2 through a sixth one of its small I/O circuits 203; the OS3 pad 232 may receive data to be passed as the first data input S_Enable of the small driver 374 of each of the small I/O circuits 203 of I/O Port 3 through a seventh one of its small I/O circuits 203; the OS4 pad 232 may receive data to be passed as the first data input S_Enable of the small driver 374 of each of the small I/O circuits 203 of I/O Port 4 through an eighth one of its small I/O circuits 203. The first type of standard commodity field programmable integrated-circuit (FPIC) chip or chiplet 200 may select, in accordance with logic levels at the output selection (OS) pads 232, e.g., OS1, OS2, OS3 and OS4 pads, one or more from its I/O ports 377, e.g., I/O Port 1, I/O Port 2, I/O Port 3 and I/O Port 4 to pass data for its output operation. For each of the small I/O circuits 203 of each of the one or more I/O ports 377 selected in accordance with the logic levels at the output selection (OS) pads 232, its small driver 374 may be enabled by the first data input S_Enable of its small driver 374 associated with the logic level at one of the output selection (OS) pads 232 to amplify or pass the second data input S_Data_out of its small driver 374, associated with one of the data output(s) of one of the programmable logic blocks (LBs) 201 of the first type of standard commodity field programmable integrated-circuit (FPIC) chip or chiplet 200 through one or more of the programmable interconnects 361 of the intra-chip interconnects 502 of the first type of standard commodity field programmable integrated-circuit (FPIC) chip or chiplet 200, as the data output of its small driver 374 to be transmitted to a data path of one of data buses 315 as illustrated in FIG. 22 outside the first type of standard commodity field programmable integrated-circuit (FPIC) chip or chiplet 200 through one of the I/O pads 372 of said each of the one or more I/O ports 377, for example. For each of the small I/O circuits 203 of each of the I/O ports 377, not selected in accordance with in accordance with the logic levels at the output selection (OS) pads 232, of the first type of standard commodity field programmable integrated-circuit (FPIC) chip or chiplet 200, its small driver 374 may be disabled by the first data input S_Enable of its small driver 374 associated with the logic level at one of the output selection (OS) pads 232.

For example, referring to FIG. 17A, provided that the first type of standard commodity field programmable integrated-circuit (FPIC) chip or chiplet 200 may have (1) the chip-enable (CE) pad 209 at a logic level of "0", (2) the OS1 pad 232 at a logic level of "0", (3) the OS2 pad 232 at a logic level of "1", (4) the OS3 pad 232 at a logic level of "1" and (5) the OS4 pad 232 at a logic level of "1", the first type of standard commodity field programmable integrated-circuit (FPIC) chip or chiplet 200 may be enabled in accordance with the logic level at its chip-enable (CE) pad 209 and may select, in accordance with the logic levels at its OS1, OS2, OS3 and OS4 pads 232, one or more I/O port, i.e., I/O Port 1, from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1, of the first type of standard commodity field programmable integrated-circuit (FPIC) chip or chiplet 200, its small driver 374 may be enabled by the first data input S_Enable of its small driver 374 associated with the logic level at the OS1 pad 232 of the first type of standard commodity field programmable integrated-circuit (FPIC) chip or chiplet 200. For each of the small I/O circuits 203 of the unselected I/O ports, i.e., I/O Port 2, I/O Port 3 and I/O Port 4, of the first type of standard commodity field programmable integrated-circuit (FPIC) chip or chiplet 200, its small driver 374 may be disabled by the first data input S_Enable of its small driver 374 associated respectively with the logic levels at the OS2, OS3 and OS4 pads 232 of the first type of standard commodity field programmable integrated-circuit (FPIC) chip or chiplet 200.

For example, referring to FIG. 17A, provided that the first type of standard commodity field programmable integrated-circuit (FPIC) chip or chiplet 200 may have (1) the chip-enable (CE) pad 209 at a logic level of "0", (2) the OS1 pad 232 at a logic level of "0", (3) the OS2 pad 232 at a logic level of "0", (4) the OS3 pad 232 at a logic level of "0" and (5) the OS4 pad 232 at a logic level of "0", the first type of standard commodity field programmable integrated-circuit (FPIC) chip or chiplet 200 may be enabled in accordance with the logic level at its chip-enable (CE) pad 209 and may select, in accordance with the logic levels at its OS1, OS2, OS3 and OS4 pads 232, all from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1, I/O Port 2, I/O Port 3 and I/O Port 4, of the first type of standard commodity field programmable integrated-circuit (FPIC) chip or chiplet 200, its small driver 374 may be enabled by the first data input S_Enable of its small driver 374 associated respectively with the logic levels at the OS1, OS2, OS3 and OS4 pads 232 of the first type of standard commodity field programmable integrated-circuit (FPIC) chip or chiplet 200.

Thereby, referring to FIG. 17A, for the first type of standard commodity field programmable integrated-circuit (FPIC) chip or chiplet 200, in a clock cycle one or more of its I/O ports 377, e.g., I/O Port 1, I/O Port 2, I/O Port 3 and I/O Port 4, may be selected, in accordance with the logic levels at its IS1, IS2, IS3 and IS4 pads 231, to pass data for the input operation, while another one or more of its I/O ports 377, e.g., I/O Port 1, I/O Port 2, I/O Port 3 and I/O Port 4, may be selected, in accordance with the logic levels at its OS1, OS2, OS3 and OS4 pads 232, to pass data for the output operation. Its input selection (IS) pads 231 and output selection (OS) pads 232 may be provided as its I/O-port selection pads.

Referring to FIG. 17A, the first type of standard commodity field programmable integrated-circuit (FPIC) chip or chiplet 200 may further include (1) multiple power pads 205 for applying the voltage Vcc of power supply to its programmable logic blocks (LBs) 201 and first or second type of field programmable switch cells 379, or any type of its first through fourth types of coarse-grained field programmable (CGFP) architectures 2070, 2170, 2090 and 2270 in the alternative scenario, through one or more of the non-programmable interconnects 364 of its intra-chip interconnects 502 and to the small drivers 374 and receivers 375 of its small I/O circuits 203 through one or more of the non-programmable interconnects 364 of its intra-chip interconnects 502, wherein the voltage Vcc of power supply may be between 0.2V and 2.5V, between 0.2V and 2V, between 0.2V and 1.5V, between 0.1V and 1V, between 0.2V and 1V or between 0.1V and 0.5V, or, smaller or lower than or equal to 2.5V, 2V, 1.8V, 1.5V, 1V or 0.5V, and (2) multiple ground pads 206 configured for providing the voltage Vss of ground reference to its programmable logic blocks (LBs) 201 and first or second type of field programmable switch cells 379, or any type of its first through fourth types of coarse-grained field programmable (CGFP) architectures 2070, 2170, 2090 and 2270 in the alternative scenario, through one or more of the non-programmable interconnects 364 of its intra-chip interconnects 502 and to the small drivers 374 and receivers 375 of its small I/O circuits 203 through one or more of the non-programmable interconnects 364 of its intra-chip interconnects 502.

Referring to FIG. 17A, the first type of standard commodity field programmable integrated-circuit (FPIC) chip or chiplet 200 may further include a clock pad (CLK) 229 configured to receive a clock signal clk from circuits outside of the first type of standard commodity field programmable integrated-circuit (FPIC) chip or chiplet 200 and multiple control pads (CP) 378 configured to receive control commands to control the first type of standard commodity field programmable integrated-circuit (FPIC) chip or chiplet 200. In an example, the clock signal clk may be passed to the D-type flip-flop circuit 2034 or 2039 of each of its programmable logic blocks (LBs) 201, i.e., field programmable logic cells or elements (LCEs) 2014 as illustrated in FIGS. 2B and 2C.

Referring to FIG. 17A, for the first type of standard commodity field programmable integrated-circuit (FPIC) chip or chiplet 200, its programmable logic blocks (LBs) 201 may be reconfigurable for artificial-intelligence (AI) application. For example, in a clock cycle, one of its programmable logic blocks (LBs) 201 may be programmed to perform OR operation; however, after one or more events happen, in another clock cycle said one of its programmable logic blocks (LBs) 201 may be programmed to perform NAND operation for better AI performance.

Referring to FIG. 17A, the first type of standard commodity field programmable integrated-circuit (FPIC) chip or chiplet 200 may be designed, implemented and fabricated using an advanced semiconductor technology node or generation more advanced than or equal to, or below or equal to, 20 nm or 10 nm for example. The first type of standard commodity field programmable integrated-circuit (FPIC) chip or chiplet 200 may have an area between 100 $mm^2$ and 9 $mm^2$, 75 $mm^2$ and 16 $mm^2$, 50 $mm^2$ and 16 $mm^2$, or 25 $mm^2$ and 9 $mm^2$. Transistors or semiconductor devices of the first type of standard commodity field programmable integrated-circuit (FPIC) chip or chiplet 200 used in an advanced semiconductor technology node or generation may be fin field-effect transistors (FINFETs), gate-all-around field-effect transistors (GAAFETs), FINFETs on silicon-on-insulator (FINFETs SOI), GAAFETs on silicon-on-insulator (GAAFETs SOI), fully depleted silicon-on-insulator (FDSOI) metal-oxide-semiconductor field-effect transistors (MOSFETs), partially depleted silicon-on-insulator (PDSOI) MOSFETs or planar MOSFETs.

Figure 17B:
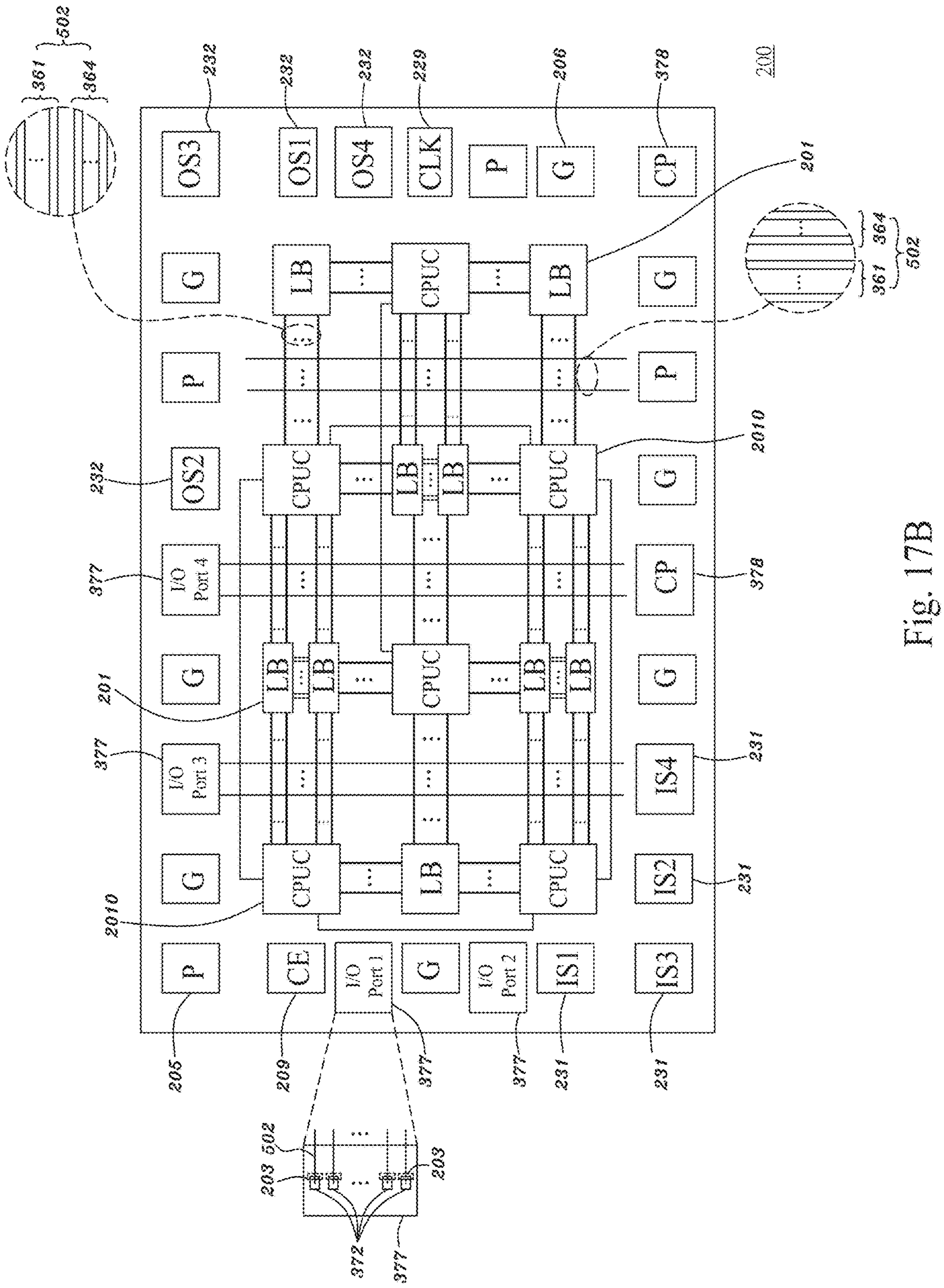
FIG. 17B is a top view showing a layout of a second type of standard commodity field programmable integrated-circuit (FPIC) chip in accordance with an embodiment of the present application.

Specification for Second Type of Standard Commodity Field-Programmable Integrated-Circuit (FPIC) Chip FIG. 17B is a top view showing a layout of a second type of standard commodity field programmable integrated-circuit (FPIC) chip in accordance with an embodiment of the present application. Referring to FIG. 17B, a second type of standard commodity field programmable integrated-circuit (FPIC) chip or chiplet 200 may be used as a data-processing-unit (DPU) integrated-circuit (IC) chip, including (1) multiple programmable logic blocks (LBs) 201, each of which may be the first, second or third type of fined-grained field programmable logic cell or element (LCE) 2014 as illustrated in FIGS. 2A-2C for a fined-grained (FG) field-programmable-gate-array (FPGA) integrated-circuit (IC) chip, the coarse-grained reconfigurable architecture (CGRA) 2041 as illustrated in FIG. 4 for a coarse-grained reconfigurable architecture (CGRA) integrated-circuit (IC) chip or the coarse-grained programmable logic cell or element 2060 as illustrated in FIGS. 5A-5D and 6 for a coarse-grained field programmable (CGFP) integrated-circuit (IC) chip, arranged in an array in a central region thereof, (2) multiple center-processing-unit cores (CPUC) 2010 arranged in the central region thereof, each of which is between two of its programmable logic blocks (LBs) 201 in a front/back direction and between another two of its programmable logic blocks (LBs) 201 in a left/right direction vertical to the front/back direction, (3) multiple first or second type of field programmable switch cells 379 as illustrated in FIGS. 3A and 3B arranged around each of its programmable logic blocks (LB s) 201 and center-processing-unit cores (CPUC) 2010, and (4) multiple intra-chip interconnects 502 each extending over spaces between neighboring two of its programmable logic blocks (LBs) 201 and center-processing-unit cores (CPUC) 2010. For the second type of standard commodity field programmable integrated-circuit (FPIC) chip or chiplet 200, its intra-chip interconnects 502 may include the programmable interconnects 361 as seen in FIGS. 3A and 3B configured to be programmed for interconnection by its first or second type of field programmable switch cells 379 and multiple non-programmable interconnects 364 each for (1) passing the resulting values or programming codes to one of the memory cells 490 of one of its programmable logic blocks (LBs) 201 in case for the first type of fined-grained field programmable logic cell or element (LCE) 2014 as illustrated in FIG. 2A to be stored therein, (2) passing the resulting values to one of the memory cells of one of its programmable logic blocks (LBs) 201 in case for the second type of fined-grained field programmable logic cell or element (LCE) 2014 as illustrated in FIG. 2B to be stored therein, (3) passing the resulting values to one of the first and second sets of memory cells of one of its programmable logic blocks (LBs) 201 in case for the third type of fined-grained field programmable logic cell or element (LCE) 2014 as illustrated in FIG. 2C to be stored therein, (4) passing the instruction sets to one of the third memory cells of the instruction memory block or section 2049 of one of its programmable logic blocks (LBs) 201 in case for the coarse-grained reconfigurable architecture (CGRA) 2041 as illustrated in FIG. 4 to be stored therein, (5) passing the resulting values or data or programming codes to one of the third type of static random-access memory (SRAM) cells 398 of one of its programmable logic blocks (LBs) 201 in case for the coarse-grained programmable logic cells or elements (LCEs) 2060 as illustrated in FIGS. 5A-5D and 6 to be stored therein, or (6) passing the programming codes to one of the memory cells 362 of one of its first or second type of field programmable switch cells 379 as illustrated in FIGS. 3A and 3B to be stored therein. The second type of standard commodity field programmable integrated-circuit (FPIC) chip or chiplet 200 may further include multiple small input/output (I/O) circuits 203 as illustrated in FIG. 16B each providing the small driver 374 with the second data input S_Data_out at the second input point of the small driver 374 configured to couple to one of the programmable or non-programmable interconnects 361 or 364 of its intra-chip interconnects 502 and providing the small receiver 375 with the data output S_Data_in at the output point of the small receiver 375 configured to couple to one of the programmable or non-programmable interconnects 361 or 364 of its intra-chip interconnects 502. For the second type of standard commodity field programmable integrated-circuit (FPIC) chip or chiplet 200, each of its center-processing-unit cores (CPUC) 2010 may be ARM Cortex processor/controller cores based on a reduced instruction set computing (RISC) architecture or x86 central-processing-unit (CPU) cores based on complex instruction set computing (CISC) architecture, wherein the ARM Cortex processor/controller cores may be 8-bit, 16-bit, 32-bit, 64-bit or more-than-64-bit reduced-instruction-set-computing (RISC) ARM processor/controller cores licensed from ARM Holdings.

Referring to FIG. 17B, for the second type of standard commodity field programmable integrated-circuit (FPIC) chip or chiplet 200, each of the programmable interconnects 361 of its intra-chip interconnects 502 may couple to one or more of its programmable logic blocks (LBs) 201 and/or one or more of its center-processing-unit cores (CPUC) 2010. Each of the non-programmable interconnects 364 of its intra-chip interconnects 502 may couple to one or more of its programmable logic blocks (LBs) 201 and/or one or more of its center-processing-unit cores (CPUC) 2010. One or more of its programmable logic blocks (LBs) 201 may be arranged next to two of its center-processing-unit cores (CPUC) 2010 to provide a smart interface between said two of its center-processing-unit cores (CPUC) 2010, and thereby each of said one or more of its programmable logic blocks (LBs) 201 may perform field programmability and artificial intelligent networking between said two of its center-processing-unit cores (CPUC) 2010. That is, each of said one or more of its programmable logic blocks (LBs) 201 may have the input data set including data passed from a first one of the center-processing-unit cores (CPUC) 2010, such as a left one, next to said each of said one or more of its programmable logic blocks (LBs) 201 through a first path formed by coupling of a first group of the programmable interconnects 361 of its intra-chip interconnects 502 controlled by one or more of its first or second type of field programmable switch cells 379 or formed by coupling of a first group of the non-programmable interconnects 364 of its intra-chip interconnects 502 and may be configured to perform logic operation or computation operation on the input data set thereof into the data output(s) thereof passed to a second one of its center-processing-unit cores (CPUC) 2010, such as a right one, next to said each of said one or more of its programmable logic blocks (LBs) 201 through a second path formed by coupling of a second group of the programmable interconnects 361 of its intra-chip interconnects 502 controlled by another one or more of its first or second type of field programmable switch cells 379 or formed by coupling of a second group of the non-programmable interconnects 364 of its intra-chip interconnects 502, wherein the computation operation may include an addition, subtraction, multiplication or division operation, and the logic operation may include a Boolean operation such as AND, NAND, OR or NOR operation. Further, one or more of the non-programmable interconnects 364 of its intra-chip interconnects 502 may be provided as one or more bypasses coupling the first and second ones of the center-processing-unit cores (CPUC) 2010 to bypass said each of said one or more of its programmable logic blocks (LBs) 201.

Referring to FIG. 17B, the second type of standard commodity field programmable integrated-circuit (FPIC) chip or chiplet 200 may include multiple I/O pads 372 as seen in FIG. 16B each vertically over one of its small input/output (I/O) circuits 203. For example, for one of the small input/output (I/O) circuits 203 of the second type of standard commodity field programmable integrated-circuit (FPIC) chip or chiplet 200, in a first clock cycle its small driver 374 may be enabled by the first data input S_Enable of its small driver 374 and its small receiver 375 may be inhibited by the first data input S_Inhibit of its small receiver 375. Thereby, its small driver 374 may amplify the second data input S_Data_out of its small driver 374, passed from one of the data output(s) of one of the programmable logic blocks (LBs) 201 of the second type of standard commodity field programmable integrated-circuit (FPIC) chip or chiplet 200 or an output data of one of the center-processing-unit cores (CPUC) 2010 of the second type of standard commodity field programmable integrated-circuit (FPIC) chip or chiplet 200, as the data output of its small driver 374 to be transmitted to one of the I/O pads 372 vertically over said one of its small input/output (I/O) circuits 203 for external connection to circuits outside the second type of standard commodity field programmable integrated-circuit (FPIC) chip or chiplet 200.

In a second clock cycle, for said one of the small input/output (I/O) circuits 203 of the second type of standard commodity field programmable integrated-circuit (FPIC) chip or chiplet 200, its small driver 374 may be disabled by the first data input S_Enable of its small driver 374 and its small receiver 375 may be activated by the first data input S_Inhibit of its small receiver 375. Thereby, its small receiver 375 may amplify the second data input of its small receiver 375 transmitted from circuits outside the second type of standard commodity field programmable integrated-circuit (FPIC) chip or chiplet 200 through said one of the I/O pads 372 as the data output S_Data_in of its small receiver 375 to be passed as a data input of the input data set of one of the programmable logic blocks (LBs) 201 of the second type of standard commodity field programmable integrated-circuit (FPIC) chip or chiplet 200 or a data input of one of the center-processing-unit cores (CPUC) 2010 of the second type of standard commodity field programmable integrated-circuit (FPIC) chip or chiplet 200.

Referring to FIG. 17B, the second type of standard commodity field programmable integrated-circuit (FPIC) chip or chiplet 200 may include multiple I/O ports 377 having the number ranging from 2 to 64 for example, such as I/O Port 1, I/O Port 2, I/O Port 3 and I/O Port 4 for this case. Each of the I/O ports 377 may include (1) the small I/O circuits 203 as seen in FIG. 16B having the number ranging from 4 to 256, such as 64 for this case, arranged in parallel for data transmission with bit width ranging from 4 to 256, such as 64 for this case, and (2) the I/O pads 372 as seen in FIG. 16B having the number ranging from 4 to 256, such as 64 for this case, arranged in parallel and vertically over the small I/O circuits 203 respectively.

Referring to FIG. 17B, the second type of standard commodity field programmable integrated-circuit (FPIC) chip or chiplet 200 may further include a chip-enable (CE) pad 209 configured for enabling or disabling the second type of standard commodity field programmable integrated-circuit (FPIC) chip or chiplet 200. For example, when the chip-enable (CE) pad 209 is at a logic level of "0", the second type of standard commodity field programmable integrated-circuit (FPIC) chip or chiplet 200 may be enabled to process data and/or operate with circuits outside of the second type of standard commodity field programmable integrated-circuit (FPIC) chip or chiplet 200; when the chip-enable (CE) pad 209 is at a logic level of "1", the second type of standard commodity field programmable integrated-circuit (FPIC) chip or chiplet 200 may be disabled not to process data and/or operate with circuits outside of the second type of standard commodity field programmable integrated-circuit (FPIC) chip or chiplet 200.

Referring to FIG. 17B, the second type of standard commodity field programmable integrated-circuit (FPIC) chip or chiplet 200 may include multiple input selection (IS) pads 231, e.g., IS1, IS2, IS3 and IS4 pads, each configured to receive data to be passed as the first data input S_Inhibit of the small receiver 375 of each of the small I/O circuits 203 of one of its I/O ports 377, e.g., I/O Port 1, I/O Port 2, I/O Port 3 and I/O Port 4. For more elaboration, the IS1 pad 231 may receive data to be passed as the first data input S_Inhibit of the small receiver 375 of each of the small I/O circuits 203 of its I/O Port 1 through a first one of its small I/O circuits 203; the IS2 pad 231 may receive data to be passed as the first data input S_Inhibit of the small receiver 375 of each of the small I/O circuits 203 of I/O Port 2 through a second one of its small I/O circuits 203; the IS3 pad 231 may receive data to be passed as the first data input S_Inhibit of the small receiver 375 of each of the small I/O circuits 203 of I/O Port 3 through a third one of its small I/O circuits 203; and the IS4 pad 231 may receive data to be passed as the first data input S_Inhibit of the small receiver 375 of each of the small I/O circuits 203 of I/O Port 4 through a fourth one of its small I/O circuits 203. The second type of standard commodity field programmable integrated-circuit (FPIC) chip or chiplet 200 may select, in accordance with logic levels at the input selection (IS) pads 231, e.g., IS1, IS2, IS3 and IS4 pads, one or more from its I/O ports 377, e.g., I/O Port 1, I/O Port 2, I/O Port 3 and I/O Port 4 to pass data for its input operation. For each of the small I/O circuits 203 of one of the I/O ports 377 selected in accordance with the logic level at one of the input selection (IS) pads 231 of the second type of standard commodity field programmable integrated-circuit (FPIC) chip or chiplet 200, its small receiver 375 may be activated by the first data input S_Inhibit of its small receiver 375 associated with the logic level at said one of the input selection (IS) pads 231 of the second type of standard commodity field programmable integrated-circuit (FPIC) chip or chiplet 200 to amplify or pass the second data input of its small receiver 375, transmitted from a data path of one of data buses 315 as illustrated in FIG. 22 outside the second type of standard commodity field programmable integrated-circuit (FPIC) chip or chiplet 200 through one of the I/O pads 372 of said one of the I/O ports 377 selected in accordance with the logic level at said one of the input selection (IS) pads 231 of the second type of standard commodity field programmable integrated-circuit (FPIC) chip or chiplet 200, as the data output S_Data_in of its small receiver 375 to be passed as a data input of the input data set of one of the programmable logic blocks (LBs) 201 of the second type of standard commodity field programmable integrated-circuit (FPIC) chip or chiplet 200 or a data input of one of the center-processing-unit cores (CPUC) 2010 of the standard commodity field programmable integrated-circuit (FPIC) chip 200 through one or more of the programmable interconnects 361 of the intra-chip interconnects 502 of the second type of standard commodity field programmable integrated-circuit (FPIC) chip or chiplet 200, for example. For each of the small I/O circuits 203 of the other one or more of the I/O ports 377, not selected in accordance with the logic level at the other(s) of the input selection (IS) pads 231, of the second type of standard commodity field programmable integrated-circuit (FPIC) chip or chiplet 200, its small receiver 375 may be inhibited by the first data input S_Inhibit of its small receiver 375 associated with the logic level at one of the other(s) of the input selection (IS) pads 231.

For example, referring to FIG. 17B, provided that the second type of standard commodity field programmable integrated-circuit (FPIC) chip or chiplet 200 may have (1) the chip-enable (CE) pad 209 at a logic level of "0", (2) the IS1 pad 231 at a logic level of "1", (3) the IS2 pad 231 at a logic level of "0", (4) the IS3 pad 231 at a logic level of "0" and (5) the IS4 pad 231 at a logic level of "0", the second type of standard commodity field programmable integrated-circuit (FPIC) chip or chiplet 200 may be enabled in accordance with the logic level at its chip-enable (CE) pad 209 and may select, in accordance with the logic levels at its IS1, IS2, IS3 and IS4 pads 231, one or more I/O port, i.e., I/O Port 1, from its I/O ports 377, i.e., I/O Port 1, I/O Port 2, I/O Port 3 and I/O Port 4, to pass data for the input operation. For each of the small I/O circuits 203 of the selected I/O port 377, i.e., I/O Port 1, of the second type of standard commodity field programmable integrated-circuit (FPIC) chip or chiplet 200, its small receiver 375 may be activated by the first data input S_Inhibit of its small receiver 375 associated with the logic level at the IS1 pad 231 of the second type of standard commodity field programmable integrated-circuit (FPIC) chip or chiplet 200. For each of the small I/O circuits 203 of the unselected I/O ports, i.e., I/O Port 2, I/O Port 3 and I/O Port 4, of the second type of standard commodity field programmable integrated-circuit (FPIC) chip or chiplet 200, its small receiver 375 may be inhibited by the first data input S_Inhibit of its small receiver 375 associated respectively with the logic levels at the IS2, IS3 and IS4 pads 231 of the second type of standard commodity field programmable integrated-circuit (FPIC) chip or chiplet 200.

For example, referring to FIG. 17B, provided that the second type of standard commodity field programmable integrated-circuit (FPIC) chip or chiplet 200 may have (1) the chip-enable (CE) pad 209 at a logic level of "0", (2) the IS1 pad 231 at a logic level of "1", (3) the IS2 pad 231 at a logic level of "1", (4) the IS3 pad 231 at a logic level of "1" and (5) the IS4 pad 231 at a logic level of "1", the second type of standard commodity field programmable integrated-circuit (FPIC) chip or chiplet 200 may be enabled in accordance with the logic level at its chip-enable (CE) pad 209 and may select, in accordance with the logic levels at its IS1, IS2, IS3 and IS4 pads 231, all from its I/O ports 377, i.e., I/O Port 1, I/O Port 2, I/O Port 3 and I/O Port 4, to pass data for the input operation at the same clock cycle. For each of the small I/O circuits 203 of the selected I/O ports 377, i.e., I/O Port 1, I/O Port 2, I/O Port 3 and I/O Port 4, of the second type of standard commodity field programmable integrated-circuit (FPIC) chip or chiplet 200, its small receiver 375 may be activated by the first data input S_Inhibit of its small receiver 375 associated respectively with the logic levels at the IS1, IS2, IS3 and IS4 pads 231 of the second type of standard commodity field programmable integrated-circuit (FPIC) chip or chiplet 200.

Referring to FIG. 17B, the second type of standard commodity field programmable integrated-circuit (FPIC) chip or chiplet 200 may include multiple output selection (OS) pads 232, e.g., OS1, OS2, OS3 and OS4 pads, each configured to receive data to be passed as the first data input S_Enable of the small driver 374 of each of the small I/O circuits 203 of one of its I/O ports 377, e.g., I/O Port 1, I/O Port 2, I/O Port 3 and I/O Port 4. For more elaboration, the OS1 pad 232 may receive data to be passed as the first data input S_Enable of the small driver 374 of each of the small I/O circuits 203 of I/O Port 1 through a fifth one of its small I/O circuits 203; the OS2 pad 232 may receive data to be passed as the first data input S_Enable of the small driver 374 of each of the small I/O circuits 203 of I/O Port 2 through a sixth one of its small I/O circuits 203; the OS3 pad 232 may receive data to be passed as the first data input S_Enable of the small driver 374 of each of the small I/O circuits 203 of I/O Port 3 through a seventh one of its small I/O circuits 203; the OS4 pad 232 may receive data to be passed as the first data input S_Enable of the small driver 374 of each of the small I/O circuits 203 of I/O Port 4 through an eighth one of its small I/O circuits 203. The second type of standard commodity field programmable integrated-circuit (FPIC) chip or chiplet 200 may select, in accordance with logic levels at the output selection (OS) pads 232, e.g., OS1, OS2, OS3 and OS4 pads, one or more from its I/O ports 377, e.g., I/O Port 1, I/O Port 2, I/O Port 3 and I/O Port 4 to pass data for its output operation. For each of the small I/O circuits 203 of each of the one or more I/O ports 377 selected in accordance with the logic levels at the output selection (OS) pads 232, its small driver 374 may be enabled by the first data input S_Enable of its small driver 374 associated with the logic level at one of the output selection (OS) pads 232 to amplify or pass the second data input S_Data_out of its small driver 374, associated with the data output(s) of one of the programmable logic blocks (LBs) 201 of the second type of standard commodity field programmable integrated-circuit (FPIC) chip or chiplet 200 or an data output of one of the center-processing-unit cores (CPUC) 2010 of the second type of standard commodity field programmable integrated-circuit (FPIC) chip or chiplet 200, as the data output of its small driver 374 to be transmitted to a data path of one of data buses 315 as illustrated in FIG. 22 outside the second type of standard commodity field programmable integrated-circuit (FPIC) chip or chiplet 200 through one of the I/O pads 372 of said each of the one or more I/O ports 377, for example. For each of the small I/O circuits 203 of each of the I/O ports 377, not selected in accordance with in accordance with the logic levels at the output selection (OS) pads 232, of the second type of standard commodity field programmable integrated-circuit (FPIC) chip or chiplet 200, its small driver 374 may be disabled by the first data input S_Enable of its small driver 374 associated with the logic level at one of the output selection (OS) pads 232.

For example, referring to FIG. 17B, provided that the second type of standard commodity field programmable integrated-circuit (FPIC) chip or chiplet 200 may have (1) the chip-enable (CE) pad 209 at a logic level of "0", (2) the OS1 pad 232 at a logic level of "0", (3) the OS2 pad 232 at a logic level of "1", (4) the OS3 pad 232 at a logic level of "1" and (5) the OS4 pad 232 at a logic level of "1", the second type of standard commodity field programmable integrated-circuit (FPIC) chip or chiplet 200 may be enabled in accordance with the logic level at its chip-enable (CE) pad 209 and may select, in accordance with the logic levels at its OS1, OS2, OS3 and OS4 pads 232, one or more I/O port, i.e., I/O Port 1, from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1, of the second type of standard commodity field programmable integrated-circuit (FPIC) chip or chiplet 200, its small driver 374 may be enabled by the first data input S_Enable of its small driver 374 associated with the logic level at the OS1 pad 232 of the second type of standard commodity field programmable integrated-circuit (FPIC) chip or chiplet 200. For each of the small I/O circuits 203 of the unselected I/O ports, i.e., I/O Port 2, I/O Port 3 and I/O Port 4, of the second type of standard commodity field programmable integrated-circuit (FPIC) chip or chiplet 200, its small driver 374 may be disabled by the first data input S_Enable of its small driver 374 associated respectively with the logic levels at the OS2, OS3 and OS4 pads 232 of the second type of standard commodity field programmable integrated-circuit (FPIC) chip or chiplet 200.

For example, referring to FIG. 17B, provided that the second type of standard commodity field programmable integrated-circuit (FPIC) chip or chiplet 200 may have (1) the chip-enable (CE) pad 209 at a logic level of "0", (2) the OS1 pad 232 at a logic level of "0", (3) the OS2 pad 232 at a logic level of "0", (4) the OS3 pad 232 at a logic level of "0" and (5) the OS4 pad 232 at a logic level of "0", the second type of standard commodity field programmable integrated-circuit (FPIC) chip or chiplet 200 may be enabled in accordance with the logic level at its chip-enable (CE) pad 209 and may select, in accordance with the logic levels at its OS1, OS2, OS3 and OS4 pads 232, all from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1, I/O Port 2, I/O Port 3 and I/O Port 4, of the second type of standard commodity field programmable integrated-circuit (FPIC) chip or chiplet 200, its small driver 374 may be enabled by the first data input S_Enable of its small driver 374 associated respectively with the logic levels at the OS1, OS2, OS3 and OS4 pads 232 of the second type of standard commodity field programmable integrated-circuit (FPIC) chip or chiplet 200.

Thereby, referring to FIG. 17B, for the second type of standard commodity field programmable integrated-circuit (FPIC) chip or chiplet 200, in a clock cycle one or more of its I/O ports 377, e.g., I/O Port 1, I/O Port 2, I/O Port 3 and I/O Port 4, may be selected, in accordance with the logic levels at its IS1, IS2, IS3 and IS4 pads 231, to pass data for the input operation, while another one or more of its I/O ports 377, e.g., I/O Port 1, I/O Port 2, I/O Port 3 and I/O Port 4, may be selected, in accordance with the logic levels at its OS1, OS2, OS3 and OS4 pads 232, to pass data for the output operation. Its input selection (IS) pads 231 and output selection (OS) pads 232 may be provided as its I/O-port selection pads.

Referring to FIG. 17B, the second type of standard commodity field programmable integrated-circuit (FPIC) chip or chiplet 200 may further include (1) multiple power pads 205 for applying the voltage Vcc of power supply to its programmable logic blocks (LBs) 201, center-processing-unit cores (CPUC) 2010 and first or second type of field programmable switch cells 379 through one or more of the non-programmable interconnects 364 of its intra-chip interconnects 502 and to the small drivers 374 and receivers 375 of its small I/O circuits 203 through one or more of the non-programmable interconnects 364 of its intra-chip interconnects 502, wherein the voltage Vcc of power supply may be between 0.2V and 2.5V, between 0.2V and 2V, between 0.2V and 1.5V, between 0.1V and 1V, between 0.2V and 1V or between 0.1V and 0.5V, or, smaller or lower than or equal to 2.5V, 2V, 1.8V, 1.5V, 1V or 0.5V, and (2) multiple ground pads 206 configured for providing the voltage Vss of ground reference to its programmable logic blocks (LBs) 201, center-processing-unit cores (CPUC) 2010 and first or second type of field programmable switch cells 379 through one or more of the non-programmable interconnects 364 of its intra-chip interconnects 502 and to the small drivers 374 and receivers 375 of its small I/O circuits 203 through one or more of the non-programmable interconnects 364 of its intra-chip interconnects 502.

Referring to FIG. 17B, the second type of standard commodity field programmable integrated-circuit (FPIC) chip or chiplet 200 may further include a clock pad (CLK) 229 configured to receive a clock signal elk from circuits outside of the second type of standard commodity field programmable integrated-circuit (FPIC) chip or chiplet 200 and multiple control pads (CP) 378 configured to receive control commands to control the second type of standard commodity field programmable integrated-circuit (FPIC)

chip or chiplet 200. In an example, the clock signal clk may be passed to the D-type flip-flop circuit 2034 or 2039 of each of its programmable logic blocks (LBs) 201, i.e., field programmable logic cells or elements (LCEs) 2014 as illustrated in FIGS. 2B and 2C.

Referring to FIG. 17B, for the second type of standard commodity field programmable integrated-circuit (FPIC) chip or chiplet 200, its programmable logic blocks (LBs) 201 may be reconfigurable for artificial-intelligence (AI) application. For example, in a clock cycle, one of its programmable logic blocks (LBs) 201 may be programmed to perform OR operation; however, after one or more events happen, in another clock cycle said one of its programmable logic blocks (LBs) 201 may be programmed to perform NAND operation for better AI performance.

Referring to FIG. 17B, the second type of standard commodity field programmable integrated-circuit (FPIC) chip or chiplet 200 may be designed, implemented and fabricated using an advanced semiconductor technology node or generation more advanced than or equal to, or below or equal to, 30 nm, 20 nm or 10 nm for example. The second type of standard commodity field programmable integrated-circuit (FPIC) chip or chiplet 200 may have an area between 400 $mm^2$ and 9 $mm^2$, 225 $mm^2$ and 9 $mm^2$, 144 $mm^2$ and 16 $mm^2$, 100 $mm^2$ and 16 $mm^2$, 75 $mm^2$ and 16 $mm^2$, or 50 $mm^2$ and 16 $mm^2$. Transistors or semiconductor devices of the second type of standard commodity field programmable integrated-circuit (FPIC) chip or chiplet 200 used in an advanced semiconductor technology node or generation may be fin field-effect transistors (FINFETs), gate-all-around field-effect transistors (GAAFETs), FINFETs on silicon-on-insulator (FINFETs SOI), GAAFETs on silicon-on-insulator (GAAFETs SOI), fully depleted silicon-on-insulator (FDSOI) metal-oxide-semiconductor field-effect transistors (MOSFETs), partially depleted silicon-on-insulator (PDSOI) MOSFETs or planar MOSFETs.

Figure 18:
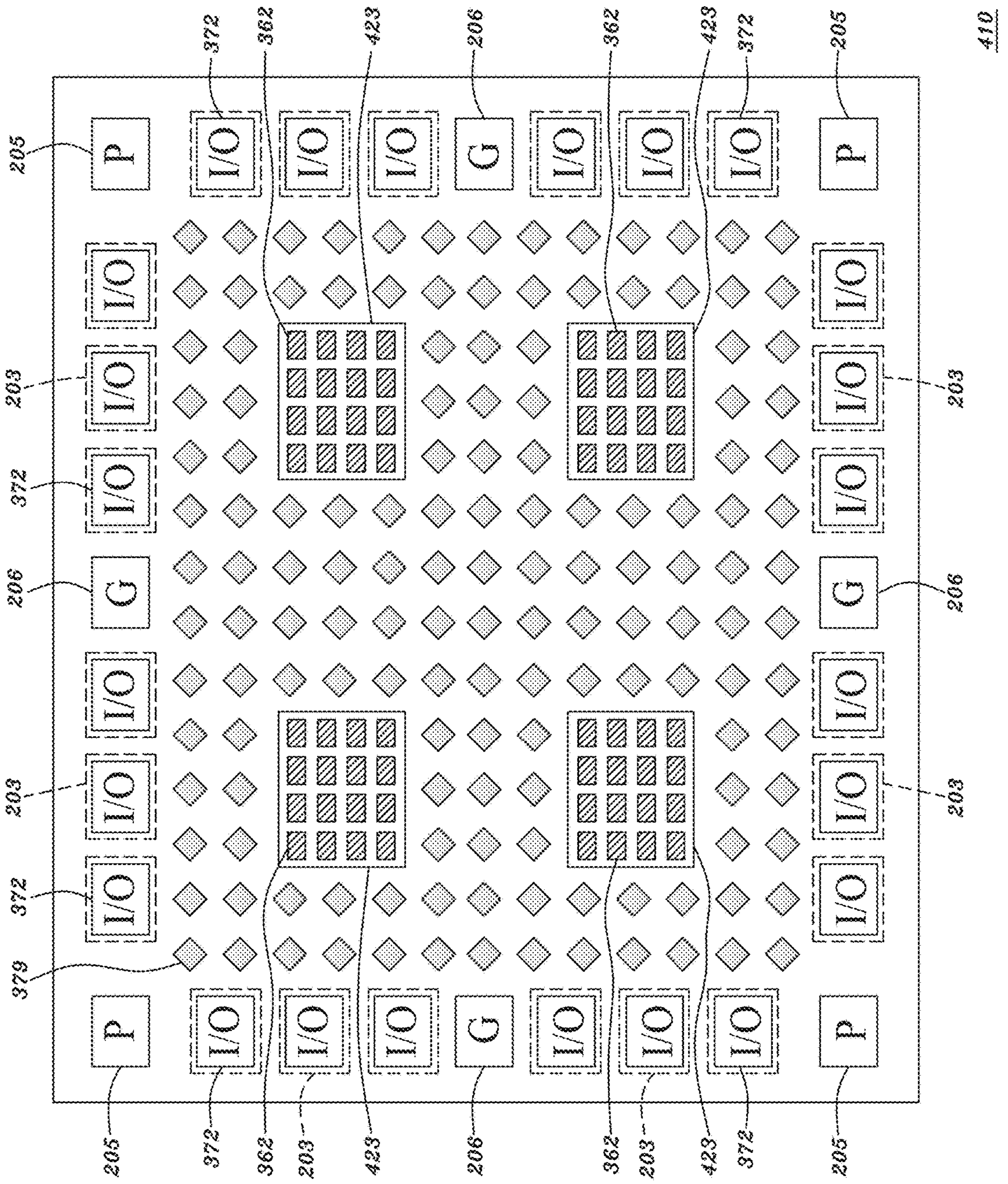
FIG. 18 is a schematically top view showing a block diagram of a dedicated programmable interconnection (DPI) integrated-circuit (IC) chip in accordance with an embodiment of the present application.

Specification for Dedicated Programmable Interconnection (DPI) Integrated-Circuit (IC) Chip FIG. 18 is a schematically top view showing a block diagram of a dedicated programmable interconnection (DPI) integrated-circuit (IC) chip in accordance with an embodiment of the present application. Referring to FIG. 18, a DPIIC chip 410 may include (1) a plurality of memory-array blocks 423 arranged in an array in a central region thereof, wherein each of the memory-array blocks 423 may include the memory cells 362 of the first type of field programmable switch cells 379 as illustrated in FIG. 3A and/or the four sets of memory cells 362 of the second type of field programmable switch cells 379 as illustrated in FIG. 3B arranged in an array, (2) a plurality of groups of the pass/no-pass switch 292 of the first type of field programmable switch cells 379 as illustrated in FIG. 3A and/or a plurality of groups of the four selection circuits 211 and four pass/no-pass switch 292 of the second type of field programmable switch cells 379 as illustrated in FIG. 3B, each group of which is arranged in one or more rings around one of the memory-array blocks 423, wherein the memory cells 362 of each of its first type of field programmable switch cells 379 in one of its memory-array blocks 423 is configured to be programmed to control the pass/no-pass switch 292 of said each of its first type of field programmable switch cells 379 around said one of its memory-array blocks 423, (3) a plurality of intra-chip interconnects including the programmable interconnects 361 as illustrated in FIGS. 3A and 3B configured to be programmed for interconnection by its first or second type of field programmable switch cells 379 and multiple non-programmable interconnects each for passing the programming codes to one of the memory cells 362 of one of its first or second type of field programmable switch cells 379 to be stored therein, and (4) a plurality of small input/output (I/O) circuits 203 as illustrated in FIG. 16B each providing the small receiver 375 with the data output S_Data_in associated with a data input at one of the nodes N21 and N22 of one of its first type of field programmable switch cells 379 or a data input at one of the nodes N23-N26 of one of its second type of field programmable switch cells 379 through one or more of the programmable interconnects 361 of its intra-chip interconnects and providing the small driver 374 with the data input S_Data_out associated with a data output at one of the nodes N21 and N22 of another of its first type of field programmable switch cells 379 or a data output at one of the nodes N23-N26 of another of its second type of field programmable switch cells 379 through one or more of the programmable interconnects 361 of its intra-chip interconnects.

Referring to FIG. 18, the DPIIC chip 410 may include multiple of the I/O pads 372 as seen in FIG. 16B, each vertically over one of its small input/output (I/O) circuits 203, coupling to the node 381 of said one of its small input/output (I/O) circuits 203. For the DPIIC chip 410, in a first clock cycle data from one of the nodes N21 and N22 of one of its first type of field programmable switch cells 379 or one of the nodes N23-N26 of one of its second type of field programmable switch cells 379 may be associated with the second data input S_Data_out of the small driver 374 of one of its small input/output (I/O) circuits 203 through one or more of the programmable interconnects 361 of its intra-chip interconnects programmed by said one of its first type of field programmable switch cells 379 or said one of its second type of field programmable switch cells 379, and then the small driver 374 of said one of its small input/output (I/O) circuits 203 may amplify or pass the second data input S_Data_out of the small driver 374 of said one of its small input/output (I/O) circuits 203 into the data output of the small driver 374 of said one of its small input/output (I/O) circuits 203 to be transmitted to one of its I/O pads 372 vertically over said one of its small input/output (I/O) circuits 203 for external connection to circuits outside the DPIIC chip 410. In a second clock cycle, data from circuits outside the DPIIC chip 410 may be associated with the second data input of the small receiver 375 of said one of its small input/output (I/O) circuits 203 through said one of its I/O pads 372, and then the small receiver 375 of said one of its small input/output (I/O) circuits 203 may amplify or pass the second data input of the small receiver 375 of said one of its small input/output (I/O) circuits 203 into the data output S_Data_in of the small receiver 375 of said one of its small input/output (I/O) circuits 203 to be passed to one of the nodes N21 and N22 of another of its first type of field programmable switch cells 379 or one of the nodes N23-N26 of another of its second type of field programmable switch cells 379 through another one or more of the programmable interconnects 361 of its intra-chip interconnects programmed by said another of its first type of field programmable switch cells 379 or said another of its second type of field programmable switch cells 379.

Referring to FIG. 18, the DPIIC chip 410 may further include (1) multiple power pads 205 for applying the voltage Vcc of power supply to its first or second type of field programmable switch cells 379 through one or more of the non-programmable interconnects of its intra-chip interconnects and to the small drivers 374 and receivers 375 of its small I/O circuits 203 through one or more of the non-programmable interconnects of its intra-chip interconnects, wherein the voltage Vcc of power supply may be between 0.2V and 2.5V, between 0.2V and 2V, between 0.2V and 1.5V, between 0.1V and 1V, between 0.2V and 1V or between 0.1V and 0.5V, or, smaller or lower than or equal to 2.5V, 2V, 1.8V, 1.5V, 1V or 0.5V, and (2) multiple ground pads 206 for providing the voltage Vss of ground reference to its first or second type of field programmable switch cells 379 through one or more of the non-programmable interconnects of its intra-chip interconnects and to the small drivers 374 and receivers 375 of its small I/O circuits 203 through one or more of the non-programmable interconnects of its intra-chip interconnects.

Referring to FIG. 18, the DPIIC chip 410 may further include multiple volatile storage units, such as the first type of SRAM cells 398 as illustrated in FIG. 1A, used as cache memory for data latch or storage. Each of its volatile storage units may include the two switches 449, such as N-type or P-type MOS transistors, for bit and bit-bar data transfer, and two pairs of P-type and N-type MOS transistors 447 and 448 for data latch or storage nodes. For each of the volatile storage units acting as the cache memory of the DPIIC chip 410, its two switches 449 may perform control of writing data into its memory cell 446 and reading data stored in its memory cell 446. The DPIIC chip 410 may further include a sense amplifier for reading, amplifying or detecting data from the memory cells 446 of its volatile storage units.

Referring to FIG. 18, the dedicated programmable interconnection (DPI) integrated-circuit (IC) chip 410 may be designed, implemented and fabricated using an advanced semiconductor technology node or generation more advanced than or equal to, or below or equal to, 30 nm, 20 nm or 10 nm for example. The DPIIC chip 410 may have an area between 400 $mm^2$ and 9 $mm^2$, 225 $mm^2$ and 9 $mm^2$, 144 $mm^2$ and 16 $mm^2$, 100 $mm^2$ and 16 $mm^2$, 75 $mm^2$ and 16 $mm^2$, or 50 $mm^2$ and 16 $mm^2$. Transistors or semiconductor devices of the DPIIC chip 410 used in an advanced semiconductor technology node or generation may be fin field-effect transistors (FINFETs), gate-all-around field-effect transistors (GAAFETs), FINFETs on silicon-on-insulator (FINFETs SOI), GAAFETs on silicon-on-insulator (GAAFETs SOI), fully depleted silicon-on-insulator (FDSOI) metal-oxide-semiconductor field-effect transistors (MOSFETs), partially depleted silicon-on-insulator (PDSOI) MOSFETs or planar MOSFETs.

Specification for First Type of Standard Commodity Logic Drive

Figure 19A:
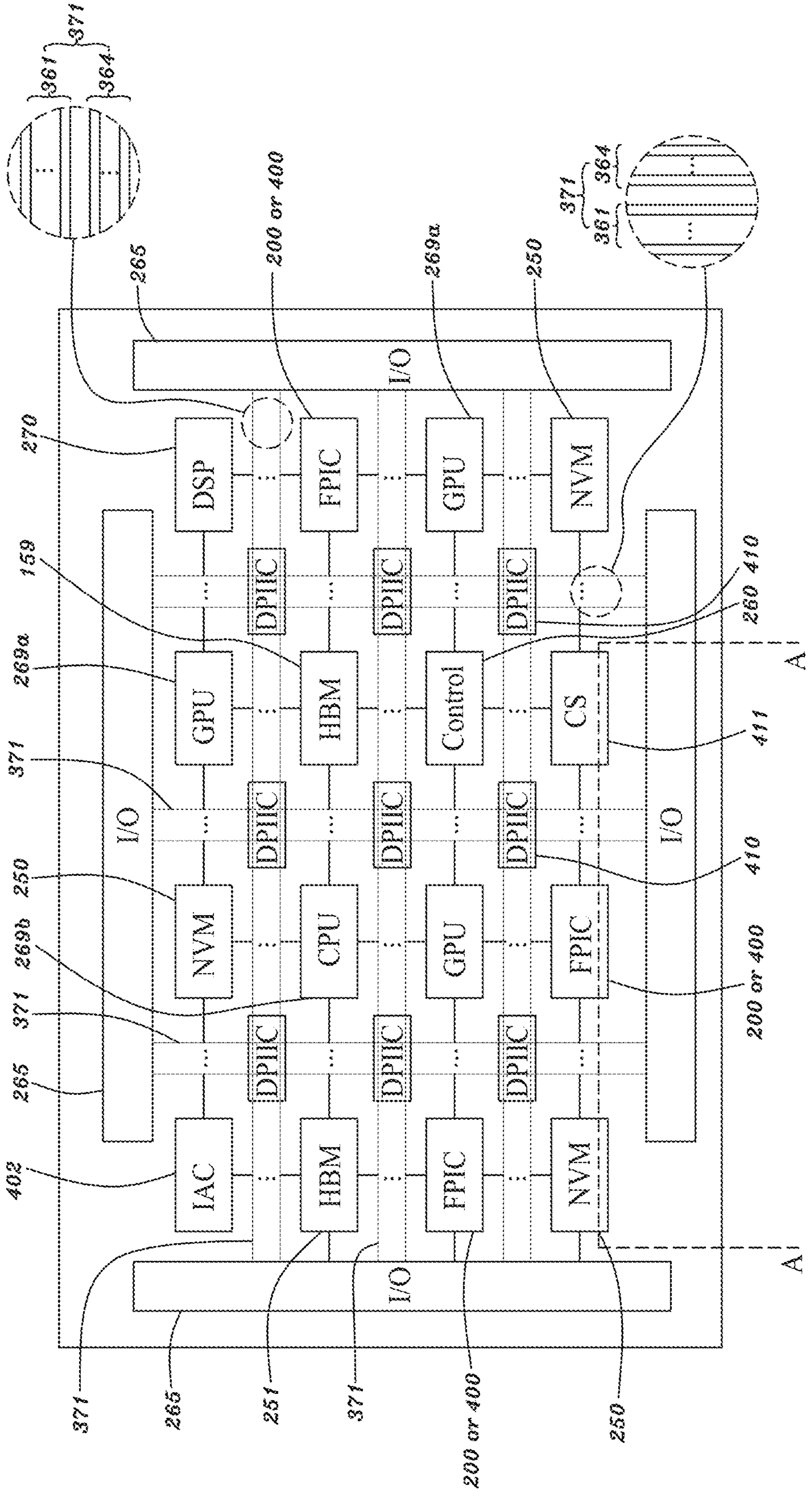
FIG. 19A is a schematically top view showing arrangement for various chips packaged in a first type of standard commodity logic drive in accordance with an embodiment of the present application.
Figure 27A:
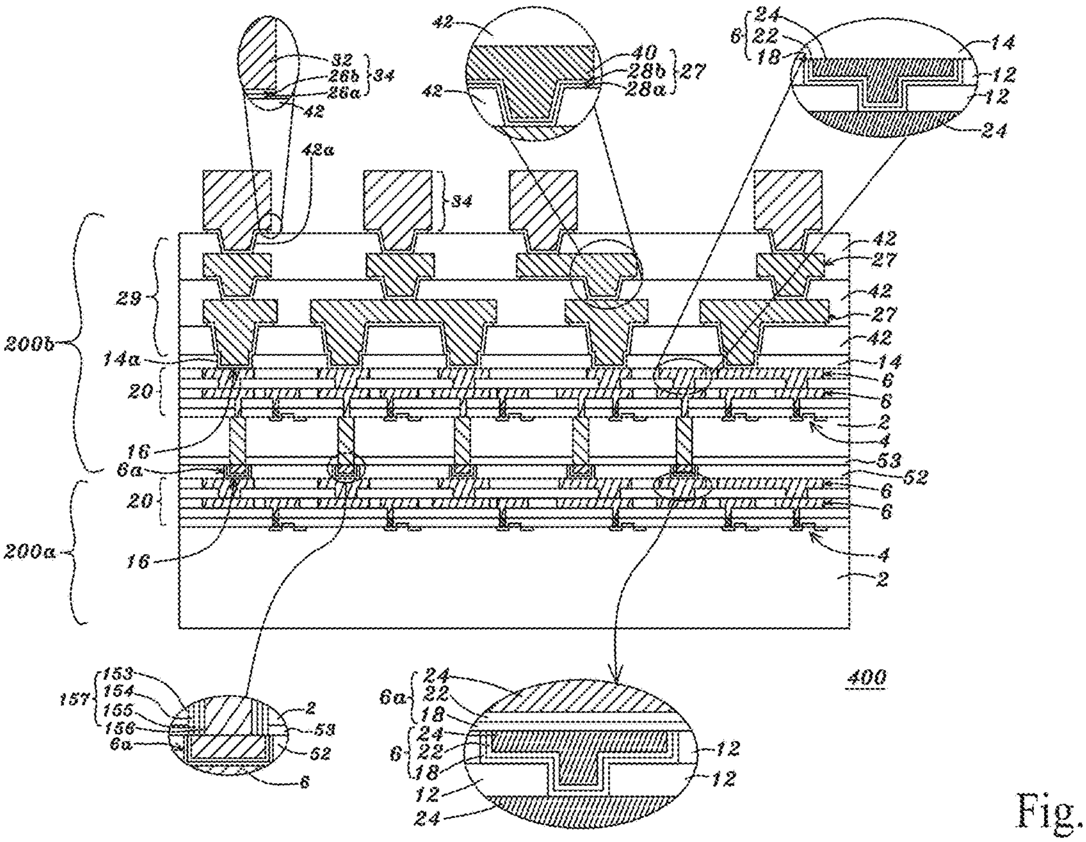
FIGS. 27A-27F are schematically cross-sectional views showing various types of field programmable chip-on-chip modules in accordance with an embodiment of the present application.
Figure 27B:
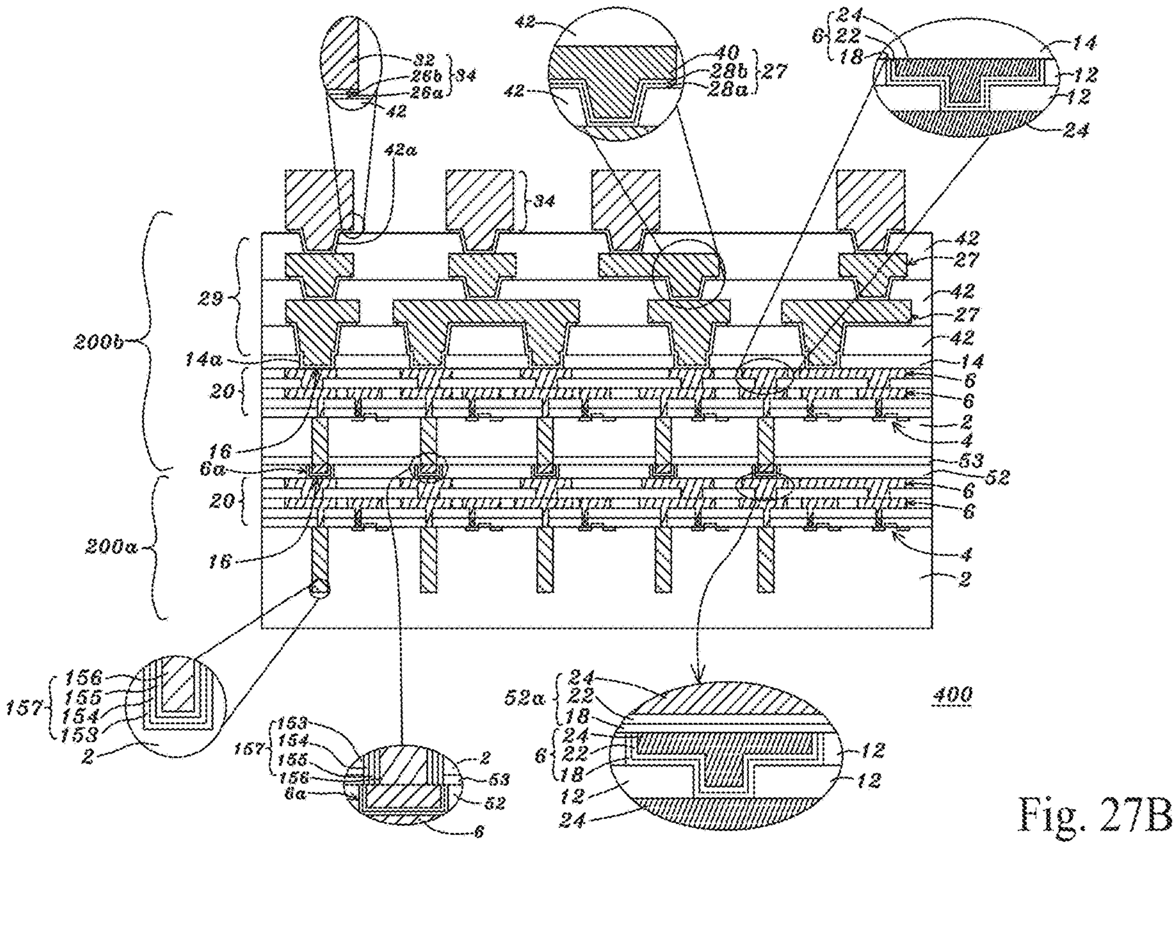
Figure 27C:
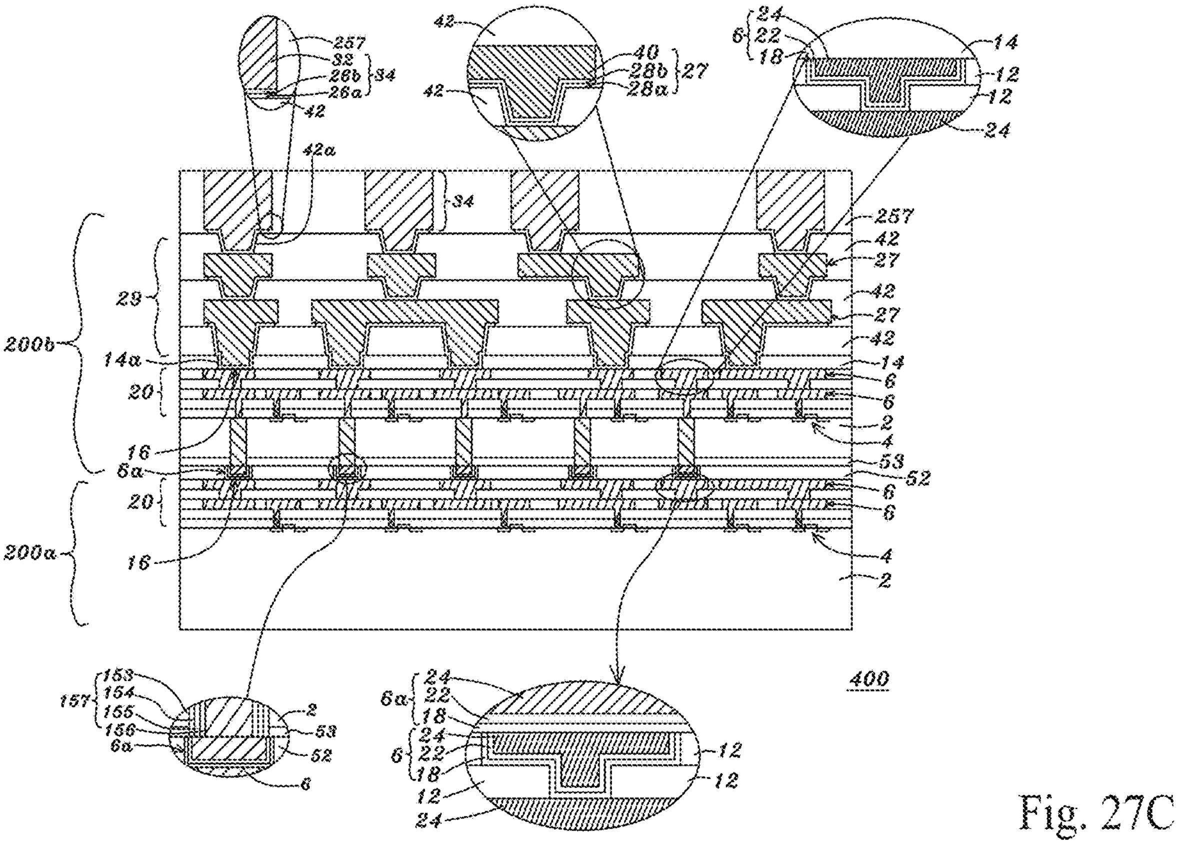

FIG. 19A is a schematically top view showing arrangement for various chips packaged in a first type of standard commodity logic drive in accordance with an embodiment of the present application. Referring to FIG. 30A, a first type of standard commodity logic drive 300 may be packaged with multiple logic integrated-circuit (IC) chips, including multiple graphic-processing unit (GPU) integrated-circuit (IC) chips 269*a*, i.e., data-processing-unit (DPU) integrated-circuit (IC) chips, a central-processing-unit (CPU) integrated-circuit (IC) chip 269*b*, a digital-signal-processing (DSP) integrated-circuit (IC) chip 270 and three standard commodity field programmable integrated-circuit (FPIC) chips or chiplets 200, wherein each of its three standard commodity field programmable integrated-circuit (FPIC) chips or chiplets 200 may have the same structure and specification as that illustrated in FIGS. 17A or 17B. Alternatively, its digital-signal-processing (DSP) integrated-circuit (IC) chip 270 may be replaced with a tensor-flow-processing-unit (TPU) integrated-circuit (IC) chip, micro-control-unit (MCU) integrated-circuit (IC) chip, artificial-intelligent-unit (AIU) integrated-circuit (IC) chip, machine-learning-unit (MLU) integrated-circuit (IC) chip, application-specific-integrated-circuit (ASIC) chip, data-processing-unit (DPU) integrated-circuit (IC) chip or application-processing-unit (APU) integrated-circuit (IC) chip. Further, the first type of standard commodity logic drive 300 may be packaged with multiple high-bandwidth-memory (HBM) integrated-circuit (IC) chips 251 each arranged next to one of its GPU IC chips 269*a*, CPU IC chip 269*b* and field programmable integrated-circuit (FPIC) chips or chiplets 200 for communication with said one of its GPU IC chips 269*a*, CPU IC chip 269*b* and field programmable integrated-circuit (FPIC) chips or chiplets 200 in a high speed, high bandwidth and wide bitwidth of greater than 64 or 256, for example. For the first type of standard commodity logic drive 300, any of its three field programmable integrated-circuit (FPIC) chips or chiplets 200 may be a fined-grained (FG) field-programmable-gate-array (FPGA) integrated-circuit (IC) chip as illustrated in FIGS. 27A-27C, another any of its three field programmable integrated-circuit (FPIC) chips or chiplets 200 may be a coarse-grained reconfigurable architecture (CGRA) integrated-circuit (IC) chip, and the any other of its three field programmable integrated-circuit (FPIC) chips or chiplets 200 may be a coarse-grained field programmable (CGFP) integrated-circuit (IC) chip. Each of its HBM IC chips 251 may be a high speed, high bandwidth, wide bitwidth dynamic-random-access-memory (DRAM) IC chip, high speed, high bandwidth, wide bitwidth cache static-random-access-memory (SRAM) chip, high speed, high bandwidth, wide bitwidth magnetoresistive random-access-memory (MRAM) chip or high speed, high bandwidth, wide bitwidth resistive random-access-memory (RRAM) chip. The first type of standard commodity logic drive 300 may be further packaged with one or more of non-volatile memory (NVM) IC chips 250, such as NAND or NOR flash memory IC chip, MRAM IC chip, RRAM IC chip or FRAM IC chip, wherein each of its non-volatile memory (NVM) integrated-circuit (IC) chips 250 may include NAND flash memory cells, NOR flash memory cells, magnetoresistive random access memory (MRAM) cells, resistive random access memory (RRAM) cells or ferroelectric random access memory (FRAM) cells, configured to store data-information-memory (DIM) data from data-information-memory (DIM) cells of each of its HBM IC chips 251, wherein each of the ferroelectric random access memory (FRAM) cells of said each of its non-volatile memory (NVM) integrated-circuit (IC) chips 250 may include two electrodes and a thin ferroelectric film made of lead zirconate titanate (PZT) between the two electrodes thereof. The first type of standard commodity logic drive 300 may be further packaged with an innovated application-specific-IC (ASIC) or customer-owned-tooling (COT) (abbreviated as IAC below) chip 402 for intellectual-property (IP) circuits, application-specific (AS) circuits, analog circuits, mixed-mode signal circuits, radio-frequency (RF) circuits, and/or transmitter, receiver or transceiver circuits, etc. The first type of standard commodity logic drive 300 may be further packaged with a dedicated control and input/output (I/O) chip 260, or dedicated control chip, to control data transmission between any two of its CPU IC chip 269*b*, DSP chip 270, standard commodity field programmable integrated-circuit (FPIC) chips or chiplets 200, GPU IC chips 269*a*, NVM IC chips 250, IAC chip 402 and HBM IC chips 251.

Figure 20:
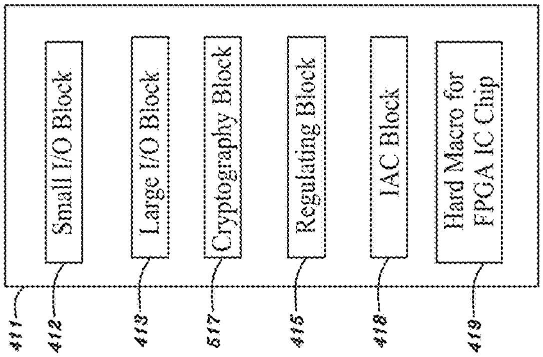
FIG. 20 is a schematically top view showing a block diagram of a cooperating and supporting (CS) integrated-circuit (IC) chip in accordance with an embodiment of the present application.

Referring to FIG. 19A, the first type of standard commodity logic drive 300 may be further packaged with a cooperating and supporting (CS) integrated-circuit (IC) chip 411 for performing the following functions. FIG. 20 is a schematically top view showing a block diagram of a cooperating and supporting (CS) integrated-circuit (IC) chip in accordance with an embodiment of the present application. Referring to FIGS. 19A and 20, for the first type of standard commodity logic drive 300, its cooperating and supporting (CS) integrated-circuit (IC) chip 411 may include one, more or all of the following circuit blocks: (1) a large-input/output (I/O) block 412 configured for various input/output (I/O) formats or protocols such as Ethernet, peripheral component interconnect express (PCIe), serial-advanced-technology-attachment (SATA), universal chiplet interconnect express (UCIe), universal serial bus (USB) or Thunderbolt, each having a plurality of large input/output (I/O) circuits 341 as illustrated in FIG. 16A configured to couple to its non-volatile memory (NVM) integrated-circuit (IC) chips 250 for data transmission between its cooperating and supporting (CS) integrated-circuit (IC) chip 411 and any of its non-volatile memory (NVM) integrated-circuit (IC) chips 250, (2) a small-input/output (I/O) block 413 having a plurality of small input/output (I/O) circuits 203 as illustrated in FIG. 16B configured to couple to its logic integrated-circuit (IC) chip, such as its standard commodity field programmable integrated-circuit (FPIC) chip 200, central-processing-unit (CPU) integrated-circuit (IC) chip 269*b*, graphic-processing-unit (GPU) integrated-circuit (IC) chip 269*a* or digital-signal-processing (DSP) integrated-circuit (IC) chip 270, for data transmission between its cooperating and supporting (CS) integrated-circuit (IC) chip 411 and any of its logic integrated-circuit (IC) chip, (3) a cryptography block 517 configured to decrypt encrypted data from any of its non-volatile memory (NVM) integrated-circuit (IC) chips 250 as decrypted data to be passed to any of its logic integrated-circuit (IC) chips and to encrypt data from any of its logic integrated-circuit (IC) chips as encrypted data to be passed to either of its non-volatile memory (NVM) integrated-circuit (IC) chips 250 to be stored therein, (4) a regulating block 415 configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to any of its logic integrated-circuit (IC) chips, (5) an innovated application-specific-integrated-circuit (ASIC) or customer-owned tooling (COT) block 418, i.e., IAC block, configured to implement intellectual-property (IP) circuits, application-specific (AS) circuits, analog circuits, mixed-mode signal circuits, radio-frequency (RF) circuits, and/or transmitter, receiver, transceiver circuits for customers, and (6) multiple hard macros 419 for any of its field programmable integrated-circuit (FPIC) chips or chiplets 200, wherein each of the hard macros 419 of its cooperating and supporting (CS) integrated-circuit (IC) chip 411 may be a digital-signal-processing (DSP) slice for multiplication or division, block random-access memory (RAM) cells for logic operation, central-processing unit (CPU) cores, intellectual property (IP) cores, floating-point calculator, machine-learning-processing (MLP) circuit, central-processing-unit (CPU) circuit, graphic-processing-unit (GPU) circuit, data-processing-unit (DPU) circuit, and/or application-processing-unit (APU) circuit, having output data coupling to the input data set of a first one of the programmable logic blocks (LBs) 201 of any of its standard commodity field programmable integrated-circuit (FPIC) chips or chiplets 200 through one or more of the first or second type of field programmable switch cells 379 of said any of its field programmable integrated-circuit (FPIC) chips or chiplets 200 or having input data associated with the data output of a second one of the programmable logic blocks (LBs) 201 of said any of its standard commodity field programmable integrated-circuit (FPIC) chips or chiplets 200 through one or more of the first or second type of field programmable switch cells 379 of said any of its field programmable integrated-circuit (FPIC) chips or chiplets 200. The central-processing-unit (CPU) cores of said each of the hard macros 419 of its cooperating and supporting (CS) integrated-circuit (IC) chip 411 may be ARM Cortex processor/controller cores based on a reduced instruction set computing (RISC) architecture or x86 central-processing-unit (CPU) cores based on complex instruction set computing (CISC) architecture, wherein the ARM Cortex processor/controller cores may be 8-bit, 16-bit, 32-bit, 64-bit or more-than-64-bit reduced-instruction-set-computing (RISC) ARM processor/controller cores licensed from ARM Holdings. Alternatively, the hard macros 419 of its cooperating and supporting (CS) integrated-circuit (IC) chip 411 may be a phase locked loop (PLL) circuit or digital clock manager (DCM) configured to generate a clock signal to be passed to any of its field programmable integrated-circuit (FPIC) chips or chiplets 200 and may be targeted for a specific IC manufacturing technology. The hard macros 419 of its cooperating and supporting (CS) integrated-circuit (IC) chip 411 may be block level designs optimized for power, area, timing and testing. While accomplishing physical design it is possible to only access I/O points of the hard macros 419 of its cooperating and supporting (CS) integrated-circuit (IC) chip 411, unlike soft macros allowing us to manipulate a register-transfer level (RTL). The hard macros 419 of its cooperating and supporting (CS) integrated-circuit (IC) chip 411 may be blocks generated using full custom design methodology and imported into a physical design database as a graphic design system (GDS) file. The hard macros 419 of its cooperating and supporting (CS) integrated-circuit (IC) chip 411 may cooperate with any of its field programmable integrated-circuit (FPIC) chips or chiplets 200 coupling to its cooperating and supporting (CS) integrated-circuit (IC) chip 411 to accelerate compilation of said any of its field programmable integrated-circuit (FPIC) chips or chiplets 200. The time for compiling any of its field programmable integrated-circuit (FPIC) chips or chiplets 200 may be reduced by using the hard macros 419, which may be pre-compiled circuit blocks, of its cooperating and supporting (CS) integrated-circuit (IC) chip 411. The hard macros 419 of its cooperating and supporting (CS) integrated-circuit (IC) chip 411 may include previously synthesized, mapped, placed and routed circuitry that may be relatively placed with short tool runtimes and that make it possible to reuse previous computational effort. The hard macros 419 of its cooperating and supporting (CS) integrated-circuit (IC) chip 411 may couple to and cooperate with the programmable logic blocks (LBs) 201 of any of its standard commodity field programmable integrated-circuit (FPIC) chips or chiplets 200 to perform a logic, computing or processing function. Its cooperating and supporting (CS) integrated-circuit (IC) chip 411 may be designed, implemented and fabricated using varieties of semiconductor technology nodes or generations, including old or matured technology notes or generations less advanced than or equal to, or above or equal to 20 nm, 30 nm, 40 nm, 50 nm, 90 nm, 130 nm, 250 nm, 350 nm, or 500 nm for example. Transistors used in its cooperating and supporting (CS) integrated-circuit (IC) chip 411 may be a fully depleted silicon-on-insulator (FDSOI) MOSFET, a partially depleted silicon-on-insulator (PDSOI) MOSFET or a planar MOSFET. A voltage Vcc of power supply used in its cooperating and supporting (CS) integrated-circuit (IC) chip 411 may be greater than or equal to 1 volt, 1.5 volts, 2.0 volts, 2.5 volts, 3 volts, 3.5 volts, 4 volts, or 5 volts. The field-effect-transistors (FETs) used in its cooperating and supporting (CS) integrated-circuit (IC) chip 411 may have gate oxide (physical) thickness greater than or equal to 5 nm, 6 nm, 7.5 nm, 10 nm, 12.5 nm, or 15 nm.

Referring to FIG. 19A, for the first type of standard commodity logic drive 300, its CPU IC chip 269*b*, DSP chip 270, dedicated control and input/output (I/O) chip 260, standard commodity field programmable integrated-circuit (FPIC) chips or chiplets 200, GPU IC chips 269*a*, cooperating and supporting (CS) integrated-circuit (IC) chip 411, NVM IC chips 250, IAC chip 402 and HBM IC chips 251 may be arranged in an array, wherein its CPU IC chip 269*b* and dedicated control and input/output (I/O) chip 260 may be arranged in its center region surrounded by its periphery region having its standard commodity field programmable integrated-circuit (FPIC) chips or chiplets 200, DSP chip 270, GPU IC chips 269*a*, NVM IC chips 250, cooperating and supporting (CS) integrated-circuit (IC) chip 411, IAC chip 402 and HBM IC chips 251 arranged therein. Alternatively, each of the standard commodity field programmable integrated-circuit (FPIC) chips or chiplets 200 may be replaced with any type of the first through sixth types of field programmable chip-on-chip modules 400 as illustrated in FIGS. 27A-27F.

Referring to FIG. 19A, the first type of standard commodity logic drive 300 may include multiple inter-chip interconnects 371 each coupling neighboring two of its standard commodity field programmable integrated-circuit (FPIC) chips or chiplets 200, field programmable chip-on-chip modules 400 each in case of replacing its standard commodity field programmable integrated-circuit (FPIC) chips or chiplets 200, NVM IC chips 250, dedicated control and input/output (I/O) chip 260, GPU IC chips 269*a*, CPU IC chip 269*b*, DSP chip 270, cooperating and supporting (CS) integrated-circuit (IC) chip 411, IAC chip 402 and HBM IC chips 251. The first type of standard commodity logic drive 300 may include multiple DPIIC chip 410 each aligned with a cross of a bundle of its inter-chip interconnects 371 extending in a forward or backward direction and a bundle of its inter-chip interconnects 371 extending in a leftward or rightward direction. For the first type of standard commodity logic drive 300, each of its DPIIC chips 410 is at corners of four of its standard commodity field programmable integrated-circuit (FPIC) chips or chiplets 200, field programmable chip-on-chip modules 400 in case of replacing its standard commodity field programmable integrated-circuit (FPIC) chips or chiplets 200, NVM IC chips 250, dedicated control and input/output (I/O) chip 260, GPU IC chips 269*a*, CPU IC chip 269*b*, DSP chip 270, IAC chip 402, cooperating and supporting (CS) integrated-circuit (IC) chips 411 and HBM IC chips 251 around said each of its DPIIC chips 410. Its inter-chip interconnects 371 may be formed for the programmable interconnect 361 and non-programmable interconnects 364. Data transmission may be built (1) between any of the programmable interconnects 361 of its inter-chip interconnects 371 and any of the programmable interconnects 361 of the intra-chip interconnects 502 of any of its standard commodity field programmable integrated-circuit (FPIC) chips or chiplets 200, or any of the programmable interconnects 361 of the intra-chip interconnects 502 of either of the first and second field programmable integrated-circuit (IC) chips or chiplets 200*a* and 200*b* of any of its field programmable chip-on-chip modules 400 in case of replacing its standard commodity field programmable integrated-circuit (FPIC) chips or chiplets 200, via any of the small input/output (I/O) circuits 203 of said any of its standard commodity field programmable integrated-circuit (FPIC) chips or chiplets 200, or any of the small input/output (I/O) circuits 203 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200, and (2) between any of the programmable interconnects 361 of its inter-chip interconnects 371 and any of the programmable interconnects 361 of the intra-chip interconnects of any of its DPIIC chips 410 via any of the small input/output (I/O) circuits 203 of said any of its DPIIC chips 410.

Referring to FIG. 19A, for the first type of standard commodity logic drive 300, for a first aspect a first one of the large I/O circuits 341 of either of its NVM IC chips 250 may have the large driver 274 as seen in FIG. 16A coupling to the large receiver 275 of a second one of the large I/O circuits 341 of its CS IC chip 411 via one of the non-programmable interconnects 364 of its inter-chip interconnects 371 for passing first encrypted CPM data from the large driver 274 of the first one of the large I/O circuits 341 to the large receiver 275 of the second one of the large I/O circuits 341. Next, the first encrypted CPM data may be decrypted by the cryptography block 517 of its CS IC chip 411 as first decrypted CPM data. Next, a first one of the small I/O circuits 203 of its CS IC chip 411 may have the small driver 374 as seen in FIG. 16B coupling to the small receiver 375 of a second one of the small I/O circuits 203 of any of its standard commodity field programmable integrated-circuit (FPIC) chips or chiplets 200 or the small receiver 375 of a second one of the small I/O circuits 203 of either of the first and second field programmable integrated-circuit (IC) chips or chiplets 200*a* and 200*b* of any of its field programmable chip-on-chip modules 400 in case of replacing its standard commodity field programmable integrated-circuit (FPIC) chips or chiplets 200 via another of the non-programmable interconnects 364 of its inter-chip interconnects 371 for passing the first decrypted CPM data from the small driver 374 of the first one of the small I/O circuits 203 to the small receiver 375 of the second one of the small I/O circuits 203. Next, one of the programmable logic blocks (LBs) 201 of said any of its standard commodity field programmable integrated-circuit (FPIC) chips or chiplets 200 or one of the programmable logic blocks (LBs) 201 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 may be programmed or configured in accordance with the first decrypted CPM data, and/or one of the first or second type of field programmable switch cells 379 of said any of its standard commodity field programmable integrated-circuit (FPIC) chips or chiplets 200 or one of the first or second type of field programmable switch cells 379 of said either of the first and second field programmable integrated-circuit (IC) chips or chiplets 200*a* and 200*b* of said any of its field programmable chip-on-chip modules 400 in case of replacing said one of its standard commodity field programmable integrated-circuit (FPIC) chips or chiplets 200 may be programmed or configured in accordance with the first decrypted CPM data. Alternatively, any type of the first through fourth types of coarse-grained field programmable (CGFP) architectures 2070, 2170, 2090 and 2270 of said any of its standard commodity field programmable integrated-circuit (FPIC) chips or chiplets 200 or any type of the first through fourth types of coarse-grained field programmable (CGFP) architectures 2070, 2170, 2090 and 2270 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 may be programmed or configured in accordance with the first decrypted CPM data. Further, a third one of the small I/O circuits 203 of said any of its standard commodity field programmable integrated-circuit (FPIC) chips or chiplets 200 or a third one of the small I/O circuits 203 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 may have the small driver 374 as seen in FIG. 16B coupling to the small receiver 375 of a fourth one of the small I/O circuits 203 of its CS IC chip 411 via another of the non-programmable interconnects 364 of its inter-chip interconnects 371 for passing second CPM data used to program or configure (1) one of the programmable logic blocks (LBs) 201 of said any of its standard commodity field programmable integrated-circuit (FPIC) chips or chiplets 200 or one of the programmable logic blocks (LBs) 201 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200, or, in the alternative scenario, said any type of the first through fourth types of coarse-grained field programmable (CGFP) architectures 2070, 2170, 2090 and 2270 of said any of its standard commodity field programmable integrated-circuit (FPIC) chips or chiplets 200 or said any type of the first through fourth types of coarse-grained field programmable (CGFP) architectures 2070, 2170, 2090 and 2270 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200, and (2) one of the first or second type of field programmable switch cells 379 of said any of its standard commodity field programmable integrated-circuit (FPIC) chips or chiplets 200 or one of the first or second type of field programmable switch cells 379 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 from the small driver 374 of the third one of the small I/O circuits 203 to the small receiver 375 of the fourth one of the small I/O circuits 203. Next, the second CPM data may be encrypted by the cryptography block 517 of its CS IC chip 411 as second encrypted CPM data. Next, a third one of the large I/O circuits 341 of its CS IC chip 411 may have the large driver 274 as seen in FIG. 16A coupling to the large receiver 275 of a fourth one of the large I/O circuits 341 of said either of its NVM IC chips 250 via another of the non-programmable interconnects 364 of its inter-chip interconnects 371 for passing the second encrypted CPM data from the large driver 274 of the third one of the large I/O circuits 341 to the large receiver 275 of the fourth one of the large I/O circuits 341 to be stored in said either of its NVM IC chips 250.

Referring to FIG. 19A, for the first type of standard commodity logic drive 300, for a second aspect a first one of the large I/O circuits 341 of either of its NVM IC chips 250 may have the large driver 274 as seen in FIG. 16A coupling to the large receiver 275 of a second one of the large I/O circuits 341 of its CS IC chip 411 via one of the non-programmable interconnects 364 of its inter-chip interconnects 371 for passing first encrypted CPM data from the large driver 274 of the first one of the large I/O circuits 341 to the large receiver 275 of the second one of the large I/O circuits 341. Next, a first one of the small I/O circuits 203 of its CS IC chip 411 may have the small driver 374 as seen in FIG. 16B coupling to the small receiver 375 of a second one of the small I/O circuits 203 of any of its standard commodity field programmable integrated-circuit (FPIC) chips or chiplets 200 or the small receiver 375 of a second one of the small I/O circuits 203 of either of the first and second field programmable integrated-circuit (IC) chips or chiplets 200*a* and 200*b* of any of its field programmable chip-on-chip modules 400 in case of replacing its standard commodity field programmable integrated-circuit (FPIC) chips or chiplets 200 via another of the non-programmable interconnects 364 of its inter-chip interconnects 371 for passing the first encrypted CPM data from the small driver 374 of the first one of the small I/O circuits 203 to the small receiver 375 of the second one of the small I/O circuits 203. Next, said any of its standard commodity field programmable integrated-circuit (FPIC) chips or chiplets 200 or said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 may include a cryptography block configured to decrypt the first encrypted CPM data as first decrypted CPM data. Next, one of the programmable logic blocks (LBs) 201 of said any of its standard commodity field programmable integrated-circuit (FPIC) chips or chiplets 200 or one of the programmable logic blocks (LBs) 201 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 may be programmed or configured in accordance with the first decrypted CPM data, and/or one of the first or second type of field programmable switch cells 379 of said any of its standard commodity field programmable integrated-circuit (FPIC) chips or chiplets 200 or one of the first or second type of field programmable switch cells 379 of said either of the first and second field programmable integrated-circuit (IC) chips or chiplets 200*a* and 200*b* of said any of its field programmable chip-on-chip modules 400 in case of replacing said one of its standard commodity field programmable integrated-circuit (FPIC) chips or chiplets 200 may be programmed or configured in accordance with the first decrypted CPM data. Alternatively, any type of the first through fourth types of coarse-grained field programmable (CGFP) architectures 2070, 2170, 2090 and 2270 of said any of its standard commodity field programmable integrated-circuit (FPIC) chips or chiplets 200 or any type of the first through fourth types of coarse-grained field programmable (CGFP) architectures 2070, 2170, 2090 and 2270 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 may be programmed or configured in accordance with the first decrypted CPM data. Further, second CPM data used to program or configure (1) one of the programmable logic blocks (LBs) 201 of said any of its standard commodity field programmable integrated-circuit (FPIC) chips or chiplets 200 or one of the programmable logic blocks (LBs) 201 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200, or, in the alternative scenario, said any type of the first through fourth types of coarse-grained field programmable (CGFP) architectures 2070, 2170, 2090 and 2270 of said any of its standard commodity field programmable integrated-circuit (FPIC) chips or chiplets 200 or said any type of the first through fourth types of coarse-grained field programmable (CGFP) architectures 2070, 2170, 2090 and 2270 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200, and (2) one of the first or second type of field programmable switch cells 379 of said any of its standard commodity field programmable integrated-circuit (FPIC) chips or chiplets 200 or one of the first or second type of field programmable switch cells 379 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 may be encrypted by the cryptography block of said any of its standard commodity field programmable integrated-circuit (FPIC) chips or chiplets 200 or the cryptography block of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 as second encrypted CPM data. Next, a third one of the small I/O circuits 203 of said any of its standard commodity field programmable integrated-circuit (FPIC) chips or chiplets 200 or a third one of the small I/O circuits 203 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 may have the small driver 374 as seen in FIG. 16B coupling to the small receiver 375 of a fourth one of the small I/O circuits 203 of its CS IC chip 411 via another of the non-programmable interconnects 364 of its inter-chip interconnects 371 for passing the second encrypted CPM data from the small driver 374 of the third one of the small I/O circuits 203 to the small receiver 375 of the fourth one of the small I/O circuits 203. Next, a third one of the large I/O circuits 341 of its CS IC chip 411 may have the large driver 274 as seen in FIG. 16A coupling to the large receiver 275 of a fourth one of the large I/O circuits 341 of said either of its NVM IC chips 250 via another of the non-programmable interconnects 364 of its inter-chip interconnects 371 for passing the second encrypted CPM data from the large driver 274 of the third one of the large I/O circuits 341 to the large receiver 275 of the fourth one of the large I/O circuits 341 to be stored in said either of its NVM IC chips 250.

Referring to FIG. 19A, for the first type of standard commodity logic drive 300, for a third aspect a first one of the small I/O circuits 203 of either of its NVM IC chips 250 may have the small driver 374 as seen in FIG. 16B coupling to the small receiver 375 of a second one of the small I/O circuits 203 of any of its standard commodity field programmable integrated-circuit (FPIC) chips or chiplets 200 or the small receiver 375 of a second one of the small I/O circuits 203 of either of the first and second field programmable integrated-circuit (IC) chips or chiplets 200*a* and 200*b* of any of its field programmable chip-on-chip modules 400 in case of replacing its standard commodity field programmable integrated-circuit (FPIC) chips or chiplets 200 via one of the non-programmable interconnects 364 of its inter-chip interconnects 371 for passing first encrypted CPM data from the small driver 374 of the first one of the small I/O circuits 203 to the small receiver 375 of the second one of the small I/O circuits 203. Next, said any of its standard commodity field programmable integrated-circuit (FPIC) chips or chiplets 200 or said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 may include a cryptography block configured to decrypt the first encrypted CPM data as first decrypted CPM data. Next, one of the programmable logic blocks (LBs) 201 of said any of its standard commodity field programmable integrated-circuit (FPIC) chips or chiplets 200 or one of the programmable logic blocks (LBs) 201 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 may be programmed or configured in accordance with the first decrypted CPM data, and/or one of the first or second type of field programmable switch cells 379 of said any of its standard commodity field programmable integrated-circuit (FPIC) chips or chiplets 200 or one of the first or second type of field programmable switch cells 379 of said either of the first and second field programmable integrated-circuit (IC) chips or chiplets 200*a* and 200*b* of said any of its field programmable chip-on-chip modules 400 in case of replacing said one of its standard commodity field programmable integrated-circuit (FPIC) chips or chiplets 200 may be programmed or configured in accordance with the first decrypted CPM data. Alternatively, any type of the first through fourth types of coarse-grained field programmable (CGFP) architectures 2070, 2170, 2090 and 2270 of said any of its standard commodity field programmable integrated-circuit (FPIC) chips or chiplets 200 or any type of the first through fourth types of coarse-grained field programmable (CGFP) architectures 2070, 2170, 2090 and 2270 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 may be programmed or configured in accordance with the first decrypted CPM data. Further, second CPM data used to program or configure (1) one of the programmable logic blocks (LBs) 201 of said any of its standard commodity field programmable integrated-circuit (FPIC) chips or chiplets 200 or one of the programmable logic blocks (LBs) 201 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200, or, in the alternative scenario, said any type of the first through fourth types of coarse-grained field programmable (CGFP) architectures 2070, 2170, 2090 and 2270 of said any of its standard commodity field programmable integrated-circuit (FPIC) chips or chiplets 200 or said any type of the first through fourth types of coarse-grained field programmable (CGFP) architectures 2070, 2170, 2090 and 2270 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200, and (2) one of the first or second type of field programmable switch cells 379 of said any of its standard commodity field programmable integrated-circuit (FPIC) chips or chiplets 200 or one of the first or second type of field programmable switch cells 379 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 may be encrypted by the cryptography block of said any of its standard commodity field programmable integrated-circuit (FPIC) chips or chiplets 200 or the cryptography block of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 as second encrypted CPM data. Next, a third one of the small I/O circuits 203 of said any of its standard commodity field programmable integrated-circuit (FPIC) chips or chiplets 200 or a third one of the small I/O circuits 203 of said either of the first and second field programmable integrated-circuit (IC) chips or chiplets 200*a* and 200*b* of any of its field programmable chip-on-chip modules 400 in case of replacing its standard commodity field programmable integrated-circuit (FPIC) chips or chiplets 200 may have the small driver 374 as seen in FIG. 18B coupling to the small receiver 375 of a fourth one of the small I/O circuits 203 of said either of its NVM IC chips 250 via another of the non-programmable interconnects 364 of its inter-chip interconnects 371 for passing the second encrypted CPM data from the small driver 374 of the third one of the small I/O circuits 203 to the small receiver 375 of the fourth one of the small I/O circuits 203 to be stored in said either of its NVM IC chips 250.

Referring to FIG. 19A, for the first type of standard commodity logic drive 300, for a fourth aspect, either of its NVM IC chips 250 may include a cryptography block configured to decrypt first encrypted CPM data stored therein as first decrypted CPM data. A first one of the large I/O circuits 341 of said either of its NVM IC chips 250 may have the large driver 274 as seen in FIG. 16A coupling to the large receiver 275 of a second one of the large I/O circuits 341 of its CS IC chip 411 via one of the non-programmable interconnects 364 of its inter-chip interconnects 371 for passing the first decrypted CPM data from the large driver 274 of the first one of the large I/O circuits 341 to the large receiver 275 of the second one of the large I/O circuits 341. Next, a first one of the small I/O circuits 203 of its CS IC chip 411 may have the small driver 374 as seen in FIG. 16B coupling to the small receiver 375 of a second one of the small I/O circuits 203 of any of its standard commodity field programmable integrated-circuit (FPIC) chips or chiplets 200 or the small receiver 375 of a second one of the small I/O circuits 203 of either of the first and second field programmable integrated-circuit (IC) chips or chiplets 200*a* and 200*b* of any of its field programmable chip-on-chip modules 400 in case of replacing its standard commodity field programmable integrated-circuit (FPIC) chips or chiplets 200 via another of the non-programmable interconnects 364 of its inter-chip interconnects 371 for passing the first decrypted CPM data from the small driver 374 of the first one of the small I/O circuits 203 to the small receiver 375 of the second one of the small I/O circuits 203. Next, one of the programmable logic blocks (LBs) 201 of said any of its standard commodity field programmable integrated-circuit (FPIC) chips or chiplets 200 or one of the programmable logic blocks (LBs) 201 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 may be programmed or configured in accordance with the first decrypted CPM data, and/or one of the first or second type of field programmable switch cells 379 of said any of its standard commodity field programmable integrated-circuit (FPIC) chips or chiplets 200 or one of the first or second type of field programmable switch cells 379 of said either of the first and second field programmable integrated-circuit (IC) chips or chiplets 200*a* and 200*b* of said any of its field programmable chip-on-chip modules 400 in case of replacing said one of its standard commodity field programmable integrated-circuit (FPIC) chips or chiplets 200 may be programmed or configured in accordance with the first decrypted CPM data. Alternatively, any type of the first through fourth types of coarse-grained field programmable (CGFP) architectures 2070, 2170, 2090 and 2270 of said any of its standard commodity field programmable integrated-circuit (FPIC) chips or chiplets 200 or any type of the first through fourth types of coarse-grained field programmable (CGFP) architectures 2070, 2170, 2090 and 2270 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 may be programmed or configured in accordance with the first decrypted CPM data. Further, a third one of the small I/O circuits 203 of said any of its standard commodity field programmable integrated-circuit (FPIC) chips or chiplets 200 or a third one of the small I/O circuits 203 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 may have the small driver 374 as seen in FIG. 16B coupling to the small receiver 375 of a fourth one of the small I/O circuits 203 of its CS IC chip 411 via another of the non-programmable interconnects 364 of its inter-chip interconnects 371 for passing second CPM data used to program or configure (1) one of the programmable logic blocks (LBs) 201 of said any of its standard commodity field programmable integrated-circuit (FPIC) chips or chiplets 200 or one of the programmable logic blocks (LBs) 201 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200, or, in the alternative scenario, said any type of the first through fourth types of coarse-grained field programmable (CGFP) architectures 2070, 2170, 2090 and 2270 of said any of its standard commodity field programmable integrated-circuit (FPIC) chips or chiplets 200 or said any type of the first through fourth types of coarse-grained field programmable (CGFP) architectures 2070, 2170, 2090 and 2270 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200, and (2) one of the first or second type of field programmable switch cells 379 of said any of its standard commodity field programmable integrated-circuit (FPIC) chips or chiplets 200 or one of the first or second type of field programmable switch cells 379 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 from the small driver 374 of the third one of the small I/O circuits 203 to the small receiver 375 of the fourth one of the small I/O circuits 203. Next, a third one of the large I/O circuits 341 of its CS IC chip 411 may have the large driver 274 as seen in FIG. 16A coupling to the large receiver 275 of a fourth one of the large I/O circuits 341 of said either of its NVM IC chips 250 via another of the non-programmable interconnects 364 of its inter-chip interconnects 371 for passing the second CPM data from the large driver 274 of the third one of the large I/O circuits 341 to the large receiver 275 of the fourth one of the large I/O circuits 341. Next, the second CPM data may be encrypted by the cryptography block of said either of its NVM IC chips 250 as second encrypted CPM data to be stored in said either of its NVM IC chips 250.

Referring to FIG. 19A, for the first type of standard commodity logic drive 300, for a fifth aspect either of its NVM IC chips 250 may include a cryptography block configured to decrypt first encrypted CPM data stored therein as first decrypted CPM data. A first one of the small I/O circuits 203 of said either of its NVM IC chips 250 may have the small driver 374 as seen in FIG. 16B coupling to the small receiver 375 of a second one of the small I/O circuits 203 of any of its field programmable integrated-circuit (FPIC) chips or chiplets 200 or the small receiver 375 of a second one of the small I/O circuits 203 of either of the first and second field programmable integrated-circuit (IC) chips or chiplets 200*a* and 200*b* of any of its field programmable chip-on-chip modules 400 in case of replacing its standard commodity field programmable integrated-circuit (FPIC) chips or chiplets 200 via one of the non-programmable interconnects 364 of its inter-chip interconnects 371 for passing the first decrypted CPM data from the small driver 374 of the first one of the small I/O circuits 203 to the small receiver 375 of the second one of the small I/O circuits 203. Next, one of the programmable logic blocks (LBs) 201 of said any of its standard commodity field programmable integrated-circuit (FPIC) chips or chiplets 200 or one of the programmable logic blocks (LBs) 201 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 may be programmed or configured in accordance with the first decrypted CPM data, and/or one of the first or second type of field programmable switch cells 379 of said any of its standard commodity field programmable integrated-circuit (FPIC) chips or chiplets 200 or one of the first or second type of field programmable switch cells 379 of said either of the first and second field programmable integrated-circuit (IC) chips or chiplets 200*a* and 200*b* of said any of its field programmable chip-on-chip modules 400 in case of replacing said one of its standard commodity field programmable integrated-circuit (FPIC) chips or chiplets 200 may be programmed or configured in accordance with the first decrypted CPM data. Alternatively, any type of the first through fourth types of coarse-grained field programmable (CGFP) architectures 2070, 2170, 2090 and 2270 of said any of its standard commodity field programmable integrated-circuit (FPIC) chips or chiplets 200 or any type of the first through fourth types of coarse-grained field programmable (CGFP) architectures 2070, 2170, 2090 and 2270 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 may be programmed or configured in accordance with the first decrypted CPM data. Further, a third one of the small I/O circuits 203 of said any of its standard commodity field programmable integrated-circuit (FPIC) chips or chiplets 200 or a third one of the small I/O circuits 203 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 may have the small driver 374 as seen in FIG. 16B coupling to the small receiver 375 of a fourth one of the small I/O circuits 203 of said either of its NVM IC chips 250 via another of the non-programmable interconnects 364 of its inter-chip interconnects 371 for passing second CPM data used to program or configure (1) one of the programmable logic blocks (LBs) 201 of said any of its standard commodity field programmable integrated-circuit (FPIC) chips or chiplets 200 or one of the programmable logic blocks (LBs) 201 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200, or, in the alternative scenario, said any type of the first through fourth types of coarse-grained field programmable (CGFP) architectures 2070, 2170, 2090 and 2270 of said any of its standard commodity field programmable integrated-circuit (FPIC) chips or chiplets 200 or said any type of the first through fourth types of coarse-grained field programmable (CGFP) architectures 2070, 2170, 2090 and 2270 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200, and (2) one of the first or second type of field programmable switch cells 379 of said any of its standard commodity field programmable integrated-circuit (FPIC) chips or chiplets 200 or one of the first or second type of field programmable switch cells 379 of said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200 from the small driver 374 of the third one of the small I/O circuits 203 to the small receiver 375 of the fourth one of the small I/O circuits 203. Next, the second CPM data may be encrypted by the cryptography block of said either of its NVM IC chips 250 as second encrypted CPM data to be stored in said either of its NVM IC chips 250.

Referring to FIG. 19A, for the first type of standard commodity logic drive 300, one or more of the programmable interconnects 361 of its inter-chip interconnects 371 may couple each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 to all of its DPIIC chips 410. One or more of the programmable interconnects 361 of the inter-chip interconnects 371 may couple each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 to its dedicated control and input/output (I/O) chip 260. One or more of the programmable interconnects 361 of its inter-chip interconnects 371 may couple each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 to both of its NVM IC chips 250. One or more of the programmable interconnects 361 of its inter-chip interconnects 371 may couple each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 to all of its GPU IC chips 269*a*. One or more of the programmable interconnects 361 of its inter-chip interconnects 371 may couple each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 to its CPU IC chip 269*b*. One or more of the programmable interconnects 361 of its inter-chip interconnects 371 may couple each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 to its DSP chip 270. One or more of the programmable interconnects 361 of its inter-chip interconnects 371 may couple one of its standard commodity field programmable integrated-circuit (FPIC) chips or chiplets 200 or either of the first and second field programmable integrated-circuit (IC) chips or chiplets 200*a* and 200*b* of one of its field programmable chip-on-chip modules 400 in case of replacing its standard commodity field programmable integrated-circuit (FPIC) chips or chiplets 200 to one of its HBM IC chips 251 next to said one of its standard commodity field programmable integrated-circuit (FPIC) chips or chiplets 200 or said one of the field programmable chip-on-chip modules 400 in case of replacing its standard commodity field programmable integrated-circuit (FPIC) chips or chiplets 200, and the communication between said one of its standard commodity field programmable integrated-circuit (FPIC) chips or chiplets 200, or said either of the first and second field programmable integrated-circuit (IC) chips or chiplets 200*a* and 200*b* of said one of its field programmable chip-on-chip modules 400 in case of replacing its standard commodity field programmable integrated-circuit (FPIC) chips or chiplets 200, and said one of its HBM IC chips 251 may have a data bit width of equal to or greater than 64, 128, 256, 512, 1024, 2048, 4096, 8K, or 16K. One or more of the programmable interconnects 361 of its inter-chip interconnects 371 may couple each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 to the others of its standard commodity field programmable integrated-circuit (FPIC) chips or chiplets 200 or either of the first and second field programmable integrated-circuit (IC) chips or chiplets 200*a* and 200*b* of the others of its field programmable chip-on-chip modules 400 in case of replacing its standard commodity field programmable integrated-circuit (FPIC) chips or chiplets 200. One or more of the programmable interconnects 361 of its inter-chip interconnects 371 may couple each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 to its IAC chip 402. One or more of the programmable interconnects 361 of its inter-chip interconnects 371 may couple each of its DPIIC chips 410 to its dedicated control and input/output (I/O) chip 260. One or more of the programmable interconnects 361 of its inter-chip interconnects 371 may couple each of its DPIIC chips 410 to both of its NVM IC chips 250. One or more of the programmable interconnects 361 of its inter-chip interconnects 371 may couple each of its DPIIC chips 410 to all of its GPU IC chips 269*a*. One or more of the programmable interconnects 361 of its inter-chip interconnects 371 may couple each of its DPIIC chips 410 to its CPU IC chip 269*b*. One or more of the programmable interconnects 361 of its inter-chip interconnects 371 may couple each of its DPIIC chips 410 to its DSP chip 270. One or more of the programmable interconnects 361 of its inter-chip interconnects 371 may couple each of its DPIIC chips 410 to all of its HBM IC chips 251. One or more of the programmable interconnects 361 of its inter-chip interconnects 371 may couple each of its DPIIC chips 410 to the others of its DPIIC chips 410. One or more of the programmable interconnects 361 of its inter-chip interconnects 371 may couple each of its DPIIC chips 410 to its IAC chip 402. One or more of the programmable interconnects 361 of its inter-chip interconnects 371 may couple its CPU IC chip 269*b* to all of its GPU IC chips 269*a*. One or more of the programmable interconnects 361 of its inter-chip interconnects 371 may couple its DSP chip 270 to all of its GPU IC chips 269*a*. One or more of the programmable interconnects 361 of its inter-chip interconnects 371 may couple its CPU IC chip 269*b* to both of its NVM IC chips 250. One or more of the programmable interconnects 361 of its inter-chip interconnects 371 may couple its DSP chip 270 to both of its NVM IC chips 250. One or more of the programmable interconnects 361 of its inter-chip interconnects 371 may couple its CPU IC chip 269*b* to one of its HBM IC chips 251 next to its CPU IC chip 269*b* and the communication between its CPU IC chip 269*b* and said one of its HBM IC chips 251 may have a data bit width of equal to or greater than 64, 128, 256, 512, 1024, 2048, 4096, 8K, or 16K. One or more of the programmable interconnects 361 of its inter-chip interconnects 371 may couple its CPU IC chip 269*b* to its IAC chip 402. One or more of the programmable interconnects 361 of its inter-chip interconnects 371 may couple its DSP chip 270 to its IAC chip 402. One or more of the programmable interconnects 361 of its inter-chip interconnects 371 may couple its CPU IC chip 269*b* to its DSP chip 270. One or more of the programmable interconnects 361 of its inter-chip interconnects 371 may couple one of its GPU IC chips 269*a* to one of its HBM IC chips 251 next to said one of its GPU IC chips 269*a* and the communication between said one of its GPU IC chips 269*a* and said one of its HBM IC chips 251 may have a data bit width of equal to or greater than 64, 128, 256, 512, 1024, 2048, 4096, 8K, or 16K. One or more of the programmable interconnects 361 of its inter-chip interconnects 371 may couple each of its GPU IC chips 269*a* to both of its NVM IC chips 250. One or more of the programmable interconnects 361 of its inter-chip interconnects 371 may couple each of its GPU IC chips 269*a* to the others of its GPU IC chips 269*a*. One or more of the programmable interconnects 361 of its inter-chip interconnects 371 may couple each of its GPU IC chips 269*a* to its IAC chip 402. One or more of the programmable interconnects 361 of its inter-chip interconnects 371 may couple each of its NVM IC chips 250 to its dedicated control and input/output (I/O) chip 260. One or more of the programmable interconnects 361 of its inter-chip interconnects 371 may couple each of its HBM IC chips 251 to its dedicated control and input/output (I/O) chip 260. One or more of the programmable interconnects 361 of its inter-chip interconnects 371 may couple each of its GPU IC chips 269*a* to its dedicated control and input/output (I/O) chip 260. One or more of the programmable interconnects 361 of its inter-chip interconnects 371 may couple its CPU IC chip 269*b* to its dedicated control and input/output (I/O) chip 260. One or more of the programmable interconnects 361 of its inter-chip interconnects 371 may couple its DSP chip 270 to its dedicated control and input/output (I/O) chip 260. One or more of the programmable interconnects 361 of its inter-chip interconnects 371 may couple each of its NVM IC chips 250 to all of its HBM IC chips 251. One or more of the programmable interconnects 361 of its inter-chip interconnects 371 may couple each of its NVM IC chips 250 to its IAC chip 402. One or more of the programmable interconnects 361 of its inter-chip interconnects 371 may couple each of its HBM IC chips 251 to its IAC chip 402. One or more of the programmable interconnects 361 of its inter-chip interconnects 371 may couple each of its IAC chip 402 to its dedicated control and input/output (I/O) chip 260. One or more of the programmable interconnects 361 of its inter-chip interconnects 371 may couple each of its NVM IC chips 250 to the other of its NVM IC chips 250. One or more of the programmable interconnects 361 of its inter-chip interconnects 371 may couple each of its HBM IC chips 251 to the others of its HBM IC chips 251.

Referring to FIG. 19A, the first type of standard commodity logic drive 300 may include multiple dedicated input/output (I/O) chips 265 in its peripheral region surrounding its center region having its NVM IC chips 250, dedicated control and input/output (I/O) chip 260, GPU IC chips 269*a*, CPU IC chip 269*b*, DSP chip 270, HBM IC chips 251, IAC chip 402, DPIIC chips 410 and standard commodity field programmable integrated-circuit (FPIC) chips or chiplets 200, or field programmable chip-on-chip modules 400 in case of replacing its standard commodity field programmable integrated-circuit (FPIC) chips or chiplets 200, arranged therein. One or more of the programmable interconnects 361 of its inter-chip interconnects 371 may couple each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 to all of its dedicated input/output (I/O) chips 265. One or more of the programmable interconnects 361 of its inter-chip interconnects 371 may couple each of its DPIIC chips 410 to all of its dedicated input/output (I/O) chips 265. One or more of the programmable interconnects 361 of its inter-chip interconnects 371 may couple each of its NVM IC chips 250 to all of its dedicated input/output (I/O) chips 265. One or more of the programmable interconnects 361 of its inter-chip interconnects 371 may couple its dedicated control and input/output (I/O) chip 260 to all of its dedicated input/output (I/O) chips 265. One or more of the programmable interconnects 361 of its inter-chip interconnects 371 may couple each of its GPU IC chips 269*a* to all of its dedicated input/output (I/O) chips 265. One or more of the programmable interconnects 361 of its inter-chip interconnects 371 may couple its CPU IC chip 269*b* to all of its dedicated input/output (I/O) chips 265. One or more of the programmable interconnects 361 of its inter-chip interconnects 371 may couple its DSP chip 270 to all of its dedicated input/output (I/O) chips 265. One or more of the programmable interconnects 361 of its inter-chip interconnects 371 may couple each of its HBM IC chips 251 to all of its dedicated input/output (I/O) chips 265. One or more of the programmable interconnects 361 of its inter-chip interconnects 371 may couple its IAC chip 402 to all of its dedicated input/output (I/O) chips 265. Its dedicated control and input/output (I/O) chip 260 is configured to control data transmission between each of its dedicated input/output (I/O) chips 265 and one of its CPU IC chip 269*b*, DSP chip 270, GPU IC chips 269*a*, NVM IC chips 250, IAC chip 402, HBM IC chips 251 and standard commodity field programmable integrated-circuit (FPIC) chips or chiplets 200, or one of the first and second field programmable integrated-circuit (IC) chips or chiplets 200*a* and 200*b* of one of its field programmable chip-on-chip modules 400 in case of replacing its standard commodity field programmable integrated-circuit (FPIC) chips or chiplets 200.

Referring to FIG. 19A, for the first type of standard commodity logic drive 300 being in operation, each of its DPIIC chip 410 may be arranged with the SRAM cells 398, as seen in FIG. 1A, acting as cache memory for storing data from each of its CPU IC chip 269*b*, DSP chip 270, dedicated control and input/output (I/O) chip 260, GPU IC chips 269*a*, NVM IC chips 250, IAC chip 402, HBM IC chips 251 and standard commodity field programmable integrated-circuit (FPIC) chips or chiplets 200, or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200.

Referring to FIG. 19A, for the first type of standard commodity logic drive 300, each of its CS IC chips 411 may include the regulating block 415 as illustrated in FIG. 20 configured to regulate a voltage (Vcc) of power supply from an input voltage of 12, 5, 3.3 or 2.5 volts to an output voltage of 3.3, 2.5, 1.8, 1.5, 1.35, 1.2, 1.0, 0.75 or 0.5 volts to be delivered to each of its CPU IC chip 269*b*, DSP chip 270, dedicated control and input/output (I/O) chip 260, GPU IC chips 269*a*, NVM IC chips 250, IAC chip 402, HBM IC chips 251 and standard commodity field programmable integrated-circuit (FPIC) chips or chiplets 200, or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200. Alternatively, instead of only one CS IC chip 411, multiple CS IC chips 411 each having the same function as one illustrated in FIGS. 19A and 20 may be provided for the first type of standard commodity logic drive 300.

Specification for Second Type of Standard Commodity Logic Drive

Figure 19B:
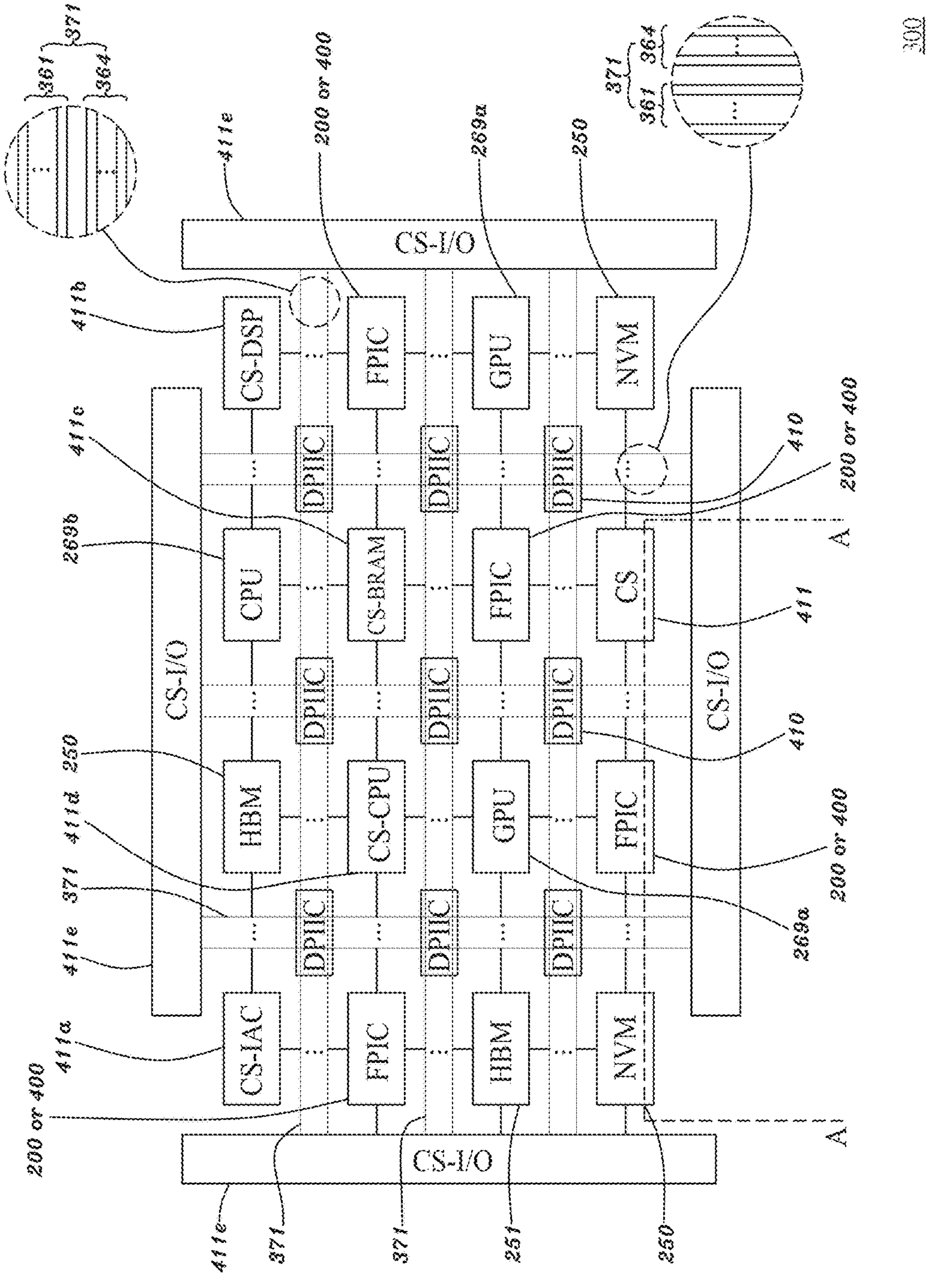
FIG. 19B is a schematically top view showing arrangement for various chips packaged in a second type of standard commodity logic drive in accordance with another embodiment of the present application.

FIG. 19B is a schematically top view showing arrangement for various chips packaged in a second type of standard commodity logic drive in accordance with another embodiment of the present application. Referring to FIG. 19B, a second type of standard commodity logic drive 300 may be packaged with multiple logic integrated-circuit (IC) chips, including multiple graphic-processing unit (GPU) integrated-circuit (IC) chips 269*a*, i.e., data-processing-unit (DPU) integrated-circuit (IC) chips, a central-processing-unit (CPU) integrated-circuit (IC) chip 269*b* and four standard commodity field programmable integrated-circuit (FPIC) chip or chiplet 200, wherein each of its four standard commodity field programmable integrated-circuit (FPIC) chips or chiplets 200 may have the same structure and specification as that illustrated in FIGS. 17A or 17B. Further, the second type of standard commodity logic drive 300 may be packaged with multiple high-bandwidth-memory (HBM) integrated-circuit (IC) chips 251 each arranged next to one of its GPU IC chips 269*a*, CPU IC chip 269*b* and four field programmable integrated-circuit (FPIC) chips or chiplets 200 for communication with said one of its GPU IC chips 269*a*, CPU IC chip 269*b* and field programmable integrated-circuit (FPIC) chips or chiplets 200 in a high speed, high bandwidth and wide bitwidth of greater than 64 or 256, for example. For the second type of standard commodity logic drive 300, any of its four field programmable integrated-circuit (FPIC) chips or chiplets 200 may be a fined-grained (FG) field-programmable-gate-array (FPGA) integrated-circuit (IC) chip as illustrated in FIGS. 27A-27C, another any of its four field programmable integrated-circuit (FPIC) chips or chiplets 200 may be a coarse-grained reconfigurable architecture (CGRA) integrated-circuit (IC) chip, and the any other of its four field programmable integrated-circuit (FPIC) chips or chiplets 200 may be a coarse-grained field programmable (CGFP) integrated-circuit (IC) chip. Each of its HBM IC chips 251 may be a high speed, high bandwidth, wide bitwidth dynamic-random-access-memory (DRAM) IC chip, high speed, high bandwidth, wide bitwidth cache static-random-access-memory (SRAM) chip, high speed, high bandwidth, wide bitwidth magnetoresistive random-access-memory (MRAM) chip or high speed, high bandwidth, wide bitwidth resistive random-access-memory (RRAM) chip. The second type of standard commodity logic drive 300 may be further packaged with one or more of non-volatile memory (NVM) IC chips 250, such as NAND or NOR flash memory IC chip, MRAM IC chip, RRAM IC chip or FRAM IC chip, wherein each of its non-volatile memory (NVM) integrated-circuit (IC) chips 250 may include NAND flash memory cells, NOR flash memory cells, magnetoresistive random access memory (MRAM) cells, resistive random access memory (RRAM) cells or ferroelectric random access memory (FRAM) cells, configured to store data-information-memory (DIM) data from data-information-memory (DIM) cells, such as SRAM or DRAM cells, of each of its HBM IC chips 251, wherein each of the ferroelectric random access memory (FRAM) cells of said each of its non-volatile memory (NVM) integrated-circuit (IC) chips 250 may include two electrodes and a thin ferroelectric film made of lead zirconate titanate (PZT) between the two electrodes thereof. The second type of standard commodity logic drive 300 may be further packaged with one or more cooperating and supporting (CS) integrated-circuit (IC) chips 411 for performing the functions as illustrated in FIGS. 19A and 20. For example, one of its cooperating and supporting (CS) integrated-circuit (IC) chips 411 may be provided with intellectual-property (IP) circuits, application-specific (AS) circuits, analog circuits, mixed-mode signal circuits, radio-frequency (RF) circuits, and/or transmitter, receiver or transceiver circuits, etc., to be used for an innovated application-specific-IC (ASIC) or customer-owned-tooling (COT) chip abbreviated as a CS-IAC chip 411*a*. Another of its cooperating and supporting (CS) integrated-circuit (IC) chips 411 may be formed with digital-signal-processing (DSP) slices for multiplication or division, which may be abbreviated as a CS-DSP chip 411*b*. Another of its cooperating and supporting (CS) integrated-circuit (IC) chips 411 may be formed with multiple block static-random-access memory (SRAM) cells for logic operation, which may be abbreviated as a CS-BRAM chip 411*c*. Another of its cooperating and supporting (CS) integrated-circuit (IC) chips 411 may be formed with multiple central-processing-unit (CPU) cores, which may be abbreviated as a CS-CPU IC chip 411*d*, wherein the central-processing-unit (CPU) cores of its CS-CPU IC chip 411*d* may be ARM Cortex processor/controller cores based on a reduced instruction set computing (RISC) architecture or x86 central-processing-unit (CPU) cores based on complex instruction set computing (CISC) architecture, wherein the ARM Cortex processor/controller cores may be 8-bit, 16-bit, 32-bit, 64-bit or more-than-64-bit reduced-instruction-set-computing (RISC) ARM processor/controller cores licensed by ARM Holdings. For the second type of standard commodity logic drive 300, its CPU IC chip 269*b*, standard commodity field programmable integrated-circuit (FPIC) chips or chiplets 200, GPU IC chips 269*a*, cooperating and supporting (CS) integrated-circuit (IC) chips 411, CS-IAC chip 411*a*, CS-DSP chip 411*b*, CS-BRAM chip 411*c*, CS-CPU IC chip 411*d*, NVM IC chips 250 and HBM IC chips 251 may be arranged in an array. Alternatively, each of its four standard commodity field programmable integrated-circuit (FPIC) chips or chiplets 200 may be replaced with any type of the first through sixth types of field programmable chip-on-chip modules 400 as illustrated in FIGS. 27A-27F.

Referring to FIG. 19B, the second type of standard commodity logic drive 300 may include multiple inter-chip interconnects 371 each coupling neighboring two of its standard commodity field programmable integrated-circuit (FPIC) chips or chiplets 200, field programmable chip-on-chip modules 400 each in case of replacing any of its standard commodity field programmable integrated-circuit (FPIC) chips or chiplets 200, NVM IC chips 250, GPU IC chips 269*a*, CPU IC chip 269*b*, cooperating and supporting (CS) integrated-circuit (IC) chip 411, CS-IAS chip 411*a*, CS-DSP chip 411*b*, CS-BRAM chip 411*c*, CS-CPU IC chip 411*d* and HBM IC chips 251. The second type of standard commodity logic drive 300 may include multiple DPIIC chip 410 each aligned with a cross of a bundle of its inter-chip interconnects 371 extending in a forward or backward direction and a bundle of its inter-chip interconnects 371 extending in a leftward or rightward direction. For the second type of standard commodity logic drive 300, each of its DPIIC chips 410 is at corners of four of its standard commodity field programmable integrated-circuit (FPIC) chips or chiplets 200, field programmable chip-on-chip modules 400 each in case of replacing any of its standard commodity field programmable integrated-circuit (FPIC) chips or chiplets 200, NVM IC chips 250, GPU IC chips 269*a*, CPU IC chip 269*b*, cooperating and supporting (CS) integrated-circuit (IC) chip 411, CS-IAS chip 411*a*, CS-DSP chip 411*b*, CS-BRAM chip 411*c*, CS-CPU IC chip 411*d* and HBM IC chips 251 around said each of its DPIIC chips 410. Its inter-chip interconnects 371 may be formed for the programmable interconnect 361 and non-programmable interconnects 364. Data transmission may be built (1) between any of the programmable interconnects 361 of its inter-chip interconnects 371 and any of the programmable interconnects 361 of any of its standard commodity field programmable integrated-circuit (FPIC) chips or chiplets 200, or any of the programmable interconnects 361 of either of the first and second field programmable integrated-circuit (IC) chips or chiplets 200*a* and 200*b* of any of its field programmable chip-on-chip modules 400 in case of replacing its standard commodity field programmable integrated-circuit (FPIC) chips or chiplets 200, via any of the small input/output (I/O) circuits 203 of said any of its standard commodity field programmable integrated-circuit (FPIC) chips or chiplets 200, or any of the small input/output (I/O) circuits 203 of said either of its first or second field programmable integrated-circuit (IC) chip or chiplet 200*a* or 200*b* of said any of its field programmable chip-on-chip modules 400 in case of replacing its standard commodity field programmable integrated-circuit (FPIC) chips or chiplets 200, and (2) between any of the programmable interconnects 361 of its inter-chip interconnects 371 and any of the programmable interconnects 361 of the intra-chip interconnects of any of its DPIIC chips 410 via any of the small input/output (I/O) circuits 203 of said any of its DPIIC chips 410.

Referring to FIG. 19B, the second type of standard commodity logic drive 300 may include the NVM IC chips 250, CS IC chip 411 and standard commodity field programmable integrated-circuit (FPIC) chips or chiplets 200 or field programmable chip-on-chip modules 400 in case of replacing its standard commodity field programmable integrated-circuit (FPIC) chips or chiplets 200 to perform the data processing as illustrated in FIG. 19A for each of the first, second and fourth aspects. Alternatively, the second type of standard commodity logic drive 300 may include the NVM IC chips 250 and standard commodity field programmable integrated-circuit (FPIC) chips or chiplets 200 or field programmable chip-on-chip modules 400 in case of replacing its standard commodity field programmable integrated-circuit (FPIC) chips or chiplets 200 to perform the data processing as illustrated in FIG. 19A for each of the third and fifth aspects.

Referring to FIG. 19B, for the second type of standard commodity logic drive 300, a voltage (Vcc) of power supply supplied for its CS-CPU IC chip 411*d* may be the same as that supplied for each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200. Further, gate oxide of each transistor of its CS-CPU IC chip 411*d* may have the same thickness as that of each transistor of each of its field programmable integrated-circuit (FPIC) chips or chiplets 200 or that of each transistor of each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200. The semiconductor technology node or generation used in its CS-CPU IC chip 411*d* may be the same as or similar to that used in each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200.

Referring to FIG. 19B, for the second type of standard commodity logic drive 300, one or more of the programmable interconnects 361 of its inter-chip interconnects 371 may couple each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 to all of its cooperating and supporting (CS) IC chip 411, CS-IAC chip 411*a*, CS-DSP chip 411*b*, CS-BRAM chip 411*c* and CS-CPU IC chip 411*d*. One or more of the programmable interconnects 361 of its inter-chip interconnects 371 may couple each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 to all of its DPIIC chips 410. One or more of the programmable interconnects 361 of its inter-chip interconnects 371 may couple each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 to both of its NVM IC chips 250. One or more of the programmable interconnects 361 of its inter-chip interconnects 371 may couple each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 to all of its GPU IC chips 269*a*. One or more of the programmable interconnects 361 of its inter-chip interconnects 371 may couple each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 to its CPU IC chip 269*b*. One or more of the programmable interconnects 361 of its inter-chip interconnects 371 may couple one of its standard commodity field programmable integrated-circuit (FPIC) chips or chiplets 200 or either of the first and second field programmable integrated-circuit (IC) chips or chiplets 200*a* and 200*b* of one of its field programmable chip-on-chip modules 400 in case of replacing its standard commodity field programmable integrated-circuit (FPIC) chips or chiplets 200 to one of its HBM IC chips 251 next to said one of its standard commodity field programmable integrated-circuit (FPIC) chips or chiplets 200 or said one of its field programmable chip-on-chip modules 400 in case of replacing its standard commodity field programmable integrated-circuit (FPIC) chips or chiplets 200, and the communication between said one of its standard commodity field programmable integrated-circuit (FPIC) chips or chiplets 200, or said either of the first and second field programmable integrated-circuit (IC) chips or chiplets 200*a* and 200*b* of said one of its field programmable chip-on-chip modules 400 in case of replacing its standard commodity field programmable integrated-circuit (FPIC) chips or chiplets 200, and said one of its HBM IC chips 251 may have a data bit width of equal to or greater than 64, 128, 256, 512, 1024, 2048, 4096, 8K, or 16K. One or more of the programmable interconnects 361 of its inter-chip interconnects 371 may couple each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 to the others of its standard commodity field programmable integrated-circuit (FPIC) chips or chiplets 200 or either of the first and second field programmable integrated-circuit (IC) chips or chiplets 200*a* and 200*b* of the others of its field programmable chip-on-chip modules 400 in case of replacing its standard commodity field programmable integrated-circuit (FPIC) chips or chiplets 200. One or more of the programmable interconnects 361 of its inter-chip interconnects 371 may couple each of its DPIIC chips 410 to both of its NVM IC chips 250. One or more of the programmable interconnects 361 of its inter-chip interconnects 371 may couple each of its DPIIC chips 410 to all of its GPU IC chips 269*a*. One or more of the programmable interconnects 361 of its inter-chip interconnects 371 may couple each of its DPIIC chips 410 to its CPU IC chip 269*b*. One or more of the programmable interconnects 361 of its inter-chip interconnects 371 may couple each of its DPIIC chips 410 to all of its HBM IC chips 251. One or more of the programmable interconnects 361 of its inter-chip interconnects 371 may couple each of its DPIIC chips 410 to the others of its DPIIC chips 410. One or more of the programmable interconnects 361 of its inter-chip interconnects 371 may couple its CPU IC chip 269*b* to all of its GPU IC chips 269*a*. One or more of the programmable interconnects 361 of its inter-chip interconnects 371 may couple its CPU IC chip 269*b* to both of its NVM IC chips 250. One or more of the programmable interconnects 361 of its inter-chip interconnects 371 may couple its CPU IC chip 269*b* to one of its HBM IC chips 251 next to its CPU IC chip 269*b* and the communication between its CPU IC chip 269*b* and said one of its HBM IC chips 251 may have a data bit width of equal to or greater than 64, 128, 256, 512, 1024, 2048, 4096, 8K, or 16K. One or more of the programmable interconnects 361 of its inter-chip interconnects 371 may couple one of its GPU IC chips 269*a* to one of its HBM IC chips 251 next to said one of its GPU IC chips 269*a* and the communication between said one of its GPU IC chips 269*a* and said one of its HBM IC chips 251 may have a data bit width of equal to or greater than 64, 128, 256, 512, 1024, 2048, 4096, 8K, or 16K. One or more of the programmable interconnects 361 of its inter-chip interconnects 371 may couple each of its GPU IC chips 269*a* to both of its NVM IC chips 250. One or more of the programmable interconnects 361 of its inter-chip interconnects 371 may couple each of its GPU IC chips 269*a* to the others of its GPU IC chips 269*a*. One or more of the programmable interconnects 361 of its inter-chip interconnects 371 may couple each of its NVM IC chips 250 to all of its HBM IC chips 251. One or more of the programmable interconnects 361 of its inter-chip interconnects 371 may couple each of its NVM IC chips 250 to the other of its NVM IC chips 250. One or more of the programmable interconnects 361 of its inter-chip interconnects 371 may couple each of its HBM IC chips 251 to the others of its HBM IC chips 251.

For example, referring to FIG. 19B, for the second type of standard commodity logic drive 300, one of its standard commodity field programmable integrated-circuit (FPIC) chips or chiplets 200 or one of its field programmable chip-on-chip modules 400 in case of replacing its standard commodity field programmable integrated-circuit (FPIC) chips or chiplets 200 may be arranged next to two of its GPU IC chips 269*a* and between said two of its GPU IC chips 269*a* to provide a smart interface between said two of its GPU IC chips 269*a*, and thereby said one of its standard commodity field programmable integrated-circuit (FPIC) chips or chiplets 200 or said one of its field programmable chip-on-chip modules 400 in case of replacing its standard commodity field programmable integrated-circuit (FPIC) chips or chiplets 200 may perform field programmability and artificial intelligent networking between said two of its GPU IC chips 269*a*.

Referring to FIG. 19B, for the second type of standard commodity logic drive 300, its cooperating and supporting (CS) IC chips 411 may be provided with the large-input/output (I/O) block 412 and small-input/output (I/O) block 413 as illustrated in FIG. 20, which may be abbreviated as CS-I/O chips 411*e*, to perform the same function as that of the dedicated I/O chips 265 of the first type of standard commodity logic drive 300 as illustrated in FIG. 19A. Its CS-I/O chips 411*e* may be arranged in its peripheral region surrounding its center region having its NVM IC chips 250, GPU IC chips 269*a*, CPU IC chip 269*b*, cooperating and supporting (CS) integrated-circuit (IC) chip 411, CS-IAS chip 411*a*, CS-DSP chip 411*b*, CS-BRAM chip 411*c*, CS-CPU IC chip 411*d*, HBM IC chips 251 and standard commodity field programmable integrated-circuit (FPIC) chips or chiplets 200, or field programmable chip-on-chip modules 400 in case of replacing its standard commodity field programmable integrated-circuit (FPIC) chips or chiplets 200, arranged therein. One or more of the programmable interconnects 361 of its inter-chip interconnects 371 may couple each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 to all of its CS-I/O chips 411*e*. One or more of the programmable interconnects 361 of its inter-chip interconnects 371 may couple each of its DPIIC chips 410 to all of its CS-I/O chips 411*e*. One or more of the programmable interconnects 361 of its inter-chip interconnects 371 may couple each of its NVM IC chips 250 to all of its CS-I/O chips 411*e*. One or more of the programmable interconnects 361 of its inter-chip interconnects 371 may couple each of its GPU IC chips 269*a* to all of its CS-I/O chips 411*e*. One or more of the programmable interconnects 361 of its inter-chip interconnects 371 may couple its CPU IC chip 269*b* to all of its CS-I/O chips 411*e*. One or more of the programmable interconnects 361 of its inter-chip interconnects 371 may couple each of its HBM IC chips 251 to all of its CS-I/O chips 411*e*. One or more of the programmable interconnects 361 of its inter-chip interconnects 371 may couple its CS-IAC chip 411*a* to all of its CS-I/O chips 411*e*. One or more of the programmable interconnects 361 of its inter-chip interconnects 371 may couple its CS-DSP chip 411*b* to all of its CS-I/O chips 411*e*. One or more of the programmable interconnects 361 of its inter-chip interconnects 371 may couple its CS-BRAM chip 411*c* to all of its CS-I/O chips 411*e*. One or more of the programmable interconnects 361 of its inter-chip interconnects 371 may couple its CS-CPU IC chip 411*d* to all of its CS-I/O chips 411*e*.

Referring to FIG. 19B, for the second type of standard commodity logic drive 300 being in operation, each of its DPIIC chip 410 may be arranged with the SRAM cells 398, as seen in FIG. 1A, acting as cache memory for storing data from each of its CPU IC chip 269*b*, GPU IC chips 269*a*, cooperating and supporting (CS) integrated-circuit (IC) chips 411, CS-IAC chip 411*a*, CS-DSP chip 411*b*, CS-BRAM chip 411*c*, CS-CPU IC chip 411*d*, CS-I/O chips 411*e*, NVM IC chips 250, HBM IC chips 251 and standard commodity field programmable integrated-circuit (FPIC) chips or chiplets 200, or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200.

Referring to FIG. 19B, for the second type of standard commodity logic drive 300, its CS IC chip 411 may include the regulating block 415 as illustrated in FIG. 20 configured to regulate a voltage (Vcc) of power supply from an input voltage of 12, 5, 3.3 or 2.5 volts to an output voltage of 3.3, 2.5, 1.8, 1.5, 1.35, 1.2, 1.0, 0.75 or 0.5 volts to be delivered to each of its CPU IC chip 269*b*, GPU IC chips 269*a*, CS-IAC chip 411*a*, CS-DSP chip 411*b*, CS-BRAM chip 411*c*, CS-CPU IC chip 411*d*, CS-I/O chips 411*e*, NVM IC chips 250, HBM IC chips 251 and standard commodity field programmable integrated-circuit (FPIC) chips or chiplets 200, or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200. Alternatively, instead of only one CS IC chip 411, multiple CS IC chips 411 each having the same function as one illustrated in FIGS. 19A and 20 may be provided for the second type of standard commodity logic drive 300.

Interconnection for Logic Drive

Figure 21A:
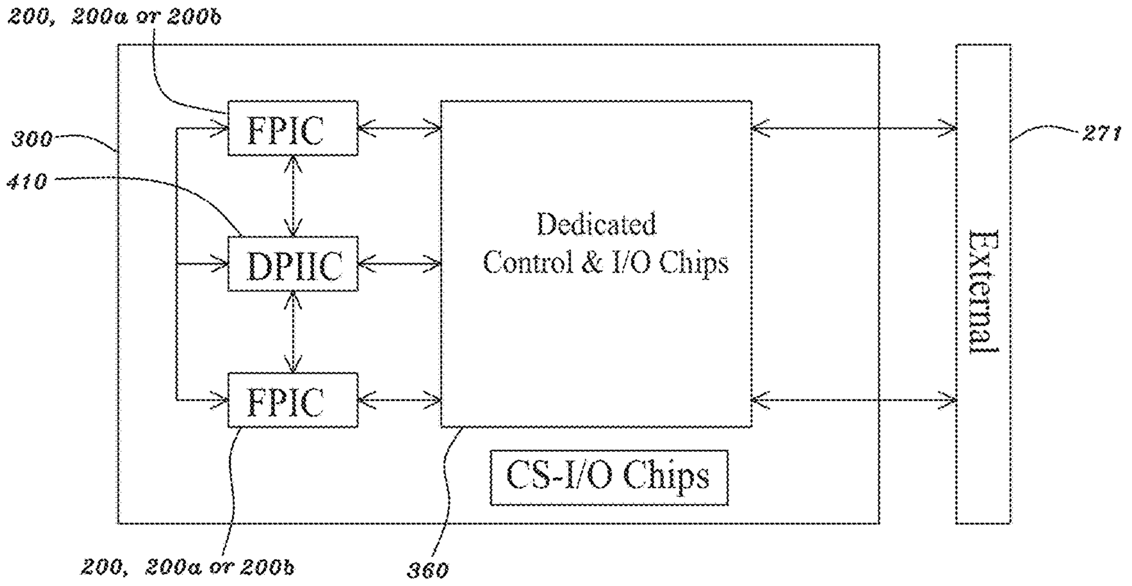
FIG. 21A is a block diagram showing interconnection between chips in a standard commodity logic drive in accordance with an embodiment of the present application.

FIG. 21A is a block diagram showing interconnection between chips in a standard commodity logic drive in accordance with an embodiment of the present application. Referring to FIG. 21A, two blocks 200 or 400 may be two different groups of the standard commodity field programmable integrated-circuit (FPIC) chips or chiplets 200, or two different groups of the field programmable chip-on-chip modules 400 in case of replacing the standard commodity field programmable integrated-circuit (FPIC) chips or chiplets 200, in each of the first and second types of standard commodity logic drives 300 illustrated in FIGS. 19A and 19B; a block 410 may be a combination of the DPIIC chips 410 in each of the first and second types of standard commodity logic drives 300 illustrated in FIGS. 19A and 19B; a block 360 may be a combination of the dedicated I/O chips 265 and dedicated control and input/output (I/O) chip 260 in the first type of standard commodity logic drive 300 illustrated in FIG. 19A or a combination of the CS-I/O chips 411*e* in the second type of standard commodity logic drive 300 illustrated in FIG. 19B.

Referring to FIG. 21A, for each of the first and second types of standard commodity logic drives 300 as illustrated in FIGS. 19A and 19B, one or more of the programmable interconnects 361 of its inter-chip interconnects 371 may couple one or more of the small I/O circuits 203 of each of its dedicated I/O chips 265 and dedicated control and input/output (I/O) chip 260, or CS-I/O chips 411*e*, in the block 360 to one or more of the small I/O circuits 203 of any of its standard commodity field programmable integrated-circuit (FPIC) chips or chiplets 200, or one or more of the small I/O circuits 203 of either of the first and second field programmable integrated-circuit (IC) chips or chiplets 200*a* and 200*b* of any of its field programmable chip-on-chip modules 400 in case of replacing its standard commodity field programmable integrated-circuit (FPIC) chips or chiplets 200. One or more of the programmable interconnects 361 of its inter-chip interconnects 371 may couple one or more of the small I/O circuits 203 of each of its dedicated I/O chips 265 and dedicated control and input/output (I/O) chip 260, or CS-I/O chips 411*e*, in the block 360 to one or more of the small I/O circuits 203 of any of its DPIIC chips 410. One or more of the non-programmable interconnects 364 of its inter-chip interconnects 371 may couple one or more of the small I/O circuits 203 of each of its dedicated I/O chips 265 and dedicated control and input/output (I/O) chip 260, or CS-I/O chips 411*e*, in the block 360 to one or more of the small I/O circuits 203 of each of its standard commodity field programmable integrated-circuit (FPIC) chips or chiplets 200, or one or more of the small I/O circuits 203 of either of the first and second field programmable integrated-circuit (IC) chips or chiplets 200*a* and 200*b* of any of its field programmable chip-on-chip modules 400 in case of replacing its standard commodity field programmable integrated-circuit (FPIC) chips or chiplets 200. One or more of the non-programmable interconnects 364 of its inter-chip interconnects 371 may couple one or more of the small I/O circuits 203 of each of its dedicated I/O chips 265 and dedicated control and input/output (I/O) chip 260, or CS-I/O chips 411*e*, in the block 360 to one or more of the small I/O circuits 203 of any of its DPIIC chips 410.

Referring to FIG. 21A, for each of the first and second types of standard commodity logic drives 300 as illustrated in FIGS. 19A and 19B, one or more of the programmable interconnects 361 of its inter-chip interconnects 371 may couple one or more of the small I/O circuits 203 of each of its DPIIC chips 410 to one or more of the small I/O circuits 203 of any of its standard commodity field programmable integrated-circuit (FPIC) chips or chiplets 200 or one or more of the small I/O circuits 203 of either of the first and second field programmable integrated-circuit (IC) chips or chiplets 200*a* and 200*b* of any of its field programmable chip-on-chip modules 400 in case of replacing its standard commodity field programmable integrated-circuit (FPIC) chips or chiplets 200. One or more of the programmable interconnects 361 of its inter-chip interconnects 371 may couple one or more of the small I/O circuits 203 of each of its DPIIC chips 410 to one or more of the small I/O circuits 203 of any of the others of its DPIIC chips 410. One or more of the non-programmable interconnects 364 of its inter-chip interconnects 371 may couple one or more of the small I/O circuits 203 of each of its DPIIC chips 410 to one or more of the small I/O circuits 203 of any of its standard commodity field programmable integrated-circuit (FPIC) chips or chiplets 200 or one or more of the small I/O circuits 203 of either of the first and second field programmable integrated-circuit (IC) chips or chiplets 200*a* and 200*b* of any of its field programmable chip-on-chip modules 400 in case of replacing its standard commodity field programmable integrated-circuit (FPIC) chips or chiplets 200. One or more of the non-programmable interconnects 364 of its inter-chip interconnects 371 may couple one or more of the small I/O circuits 203 of each of its DPIIC chips 410 to one or more of the small I/O circuits 203 of any of the others of its DPIIC chips 410.

Referring to FIG. 21A, for each of the first and second types of standard commodity logic drives 300 as illustrated in FIGS. 19A and 19B, one or more of the programmable interconnects 361 of its inter-chip interconnects 371 may couple one or more of the small I/O circuits 203 of each of its standard commodity field programmable integrated-circuit (FPIC) chips or chiplets 200 or one or more of the small I/O circuits 203 of each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 to one or more of the small I/O circuits 203 of any of the others of the standard commodity field programmable integrated-circuit (FPIC) chips or chiplets 200 or one or more of the small I/O circuits 203 of either of the first and second field programmable integrated-circuit (IC) chips or chiplets 200*a* and 200*b* of any of the others of its field programmable chip-on-chip modules 400 in case of replacing its standard commodity field programmable integrated-circuit (FPIC) chips or chiplets 200. One or more of the non-programmable interconnects 364 of its inter-chip interconnects 371 may couple one or more of the small I/O circuits 203 of each of its standard commodity field programmable integrated-circuit (FPIC) chips or chiplets 200 or one or more of the small I/O circuits 203 of each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 to one or more of the small I/O circuits 203 of any of the others of the standard commodity field programmable integrated-circuit (FPIC) chips or chiplets 200 or one or more of the small I/O circuits 203 of either of the first and second field programmable integrated-circuit (IC) chips or chiplets 200*a* and 200*b* of any of the others of its field programmable chip-on-chip modules 400 in case of replacing its standard commodity field programmable integrated-circuit (FPIC) chips or chiplets 200.

Referring to FIG. 21A, for each of the first and second types of standard commodity logic drives 300 as illustrated in FIGS. 19A and 19B, one or more of the programmable interconnects 361 of its inter-chip interconnects 371 may couple one or more of the large I/O circuits 341 of each of its dedicated I/O chips 265 and dedicated control and input/output (I/O) chip 260, or CS-I/O chips 411*e*, in the block 360 to one or more of the large I/O circuits 341 of any of the others of its dedicated I/O chips 265 and dedicated control and input/output (I/O) chip 260, or CS-I/O chips 411*e*. One or more of the large I/O circuits 341 of each of its dedicated I/O chips 265 and dedicated control and input/output (I/O) chip 260, or CS-I/O chips 411*e*, in the block 360 may couple to the external circuitry 271 outside said each of the first and second types of standard commodity logic drives 300.

Referring to FIG. 21A, for each of the first and second types of standard commodity logic drives 300 as illustrated in FIGS. 19A and 19B, a voltage (Vcc) of power supply supplied for each of the large I/O circuits 341 of each of its dedicated I/O chips 265 and dedicated control and I/O chip 260, or CS-I/O chips 411*e*, in the block 360 may be higher than that supplied for each of the small I/O circuits 203 of said each of its dedicated I/O chips 265 and dedicated control and I/O chip 260, or CS-I/O chips 411*e*, in the block 360 and that supplied for each of the small I/O circuits 203 of each of its standard commodity field programmable integrated-circuit (FPIC) chips or chiplets 200 or each of the small I/O circuits 203 of each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200, wherein the voltage (Vcc) of power supply supplied for each of the small I/O circuits 203 of each of its dedicated I/O chips 265 and dedicated control and I/O chip 260, or CS-I/O chips 411*e*, in the block 360 may be the same as that supplied for each of the small I/O circuits 203 of each of its standard commodity field programmable integrated-circuit (FPIC) chips or chiplets 200 or each of the small I/O circuits 203 of each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200. Further, gate oxide of each of the large I/O circuits 341 of each of its dedicated I/O chips 265 and dedicated control and I/O chip 260, or CS-I/O chips 411*e*, in the block 360 may have a greater thickness than that of each of the small I/O circuits 203 of said each of its dedicated I/O chips 265 and dedicated control and I/O chip 260, or CS-I/O chips 411*e*, in the block 360.

Referring to FIG. 21A, for each of the first and second types of standard commodity logic drives 300 as illustrated in FIGS. 19A and 19B, each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 may reload (1) the resulting values or programming codes via one or more of the non-programmable interconnects 364 of its intra-chip interconnects 502 from any of its non-volatile memory (NVM) IC chips 250 to one of the memory cells 490 of one of the programmable logic blocks (LBs) 201 thereof in case for the first type of fined-grained field programmable logic cell or element (LCE) 2014 as illustrated in FIG. 2A to be stored therein for configuring or programming said one of the programmable logic blocks (LBs) 201 thereof, (2) the resulting values via one or more of the non-programmable interconnects 364 of its intra-chip interconnects 502 from any of its non-volatile memory (NVM) IC chips 250 to one of the memory cells of one of the programmable logic blocks (LBs) 201 thereof in case for the second type of fined-grained field programmable logic cell or element (LCE) 2014 as illustrated in FIG. 2B to be stored therein for configuring or programming said one of the programmable logic blocks (LBs) 201 thereof, (3) the resulting values via one or more of the non-programmable interconnects 364 of its intra-chip interconnects 502 from any of its non-volatile memory (NVM) IC chips 250 to one of the first and second sets of memory cells of one of the programmable logic blocks (LBs) 201 thereof in case for the third type of fined-grained field programmable logic cell or element (LCE) 2014 as illustrated in FIG. 2C to be stored therein for configuring or programming said one of the programmable logic blocks (LBs) 201 thereof, (4) the instruction sets via one or more of the non-programmable interconnects 364 of its intra-chip interconnects 502 from any of its non-volatile memory (NVM) IC chips 250 to one of the third memory cells of the instruction memory block or section 2049 of one of the programmable logic blocks (LBs) 201 thereof in case for the coarse-grained reconfigurable architecture (CGRA) 2041 as illustrated in FIG. 4 to be stored therein for configuring or programming said one of the programmable logic blocks (LBs) 201 thereof, (5) the resulting values or data or programming codes via one or more of the non-programmable interconnects 364 of its intra-chip interconnects 502 from any of its non-volatile memory (NVM) IC chips 250 to one of the third type of static random-access memory (SRAM) cells 398 of one of the programmable logic blocks (LBs) 201 thereof in case for the coarse-grained programmable logic cells or elements (LCEs) 2060 as illustrated in FIGS. 5A-5D and 6 to be stored therein for configuring or programming said one of the programmable logic blocks (LBs) 201 thereof, (6) the resulting values or data or programmable codes via one or more of the non-programmable interconnects 364 of its intra-chip interconnects 502 from any of its non-volatile memory (NVM) IC chips 250 to one of the third type of static random-access memory (SRAM) cells 398 of one of the coarse-grained programmable logic cells or elements (LCEs) 2060 of any type of the first through fourth types of coarse-grained field programmable (CGFP) architectures 2070, 2170, 2090 and 2270 thereof as illustrated in FIGS. 5A-15 to be stored therein for configuring or programming said one of the coarse-grained programmable logic cells or elements (LCEs) 2060 thereof, (7) the programming codes via one or more of the non-programmable interconnects 364 of its intra-chip interconnects 502 from any of its non-volatile memory (NVM) IC chips 250 to one of the memory cells 362 of one of the first or second type of field programmable switch cells 379 thereof as illustrated in FIGS. 3A and 3B to be stored therein for configuring or programming said one of the first or second type of field programmable switch cells 379 thereof, or (8) the programming codes via one or more of the non-programmable interconnects 364 of its intra-chip interconnects 502 from any of its non-volatile memory (NVM) IC chips 250 to any of the interconnection-programming memory cells as illustrated in FIGS. 8A-15 to be stored therein for configuring or programming any of the four selection circuits 2073 of any of the programmable-interconnection-combined functional units 2071 or 2171 of any type of the first, second and fourth types of coarse-grained field programmable (CGFP) architectures 2070, 2170 and 2270 thereof, any of the four field-programmable local-interconnection selection circuits 2074 of any of the programmable-interconnection networking units 2072 of the first type of coarse-grained field programmable (CGFP) architectures 2070 thereof, any of the four field-programmable bypass-path selection circuits 2075 of any of the programmable-interconnection networking units 2072 of the first type of coarse-grained field programmable (CGFP) architectures 2070 thereof, any of the field-programmable crossbar selection circuits 2174 and 2175 of any of the programmable-interconnection-combined functional units 2171 of any type of the second and fourth types of coarse-grained field programmable (CGFP) architectures 2170 and 2270 thereof, any of the field-programmable selection circuits 2093 of any of the look-up table (LUT) banks 2091 of the third type of coarse-grained field programmable (CGFP) architecture 2090 thereof, or the decoder 2096 of any of the spare units 2095 of any of the look-up table (LUT) banks 2091 of the third type of coarse-grained field programmable (CGFP) architecture 2090 thereof. Further, each of its DPIIC chips 410 may reload the programming codes via one or more of the non-programmable interconnects 364 of its intra-chip interconnects 502 from any of its non-volatile memory (NVM) IC chips 250 to one of the memory cells 362 of one of the first or second type of field programmable switch cells 379 thereof as illustrated in FIGS. 3A and 3B to be stored therein for configuring or programming said one of the first or second type of field programmable switch cells 379 thereof.

Thereby, referring to FIG. 21A, for each of the first and second types of standard commodity logic drives 300 as illustrated in FIGS. 19A and 19B, one of the large I/O circuits 341 of one of its dedicated I/O chips 265 or CS-I/O chips 411*e* may drive to-be-processed data, i.e., data-information-memory (DIM) data, from the external circuitry 271 outside said each of the first and second types of standard commodity logic drives 300 to a first one of the small I/O circuits 203 of said one of its dedicated I/O chips 265 or CS-I/O chips 411*e*. The first one of the small I/O circuits 203 may drive the to-be-processed data to a second one of the small I/O circuits 203 of one of its DPIIC chips 410 via one or more of the programmable interconnects 361 of its inter-chip interconnects 371. The second one of the small I/O circuits 203 may drive the to-be-processed data to one of the first or second type of field programmable switch cells 379 of said one of its DPIIC chips 410 via a first one of the programmable interconnects 361 of the intra-chip interconnects of said one of its DPIIC chips 410. Said one of the first or second type of field programmable switch cells 379 may pass the to-be-processed data from the first one of the programmable interconnects 361 to a second one of the programmable interconnects 361 of the intra-chip interconnects of said one of its DPIIC chips 410 to be passed to a third one of the small I/O circuits 203 of said one of its DPIIC chips 410. The third one of the small I/O circuits 203 may drive the to-be-processed data to a fourth one of the small I/O circuits 203 of one of its standard commodity field programmable integrated-circuit (FPIC) chips or chiplets 200 or a fourth one of the small I/O circuits 203 of one of the first and second field programmable integrated-circuit (IC) chips or chiplets 200*a* and 200*b* of one of its field programmable chip-on-chip modules 400 in case of replacing its standard commodity field programmable integrated-circuit (FPIC) chips or chiplets 200 via one or more of the programmable interconnects 361 of its inter-chip interconnects 371. The fourth one of the small I/O circuits 203 may drive the to-be-processed data to one of the first or second type of field programmable switch cells 379 of said one of its standard commodity field programmable integrated-circuit (FPIC) chips or chiplets 200 or one of the first or second type of field programmable switch cells 379 of said one of the first and second field programmable integrated-circuit (IC) chips or chiplets 200*a* and 200*b* through a first group of the programmable interconnects 361 of the intra-chip interconnects 502 of said one of its standard commodity field programmable integrated-circuit (FPIC) chips or chiplets 200 or a first group of the programmable interconnects 361 of the intra-chip interconnects 502 of said one of the first and second field programmable integrated-circuit (IC) chips or chiplets 200*a* and 200*b*. Said one of the first or second type of field programmable switch cells 379 may pass the to-be-processed data from the first group of programmable interconnects 361 to a second group of the programmable interconnects 361 of the intra-chip interconnects 502 of said one of its standard commodity field programmable integrated-circuit (FPIC) chips or chiplets 200 or a second group of the programmable interconnects 361 of said one of the first and second field programmable integrated-circuit (IC) chips or chiplets 200*a* and 200*b* to be passed as (1) input data of the input data set of one of the programmable logic blocks (LBs) 201 of said one of its standard commodity field programmable integrated-circuit (FPIC) chips or chiplets 200, or input data of the input data set of one of the programmable logic blocks (LBs) 201 of said one of the first and second field programmable integrated-circuit (IC) chips or chiplets 200*a* and 200*b*, or (2) a data input of one of the center-processing-unit cores (CPUC) 2010 of said one of its standard commodity field programmable integrated-circuit (FPIC) chips or chiplets 200, or a data input of one of the center-processing-unit cores (CPUC) 2010 of said one of the first and second field programmable integrated-circuit (IC) chips or chiplets 200*a* and 200*b*. In the alternative scenario, the fourth one of the small I/O circuits 203 may drive the to-be-processed data to be passed as (1) input data of the input data set of one of the coarse-grained programmable logic cells or elements 2060 of any type of the first through fourth types of coarse-grained field programmable (CGFP) architectures 2070, 2170, 2090 and 2270 of said one of its standard commodity field programmable integrated-circuit (FPIC) chips or chiplets 200 or input data of the input data set of one of the coarse-grained programmable logic cells or elements 2060 of said one of the first and second field programmable integrated-circuit (IC) chips or chiplets 200*a* and 200*b* of said one of its field programmable chip-on-chip modules 400 in case of replacing its standard commodity field programmable integrated-circuit (FPIC) chips or chiplets 200, (2) input data of the second input data set of one of the four selection circuits 2073 of one of the programmable-interconnection-combined functional units 2071 or 2171 of any type of the first, second and fourth types of coarse-grained field programmable (CGFP) architectures 2070, 2170 and 2270 of said one of its standard commodity field programmable integrated-circuit (FPIC) chips or chiplets 200 or input data of the second input data set of one of the four selection circuits 2073 of one of the programmable-interconnection-combined functional units 2071 or 2171 of any type of the first, second and fourth types of coarse-grained field programmable (CGFP) architectures 2070, 2170 and 2270 of said one of the first and second field programmable integrated-circuit (IC) chips or chiplets 200*a* and 200*b*, (3) input data of the second input data set of one of the four field-programmable local-interconnection selection circuits 2074 of one of the programmable-interconnection networking units 2072 of the first type of coarse-grained field programmable (CGFP) architectures 2070 of said one of its standard commodity field programmable integrated-circuit (FPIC) chips or chiplets 200 or input data of the second input data set of one of the four field-programmable local-interconnection selection circuits 2074 of one of the programmable-interconnection networking units 2072 of the first type of coarse-grained field programmable (CGFP) architectures 2070 of said one of the first and second field programmable integrated-circuit (IC) chips or chiplets 200*a* and 200*b*, (4) input data of the second input data set of one of the four field-programmable bypass-path selection circuits 2075 of one of the programmable-interconnection networking units 2072 of the first type of coarse-grained field programmable (CGFP) architectures 2070 of said one of its standard commodity field programmable integrated-circuit (FPIC) chips or chiplets 200 or input data of the second input data set of one of the four field-programmable bypass-path selection circuits 2075 of one of the programmable-interconnection networking units 2072 of the first type of coarse-grained field programmable (CGFP) architectures 2070 of said one of the first and second field programmable integrated-circuit (IC) chips or chiplets 200*a* and 200*b*, (5) input data of the second input data set of any of the field-programmable crossbar selection circuits 2174 and 2175 of one of the programmable-interconnection-combined functional units 2171 of any type of the second and fourth types of coarse-grained field programmable (CGFP) architectures 2170 and 2270 of said one of its standard commodity field programmable integrated-circuit (FPIC) chips or chiplets 200 or input data of the second input data set of any of the field-programmable crossbar selection circuits 2174 and 2175 of one of the programmable-interconnection-combined functional units 2171 of any type of the second and fourth types of coarse-grained field programmable (CGFP) architectures 2170 and 2270 of said one of the first and second field programmable integrated-circuit (IC) chips or chiplets 200*a* and 200*b*, (6) input data of the fourth input data set of the field-programmable selection circuit 2093 of any of the look-up table (LUT) banks 2091 of the third type of coarse-grained field programmable (CGFP) architecture 2090 of said one of its standard commodity field programmable integrated-circuit (FPIC) chips or chiplets 200 or input data of the fourth input data set of the field-programmable selection circuit 2093 of any of the look-up table (LUT) banks 2091 of the third type of coarse-grained field programmable (CGFP) architecture 2090 of said one of the first and second field programmable integrated-circuit (IC) chips or chiplets 200*a* and 200*b*, or (7) input data of the fourth input data set of the decoder 2096 of any of the spare units 2095 of any of the look-up table (LUT) banks 2091 of the third type of coarse-grained field programmable (CGFP) architecture 2090 of said one of its standard commodity field programmable integrated-circuit (FPIC) chips or chiplets 200 or input data of the fourth input data set of the decoder 2096 of any of the spare units 2095 of any of the look-up table (LUT) banks 2091 of the third type of coarse-grained field programmable (CGFP) architecture 2090 of said one of the first and second field programmable integrated-circuit (IC) chips or chiplets 200*a* and 200*b*.

Alternatively, referring to FIG. 21A, for each of the first and second types of standard commodity logic drives 300 as illustrated in FIGS. 19A and 19B, a first one of the programmable logic blocks (LBs) 201 of a first one of its standard commodity field programmable integrated-circuit (FPIC) chips or chiplets 200, or a first one of the programmable logic blocks (LBs) 201 of one of the first and second field programmable integrated-circuit (IC) chips or chiplets

200*a* and 200*b* of a first one of its field programmable chip-on-chip modules 400 in case of replacing its standard commodity field programmable integrated-circuit (FPIC) chips or chiplets 200, or a first one of the center-processing-unit cores (CPUC) 2010 of the first one of its standard commodity field programmable integrated-circuit (FPIC) chips or chiplets 200, or a first one of the center-processing-unit cores (CPUC) 2010 of said one of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, may have the data output to be passed to a first one of the first or second type of field programmable switch cells 379 of the first one of its standard commodity field programmable integrated-circuit (FPIC) chips or chiplets 200, or a first one of the first or second type of field programmable switch cells 379 of said one of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, via a first group of the programmable interconnects 361 of the intra-chip interconnects 502 of the first one of its standard commodity field programmable integrated-circuit (FPIC) chips or chiplets 200, or a first group of the programmable interconnects 361 of the intra-chip interconnects 502 of said one of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200. The first one of the first or second type of field programmable switch cells 379 may pass the data output of the first one of the programmable logic blocks (LBs) 201 or the data output of the first one of the center-processing-unit cores (CPUC) 2010 from the first group of the programmable interconnects 361 to a second group of the programmable interconnects 361 of the intra-chip interconnects 502 of the first one of its standard commodity field programmable integrated-circuit (FPIC) chips or chiplets 200, or a second group of the programmable interconnects 361 of the intra-chip interconnects 502 of said one of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, to be passed to a first one of the small I/O circuits 203 of the first one of its standard commodity field programmable integrated-circuit (FPIC) chips or chiplets 200 or a first one of the small I/O circuits 203 of said one of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200. In the alternative scenario, a first one of the coarse-grained programmable logic cells or elements 2060 of any type of the first through fourth types of coarse-grained field programmable (CGFP) architectures 2070, 2170, 2090 and 2270 of the first one of its standard commodity field programmable integrated-circuit (FPIC) chips or chiplets 200 or a first one of the coarse-grained programmable logic cells or elements 2060 of any type of the first through fourth types of coarse-grained field programmable (CGFP) architectures 2070, 2170, 2090 and 2270 of said one of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200 may have the data output to be passed to the first one of the small I/O circuits 203; one of the four selection circuits 2073 of one of the programmable-interconnection-combined functional units 2071 or 2171 of any type of the first, second and fourth types of coarse-grained field programmable (CGFP) architectures 2070, 2170 and 2270 of the first one of its standard commodity field programmable integrated-circuit (FPIC) chips or chiplets 200 or one of the four selection circuits 2073 of one of the programmable-interconnection-combined functional units 2071 or 2171 of any type of the first, second and fourth types of coarse-grained field programmable (CGFP) architectures 2070, 2170 and 2270 of said one of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200 may have the output data set having a data output to be passed to the first one of the small I/O circuits 203; one of the four field-programmable local-interconnection selection circuits 2074 of one of the programmable-interconnection networking units 2072 of the first type of coarse-grained field programmable (CGFP) architectures 2070 of the first one of its standard commodity field programmable integrated-circuit (FPIC) chips or chiplets 200 or one of the four field-programmable local-interconnection selection circuits 2074 of one of the programmable-interconnection networking units 2072 of the first type of coarse-grained field programmable (CGFP) architectures 2070 of said one of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200 may have the output data set having a data output to be passed to the first one of the small I/O circuits 203; one of the four field-programmable bypass-path selection circuits 2075 of one of the programmable-interconnection networking units 2072 of the first type of coarse-grained field programmable (CGFP) architectures 2070 of the first one of its standard commodity field programmable integrated-circuit (FPIC) chips or chiplets 200 or one of the four field-programmable bypass-path selection circuits 2075 of one of the programmable-interconnection networking units 2072 of the first type of coarse-grained field programmable (CGFP) architectures 2070 of said one of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200 may have the output data set having a data output to be passed to the first one of the small I/O circuits 203; any of the field-programmable crossbar selection circuits 2174 and 2175 of one of the programmable-interconnection-combined functional units 2171 of any type of the second and fourth types of coarse-grained field programmable (CGFP) architectures 2170 and 2270 of the first one of its standard commodity field programmable integrated-circuit (FPIC) chips or chiplets 200 or any of the field-programmable crossbar selection circuits 2174 and 2175 of one of the programmable-interconnection-combined functional units 2171 of any type of the second and fourth types of coarse-grained field programmable (CGFP) architectures 2170 and 2270 of said one of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200 may have the data output to be passed to the first one of the small I/O circuits 203; the field-programmable selection circuit 2093 of any of the look-up table (LUT) banks 2091 of the third type of coarse-grained field programmable (CGFP) architecture 2090 of the first one of its standard commodity field programmable integrated-circuit (FPIC) chips or chiplets 200 or the field-programmable selection circuit 2093 of any of the look-up table (LUT) banks 2091 of the third type of coarse-grained field programmable (CGFP) architecture 2090 of said one of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200 may have the first output data set having a data output to be passed to the first one of the small I/O circuits 203; the decoder 2096 of any of the spare units 2095 of any of the look-up table (LUT) banks 2091 of the third type of coarse-grained field programmable (CGFP) architecture 2090 of the first one of its standard commodity field programmable integrated-circuit (FPIC) chips or chiplets 200 or the decoder 2096 of any of the spare units 2095 of any of the look-up table (LUT) banks 2091 of the third type of coarse-grained field programmable (CGFP) architecture 2090 of said one of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200 may have an output data set at the second group of output points of the decoder 2096 having a data output to be passed to the first one of the small I/O circuits 203. The first one of the small I/O circuits 203 may drive to-be-processed data or data-information-memory (DIM) data, i.e., the data output of the first one of the programmable logic blocks (LBs) 201, the data output of the first one of the center-processing-unit cores (CPUC) 2010, the data output of the first one of the coarse-grained programmable logic cells or elements 2060 of said any type of the first through fourth types of coarse-grained field programmable (CGFP) architectures 2070, 2170, 2090 and 2270, the data output of said one of the four selection circuits 2073, the data output of said one of the four field-programmable local-interconnection selection circuits 2074, the data output of said one of the four field-programmable bypass-path selection circuits 2075, the data output of said any of the field-programmable crossbar selection circuits 2174 and 2175, the data output of the field-programmable selection circuit 2093 of said any of the look-up table (LUT) banks 2091 or the data output of the decoder 2096 of said any of the spare units 2095, to a second one of the small I/O circuits 203 of one of its DPIIC chips 410 via one or more of the programmable interconnects 361 of its inter-chip interconnects 371. The second one of the small I/O circuits 203 may drive the data-information-memory (DIM) stream to a second one of the first or second type of field programmable switch cells 379 of said one of its DPIIC chips 410 via a third group of the programmable interconnects 361 of the intra-chip interconnects of said one of its DPIIC chips 410. The second one of the first or second type of field programmable switch cells 379 may pass the to-be-processed data from the third group of the programmable interconnects 361 to a fourth group of the programmable interconnects 361 of the intra-chip interconnects of said one of its DPIIC chips 410 to be passed to a third one of the small I/O circuits 203 of said one of its DPIIC chips 410. The third one of the small I/O circuits 203 may drive the to-be-processed data to a fourth one of the small I/O circuits 203 of a second one of its standard commodity field programmable integrated-circuit (FPIC) chips or chiplets 200, or a fourth one of the small I/O circuits 203 of one of the first and second field programmable integrated-circuit (IC) chips or chiplets 200*a* and 200*b* of a second one of its field programmable chip-on-chip modules 400 in case of replacing its standard commodity field programmable integrated-circuit (FPIC) chips or chiplets 200, via one or more of the programmable interconnects 361 of its inter-chip interconnects 371. The fourth one of the small I/O circuits 203 may drive the to-be-processed data to a third one of the first or second type of field programmable switch cells 379 of the second one of its standard commodity field programmable integrated-circuit (FPIC) chips or chiplets 200, or a third one of the first or second type of field programmable switch cells 379 of said one of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, via a fifth group of the programmable interconnects 361 of the intra-chip interconnects 502 of the second one of its standard commodity field programmable integrated-circuit (FPIC) chips or chiplets 200, or a fifth group of the programmable interconnects 361 of the intra-chip interconnects 502 of said one of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200. The third one of the first or second type of field programmable switch cells 379 may pass the to-be-processed data from the fifth group of the programmable interconnects 361 to a sixth group of the programmable interconnects 361 of the intra-chip interconnects 502 of the second one of its standard commodity field programmable integrated-circuit (FPIC) chips or chiplets 200, or a sixth group of the programmable interconnects 361 of the intra-chip interconnects 502 of said one of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, to be passed as (1) input data of the input data set of one of the programmable logic blocks (LBs) 201 of the second one of its standard commodity field programmable integrated-circuit (FPIC) chips or chiplets 200, or input data of the input data set of one of the programmable logic blocks (LBs) 201 of said one of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, or (2) a data input of one of the center-processing-unit cores (CPUC) 2010 of the second one of its standard commodity field programmable integrated-circuit (FPIC) chips or chiplets 200, or a data input of one of the center-processing-unit cores (CPUC) 2010 of said one of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200. In the alternative scenario, the fourth one of the small I/O circuits 203 may drive the to-be-processed data to be passed as input data of the input data set of a second one of the coarse-grained programmable logic cells or elements 2060 of any type of the first through fourth types of coarse-grained field programmable (CGFP) architectures 2070, 2170, 2090 and 2270 of the second one of its standard commodity field programmable integrated-circuit (FPIC) chips or chiplets 200 or input data of the input data set of a second one of the coarse-grained programmable logic cells or elements 2060 of any type of the first through fourth types of coarse-grained field programmable (CGFP) architectures 2070, 2170, 2090 and 2270 of said one of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200.

Alternatively, referring to FIG. 21A, for each of the first and second types of standard commodity logic drives 300 as illustrated in FIGS. 19A and 19B, one of the programmable logic blocks (LBs) 201 of one of its standard commodity field programmable integrated-circuit (FPIC) chips or chiplets 200, or one of the programmable logic blocks (LBs) 201 of one of the first and second field programmable integrated-circuit (IC) chips or chiplets 200*a* and 200*b* of one of its field programmable chip-on-chip modules 400 in case of replacing its standard commodity field programmable integrated-circuit (FPIC) chips or chiplets 200, or one of the center-processing-unit cores (CPUC) 2010 of said one of its standard commodity field programmable integrated-circuit (FPIC) chips or chiplets 200, or one of the center-processing-unit cores (CPUC) 2010 of said one of the first and second field programmable integrated-circuit (IC) chips or chiplets 200*a* and 200*b* of said one of its field programmable chip-on-chip modules 400 in case of replacing its standard commodity field programmable integrated-circuit (FPIC) chips or chiplets 200, may have the data output to be passed to one of the first or second type of field programmable switch cells 379 of said one of its standard commodity field programmable integrated-circuit (FPIC) chips or chiplets 200, or one of the first or second type of field programmable switch cells 379 of said one of the first and second field programmable integrated-circuit (IC) chips or chiplets 200*a* and 200*b* of said one of its field programmable chip-on-chip modules 400 in case of replacing its standard commodity field programmable integrated-circuit (FPIC) chips or chiplets 200, via a first group of the programmable interconnects 361 of the intra-chip interconnects 502 of said one of its standard commodity field programmable integrated-circuit (FPIC) chips or chiplets 200, or a first group of the programmable interconnects 361 of the intra-chip interconnects 502 of said one of the first and second field programmable integrated-circuit (IC) chips or chiplets 200*a* and 200*b* of said one of its field programmable chip-on-chip modules 400 in case of replacing its standard commodity field programmable integrated-circuit (FPIC) chips or chiplets 200. Said one of the first or second type of field programmable switch cells 379 may pass the data output of said one of the programmable logic blocks (LBs) 201 or the data output of said one of the center-processing-unit cores (CPUC) 2010 from the first group of the programmable interconnects 361 to a second group of the programmable interconnects 361 of the intra-chip interconnects 502 of said one of its standard commodity field programmable integrated-circuit (FPIC) chips or chiplets 200, or a second group of the programmable interconnects 361 of the intra-chip interconnects 502 of said one of the first and second field programmable integrated-circuit (IC) chips or chiplets 200*a* and 200*b* of said one of its field programmable chip-on-chip modules 400 in case of replacing its standard commodity field programmable integrated-circuit (FPIC) chips or chiplets 200, to be passed to a first one of the small I/O circuits 203 of said one of its standard commodity field programmable integrated-circuit (FPIC) chips or chiplets 200 or a first one of the small I/O circuits 203 of said one of the first and second field programmable integrated-circuit (IC) chips or chiplets 200*a* and 200*b* of said one of its field programmable chip-on-chip modules 400 in case of replacing its standard commodity field programmable integrated-circuit (FPIC) chips or chiplets 200. In the alternative scenario, one of the coarse-grained programmable logic cells or elements 2060 of any type of the first through fourth types of coarse-grained field programmable (CGFP) architectures 2070, 2170, 2090 and 2270 of said one of its standard commodity field programmable integrated-circuit (FPIC) chips or chiplets 200 or one of the coarse-grained programmable logic cells or elements 2060 of any type of the first through fourth types of coarse-grained field programmable (CGFP) architectures 2070, 2170, 2090 and 2270 of said one of the first and second field programmable integrated-circuit (IC) chips or chiplets 200*a* and 200*b* of said one of its field programmable chip-on-chip modules 400 in case of replacing its standard commodity field programmable integrated-circuit (FPIC) chips or chiplets 200 may have the data output to be passed to the first one of the small I/O circuits 203. The first one of the small I/O circuits 203 may drive to-be-processed data or data-information-memory (DIM) data, i.e., the data output of the first one of the programmable logic blocks (LBs) 201, the data output of the first one of the center-processing-unit cores (CPUC) 2010 or the data output of the first one of the coarse-grained programmable logic cells or elements 2060 of said any type of the first through fourth types of coarse-grained field programmable (CGFP) architectures 2070, 2170, 2090 and 2270, to a second one of the small I/O circuits 203 of any of its dedicated I/O chips 265 or a second one of the small I/O circuits 203 of any of its CS-I/O chips 411*e* via one or more of the programmable interconnects 361 of its inter-chip interconnects 371. The second one of the small I/O circuits 203 may drive the to-be-processed data to one of the large I/O circuits 341 of said any of its dedicated I/O chips 265 or one of the large I/O circuits 341 of said any of its CS-I/O chips 411*e* to be passed to external circuitry 271 outside said each of the first and second types of standard commodity logic drives 300.

Referring to FIG. 21A, for each of the first and second types of standard commodity logic drives 300 as illustrated in FIGS. 19A and 19B, the external circuitry 271 outside said each of the first and second types of standard commodity logic drives 300 may not be allowed to reload data from any of its NVM IC chips 250. Alternatively, the external circuitry 271 outside said each of the first and second types of standard commodity logic drives 300 may be allowed to reload data from any of its NVM IC chips 250.

Figure 21B:
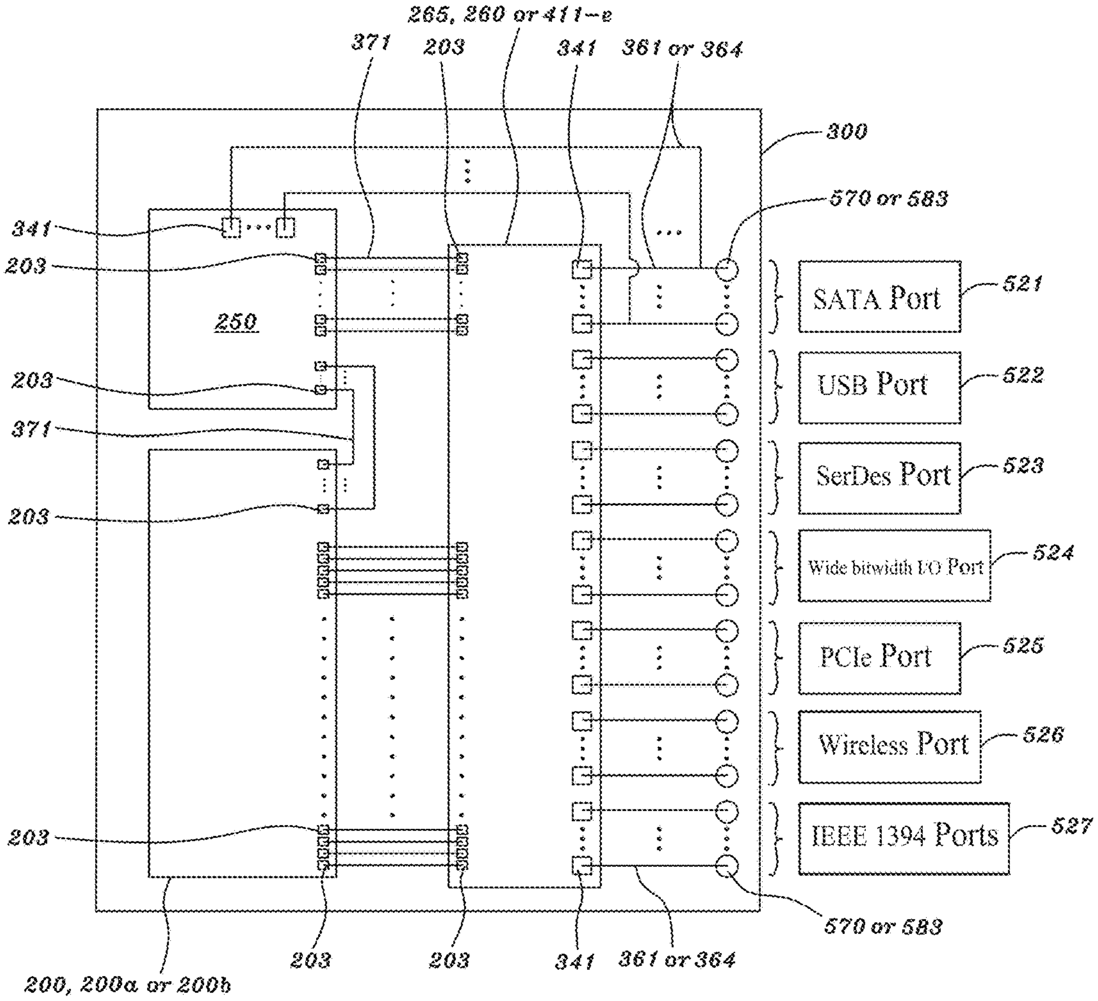
FIG. 21B is a block diagram showing interconnection in a standard commodity logic drive in accordance with an embodiment of the present application.
Figure 28:
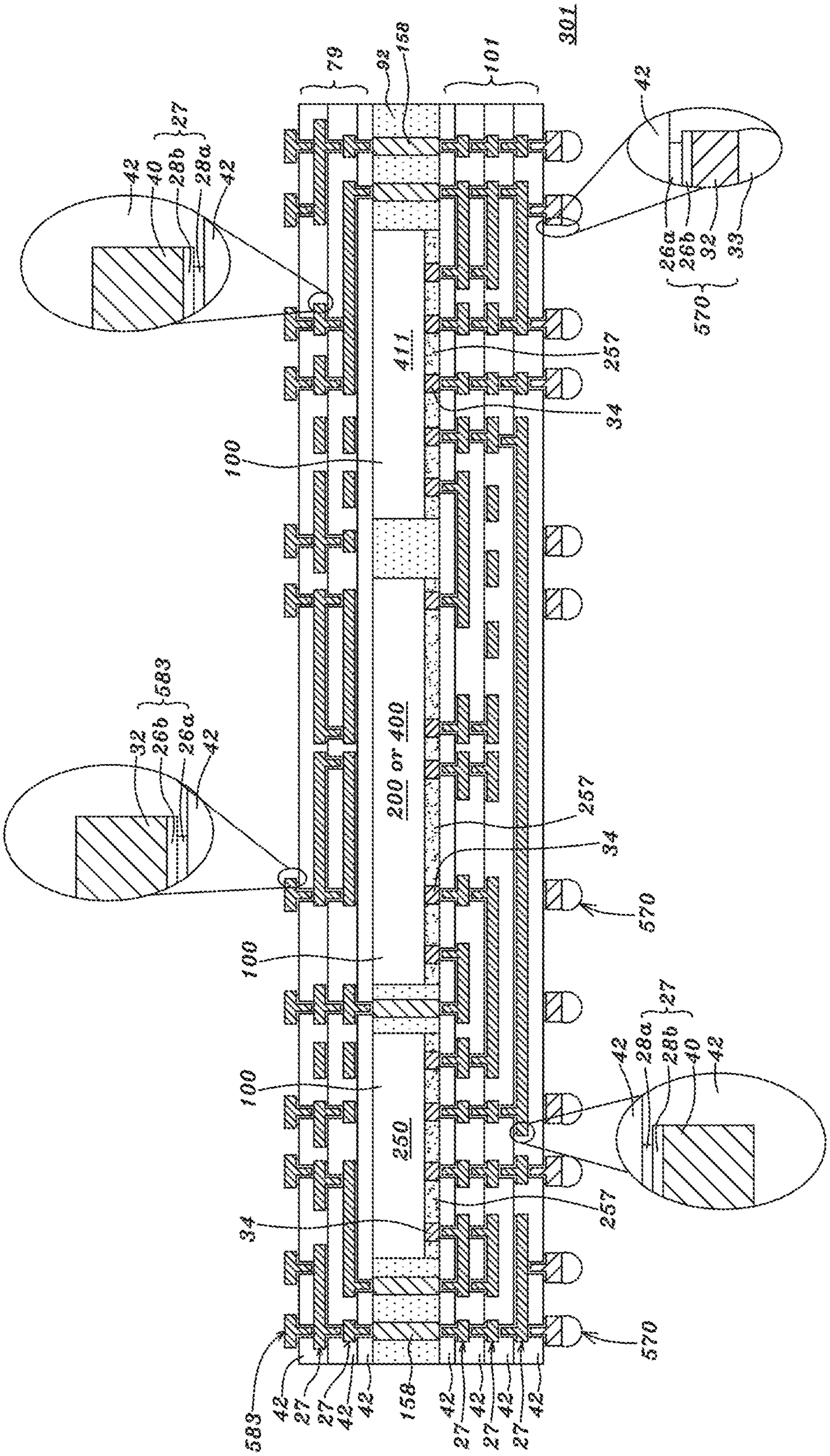
FIGS. 28-33 are schematically cross-sectional views showing various types of chip packages in accordance with an embodiment of the present application.
Figure 29:
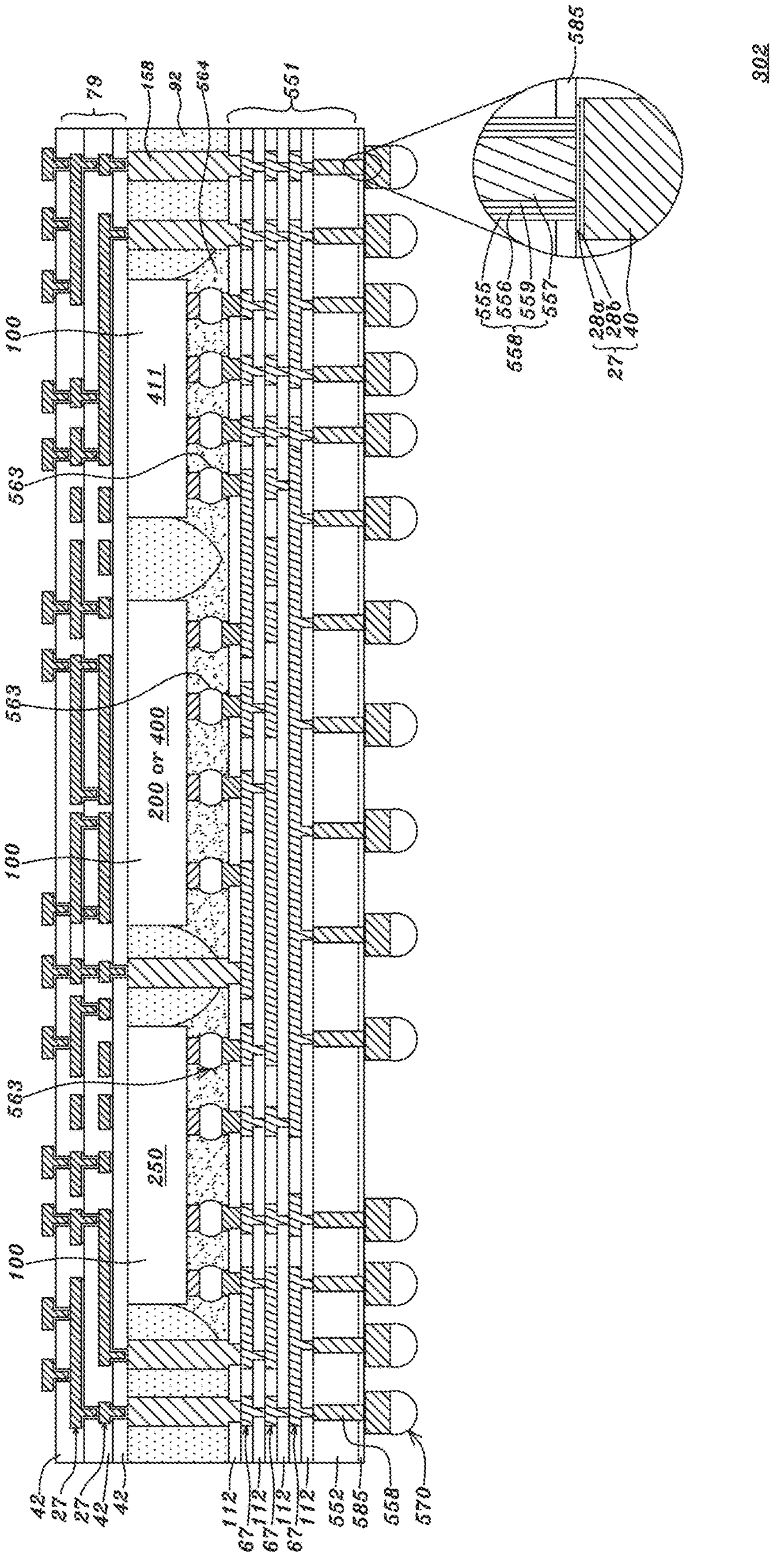
Figure 30:
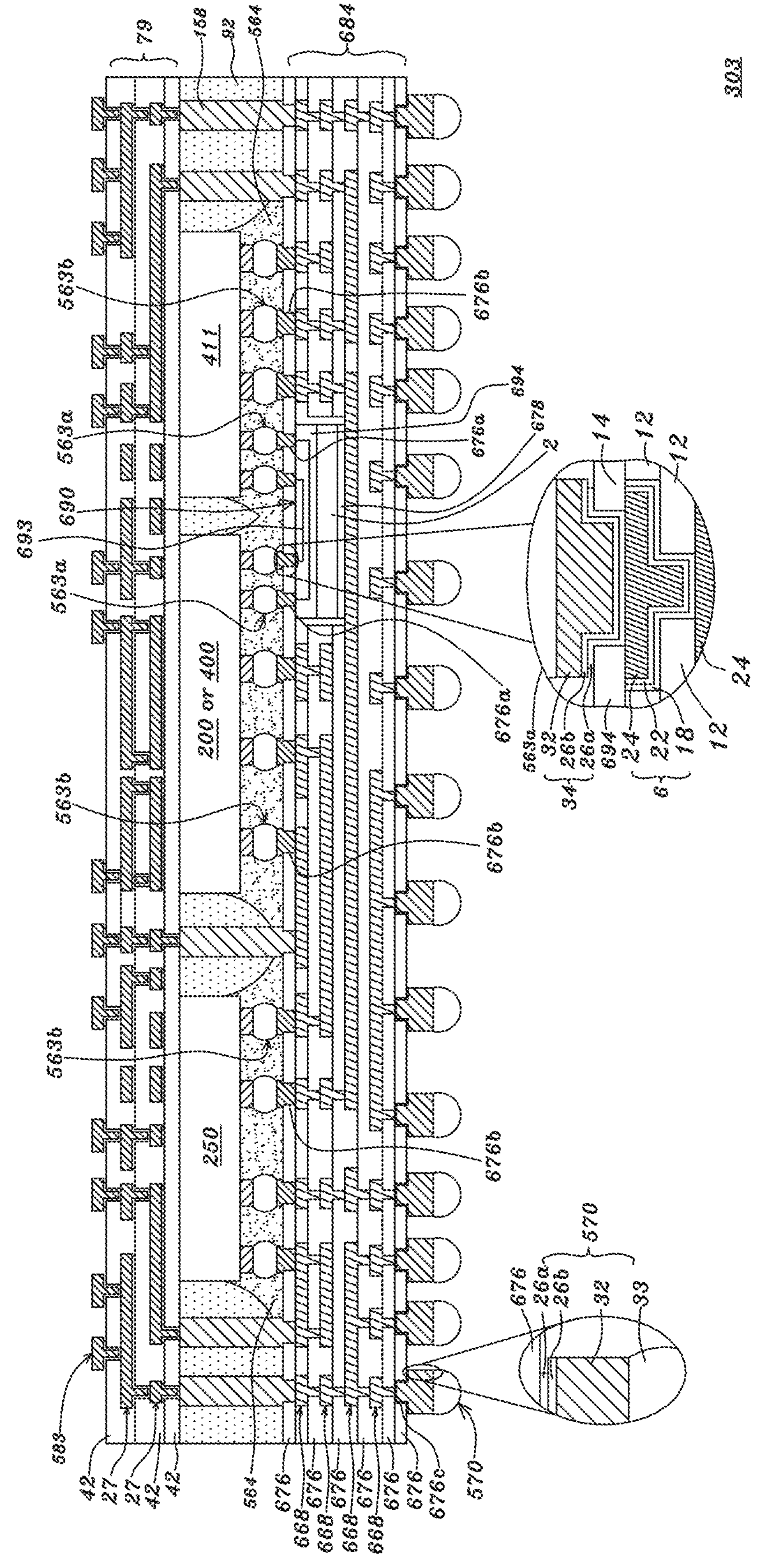

FIG. 21B is a block diagram showing interconnection in a standard commodity logic drive in accordance with an embodiment of the present application. Referring to FIG. 19B, for each of the first and second types of standard commodity logic drives 300 as illustrated in FIGS. 19A and 19B, each of its dedicated I/O chips 265 and control and I/O chip 260 or its CS-I/O chips 411*e* may include (1) a first group of small I/O circuits 203 as illustrated in FIG. 16B each having the node 381 coupling to the node 381 of one of a first group of small I/O circuits 203 of any of its field programmable integrated-circuit (FPIC) chips or chiplets 200, or the node 381 of one of a first group of small I/O circuits 203 of either of the first and second field programmable integrated-circuit (IC) chips or chiplets 200*a* and 200*b* of any of its field programmable chip-on-chip modules 400 in case of replacing its standard commodity field programmable integrated-circuit (FPIC) chips or chiplets 200, through any of the programmable and non-programmable interconnects 361 and 364 of a first group of its inter-chip interconnect 371 and (2) a second group of small I/O circuits 203 each having the node 381 coupling to the node 381 of one of a first group of small I/O circuits 203 of any of its NVM IC chips 250 through any of the programmable and non-programmable interconnects 361 and 364 of a second group of its inter-chip interconnect 371. Said any of its field programmable integrated-circuit (FPIC) chips or chiplets 200, or said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200, may include a second group of small I/O circuits 203 as illustrated in FIG. 16B each having the node 381 coupling to the node 381 of one of a second group of small I/O circuits 203 of said any of its NVM IC chips 250 through any of the programmable and non-programmable interconnects 361 and 364 of a third group of its inter-chip interconnect 371. Said each of its dedicated I/O chips 265 and control and I/O chip 260 or its CS-I/O chips 411*e* may include (1) a first group of large I/O circuits 341 as illustrated in FIG. 16A each having the node 281 coupling to one of its metal bumps, pillars or pads 570 or metal pads 583 as seen in FIGS. 28-30 for one or more serial-advanced-technology-attachment (SATA) ports 521 and to the node 281 of one of the large I/O circuits 341 of said any of its NVM IC chips 250 through any of the programmable and non-programmable interconnects 361 and 364 of a fourth group of its inter-chip interconnect 371, (2) a second group of large I/O circuits 341 each having the node 281 coupling to one of its metal bumps, pillars or pads 570 or metal pads 583 for one or more universal serial bus (USB) ports 522, (3) a third group of large I/O circuits 341 each having the node 281 coupling to one of its metal bumps, pillars or pads 570 or metal pads 583 for one or more serializer/deserializer (SerDes) ports 523, (4) a fourth group of large I/O circuits 341 each having the node 281 coupling to one of its metal bumps, pillars or pads 570 or metal pads 583 for one or more wide input/output (I/O) ports 524, (5) a fifth group of large I/O circuits 341 each having the node 281 coupling to one of its metal bumps, pillars or pads 570 or metal pads 583 for one or more peripheral-components-interconnect express (PCIe) ports 525, (6) a sixth group of large I/O circuits 341 each having the node 281 coupling to one of its metal bumps, pillars or pads 570 or metal pads 583 for one or more wireless ports 526 and (7) a seventh group of large I/O circuits 341 each having the node 281 coupling to one of its metal bumps, pillars or pads 570 or metal pads 583 for one or more IEEE 1394 ports 527.

Referring to FIG. 21B, for each of the first and second types of standard commodity logic drives 300 as illustrated in FIGS. 19A and 19B, each of its dedicated I/O chips 265 and control and I/O chip 260 or its CS-I/O chips 411*e* may include a buffer and/or driver circuits for latching or storing (1) CPM data, i.e., the resulting values or programming codes, therein downloaded from any of its non-volatile memory (NVM) IC chips 250 with a first interface via one or more of the non-programmable interconnects 364 of its intra-chip interconnects 502 in case for the first type of fined-grained field programmable logic cell or element (LCE) 2014 as illustrated in FIG. 2A, (2) CPM data, i.e., the resulting values, therein downloaded from any of its non-volatile memory (NVM) IC chips 250 with a first interface via one or more of the non-programmable interconnects 364 of its intra-chip interconnects 502 in case for the second type of fined-grained field programmable logic cell or element (LCE) 2014 as illustrated in FIG. 2B, (3) CPM data, i.e., the resulting values, therein downloaded from any of its non-volatile memory (NVM) IC chips 250 with a first interface via one or more of the non-programmable interconnects 364 of its intra-chip interconnects 502 in case for the third type of fined-grained field programmable logic cell or element (LCE) 2014 as illustrated in FIG. 2C, (4) CPM data, i.e., the instruction sets, therein downloaded from any of its non-volatile memory (NVM) IC chips 250 with a first interface via one or more of the non-programmable interconnects 364 of its intra-chip interconnects 502 in case for the coarse-grained reconfigurable architecture (CGRA) 2041 as illustrated in FIG. 4, (5) CPM data, i.e., the resulting values or data or programming codes, therein downloaded from any of its non-volatile memory (NVM) IC chips 250 with a first interface via one or more of the non-programmable interconnects 364 of its intra-chip interconnects 502 in case for the coarse-grained programmable logic cells or elements (LCEs) 2060 as illustrated in FIGS. 5A-5D and 6, (6) CPM data, i.e., the resulting values or data or programmable codes, therein downloaded from any of its non-volatile memory (NVM) IC chips 250 with a first interface via one or more of the non-programmable interconnects 364 of its intra-chip interconnects 502 in case for any type of the first through fourth types of coarse-grained field programmable (CGFP) architectures 2070, 2170, 2090 and 2270 as illustrated in FIGS. 5A-15, (7) CPM data, i.e., the programming codes, therein downloaded from any of its non-volatile memory (NVM) IC chips 250 with a first interface via one or more of the non-programmable interconnects 364 of its intra-chip interconnects 502 in case for the first or second type of field programmable switch cells 379 as illustrated in FIGS. 3A and 3B, (8) CPM data, i.e., the programming codes, therein downloaded from any of its non-volatile memory (NVM) IC chips 250 with a first interface via one or more of the non-programmable interconnects 364 of its intra-chip interconnects 502 in case for the four selection circuits 2073 of any of the programmable-interconnection-combined functional units 2071 or 2171 of any type of the first, second and fourth types of coarse-grained field programmable (CGFP) architectures 2070, 2170 and 2270 as illustrated in FIGS. 7-15, for the four field-programmable local-interconnection selection circuits 2074 and four field-programmable bypass-path selection circuits 2075 of any of the programmable-interconnection networking units 2072 of the first type of coarse-grained field programmable (CGFP) architecture 2070 as illustrated in FIGS. 7-9, for the field-programmable crossbar selection circuits 2174 and 2175 of any of the programmable-interconnection-combined functional units 2171 of any type of the second and fourth types of coarse-grained field programmable (CGFP) architectures 2170 and 2270 as illustrated in FIGS. 10-11C, for the field-programmable selection circuit 2093 of any of the look-up table (LUT) banks 2091 of the third type of coarse-grained field programmable (CGFP) architecture 2090 as illustrated in FIG. 13 and/or for the decoder 2096 of any of the spare units 2095 of any of the look-up table (LUT) banks

2091 of the third type of coarse-grained field programmable (CGFP) architecture 2090 as illustrated in FIGS. 13 and 14. Further, for any of the field programmable integrated-circuit (FPIC) chips or chiplets 200 of said each of the first and second types of standard commodity logic drives 300, or either of the first and second field programmable integrated-circuit (IC) chips or chiplets 200*a* and 200*b* of any of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, the buffer and/or driver circuits of each of the dedicated I/O chips 265 and control and I/O chip 260 or the CS-I/O chips 411*e* of said each of the first and second types of standard commodity logic drives 300 may amplify the CPM data to be passed with a second interface to (1) multiple of the memory cells 490 of one or more of its programmable logic blocks (LBs) 201 in case for the first type of fined-grained field programmable logic cell or element (LCE) 2014 as illustrated in FIG. 2A to be stored therein for configuring or programming said one or more of its programmable logic blocks (LBs) 201, (2) multiple of the memory cells of one or more of its programmable logic blocks (LBs) 201 in case for the second type of fined-grained field programmable logic cell or element (LCE) 2014 as illustrated in FIG. 2B to be stored therein for configuring or programming said one or more of its programmable logic blocks (LBs) 201, (3) multiple of the first and second sets of memory cells of one or more of its programmable logic blocks (LBs) 201 in case for the third type of fined-grained field programmable logic cell or element (LCE) 2014 as illustrated in FIG. 2C to be stored therein for configuring or programming said one or more of its programmable logic blocks (LBs) 201, (4) multiple of the third memory cells of the instruction memory block or section 2049 of one or more of its programmable logic blocks (LBs) 201 in case for the coarse-grained reconfigurable architecture (CGRA) 2041 as illustrated in FIG. 4 to be stored therein for configuring or programming said one or more of its programmable logic blocks (LBs) 201, (5) multiple of the third type of static random-access memory (SRAM) cells 398 of one or more of its programmable logic blocks (LBs) 201 in case for the coarse-grained programmable logic cells or elements (LCEs) 2060 as illustrated in FIGS. 5A-5D and 6 to be stored therein for configuring or programming said one or more of its programmable logic blocks (LBs) 201, (6) multiple of the third type of static random-access memory (SRAM) cells 398 of one or more of the coarse-grained programmable logic cells or elements (LCEs) 2060 of any type of the first through fourth types of its coarse-grained field programmable (CGFP) architectures 2070, 2170, 2090 and 2270 as illustrated in FIGS. 5A-15 to be stored therein for configuring or programming said one or more of the coarse-grained programmable logic cells or elements (LCEs) 2060, (7) multiple of the memory cells 362 of one or more of its first or second type of field programmable switch cells 379 as illustrated in FIGS. 3A and 3B to be stored therein for configuring or programming said one or more of its first or second type of field programmable switch cells 379, (8) multiple of the interconnection-programming memory cells of any type of its first, second, third and fourth types of coarse-grained field programmable (CGFP) architectures 2070, 2170, 2090 and 2270 as illustrated in FIGS. 7-15 to be stored therein for configuring or programming the four selection circuits 2073 of any of the programmable-interconnection-combined functional units 2071 or 2171 of any type of its first, second and fourth types of coarse-grained field programmable (CGFP) architectures 2070, 2170 and 2270 as illustrated in FIGS. 7-15, the four field-programmable local-interconnection selection circuits 2074 and four field-programmable bypass-path selection circuits 2075 of any of the programmable-interconnection networking units 2072 of its first type of coarse-grained field programmable (CGFP) architecture 2070 as illustrated in FIGS. 7-9, the field-programmable crossbar selection circuits 2174 and 2175 of any of the programmable-interconnection-combined functional units 2171 of any type of its second and fourth types of coarse-grained field programmable (CGFP) architectures 2170 and 2270 as illustrated in FIGS. 10-11C, the field-programmable selection circuit 2093 of any of the look-up table (LUT) banks 2091 of its third type of coarse-grained field programmable (CGFP) architecture 2090 as illustrated in FIG. 13 and/or for the decoder 2096 of any of the spare units 2095 of any of the look-up table (LUT) banks 2091 of its third type of coarse-grained field programmable (CGFP) architecture 2090 as illustrated in FIGS. 13 and 14. In a first example, the first interface may have a first bit-width of 1 bit in a standard of serial advanced technology attachment (SATA) and the second interface may have a second bit width equal to or more than 4, 8, 16, 32 or 64 and greater than the first bit-width. In a second example, the first interface may have a third bit-width of 32 bits in a standard of peripheral component interconnect express (PCIe) and the second interface may have a fourth bit width equal to or more than 64, 128 or 256 and greater than the third bit-width.

Data and Control Buses for Expandable Logic Scheme Based on Standard Commodity Field Programmable Integrated-Circuit (FPIC) Chips and/or High Bandwidth Memory (HBM) IC Chips FIG. 22 is a block diagram illustrating multiple control buses for one or more standard commodity field programmable integrated-circuit (FPIC) chips and multiple data buses for an expandable logic scheme based on one or more standard commodity field programmable integrated-circuit (FPIC) chips and high bandwidth memory (HBM) IC chips in accordance with the present application. Referring to FIG. 22, for each of the first and second types of standard commodity logic drives 300 as illustrated in FIGS. 19A and 19B, multiple control buses 416 may be constructed each from multiple of the programmable interconnects 361 of its inter-chip interconnects 371 or multiple of the non-programmable interconnects 364 of its inter-chip interconnects 371. One of its control buses 416 may couple the IS1 pads 231 of all of its standard commodity field programmable integrated-circuit (FPIC) chips or chiplets 200 as illustrated in either FIG. 17A or 17B, or the IS1 pads 231 of both of the first and second field programmable integrated-circuit (IC) chips or chiplets 200*a* and 200*b* of all of its field programmable chip-on-chip modules 400 in case of replacing its standard commodity field programmable integrated-circuit (FPIC) chips or chiplets 200, to each other or one another. Another of its control buses 416 may couple the IS2 pads 231 of all of its standard commodity field programmable integrated-circuit (FPIC) chips or chiplets 200, or the IS2 pads 231 of both of the first and second field programmable integrated-circuit (IC) chips or chiplets 200*a* and 200*b* of all of its field programmable chip-on-chip modules 400 in case of replacing its standard commodity field programmable integrated-circuit (FPIC) chips or chiplets 200, to each other or one another. Another of its control buses 416 may couple the IS3 pads 231 of all of its standard commodity field programmable integrated-circuit (FPIC) chips or chiplets

200, or the IS3 pads 231 of both of the first and second field programmable integrated-circuit (IC) chips or chiplets 200*a* and 200*b* of all of its field programmable chip-on-chip modules 400 in case of replacing its standard commodity field programmable integrated-circuit (FPIC) chips or chiplets 200, to each other or one another. Another of its control buses 416 may couple the IS4 pads 231 of all of its standard commodity field programmable integrated-circuit (FPIC) chips or chiplets 200, or the IS4 pads 231 of both of the first and second field programmable integrated-circuit (IC) chips or chiplets 200*a* and 200*b* of all of its field programmable chip-on-chip modules 400 in case of replacing its standard commodity field programmable integrated-circuit (FPIC) chips or chiplets 200, to each other or one another. Another of its control buses 416 may couple the OS1 pads 232 of all of its standard commodity field programmable integrated-circuit (FPIC) chips or chiplets 200, or the OS1 pads 232 of both of the first and second field programmable integrated-circuit (IC) chips or chiplets 200*a* and 200*b* of all of its field programmable chip-on-chip modules 400 in case of replacing its standard commodity field programmable integrated-circuit (FPIC) chips or chiplets 200, to each other or one another. Another of its control buses 416 may couple the OS2 pads 232 of all of its standard commodity field programmable integrated-circuit (FPIC) chips or chiplets 200 to each other or one another. Another of its control buses 416 may couple the OS3 pads 232 of all of its standard commodity field programmable integrated-circuit (FPIC) chips or chiplets 200, or the OS3 pads 232 of both of the first and second field programmable integrated-circuit (IC) chips or chiplets 200*a* and 200*b* of all of its field programmable chip-on-chip modules 400 in case of replacing its standard commodity field programmable integrated-circuit (FPIC) chips or chiplets 200, to each other or one another. Another of its control buses 416 may couple the OS4 pads 232 of all of its standard commodity field programmable integrated-circuit (FPIC) chips or chiplets 200, or the OS4 pads 232 of both of the first and second field programmable integrated-circuit (IC) chips or chiplets 200*a* and 200*b* of all of its field programmable chip-on-chip modules 400 in case of replacing its standard commodity field programmable integrated-circuit (FPIC) chips or chiplets 200, to each other or one another.

Referring to FIG. 22, for each of the first and second types of standard commodity logic drives 300 as illustrated in FIGS. 19A and 19B, multiple chip-enable (CE) lines 417 may be constructed each from multiple of the programmable interconnects 361 of its inter-chip interconnects 371 or multiple of the non-programmable interconnects 364 of its inter-chip interconnects 371 to couple to the chip-enable (CE) pad 209 of one of its standard commodity field programmable integrated-circuit (FPIC) chips or chiplets 200, or the chip-enable (CE) pad 209 of either of the first and second field programmable integrated-circuit (IC) chips or chiplets 200*a* and 200*b* of one of its field programmable chip-on-chip modules 400 in case of replacing its standard commodity field programmable integrated-circuit (FPIC) chips or chiplets 200.

Figure 23A:
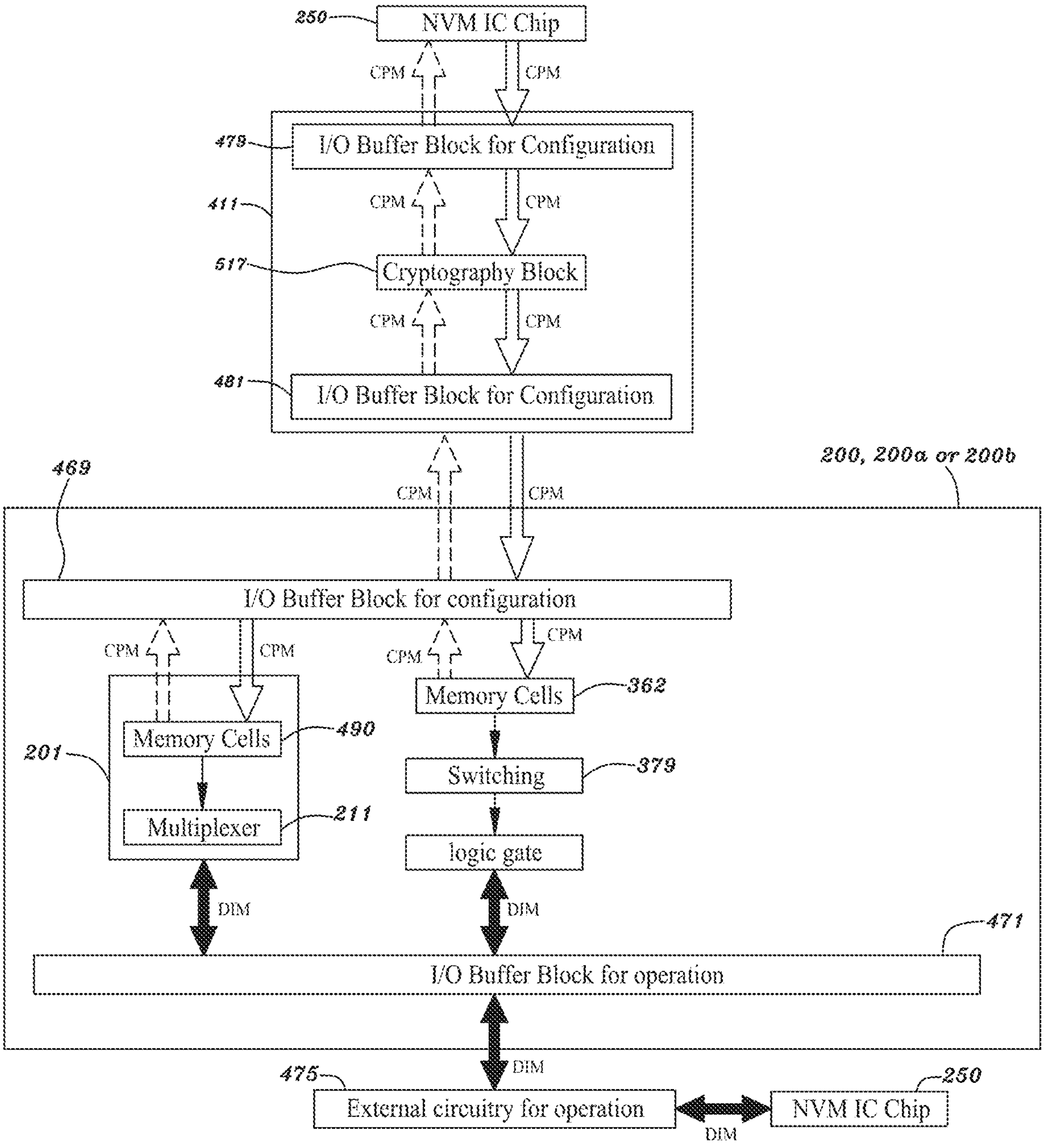
FIGS. 23A-23C are various block diagrams showing various architectures of programming and operation for a standard commodity field programmable integrated-circuit (FPIC) chip in accordance with an embodiment of the present application.
Figure 23B:
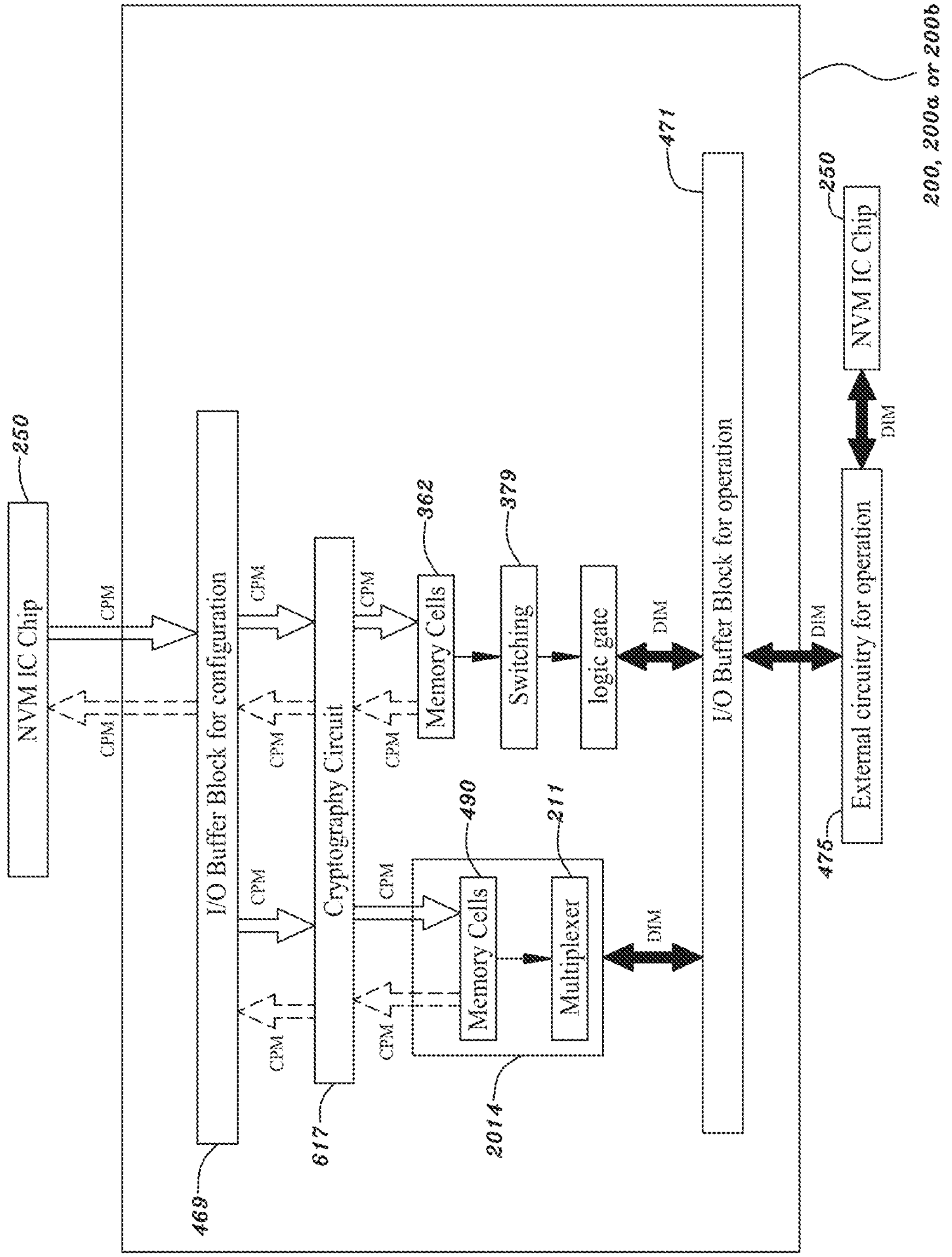
Figure 23C:
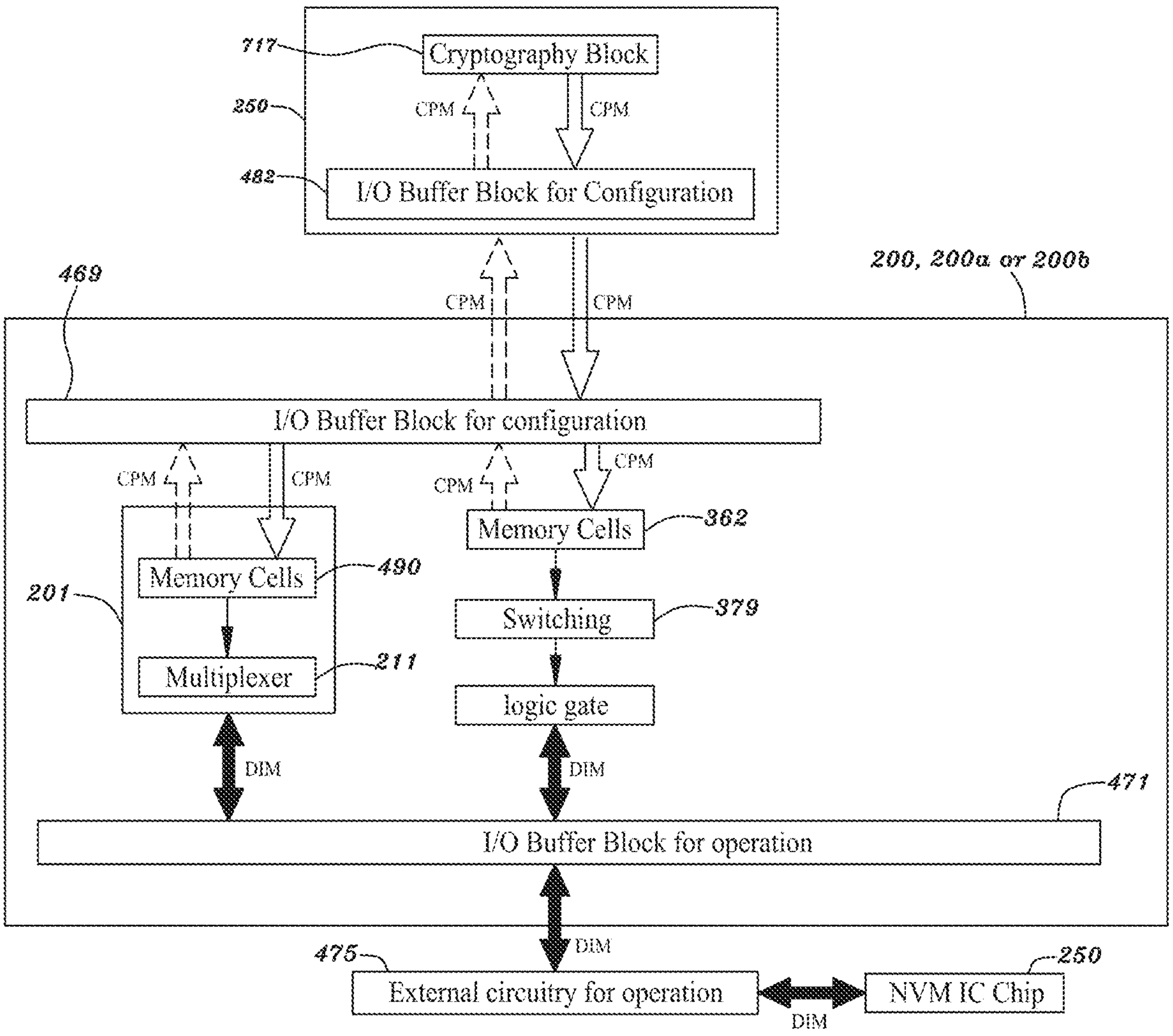

Referring to FIG. 22, for each of the first and second types of standard commodity logic drives 300 as illustrated in FIGS. 19A and 19B, a set of data buses 315 may be provided for use in an expandable interconnection scheme. In this case, its set of data buses 315 may include four data-bus subsets or data buses, e.g., 315A, 315B, 315C and 315D, each data-bus subset or data bus of which may couple to or be associated with one of the I/O ports 377, e.g., I/O Port 1, I/O Port 2, I/O Port 3 and I/O Port 4, of each of its standard commodity field programmable integrated-circuit (FPIC) chips or chiplets 200, or one of the I/O ports 377, e.g., I/O Port 1, I/O Port 2, I/O Port 3 and I/O Port 4, of each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200, and one of multiple I/O ports of circuitry 475 as seen in FIGS. 23A-23C, such as each of its high bandwidth memory (HBM) IC chips 251, external of its standard commodity field programmable integrated-circuit (FPIC) chips or chiplets 200, wherein FIGS. 23A-23C are various block diagrams showing various architectures of configuration and operation for a standard commodity field programmable integrated-circuit (FPIC) chip in accordance with an embodiment of the present application. The data bus 315A couples to and is associated with one of the I/O ports 377, e.g., I/O Port 1, of each of its standard commodity field programmable integrated-circuit (FPIC) chips or chiplets 200, or one of the I/O ports 377, e.g., I/O Port 1, of each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200, and a first one of the I/O ports of each of its high bandwidth memory (HBM) IC chips 251; the data bus 315B couples to and is associated with one of the I/O ports 377, e.g., I/O Port 2, of each of its standard commodity field programmable integrated-circuit (FPIC) chips or chiplets 200, or one of the I/O ports 377, e.g., I/O Port 2, of each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200, and a second one of the I/O ports of each of its high bandwidth memory (HBM) IC chips 251; the data bus 315C couples to and is associated with one of the I/O ports 377, e.g., I/O Port 3, of each of its standard commodity field programmable integrated-circuit (FPIC) chips or chiplets 200, or one of the I/O ports 377, e.g., I/O Port 3, of each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200, and a third one of the I/O ports of each of its high bandwidth memory (HBM) IC chips 251; and the data bus 315D couples to and is associated with one of the I/O ports 377, e.g., I/O Port 4, of each of its standard commodity field programmable integrated-circuit (FPIC) chips or chiplets 200, or one of the I/O ports 377, e.g., I/O Port 4, of each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200, and a fourth one of the I/O ports of each of its high bandwidth memory (HBM) IC chips 251. Each of the four data buses, e.g., 315A, 315B, 315C and 315D, may provide data transmission with bit width ranging from 4 to 256, such as 64 for a case. In this case, each of its four data buses, e.g., 315A, 315B, 315C and 315D, may be composed of multiple data paths, having the number of 64 arranged in parallel, coupling respectively to the I/O pads 372, having the number of 64 arranged in parallel, of one of the I/O ports 377, e.g., I/O Port 1, I/O Port 2, I/O Port 3 and I/O Port 4, of each of its standard commodity field programmable integrated-circuit (FPIC) chips or chiplets 200, or the I/O pads 372, having the number of 64 arranged in parallel, of one of the I/O ports 377, e.g., I/O Port 1, I/O Port 2, I/O Port 3 and I/O Port 4, of each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200, wherein each of the data paths of said each of its four data buses, e.g., 315A, 315B, 315C and 315D, may be constructed from multiple of the programmable interconnects 361 of its inter-chip interconnects 371 or multiple of the non-programmable interconnects 364 of its inter-chip interconnects 371.

Referring to FIGS. 22 and 23A-23C, for each of the first and second types of standard commodity logic drives 300 as illustrated in FIGS. 19A and 19B, each of its data buses 315 may pass to-be-processed data or data-information-memory (DIM) data for each of its standard commodity field programmable integrated-circuit (FPIC) chips or chiplets 200, or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200, and each of its high bandwidth memory (HBM) IC chips 251 (only one is shown in FIG. 22).

Referring to FIGS. 22 and 23A-23C, in a third clock cycle a first one of its standard commodity field programmable integrated-circuit (FPIC) chips or chiplets 200, or either of the first and second field programmable integrated-circuit (IC) chips or chiplets 200*a* and 200*b* of a first one of its field programmable chip-on-chip modules 400 in case of replacing its standard commodity field programmable integrated-circuit (FPIC) chips or chiplets 200, may be selected in accordance with a logic level at the chip-enable pad 209 of the first one of its standard commodity field programmable integrated-circuit (FPIC) chips or chiplets 200, or a logic level at the chip-enable pad 209 of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, to be enabled to pass data for the input operation of the first one of its standard commodity field programmable integrated-circuit (FPIC) chips or chiplets 200, or the input operation of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, and a second one of its standard commodity field programmable integrated-circuit (FPIC) chips or chiplets 200, or either of the first and second field programmable integrated-circuit (IC) chips or chiplets 200*a* and 200*b* of a second one of its field programmable chip-on-chip modules 400 in case of replacing its standard commodity field programmable integrated-circuit (FPIC) chips or chiplets 200, may be selected in accordance with a logic level at the chip-enable pad 209 of the second one of its standard commodity field programmable integrated-circuit (FPIC) chips or chiplets 200, or a logic level at the chip-enable pad 209 of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, to be enabled to pass data for the output operation of the second one of its standard commodity field programmable integrated-circuit (FPIC) chips or chiplets 200, or the output operation of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200. For the first one of the standard commodity field programmable integrated-circuit (FPIC) chips or chiplets 200 of said each of the first and second types of standard commodity logic drives 300, or said either of the first and second field programmable integrated-circuit (IC) chips or chiplets 200*a* and 200*b* of the first one of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, an I/O port, e.g. I/O Port 1, may be selected from its I/O ports 377, e.g., I/O Port 1, I/O Port 2, I/O Port 3 and I/O Port 4, in its I/O buffering block 471 to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. For the second one of the standard commodity field programmable integrated-circuit (FPIC) chips or chiplets 200 of said each of the first and second types of standard commodity logic drives 300, or said either of the first and second field programmable integrated-circuit (IC) chips or chiplets 200*a* and 200*b* of the second one of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, the same I/O port, e.g. I/O Port 1, may be selected from its I/O ports 377, e.g., I/O Port 1, I/O Port 2, I/O Port 3 and I/O Port 4, in its I/O buffering block 471 to enable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads, and to inhibit the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads. Thereby, for said each of the first and second types of standard commodity logic drives 300, in the third clock cycle the selected I/O port, e.g., I/O Port 1, of the second one of its standard commodity field programmable integrated-circuit (FPIC) chips or chiplets 200, or the selected I/O port, e.g., I/O Port 1, of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, may have the small drivers 374 to drive or pass a first one, e.g., 315A, of its data buses 315 first to-be-processed data, i.e., data-information-memory (DIM) data, associated with (1) the data output of one of the programmable logic blocks (LBs) 201 of the second one of its standard commodity field programmable integrated-circuit (FPIC) chips or chiplets 200, or the data output of one of the programmable logic blocks (LBs) 201 of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, (2) the data output of one of the center-processing-unit cores (CPUC) 2010 of the second one of its standard commodity field programmable integrated-circuit (FPIC) chips or chiplets 200, or the data output of one of the center-processing-unit cores (CPUC) 2010 of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, or (3) the data output of one of the coarse-grained programmable logic cells or elements 2060 of any type of the first through fourth types of coarse-grained field programmable (CGFP) architectures 2070, 2170, 2090 and 2270 of the second one of its standard commodity field programmable integrated-circuit (FPIC) chips or chiplets 200, or the data output of one of the coarse-grained programmable logic cells or elements 2060 of any type of the first through fourth types of coarse-grained field programmable (CGFP) architectures 2070, 2170, 2090 and 2270 of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200. The small receivers 375 of the selected I/O port, e.g., I/O Port 1, of the first one of its standard commodity field programmable integrated-circuit (FPIC) chips or chiplets 200, or the small receivers 375 of the selected I/O port, e.g., I/O Port 1, of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, may receive the first to-be-processed data from the first one, e.g., 315A, of its data buses 315 to be passed as (1) input data of the input data set of one of the programmable logic blocks (LBs) 201 of the first one of its standard commodity field programmable integrated-circuit (FPIC) chips or chiplets 200, or input data of the input data set of one of the programmable logic blocks (LBs) 201 of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, (2) a data input of one of the center-processing-unit cores (CPUC) 2010 of the first one of its standard commodity field programmable integrated-circuit (FPIC) chips or chiplets 200, or a data input of one of the center-processing-unit cores (CPUC) 2010 of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, or (3) input data of the input data set of one of the coarse-grained programmable logic cells or elements 2060 of any type of the first through fourth types of coarse-grained field programmable (CGFP) architectures 2070, 2170, 2090 and 2270 of the first one of its standard commodity field programmable integrated-circuit (FPIC) chips or chiplets 200, or input data of the input data set of one of the coarse-grained programmable logic cells or elements 2060 of any type of the first through fourth types of coarse-grained field programmable (CGFP) architectures 2070, 2170, 2090 and 2270 of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200. The first one, e.g., 315A, of its data buses 315 may have the data paths each coupling the small driver 374 of one of the small I/O circuits 203 of the selected I/O port, e.g., I/O Port 1, of the second one of its standard commodity field programmable integrated-circuit (FPIC) chips or chiplets 200, or the small driver 374 of one of the small I/O circuits 203 of the selected I/O port, e.g., I/O Port 1, of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, to the small receiver 375 of one of the small I/O circuits 203 of the selected I/O port, e.g., I/O Port 1, of the first one of its standard commodity field programmable integrated-circuit (FPIC) chips or chiplets 200, or the small receiver 375 of one of the small I/O circuits 203 of the selected I/O port, e.g., I/O Port 1, of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200.

Furthermore, referring to FIGS. 22 and 23A-23C, for said each of the first and second types of standard commodity logic drives 300, in the third clock cycle a third one of its standard commodity field programmable integrated-circuit (FPIC) chips or chiplets 200, or either of the first and second field programmable integrated-circuit (IC) chips or chiplets 200*a* and 200*b* of a third one of its field programmable chip-on-chip modules 400 in case of replacing its standard commodity field programmable integrated-circuit (FPIC) chips or chiplets 200, may be selected in accordance with a logic level at the chip-enable pad 209 of the third one of its standard commodity field programmable integrated-circuit (FPIC) chips or chiplets 200, or a logic level at the chip-enable pad 209 of said either of the first and second field programmable integrated-circuit (IC) chips or chiplets 200*a* and 200*b* of the third one of its field programmable chip-on-chip modules 400 in case of replacing its standard commodity field programmable integrated-circuit (FPIC) chips or chiplets 200, to be enabled to pass data for the input operation of the third one of its standard commodity field programmable integrated-circuit (FPIC) chips or chiplets 200, or the input operation of said either of the first and second field programmable integrated-circuit (IC) chips or chiplets 200*a* and 200*b* of the third one of its field programmable chip-on-chip modules 400 in case of replacing its standard commodity field programmable integrated-circuit (FPIC) chips or chiplets 200. For the third one of the standard commodity field programmable integrated-circuit (FPIC) chips or chiplets 200 of said each of the first and second types of standard commodity logic drives 300, or said either of the first and second field programmable integrated-circuit (IC) chips or chiplets 200*a* and 200*b* of the third one of the field programmable chip-on-chip modules 400 of said each of the first and second types of standard commodity logic drives 300 in case of replacing the standard commodity field programmable integrated-circuit (FPIC)

chips or chiplets 200 of said each of the first and second types of standard commodity logic drives 300, an I/O port, e.g. I/O Port 1, may be selected from its I/O ports 377, e.g., I/O Port 1, I/O Port 2, I/O Port 3 and I/O Port 4, in its I/O buffering block 471 to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Thereby, for said each of the first and second types of standard commodity logic drives 300, in the third clock cycle the small receivers 375 of the selected I/O port, e.g., I/O Port 1, of the third one of its standard commodity field programmable integrated-circuit (FPIC) chips or chiplets 200, or the small receivers 375 of the selected I/O port, e.g., I/O Port 1, of said either of the first and second field programmable integrated-circuit (IC) chips or chiplets 200*a* and 200*b* of the third one of its field programmable chip-on-chip modules 400 in case of replacing its standard commodity field programmable integrated-circuit (FPIC) chips or chiplets 200, may receive the first to-be-processed data to be passed as (1) input data of the input data set of one of the programmable logic blocks (LBs) 201 of the third one of its standard commodity field programmable integrated-circuit (FPIC) chips or chiplets 200, or input data of the input data set of one of the programmable logic blocks (LBs) 201 of said either of the first and second field programmable integrated-circuit (IC) chips or chiplets 200*a* and 200*b* of the third one of its field programmable chip-on-chip modules 400 in case of replacing its standard commodity field programmable integrated-circuit (FPIC) chips or chiplets 200, (2) a data input of one of the center-processing-unit cores (CPUC) 2010 of the third one of its standard commodity field programmable integrated-circuit (FPIC) chips or chiplets 200, or a data input of one of the center-processing-unit cores (CPUC) 2010 of said either of the first and second field programmable integrated-circuit (IC) chips or chiplets 200*a* and 200*b* of the third one of its field programmable chip-on-chip modules 400 in case of replacing its standard commodity field programmable integrated-circuit (FPIC) chips or chiplets 200, or (3) input data of the input data set of one of the coarse-grained programmable logic cells or elements 2060 of any type of the first through fourth types of coarse-grained field programmable (CGFP) architectures 2070, 2170, 2090 and 2270 of the third one of its standard commodity field programmable integrated-circuit (FPIC) chips or chiplets 200, or input data of the input data set of one of the coarse-grained programmable logic cells or elements 2060 of any type of the first through fourth types of coarse-grained field programmable (CGFP) architectures 2070, 2170, 2090 and 2270 of said either of the first and second field programmable integrated-circuit (IC) chips or chiplets 200*a* and 200*b* of the third one of its field programmable chip-on-chip modules 400 in case of replacing its standard commodity field programmable integrated-circuit (FPIC) chips or chiplets 200. The first one, e.g., 315A, of its data buses 315 may have the data paths each coupling to the small receiver 375 of one of the small I/O circuits 203 of the selected I/O port, e.g., I/O Port 1, of the third one of its standard commodity field programmable integrated-circuit (FPIC) chips or chiplets 200, or the small receiver 375 of one of the small I/O circuits 203 of the selected I/O port, e.g., I/O Port 1, of said either of the first and second field programmable integrated-circuit (IC) chips or chiplets 200*a* and 200*b* of the third one of its field programmable chip-on-chip modules 400 in case of replacing its standard commodity field programmable integrated-circuit (FPIC) chips or chiplets 200. For each of the others of the standard commodity field programmable integrated-circuit (FPIC) chips or chiplets 200 of said each of the first and second types of standard commodity logic drives 300, or each of the first and second field programmable integrated-circuit (IC) chips or chiplets 200*a* and 200*b* of each of the others of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, the small driver and receiver 374 and 375 of each of the small I/O circuits 203 of its I/O port 377, e.g. I/O Port 1, coupling to the first one, e.g., 315A, of the data buses 315 of said each of the first and second types of standard commodity logic drives 300 may be disabled or inhibited. For each of the high bandwidth memory (HBM) IC chips 251 of said each of the first and second types of standard commodity logic drives 300, the small driver and receiver 374 and 375 of each of the small I/O circuits 203 of its I/O port, e.g. first I/O Port, coupling to the first one, e.g., 315A, of the data buses 315 of said each of the first and second types of standard commodity logic drives 300 may be disabled or inhibited.

Furthermore, referring to FIGS. 22 and 23A-23C, for the first one of the standard commodity field programmable integrated-circuit (FPIC) chips or chiplets 200 of said each of the first and second types of standard commodity logic drives 300, or said either of the first and second field programmable integrated-circuit (IC) chips or chiplets 200*a* and 200*b* of the first one of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, in the third clock cycle an I/O port, e.g. I/O Port 2, may be selected from its I/O ports 377, e.g., I/O Port 1, I/O Port 2, I/O Port 3 and I/O Port 4, in its I/O buffering block 471 to enable the small drivers 374 of the small I/O circuits 203 of its selected I/O port 377, e.g. I/O Port 2, in accordance with logic levels at its output-selection (OS) pads 232, e.g., OS1, OS2, OS3 and OS4 pads, and to inhibit the small receivers 375 of the small I/O circuits 203 of its selected I/O port 377, e.g. I/O Port 2, in accordance with logic levels at its input-selection (IS) pads 231, e.g., IS1, IS2, IS3 and IS4 pads. For the second one of the standard commodity field programmable integrated-circuit (FPIC) chips or chiplets 200 of said each of the first and second types of standard commodity logic drives 300, or said either of the first and second field programmable integrated-circuit (IC) chips or chiplets 200*a* and 200*b* of the second one of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, the same I/O port, e.g. I/O Port 2, may be selected from its I/O ports 377, e.g., I/O Port 1, I/O Port 2, I/O Port 3 and I/O Port 4, in its I/O buffering block 471 to activate the small receivers 375 of the small I/O circuits 203 of its selected I/O port 377, e.g. I/O Port 2, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 2, in accordance with logic levels at its output-selection (OS) pads 232, e.g., OS1, OS2, OS3 and OS4 pads. Thereby, for said each of the first and second types of standard commodity logic drives 300 as illustrated in FIGS. 19A and 19B, in the third clock cycle the selected I/O port, e.g., I/O Port 2, of the first one of its standard commodity field programmable integrated-circuit (FPIC) chips or chiplets 200, or the selected I/O port, e.g., I/O Port 2, of said either of the first and second field programmable integrated-circuit (IC) chips or chiplets 200*a* or 200*b* of the first one of its field programmable chip-on-chip modules 400 in case of replacing its standard commodity field programmable integrated-circuit (FPIC) chips or chiplets 200, may have the small drivers 374 to drive or pass a second one, e.g., 315B, of its data buses 315 second to-be-processed data, i.e., data-information-memory (DIM) data, associated with (1) the data output of one of the programmable logic blocks (LBs) 201 of the first one of its standard commodity field programmable integrated-circuit (FPIC) chips or chiplets 200, or the data output of one of the programmable logic blocks (LBs) 201 of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, (2) the data output of one of the center-processing-unit cores (CPUC) 2010 of the first one of its standard commodity field programmable integrated-circuit (FPIC) chips or chiplets 200, or the data output of one of the center-processing-unit cores (CPUC) 2010 of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, or (3) the data output of one of the coarse-grained programmable logic cells or elements 2060 of any type of the first through fourth types of coarse-grained field programmable (CGFP) architectures 2070, 2170, 2090 and 2270 of the first one of its standard commodity field programmable integrated-circuit (FPIC) chips or chiplets 200, or the data output of one of the coarse-grained programmable logic cells or elements 2060 of any type of the first through fourth types of coarse-grained field programmable (CGFP) architectures 2070, 2170, 2090 and 2270 of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200. The small receivers 375 of the selected I/O port, e.g., I/O Port 2, of the second one of its standard commodity field programmable integrated-circuit (FPIC) chips or chiplets 200, or the small receivers 375 of the selected I/O port, e.g., I/O Port 2, of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, may receive the second to-be-processed data from the second one, e.g., 315B, of its data buses 315 to be passed as (1) input data of the input data set of one of the programmable logic blocks (LBs) 201 of the second one of its standard commodity field programmable integrated-circuit (FPIC) chips or chiplets 200, or input data of the input data set of one of the programmable logic blocks (LBs) 201 of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, (2) a data input of one of the center-processing-unit cores (CPUC) 2010 of the second one of its standard commodity field programmable integrated-circuit (FPIC) chips or chiplets 200, or a data input of one of the center-processing-unit cores (CPUC) 2010 of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, or (3) input data of the input data set of one of the coarse-grained programmable logic cells or elements 2060 of any type of the first through fourth types of coarse-grained field programmable (CGFP) architectures 2070, 2170, 2090 and 2270 of the second one of its standard commodity field programmable integrated-circuit (FPIC) chips or chiplets 200, or input data of the input data set of one of the coarse-grained programmable logic cells or elements 2060 of any type of the first through fourth types of coarse-grained field programmable (CGFP) architectures 2070, 2170, 2090 and 2270 of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200. The second one, e.g., 315B, of its data buses 315 may have the data paths each coupling the small driver 374 of one of the small I/O circuits 203 of the selected I/O port, e.g., I/O Port 2, of the first one of its standard commodity field programmable integrated-circuit (FPIC) chips or chiplets 200, or the small driver 374 of one of the small I/O circuits 203 of the selected I/O port, e.g., I/O Port 2, of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, to the small receiver 375 of one of the small I/O circuits 203 of the selected I/O port, e.g., I/O Port 2, of the second one of its standard commodity field programmable integrated-circuit (FPIC) chips or chiplets 200, or the small receiver 375 of one of the small I/O circuits 203 of the selected I/O port, e.g., I/O Port 2, of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200.

Further, referring to FIGS. 22 and 23A-23C, for said each of the first and second types of standard commodity logic drives 300, in a fourth clock cycle the first one of its standard commodity field programmable integrated-circuit (FPIC) chips or chiplets 200, or said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, may be selected in accordance with the logic level at the chip-enable pad 209 of the first one of its standard commodity field programmable integrated-circuit (FPIC) chips or chiplets 200, or the logic level at the chip-enable pad 209 of said either of the first and second field programmable integrated-circuit (IC) chips or chiplets

200*a* and 200*b* of the first one of its field programmable chip-on-chip modules 400 in case of replacing its standard commodity field programmable integrated-circuit (FPIC) chips or chiplets 200, to be enabled to pass data for the input operation of the first one of its standard commodity field programmable integrated-circuit (FPIC) chips or chiplets 200, or the input operation of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200. For the first one of the standard commodity field programmable integrated-circuit (FPIC) chips or chiplets 200 of said each of the first and second types of standard commodity logic drives 300, or said either of the first and second field programmable integrated-circuit (IC) chips or chiplets 200*a* and 200*b* of the first one of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, the I/O port, e.g. I/O Port 1, may be selected from its I/O ports 377, e.g., I/O Port 1, I/O Port 2, I/O Port 3 and I/O Port 4, in its I/O buffering block 471 to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Further, for said each of the first and second types of standard commodity logic drives 300, in the fourth clock cycle a first one of its high bandwidth memory (HBM) IC chips 251 may be selected to be enabled to pass data for an output operation of the first one of its high bandwidth memory (HBM) IC chips 251. For the first one of the high bandwidth memory (HBM) IC chips 251 of said each of the first and second types of standard commodity logic drives 300, its first I/O port may be selected from its I/O ports, e.g., first, second, third and fourth I/O ports, to enable the small drivers 374 of the small I/O circuits 203 of its selected I/O port, e.g. first I/O Port, in accordance with logic levels at its I/O-port selection pads, and to inhibit the small receivers 375 of the small I/O circuits 203 of its selected I/O port, e.g. first I/O Port, in accordance with logic levels at its I/O-port selection pads. Thereby, for said each of the first and second types of standard commodity logic drives 300, in the fourth clock cycle the selected I/O port, e.g., first I/O Port, of the first one of its high bandwidth memory (HBM) IC chips 251 may have the small drivers 374 to drive or pass third to-be-processed data, i.e., data-information-memory (DIM) data, from data-information-memory (DIM) cells, such as SRAM or DRAM cells, of the first one of its high bandwidth memory (HBM) IC chips 251 to the first one, e.g., 315A, of its data buses 315. The small receivers 375 of the selected I/O port, e.g., I/O Port 1, of the first one of its standard commodity field programmable integrated-circuit (FPIC) chips or chiplets 200, or the small receivers 375 of the selected I/O port, e.g., I/O Port 1, of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, may receive the third to-be-processed data from the first one, e.g., 315A, of its data buses 315 to be passed as (1) input data of the input data set of one of the programmable logic blocks (LBs) 201 of the first one of its standard commodity field programmable integrated-circuit (FPIC) chips or chiplets 200, or input data of the input data set of one of the programmable logic blocks (LBs) 201 of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, (2) a data input of one of the center-processing-unit cores (CPUC) 2010 of the first one of its standard commodity field programmable integrated-circuit (FPIC) chips or chiplets 200, or a data input of one of the center-processing-unit cores (CPUC) 2010 of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, or (3) input data of the input data set of one of the coarse-grained programmable logic cells or elements 2060 of any type of the first through fourth types of coarse-grained field programmable (CGFP) architectures 2070, 2170, 2090 and 2270 of the first one of its standard commodity field programmable integrated-circuit (FPIC) chips or chiplets 200, or input data of the input data set of one of the coarse-grained programmable logic cells or elements 2060 of any type of the first through fourth types of coarse-grained field programmable (CGFP) architectures 2070, 2170, 2090 and 2270 of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200. The first one, e.g., 315A, of its data buses 315 may have the data paths each coupling the small driver 374 of one of the small I/O circuits 203 of the selected I/O port, e.g., first I/O port, of the first one of its high bandwidth memory (HBM) IC chips 251 to the small receiver 375 of one of the small I/O circuits 203 of the selected I/O port, e.g., I/O Port 1, of the first one of its standard commodity field programmable integrated-circuit (FPIC) chips or chiplets 200, or the small receiver 375 of one of the small I/O circuits 203 of the selected I/O port, e.g., I/O Port 1, of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200.

Furthermore, referring to FIGS. 22 and 23A-23C, for said each of the first and second types of standard commodity logic drives 300, in the fourth clock cycle the second one of its standard commodity field programmable integrated-circuit (FPIC) chips or chiplets 200, or said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, may be selected in accordance with a logic level at the chip-enable pad 209 of the second one of its standard commodity field programmable integrated-circuit (FPIC) chips or chiplets 200, or a logic level at the chip-enable pad 209 of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, to be enabled to pass data for the input operation of the second one of its standard commodity field programmable integrated-circuit (FPIC) chips or chiplets 200, or the input operation of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200. For the second one of the standard commodity field programmable integrated-circuit (FPIC) chips or chiplets 200 of said each of the first and second types of standard commodity logic drives 300, or said either of the first and second field programmable integrated-circuit (IC) chips or chiplets 200*a* and 200*b* of the second one of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, an I/O port, e.g. I/O Port 1, may be selected from its I/O ports 377, e.g., I/O Port 1, I/O Port 2, I/O Port 3 and I/O Port 4, in its I/O buffering block 471 to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Thereby, for said each of the first and second types of standard commodity logic drives 300, in the fourth clock cycle the small receivers 375 of the selected I/O port, e.g., I/O Port 1, of the second one of its standard commodity field programmable integrated-circuit (FPIC) chips or chiplets 200, or the small receivers 375 of the selected I/O port, e.g., I/O Port 1, of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, may receive the third to-be-processed data from the first one, e.g., 315A, of its data buses 315 to be passed as (1) input data of the input data set of one of the programmable logic blocks (LBs) 201 of the second one of its standard commodity field programmable integrated-circuit (FPIC) chips or chiplets 200, or input data of the input data set of one of the programmable logic blocks (LBs) 201 of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, (2) a data input of one of the center-processing-unit cores (CPUC) 2010 of the second one of its standard commodity field programmable integrated-circuit (FPIC) chips or chiplets 200, or a data input of one of the center-processing-unit cores (CPUC) 2010 of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, or (3) input data of the input data set of one of the coarse-grained programmable logic cells or elements 2060 of any type of the first through fourth types of coarse-grained field programmable (CGFP) architectures 2070, 2170, 2090 and 2270 of the second one of its standard commodity field programmable integrated-circuit (FPIC) chips or chiplets 200, or input data of the input data set of one of the coarse-grained programmable logic cells or elements 2060 of any type of the first through fourth types of coarse-grained field programmable (CGFP) architectures 2070, 2170, 2090 and 2270 of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200. The first one, e.g., 315A, of its data buses 315 may have the data paths each coupling to the small receiver 375 of one of the small I/O circuits 203 of the selected I/O port, e.g., I/O Port 1, of the second one of its standard commodity field programmable integrated-circuit (FPIC) chips or chiplets 200, or the small receiver 375 of one of the small I/O circuits 203 of the selected I/O port, e.g., I/O Port 1, of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200. For each of the others of the standard commodity field programmable integrated-circuit (FPIC) chips or chiplets 200 of said each of the first and second types of standard commodity logic drives 300, or each of the first and second field programmable integrated-circuit (IC) chips or chiplets 200*a* and 200*b* of each of the others of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, the small driver and receiver 374 and 375 of each of the small I/O circuits 203 of its I/O ports 377, e.g. I/O Port 1, coupling to the first one, e.g., 315A, of the data buses 315 of said each of the first and second types of standard commodity logic drives 300 may be disabled or inhibited. For each of the others of the high bandwidth memory (HBM) IC chips 251 of said each of the first and second types of standard commodity logic drives 300, the small driver and receiver 374 and 375 of each of the small I/O circuits 203 of its I/O port, e.g. first I/O Port, coupling to the first one, e.g., 315A, of the data buses 315 of said each of the first and second types of standard commodity logic drives 300 may be disabled or inhibited.

Further, referring to FIGS. 22 and 23A-23C, for said each of the first and second types of standard commodity logic drives 300, in a fifth clock cycle the first one of its standard commodity field programmable integrated-circuit (FPIC) chips or chiplets 200, or said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, may be selected in accordance with a logic level at the chip-enable pad 209 of the first one of its standard commodity field programmable integrated-circuit (FPIC) chips or chiplets 200, or a logic level at the chip-enable pad 209 of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, to be enabled to pass data for the output operation of the first one of its standard commodity field programmable integrated-circuit (FPIC) chips or chiplets 200, or the output operation of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200. For the first one of the standard commodity field programmable integrated-circuit (FPIC) chips or chiplets 200 of said each of the first and second types of standard commodity logic drives 300, or said either of the first and second field programmable integrated-circuit (IC) chips or chiplets 200*a* and 200*b* of the first one of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, the I/O port, e.g. I/O Port 1, may be selected from its I/O ports 377, e.g., I/O Port 1, I/O Port 2, I/O Port 3 and I/O Port 4, in its I/O buffering block 471 to enable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads, and to inhibit the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads. Further, for said each of the first and second types of standard commodity logic drives 300, in the fifth clock cycle the first one of its high bandwidth memory (HBM) IC chips 251 may be selected to be enabled to pass data for an input operation of the first one of its high bandwidth memory (HBM) IC chips 251. For the first one of the high bandwidth memory (HBM) IC chips 251 of said each of the first and second types of standard commodity logic drives 300, its first I/O port may be selected from its I/O ports, e.g., first, second, third and fourth I/O ports, to activate the small receivers 375 of the small I/O circuits 203 of its selected I/O port, e.g. first I/O Port, in accordance with logic levels at its I/O-port selection pads, and to disable the small drivers 374 of the small I/O circuits 203 of its selected I/O port, e.g. first I/O Port, in accordance with logic levels at its I/O-port selection pads. Thereby, for said each of the first and second types of standard commodity logic drives 300, in the fifth clock cycle the small drivers 374 of the selected I/O port, e.g., I/O Port 1, of the first one of its standard commodity field programmable integrated-circuit (FPIC) chips or chiplets 200, or the small drivers 374 of the selected I/O port, e.g., I/O Port 1, of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, may drive or pass the first one, e.g., 315A, of its data buses 315 fourth to-be-processed data, i.e., data-information-memory (DIM) data, associated with (1) the data output of one of the programmable logic blocks (LBs) 201 of the first one of its standard commodity field programmable integrated-circuit (FPIC) chips or chiplets 200, or the data output of one of the programmable logic blocks (LBs) 201 of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, (2) the data output of one of the center-processing-unit cores (CPUC) 2010 of the first one of its standard commodity field programmable integrated-circuit (FPIC) chips or chiplets 200, or the data output of one of the center-processing-unit cores (CPUC) 2010 of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, or (3) the data output of one of the coarse-grained programmable logic cells or elements 2060 of any type of the first through fourth types of coarse-grained field programmable (CGFP) architectures 2070, 2170, 2090 and 2270 of the first one of its standard commodity field programmable integrated-circuit (FPIC) chips or chiplets 200, or the data output of one of the coarse-grained programmable logic cells or elements 2060 of any type of the first through fourth types of coarse-grained field programmable (CGFP) architectures 2070, 2170, 2090 and 2270 of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200. Further, the selected I/O port, e.g., first I/O Port, of the first one of its high bandwidth memory (HBM) IC chips 251 may have the small receivers 375 to receive the fourth to-be-processed data from the first one, e.g., 315A, of its data buses 315 to be passed to data-information-memory (DIM) cells, such as SRAM or DRAM cells, of the first one of its high bandwidth memory (HBM) IC chips 251 to be stored therein. The first one, e.g., 315A, of its data buses 315 may have the data paths each coupling the small driver 374 of one of the small I/O circuits 203 of the selected I/O port, e.g., I/O Port 1, of the first one of its standard commodity field programmable integrated-circuit (FPIC) chips or chiplets 200, or the small driver 374 of one of the small I/O circuits 203 of the selected I/O port, e.g., I/O Port 1, of said either of the first and second field programmable integrated-circuit (IC) chips or chiplets 200*a* and 200*b* of the first one of its field programmable chip-on-chip modules 400 in case of replacing its standard commodity field programmable integrated-circuit (FPIC) chips or chiplets 200, to the small receiver 375 of one of the small I/O circuits 203 of the selected I/O port, e.g., first I/O port, of the first one of its high bandwidth memory (HBM) IC chips 251.

Furthermore, referring to FIGS. 22 and 23A-23C, for said each of the first and second types of standard commodity logic drives 300, in the fifth clock cycle the second one of its standard commodity field programmable integrated-circuit (FPIC) chips or chiplets 200, or said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, may be selected in accordance with a logic level at the chip-enable pad 209 of the second one of its standard commodity field programmable integrated-circuit (FPIC) chips or chiplets 200, or a logic level at the chip-enable pad 209 of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, to be enabled to pass data for the input operation of the second one of its standard commodity field programmable integrated-circuit (FPIC) chips or chiplets 200, or the input operation of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200. For the second one of the standard commodity field programmable integrated-circuit (FPIC) chips or chiplets 200 of said each of the first and second types of standard commodity logic drives 300, or said either of the first and second field programmable integrated-circuit (IC) chips or chiplets 200*a* and 200*b* of the second one of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, an I/O port, e.g. I/O Port 1, may be selected from its I/O ports 377, e.g., I/O Port 1, I/O Port 2, I/O Port 3 and I/O Port 4, in its I/O buffering block 471 to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Thereby, for said each of the first and second types of standard commodity logic drives 300, in the fifth clock cycle the small receivers 375 of the selected I/O port, e.g., I/O Port 1, of the second one of its standard commodity field programmable integrated-circuit (FPIC) chips or chiplets 200, or the small receivers 375 of the selected I/O port, e.g., I/O Port 1, of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, may receive the fourth to-be-processed data from the first one, e.g., 315A, of its data buses 315 to be passed as (1) input data of the input data set of one of the programmable logic blocks (LBs) 201 of the second one of its standard commodity field programmable integrated-circuit (FPIC) chips or chiplets 200, or input data of the input data set of one of the programmable logic blocks (LBs) 201 of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, (2) a data input of one of the center-processing-unit cores (CPUC) 2010 of the second one of its standard commodity field programmable integrated-circuit (FPIC) chips or chiplets 200, or a data input of one of the center-processing-unit cores (CPUC) 2010 of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200, or (3) input data of the input data set of one of the coarse-grained programmable logic cells or elements 2060 of any type of the first through fourth types of coarse-grained field programmable (CGFP) architectures 2070, 2170, 2090 and 2270 of the second one of its standard commodity field programmable integrated-circuit (FPIC) chips or chiplets 200, or input data of the input data set of one of the coarse-grained programmable logic cells or elements 2060 of any type of the first through fourth types of coarse-grained field programmable (CGFP) architectures 2070, 2170, 2090 and 2270 of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200. The first one, e.g., 315A, of its data buses 315 may have the data paths each coupling to the small receiver 375 of one of the small I/O circuits 203 of the selected I/O port, e.g., I/O Port 1, of the second one of its standard commodity field programmable integrated-circuit (FPIC) chips or chiplets 200, or the small receiver 375 of one of the small I/O circuits 203 of the selected I/O port, e.g., I/O Port 1, of said either of the first and second field programmable integrated-circuit (IC) chips or chiplets 200*a* and 200*b* of the second one of its field programmable chip-on-chip modules 400 in case of replacing its standard commodity field programmable integrated-circuit (FPIC) chips or chiplets 200. For each of the others of the standard commodity field programmable integrated-circuit (FPIC) chips or chiplets 200 of said each of the first and second types of standard commodity logic drives 300, or each of the first and second field programmable integrated-circuit (IC) chips or chiplets 200*a* and 200*b* of each of the others of the field programmable chip-on-chip modules 400 of said each of the first and second types of standard commodity logic drives 300, in case of replacing the standard commodity field programmable integrated-circuit (FPIC) chips or chiplets 200 of said each of the first and second types of standard commodity logic drives 300, the small driver and receiver 374 and 375 of each of the small I/O circuits 203 of its I/O port 377, e.g. I/O Port 1, coupling to the first one, e.g., 315A, of the data buses 315 of said each of the first and second types of standard commodity logic drives 300 may be disabled or inhibited. For each of the others of the high bandwidth memory (HBM) IC chips 251 of said each of the first and second types of standard commodity logic drives 300, the small driver and receiver 374 and 375 of each of the small I/O circuits 203 of its I/O port, e.g., first I/O Port, coupling to the first one, e.g., 315A, of the data buses 315 of said each of the first and second types of standard commodity logic drives 300 may be disabled or inhibited.

Further, referring to FIG. 22, for said each of the first and second types of standard commodity logic drives 300, in a sixth clock cycle the first one of its high bandwidth memory (HBM) IC chips 251 may be selected to be enabled to pass data for an input operation of the first one of its high bandwidth memory (HBM) IC chips 251. For the first one of the high bandwidth memory (HBM) IC chips 251 of the standard commodity logic drive 300, its first I/O port may be selected from its I/O ports, e.g., first, second, third and fourth I/O ports, to activate the small receivers 375 of the small I/O circuits 203 of its selected I/O port, e.g. first I/O Port, in accordance with logic levels at its I/O-port selection pads, and to disable the small drivers 374 of the small I/O circuits 203 of its selected I/O port, e.g. first I/O Port, in accordance with logic levels at its I/O-port selection pads. Further, for said each of the first and second types of standard commodity logic drives 300, in the sixth clock cycle a second one of its high bandwidth memory (HBM) IC chips 251 may be selected to be enabled to pass data for an output operation of the second one of its high bandwidth memory (HBM) IC chips 251. For the second one of the high bandwidth memory (HBM) IC chips 251 of said each of the first and second types of standard commodity logic drives 300, its first I/O port may be selected from its I/O ports, e.g., first, second, third and fourth I/O ports, to enable the small drivers 374 of the small I/O circuits 203 of its selected I/O port, e.g. first I/O Port, in accordance with logic levels at its I/O-port selection pads, and to inhibit the small receivers 375 of the small I/O circuits 203 of its selected I/O port, e.g. first I/O Port, in accordance with logic levels at its I/O-port selection pads. Thereby, for said each of the first and second types of standard commodity logic drives 300, in the sixth clock cycle the selected I/O port, e.g., first I/O Port, of the second one of its high bandwidth memory (HBM) IC chips 251 may have the small drivers 374 to drive or pass fifth to-be-processed data, i.e., data-information-memory (DIM) data, from data-information-memory (DIM) cells, such as SRAM or DRAM cells, of the second one of its high bandwidth memory (HBM) IC chips 251 to the first one, e.g., 315A, of its data buses 315. The selected I/O port, e.g., first I/O Port, of the first one of its high bandwidth memory (HBM) IC chips 251 may have the small receivers 375 to receive the fifth to-be-processed data from the first one, e.g., 315A, of its data buses 315 to be passed to data-information-memory (DIM) cells, such as SRAM or DRAM cells, of the first one of its high bandwidth memory (HBM) IC chips 251 to be stored therein. The first one, e.g., 315A, of its data buses 315 may have the data paths each coupling the small driver 374 of one of the small I/O circuits 203 of the selected I/O port, e.g., first I/O port, of the second one of its high bandwidth memory (HBM) IC chips 251 to the small receiver 375 of one of the small I/O circuits 203 of the selected I/O port, e.g., first I/O port, of the first one of its high bandwidth memory (HBM) IC chips 251. For each of the standard commodity field programmable integrated-circuit (FPIC) chips or chiplets 200 of said each of the first and second types of standard commodity logic drives 300, or each of the first and second field programmable integrated-circuit (IC) chips or chiplets 200*a* and 200*b* of each of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, the small driver and receiver 374 and 375 of each of the small I/O circuits 203 of its I/O port 377, e.g. I/O Port 1, coupling to the first one, e.g., 315A, of the data buses 315 of said each of the first and second types of standard commodity logic drives 300 may be disabled or inhibited. For each of the others of the high bandwidth memory (HBM) IC chips 251 of said each of the first and second types of standard commodity logic drives 300, the small driver and receiver 374 and 375 of each of the small I/O circuits 203 of its I/O port, e.g. first I/O Port, coupling to the first one, e.g., 315A, of the data buses 315 of said each of the first and second types of standard commodity logic drives 300 may be disabled or inhibited.

Architecture of Configuration and Operation in Standard Commodity Field Programmable Integrated-Circuit (FPIC) Chip FIGS. 23A-23C are various block diagrams showing various architectures of configuration and operation for a standard commodity field programmable integrated-circuit (FPIC) chip in accordance with an embodiment of the present application. Referring to FIGS. 23A-23C, for each of the first and second types of standard commodity logic drives 300 as illustrated in FIGS. 19A and 19B, any of its non-volatile memory (NVM) IC chips 250 may include three non-volatile memory blocks each composed of multiple non-volatile memory cells arranged in an array. The non-volatile memory cells, i.e., configuration programming memory (CPM) cells, of a first one of the three non-volatile memory blocks of said any of its non-volatile memory (NVM) IC chips 250 are configured to save or store encrypted CPM data for (1) original CPM data, i.e., the resulting values or programming codes, therein in case for the first type of fined-grained field programmable logic cell or element (LCE) 2014 as illustrated in FIG. 2A, (2) original CPM data, i.e., the resulting values, therein in case for the second type of fined-grained field programmable logic cell or element (LCE) 2014 as illustrated in FIG. 2B, (3) original CPM data, i.e., the resulting values, therein in case for the third type of fined-grained field programmable logic cell or element (LCE) 2014 as illustrated in FIG. 2C, (4) original CPM data, i.e., the instruction sets, therein in case for the coarse-grained reconfigurable architecture (CGRA) 2041 as illustrated in FIG. 4, (5) original CPM data, i.e., the resulting values or data or programming codes, therein in case for the coarse-grained programmable logic cells or elements (LCEs) 2060 as illustrated in FIGS. 5A-5D and 6, (6) original CPM data, i.e., the resulting values or data or programmable codes, therein in case for any type of the first through fourth types of coarse-grained field programmable (CGFP) architectures 2070, 2170, 2090 and 2270 as illustrated in FIGS. 5A-15, or (7) original CPM data, i.e., the programming codes, therein in case for the first or second type of field programmable switch cells 379 thereof as illustrated in FIGS. 3A and 3B. The non-volatile memory cells, i.e., configuration programming memory (CPM) cells, of a second one of the three non-volatile memory blocks of said any of its non-volatile memory (NVM) IC chips 250 are configured to save or store encrypted CPM data for (1) immediately-previously self-configured CPM data, i.e., the resulting values or programming codes, therein in case for the first type of fined-grained field programmable logic cell or element (LCE) 2014 as illustrated in FIG. 2A, (2) immediately-previously self-configured CPM data, i.e., the resulting values, therein in case for the second type of fined-grained field programmable logic cell or element (LCE) 2014 as illustrated in FIG. 2B, (3) immediately-previously self-configured CPM data, i.e., the resulting values, therein in case for the third type of fined-grained field programmable logic cell or element (LCE) 2014 as illustrated in FIG. 2C, (4) immediately-previously self-configured CPM data, i.e., the instruction sets, therein in case for the coarse-grained reconfigurable architecture (CGRA) 2041 as illustrated in FIG. 4, (5) immediately-previously self-configured CPM data, i.e., the resulting values or data or programming codes, therein in case for the coarse-grained programmable logic cells or elements (LCEs) 2060 as illustrated in FIGS. 5A-5D and 6, (6) immediately-previously self-configured CPM data, i.e., the resulting values or data or programmable codes, therein in case for any type of the first through fourth types of coarse-grained field programmable (CGFP) architectures 2070, 2170, 2090 and 2270 as illustrated in FIGS. 5A-15, or (7) immediately-previously self-configured CPM data, i.e., the programming codes, therein in case for the first or second type of field programmable switch cells 379 thereof as illustrated in FIGS. 3A and 3B. The non-volatile memory cells, i.e., configuration programming memory (CPM) cells, of a third one of the three non-volatile memory blocks of said any of its non-volatile memory (NVM) IC chips 250 are configured to save or store encrypted CPM data for (1) currently self-configured CPM data, i.e., the resulting values or programming codes, therein in case for the first type of fined-grained field programmable logic cell or element (LCE) 2014 as illustrated in FIG. 2A, (2) currently self-configured CPM data, i.e., the resulting values, therein in case for the second type of fined-grained field programmable logic cell or element (LCE) 2014 as illustrated in FIG. 2B, (3) currently self-configured CPM data, i.e., the resulting values, therein in case for the third type of fined-grained field programmable logic cell or element (LCE) 2014 as illustrated in FIG. 2C, (4) currently self-configured CPM data, i.e., the instruction sets, therein in case for the coarse-grained reconfigurable architecture (CGRA) 2041 as illustrated in FIG. 4, (5) currently self-configured CPM data, i.e., the resulting values or data or programming codes, therein in case for the coarse-grained programmable logic cells or elements (LCEs) 2060 as illustrated in FIGS. 5A-5D and 6, (6) currently self-configured CPM data, i.e., the resulting values or data or programmable codes, therein in case for any type of the first through fourth types of coarse-grained field programmable (CGFP) architectures 2070, 2170, 2090 and 2270 as illustrated in FIGS. 5A-15, or (7) currently self-configured CPM data, i.e., the programming codes, therein in case for the first or second type of field programmable switch cells 379 thereof as illustrated in FIGS. 3A and 3B.

For each of the first and second type of standard commodity logic drives 300 as illustrated in FIGS. 19A and 19B for the first aspect, each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 may have the specification for one 200 as illustrated in FIG. 23A and its CS IC chip 411 may have the specification for one 411 as illustrated in FIG. 23A. Referring to FIG. 23A, the encrypted CPM data stored in one of the three non-volatile memory blocks of said any of its non-volatile memory (NVM) IC chips 250 may be passed from the large driver 274 of one of the large I/O circuits 341 of said any of its non-volatile memory (NVM) IC chips 250 to the large receiver 275 of one of the large I/O circuits 341 of its cooperating and supporting (CS) integrated-circuit (IC) chip 411 in an I/O buffering block 479 of its cooperating and supporting (CS) integrated-circuit (IC) chip 411. For the CS IC chip 411 of said each of the first and second types of standard commodity logic drives 300 for the first aspect, the data output L_Data_in of the large receiver 275 of said one of its large I/O circuits 341 in its I/O buffering block 479, associated with the encrypted CPM data, may be decrypted by its cryptography block 517 as decrypted CPM data. The decrypted data may be passed from the small driver 374 of one of its small I/O circuits 203 in its I/O buffering block 481 to the small receiver 375 of one of the small I/O circuits 203 of any of the field programmable integrated-circuit (FPIC) chips or chiplets 200 of said each of the first and second types of standard commodity logic drives 300, which are in an I/O buffering block 469 of said one of the field programmable integrated-circuit (FPIC) chips or chiplets 200, or the small receiver 375 of one of the small I/O circuits 203 of either of the first and second field programmable integrated-circuit (IC) chips or chiplets 200*a* and 200*b* of any of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, which are in an I/O buffering block 469 of said either of the first and second field programmable integrated-circuit (IC) chips or chiplets 200*a* and 200*b*. For said any of the field programmable integrated-circuit (FPIC) chips or chiplets 200 of said each of the first and second types of standard commodity logic drives 300 for the first aspect, or said either of the first and second field programmable integrated-circuit (IC) chips or chiplets 200*a* and 200*b* of said any of the field programmable chip-on-chip modules 400 of said each of the first and second types of standard commodity logic drives 300 for the first aspect in case of replacing the standard commodity field programmable integrated-circuit (FPIC) chips or chiplets 200 of said each of the first and second types of standard commodity logic drives 300 for the first aspect, its programmable logic blocks (LBs) 201, coarse-grained programmable logic cells or elements 2060 of any type of its first through fourth types of coarse-grained field programmable (CGFP) architectures 2070, 2170, 2090 and 2270 or first or second type of field programmable switch cells 379 may be programmed or configured in accordance with the decrypted CPM data.

For each of the first and second type of standard commodity logic drives 300 as illustrated in FIGS. 19A and 19B for the third aspect, each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 may have the specification for one 200 as illustrated in FIG. 23B. Referring to FIG. 23B, the encrypted CPM data stored in one of the three non-volatile memory blocks of said any of its non-volatile memory (NVM) IC chips 250 may be passed from the small driver 374 of one of the small I/O circuits 203 of said any of its non-volatile memory (NVM) IC chips 250 to the small receiver 375 of one of the small I/O circuits 203 of any of the field programmable integrated-circuit (FPIC) chips or chiplets 200 of said each of the first and second types of standard commodity logic drives 300, which are in an I/O buffering block 469 of said any of the field programmable integrated-circuit (FPIC) chips or chiplets 200, or the small receiver 375 of one of the small I/O circuits 203 of either of the first and second field programmable integrated-circuit (IC) chips or chiplets 200*a* and 200*b* of any of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, which are in an I/O buffering block 469 of said either of the first and second field programmable integrated-circuit (IC) chips or chiplets 200*a* and 200*b*. For said any of the field programmable integrated-circuit (FPIC) chips or chiplets 200 of said each of the first and second types of standard commodity logic drives 300 for the third aspect, or said either of the first and second field programmable integrated-circuit (IC) chips or chiplets 200*a* and 200*b* of said any of the field programmable chip-on-chip modules 400 of said each of the first and second types of standard commodity logic drives 300 for the third aspect in case of replacing the standard commodity field programmable integrated-circuit (FPIC) chips or chiplets 200 of the standard commodity logic drive 300 for the third aspect, the data output S_Data_in of the small receiver 375 of said one of its small I/O circuits 203 in its I/O buffering block 469, associated with the encrypted CPM data, may be decrypted by its cryptography block 617 as decrypted CPM data. Its programmable logic blocks (LBs) 201, coarse-grained programmable logic cells or elements 2060 of any type of its first through fourth types of coarse-grained field programmable (CGFP) architectures 2070, 2170, 2090 and 2270 or first or second type of field programmable switch cells 379 may be programmed or configured in accordance with the decrypted CPM data.

For each of the first and second type of standard commodity logic drives 300 as illustrated in FIGS. 19A and 19B for the fifth aspect, each of its standard commodity field programmable integrated-circuit (FPIC) chips or chiplets 200 or each of the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200 may have the specification for one 200 as illustrated in FIG. 23C and each of its non-volatile memory (NVM) IC chips 250 may have the specification for one 411 as illustrated in FIG. 23C. Referring to FIG. 23C, the encrypted CPM data stored in one of the three non-volatile memory blocks of said any of its non-volatile memory (NVM) IC chips 250 may be decrypted by a cryptography block 717 of said any of its non-volatile memory (NVM) IC chips 250 as decrypted CPM data. The decrypted CPM data may be passed from the small driver 374 of one of the small I/O circuits 203 of said any of its non-volatile memory (NVM) IC chips 250, which are in an I/O buffering block 482 of said any of its non-volatile memory (NVM) IC chips 250, to the small receiver 375 of one of the small I/O circuits 203 of any of the field programmable integrated-circuit (FPIC) chips or chiplets 200 of said each of the first and second types of standard commodity logic drives 300, which are in an I/O buffering block 469 of said any of the field programmable integrated-circuit (FPIC) chips or chiplets 200, or the small receiver 375 of one of the small I/O circuits 203 of either of the first and second field programmable integrated-circuit (IC) chips or chiplets 200*a* and 200*b* of any of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, which are in an I/O buffering block 469 of said either of the first and second field programmable integrated-circuit (IC) chips or chiplets 200*a* and 200*b*. For said any of the field programmable integrated-circuit (FPIC) chips or chiplets 200 of said each of the first and second types of standard commodity logic drives 300 for the fifth aspect, or said either of the first and second field programmable integrated-circuit (IC) chips or chiplets 200*a* and 200*b* of said any of the field programmable chip-on-chip modules 400 for the fifth aspect in case of replacing the standard commodity field programmable integrated-circuit (FPIC) chips or chiplets 200 of the standard commodity logic drive 300 for the fifth aspect, its programmable logic blocks (LBs) 201, coarse-grained programmable logic cells or elements 2060 of any type of its first through fourth types of coarse-grained field programmable (CGFP) architectures 2070, 2170, 2090 and 2270 or first or second type of field programmable switch cells 379 may be programmed or configured in accordance with the decrypted CPM data.

Referring to FIGS. 23A-23C, for each of the first and second types of standard commodity logic drives 300 as illustrated in FIGS. 19A and 19B, the data-information-memory (DIM) data saved or stored in the SRAM or DRAM cells, i.e., data-information-memory (DIM) cells, of any of its HBM IC chips 251 may be backed up or stored in any of its NVM IC chips 250 or circuits outside said each of the first and second types of standard commodity logic drives 300. Thereby, when said each of the first and second types of standard commodity logic drives 300 is powered off, the data-information-memory (DIM) data stored in said any of its NVM IC chips 250 may be kept.

For reconfiguration for artificial intelligence (AI), machine learning or deep learning, for each of the standard commodity field programmable integrated-circuit (FPIC) chips or chiplets 200 of each of the first and second types of standard commodity logic drives 300 as illustrated in FIGS. 19A and 19B, or each of the first and second field programmable integrated-circuit (IC) chips or chiplets 200*a* and 200*b* of each of the field programmable chip-on-chip modules 400 of each of the first and second types of standard commodity logic drives 300 in case of replacing the standard commodity field programmable integrated-circuit (FPIC) chips or chiplets 200 of each of the first and second types of standard commodity logic drives 300, current logic operation, such as AND logic operation, performed by one of its programmable logic blocks (LBs) 201 may be self-reconfigured to another logic operation, such as NAND logic operation, by reconfiguring (1) the resulting values or programming codes for the CPM data to be passed to the memory cells 490 of said one of its programmable logic blocks (LBs) 201 in case for the first type of fined-grained field programmable logic cell or element (LCE) 2014 as illustrated in FIG. 2A to be stored therein, (2) the resulting values for the CPM data to be passed to the memory cells of said one of its programmable logic blocks (LBs) 201 in case for the second type of fined-grained field programmable logic cell or element (LCE) 2014 as illustrated in FIG. 2B to be stored therein, (3) the resulting values for the CPM data to be passed to the first and second sets of memory cells of said one of its programmable logic blocks (LBs) 201 in case for the third type of fined-grained field programmable logic cell or element (LCE) 2014 as illustrated in FIG. 2C to be stored therein, (4) the instruction sets for the CPM data to be passed to the third memory cells of the instruction memory block or section 2049 of said one of its programmable logic blocks (LBs) 201 in case for the coarse-grained reconfigurable architecture (CGRA) 2041 as illustrated in FIG. 4 to be stored therein, or (5) the resulting values or data or programming codes for the CPM data to be passed to the third type of static random-access memory (SRAM) cells 398 of said one of its programmable logic blocks (LBs) 201 in case for the coarse-grained programmable logic cells or elements (LCEs) 2060 as illustrated in FIGS. 5A-5D and 6 to be stored therein. Alternatively, current logic operation, such as AND logic operation, performed by one of the coarse-grained programmable logic cells or elements 2060 of any type of its first through fourth types of coarse-grained field programmable (CGFP) architectures 2070, 2170, 2090 and 2270 as illustrated in FIGS. 5A-15 may be self-reconfigured to another logic operation, such as NAND logic operation, by reconfiguring the resulting values or data or programmable codes for the CPM data to be passed to the third type of static random-access memory (SRAM) cells 398 of said one of the coarse-grained programmable logic cells or elements (LCEs) 2060 of said any type of its first through fourth types of coarse-grained field programmable (CGFP) architectures 2070, 2170, 2090 and 2270 to be stored therein. The current switching state of one of its first or second type of field programmable switch cells 379 may be self-reconfigured to another switching state by reconfiguring the programming codes for the CPM data to be passed to one of the memory cells 362 of said one of its first or second type of field programmable switch cells 379 to be stored therein for controlling the switching state thereof in real time. The current switching state of one of the four selection circuits 2073 of one of the programmable-interconnection-combined functional units 2071 or 2171 of any type of its first, second and fourth types of coarse-grained field programmable (CGFP) architectures 2070, 2170 and 2270 may be self-reconfigured to another switching state by reconfiguring the programming codes for the CPM data to be passed to one of the interconnection-programming memory cells of said one of the programmable-interconnection-combined functional units 2071 or 2171 to be stored therein for controlling the switching state thereof in real time. The current switching state of one of the four field-programmable local-interconnection selection circuits 2074 of one of the programmable-interconnection networking units 2072 of its first type of coarse-grained field programmable (CGFP) architectures 2070 may be self-reconfigured to another switching state by reconfiguring the programming codes for the CPM data to be passed to one of the interconnection-programming memory cells of said one of the programmable-interconnection networking units 2072 to be stored therein for controlling the switching state thereof in real time. The current switching state of one of the four field-programmable bypass-path selection circuits 2075 of one of the programmable-interconnection networking units 2072 of its first type of coarse-grained field programmable (CGFP) architectures 2070 may be self-reconfigured to another switching state by reconfiguring the programming codes for the CPM data to be passed to one of the interconnection-programming memory cells of said one of the programmable-interconnection networking units 2072 to be stored therein for controlling the switching state thereof in real time. The current switching state of any of the field-programmable crossbar selection circuits 2174 and 2175 of one of the programmable-interconnection-combined functional units 2171 of any type of its second and fourth types of coarse-grained field programmable (CGFP) architectures 2170 and 2270 may be self-reconfigured to another switching state by reconfiguring the programming codes for the CPM data to be passed to one of the interconnection-programming memory cells of said one of the programmable-interconnection-combined functional units 2171 to be stored therein for controlling the switching state thereof in real time. The current switching state of the field-programmable selection circuit 2093 of any of the look-up table (LUT) banks 2091 of its third type of coarse-grained field programmable (CGFP) architecture 2090 may be self-reconfigured to another switching state by reconfiguring the programming codes for the CPM data to be passed to one of the interconnection-programming memory cells of its third type of coarse-grained field programmable (CGFP) architecture 2090 to be stored therein for controlling the switching state of the field-programmable selection circuit 2093 in real time. The current switching state of the decoder 2096 of any of the spare units 2095 of any of the look-up table (LUT) banks 2091 of its third type of coarse-grained field programmable (CGFP) architecture 2090 may be self-reconfigured to another switching state by reconfiguring the programming codes for the CPM data to be passed to one of the interconnection-programming memory cells of its third type of coarse-grained field programmable (CGFP) architecture 2090 to be stored therein for controlling the switching state thereof in real time.

Referring to FIG. 23A, for said each of the standard commodity field programmable integrated-circuit (FPIC) chips or chiplets 200 of said each of the first and second type of standard commodity logic drives 300 for the first aspect or said each of the first and second field programmable integrated-circuit (IC) chips or chiplets 200*a* and 200*b* of said each of the field programmable chip-on-chip modules 400 of said each of the first and second type of standard commodity logic drives 300 for the first aspect in case of replacing the standard commodity field programmable integrated-circuit (FPIC) chips or chiplets 200 of said each of the first and second type of standard commodity logic drives 300, the small driver 374 of one of its small I/O circuits 203 in its I/O buffering block 469 may have the data input S_Data_out associated with the currently self-configured CPM data, which may be (1) the resulting values or programming codes, stored in one of the memory cells 490 of one of its programmable logic blocks (LBs) 201 in case for the first type of fined-grained field programmable logic cell or element (LCE) 2014 as illustrated in FIG. 2A, (2) the resulting values stored in one of its memory cells in case for the second type of fined-grained field programmable logic cell or element (LCE) 2014 as illustrated in FIG. 2B, (3) the resulting values stored in one of the first and second sets of memory cells of one of its programmable logic blocks (LBs) 201 in case for the third type of fined-grained field programmable logic cell or element (LCE) 2014 as illustrated in FIG. 2C, (4) the instruction sets stored in one of its programmable logic blocks (LBs) 201 in case for the coarse-grained reconfigurable architecture (CGRA) 2041 as illustrated in FIG. 4, (5) the resulting values or data or programming codes stored in one of the third type of static random-access memory (SRAM) cells 398 of one of its programmable logic blocks (LBs) 201 in case for the coarse-grained programmable logic cells or elements (LCEs) 2060 as illustrated in FIGS. 5A-5D and 6, (6) the resulting values or data or programmable codes stored in one of the third type of static random-access memory (SRAM) cells 398 of one of the coarse-grained programmable logic cells or elements (LCEs) 2060 of any type of its first through fourth types of coarse-grained field programmable (CGFP) architectures 2070, 2170, 2090 and 2270 as illustrated in FIGS. 5A-15, (7) the programming codes stored in one of the memory cells 362 of one of its first or second type of field programmable switch cells 379 as illustrated in FIGS. 3A and 3B, or (8) the programming codes stored in one of the interconnection-programming memory cells of any type of its first, second, third and fourth types of coarse-grained field programmable (CGFP) architectures 2070, 2170, 2090 and 2270 as illustrated in FIGS. 8A-15, to be passed to the small receiver 375 of one of the small I/O circuits 203 of the cooperating and supporting (CS) integrated-circuit (IC) chip 411 of said each of the first and second type of standard commodity logic drives 300, which are in the I/O buffering block 481 of the cooperating and supporting (CS) integrated-circuit (IC) chip 411 of said each of the first and second type of standard commodity logic drives 300. For the CS IC chip 411 of said each of the first and second type of standard commodity logic drives 300, the currently self-configured CPM data may be encrypted by its cryptography circuit 517 as encrypted and currently self-configured CPM data. The large driver 274 of one of its large I/O circuits 341 in its I/O buffering block 479 may have the data inputs L_Data_out, associated with the encrypted and currently self-configured CPM data, to be passed to the large receiver 275 of one of the large I/O circuits 341 of one of the non-volatile memory (NVM) IC chips 250 of said each of the first and second type of standard commodity logic drives 300 to be stored in the non-volatile memory cells, i.e., configuration programming memory (CPM) cells, of the third one of the three nonvolatile memory blocks of said one of the non-volatile memory (NVM) IC chips 250.

Referring to FIG. 23B, for said each of the standard commodity field programmable integrated-circuit (FPIC) chips or chiplets 200 of said each of the first and second type of standard commodity logic drives 300 for the third aspect or said each of the first and second field programmable integrated-circuit (IC) chips or chiplets 200*a* and 200*b* of said each of the field programmable chip-on-chip modules 400 of said each of the first and second type of standard commodity logic drives 300 for the third aspect in case of replacing the standard commodity field programmable integrated-circuit (FPIC) chips or chiplets 200 of said each of the first and second type of standard commodity logic drives 300, the currently self-configured CPM data, which may be (1) the resulting values or programming codes, stored in one of the memory cells 490 of one of its programmable logic blocks (LBs) 201 in case for the first type of fined-grained field programmable logic cell or element (LCE) 2014 as illustrated in FIG. 2A, (2) the resulting values stored in one of its memory cells in case for the second type of fined-grained field programmable logic cell or element (LCE) 2014 as illustrated in FIG. 2B, (3) the resulting values stored in one of the first and second sets of memory cells of one of its programmable logic blocks (LBs) 201 in case for the third type of fined-grained field programmable logic cell or element (LCE) 2014 as illustrated in FIG. 2C, (4) the instruction sets stored in one of its programmable logic blocks (LBs) 201 in case for the coarse-grained reconfigurable architecture (CGRA) 2041 as illustrated in FIG. 4, (5) the resulting values or data or programming codes stored in one of the third type of static random-access memory (SRAM) cells 398 of one of its programmable logic blocks (LBs) 201 in case for the coarse-grained programmable logic cells or elements (LCEs) 2060 as illustrated in FIGS. 5A-5D and 6, (6) the resulting values or data or programmable codes stored in one of the third type of static random-access memory (SRAM) cells 398 of one of the coarse-grained programmable logic cells or elements (LCEs) 2060 of any type of its first through fourth types of coarse-grained field programmable (CGFP) architectures 2070, 2170, 2090 and 2270 as illustrated in FIGS. 5A-15, (7) the programming codes stored in one of the memory cells 362 of one of its first or second type of field programmable switch cells 379 as illustrated in FIGS. 3A and 3B, or (8) the programming codes stored in one of the interconnection-programming memory cells of any type of its first, second, third and fourth types of coarse-grained field programmable (CGFP) architectures 2070, 2170, 2090 and 2270 as illustrated in FIGS. 8A-15, may be encrypted by its cryptography circuits 617 as encrypted and currently self-configured CPM data. The small driver 374 of one of its small I/O circuits 203 in its I/O buffering block 469 may have the data input S_Data_out, associated with the encrypted and currently self-configured CPM data, to be passed to the small receiver 375 of one of the small I/O circuits 203 of one of the non-volatile memory (NVM) IC chips 250 of said each of the first and second type of standard commodity logic drives 300 to be stored in the non-volatile memory cells, i.e., configuration programming memory (CPM) cells, of the third one of the three non-volatile memory blocks of said one of the non-volatile memory (NVM) IC chips 250.

Referring to FIG. 23C, for said each of the standard commodity field programmable integrated-circuit (FPIC) chips or chiplets 200 of said each of the first and second type of standard commodity logic drives 300 for the fifth aspect or said each of the first and second field programmable integrated-circuit (IC) chips or chiplets 200*a* and 200*b* of said each of the field programmable chip-on-chip modules 400 of said each of the first and second type of standard commodity logic drives 300 for the fifth aspect in case of replacing the standard commodity field programmable integrated-circuit (FPIC) chips or chiplets 200 of said each of the first and second type of standard commodity logic drives 300, the small driver 374 of one of its small I/O circuits 203 in its I/O buffering block 469 may have the data input S_Data_out associated with the currently self-configured CPM data, which may be (1) the resulting values or programming codes, stored in one of the memory cells 490 of one of its programmable logic blocks (LBs) 201 in case for the first type of fined-grained field programmable logic cell or element (LCE) 2014 as illustrated in FIG. 2A, (2) the resulting values stored in one of its memory cells in case for the second type of fined-grained field programmable logic cell or element (LCE) 2014 as illustrated in FIG. 2B, (3) the resulting values stored in one of the first and second sets of memory cells of one of its programmable logic blocks (LBs) 201 in case for the third type of fined-grained field programmable logic cell or element (LCE) 2014 as illustrated in FIG. 2C, (4) the instruction sets stored in one of its programmable logic blocks (LBs) 201 in case for the coarse-grained reconfigurable architecture (CGRA) 2041 as illustrated in FIG. 4, (5) the resulting values or data or programming codes stored in one of the third type of static random-access memory (SRAM) cells 398 of one of its programmable logic blocks (LBs) 201 in case for the coarse-grained programmable logic cells or elements (LCEs) 2060 as illustrated in FIGS. 5A-5D and 6, (6) the resulting values or data or programmable codes stored in one of the third type of static random-access memory (SRAM) cells 398 of one of the coarse-grained programmable logic cells or elements (LCEs) 2060 of any type of its first through fourth types of coarse-grained field programmable (CGFP) architectures 2070, 2170, 2090 and 2270 as illustrated in FIGS. 5A-15, (7) the programming codes stored in one of the memory cells 362 of one of its first or second type of field programmable switch cells 379 as illustrated in FIGS. 3A and 3B, or (8) the programming codes stored in one of the interconnection-programming memory cells of any type of its first, second, third and fourth types of coarse-grained field programmable (CGFP) architectures 2070, 2170, 2090 and 2270 as illustrated in FIGS. 8A-15, to be passed to the small receiver 375 of one of the small I/O circuits 203 of one of the non-volatile memory (NVM) IC chips 250 of said each of the first and second type of standard commodity logic drives 300, which are in the I/O buffering block 482 of said one of the non-volatile memory (NVM) IC chips 250 of said each of the first and second type of standard commodity logic drives 300. For said one of the non-volatile memory (NVM) IC chips 250 of said each of the first and second type of standard commodity logic drives 300, the currently self-configured CPM data may be encrypted by its cryptography circuits 717 as encrypted and currently self-configured CPM data to be stored in the non-volatile memory cells, i.e., configuration programming memory (CPM) cells, of the third one of its three non-volatile memory blocks.

Accordingly, referring to FIGS. 23A-23C, for said each of the first and second types of standard commodity logic drives 300 as illustrated in FIGS. 19A and 19B for each of the first, third and fifth aspects, when it is powered on, the encrypted and currently self-configured CPM data stored or saved in the non-volatile memory cells in the third one of the three non-volatile memory blocks of one of its non-volatile memory (NVM) IC chips 250 may be decrypted by the cryptography circuits 517 of its CS IC chip 411 for the first aspect, by the cryptography circuits 617 of said each of its standard commodity field programmable integrated-circuit (FPIC) chips or chiplets 200 for the third aspect or the cryptography circuits 617 of said each of the first and second field programmable integrated-circuit (IC) chips or chiplets 200*a* and 200*b* of said each of its field programmable chip-on-chip modules 400 for the third aspect in case of replacing its standard commodity field programmable integrated-circuit (FPIC) chips or chiplets 200, or by the cryptography circuits 717 of said one of its non-volatile memory (NVM) IC chips 250 for the fifth aspect as decrypted and currently self-configured CPM data. For said each of the standard commodity field programmable integrated-circuit (FPIC) chips or chiplets 200 of said each of the first and second types of standard commodity logic drives 300 or said each of the first and second field programmable integrated-circuit (IC) chips or chiplets 200*a* and 200*b* of said each of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, the decrypted and currently self-configured CPM data may be (1) the resulting values or programming codes to be passed to the memory cells 490 of one of its programmable logic blocks (LBs) 201 in case for the first type of fined-grained field programmable logic cell or element (LCE) 2014 as illustrated in FIG. 2A to be stored therein, (2) the resulting values to be passed to the memory cells of one of its programmable logic blocks (LBs) 201 in case for the second type of fined-grained field programmable logic cell or element (LCE) 2014 as illustrated in FIG. 2B to be stored therein, (3) the resulting values to be passed to the first and second sets of memory cells of one of its programmable logic blocks (LBs) 201 in case for the third type of fined-grained field programmable logic cell or element (LCE) 2014 as illustrated in FIG. 2C to be stored therein, (4) the instruction sets to be passed to the third memory cells of the instruction memory block or section 2049 of one of its programmable logic blocks (LBs) 201 in case for the coarse-grained reconfigurable architecture (CGRA) 2041 as illustrated in FIG. 4 to be stored therein, (5) the resulting values or data or programming codes to be passed to the third type of static random-access memory (SRAM) cells 398 of one of its programmable logic blocks (LBs) 201 in case for the coarse-grained programmable logic cells or elements (LCEs) 2060 as illustrated in FIGS. 5A-5D and 6 to be stored therein, (6) the resulting values or data or programmable codes to be passed to the third type of static random-access memory (SRAM) cells 398 of one of the coarse-grained programmable logic cells or elements (LCEs) 2060 of said any type of its first through fourth types of coarse-grained field programmable (CGFP) architectures 2070, 2170, 2090 and 2270 to be stored therein, (7) the programming codes to be passed to the memory cells 362 of one of its first or second type of field programmable switch cells 379 to be stored therein, (8) the programming codes to be passed to one of the interconnection-programming memory cells of one of the programmable-interconnection-combined functional units 2070 of either type of its first and fourth types of coarse-grained field programmable (CGFP) architectures 2070 and 2270 to be stored therein, (8) the programming codes to be passed to one of the interconnection-programming memory cells of one of the programmable-interconnection networking units 2072 of its first type of coarse-grained field programmable (CGFP) architectures 2070 to be stored therein, (9) the programming codes to be passed to one of the interconnection-programming memory cells of one of the programmable-interconnection-combined functional units 2171 of either type of its second and fourth types of coarse-grained field programmable (CGFP) architectures 2170 and 2270 to be stored therein, or (10) the programming codes to be passed to one of the interconnection-programming memory cells of its third type of coarse-grained field programmable (CGFP) architecture 2090 to be stored therein. During operation, said each of the standard commodity field programmable integrated-circuit (FPIC) chips or chiplets 200 of said each of the first and second types of standard commodity logic drives 300 or said each of the first and second field programmable integrated-circuit (IC) chips or chiplets 200*a* and 200*b* of said each of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300 may be reset and the encrypted original CPM data or encrypted and immediately-previously self-configured CPM data stored or saved in the non-volatile memory cells in the first or second respective one of the three non-volatile memory blocks of one of its non-volatile memory (NVM) IC chips 250 may be decrypted by the cryptography circuits 517 of its CS IC chip 411 for the first aspect, by the cryptography circuits 617 of said each of its standard commodity field programmable integrated-circuit (FPIC) chips or chiplets 200 for the third aspect or the cryptography circuits 617 of said each of the first and second field programmable integrated-circuit (IC) chips or chiplets 200*a* and 200*b* of said each of its field programmable chip-on-chip modules 400 for the third aspect in case of replacing its standard commodity field programmable integrated-circuit (FPIC) chips or chiplets 200, or by the cryptography circuits 717 of said one of its non-volatile memory (NVM) IC chips 250 for the fifth aspect as decrypted original CPM data or decrypted and immediately-previously self-configured CPM data. For said each of the standard commodity field programmable integrated-circuit (FPIC) chips or chiplets 200 of said each of the first and second types of standard commodity logic drives 300 or said each of the first and second field programmable integrated-circuit (IC) chips or chiplets 200*a* and 200*b* of said each of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, the decrypted original CPM data or decrypted and immediately-previously self-configured CPM data may be (1) the resulting values or programming codes to be passed to the memory cells 490 of one of its programmable logic blocks (LBs) 201 in case for the first type of fined-grained field programmable logic cell or element (LCE) 2014 as illustrated in FIG. 2A to be stored therein, (2) the resulting values to be passed to the memory cells of one of its programmable logic blocks (LBs) 201 in case for the second type of fined-grained field programmable logic cell or element (LCE) 2014 as illustrated in FIG. 2B to be stored therein, (3) the resulting values to be passed to the first and second sets of memory cells of one of its programmable logic blocks (LBs) 201 in case for the third type of fined-grained field programmable logic cell or element (LCE) 2014 as illustrated in FIG. 2C to be stored therein, (4) the instruction sets to be passed to the third memory cells of the instruction memory block or section 2049 of one of its programmable logic blocks (LBs) 201 in case for the coarse-grained reconfigurable architecture (CGRA) 2041 as illustrated in FIG. 4 to be stored therein, (5) the resulting values or data or programming codes to be passed to the third type of static random-access memory (SRAM) cells 398 of one of its programmable logic blocks (LBs) 201 in case for the coarse-grained programmable logic cells or elements (LCEs) 2060 as illustrated in FIGS. 5A-5D and 6 to be stored therein, (6) the resulting values or data or programmable codes to be passed to the third type of static random-access memory (SRAM) cells 398 of one of the coarse-grained programmable logic cells or elements (LCEs) 2060 of said any type of its first through fourth types of coarse-grained field programmable (CGFP) architectures 2070, 2170, 2090 and 2270 to be stored therein, (7) the programming codes to be passed to the memory cells 362 of one of its first or second type of field programmable switch cells 379 to be stored therein, (8) the programming codes to be passed to one of the interconnection-programming memory cells of one of the programmable-interconnection-combined functional units 2070 of either type of its first and fourth types of coarse-grained field programmable (CGFP) architectures 2070 and 2270 to be stored therein, (8) the programming codes to be passed to one of the interconnection-programming memory cells of one of the programmable-interconnection networking units 2072 of its first type of coarse-grained field programmable (CGFP) architectures 2070 to be stored therein, (9) the programming codes to be passed to one of the interconnection-programming memory cells of one of the programmable-interconnection-combined functional units 2171 of either type of its second and fourth types of coarse-grained field programmable (CGFP) architectures 2170 and 2270 to be stored therein, or (10) the programming codes to be passed to one of the interconnection-programming memory cells of its third type of coarse-grained field programmable (CGFP) architecture 2090 to be stored therein.

Algorithm or Method for Optimizing Performance of Multichip Package

Figure 24A:
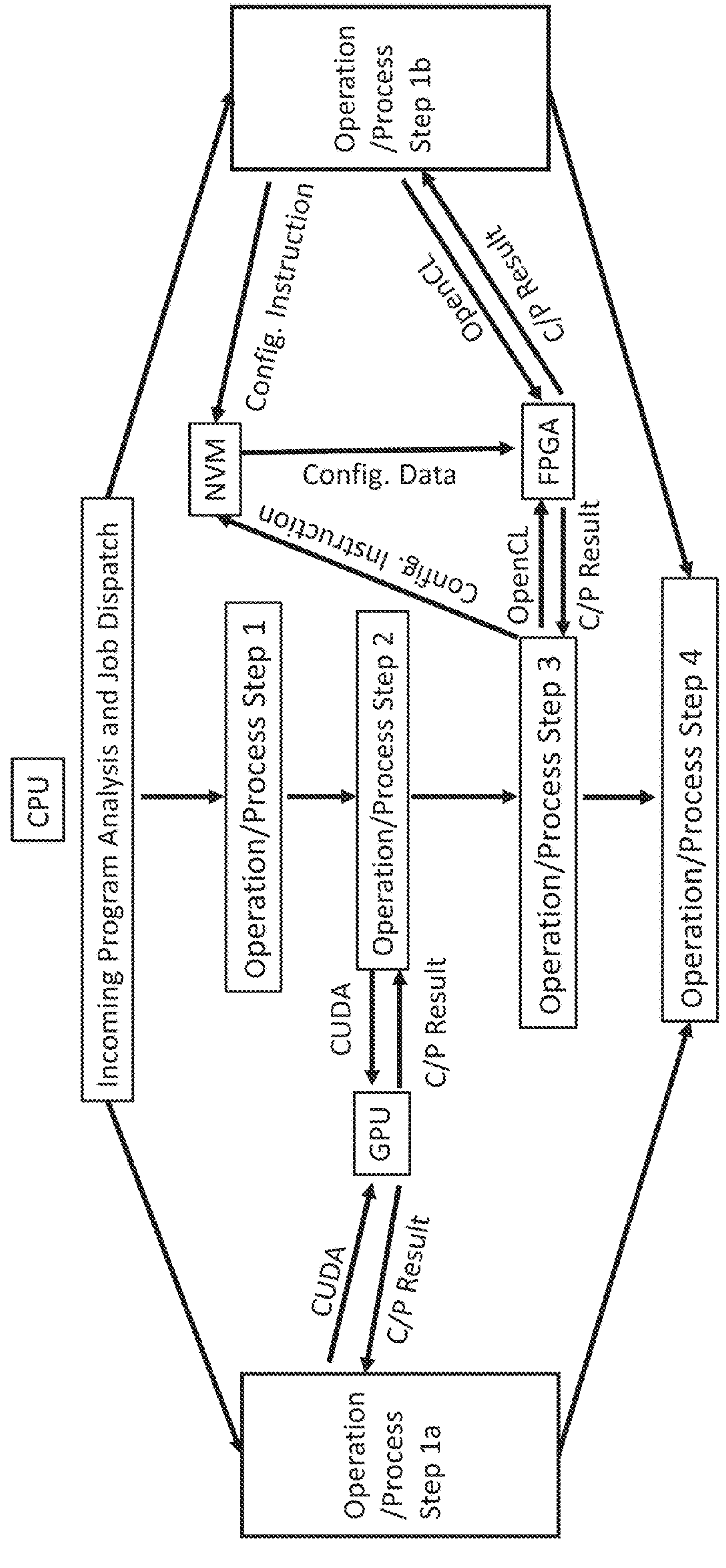
FIG. 24A is a block diagram for illustrating a first method for optimizing performance of a multichip package in accordance with an embodiment of the present application.

FIG. 24A is a block diagram for illustrating a first method for optimizing performance of a multichip package in accordance with an embodiment of the present application. Referring to FIG. 24A, the performance optimization may be exercised on the CPU IC chip(s), GPU IC chip(s), i.e., DPU IC chip(s), and field programmable integrated-circuit (FPIC) chips in each of the first and second types of standard commodity logic drives 300 as illustrated in FIGS. 19A and 19B for any of the first through fifth aspects. Each of the first and second types of standard commodity logic drives 300 may be operated based on a CPU common programming language, such as python, JavaScript, Java, C#, C, or C++, Scala, Swift, Matlab, Assembly Language, Pascal, Visual Basic, or PL/SQL language, for the operations/processes of its CPU IC chip(s). For each of the first and second types of standard commodity logic drives 300, its CPU IC chip 269*b* is configured to (1) analyze and assess an incoming software program for a requested job, written by one of the CPU common programming languages, to perform multiple operation/process steps, and (2) decide which of its CPU IC chip 269*b*, its GPU IC chips 269*a* and its field programmable integrated-circuit (FPIC) chips 200, or the first and second field programmable integrated-circuit (IC) chips or chiplets 200*a* and 200*b* of each of its field programmable chip-on-chip modules 400 in case of replacing its standard commodity field programmable integrated-circuit (FPIC) chips or chiplets 200, is used for performance optimization to perform which of the operation/process steps. For example, in the performance optimization for each of the first and second types of standard commodity logic drives 300, the incoming software program for a requested job may be first analyzed by its CPU IC chip 269*b* to determine six operation/process steps, comprising (1) a first stream for multiple operation/process steps 1-4 to be processed or performed in series, (2) a second stream for an operation/process step 1a to be processed or performed in parallel with the first stream, and (3) a third stream for an operation/process step 1b to be processed or performed in parallel with the first and second streams. Its CPU IC chip 269*b* may assign or dispatch the operation/process steps 1a and 2 to any of its GPU IC chips 269*a* and the operation/process steps 1b and 3 to any of its field programmable integrated-circuit (FPIC) chips 200 or either of the first and second field programmable integrated-circuit (IC) chips or chiplets 200*a* and 200*b* of any of its field programmable chip-on-chip modules 400 in case of replacing its standard commodity field programmable integrated-circuit (FPIC) chips or chiplets 200. Its CPU IC chip 269*b* may compile or translate a first programming language, i.e., one of the CPU common languages, for the operation/process step 1a in the second stream and the operation/process step 2 in the first stream into a second programming language, such as language of compute unified device architecture (CUDA), for said any of its GPU IC chips 269*a*, and the first programming language for the operation/process step 1b in the third stream and the operation/process step 3 in the first stream into a third programming language, such as language of open computing language (OpenCL), for said any of its field programmable integrated-circuit (FPIC) chips 200 or said either of the first and second field programmable integrated-circuit (IC) chips or chiplets 200*a* and 200*b* of said any of its field programmable chip-on-chip modules 400 in case of replacing its standard commodity field programmable integrated-circuit (FPIC) chips or chiplets 200. The programming language of CUDA is developed for a GPU IC chip for general-purpose computing, called as general-purpose computing on graphic processing units (GPGPU), comprising reduced-instruction-set-computer (RISC) instructions in an instruction set for highly-parallel operation/process with a bit width equal to or greater than 256, 512, 1024, 2048, 5120, 10240 bits for example.

Referring to FIG. 24A, for the second stream, said any of its GPU IC chips 269*a* may perform the operation/process step 1a based on the second programming language for the operation/process step 1a, in parallel with the first and third streams, to generate or return a computing/process (C/P) result out of the operation/process step 1a to its CPU IC chip 269*b* as a first input data set for the operation/process step 4. For the first stream, after its CPU IC chip 269*b* performs the operation/process step 1 based on the first programming language for the operation/process step 1 to generate a computing/process (C/P) result as an output data set for the operation/process step 1, said any of its GPU IC chips 269*a* may perform the operation/process step 2 on the output data set for the operation/process step 1 based on the second programming language for the operation/process step 2, in parallel with the second and third streams, to generate or return a computing/process (C/P) result out of the operation/process step 2 to its CPU IC chip 269*b* as an input data set for the operation/process step 3. In an example, said any of its GPU IC chips 269*a* may perform the operation/process step 2 before said any of its GPU IC chips 269*a* performs the operation/process step 1a. Alternatively, said any of its GPU IC chips 269*a* may perform the operation/process step 2 after said any of its GPU IC chips 269a performs the operation/process step 1a. Alternatively, said any of its GPU IC chips 269a may perform the operation/process steps 1a and 2 at the same time.

Referring to FIG. 24A, for the third stream, its CPU IC chip 269b may pass a set of configuration instruction to any of its NVM IC chips 250 to select, in accordance with the first programming language for the operation/process step 1b, a first specific configuration set from multiple configuration sets, including encrypted and currently self-configured CPM data, encrypted and immediately-previously self-configured CPM data and encrypted original CPM data as mentioned in FIGS. 23A-23C, stored in said any of its NVM IC chips 250 to be decrypted as decrypted CPM data to be stored in any of its field programmable integrated-circuit (FPIC) chips 200, or either of the first and second field programmable integrated-circuit (IC) chips or chiplets 200a and 200b of any of its field programmable chip-on-chip modules 400 in case of replacing its standard commodity field programmable integrated-circuit (FPIC) chips or chiplets 200, for configuring said any of its field programmable integrated-circuit (FPIC) chips 200, or said either of the first and second field programmable integrated-circuit (IC) chips or chiplets 200a and 200b, and said any of its field programmable integrated-circuit (FPIC) chips 200 or said either of the first and second field programmable integrated-circuit (IC) chips or chiplets 200a and 200b may perform or execute the operation/process step 1b based on the third programming language for the operation/process step 1b, in parallel with the first and second streams, to generate or return a computing/process (C/P) result out of the operation/process step 1b to its CPU IC chip 269b as a second input data set for the operation/process step 4.

For the first stream, after said any of its field programmable integrated-circuit (FPIC) chips 200 or said either of the first and second field programmable integrated-circuit (IC) chips or chiplets 200a and 200b performs the operation/process step 1b, said any of its field programmable integrated-circuit (FPIC) chips 200 or said either of the first and second field programmable integrated-circuit (IC) chips or chiplets 200a and 200b may pass a set of configuration instruction to said any of its NVM IC chips 250 to select, in accordance with the first programming language for the operation/process step 3, a second specific configuration set from the multiple configuration sets stored in said any of its NVM IC chips 250 to be decrypted as decrypted CPM data to be stored in said any of its field programmable integrated-circuit (FPIC) chips 200 or said either of the first and second field programmable integrated-circuit (IC) chips or chiplets 200a and 200b for configuring said any of its field programmable integrated-circuit (FPIC) chips 200 or said either of the first and second field programmable integrated-circuit (IC) chips or chiplets 200a and 200b, and after its CPU IC chip 269b receives the input data set for the operation/process step 3 from said any of its GPU IC chips 269a, said any of its field programmable integrated-circuit (FPIC) chips 200 or said either of the first and second field programmable integrated-circuit (IC) chips or chiplets 200a and 200b may perform the operation/process step 3 on the input data set for the operation/process step 3 based on the third programming language for the operation/process step 3, in parallel with the second and third streams, to generate or return a computing/process (C/P) result out of the operation/process step 3 to its CPU IC chips 269b as a third input data set for the operation/process step 4. For more elaboration, each of the multiple configuration sets was developed, compiled, verified and debugged for a specific purpose or application before stored in said any of its NVM IC chips 250. The number of the multiple configuration sets may be equal to or greater than 2, 3, 4, 5, 10, 20, 50 or 100. Said any of its field programmable integrated-circuit (FPIC) chips 200 or said either of the first and second field programmable integrated-circuit (IC) chips or chiplets 200a and 200b may be configured as a computing/processing accelerator to speed up the operation/process steps 1b and 3.

Next, referring to FIG. 24A, after its CPU IC chip 269b receive the first input data set for the operation/process step 4 from said any of its GPU IC chips 269a and the second and third input data sets for the operation/process step 4 from said any of its field programmable integrated-circuit (FPIC) chips 200 or said either of the first and second field programmable integrated-circuit (IC) chips or chiplets 200a and 200b, its CPU IC chip 269b may perform the operation/process step 4 on the first, second and third input data sets for the operation/process step 4 based on the first programming language for the operation/process step 4.

Figure 24B:
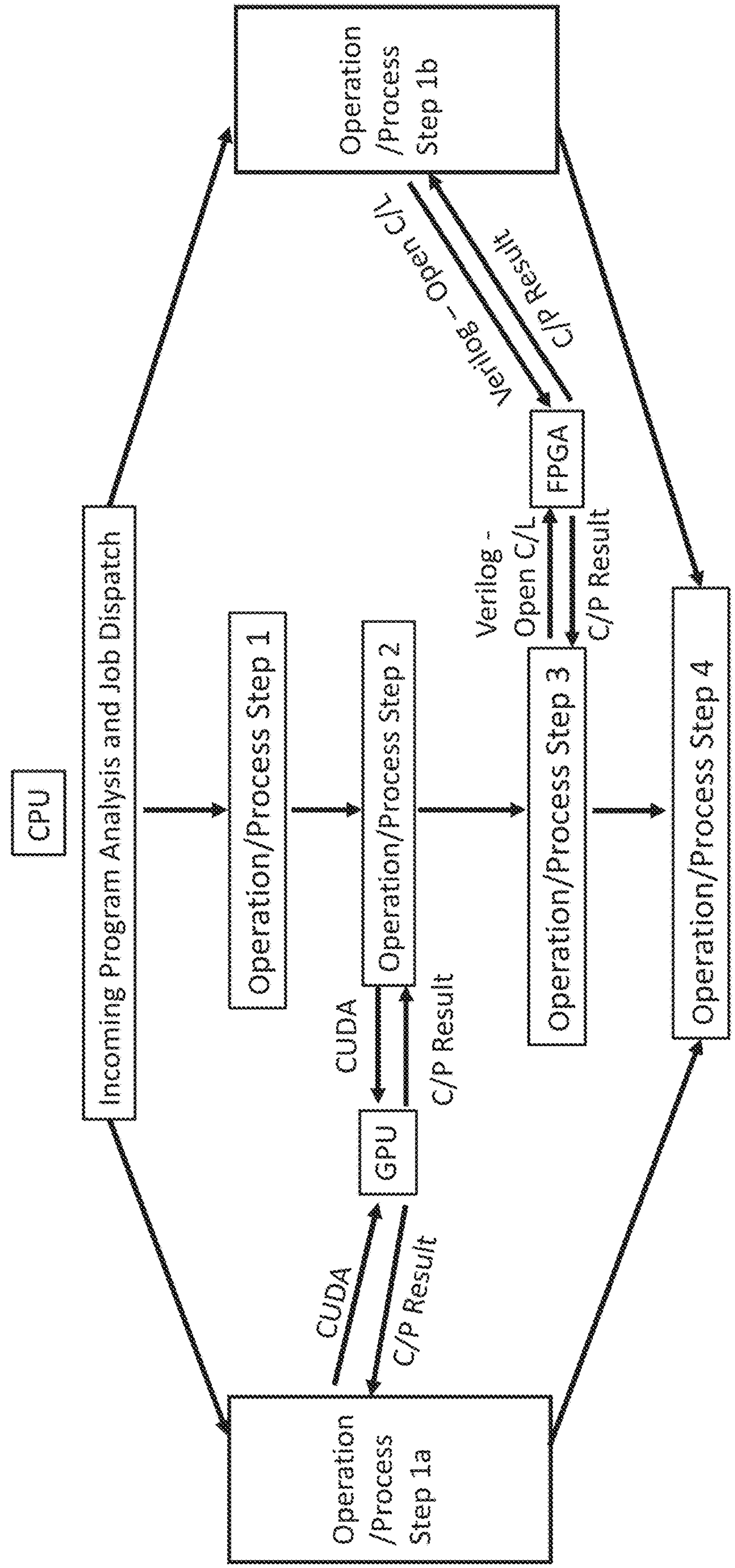
FIG. 24B is a block diagram for illustrating a second method for optimizing performance of a multichip package in accordance with an embodiment of the present application.

Alternatively, FIG. 24B is a block diagram for illustrating a second method for optimizing performance of a multichip package in accordance with an embodiment of the present application. The second method for optimizing performance of a multichip package as seen in FIG. 24B is similar to the first method therefor as illustrated in FIG. 24A and can be referred to the first method therefor. The difference therebetween is that in the second method therefor as seen in FIG. 24B for the third stream said any of its field programmable integrated-circuit (FPIC) chips 200 or said either of the first and second field programmable integrated-circuit (IC) chips or chiplets 200a and 200b may be configured based on the operation/process step 1b using a hardware description language or instruction language, such as Verilog. Next, the first programming language for the operation/process step 1b in the third stream may be translated or compiled into the third programming language, such as language of open computing language (OpenCL), for said any of its field programmable integrated-circuit (FPIC) chips 200 or said either of the first and second field programmable integrated-circuit (IC) chips or chiplets 200a and 200b. The language of OpenCL is a software written in a standard open computing language (OpenCL, Open Computing Language) for parallel programming of heterogeneous systems. Next, said any of its field programmable integrated-circuit (FPIC) chips 200 or said either of the first and second field programmable integrated-circuit (IC) chips or chiplets 200a and 200b may perform or execute the operation/process step 1b based on the third language for the operation/process step 1b, in parallel with the first and second streams, to generate or return a computing/process (C/P) result out of the operation/process step 1b to its CPU IC chip 269b as a second input data set for the operation/process step 4. For the first stream, after said any of its field programmable integrated-circuit (FPIC) chips 200 or said either of the first and second field programmable integrated-circuit (IC) chips or chiplets 200a and 200b performs the operation/process step 1b, said any of its field programmable integrated-circuit (FPIC) chips 200 or said either of the first and second field programmable integrated-circuit (IC) chips or chiplets 200a and 200b may be configured based on the operation/process step 3 using the hardware description language or instruction language, such as Verilog. Next, after its CPU IC chip 269b receives the input data set for the operation/process step 3 from said any of its GPU IC chips 269a, said any of its field programmable integrated-circuit (FPIC) chips 200 or said either of the first and second field programmable integrated-circuit (IC) chips or chiplets 200a and 200b may perform the operation/process step 3 on the input data set for the operation/process step 3 based on the third programming language for the operation/process step 3, in parallel with the second and third streams, to generate or return a computing/process (C/P) result out of the operation/process step 3 to its CPU IC chip 269*b* as a third input data set for the operation/process step 4.

Figure 25A:
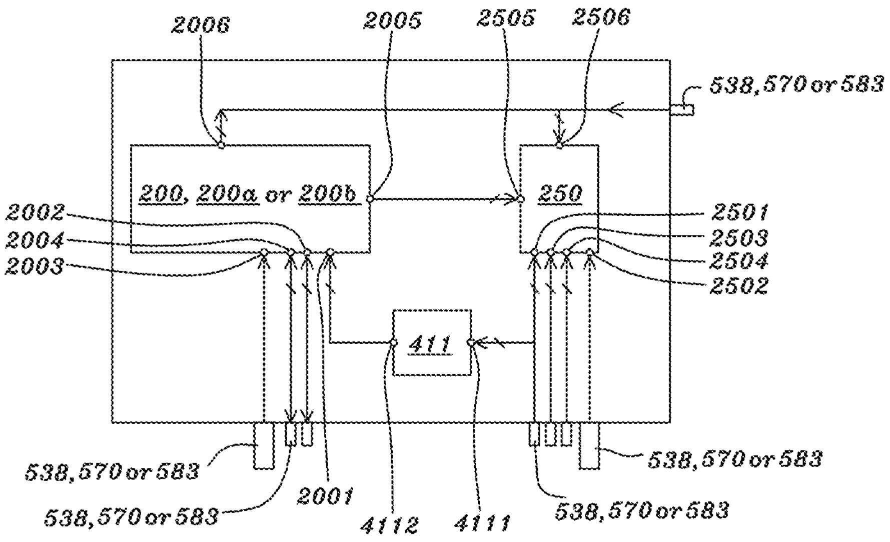
FIG. 25A is a block diagram for illustrating a first type of configuration architecture for one or more field programmable integrated-circuit (FPIC) chips in a standard commodity logic drive in accordance with the present application.

Architecture for Configuration of Field Programmable Integrated-Circuit (FPIC) Chip First Type of Configuration Architecture for Field Programmable Integrated-Circuit (FPIC) Chip FIG. 25A is a block diagram for illustrating a first type of configuration architecture for one or more field programmable integrated-circuit (FPIC) chips in a standard commodity logic drive in accordance with the present application. Referring to FIG. 25A, for each of the first and second types of standard commodity logic drives 300 for the first aspect as illustrated in FIGS. 19A, 19B and 23A, each of its non-volatile memory IC chips 250, such as NAND or NOR flash chip, MRAM IC chip, RRAM IC chip or FRAM IC chip, may include (1) multiple signal input/output (I/O) pins 2501 coupling to its external pins 538, 570 or 583, e.g., SATA port 521 as illustrated in FIG. 21B, for receiving the encrypted CPM data, i.e., original CPM data as illustrated in FIG. 23A, from its external pins 538, 570 or 583 to be stored therein and coupling to its cooperating or supporting (CS) IC chips 411 for passing the encrypted CPM data to its cooperating or supporting (CS) IC chip 411, (2) multiple power or ground pins 2502 coupling to its external pins 538, 570 or 583 for delivering a voltage (Vcc or Vss) of power supply or ground reference to said each of its non-volatile memory IC chips 250, (3) multiple control pins 2503 coupling to its external pins 538, 570 or 583 for controlling, by its external pins 538, 570 or 583, said each of its non-volatile memory IC chips 250, (4) one or more write-enable pins 2504 coupling to its external pins 538, 570 or 583 for receiving a write-enable signal from its external pins 570 or 583 to activate the signal input/output (I/O) pins 2501 thereof for receiving the encrypted CPM data from its external pins 538, 570 or 583 to be stored therein, (5) one or more read-enable pins 2505 coupling to any of its field programmable integrated-circuit (FPIC) chips 200, or either of the first and second field programmable integrated-circuit (IC) chips or chiplets 200*a* and 200*b* of any of its field programmable chip-on-chip modules 400 in case of replacing its standard commodity field programmable integrated-circuit (FPIC) chips or chiplets 200, for receiving a read-enable signal from said any of its field programmable integrated-circuit (FPIC) chips 200 or said either of the first and second field programmable integrated-circuit (IC) chips or chiplets 200*a* and 200*b* to activate the signal input/output (I/O) pins 2501 thereof to pass the encrypted CPM data to its cooperating or supporting (CS) IC chip 411, and (6) multiple address pins 2506 coupling to its external pins 538, 570 or 583 and said any of its field programmable integrated-circuit (FPIC) chips 200 or said either of the first and second field programmable integrated-circuit (IC) chips or chiplets 200*a* and 200*b* for receiving multiple first address signals from its external pins 538, 570 or 583 and multiple second address signals from said any of its field programmable integrated-circuit (FPIC) chips 200 or said either of the first and second field programmable integrated-circuit (IC) chips or chiplets 200*a* and 200*b*. Its cooperating or supporting (CS) IC chip 411 may include (1) multiple first signal input/output (I/O) pins 4111 coupling to said each of its non-volatile memory IC chips 250 for receiving the encrypted CPM data from the signal input/output (I/O) pins 2501 of said each of its non-volatile memory IC chips 250, (2) the cryptography block 517 as illustrated in FIGS. 19A, 19B and 20 and 23A for decrypting the encrypted CPM data as the decrypted CPM data and (3) multiple second signal input/output (I/O) pins 4112 coupling to said any of its field programmable integrated-circuit (FPIC) chips 200 or said either of the first and second field programmable integrated-circuit (IC) chips or chiplets 200*a* and 200*b* for passing the decrypted CPM data to said any of its field programmable integrated-circuit (FPIC) chips 200 or said either of the first and second field programmable integrated-circuit (IC) chips or chiplets 200*a* and 200*b*. Said any of its field programmable integrated-circuit (FPIC) chips 200 or said either of the first and second field programmable integrated-circuit (IC) chips or chiplets 200*a* and 200*b* may include multiple first signal input/output (I/O) pins 2001 coupling to its cooperating or supporting (CS) IC chip 411 for receiving the decrypted CPM data from the second signal input/output (I/O) pins 4112 of its cooperating or supporting (CS) IC chip 411 for configuring or programming (1) the programmable logic blocks (LBs) 201 of said any of its field programmable integrated-circuit (FPIC) chips 200 or said either of the first and second field programmable integrated-circuit (IC) chips or chiplets 200*a* and 200*b* in case for the first through third types of fined-grained field programmable logic cell or element (LCE) 2014 as illustrated in FIGS. 2A-2C, the coarse-grained reconfigurable architecture (CGRA) 2041 as illustrated in FIG. 4 or the coarse-grained programmable logic cells or elements (LCEs) 2060 as illustrated in FIGS. 5A-5D and 6, (2) the coarse-grained programmable logic cells or elements (LCEs) 2060 of any type of the first through fourth types of coarse-grained field programmable (CGFP) architectures 2070, 2170, 2090 and 2270 of said any of its field programmable integrated-circuit (FPIC) chips 200 or said either of the first and second field programmable integrated-circuit (IC) chips or chiplets 200*a* and 200*b* as illustrated in FIGS. 5A-15, (3) the first or second type of field programmable switch cells 379 of said any of its field programmable integrated-circuit (FPIC) chips 200 or said either of the first and second field programmable integrated-circuit (IC) chips or chiplets 200*a* and 200*b* as illustrated in FIGS. 3A and 3B, (4) the four selection circuits 2073 of any of the programmable-interconnection-combined functional units 2071 or 2171 of any type of the first, second and fourth types of coarse-grained field programmable (CGFP) architectures 2070, 2170 and 2270 of said any of its field programmable integrated-circuit (FPIC) chips 200 or said either of the first and second field programmable integrated-circuit (IC) chips or chiplets 200*a* and 200*b* as illustrated in FIG. 8A, (5) the four field-programmable local-interconnection selection circuits 2074 and field-programmable bypass-path selection circuits 2075 of any of the programmable-interconnection networking units 2072 of the first type of coarse-grained field programmable (CGFP) architectures 2070 of said any of its field programmable integrated-circuit (FPIC) chips 200 or said either of the first and second field programmable integrated-circuit (IC) chips or chiplets 200*a* and 200*b* as illustrated in FIG. 9, (6) the field-programmable crossbar selection circuits 2174 and 2175 of any of the programmable-interconnection-combined functional units 2171 of any type of the second and fourth types of coarse-grained field programmable (CGFP) architectures 2170 and 2270 of said any of its field programmable integrated-circuit (FPIC) chips 200 or said either of the first and second field programmable integrated-circuit (IC) chips or chiplets 200*a* and 200*b* as illustrated in FIG. 11A, (7) the field-programmable selection circuits 2093 of any of the look-up table (LUT) banks 2091 of the third type of coarse-grained field programmable (CGFP) architecture 2090 of said any of its field programmable integrated-circuit (FPIC) chips 200 or said either of the first and second field programmable integrated-circuit (IC) chips or chiplets 200*a* and 200*b* as illustrated in FIG. 13A, and/or (8) the decoder 2096 of any of the spare units 2095 of any of the look-up table (LUT) banks 2091 of the third type of coarse-grained field programmable (CGFP) architecture 2090 of said any of its field programmable integrated-circuit (FPIC) chips 200 or said either of the first and second field programmable integrated-circuit (IC) chips or chiplets 200*a* and 200*b* as illustrated in FIGS. 13A and 14. Said any of its field programmable integrated-circuit (FPIC) chips 200 or said either of the first and second field programmable integrated-circuit (IC) chips or chiplets 200*a* and 200*b* may further include multiple second signal input/output (I/O) pins 2002 coupling to its external pins 538, 570 or 583 for receiving, in an operation mode, the to-be-processed data or data-information-memory (DIM) data from its external pins 538, 570 or 583 to be passed as (1) input data of the input data set of one of the programmable logic blocks (LBs) 201 of said any of its standard commodity field programmable integrated-circuit (FPIC) chips or chiplets 200, or input data of the input data set of one of the programmable logic blocks (LBs) 201 of said either of the first and second field programmable integrated-circuit (IC) chips or chiplets 200*a* and 200*b*, or (2) a data input of one of the center-processing-unit cores (CPUC) 2010 of said any of its standard commodity field programmable integrated-circuit (FPIC) chips or chiplets 200, or a data input of one of the center-processing-unit cores (CPUC) 2010 of said any of the first and second field programmable integrated-circuit (IC) chips or chiplets 200*a* and 200*b*, (3) input data of the input data set of one of the coarse-grained programmable logic cells or elements 2060 of any type of the first through fourth types of coarse-grained field programmable (CGFP) architectures 2070, 2170, 2090 and 2270 of said any of its standard commodity field programmable integrated-circuit (FPIC) chips or chiplets 200 or input data of the input data set of one of the coarse-grained programmable logic cells or elements 2060 of said either of the first and second field programmable integrated-circuit (IC) chips or chiplets 200*a* and 200*b*, (4) input data of the second input data set of one of the four selection circuits 2073 of one of the programmable-interconnection-combined functional units 2071 or 2171 of any type of the first, second and fourth types of coarse-grained field programmable (CGFP) architectures 2070, 2170 and 2270 of said any of its standard commodity field programmable integrated-circuit (FPIC) chips or chiplets 200 or input data of the second input data set of one of the four selection circuits 2073 of one of the programmable-interconnection-combined functional units 2071 or 2171 of any type of the first, second and fourth types of coarse-grained field programmable (CGFP) architectures 2070, 2170 and 2270 of said either of the first and second field programmable integrated-circuit (IC) chips or chiplets 200*a* and 200*b*, (5) input data of the second input data set of one of the four field-programmable local-interconnection selection circuits 2074 of one of the programmable-interconnection networking units 2072 of the first type of coarse-grained field programmable (CGFP) architectures 2070 of said any of its standard commodity field programmable integrated-circuit (FPIC) chips or chiplets 200 or input data of the second input data set of one of the four field-programmable local-interconnection selection circuits 2074 of one of the programmable-interconnection networking units 2072 of the first type of coarse-grained field programmable (CGFP) architectures 2070 of said either of the first and second field programmable integrated-circuit (IC) chips or chiplets 200*a* and 200*b*, (6) input data of the second input data set of one of the four field-programmable bypass-path selection circuits 2075 of one of the programmable-interconnection networking units 2072 of the first type of coarse-grained field programmable (CGFP) architectures 2070 of said any of its standard commodity field programmable integrated-circuit (FPIC) chips or chiplets 200 or input data of the second input data set of one of the four field-programmable bypass-path selection circuits 2075 of one of the programmable-interconnection networking units 2072 of the first type of coarse-grained field programmable (CGFP) architectures 2070 of said either of the first and second field programmable integrated-circuit (IC) chips or chiplets 200*a* and 200*b*, (7) input data of the second input data set of any of the field-programmable crossbar selection circuits 2174 and 2175 of one of the programmable-interconnection-combined functional units 2171 of any type of the second and fourth types of coarse-grained field programmable (CGFP) architectures 2170 and 2270 of said any of its standard commodity field programmable integrated-circuit (FPIC) chips or chiplets 200 or input data of the second input data set of any of the field-programmable crossbar selection circuits 2174 and 2175 of one of the programmable-interconnection-combined functional units 2171 of any type of the second and fourth types of coarse-grained field programmable (CGFP) architectures 2170 and 2270 of said either of the first and second field programmable integrated-circuit (IC) chips or chiplets 200*a* and 200*b*, (8) input data of the fourth input data set of the field-programmable selection circuit 2093 of any of the look-up table (LUT) banks 2091 of the third type of coarse-grained field programmable (CGFP) architecture 2090 of said any of its standard commodity field programmable integrated-circuit (FPIC) chips or chiplets 200 or input data of the fourth input data set of the field-programmable selection circuit 2093 of any of the look-up table (LUT) banks 2091 of the third type of coarse-grained field programmable (CGFP) architecture 2090 of said either of the first and second field programmable integrated-circuit (IC) chips or chiplets 200*a* and 200*b*, or (9) input data of the fourth input data set of the decoder 2096 of any of the spare units 2095 of any of the look-up table (LUT) banks 2091 of the third type of coarse-grained field programmable (CGFP) architecture 2090 of said any of its standard commodity field programmable integrated-circuit (FPIC) chips or chiplets 200 or input data of the fourth input data set of the decoder 2096 of any of the spare units 2095 of any of the look-up table (LUT) banks 2091 of the third type of coarse-grained field programmable (CGFP) architecture 2090 of said either of the first and second field programmable integrated-circuit (IC) chips or chiplets 200*a* and 200*b*. Further, the second signal input/output (I/O) pins 2002 of said any of its field programmable integrated-circuit (FPIC) chips 200 or said either of the first and second field programmable integrated-circuit (IC) chips or chiplets 200*a* and 200*b* may pass its external pins 538, 570 or 583 the to-be-processed data or data-information-memory (DIM) data associated with (1) the data output of one of the programmable logic blocks (LBs) 201 of said any of its standard commodity field programmable integrated-circuit (FPIC) chips or chiplets 200, or the data output of one of the programmable logic blocks (LBs) 201 of said either of the first and second field programmable integrated-circuit (IC) chips or chiplets 200*a* and 200*b*, (2) the data output of one of the center-processing-unit cores (CPUC) 2010 of said any of its standard commodity field programmable integrated-circuit (FPIC) chips or chiplets 200, or the data output of one of the center-processing-unit cores (CPUC) 2010 of said either of the first and second field programmable integrated-circuit (IC) chips or chiplets 200*a* and 200*b*, or (3) the data output of one of the coarse-grained programmable logic cells or elements 2060 of any type of the first through fourth types of coarse-grained field programmable (CGFP) architectures 2070, 2170, 2090 and 2270 of said any of its standard commodity field programmable integrated-circuit (FPIC) chips or chiplets 200, or the data output of one of the coarse-grained programmable logic cells or elements 2060 of any type of the first through fourth types of coarse-grained field programmable (CGFP) architectures 2070, 2170, 2090 and 2270 of said either of the first and second field programmable integrated-circuit (IC) chips or chiplets 200*a* and 200*b*. Said any of its field programmable integrated-circuit (FPIC) chips 200 or said either of the first and second field programmable integrated-circuit (IC) chips or chiplets 200*a* and 200*b* may further include (1) multiple power or ground pins 2003 coupling to its external pins 538, 570 or 583 for delivering a voltage (Vcc or Vss) of power supply or ground reference to said any of its field programmable integrated-circuit (FPIC) chips 200 or said either of the first and second field programmable integrated-circuit (IC) chips or chiplets 200*a* and 200*b*, (2) multiple control pins 2004 coupling to its external pins 538, 570 or 583 for controlling, by its external pins 538, 570 or 583, said any of its field programmable integrated-circuit (FPIC) chips 200 or said either of the first and second field programmable integrated-circuit (IC) chips or chiplets 200*a* and 200*b* or for controlling, by said any of its field programmable integrated-circuit (FPIC) chips 200 or said either of the first and second field programmable integrated-circuit (IC) chips or chiplets 200*a* and 200*b*, its external pins 538, 570 or 583, (3) one or more read-enable pins 2005 coupling to the read-enable pins 2505 of said each of its non-volatile memory IC chips 250 for passing the read-enable signal to the read-enable pins 2505 of said each of its non-volatile memory IC chips 250 to activate the signal input/output (I/O) pins 2501 of said each of its non-volatile memory IC chips 250 to pass the encrypted CPM data from said each of its non-volatile memory IC chips 250 to its cooperating or supporting (CS) IC chip 411, and (4) multiple address pins 2006 coupling to its external pins 538, 570 or 583 and the address pins 2506 of said each of its non-volatile memory IC chips 250 for passing the second address signals to the address pins 2506 of said each of its non-volatile memory IC chips 250 to access the encrypted CPM data stored in said each of its non-volatile memory IC chips 250 to be passed from the signal input/output (I/O) pins 2501 of said each of its non-volatile memory IC chips 250 to the first signal input/output (I/O) pins 4111 of its cooperating or supporting (CS) IC chip 411. For said each of the first and second types of standard commodity logic drives 300, each of its external pins 538, 570 or 583 may be a metal pin, metal contact, metal bump or solder ball as seen in FIGS. 28-33.

Referring to FIG. 25A, for configuring or reconfiguring said each of the first and second types of standard commodity logic drives 300 for the first aspect, when said any of its standard commodity field programmable integrated-circuit (FPIC) chips or chiplets 200 or said either of the first and second field programmable integrated-circuit (IC) chips or chiplets 200*a* and 200*b* passes the read-enable signal from the read-enable pins 2005 of said any of its standard commodity field programmable integrated-circuit (FPIC) chips or chiplets 200, or the read-enable pins 2005 of said either of the first and second field programmable integrated-circuit (IC) chips or chiplets 200*a* and 200*b*, to the read-enable pins 2505 of said each of its non-volatile memory IC chips 250 to activate said each of its non-volatile memory IC chips 250 in a read-enable mode or reading stage, said each of its non-volatile memory IC chips 250 may pass the encrypted CPM data stored therein from the signal input/output (I/O) pins 2501 of said each of its non-volatile memory IC chips 250 to the first signal input/output (I/O) pins 4111 of its cooperating or supporting (CS) IC chip 411 in accordance with the second address signals passed to the address pins 2506 of said each of its non-volatile memory IC chips 250 from the address pins 2006 of said any of its standard commodity field programmable integrated-circuit (FPIC) chips or chiplets 200 or said either of the first and second field programmable integrated-circuit (IC) chips or chiplets 200*a* and 200*b*. In the read-enable mode or reading stage, after receiving the encrypted CPM data, its cooperating or supporting (CS) IC chip 411 may include the cryptography block 517 for decrypting the encrypted CPM data as the decrypted CPM data to be passed from the first signal input/output (I/O) pins 4111 of its cooperating or supporting (CS) IC chip 411 to the first signal input/output (I/O) pins 2001 of said any of its standard commodity field programmable integrated-circuit (FPIC) chips or chiplets 200 or said either of the first and second field programmable integrated-circuit (IC) chips or chiplets 200*a* and 200*b*. In the read-enable mode or reading stage, for said any of the standard commodity field programmable integrated-circuit (FPIC) chips or chiplets 200 of said each of the first and second types of standard commodity logic drives 300 or said either of the first and second field programmable integrated-circuit (IC) chips or chiplets 200*a* and 200*b* of said any of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, the decrypted CPM data may be passed from its first signal input/output (I/O) pins 2001 to (1) multiple of the memory cells 490 of one or more of its programmable logic blocks (LBs) 201 in case for the first type of fined-grained field programmable logic cell or element (LCE) 2014 as illustrated in FIG. 2A to be stored therein for configuring or programming said one or more of its programmable logic blocks (LBs) 201, (2) multiple of the memory cells of one or more of its programmable logic blocks (LBs) 201 in case for the second type of fined-grained field programmable logic cell or element (LCE) 2014 as illustrated in FIG. 2B to be stored therein for configuring or programming said one or more of its programmable logic blocks (LBs) 201, (3) multiple of the first and second sets of memory cells of one or more of its programmable logic blocks (LBs) 201 in case for the third type of fined-grained field programmable logic cell or element (LCE) 2014 as illustrated in FIG. 2C to be stored therein for configuring or programming said one or more of its programmable logic blocks (LBs) 201, (4) multiple of the third memory cells of the instruction memory block or section 2049 of one or more of its programmable logic blocks (LBs) 201 in case for the coarse-grained reconfigurable architecture (CGRA) 2041 as illustrated in FIG. 4 to be stored therein for configuring or programming said one or more of its programmable logic blocks (LBs) 201, (5) multiple of the third type of static random-access memory (SRAM) cells 398 of one or more of its programmable logic blocks (LBs) 201 in case for the coarse-grained programmable logic cells or elements (LCEs) 2060 as illustrated in FIGS. 5A-5D and 6 to be stored therein for configuring or programming said one or more of its programmable logic blocks (LBs) 201, (6) multiple of the third type of static random-access memory (SRAM) cells 398 of one or more of the coarse-grained programmable logic cells or elements (LCEs) 2060 of any type of the first through fourth types of its coarse-grained field programmable (CGFP) architectures 2070, 2170, 2090 and 2270 as illustrated in FIGS. 5A-15 to be stored therein for configuring or programming said one or more of the coarse-grained programmable logic cells or elements (LCEs) 2060, (7) multiple of the memory cells 362 of one or more of its first or second type of field programmable switch cells 379 as illustrated in FIGS. 3A and 3B to be stored therein for configuring or programming said one or more of its first or second type of field programmable switch cells 379, (8) multiple of the interconnection-programming memory cells of any type of its first, second, third and fourth types of coarse-grained field programmable (CGFP) architectures 2070, 2170, 2090 and 2270 as illustrated in FIGS. 7-15 to be stored therein for configuring or programming the four selection circuits 2073 of any of the programmable-interconnection-combined functional units 2071 or 2171 of any type of its first, second and fourth types of coarse-grained field programmable (CGFP) architectures 2070, 2170 and 2270 as illustrated in FIGS. 7-15, the four field-programmable local-interconnection selection circuits 2074 and four field-programmable bypass-path selection circuits 2075 of any of the programmable-interconnection networking units 2072 of its first type of coarse-grained field programmable (CGFP) architecture 2070 as illustrated in FIGS. 7-9, the field-programmable crossbar selection circuits 2174 and 2175 of any of the programmable-interconnection-combined functional units 2171 of any type of its second and fourth types of coarse-grained field programmable (CGFP) architectures 2170 and 2270 as illustrated in FIGS. 10-11C, the field-programmable selection circuit 2093 of any of the look-up table (LUT) banks 2091 of its third type of coarse-grained field programmable (CGFP) architecture 2090 as illustrated in FIG. 13 and/or for the decoder 2096 of any of the spare units 2095 of any of the look-up table (LUT) banks 2091 of its third type of coarse-grained field programmable (CGFP) architecture 2090 as illustrated in FIGS. 13 and 14.

Referring to FIG. 25A, for configuring or reconfiguring said each of the first and second types of standard commodity logic drives 300 for the first aspect, when its external pins 538, 570 or 583 pass the write-enable signal to the write-enable pins 2504 of said each of its non-volatile memory IC chips 250 to activate said each of its non-volatile memory IC chips 250 in a write-enable mode or writing stage, said each of its non-volatile memory IC chips 250 may receive the encrypted CPM data passed from its external pins 538, 570 or 583 to the signal input/output (I/O) pins 2501 of said each of its non-volatile memory IC chips 250 to be stored therein in accordance with the first address signals passed to the address pins 2506 of said each of its non-volatile memory IC chips 250 from its external pins 538, 570 or 583.

In an example, referring to FIG. 25A, for said each of the first and second types of standard commodity logic drives 300 for the first aspect, the read-enable pins 2505 of said each of its non-volatile memory IC chips 250 and the read-enable pins 2005 of said any of its field programmable integrated-circuit (FPIC) chips 200, or the read-enable pins 2005 of said either of the first and second field programmable integrated-circuit (IC) chips or chiplets 200*a* and 200*b*, may not be accessed by any of its external pins 538, 570 or 583 and may not couple to any of its external pins 538, 570 or 583 to protect the encrypted CPM data stored in said each of its non-volatile memory IC chips 250 from being read, copied or downloaded by a pirate. Further, in the operation mode, the read-enable pins 2005 of said any of its field programmable integrated-circuit (FPIC) chips 200, or the read-enable pins 2005 of said either of the first and second field programmable integrated-circuit (IC) chips or chiplets 200*a* and 200*b*, may pass a read disable signal to the read-enable pins 2505 of said each of its non-volatile memory IC chips 250 to disable a read function of said each of its non-volatile memory IC chips 250, and thus the encrypted CPM data stored in said each of its non-volatile memory IC chips 250 may not be read in the operation mode.

Figure 25B:
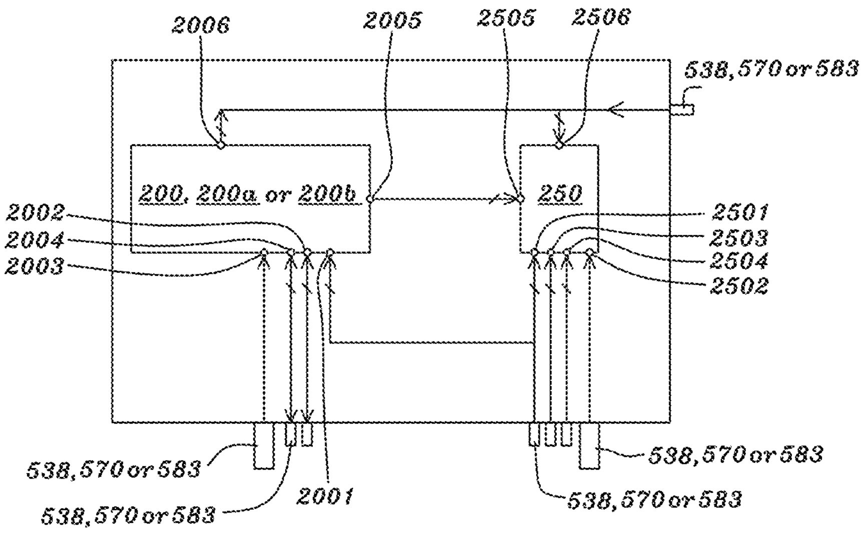
FIG. 25B is a block diagram for illustrating a second type of configuration architecture for one or more field programmable integrated-circuit (FPIC) chips in a standard commodity logic drive in accordance with the present application.

Second Type of Configuration Architecture for Field Programmable Integrated-Circuit (FPIC) Chip FIG. 25B is a block diagram for illustrating a second type of configuration architecture for one or more field programmable integrated-circuit (FPIC) chips in a standard commodity logic drive in accordance with the present application. Referring to FIG. 25B, for each of the first and second types of standard commodity logic drives 300, each of its non-volatile memory IC chips 250, such as NAND or NOR flash chip, MRAM IC chip, RRAM IC chip or FRAM IC chip, may have a read protect function or circuit to protect said each of its non-volatile memory IC chips 250 from being read from its external circuits and may include (1) multiple signal input/output (I/O) pins 2501 coupling to its external pins 538, 570 or 583, e.g., SATA port 521 as illustrated in FIG. 21B, for receiving the CPM data, i.e., original CPM data as illustrated in FIG. 23A-23C, from its external pins 538, 570 or 583 to be stored therein and coupling to any of its field programmable integrated-circuit (FPIC) chips 200 or either of the first and second field programmable integrated-circuit (IC) chips or chiplets 200*a* and 200*b* of any of its field programmable chip-on-chip modules 400 in case of replacing its standard commodity field programmable integrated-circuit (FPIC) chips or chiplets 200 for passing the CPM data to said any of its field programmable integrated-circuit (FPIC) chips 200 or said either of the first and second field programmable integrated-circuit (IC) chips or chiplets 200*a* and 200*b*, (2) multiple power or ground pins 2502 coupling to its external pins 538, 570 or 583 for delivering a voltage (Vcc or Vss) of power supply or ground reference to said each of its non-volatile memory IC chips 250, (3) multiple control pins 2503 coupling to its external pins 538, 570 or 583 for controlling, by its external pins 538, 570 or 583, said each of its non-volatile memory IC chips 250, (4) one or more write-enable pins 2504 coupling to its external pins 538, 570 or 583 for receiving a write-enable signal from its external pins 538, 570 or 583 to activate the signal input/output (I/O) pins 2501 thereof for receiving the CPM data from its external pins 538, 570 or 583 to be stored therein, (5) one or more read-enable pins 2505 coupling to said any of its field programmable integrated-circuit (FPIC) chips 200 or said either of the first and second field programmable integrated-circuit (IC) chips or chiplets 200*a* and 200*b* for receiving a read-enable signal from said any of its field programmable integrated-circuit (FPIC) chips 200 or said either of the first and second field programmable integrated-circuit (IC) chips or chiplets 200*a* and 200*b* to activate the signal input/output (I/O) pins 2501 thereof to pass the CPM data to said any of its field programmable integrated-circuit (FPIC) chips 200 or said either of the first and second field programmable integrated-circuit (IC) chips or chiplets 200*a* and 200*b*, and (6) multiple address pins 2506 coupling to its external pins

538, 570 or 583 and said any of its field programmable integrated-circuit (FPIC) chips 200 or said either of the first and second field programmable integrated-circuit (IC) chips or chiplets 200*a* and 200*b* for receiving multiple first address signals from its external pins 538, 570 or 583 and multiple second address signals from said any of its field programmable integrated-circuit (FPIC) chips 200 or said either of the first and second field programmable integrated-circuit (IC) chips or chiplets 200*a* and 200*b*. Said any of its field programmable integrated-circuit (FPIC) chips 200 or said either of the first and second field programmable integrated-circuit (IC) chips or chiplets 200*a* and 200*b* may include multiple first signal input/output (I/O) pins 2001 multiple first signal input/output (I/O) pins 2001 coupling to said each of its non-volatile memory IC chips 250 for receiving the CPM data from the signal input/output (I/O) pins 2501 of said each of its non-volatile memory IC chips 250 for configuring or programming (1) the programmable logic blocks (LBs) 201 of said any of its field programmable integrated-circuit (FPIC) chips 200 or said either of the first and second field programmable integrated-circuit (IC) chips or chiplets 200*a* and 200*b* in case for the first through third types of fined-grained field programmable logic cell or element (LCE) 2014 as illustrated in FIGS. 2A-2C, the coarse-grained reconfigurable architecture (CGRA) 2041 as illustrated in FIG. 4 or the coarse-grained programmable logic cells or elements (LCEs) 2060 as illustrated in FIGS. 5A-5D and 6, (2) the coarse-grained programmable logic cells or elements (LCEs) 2060 of any type of the first through fourth types of coarse-grained field programmable (CGFP) architectures 2070, 2170, 2090 and 2270 of said any of its field programmable integrated-circuit (FPIC) chips 200 or said either of the first and second field programmable integrated-circuit (IC) chips or chiplets 200*a* and 200*b* as illustrated in FIGS. 5A-15, (3) the first or second type of field programmable switch cells 379 of said any of its field programmable integrated-circuit (FPIC) chips 200 or said either of the first and second field programmable integrated-circuit (IC) chips or chiplets 200*a* and 200*b* as illustrated in FIGS. 3A and 3B, (4) the four selection circuits 2073 of any of the programmable-interconnection-combined functional units 2071 or 2171 of any type of the first, second and fourth types of coarse-grained field programmable (CGFP) architectures 2070, 2170 and 2270 of said any of its field programmable integrated-circuit (FPIC) chips 200 or said either of the first and second field programmable integrated-circuit (IC) chips or chiplets 200*a* and 200*b* as illustrated in FIG. 8A, (5) the four field-programmable local-interconnection selection circuits 2074 and field-programmable bypass-path selection circuits 2075 of any of the programmable-interconnection networking units 2072 of the first type of coarse-grained field programmable (CGFP) architectures 2070 of said any of its field programmable integrated-circuit (FPIC) chips 200 or said either of the first and second field programmable integrated-circuit (IC) chips or chiplets 200*a* and 200*b* as illustrated in FIG. 9, (6) the field-programmable crossbar selection circuits 2174 and 2175 of any of the programmable-interconnection-combined functional units 2171 of any type of the second and fourth types of coarse-grained field programmable (CGFP) architectures 2170 and 2270 of said any of its field programmable integrated-circuit (FPIC) chips 200 or said either of the first and second field programmable integrated-circuit (IC) chips or chiplets 200*a* and 200*b* as illustrated in FIG. 11A, (7) the field-programmable selection circuits 2093 of any of the look-up table (LUT) banks 2091 of the third type of coarse-grained field programmable (CGFP) architecture 2090 of said any of its field programmable integrated-circuit (FPIC) chips 200 or said either of the first and second field programmable integrated-circuit (IC) chips or chiplets 200*a* and 200*b* as illustrated in FIG. 13A, and/or (8) the decoder 2096 of any of the spare units 2095 of any of the look-up table (LUT) banks 2091 of the third type of coarse-grained field programmable (CGFP) architecture 2090 of said any of its field programmable integrated-circuit (FPIC) chips 200 or said either of the first and second field programmable integrated-circuit (IC) chips or chiplets 200*a* and 200*b* as illustrated in FIGS. 13A and 14. Said any of its field programmable integrated-circuit (FPIC) chips 200 or said either of the first and second field programmable integrated-circuit (IC) chips or chiplets 200*a* and 200*b* may further include multiple second signal input/output (I/O) pins 2002 coupling to its external pins 538, 570 or 583 for receiving, in an operation mode, the to-be-processed data or data-information-memory (DIM) data from its external pins 538, 570 or 583 to be passed as (1) input data of the input data set of one of the programmable logic blocks (LBs) 201 of said any of its standard commodity field programmable integrated-circuit (FPIC) chips or chiplets 200, or input data of the input data set of one of the programmable logic blocks (LBs) 201 of said either of the first and second field programmable integrated-circuit (IC) chips or chiplets 200*a* and 200*b*, or (2) a data input of one of the center-processing-unit cores (CPUC) 2010 of said any of its standard commodity field programmable integrated-circuit (FPIC) chips or chiplets 200, or a data input of one of the center-processing-unit cores (CPUC) 2010 of said either of the first and second field programmable integrated-circuit (IC) chips or chiplets 200*a* and 200*b*, (3) input data of the input data set of one of the coarse-grained programmable logic cells or elements 2060 of any type of the first through fourth types of coarse-grained field programmable (CGFP) architectures 2070, 2170, 2090 and 2270 of said any of its standard commodity field programmable integrated-circuit (FPIC) chips or chiplets 200 or input data of the input data set of one of the coarse-grained programmable logic cells or elements 2060 of said either of the first and second field programmable integrated-circuit (IC) chips or chiplets 200*a* and 200*b*, (4) input data of the second input data set of one of the four selection circuits 2073 of one of the programmable-interconnection-combined functional units 2071 or 2171 of any type of the first, second and fourth types of coarse-grained field programmable (CGFP) architectures 2070, 2170 and 2270 of said any of its standard commodity field programmable integrated-circuit (FPIC) chips or chiplets 200 or input data of the second input data set of one of the four selection circuits 2073 of one of the programmable-interconnection-combined functional units 2071 or 2171 of any type of the first, second and fourth types of coarse-grained field programmable (CGFP) architectures 2070, 2170 and 2270 of said either of the first and second field programmable integrated-circuit (IC) chips or chiplets 200*a* and 200*b*, (5) input data of the second input data set of one of the four field-programmable local-interconnection selection circuits 2074 of one of the programmable-interconnection networking units 2072 of the first type of coarse-grained field programmable (CGFP) architectures 2070 of said any of its standard commodity field programmable integrated-circuit (FPIC) chips or chiplets 200 or input data of the second input data set of one of the four field-programmable local-interconnection selection circuits 2074 of one of the programmable-interconnection networking units 2072 of the first type of coarse-grained field programmable (CGFP) architectures 2070 of said either of the first and second field programmable integrated-circuit (IC) chips or chiplets 200*a* and 200*b*, (6) input data of the second input data set of one of the four field-programmable bypass-path selection circuits 2075 of one of the programmable-interconnection networking units 2072 of the first type of coarse-grained field programmable (CGFP) architectures 2070 of said any of its standard commodity field programmable integrated-circuit (FPIC) chips or chiplets 200 or input data of the second input data set of one of the four field-programmable bypass-path selection circuits 2075 of one of the programmable-interconnection networking units 2072 of the first type of coarse-grained field programmable (CGFP) architectures 2070 of said either of the first and second field programmable integrated-circuit (IC) chips or chiplets 200*a* and 200*b*, (7) input data of the second input data set of any of the field-programmable crossbar selection circuits 2174 and 2175 of one of the programmable-interconnection-combined functional units 2171 of any type of the second and fourth types of coarse-grained field programmable (CGFP) architectures 2170 and 2270 of said any of its standard commodity field programmable integrated-circuit (FPIC) chips or chiplets 200 or input data of the second input data set of any of the field-programmable crossbar selection circuits 2174 and 2175 of one of the programmable-interconnection-combined functional units 2171 of any type of the second and fourth types of coarse-grained field programmable (CGFP) architectures 2170 and 2270 of said either of the first and second field programmable integrated-circuit (IC) chips or chiplets 200*a* and 200*b*, (8) input data of the fourth input data set of the field-programmable selection circuit 2093 of any of the look-up table (LUT) banks 2091 of the third type of coarse-grained field programmable (CGFP) architecture 2090 of said any of its standard commodity field programmable integrated-circuit (FPIC) chips or chiplets 200 or input data of the fourth input data set of the field-programmable selection circuit 2093 of any of the look-up table (LUT) banks 2091 of the third type of coarse-grained field programmable (CGFP) architecture 2090 of said either of the first and second field programmable integrated-circuit (IC) chips or chiplets 200*a* and 200*b*, or (9) input data of the fourth input data set of the decoder 2096 of any of the spare units 2095 of any of the look-up table (LUT) banks 2091 of the third type of coarse-grained field programmable (CGFP) architecture 2090 of said any of its standard commodity field programmable integrated-circuit (FPIC) chips or chiplets 200 or input data of the fourth input data set of the decoder 2096 of any of the spare units 2095 of any of the look-up table (LUT) banks 2091 of the third type of coarse-grained field programmable (CGFP) architecture 2090 of said either of the first and second field programmable integrated-circuit (IC) chips or chiplets 200*a* and 200*b*. Further, the second signal input/output (I/O) pins 2002 of said any of its field programmable integrated-circuit (FPIC) chips 200 or said either of the first and second field programmable integrated-circuit (IC) chips or chiplets 200*a* and 200*b* may pass its external pins 538, 570 or 583 the to-be-processed data or data-information-memory (DIM) data associated with (1) the data output of one of the programmable logic blocks (LBs) 201 of said any of its standard commodity field programmable integrated-circuit (FPIC) chips or chiplets 200, or the data output of one of the programmable logic blocks (LBs) 201 of said either of the first and second field programmable integrated-circuit (IC) chips or chiplets 200*a* and 200*b*, (2) the data output of one of the center-processing-unit cores (CPUC) 2010 of said any of its standard commodity field programmable integrated-circuit (FPIC) chips or chiplets 200, or the data output of one of the center-processing-unit cores (CPUC) 2010 of said either of the first and second field programmable integrated-circuit (IC) chips or chiplets 200*a* and 200*b*, or (3) the data output of one of the coarse-grained programmable logic cells or elements 2060 of any type of the first through fourth types of coarse-grained field programmable (CGFP) architectures 2070, 2170, 2090 and 2270 of said any of its standard commodity field programmable integrated-circuit (FPIC) chips or chiplets 200, or the data output of one of the coarse-grained programmable logic cells or elements 2060 of any type of the first through fourth types of coarse-grained field programmable (CGFP) architectures 2070, 2170, 2090 and 2270 of said either of the first and second field programmable integrated-circuit (IC) chips or chiplets 200*a* and 200*b*. Said any of its field programmable integrated-circuit (FPIC) chips 200 or said either of the first and second field programmable integrated-circuit (IC) chips or chiplets 200*a* and 200*b* may further include (1) multiple power or ground pins 2003 coupling to its external pins 538, 570 or 583 for delivering a voltage (Vcc or Vss) of power supply or ground reference to said any of its field programmable integrated-circuit (FPIC) chips 200 or said either of the first and second field programmable integrated-circuit (IC) chips or chiplets 200*a* and 200*b*, (2) multiple control pins 2004 coupling to its external pins 538, 570 or 583 for controlling, by its external pins 538, 570 or 583, said any of its field programmable integrated-circuit (FPIC) chips 200 or said either of the first and second field programmable integrated-circuit (IC) chips or chiplets 200*a* and 200*b* or for controlling, by said any of its field programmable integrated-circuit (FPIC) chips 200 or said either of the first and second field programmable integrated-circuit (IC) chips or chiplets 200*a* and 200*b*, its external pins 538, 570 or 583, (3) one or more read-enable pins 2005 coupling to the read-enable pins 2505 of said each of its non-volatile memory IC chips 250 for passing the read-enable signal to the read-enable pins 2505 of said each of its non-volatile memory IC chips 250 to activate the signal input/output (I/O) pins 2501 of said each of its non-volatile memory IC chips 250 to pass the CPM data from said each of its non-volatile memory IC chips 250 to said any of its field programmable integrated-circuit (FPIC) chips 200 or said either of the first and second field programmable integrated-circuit (IC) chips or chiplets 200*a* and 200*b*, and (4) multiple address pins 2006 coupling to its external pins 538, 570 or 583 and the address pins 2506 of said each of its non-volatile memory IC chips 250 for passing the second address signals to the address pins 2506 of said any of its non-volatile memory IC chips 250 to access the CPM data stored in said each of its non-volatile memory IC chips 250 to be passed from the signal input/output (I/O) pins 2501 of said each of its non-volatile memory IC chips 250 to the first signal input/output (I/O) pins 2001 of said any of its field programmable integrated-circuit (FPIC) chips 200 or said either of the first and second field programmable integrated-circuit (IC) chips or chiplets 200*a* and 200*b*. For said each of the first and second types of standard commodity logic drives 300, each of its external pins 538, 570 or 583 may be a metal pin, metal contact, metal bump or solder ball as seen in FIGS. 28-33.

Referring to FIG. 25B, for configuring or reconfiguring said each of the first and second types of standard commodity logic drives 300, when said any of its standard commodity field programmable integrated-circuit (FPIC) chips or chiplets 200 or said either of the first and second field programmable integrated-circuit (IC) chips or chiplets 200*a* and 200*b* passes the read-enable signal from the read-enable pins 2005 of said any of its standard commodity field programmable integrated-circuit (FPIC) chips or chiplets 200, or the read-enable pins 2005 of said either of the first and second field programmable integrated-circuit (IC) chips or chiplets 200_a_ and 200_b_, to the read-enable pins 2505 of said each of its non-volatile memory IC chips 250 to activate said each of its non-volatile memory IC chips 250 in a read-enable mode or reading stage, said each of its non-volatile memory IC chips 250 may pass the CPM data stored therein from the signal input/output (I/O) pins 2501 of said each of its non-volatile memory IC chips 250 to the first signal input/output (I/O) pins 2001 of said any of its standard commodity field programmable integrated-circuit (FPIC) chips or chiplets 200 or said either of the first and second field programmable integrated-circuit (IC) chips or chiplets 200_a_ and 200_b_ in accordance with the second address signals passed to the address pins 2506 of said each of its non-volatile memory IC chips 250 from the address pins 2006 of said any of its standard commodity field programmable integrated-circuit (FPIC) chips or chiplets 200 or said either of the first and second field programmable integrated-circuit (IC) chips or chiplets 200_a_ and 200_b_. In the read-enable mode or reading stage, for said any of the standard commodity field programmable integrated-circuit (FPIC) chips or chiplets 200 of said each of the first and second types of standard commodity logic drives 300 or said either of the first and second field programmable integrated-circuit (IC) chips or chiplets 200_a_ and 200_b_ of said any of the field programmable chip-on-chip modules 400 of said each of the first and second types of standard commodity logic drives 300 in case of replacing the standard commodity field programmable integrated-circuit (FPIC) chips or chiplets 200 of said each of the first and second types of standard commodity logic drives 300, the CPM data may be passed from its first signal input/output (I/O) pins 2001 to (1) multiple of the memory cells 490 of one or more of its programmable logic blocks (LBs) 201 in case for the first type of fined-grained field programmable logic cell or element (LCE) 2014 as illustrated in FIG. 2A to be stored therein for configuring or programming said one or more of its programmable logic blocks (LBs) 201, (2) multiple of the memory cells of one or more of its programmable logic blocks (LBs) 201 in case for the second type of fined-grained field programmable logic cell or element (LCE) 2014 as illustrated in FIG. 2B to be stored therein for configuring or programming said one or more of its programmable logic blocks (LBs) 201, (3) multiple of the first and second sets of memory cells of one or more of its programmable logic blocks (LBs) 201 in case for the third type of fined-grained field programmable logic cell or element (LCE) 2014 as illustrated in FIG. 2C to be stored therein for configuring or programming said one or more of its programmable logic blocks (LBs) 201, (4) multiple of the third memory cells of the instruction memory block or section 2049 of one or more of its programmable logic blocks (LBs) 201 in case for the coarse-grained reconfigurable architecture (CGRA) 2041 as illustrated in FIG. 4 to be stored therein for configuring or programming said one or more of its programmable logic blocks (LBs) 201, (5) multiple of the third type of static random-access memory (SRAM) cells 398 of one or more of its programmable logic blocks (LBs) 201 in case for the coarse-grained programmable logic cells or elements (LCEs) 2060 as illustrated in FIGS. 5A-5D and 6 to be stored therein for configuring or programming said one or more of its programmable logic blocks (LBs) 201, (6) multiple of the third type of static random-access memory (SRAM) cells 398 of one or more of the coarse-grained programmable logic cells or elements (LCEs) 2060 of any type of the first through fourth types of its coarse-grained field programmable (CGFP) architectures 2070, 2170, 2090 and 2270 as illustrated in FIGS. 5A-15 to be stored therein for configuring or programming said one or more of the coarse-grained programmable logic cells or elements (LCEs) 2060, (7) multiple of the memory cells 362 of one or more of its first or second type of field programmable switch cells 379 as illustrated in FIGS. 3A and 3B to be stored therein for configuring or programming said one or more of its first or second type of field programmable switch cells 379, (8) multiple of the interconnection-programming memory cells of any type of its first, second, third and fourth types of coarse-grained field programmable (CGFP) architectures 2070, 2170, 2090 and 2270 as illustrated in FIGS. 7-15 to be stored therein for configuring or programming the four selection circuits 2073 of any of the programmable-interconnection-combined functional units 2071 or 2171 of any type of its first, second and fourth types of coarse-grained field programmable (CGFP) architectures 2070, 2170 and 2270 as illustrated in FIGS. 7-15, the four field-programmable local-interconnection selection circuits 2074 and four field-programmable bypass-path selection circuits 2075 of any of the programmable-interconnection networking units 2072 of its first type of coarse-grained field programmable (CGFP) architecture 2070 as illustrated in FIGS. 7-9, the field-programmable crossbar selection circuits 2174 and 2175 of any of the programmable-interconnection-combined functional units 2171 of any type of its second and fourth types of coarse-grained field programmable (CGFP) architectures 2170 and 2270 as illustrated in FIGS. 10-11C, the field-programmable selection circuit 2093 of any of the look-up table (LUT) banks 2091 of its third type of coarse-grained field programmable (CGFP) architecture 2090 as illustrated in FIG. 13 and/or for the decoder 2096 of any of the spare units 2095 of any of the look-up table (LUT) banks 2091 of its third type of coarse-grained field programmable (CGFP) architecture 2090 as illustrated in FIGS. 13 and 14.

Referring to FIG. 25B, for configuring or reconfiguring said each of the first and second types of standard commodity logic drives 300, when its external pins 570 or 583 pass the write-enable signal to the write-enable pins 2504 of said each of its non-volatile memory IC chips 250 to activate said one of its non-volatile memory IC chips 250 in a write-enable mode or writing stage, said each of its non-volatile memory IC chips 250 may receive the CPM data passed from its external pins 570 or 583 to the signal input/output (I/O) pins 2501 of said each of its non-volatile memory IC chips 250 to be stored therein in accordance with the first address signals passed to the address pins 2506 of said each of its non-volatile memory IC chips 250 from its external pins 570 or 583.

In an example, referring to FIG. 25B, for said each of the first and second types of standard commodity logic drives 300, the read-enable pins 2505 of said each of its non-volatile memory IC chips 250 and the read-enable pins 2005 of said any of its field programmable integrated-circuit (FPIC) chips 200, or the read-enable pins 2005 of said either of the first and second field programmable integrated-circuit (IC) chips or chiplets 200_a_ and 200_b_, may not be accessed by any of its external pins 570 or 583 and may not couple to any of its external pins 570 or 583 to protect the CPM data stored in said each of its non-volatile memory IC chips 250 from being read, copied or downloaded by a pirate. Further, in the operation mode, the read-enable pins 2005 of said any of its field programmable integrated-circuit (FPIC) chips 200, or the read-enable pins 2005 of said either of the first and second field programmable integrated-circuit (IC) chips or chiplets 200*a* and 200*b*, may pass a read disable signal to the read-enable pins 2505 of said each of its non-volatile memory IC chips 250 to disable a read function of said each of its non-volatile memory IC chips 250, and thus the CPM data stored in said each of its non-volatile memory IC chips 250 may not be read in the operation mode.

Specification for Semiconductor Integrated-Circuit (IC) Chip

1. First Type of Semiconductor Integrated-Circuit (IC) Chip

Figure 26A:
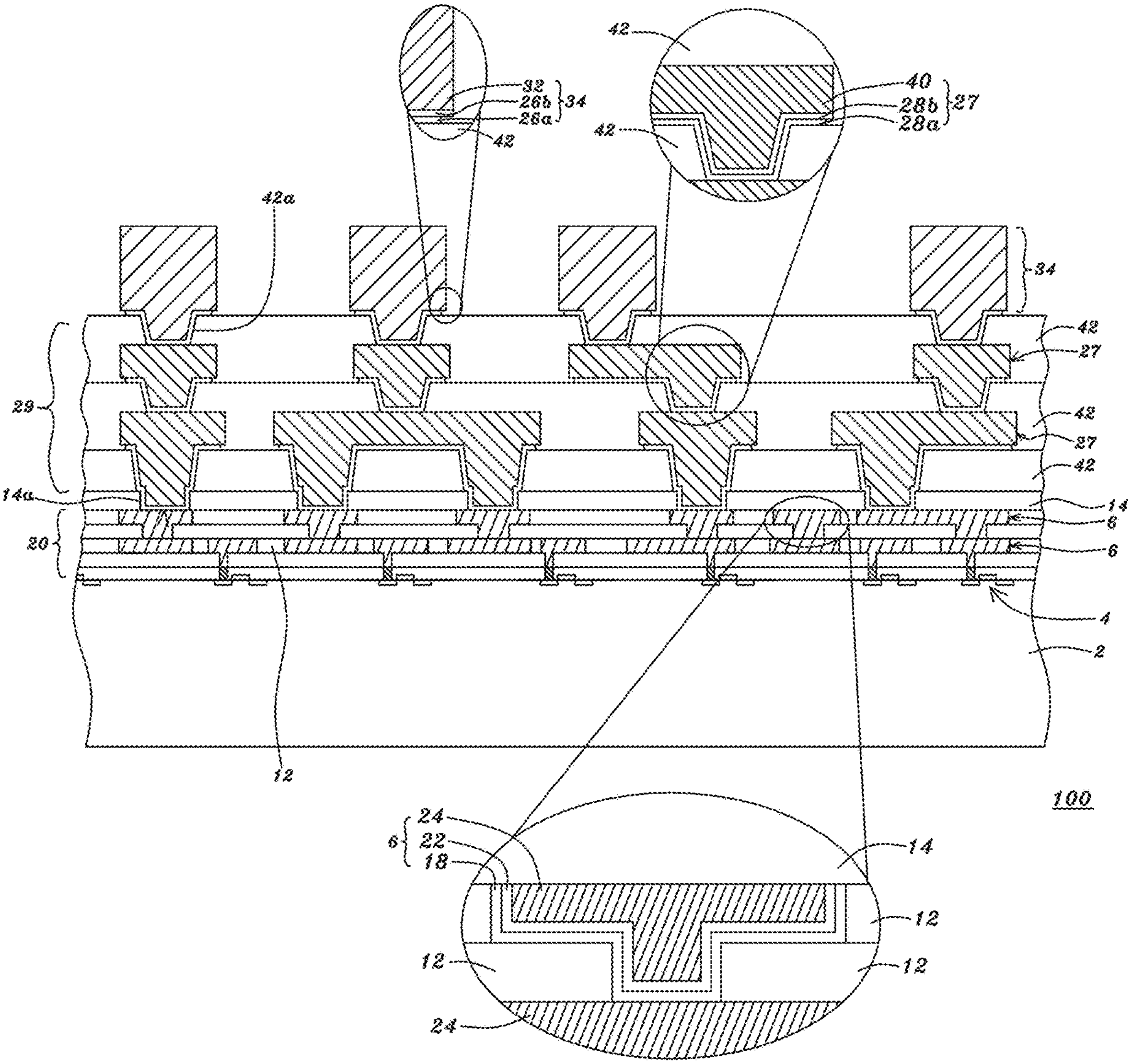
FIG. 26A-26F are schematically cross-sectional views showing various types of semiconductor integrated-circuit (IC) chips in accordance with an embodiment of the present application.

FIG. 26A is a schematically cross-sectional view showing a first type of semiconductor integrated-circuit (IC) chip in accordance with an embodiment of the present application. Referring to FIG. 26A, a first type of semiconductor integrated-circuit (IC) chip 100 may include (1) a semiconductor substrate 2, such as silicon substrate, GaAs substrate, SiGe substrate or silicon-on-insulator (SOI) substrate; (2) multiple semiconductor devices 4, such as planar metal-oxide-semiconductor (MOS) transistors, fin field effective transistors (FINFETs), gate-all-around field effective transistors (GAAFETs) or passive devices, at a top surface of its semiconductor substrate 2; (3) a first interconnection scheme for a chip (FISC) 20 over its semiconductor substrate 2, provided with one or more interconnection metal layers 6 coupling to its semiconductor devices 4 and one or more insulating dielectric layers 12 each between neighboring two of its interconnection metal layers 6, wherein each of its one or more interconnection metal layers 6 may have a thickness between 0.1 and 2 micrometers; (4) a passivation layer 14 over its first interconnection scheme for a chip (FISC) 20, wherein multiple openings 14*a* in its passivation layer 14 may be aligned with and over multiple metal pads of the topmost one of the interconnection metal layers 6 of its first interconnection scheme for a chip (FISC) 20; (5) a second interconnection scheme for a chip (SISC) 29 optionally provided over its passivation layer 14, provided with one or more interconnection metal layers 27 coupling to the topmost one of the interconnection metal layers 6 of its first interconnection scheme for a chip (FISC) 20 through the openings 14*a* in its passivation layer 14 and one or more polymer layers 42, i.e., insulating dielectric layers, each between neighboring two of its interconnection metal layers 27, under a bottommost one of its interconnection metal layers 27 or over a topmost one of its interconnection metal layers 27, wherein multiple openings 42*a* in the topmost one of its polymer layers 42 may be aligned with and over multiple metal pads of the topmost one of the interconnection metal layers 27 of its second interconnection scheme for a chip (SISC) 29, wherein each of the interconnection metal layers 27 of its second interconnection scheme for a chip (SISC) 29 may have a thicknesses between 3 and 5 micrometers; and (6) multiple micro-bumps, micro-pillars or micro-pads 34 on the topmost one of the interconnection metal layers 27 of its second interconnection scheme for a chip (SISC) 29 or, if the second interconnection scheme for a chip (SISC) 29 is not provided, on the topmost one of the interconnection metal layers 6 of its first interconnection scheme for a chip (FISC) 20.

Referring to FIG. 26A, the first type of semiconductor integrated-circuit (IC) chip 100 may have the arrangement as illustrated in either of FIGS. 17A and 17B for the first and second types of standard commodity field programmable integrated-circuit (FPIC) chips or chiplets 200. For the first type of semiconductor integrated-circuit (IC) chip 100 in case for any of the field-programmable-gate-array (FPGA) integrated-circuit (IC) chips or chiplets 200 of each of the first and second types of standard commodity logic drives 300 as illustrated in FIGS. 19A and 19B, or either of the first and second field programmable integrated-circuit (IC) chips or chiplets 200*a* and 200*b* of any of the field programmable chip-on-chip modules 400 of said each of the first and second types of standard commodity logic drives 300 in case of replacing the field-programmable-gate-array (FPGA) integrated-circuit (IC) chips or chiplets 200 of said each of the first and second types of standard commodity logic drives 300, its semiconductor devices 4 may be provided for any type of the first through third types of SRAM cells 398 as illustrated in FIGS. 1A-1G to be arranged therein, any type of the first through third types of fined-grained field programmable logic cells or elements (LCEs) 2014 as illustrated in FIGS. 2A-2C to be arranged therein, any type of the first and second types of field programmable switch cells 379 as illustrated in FIGS. 3A and 3B to be arranged therein, the coarse-grained reconfigurable (CGR) units 2052 of the coarse-grained reconfigurable architecture (CGRA) 2041 as illustrated in FIG. 4 to be arranged therein, the coarse-grained programmable logic cell or element (LCE) 2060 as illustrated in FIG. 5A to be arranged therein, the programmable-interconnection-combined functional units 2071 of either type of the first and fourth types of coarse-grained field programmable (CGFP) architectures 2070 and 2270 as illustrated in FIGS. 7, 8A, 8B and 15 to be arranged therein, the programmable-interconnection networking units 2072 of the first type of coarse-grained field programmable (CGFP) architecture 2070 as illustrated in FIGS. 7 and 9 to be arranged therein, the programmable-interconnection-combined functional units 2171 of either type of the second and fourth types of coarse-grained field programmable (CGFP) architecture 2170 and 2270 as illustrated in FIGS. 10, 11A-11C and 15 to be arranged therein, or the look-up table (LUT) banks 2091 of the third type of coarse-grained field programmable (CGFP) architecture 2090 as illustrated in FIGS. 10, 11A-11C and 15 to be arranged therein.

Referring to FIG. 26A, for the first type of semiconductor integrated-circuit (IC) chip 100, each of the interconnection metal layers 6 of its first interconnection scheme for a chip (FISC) 20 may include (1) a copper layer 24 having lower portions in openings in a lower one of the insulating dielectric layers 12, such as SiOC layers having a thickness of between 3 nm and 500 nm, and upper portions having a thickness of between 3 nm and 500 nm over the lower one of the insulating dielectric layers 12 and in openings in an upper one of the insulating dielectric layers 12, (2) an adhesion layer 18, such as titanium or titanium nitride having a thickness of between 1 nm and 50 nm, at a bottom and sidewall of each of the lower portions of the copper layer 24 and at a bottom and sidewall of each of the upper portions of the copper layer 24, and (3) a seed layer 22, such as copper, between the copper layer 24 and the adhesion layer 18, wherein the copper layer 24 has a top surface substantially coplanar with a top surface of the upper one of the insulating dielectric layers 12. Each of the interconnection metal layers 6 of its first interconnection scheme for a chip (FISC) 20 may be patterned with a metal line or trace having a thickness between 0.1 and 2 micrometers, between 3 nm and 1,000 nm or between 10 nm and 500 nm, or thinner than or equal to 5 nm, 10 nm, 30 nm, 50 nm, 100 nm, 200 nm, 300 nm, 500 nm or 1,000 nm and a width between 3 nm and 1,000 nm or between 10 nm and 500 nm, or narrower than 5 nm, 10 nm, 20 nm, 30 nm, 70 nm, 100 nm, 300 nm, 500 nm or 1,000 nm, for example. Each of the insulating dielectric layers 12 of its first interconnection scheme for a chip (FISC) 20 may be made of a layer of silicon oxide or silicon oxycarbide having a thickness between 0.1 and 2 micrometers, between 3 nm and 1,000 nm or between 10 nm and 500 nm, or thinner than 5 nm, 10 nm, 30 nm, 50 nm, 100 nm, 200 nm, 300 nm, 500 nm or 1,000 nm. Alternatively, the topmost one of the interconnection metal layers 6 of its first interconnection scheme for a chip (FISC) 20 may be made of a layer of aluminum having a thickness between 1 and 5 micrometers.

Referring to FIG. 26A, for the first type of semiconductor integrated-circuit (IC) chip 100, its passivation layer 14 containing a silicon-nitride, SiON or SiCN layer having a thickness greater than 0.3 μm for example and, alternatively, a polymer layer having a thickness between 1 and 10 μm may protect the semiconductor devices 4 and the interconnection metal layers 6 from being damaged by moisture foreign ion contamination, or from water moisture or contamination form external environment, for example sodium mobile ions. Each of the openings 14*a* in its passivation layer 14 may have a transverse dimension, from a top view, of between 0.5 and 20 μm.

Referring to FIG. 26A, for the first type of semiconductor integrated-circuit (IC) chip 100, each of the interconnection metal layers 27 of its second interconnection scheme for a chip (SISC) 29 may include (1) a copper layer 40 having lower portions in openings in one of the polymer layers 42 having a thickness of between 0.3 μm and 20 μm, and upper portions having a thickness between 0.3 μm and 20 μm over said one of the polymer layers 42, (2) an adhesion layer 28*a*, such as titanium or titanium nitride having a thickness of between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40 may have a sidewall not covered by the adhesion layer 28*a*. Each of the interconnection metal layers 27 of its second interconnection scheme for a chip (SISC) 29 may be patterned with a metal line or trace having a thickness between, for example, 0.3 μm and 20 μm, 0.5 μm and 10 μm, 1 μm and 5 μm, 1 μm and 10 μm, or 2 μm and 10 μm, or thicker than or equal to 0.3 μm, 0.5 μm, 0.7 μm, 1 μm, 1.5 μm, 2 μm or 3 μm and a width between, for example, 0.3 μm and 20 μm, 0.5 μm and 10 μm, 1 μm and 5 μm, 1 μm and 10 μm, or 2 μm and 10 μm, or wider than or equal to 0.3 μm, 0.5 μm, 0.7 μm, 1 μm, 1.5 μm, 2 μm or 3 μm. Each of the polymer layers 42 of its second interconnection scheme for a chip (SISC) 29 may have a thickness between, for example, 0.3 μm and 20 μm, 0.5 μm and 10 μm, 1 μm and 5 μm, or 1 μm and 10 μm, or thicker than or equal to 0.3 μm, 0.5 μm, 0.7 μm, 1 μm, 1.5 μm, 2 μm or 3 μm.

Referring to FIG. 26A, for the first type of semiconductor integrated-circuit (IC) chip 100 in case for any of the field-programmable-gate-array (FPGA) integrated-circuit (IC) chips or chiplets 200 of each of the first and second types of standard commodity logic drives 300 as illustrated in FIGS. 19A and 19B, or either of the first and second field programmable integrated-circuit (IC) chips or chiplets 200*a* and 200*b* of any of the field programmable chip-on-chip modules 400 of said each of the first and second types of standard commodity logic drives 300 in case of replacing the field-programmable-gate-array (FPGA) integrated-circuit (IC) chips or chiplets 200 of said each of the first and second types of standard commodity logic drives 300, the combination of the interconnection metal layers 27 of its second interconnection scheme for a chip (SISC) 29 and the interconnection metal layers 6 of its first interconnection scheme for a chip (FISC) 20 may be formed for any of the programmable interconnects 361 and non-programmable interconnects 364 of the intra-chip interconnects 502 of said any of the field-programmable-gate-array (FPGA) integrated-circuit (IC) chips or chiplets 200 or said either of the first and second field programmable integrated-circuit (IC) chips or chiplets 200*a* and 200*b* as illustrated in FIGS. 3A, 3B, 7-15, 17A and 17B, for any of the programmable bypass paths 2361 of said any of the field-programmable-gate-array (FPGA) integrated-circuit (IC) chips or chiplets 200 or said either of the first and second field programmable integrated-circuit (IC) chips or chiplets 200*a* and 200*b* as illustrated in FIG. 7, for any of the programmable bypass paths 2361 of said any of the field-programmable-gate-array (FPGA) integrated-circuit (IC) chips or chiplets 200 or said either of the first and second field programmable integrated-circuit (IC) chips or chiplets 200*a* and 200*b* as illustrated in FIGS. 7 and 9, for any of the programmable bypass paths 2172 and 2173 of said any of the field-programmable-gate-array (FPGA) integrated-circuit (IC) chips or chiplets 200 or said either of the first and second field programmable integrated-circuit (IC) chips or chiplets 200*a* and 200*b* as illustrated in FIGS. 10, 11A-11C and 15, for any of the programmable bypass paths 2172 and 2173 of said any of the field-programmable-gate-array (FPGA) integrated-circuit (IC) chips or chiplets 200 or said either of the first and second field programmable integrated-circuit (IC) chips or chiplets 200*a* and 200*b* as illustrated in FIGS. 10, 11A-11C and 15, or for any of the local and global programmable interconnection network 2092 and 2094 of said any of the field-programmable-gate-array (FPGA) integrated-circuit (IC) chips or chiplets 200 or said either of the first and second field programmable integrated-circuit (IC) chips or chiplets 200*a* and 200*b* as illustrated in FIG. 13.

Referring to FIG. 26A, for the first type of semiconductor integrated-circuit (IC) chip 100, each of its micro-bumps, micro-pillars or micro-pads 34 may be of one type of various types, i.e., first through fourth types. The first type of semiconductor integrated-circuit (IC) chip 100 as shown in FIG. 26A is only shown with its first type of micro-bumps, micro-pillars or micro-pads 34. Its first type of micro-bumps, micro-pillars or micro-pads 34 may include, as seen in FIG. 26A, (1) an adhesion layer 26*a*, such as titanium (Ti) or titanium nitride (TiN) layer having a thickness of between 1 nm and 50 nm, on the topmost one of the interconnection metal layers 27 of its second interconnection scheme for a chip (SISC) 29 or, if the second interconnection scheme for a chip (SISC) 29 is not provided, on the topmost one of the interconnection metal layers 6 of its first interconnection scheme for a chip (FISC) 20, (2) a seed layer 26*b*, such as copper, on the adhesion layer 26*a* of its first type of micro-bumps, micro-pillars or micro-pads 34 and (3) a copper layer 32 having a thickness of between 1 μm and 60 μm on the seed layer 26*b* of its first type of micro-bumps, micro-pillars or micro-pads 34.

Alternatively, its second type of micro-bumps, micro-pillars or micro-pads 34 may include the adhesion layer 26*a*, seed layer 26*b* and copper layer 32 as mentioned above for its first type of micro-bumps, micro-pillars or micro-pads 34, and may further include a tin-containing solder cap made of tin or a tin-silver alloy, which has a thickness of between 1 μm and 50 μm on the copper layer 32 its second type of micro-bumps, micro-pillars or micro-pads 34.

Alternatively, its third type of micro-bumps, micro-pillars or micro-pads 34 may be thermal compression bumps, each including the adhesion layer 26*a* and seed layer 26*b* as mentioned above for its first type of micro-bumps, micro-pillars or micro-pads 34, and further including (1) a copper layer having a thickness between 2 μm and 20 μm, such as 3 μm, and a largest transverse dimension w3, such as diameter in a circular shape, between 1 μm and 15 μm, such as 3 μm, on the seed layer 26*b* of its third type of micro-bumps, micro-pillars or micro-pads 34 and (2) a solder cap made of a tin-silver alloy, a tin-gold alloy, a tin-copper alloy, a tin-indium alloy, indium or tin, which has a thickness between 1 μm and 15 μm, such as 2 μm, and a largest transverse dimension, such as diameter in a circular shape, between 1 μm and 15 μm, such as 3 μm, on the copper layer of its third type of micro-bumps, micro-pillars or micro-pads 34. Its third type of micro-bumps, micro-pillars or micro-pads 34 are formed respectively on multiple metal pads provided by a frontmost one of the interconnection metal layers 27 of its second interconnection scheme for a chip (SISC) 29 or by, if the second interconnection scheme for a chip (SISC) 29 is not provided, a frontmost one of the interconnection metal layers 6 of its first interconnection scheme for a chip (FISC) 20, wherein each of the metal pads may have a thickness between 1 and 10 micrometers or between 2 and 10 micrometers and a largest transverse dimension, such as diameter in a circular shape, between 1 μm and 15 μm, such as 5 μm. A pitch between neighboring two of its third type of micro-bumps, micro-pillars or micro-pads 34 may be between 3 μm and 20 μm.

Alternatively, its fourth type of micro-bumps, micro-pillars or micro-pads 34 may be thermal compression pads, each including the adhesion layer 26*a* and seed layer 26*b* as mentioned above doe its first type of micro-bumps, micro-pillars or micro-pads 34, and further including (1) a copper layer having a thickness between 1 μm and 10 μm or between 2 and 10 micrometers and a largest transverse dimension w2, such as diameter in a circular shape, between 1 μm and 15 μm, such as 5 μm, on the seed layer 26*b* of its fourth type of micro-bumps, micro-pillars or micro-pads 34 and (2) a metal cap made of a tin-silver alloy, a tin-gold alloy, a tin-copper alloy, a tin-indium alloy, indium, tin or gold, which has a thickness of between 0.1 μm and 5 μm, such as 1 μm, on the copper layer of its fourth type of micro-bumps, micro-pillars or micro-pads 34. Neighboring two of its fourth type of micro-bumps, micro-pillars or micro-pads 34 may have a pitch between 3 μm and 20 μm.

2. Second Type of Semiconductor Integrated-Circuit (IC) Chip

Figure 26B:
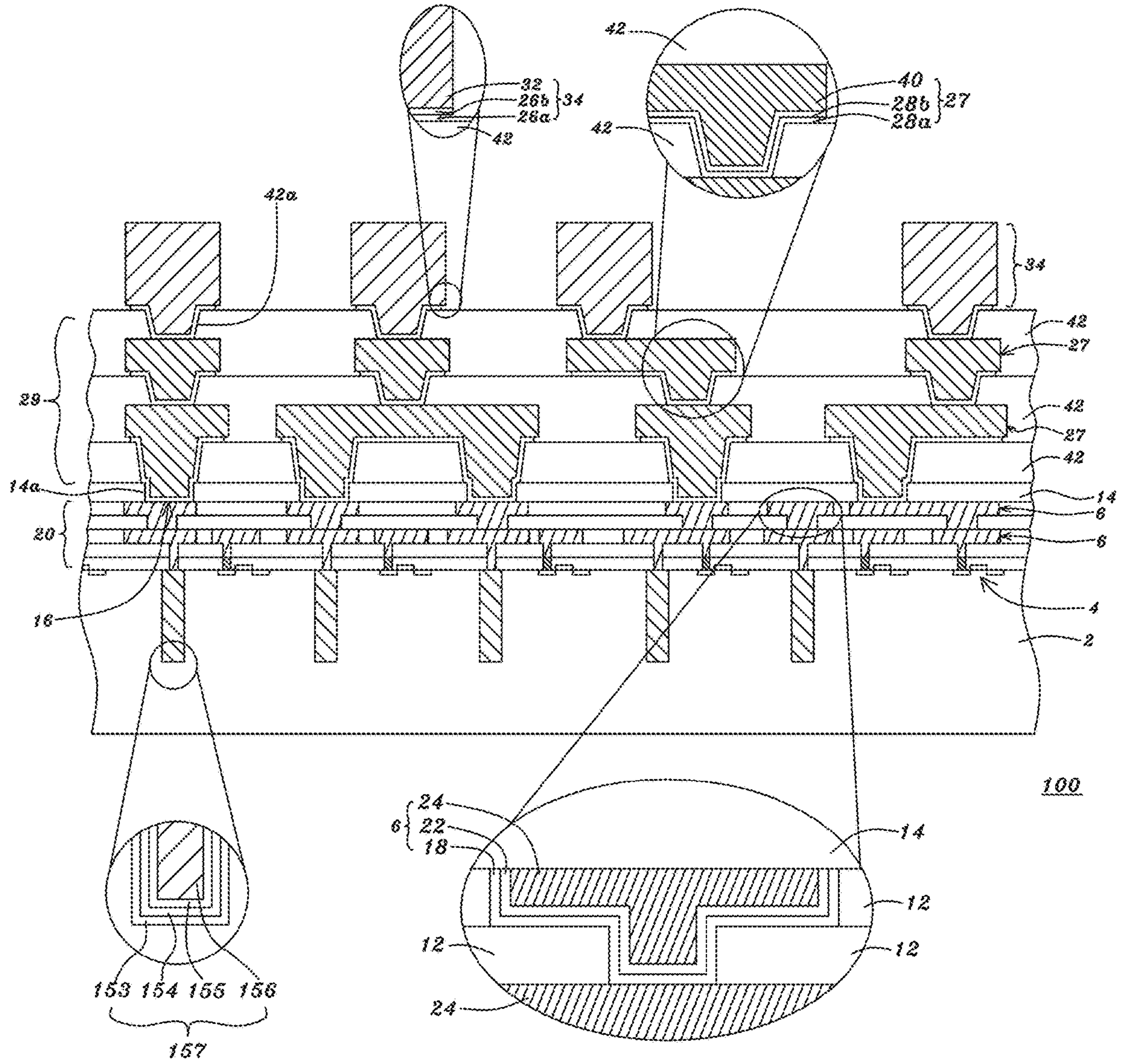

FIG. 26B is a schematically cross-sectional view showing a second type of semiconductor integrated-circuit (IC) chip in accordance with an embodiment of the present application. Referring to FIG. 26B, the second type of semiconductor integrated-circuit (IC) chip 100 may have a similar structure as illustrated in FIG. 26A. For an element indicated by the same reference number shown in FIGS. 26A and 26B, the specification of the element as seen in FIG. 26B may be referred to that of the element as illustrated in FIG. 26A. The difference between the first and second types of semiconductor integrated-circuit (IC) chips 100 is that the second type of semiconductor integrated-circuit (IC) chip 100 may further include multiple through silicon vias (TSV) 157 in its semiconductor substrate 2, wherein each of its through silicon vias (TSV) 157 may couple to one or more of its semiconductor devices 4 through one or more the interconnection metal layers 6 of its first interconnection scheme for a chip (FISC) 20. Each of its through silicon vias (TSVs) 157 may have a depth between 30 μm and 200 μm and a largest transverse dimension, such as diameter or width, between 2 μm and 20 μm or between 4 μm and 10 μm. In some case, for the second type of semiconductor integrated-circuit (IC) chip 100, each of its through silicon vias (TSV) 157 may pass through a layer of field oxide at a top surface of its semiconductor substrate 2, and thus may be called a through field-oxide via (TFOV).

Referring to FIG. 26B, each of the through silicon vias (TSV) 157 of the second type of semiconductor integrated-circuit (IC) chip 100 may include (1) an electroplated copper layer 156 having a depth or thickness between 0.3 and 200 micrometers, between 0.3 and 10 micrometers, between 30 and 200 micrometers and a largest transverse dimension, such as diameter or width, between 0.05 and 20 micrometers, between 0.05 and 0.5 micrometers, between 4 and 10 micrometers, between 2 and 20 micrometers or between 4 and 10 micrometers in the semiconductor substrate 2 of the second type of semiconductor integrated-circuit (IC) chip 100, (2) an insulating lining layer 153, such as thermally grown silicon oxide ($SiO_2$) and/or CVD silicon nitride ($Si_3N_4$) at a bottom and sidewall of its electroplated copper layer 156, (3) an adhesion layer 154, such as titanium (Ti) or titanium nitride (TiN) layer having a thickness between 1 and 50 nanometers, at the bottom and sidewall of its electroplated copper layer 156 and between its electroplated copper layer 156 and its insulating lining layer 153, and (4) an electroplating seed layer 155, such as copper seed layer 155 having a thickness between 3 and 200 nanometers, at the bottom and sidewall of its electroplated copper layer 156 and between its electroplated copper layer 156 and its adhesion layer 154.

3. Third Type of Semiconductor Integrated-Circuit (IC) Chip

Figure 26C:
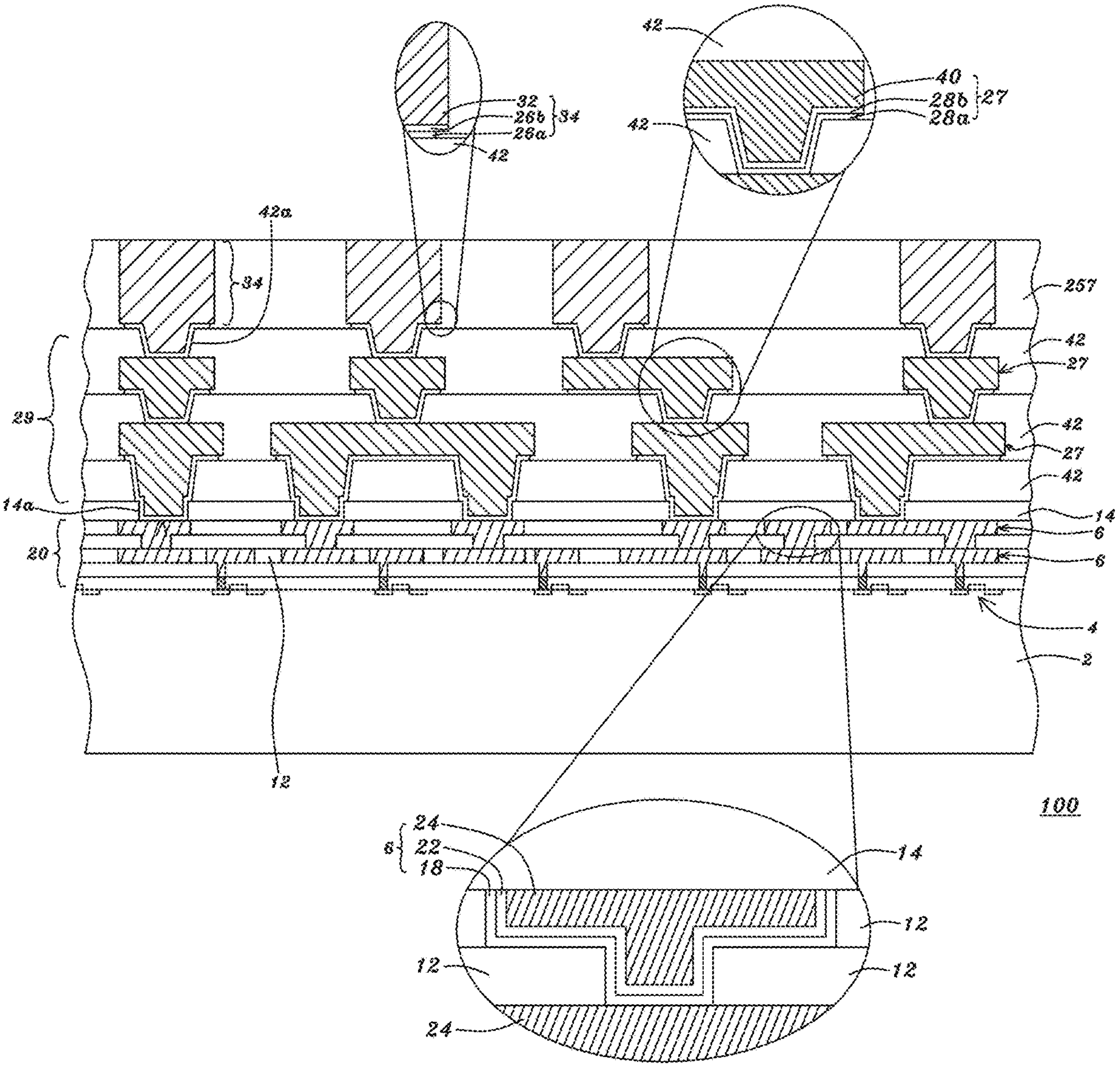

FIG. 26C is a schematically cross-sectional view showing a third type of semiconductor integrated-circuit (IC) chip in accordance with an embodiment of the present application. Referring to FIG. 26C, the third type of semiconductor integrated-circuit (IC) chip 100 may have a similar structure as illustrated in FIG. 26A. For an element indicated by the same reference number shown in FIGS. 26A and 26C, the specification of the element as seen in FIG. 26C may be referred to that of the element as illustrated in FIG. 26A. The difference between the first and third types of semiconductor integrated-circuit (IC) chips 100 is that the third type of semiconductor integrated-circuit (IC) chip 100 may be provided with the first type of micro-bumps, micro-pillars or micro-pads 34 at its top and a polymer layer 257, i.e., insulating dielectric layer, on the topmost one of the polymer layers 42 of its second interconnection scheme for a chip (SISC) 29 or, if the second interconnection scheme for a chip (SISC) 29 is not provided, on its passivation layer 14, wherein its polymer layer 257 may be horizontally around each of its first type of micro-bumps, micro-pillars or micro-pads 34 and may have a top surface substantially coplanar with a top surface of each of its first type of micro-bumps, micro-pillars or micro-pads 34, i.e., a top surface of the copper layer 32 thereof, wherein its polymer layer 257 is not extending over the top surface of each of its first type of micro-bumps, micro-pillars or micro-pads 34.

4. Fourth Type of Semiconductor Integrated-Circuit (IC) Chip

Figure 26D:
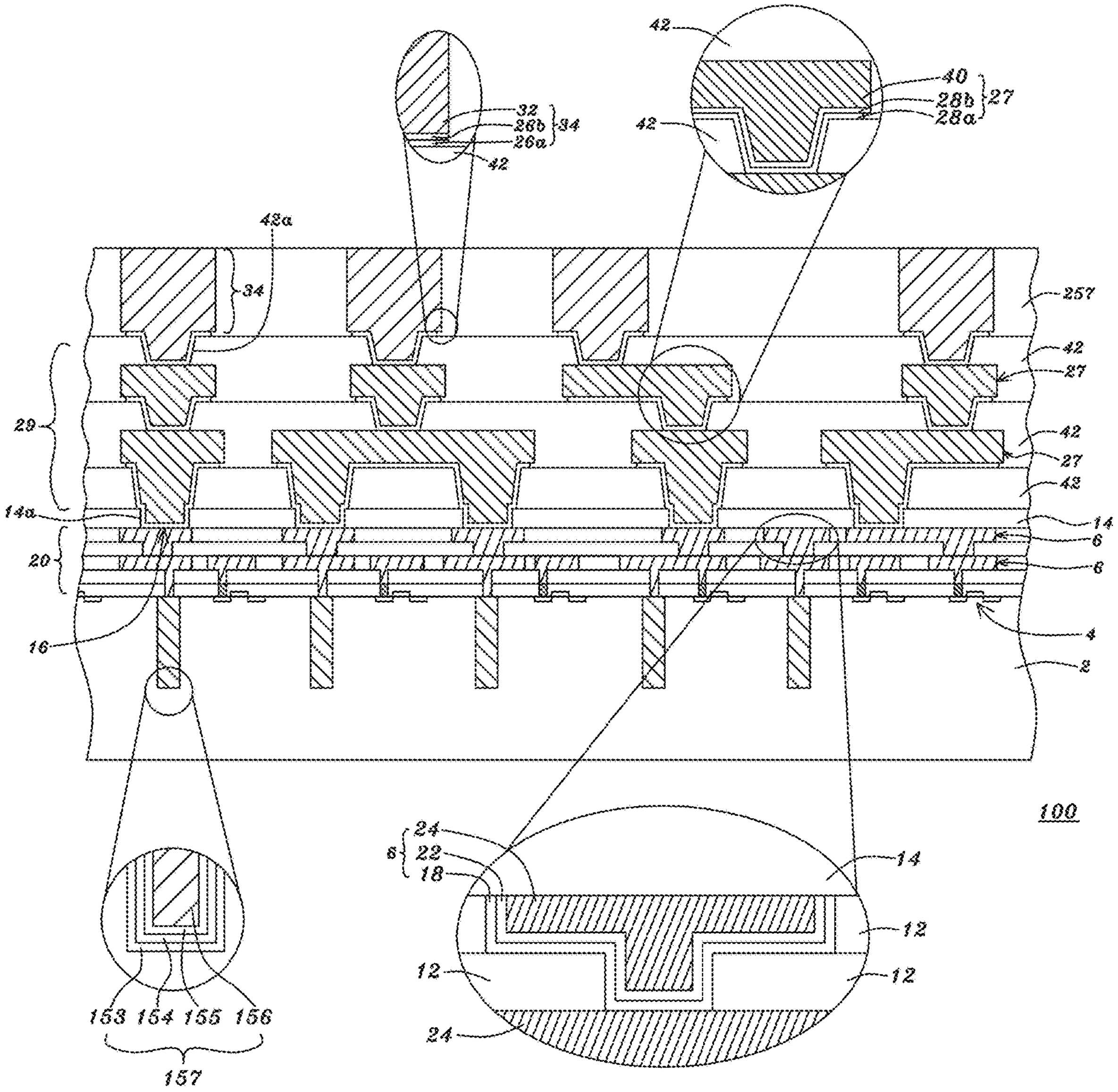

FIG. 26D is a schematically cross-sectional view showing a fourth type of semiconductor integrated-circuit (IC) chip in accordance with an embodiment of the present application. Referring to FIG. 26D, the fourth type of semiconductor integrated-circuit (IC) chip 100 may have a similar structure as illustrated in FIG. 26B. For an element indicated by the same reference number shown in FIGS. 26A, 26B and 26D, the specification of the element as seen in FIG. 26D may be referred to that of the element as illustrated in FIGS. 26A and 26B. The difference between the second and fourth types of semiconductor integrated-circuit (IC) chips 100 is that the fourth type of semiconductor integrated-circuit (IC) chip 100 may be provided with the first type of micro-bumps, micro-pillars or micro-pads 34 at its top and a polymer layer 257, i.e., insulating dielectric layer, on the topmost one of the polymer layers 42 of its second interconnection scheme for a chip (SISC) 29 or, if the second interconnection scheme for a chip (SISC) 29 is not provided, on its passivation layer 14, wherein its polymer layer 257 may be horizontally around each of its first type of micro-bumps, micro-pillars or micro-pads 34 and may have a top surface substantially coplanar with a top surface of each of its first type of micro-bumps, micro-pillars or micro-pads 34, i.e., a top surface of the copper layer 32 thereof, wherein its polymer layer 257 is not extending over the top surface of each of its first type of micro-bumps, micro-pillars or micro-pads 34.

5. Fifth Type of Semiconductor Integrated-Circuit (IC) Chip

Figure 26E:
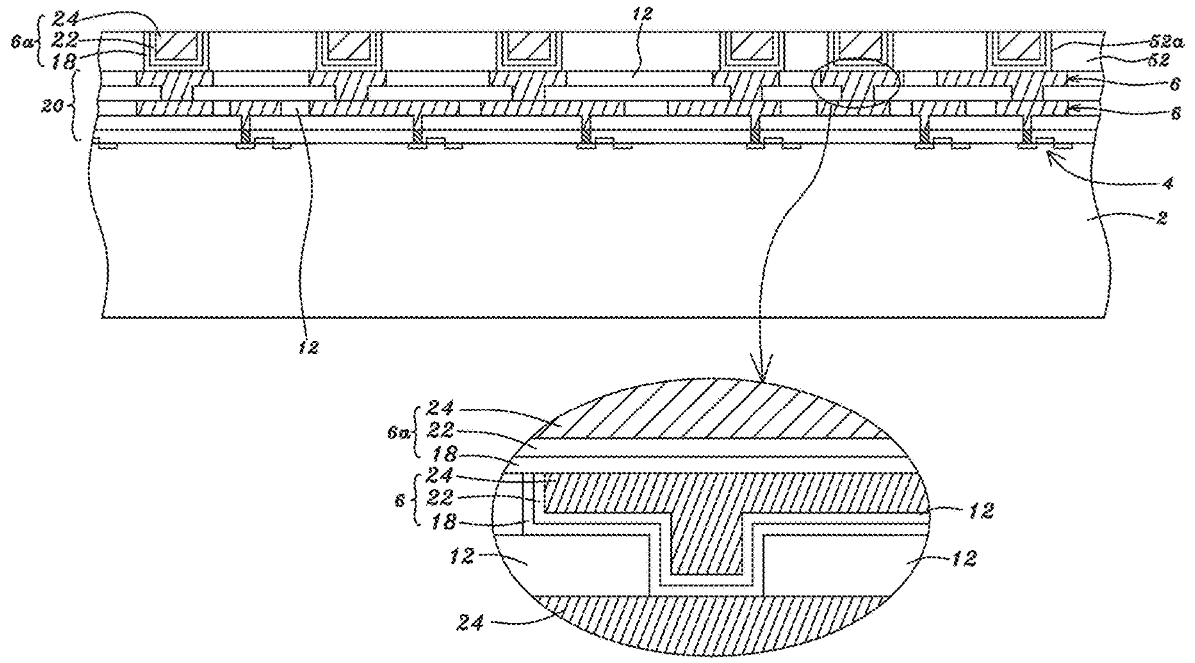

FIG. 26E is a schematically cross-sectional view showing a fifth type of semiconductor integrated-circuit (IC) chip in accordance with an embodiment of the present application. Referring to FIG. 26E, the fifth type of semiconductor integrated-circuit (IC) chip 100 may have a similar structure as illustrated in FIG. 26A. For an element indicated by the same reference number shown in FIGS. 26A and 26E, the specification of the element as seen in FIG. 26E may be referred to that of the element as illustrated in FIG. 26A. The difference between the first and fifth types of semiconductor integrated-circuit (IC) chips 100 is that the fifth type of semiconductor integrated-circuit (IC) chip 100 may be provided with (1) an insulating bonding layer 52 at its active side and on the topmost one of the insulating dielectric layers 12 of its first interconnection scheme for a chip (FISC) 20 and (2) multiple metal pads 6*a* at its active side and in multiple openings 52*a* in its insulating bonding layer 52 and on the topmost one of the interconnection metal layers 6 of its first interconnection scheme for a chip (FISC) 20, instead of the second interconnection scheme for a chip (SISC) 29, the passivation layer 14 and micro-bumps, micro-pillars or micro-pads 34 as seen in FIG. 26A. For the fifth type of semiconductor integrated-circuit (IC) chip 100, its insulating bonding layer 52 may include a silicon-oxide or silicon-oxynitride layer having a thickness between 0.1 and 2 micrometers. Each of its metal pads 6*a* may include (1) a copper layer 24 having a thickness of between 3 nm and 500 nm in one of the openings 52*a* in its insulating bonding layer 52, (2) an adhesion layer 18, such as titanium or titanium nitride having a thickness of between 1 nm and 50 nm, at a bottom and sidewall of the copper layer 24 of said each of its metal pads 6*a* and on the topmost one of the interconnection metal layers 6 of its first interconnection scheme for a chip (FISC) 20, and (3) a seed layer 22, such as copper, between the copper layer 24 and adhesion layer 18 of said each of its metal pads 6*a*, wherein said each of its metal pads 6*a*, i.e., the copper layer 24 thereof, may have a top surface substantially coplanar with a top surface of its insulating bonding layer 52, i.e., a top surface of the silicon-oxide or silicon-oxynitride layer thereof. The dimension, in a horizontal direction, of each of the metal pads 6*a* of the fifth type of semiconductor integrated-circuit (IC) chip 100 may be smaller than 5, 3, 1 or 0.5 micrometers, or between 0.1 and 5 micrometers, 0.1 and 3 micrometers, 0.1 and 1 micrometers, or 0.1 and 0.5 micrometers. The pitch between neighboring two of the metal pads 6*a* of the fifth type of semiconductor integrated-circuit (IC) chip 100 may be smaller than 10, 5, 2 or 1 micrometers, or between 0.2 and 10 micrometers, 0.2 and 5 micrometers, 0.2 and 2 micrometers, or 0.2 and 1 micrometers.

6. Sixth Type of Semiconductor Integrated-Circuit (IC) Chip

Figure 26F:
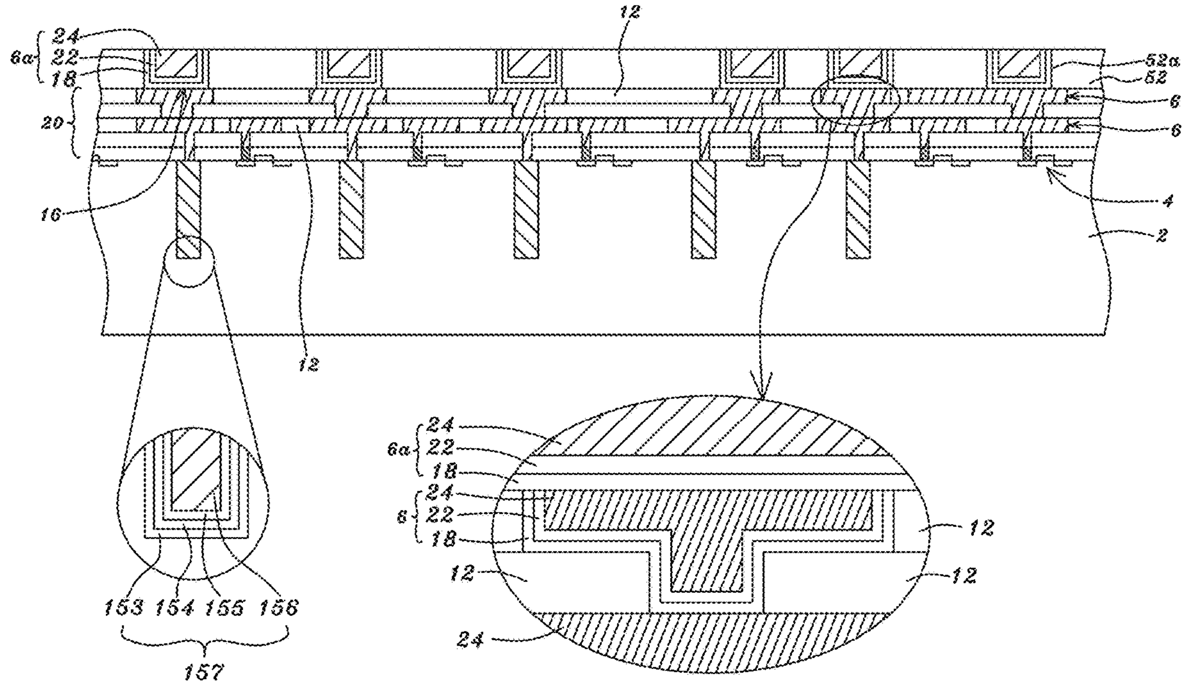

FIG. 26F is a schematically cross-sectional view showing a sixth type of semiconductor integrated-circuit (IC) chip in accordance with an embodiment of the present application. Referring to FIG. 26F, the sixth type of semiconductor integrated-circuit (IC) chip 100 may have a similar structure as illustrated in FIG. 26E. For an element indicated by the same reference number shown in FIGS. 26A, 26B, 26E and 26F, the specification of the element as seen in FIG. 26F may be referred to that of the element as illustrated in FIGS. 26A, 26B and 26E. The difference between the fifth and sixth types of semiconductor integrated-circuit (IC) chips 100 is that the sixth type of semiconductor integrated-circuit (IC) chip 100 may further include multiple through silicon vias (TSV) 157 in its semiconductor substrate 2, wherein each of its through silicon vias (TSV) 157 may couple to one or more of its semiconductor devices 4 through one or more the interconnection metal layers 6 of its first interconnection scheme for a chip (FISC) 20. Each of its through silicon vias (TSVs) 157 may have a depth between 30 μm and 200 μm and a largest transverse dimension, such as diameter or width, between 2 μm and 20 μm or between 4 μm and 10 μm. Each of its through silicon vias (TSV) 157 may have the same specification as that of the through silicon vias (TSV) 157 of the second type of semiconductor integrated-circuit (IC) chip 100 as illustrated in FIG. 26B.

Field Programmable Chip-on-Chip Module or Package

1. First Type of Field Programmable Chip-on-Chip Module or Package

FIG. 27A is a schematically cross-sectional view showing a first type of field programmable chip-on-chip module in accordance with an embodiment of the present application. Referring to FIG. 27A, a first type of field programmable chip-on-chip module 400 may include (1) a first field programmable integrated-circuit (IC) chip or chiplet 200*a*, which may have the specification for the fifth type of semiconductor integrated-circuit (IC) chip 100 as illustrated in FIG. 26E, and (2) a second field programmable integrated-circuit (IC) chip or chiplet 200*b*, which may have the specification for the second type of semiconductor integrated-circuit (IC) chips 100 as illustrated in FIG. 26B, over its first field programmable integrated-circuit (IC) chip or chiplet 200*a*. For the first type of field programmable chip-on-chip module 400, the semiconductor substrate 2 of its second field programmable integrated-circuit (IC) chip or chiplet 200*b* may have a portion at a bottom side thereof removed by a chemical-mechanical-polishing (CMP) or mechanical grinding process and then its second field programmable integrated-circuit (IC) chip or chiplet 200*b* may be formed with an insulating bonding layer 53, made of silicon oxide or silicon oxynitride for example, at a bottom of the semiconductor substrate 2 of its second field programmable integrated-circuit (IC) chip or chiplet 200*b*, wherein the insulating bonding layer 53 of its second field programmable integrated-circuit (IC) chip or chiplet 200*b* may have a bottom surface coplanar with a bottom surface of each of the through silicon vias (TSVs) 157 of its second field programmable integrated-circuit (IC) chip or chiplet 200*b*, i.e., a bottom surface of the copper layer 156 of said each of the through silicon vias (TSVs) 157. Its second field programmable integrated-circuit (IC) chip or chiplet 200*b* may be provided, for hybrid bonding, with (1) the insulating bonding layer 53, i.e., silicon oxide or oxynitride, having the bottom surface attached to and in contact with a top surface of the insulating bonding layer 52, i.e., silicon oxide or oxynitride, of its first field programmable integrated-circuit (IC) chip or chiplet 200*a*, and (2) the through silicon vias (TSVs) 157 each having the copper layer 156 with the bottom surface bonded to and in contact with a top surface of one of the metal pads 6*a*, i.e., copper layer 24 thereof, of its first field programmable integrated-circuit (IC) chip or chiplet 200*a*. The semiconductor substrate 2 of its second field-programmable-gate-array (FPGA) integrated-circuit (IC) chip or chiplet 200*b* may have a thickness thinner than 20, 10, 5, or 3 micrometers, or between 0.3 and 20 micrometers, 0.3 and 10 micrometers, 0.5 and 20 micrometers, 0.5 and 10 micrometers, 0.3 and 5 micrometers or 0.3 and 3 micrometers, and each of the through silicon vias (TSVs) 157 of the second field-programmable-gate-array (FPGA) integrated-circuit (IC) chip or chiplet 200*b* may have a width, diameter or maximum transverse dimension smaller than 20, 10, 5, 1 or 0.1 micrometers, wherein said each of the through silicon vias (TSVs) 157 may include the copper layer 156, i.e., copper via, having a width in a horizontal direction between 0.05 and 0.5 micrometers and a thickness in a vertical direction between 0.3 and 10 micrometers, for example. The dimension, in a horizontal direction, of each of the metal pads 6*a* of its first field programmable integrated-circuit (IC) chip or chiplet 200*a* may be smaller than 5, 3, 1 or 0.5 micrometers, or between 0.1 and 5 micrometers, 0.1 and 3 micrometers, 0.1 and 1 micrometers, or 0.1 and 0.5 micrometers. The pitch between neighboring two of the metal pads 6*a* of its first field programmable integrated-circuit (IC) chip or chiplet 200*a* may be smaller than 10, 5, 2 or 1 micrometers, or between 0.2 and 10 micrometers, 0.2 and 5 micrometers, 0.2 and 2 micrometers, or 0.2 and 1 micrometers. For the first type of field programmable chip-on-chip module 400, each of its first and second field programmable integrated-circuit (IC) chips or chiplets 200*a* and 200*b* may have the arrangement as illustrated in either of FIGS. 17A and 17B for the first and second types of standard commodity field programmable integrated-circuit (FPIC) chips or chiplets 200.

Referring to FIG. 27A, for the first type of field programmable chip-on-chip module 400, its first field programmable integrated-circuit (IC) chip or chiplet 200*a* may be the fined-grained (FG) field-programmable-gate-array (FPGA) integrated-circuit (IC) chip as illustrated in any of FIGS. 2A-2C, and its second field programmable integrated-circuit (IC) chip or chiplet 200*b* may be the coarse-grained field programmable (CGFP) integrated-circuit (IC) chip as illustrated in FIGS. 5A-15, for example. Alternatively, its first field programmable integrated-circuit (IC) chip or chiplet 200*a* may be the coarse-grained field programmable (CGFP) integrated-circuit (IC) chip as illustrated in FIGS. 5A-15, and its second field programmable integrated-circuit (IC) chip or chiplet 200*b* may be the fined-grained (FG) field-programmable-gate-array (FPGA) integrated-circuit (IC) chip as illustrated in any of FIGS. 2A-2C.

Referring to FIG. 27A, as a first example of the first type of field programmable chip-on-chip module 400, for achieving the first type of fined-grained field programmable logic cell or element (LCE) 2014 as illustrate in FIG. 2A, the memory cells 490 may be arranged in either of its first and second field programmable integrated-circuit (IC) chips or chiplets 200*a* and 200*b*, and the selection circuit 211 may be arranged in the other of its first and second field programmable integrated-circuit (IC) chips or chiplets 200*a* and 200*b*. Each of the memory cells 490 may couples to one of the selection circuits 211 through one of the metal pads 6*a* of its first field programmable integrated-circuit (IC) chip or chiplet 200*a* and one of the through silicon vias (TSVs) 157 of its second field programmable integrated-circuit (IC) chip or chiplet 200*b*.

Referring to FIG. 27A, as a second example of the first type of field programmable chip-on-chip module 400, for achieving the coarse-grained reconfigurable (CGR) units 2052 as illustrated in FIG. 4, the instruction memory block or section 2049 may be arranged in either of its first and second field programmable integrated-circuit (IC) chips or chiplets 200*a* and 200*b*, and the functional unit (FU) 2053, registering block 2045, register-file memory block 2046 and program counter (PC) 2048 may be arranged in the other of its first and second field programmable integrated-circuit (IC) chips or chiplets 200*a* and 200*b*. Each of the functional unit (FU) 2053, registering block 2045, register-file memory block 2046 and program counter (PC) 2048 may couple to the instruction memory block or section 2049 through one of the metal pads 6*a* of its first field programmable integrated-circuit (IC) chip or chiplet 200*a* and one of the through silicon vias (TSVs) 157 of its second field programmable integrated-circuit (IC) chip or chiplet 200*b*.

Referring to FIG. 27A, as a third example of the first type of field programmable chip-on-chip module 400, for achieving the coarse-grained programmable logic cell or element (LCE) 2060 as illustrated in FIG. 5A-5D and 6, the memory sections 2052, the local row and column decoders 2061 and 2062, the global row and column decoders 2461 and 2463 and sense-amplifier block 2462 may be arranged in either type of its first and second field programmable integrated-circuit (IC) chips or chiplets 200*a* and 200*b*, and the selection circuit 2064 and the block 2063 for registers or flip-flop circuits may be arranged in the other of its first and second field programmable integrated-circuit (IC) chips or chiplets 200*a* and 200*b*. Each of the memory sections 2052, local row and column decoders 2061 and 2062, global row and column decoders 2461 and 2463 and sense-amplifier block 2462 may couple to either of the selection circuit 2064 and the block 2063 for registers or flip-flop circuits through one of the metal pads 6*a* of its first field programmable integrated-circuit (IC) chip or chiplet 200*a* and one of the through silicon vias (TSVs) 157 of its second field programmable integrated-circuit (IC) chip or chiplet 200*b*.

Referring to FIG. 27A, as any of the above first, second and third examples of the first type of field programmable chip-on-chip module 400, for achieving either of the first and second types of field programmable switch cells 379 as illustrated in FIGS. 3A and 3B, the memory cells 362 may be arranged in either of its first and second field programmable integrated-circuit (IC) chips or chiplets 200*a* and 200*b*, and the pass/no-pass switch 292 and/or selection circuits 211 may be arranged in the other of its first and second field programmable integrated-circuit (IC) chips or chiplets 200*a* and 200*b*. Each of the memory cells 362 may couple to either of the pass/no-pass switch 292 and selection circuits 211 through one of the metal pads 6*a* of its first field programmable integrated-circuit (IC) chip or chiplet 200*a* and one of the through silicon vias (TSVs) 157 of its second field programmable integrated-circuit (IC) chip or chiplet 200*b*.

2. Second Type of Field Programmable Chip-on-Chip Module or Package

FIG. 27B is a schematically cross-sectional view showing a second type of field programmable chip-on-chip module in accordance with an embodiment of the present application. Referring to FIG. 27B, a second type of field programmable chip-on-chip module 400 may have a similar structure to the first type of field programmable chip-on-chip module 400 illustrated in FIG. 27A. For an element indicated by the same reference number shown in FIGS. 27A and 27B, the specification of the element as seen in FIG. 27B may be referred to that of the element as illustrated in FIG. 27A. The difference between the first and second types of field programmable chip-on-chip modules 400 is that the first field-programmable-gate-array (FPGA) integrated-circuit (IC) chip or chiplet 200*a* of the second type of field programmable chip-on-chip module 400 may have the specification for the sixth type of semiconductor integrated-circuit (IC) chip 100 illustrated in FIG. 26F.

3. Third Type of Field Programmable Chip-on-Chip Module or Package

FIG. 27C is a schematically cross-sectional view showing a third type of field programmable chip-on-chip module in accordance with an embodiment of the present application. Referring to FIG. 27C, a third type of field programmable chip-on-chip module 400 may have a similar structure to the first type of field programmable chip-on-chip module 400 illustrated in FIG. 27A. For an element indicated by the same reference number shown in FIGS. 27A and 27C, the specification of the element as seen in FIG. 27C may be referred to that of the element as illustrated in FIG. 27A. The difference between the first and third types of field programmable chip-on-chip modules 400 is that the second field-programmable-gate-array (FPGA) integrated-circuit (IC) chip or chiplet 200*b* of the third type of field programmable chip-on-chip module 400 may have the specification for the fourth type of semiconductor integrated-circuit (IC) chip 100 illustrated in FIG. 26D.

4. Fourth Type of Field Programmable Chip-on-Chip Module or Package

Figure 27D:
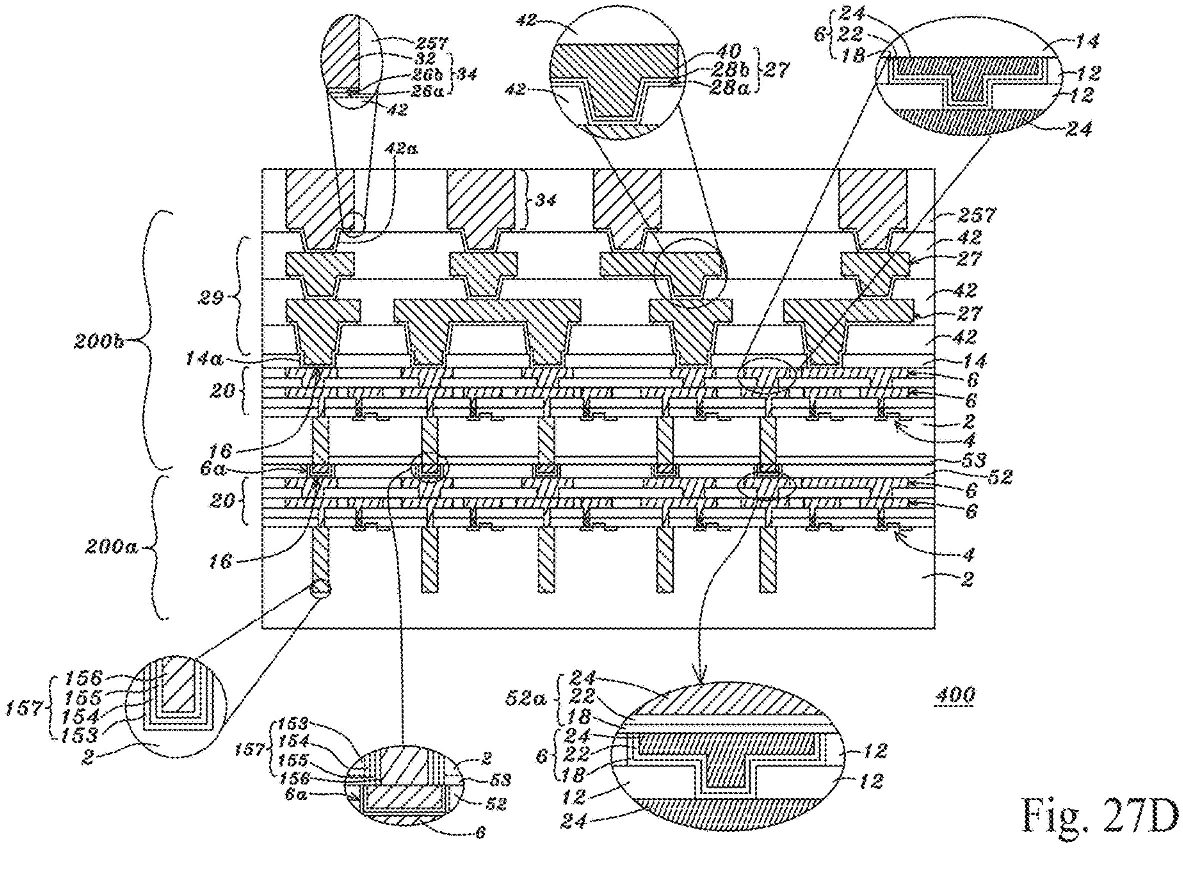

FIG. 27D is a schematically cross-sectional view showing a fourth type of field programmable chip-on-chip module in accordance with an embodiment of the present application. Referring to FIG. 27D, a fourth type of field programmable chip-on-chip module 400 may have a similar structure to the third type of field programmable chip-on-chip module 400 illustrated in FIG. 27C. For an element indicated by the same reference number shown in FIGS. 27A, 27C and 27D, the specification of the element as seen in FIG. 27D may be referred to that of the element as illustrated in FIG. 27A or 27C. The difference between the third and fourth types of field programmable chip-on-chip modules 400 is that the first field-programmable-gate-array (FPGA) integrated-circuit (IC) chip or chiplet 200*a* of the fourth type of field programmable chip-on-chip module 400 may have the specification for the sixth type of semiconductor integrated-circuit (IC) chip 100 illustrated in FIG. 26F.

5. Fifth Type of Field Programmable Chip-on-Chip Module or Package

Figure 27E:
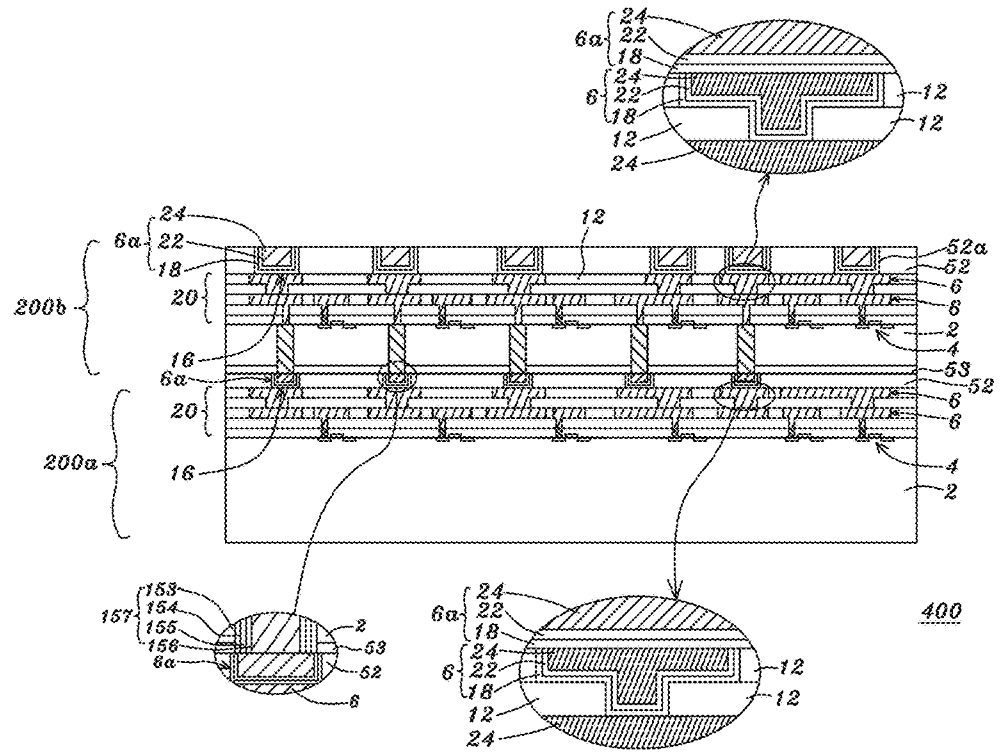

FIG. 27E is a schematically cross-sectional view showing a fifth type of field programmable chip-on-chip module in accordance with an embodiment of the present application. Referring to FIG. 27E, a fifth type of field programmable chip-on-chip module 400 may have a similar structure to the first type of field programmable chip-on-chip module 400 illustrated in FIG. 27A. For an element indicated by the same reference number shown in FIGS. 27A and 27E, the specification of the element as seen in FIG. 27E may be referred to that of the element as illustrated in FIG. 27A. The difference between the first and fifth types of field programmable chip-on-chip modules 400 is that the second field-programmable-gate-array (FPGA) integrated-circuit (IC) chip or chiplet 200*b* of the fifth type of field programmable chip-on-chip module 400 may have the specification for the sixth type of semiconductor integrated-circuit (IC) chip 100 illustrated in FIG. 26F.

6. Sixth Type of Field Programmable Chip-on-Chip Module or Package

Figure 27F:
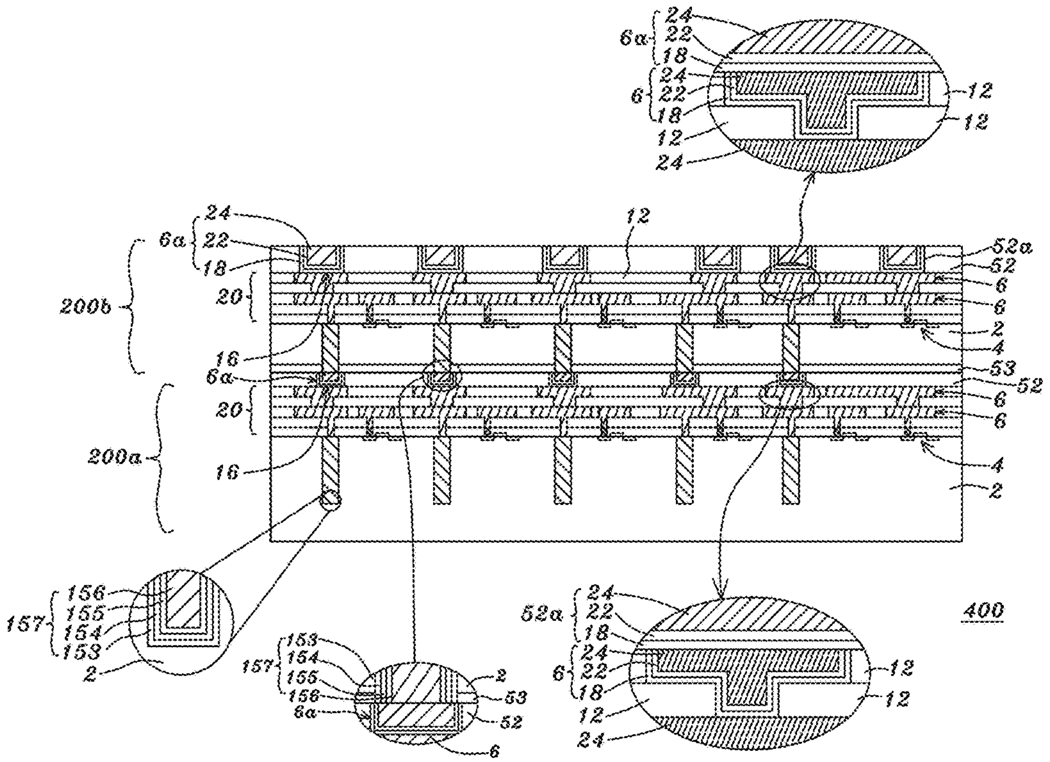

FIG. 27F is a schematically cross-sectional view showing a sixth type of field programmable chip-on-chip module in accordance with an embodiment of the present application. Referring to FIG. 27F, a sixth type of field programmable chip-on-chip module 400 may have a similar structure to the fifth type of field programmable chip-on-chip module 400 illustrated in FIG. 27E. For an element indicated by the same reference number shown in FIGS. 27A, 27E and 27F, the specification of the element as seen in FIG. 27F may be referred to that of the element as illustrated in FIG. 27A or 27E. The difference between the fifth and sixth types of field programmable chip-on-chip modules 400 is that the first field-programmable-gate-array (FPGA) integrated-circuit (IC) chip or chiplet 200*a* of the sixth type of field programmable chip-on-chip module 400 may have the specification for the sixth type of semiconductor integrated-circuit (IC) chip 100 illustrated in FIG. 26F.

Embodiments for Various Chip Package for Standard Commodity Logic Drive

1. First Type of Chip Package for Fan-Out Interconnection Technology (FOIT)

FIG. 28 is a schematically cross-sectional view showing a first type of chip package for a standard commodity logic drive in accordance with an embodiment of the present application. FIG. 28 is a schematically cross-sectional view along a cross-sectional line A-A in either of FIGS. 19A and 19B. Referring to FIG. 28, a first type of chip package 301 may be performed for either of the first and second types of standard commodity logic drives 300 as illustrated in FIGS. 19A and 19B. The first type of chip package 301 for either of the first and second types of standard commodity logic drives 300 may include multiple semiconductor integrated-circuit (IC) chips 100 arranged in a horizontal level, wherein each of its semiconductor integrated-circuit (IC) chips 100 may have the specification for the third type of semiconductor integrated-circuit (IC) chip 100 as illustrated in FIG. 26C to be turned upside down, wherein its semiconductor integrated-circuit (IC) chips 100 may include the standard commodity field programmable integrated-circuit (FPIC) chips or chiplets 200, graphic-processing unit (GPU) integrated-circuit (IC) chips 269*a*, central-processing-unit (CPU) integrated-circuit (IC) chip 269*b*, digital-signal-processing (DSP) integrated-circuit (IC) chip 270, high-bandwidth-memory (HBM) integrated-circuit (IC) chips 251, non-volatile memory (NVM) IC chips 250, IAC chip 402, dedicated control and input/output (I/O) chip 260, cooperating and supporting (CS) integrated-circuit (IC) chip 411 and dedicated input/output (I/O) chips 265 for the first type of standard commodity logic drives 300 as illustrated in FIG. 19A, and alternatively its semiconductor integrated-circuit (IC) chips 100 may include the standard commodity field programmable integrated-circuit (FPIC) chips or chiplets 200, graphic-processing unit (GPU) integrated-circuit (IC) chips 269*a*, central-processing-unit (CPU) integrated-circuit (IC) chip 269*b*, CS-IAC chip 411*a*, CS-DSP chip 411*b*, CS-BRAM chip 411*c*, CS-CPU chip 411*d*, CS-I/O chip 411*e*, high-bandwidth-memory (HBM) integrated-circuit (IC) chips 251, non-volatile memory (NVM) IC chips 250, and cooperating and supporting (CS) integrated-circuit (IC) chip 411 for the second type of standard commodity logic drives 300 as illustrated in FIG. 19B, among of which one of its field programmable integrated-circuit (FPIC) chips or chiplets 200, its CS IC chip 411 and one of its NVM IC chip 250 are shown in FIG. 28. Alternatively, each of its field programmable integrated-circuit (FPIC) chips or chiplets 200 may be replaced with the third type of field programmable chip-on-chip module 400 as illustrated in FIG. 27C to be turned upside down. The first type of chip package 301 may further include (1) a polymer layer 92, i.e., insulating dielectric layer, made of molding compound, epoxy-based material, polyimide or silicon oxide, in multiple gaps each between neighboring two of its semiconductor integrated-circuit (IC) chips 100 and its third type of field programmable chip-on-chip modules 400 in case of replacing its standard commodity field programmable integrated-circuit (FPIC) chips or chiplets 200, (2) multiple through package vias or through polymer vias (TPVs) 158 in its polymer layer 92, wherein each of its through package vias (TPVs) 158 may be made of a copper post or layer having a height or thickness between 20 μm and 300 μm, 30 μm and 200 μm, 50 μm and 150 μm, 50 μm and 120 μm, 20 μm and 100 μm, 10 μm and 100 μm, 20 μm and 60 μm, 20 μm and 40 μm, or 20 μm and 30 μm, or greater than or equal to 100 μm, 50 μm, 30 μm or 20 μm, (3) a frontside interconnection scheme for a logic drive or device (FISD) 101 under its semiconductor integrated-circuit (IC) chips 100 and its third type of field programmable chip-on-chip modules 400 in case of replacing its standard commodity field programmable integrated-circuit (FPIC) chips or chiplets 200, its polymer layer 92 and its through package vias (TPVs) 158, (4) a backside interconnection scheme 79 for a logic drive or device (BISD) over its semiconductor integrated-circuit (IC) chips 100, its third type of field programmable chip-on-chip modules 400 in case of replacing its standard commodity field programmable integrated-circuit (FPIC) chips or chiplets 200, its polymer layer 92 and its through package vias (TPVs) 158, (6) multiple metal bumps, pillars or pads 570 in an array at a bottom of the first type of chip package 301 and on a bottom surface of its FISD 101 to act as external pins of the first type of chip package 301, and (7) multiple metal pads 583 in an array at a top of the first type of chip package 301 and on a top surface of its BISD 79 to act as external pins of the first type of chip package 301. Each of its through package vias (TPVs) 158 may couple to a voltage of power supply for delivering a power supply or a voltage of ground reference for delivering a ground reference or may pass signals or clocks for signal or clock transmission. For the first type of chip package 301, each of the first type of micro-bumps, micro-pillars or micro-pads 34 of each of its semiconductor integrated-circuit (IC) chip 100, or each of the first type of micro-bumps, micro-pillars or micro-pads 34 of the second field programmable integrated-circuit (IC) chip or chiplet 200*b* of each of its field programmable chip-on-chip modules 400 in case of replacing its semiconductor integrated-circuit (IC) chip 100, may have a bottom surface coupling to its FISD 101, and the polymer layer 257 of said each of its semiconductor integrated-circuit (IC) chip 100, or the polymer layer 257 of the second field programmable integrated-circuit (IC) chip or chiplet 200*b* of said each of its third type of field programmable chip-on-chip modules 400, may have a bottom surface substantially coplanar with the bottom surface of said each of the first type of micro-bumps, micro-pillars or micro-pads 34, a bottom surface of its polymer layer 92 and a bottom surface of each of its through package vias (TPVs) 158.

Referring to FIG. 28, the FISD 101 of the first type of chip package 301 may be provided with (1) one or more interconnection metal layers 27 coupling to each of the first type of micro-bumps, micro-pillars or micro-pads 34 of each of the semiconductor integrated-circuit (IC) chips 100 of the first type of chip package 301, or each of the first type of micro-bumps, micro-pillars or micro-pads 34 of the second field programmable integrated-circuit (IC) chip or chiplet 200*b* of each of the third type of field programmable chip-on-chip modules 400 of the first type of chip package 301 in case of replacing the standard commodity field programmable integrated-circuit (FPIC) chips or chiplets 200 of the first type of chip package 301, and (2) one or more polymer layers 42, i.e., insulating dielectric layers, each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27. For the first type of chip package 301, the topmost one of the polymer layers 42 of its FISD 101 may have a top surface in contact with the bottom surface of the polymer layer 257 of each of its semiconductor integrated-circuit (IC) chips 100, or the bottom surface of the polymer layer 257 of the second field programmable integrated-circuit (IC) chip or chiplet 200*b* of each of its third type of field programmable chip-on-chip modules 400 in case of replacing its standard commodity field programmable integrated-circuit (FPIC) chips or chiplets 200, and the bottom surface of its polymer layer 92. The topmost one of the polymer layers 42 of its FISD 101 may be between the topmost one of the interconnection metal layers 27 of its FISD 101 and its polymer layer 92 and between the topmost one of the interconnection metal layers 27 of its FISD 101 and the frontside of each of its semiconductor integrated-circuit (IC) chips 100, or the frontside of the second field programmable integrated-circuit (IC) chip or chiplet 200*b* of each of its third type of field programmable chip-on-chip modules 400 in case of replacing its standard commodity field programmable integrated-circuit (FPIC) chips or chiplets 200, wherein each opening in the topmost one of the polymer layers 42 of its FISD 101 may be under one of the first type of micro-bumps, micro-pillars or micro-pads 34 of one of its semiconductor integrated-circuit (IC) chips 100, or one of the first type of micro-bumps, micro-pillars or micro-pads 34 of the second field programmable integrated-circuit (IC) chip or chiplet 200*b* of one of its third type of field programmable chip-on-chip modules 400 in case of replacing its standard commodity field programmable integrated-circuit (FPIC) chips or chiplets 200, or one of its through package vias (TPVs) 158, and thus the topmost one of the interconnection metal layers 27 of its FISD 101 may extend through said each opening to couple to said one of the first type of micro-bumps, micro-pillars or micro-pads 34 or said one of its through package vias (TPVs) 158. Each of the interconnection metal layers 27 of its FISD 101 may extend horizontally across an edge of each of its semiconductor integrated-circuit (IC) chips 100, or an edge of each of its third type of field programmable chip-on-chip modules 400 in case of replacing its standard commodity field programmable integrated-circuit (FPIC) chips or chiplets 200. The bottommost one of the interconnection metal layers 27 of its FISD 101 may have multiple metal pads at tops of multiple respective openings 42*a* in the bottommost one of the polymer layers 42 of its FISD 101. The specification and process for the interconnection metal layers 27 and polymer layers 42 for its frontside interconnection scheme for a logic drive or device (FISD) 101 may be referred to those for the SISC 29 as illustrated in FIG. 26A, respectively.

Referring to FIG. 28, for the frontside interconnection scheme for a logic drive or device (FISD) 101 of the first type of chip package 301, each of its polymer layers 42 may be a layer of polyimide, benzocyclobutene (BCB), parylene, epoxy-based material or compound, photo epoxy SU-8, elastomer or silicone, having a thickness between, for example, 0.3 μm and 30 μm, 0.5 μm and 20 μm, 1 μm and 10 μm, or 0.5 um and 5 μm, or thicker than or equal to 0.3 μm, 0.5 μm, 0.7 μm, 1 μm, 1.5 μm, 2 μm, 3 μm or 5 μm. Each of its interconnection metal layers 27 may be provided with multiple metal traces or lines each including (1) a copper layer 40 having one or more upper portions in openings in one of its polymer layers 42, and a lower portion having a thickness 0.3 μm and 20 μm under said one of its polymer layers 42, (2) an adhesion layer 28*a*, such as titanium or titanium nitride having a thickness between 1 nm and 50 nm, at a top and sidewall of each of the one or more upper portions of the copper layer 40 of said each of the metal traces or lines and at a top of the lower portion of the copper layer 40 of said each of the metal traces or lines, and (3) a seed layer 28*b*, such as copper, between the copper layer 40 and adhesion layer 28*a* of said each of the metal traces or lines, wherein the lower portion of the copper layer 40 of said each of the metal traces or lines may have a sidewall not covered by the adhesion layer 28*a* of said each of the metal traces or lines. Each of its interconnection metal layers 27 may provide multiple metal lines or traces with a thickness between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm, and a width between, for example, 0.3 μm and 30 μm, 0.5 μm and 20 μm, 1 μm and 10 μm, or 0.5 μm and 5 μm, or wider than or equal to 0.3 μm, 0.5 μm, 0.7 μm, 1 μm, 1.5 μm, 2 μm, 3 μm or 5 μm.

Referring to FIG. 28, the BISD 79 of the first type of chip package 301 may be provided with (1) one or more interconnection metal layers 27 coupling to each of the through package vias (TPVs) 158 of the first type of chip package 301, and (2) one or more polymer layers 42 each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27. For the first type of chip package 301, the bottommost one of the polymer layers 42 of its BISD 79 may be between the bottommost one of the interconnection metal layers 27 of its BISD 79 and its polymer layer 92 and between the bottommost one of the interconnection metal layers 27 of its BISD 79 and the backside of each of its semiconductor integrated-circuit (IC) chips 100, or the backside of the first field programmable integrated-circuit (IC) chip or chiplet 200*a* of each of its third type of field programmable chip-on-chip modules 400 in case of replacing its standard commodity field programmable integrated-circuit (FPIC) chips or chiplets 200, wherein each opening in the bottommost one of the polymer layers 42 of its BISD 79 may be vertically over one of its through package vias (TPVs) 158, and thus the bottommost one of the interconnection metal layers 27 of its BISD 79 may extend through said each opening to couple to said one of its through package vias (TPVs) 158. Each of the interconnection metal layers 27 of its BISD 79 may extend horizontally across an edge of each of its semiconductor integrated-circuit (IC) chips 100, or an edge of each of its third type of field programmable chip-on-chip modules 400 in case of replacing its standard commodity field programmable integrated-circuit (FPIC) chips or chiplets 200. The specification and process for the interconnection metal layers 27 and polymer layers 42 for its backside interconnection scheme for a logic drive or device (BISD) 79 may be referred to those for the SISC 29 as illustrated in FIG. 26A, respectively.

Referring to FIG. 28, for the first type of chip package 301, one or more of the interconnection metal layers 27 of its FISD 101 may be provided to form any of the programmable interconnects 361 of the inter-chip interconnects 371 of either of the first and second types of standard commodity logic drives 300 as illustrated in FIGS. 19A and 19B or any of the non-programmable interconnects 364 of the inter-chip interconnects 371 of either of the first and second types of standard commodity logic drives 300; alternatively, the combination of one or more of the interconnection metal layers 27 of its FISD 101, one or more of its through package vias (TPVs) 158 and one or more of the interconnection metal layers 27 of its BISD 79 may be provided to form any of the programmable interconnects 361 of the inter-chip interconnects 371 of either of the first and second types of standard commodity logic drives 300 or any of the non-programmable interconnects 364 of the inter-chip interconnects 371 of either of the first and second types of standard commodity logic drives 300.

Referring to FIG. 28, each of the metal bumps, pillars or pads 570 of the first type of chip package 301 may be of various types. A first type of metal bumps, pillars or pads 570 of the first type of chip package 301 each may include (1) an adhesion layer 26*a*, such as titanium (Ti) or titanium nitride (TiN) layer having a thickness between 1 nm and 50 nm, on a bottom surface of one of the metal pads of the bottommost one of the interconnection metal layers 27 of the FISD 101 of the first type of chip package 301, (2) a seed layer 26*b*, such as copper, on and under its adhesion layer 26*a* and (3) a copper layer 32 having a thickness between 1 μm and 60 μm on and under its seed layer 26*b*. Alternatively, a second type of metal bumps, pillars or pads 570 of the first type of chip package 301 each may include the adhesion layer 26*a*, seed layer 26*b* and copper layer 32 as mentioned above for the first type of metal bumps, pillars or pads 570 of the first type of chip package 301 and may further include a tin-containing solder cap 33 made of tin or a tin-silver alloy having a thickness between 1 μm and 50 μm or between 20 μm and 100 μm on and under its copper layer 32. Alternatively, a third type of metal bumps, pillars or pads 570 of the first type of chip package 301 each may include a gold layer having a thickness between 3 and 15 micrometers under the bottommost one of the interconnection metal layers 27 of the FISD 101 of the first type of chip package 301. The first type of chip package 301 in FIG. 28 is only shown with its second type of metal bumps, pillars or pads 570.

Referring to FIG. 28, each of the metal pads 583 of the first type of chip package 301 may include (1) an adhesion layer 26*a*, such as titanium (Ti) or titanium nitride (TiN) layer having a thickness between 1 nm and 50 nm, on the topmost one of the interconnection metal layers 27 of the BISD 101 of the first type of chip package 301, (2) a seed layer 26*b*, such as copper, on its adhesion layer 26*a* and (3) a copper layer 32 having a thickness between 1 μm and 60 μm on its seed layer 26*b*.

2. Second Type of Chip Package Fabricated by Multichip-on-Interposer (COIP) Flip-Chip Packaging Method FIG. 29 is a schematically cross-sectional view showing a second type of chip package for a standard commodity logic drive in accordance with an embodiment of the present application. FIG. 29 is a schematically cross-sectional view along a cross-sectional line A-A in either of FIGS. 19A and 19B. A second type of chip package 302 as seen in FIG. 29 may have a similar structure to the first type of chip package 301 as seen in FIG. 28. For an element indicated by the same reference number shown in FIGS. 28 and 29, the specification of the element as seen in FIG. 29 may be referred to that of the element as illustrated in FIG. 28. The difference therebetween is that the FISD 101 of the first type of chip package 301 as seen in FIG. 28 may be replaced with an interposer 551 as seen in FIG. 29. Referring to FIG. 29, the second type of chip package 302 may be performed for either of the first and second types of standard commodity logic drives 300 as illustrated in FIGS. 19A and 19B. The interposer 551 of the second type of chip package 302 may include (1) a silicon substrate 552, (2) multiple through silicon vias 558 extending vertically through its silicon substrate 552, (3) an interconnection scheme over the silicon substrate 552, having the specification as illustrated for the FISC 20, SISC 29 or combination of the FISC 20 and SISC 29 in FIG. 26A, over its silicon substrate 552, wherein its interconnection scheme may include multiple interconnection metal layers 67 over its silicon substrate 552, coupling to its through silicon vias 558 and each having the same specification as that of the interconnection metal layer 6 of the FISC 20 or that of the interconnection metal layer 27 of the SISC 29, and multiple insulating dielectric layers 112 each between neighboring two of the interconnection metal layers 67 of its interconnection scheme, under the bottommost one of the interconnection metal layers 67 of its interconnection scheme or over the topmost one of the interconnection metal layers 67 of its interconnection scheme and each having the same specification as that of the insulating dielectric layer 12 of the FISC 20 or that of the polymer layer 42 of the SISC 29, and (4) an insulating dielectric layer 585, i.e., silicon-oxide or silicon-nitride layer or polymer layer, on a bottom surface of its silicon substrate 552, wherein its insulating dielectric layer 585 may have a bottom surface substantially coplanar with a backside of each of its through silicon vias 558.

Referring to FIG. 29, each of the through silicon vias 558 of the interposer 551 of the second type of chip package 302 may include (1) a copper layer 557 extending vertically through the silicon substrate 552 of the interposer 551, (2) an insulating dielectric layer 555 around a sidewall of its copper layer 557 and in the silicon substrate 552 of the interposer 551, (3) an adhesion layer 556 around the sidewall of its copper layer 557 and between its copper layer 557 and insulating dielectric layer 555 and (4) a seed layer 559 around the sidewall of its copper layer 557 and between its copper layer 557 and adhesion layer 556. Each of the through silicon vias 558, i.e., the copper layer 557 thereof, may have a depth or thickness between 30 μm and 150 μm, or 50 μm and 100 μm, and a diameter or largest transverse size between 5 μm and 50 μm, or 5 μm and 15 μm. Its adhesion layer 556 may include a titanium (Ti) or titanium nitride (TiN) layer having a thickness between 1 nm to 50 nm. Its seed layer 559 may be a copper layer having a thickness of between 3 nm and 200 nm. Its insulating dielectric layer 555 may include a thermally grown silicon oxide ($SiO_2$) and/or a chemical-vapor-deposition (CVD) silicon nitride ($Si_3N_4$), for example.

Referring to FIG. 29, for the second type of chip package 302, each of its semiconductor integrated-circuit (IC) chips 100 may have the specification for the first type of semiconductor integrated-circuit (IC) chip as illustrated in FIG. 26A to be turned upside down, wherein its semiconductor integrated-circuit (IC) chips 100 may include the standard commodity field programmable integrated-circuit (FPIC) chips or chiplets 200, graphic-processing unit (GPU) integrated-circuit (IC) chips 269*a*, central-processing-unit (CPU) integrated-circuit (IC) chip 269*b*, digital-signal-processing (DSP) integrated-circuit (IC) chip 270, high-bandwidth-memory (HBM) integrated-circuit (IC) chips 251, non-volatile memory (NVM) IC chips 250, IAC chip 402, dedicated control and input/output (I/O) chip 260, cooperating and supporting (CS) integrated-circuit (IC) chip 411 and dedicated input/output (I/O) chips 265 for the first type of standard commodity logic drives 300 as illustrated in FIG. 19A, and alternatively its semiconductor integrated-circuit (IC) chips 100 may include the standard commodity field programmable integrated-circuit (FPIC) chips or chiplets 200, graphic-processing unit (GPU) integrated-circuit (IC) chips 269*a*, central-processing-unit (CPU) integrated-circuit (IC) chip 269*b*, CS-IAC chip 411*a*, CS-DSP chip 411*b*, CS-BRAM chip 411*c*, CS-CPU chip 411*d*, CS-I/O chip 411*e*, high-bandwidth-memory (HBM) integrated-circuit (IC) chips 251, non-volatile memory (NVM) IC chips 250, and cooperating and supporting (CS) integrated-circuit (IC) chip 411 for the second type of standard commodity logic drives 300 as illustrated in FIG. 19B, among of which one of its field programmable integrated-circuit (FPIC) chips or chiplets 200, its CS IC chip 411 and one of its NVM IC chip 250 are shown in FIG. 29. Alternatively, each of its field programmable integrated-circuit (FPIC) chips or chiplets 200 may be replaced with the first type of field programmable chip-on-chip module 400 as illustrated in FIG. 27A to be turned upside down. Each of its semiconductor integrated-circuit (IC) chips 100 or the second field programmable integrated-circuit (IC) chip or chiplet 200*b* of each of its first type of field programmable chip-on-chip modules 400 in case of replacing its standard commodity field programmable integrated-circuit (FPIC) chips or chiplets 200 may have the first, second, third or fourth type of micro-bumps, micro-pillars or micro-pads 34 as illustrated in FIG. 26A bonded to its interposer 551 to form multiple metal contacts 563 between said each of its semiconductor integrated-circuit (IC) chips 100, or the second field programmable integrated-circuit (IC) chip or chiplet 200*b* of said each of its first type of field programmable chip-on-chip modules 400 in case of replacing its standard commodity field programmable integrated-circuit (FPIC) chips or chiplets 200, and its interposer 551. For example, each of its metal contacts 563 may include (1) a copper layer having a thickness between 2 μm and 20 μm and a largest transverse dimension 1 μm and 15 μm between said each of its semiconductor integrated-circuit (IC) chips 100, or the second field programmable integrated-circuit (IC) chip or chiplet 200*b* of said each of its first type of field programmable chip-on-chip modules 400 in case of replacing its standard commodity field programmable integrated-circuit (FPIC) chips or chiplets 200, and its interposer 551 and (2) a solder cap, made of a tin-silver alloy, a tin-gold alloy, a tin-copper alloy, a tin-indium alloy, indium or tin, having a thickness of between 1 μm and 15 μm between the copper layer of said each of its metal contacts 563 and its interposer 551. The second type of chip package 302 may further include an underfill 564, i.e., polymer layer, between each of its semiconductor integrated-circuit (IC) chips 100, or the second field programmable integrated-circuit (IC) chip or chiplet 200*b* of each of its first type of field programmable chip-on-chip modules 400 in case of replacing its standard commodity field programmable integrated-circuit (FPIC) chips or chiplets 200, and its interposer 551, covering a sidewall of each of its metal contacts 563 between said each of its semiconductor integrated-circuit (IC) chips 100, or the second field programmable integrated-circuit (IC) chip or chiplet 200_b_ of said each of its first type of field programmable chip-on-chip modules 400 in case of replacing its standard commodity field programmable integrated-circuit (FPIC) chips or chiplets 200, and its interposer 551. Each of its through package vias (TPVs) 158 may be formed on the topmost one of interconnection metal layers 67 of its interposer 551, coupling one or more of the interconnection metal layers 67 of its interposer 551 to one or more of the interconnection metal layers 27 of its BISD 79. Each of its through package vias (TPVs) 158 may couple to a voltage of power supply for delivering a power supply or to a voltage of ground reference for delivering a ground reference or may pass signals or clocks for signal or clock transmission. Its polymer layer 92 may be formed on its interposer 551 and its underfill 564 and around each of its semiconductor integrated-circuit (IC) chips 100, or each of its first type of field programmable chip-on-chip modules 400 in case of replacing its standard commodity field programmable integrated-circuit (FPIC) chips or chiplets 200, and each of its through package vias (TPVs) 158. Each of its metal bumps, pillars or pads 570, acting as external pins of the second type of chip package 302, may have various types, i.e., first, second and third types, which may have the same specification as that of the first, second and third types of metal bumps, pillars or pads 570 respectively as illustrated in FIG. 28, wherein each of its first or second type of metal bumps, pillars or pads 570 may have the adhesion layer 26_a_ on the backside of one of the through silicon vias 558 of its interposer 551, i.e., a backside of the copper layer 557 thereof, or each of its third type of metal bumps, pillars or pads 570 may include a gold layer having a thickness between 3 and 15 micrometers under the backside of one of the through silicon vias 558 of its interposer 551, i.e., a backside of the copper layer 557 thereof. The second type of chip package 302 in FIG. 29 is only shown with its second type of metal bumps, pillars or pads 570.

Referring to FIG. 29, for the second type of chip package 302, one or more of the interconnection metal layers 67 of its interposer 551 may be provided to form any of the programmable interconnects 361 of the inter-chip interconnects 371 of either of the first and second types of standard commodity logic drives 300 as illustrated in FIGS. 19A and 19B or any of the non-programmable interconnects 364 of the inter-chip interconnects 371 of either of the first and second types of standard commodity logic drives 300; alternatively, the combination of one or more of the interconnection metal layers 67 of its interposer 551, one or more of its through package vias (TPVs) 158 and one or more of the interconnection metal layers 27 of its BISD 79 may be provided to form any of the programmable interconnects 361 of the inter-chip interconnects 371 of either of the first and second types of standard commodity logic drives 300 or any of the non-programmable interconnects 364 of the inter-chip interconnects 371 of either of the first and second types of standard commodity logic drives 300.

3. Third Type of Chip Package Fabricated by Multichip-on-Interconnection-Substrate (COIS) Flip-Chip Packaging Method FIG. 30 is a schematically cross-sectional view showing a third type of chip package for a standard commodity logic drive in accordance with an embodiment of the present application. FIG. 30 is a schematically cross-sectional view along a cross-sectional line A-A in either of FIGS. 19A and 19B. A third type of chip package 303 as seen in FIG. 30 may have a similar structure to the first type of chip package 301 as seen in FIG. 28. For an element indicated by the same reference number shown in FIGS. 28 and 30, the specification of the element as seen in FIG. 30 may be referred to that of the element as illustrated in FIG. 28. The difference therebetween is that the FISD 101 of the first type of chip package 301 as seen in FIG. 28 may be replaced with an interconnection substrate 684 as seen in FIG. 30. Referring to FIG. 30, the third type of chip package 303 may be performed for either of the first and second types of standard commodity logic drives 300 as illustrated in FIGS. 19A and 19B. The interconnection substrate 684 of the third type of chip package 303 may be a coreless substrate including (1) multiple interconnection metal layers 668, made of copper, (2) multiple polymer layers 676 each between neighboring two of its interconnection metal layers 668, and (3) one or more fine-line interconnection bridges (FIBs) 690 (only one is shown) embedded in its interconnection substrate 684 and attached onto one of its interconnection metal layers 668 via an adhesive 678. One or more of its interconnection metal layers 668 may surround four sidewalls of each of its fine-line interconnection bridges (FIBs) 690.

Referring to FIG. 30, each of the fine-line interconnection bridges (FIBs) 690 of the interconnection substrate 684 of the third type of chip package 303 may include (1) a silicon substrate 2 and (2) an interconnection scheme 694 over the silicon substrate 2 thereof, having the same specification as illustrated for the FISC 20, SISC 29 or combination of FISC 20 and SISC 29 in FIG. 26A, wherein its interconnection scheme 694 may include multiple interconnection metal layers over its silicon substrate 2, each having the same specification as that of the interconnection metal layer 6 of the FISC 20 or that of the interconnection metal layer 27 of the SISC 29, and multiple insulating dielectric layers each between neighboring two of the interconnection metal layers of its interconnection scheme 694, under the bottommost one of the interconnection metal layers of its interconnection scheme 694 or over the topmost one of the interconnection metal layers of its interconnection scheme 694, each having the same specification as that of the insulating dielectric layer 12 of the FISC 20 or that of the polymer layer 42 of the SISC 29. Each of the fine-line interconnection bridges (FIBs) 690 of the interconnection substrate 684 of the third type of chip package 303 may include (1) multiple metal pads provided by the topmost one of the interconnection metal layers of its interconnection scheme 694, and (2) metal lines or traces 693 provided by one or more of the interconnection metal layers of its interconnection scheme 694, each coupling two of its metal pads at its two opposite sides.

Referring to FIG. 30, for the interconnection substrate 684 of the third type of chip package 303, the topmost one of its polymer layers 676 may be provided over its fine-line interconnection bridges (FIBs) 690. A first group of openings 676_a_ in the topmost one of its polymer layers 676 may be formed vertically over the metal pads of its fine-line interconnection bridges (FIBs) 690 respectively, a second group of openings 676_b_ in the topmost one of its polymer layers 676 may be formed vertically over multiple metal pads of the topmost one of its interconnection metal layers 668 respectively and horizontally offset from each of its fine-line interconnection bridges (FIBs) 690 and a third group of openings 676_c_ in the bottommost one of its polymer layers 676 may be formed vertically under multiple metal pads of the bottommost one of its interconnection metal layers 668 respectively. Each of its interconnection metal layers 668 may be made of a copper layer with a thickness, for example, between 5 and 100 micrometers, between 5 and 50 micrometers or between 10 and 50 micrometers, and thicker than that of each of the interconnection metal layers of the interconnection scheme 694 of each of its fine-line interconnection bridges (FIBs) 690.

Referring to FIG. 30, for the third type of chip package 303, each of its semiconductor integrated-circuit (IC) chips 100 may have the specification for the first type of semiconductor integrated-circuit (IC) chip as illustrated in FIG. 26A to be turned upside down, wherein its semiconductor integrated-circuit (IC) chips 100 may include the standard commodity field programmable integrated-circuit (FPIC) chips or chiplets 200, graphic-processing unit (GPU) integrated-circuit (IC) chips 269*a*, central-processing-unit (CPU) integrated-circuit (IC) chip 269*b*, digital-signal-processing (DSP) integrated-circuit (IC) chip 270, high-bandwidth-memory (HBM) integrated-circuit (IC) chips 251, non-volatile memory (NVM) IC chips 250, IAC chip 402, dedicated control and input/output (I/O) chip 260, cooperating and supporting (CS) integrated-circuit (IC) chip 411 and dedicated input/output (I/O) chips 265 for the first type of standard commodity logic drives 300 as illustrated in FIG. 19A, and alternatively its semiconductor integrated-circuit (IC) chips 100 may include the standard commodity field programmable integrated-circuit (FPIC) chips or chiplets 200, graphic-processing unit (GPU) integrated-circuit (IC) chips 269*a*, central-processing-unit (CPU) integrated-circuit (IC) chip 269*b*, CS-IAC chip 411*a*, CS-DSP chip 411*b*, CS-BRAM chip 411*c*, CS-CPU chip 411*d*, CS-I/O chip 411*e*, high-bandwidth-memory (HBM) integrated-circuit (IC) chips 251, non-volatile memory (NVM) IC chips 250, and cooperating and supporting (CS) integrated-circuit (IC) chip 411 for the second type of standard commodity logic drives 300 as illustrated in FIG. 19B, among of which one of its field programmable integrated-circuit (FPIC) chips or chiplets 200, its CS IC chip 411 and one of its NVM IC chip 250 are shown in FIG. 30. Alternatively, each of its field programmable integrated-circuit (FPIC) chips or chiplets 200 may be replaced with the first type of field programmable chip-on-chip module 400 as illustrated in FIG. 27A to be turned upside down. Each of its semiconductor integrated-circuit (IC) chips 100 or the second field programmable integrated-circuit (IC) chip or chiplet 200*b* of each of its first type of field programmable chip-on-chip modules 400 in case of replacing its standard commodity field programmable integrated-circuit (FPIC) chips or chiplets 200 may have the first, second, third or fourth type of micro-bumps, micro-pillars or micro-pads 34 as illustrated in FIG. 26A bonded to its interconnection substrate 684 to form (1) multiple high-density metal contacts 563*a* between said each of its semiconductor integrated-circuit (IC) chips 100, or the second field programmable integrated-circuit (IC) chip or chiplet 200*b* of said each of its first type of field programmable chip-on-chip modules 400 in case of replacing its standard commodity field programmable integrated-circuit (FPIC) chips or chiplets 200, and one of the fine-line interconnection bridges (FIBs) 690 of its interconnection substrate 684, each coupling said each of its semiconductor integrated-circuit (IC) chips 100, or the second field programmable integrated-circuit (IC) chip or chiplet 200*b* of said each of its first type of field programmable chip-on-chip modules 400 in case of replacing its standard commodity field programmable integrated-circuit (FPIC) chips or chiplets 200, to one of the metal pads of said one of the fine-line interconnection bridges (FIBs) 690 of its interconnection substrate 684, and (2) multiple low-density metal contacts 563*b* between said each of its semiconductor integrated-circuit (IC) chips 100, or the second field programmable integrated-circuit (IC) chip or chiplet 200*b* of said each of its first type of field programmable chip-on-chip modules 400 in case of replacing its standard commodity field programmable integrated-circuit (FPIC) chips or chiplets 200, and its interconnection substrate 684 and horizontally offset from each of the fine-line interconnection bridges (FIBs) 690 of its interconnection substrate 684, each coupling said each of its semiconductor integrated-circuit (IC) chips 100, or the second field programmable integrated-circuit (IC) chip or chiplet 200*b* of said each of its first type of field programmable chip-on-chip modules 400 in case of replacing its standard commodity field programmable integrated-circuit (FPIC) chips or chiplets 200, to one of the metal pads of the topmost one of the interconnection metal layers 668 of its interconnection substrate 684. Foe example, each of its high-density and low-density metal contacts 563*a* and 563*b* may include a copper layer having a thickness between 2 μm and 20 μm between said each of its semiconductor integrated-circuit (IC) chips 100, or the second field programmable integrated-circuit (IC) chip or chiplet 200*b* of said each of its first type of field programmable chip-on-chip modules 400 in case of replacing its standard commodity field programmable integrated-circuit (FPIC) chips or chiplets 200, and its interconnection substrate 684 and a solder cap, made of a tin-silver alloy, a tin-gold alloy, a tin-copper alloy, a tin-indium alloy, indium or tin, having a thickness of between 1 μm and 15 μm between the copper layer of said each of its high-density and low-density metal contacts 563*a* and 563*b* and its interconnection substrate 684. Accordingly, neighboring two of its semiconductor integrated-circuit (IC) chips 100 and its first type of field programmable chip-on-chip modules 400 in case of replacing its standard commodity field programmable integrated-circuit (FPIC) chips or chiplets 200 may couple to each other through, in sequence, (1) one of its high-density metal contacts 563*a* under one of said neighboring two of its semiconductor integrated-circuit (IC) chips 100 and its first type of field programmable chip-on-chip modules 400 in case of replacing its standard commodity field programmable integrated-circuit (FPIC) chips or chiplets 200, (2) one of the metal lines or traces 693 of said one of the fine-line interconnection bridges (FIBs) 690 of its interconnection substrate 684 vertically under said neighboring two of its semiconductor integrated-circuit (IC) chips 100 and its first type of field programmable chip-on-chip modules 400 in case of replacing its standard commodity field programmable integrated-circuit (FPIC) chips or chiplets 200, and (3) one of its high-density metal contacts 563*a* under the other of said neighboring two of its semiconductor integrated-circuit (IC) chips 100 and its first type of field programmable chip-on-chip modules 400 in case of replacing its standard commodity field programmable integrated-circuit (FPIC) chips or chiplets 200.

Referring to FIG. 30, for the third type of chip package 303, each of its high-density metal contacts 563*a* may have the largest dimension in a horizontal cross section (for example, the diameter of a circle shape, or the diagonal length of a square or rectangle shape) between 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. The smallest space between neighboring two of its high-density metal contacts 563*a* may be between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. Each of its low-density metal contacts 563*b* may have the largest dimension in a horizontal cross section (for example, the diameter of a circle shape, or the diagonal length of a square or rectangle shape) between, for example, 20 μm and 200 μm, 20 μm and 150 μm, 20 μm and 100 μm, 20 μm and 75 μm, or 20 μm and 50 μm or larger than or equal to 20 μm, 30 μm, 40 μm, or 50 μm. The smallest space between neighboring two of its low-density metal contacts 563*b* may be between, for example, 20 μm and 200 μm, 20 μm and 150 μm, 20 μm and 100 μm, 20 μm and 75 μm, or 20 μm and 50 μm or larger than or equal to 20 μm, 30 μm, 40 μm, or 50 μm. The ratio of the largest dimension in a horizontal cross section of each of its low-density metal contacts 563*b* to that of each of its high-density metal contacts 563*a* may be between 1.1 and 5 or greater than 1.2, 1.5 or 2, for example. The ratio of the smallest space between neighboring two of its low-density metal contacts 563*b* to that between neighboring two of its high-density metal contacts 563*a* may be between 1.1 and 5 or greater than 1.2, 1.5 or 2, for example.

Referring to FIG. 30, the third type of chip package 303 may further include an underfill 564, i.e., polymer layer, between each of its semiconductor integrated-circuit (IC) chips 100, or the second field programmable integrated-circuit (IC) chip or chiplet 200*b* of each of its first type of field programmable chip-on-chip modules 400 in case of replacing its standard commodity field programmable integrated-circuit (FPIC) chips or chiplets 200, and its interconnection substrate 684, covering a sidewall of each of its high-density and low-density metal contacts 563*a* and 563*b* between said each of its semiconductor integrated-circuit (IC) chips 100, or the second field programmable integrated-circuit (IC) chip or chiplet 200*b* of said each of its first type of field programmable chip-on-chip modules 400 in case of replacing its standard commodity field programmable integrated-circuit (FPIC) chips or chiplets 200, and its interconnection substrate 684. Each of its through package vias (TPVs) 158 may be formed on the topmost one of interconnection metal layers 676 of its interconnection substrate 684, coupling one or more of the interconnection metal layers 676 of its interconnection substrate 684 to one or more of the interconnection metal layers 27 of its BISD 79. Each of its through package vias (TPVs) 158 may couple to a voltage of power supply for delivering a power supply or a voltage of ground reference for delivering a ground reference or may pass signals or clocks for signal or clock transmission. Its polymer layer 92 may be formed on its interconnection substrate 684 and its underfill 564 and around each of its semiconductor integrated-circuit (IC) chips 100, or each of its first type of field programmable chip-on-chip modules 400 in case of replacing its standard commodity field programmable integrated-circuit (FPIC) chips or chiplets 200, and each of its through package vias (TPVs) 158. Each of its metal bumps, pillars or pads 570, acting as external pins of the third type of chip package 303, may have various types, i.e., first, second and third types, which may have the same specification as that of the first, second and third types of metal bumps, pillars or pads 570 respectively as illustrated in FIG. 28, wherein each of its first or second type of metal bumps, pillars or pads 570 may have the adhesion layer 26*a* on a bottom surface of one of the metal pads of the bottommost one of the interconnection metal layers 668 of its interconnection substrate 684, or each of its third type of metal bumps, pillars or pads 570 may include a gold layer having a thickness between 3 and 15 micrometers under a bottom surface of one of the metal pads of the bottommost one of the interconnection metal layers 668 of its interconnection substrate 684. The third type of chip package 303 in FIG. 30 is only shown with its second type of metal bumps, pillars or pads 570.

Referring to FIG. 30, for the third type of chip package 303, one or more of the metal lines or traces 693 of any of the fine-line interconnection bridges (FIBs) 690 of its interconnection substrate 684 may be provided to form any of the programmable interconnects 361 of the inter-chip interconnects 371 of either of the first and second types of standard commodity logic drives 300 as illustrated in FIGS. 19A and 19B or any of the non-programmable interconnects 364 of the inter-chip interconnects 371 of either of the first and second types of standard commodity logic drives 300; alternatively, one or more of the interconnection metal layers 668 of its interconnection substrate 684 may be provided to form any of the programmable interconnects 361 of the inter-chip interconnects 371 of either of the first and second types of standard commodity logic drives 300 as illustrated in FIGS. 19A and 19B or any of the non-programmable interconnects 364 of the inter-chip interconnects 371 of either of the first and second types of standard commodity logic drives 300; alternatively, the combination of one or more of the metal lines or traces 693 of any of the fine-line interconnection bridges (FIBs) 690 of its interconnection substrate 684, one or more of the interconnection metal layers 668 of its interconnection substrate 684, one or more of its through package vias (TPVs) 158 and one or more of the interconnection metal layers 27 of its BISD 79 may be provided to form any of the programmable interconnects 361 of the inter-chip interconnects 371 of either of the first and second types of standard commodity logic drives 300 as illustrated in FIGS. 19A and 19B or any of the non-programmable interconnects 364 of the inter-chip interconnects 371 of either of the first and second types of standard commodity logic drives 300.

Fourth Type of Chip Package

Figure 31:
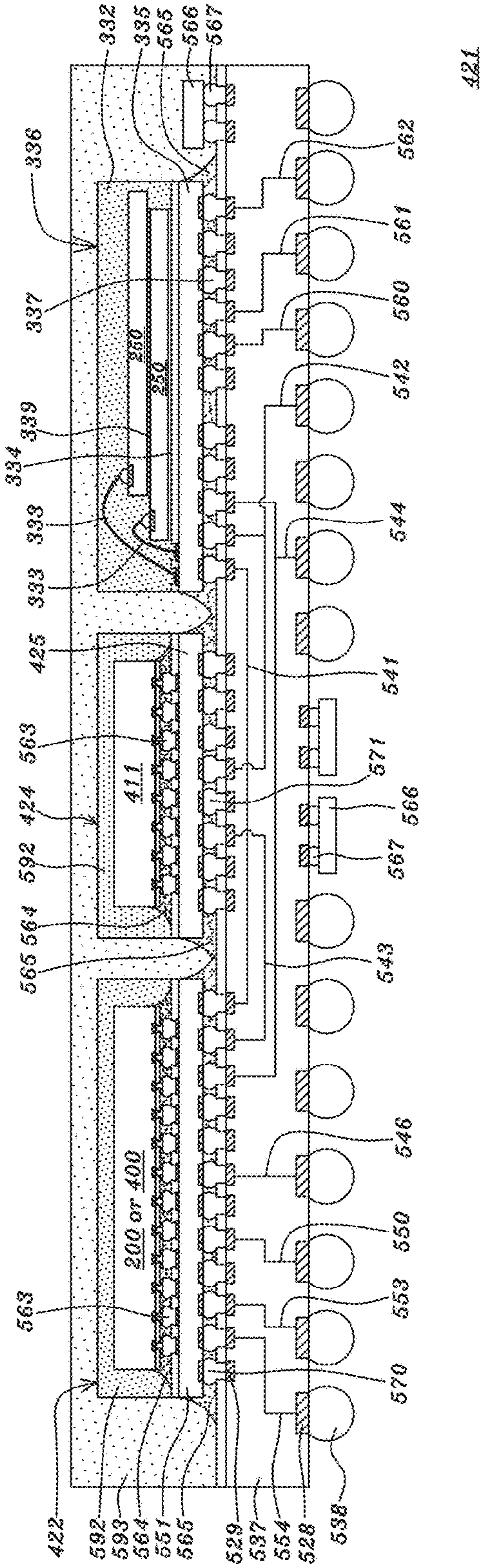

FIG. 31 is a schematically cross-sectional view showing a fourth type of chip package in accordance with an embodiment of the present application.

Referring to FIG. 31, a fourth type of chip package 421 may include (1) a ball-grid-array (BGA) substrate 537 having multiple metal pads 529 at a top surface thereof and multiple metal pads 528 at a bottom surface thereof, (2) a field-programmable integrated-circuit (IC) chip package 422 mounted to the top surface of its ball-grid-array (BGA) substrate 537, (3) a cooperating or supporting (CS) integrated-circuit (IC) chip package 424 mounted to the top surface of its ball-grid-array (BGA) substrate 537, (4) a non-volatile-memory (NVM) chip package 336 mounted to the top surface of its ball-grid-array (BGA) substrate 537, and (5) multiple solder balls 538, made of a tin-lead alloy or tin-silver-copper alloy, each on a bottom surface of one of the metal pads 528 of its ball-grid-array (BGA) substrate 537, wherein its solder balls 538 may act as external pins of the fourth type of chip package 306 to couple or bond to external circuits.

Referring to FIG. 31, the non-volatile-memory (NVM) chip package 336 of the fourth type of chip package 421 may include (1) two non-volatile memory (NVM) IC chips 250, each of which may be a NAND flash memory chip, NOR flash memory chip, magnetoresistive random access memory (MRAM) IC chip, resistive random access memory (RRAM) IC chip or ferroelectric random access memory (FRAM) IC chip, or each of which may include NAND flash memory cells, NOR flash memory cells, magnetoresistive random access memory (MRAM) cells, resistive random access memory (RRAM) cells or ferroelectric random access memory (FRAM) cells, stacked with each other and mounted to each other via an adhesive layer 339 such as silver paste or a heat conductive paste, wherein an upper one of the non-volatile memory IC chips 250 may overhang from an edge of a lower one of the non-volatile memory IC chips 250, wherein each of the ferroelectric random access memory (FRAM) cells of said each of its two non-volatile memory (NVM) integrated-circuit (IC) chips 250 may include two electrodes and a thin ferroelectric film made of lead zirconate titanate (PZT) between the two electrodes thereof, (2) a circuit board 335 under the non-volatile memory IC chips 250 to have the lower one of the non-volatile memory IC chips 250 to be attached to a top surface thereof via an adhesive layer 334 such as silver paste or a heat conductive paste, (3) multiple wirebonded wires 333 each coupling one of the non-volatile memory IC chips 250 to the circuit board 335, (4) a molded polymer 332 over the circuit board 335, encapsulating the non-volatile memory IC chips 250 and wirebonded wires 333 and (5) multiple solder balls 337 at the bottom thereof each attached to one of the metal pads 529 of the ball-grid-array (BGA) substrate 537 of the fourth type of chip packages 421.

Referring to FIG. 31, the field-programmable integrated-circuit (IC) chip package 422 of the fourth type of chip package 421 may include (1) a circuit substrate, such as the interposer 551 as illustrated in FIG. 29 or a ball-grid-array (BGA) substrate, wherein in this embodiment the interposer 551 is taken as an example, and (2) a field-programmable-gate-array (FPGA) integrated-circuit (IC) chip or chiplet 200 having the specification for the first type of semiconductor integrated-circuit (IC) chip 100 as illustrated in FIG. 26A to be turned upside down, wherein the field-programmable-gate-array (FPGA) integrated-circuit (IC) chip or chiplet 200 of its field-programmable integrated-circuit (IC) chip package 422 may be alternatively replaced with the first type of field programmable chip-on-chip module 400 as seen in FIG. 27A to be turned upside down. For the field-programmable integrated-circuit (IC) chip package 422 of the fourth type of chip package 421, its field-programmable-gate-array (FPGA) integrated-circuit (IC) chip or chiplet 200, or the second field-programmable-gate-array (FPGA) integrated-circuit (IC) chip or chiplet 200*b* of its first type of field programmable chip-on-chip module 400 in case of replacing its standard commodity field-programmable-gate-array (FPGA) integrated-circuit (IC) chip or chiplet 200, may have the first, second, third or fourth type of micro-bumps, micro-pillars or micro-pads 34 bonded to its interposer 551 to form multiple metal contacts 563 between its field-programmable-gate-array (FPGA) integrated-circuit (IC) chip or chiplet 200, or the second field-programmable-gate-array (FPGA) integrated-circuit (IC) chip or chiplet 200*b* of its first type of field programmable chip-on-chip module 400 in case of replacing its standard commodity field-programmable-gate-array (FPGA) integrated-circuit (IC) chip or chiplet 200, and its interposer 551, wherein each of its metal contacts 563 may include (1) a copper layer having a thickness between 2 μm and 20 μm and a largest transverse dimension 1 μm and 15 μm between its field-programmable-gate-array (FPGA) integrated-circuit (IC) chip or chiplet 200, or the second field-programmable-gate-array (FPGA) integrated-circuit (IC) chip or chiplet 200*b* of its first type of field programmable chip-on-chip module 400 in case of replacing its standard commodity field-programmable-gate-array (FPGA) integrated-circuit (IC) chip or chiplet 200, and its interposer 551 and (2) a solder cap, made of a tin-silver alloy, a tin-gold alloy, a tin-copper alloy, a tin-indium alloy, indium or tin, having a thickness of between 1 μm and 15 μm between the copper layer of said each of its metal contacts 563 and its interposer 551. The field-programmable integrated-circuit (IC) chip package 422 of the fourth type of chip package 421 may further include (1) an underfill 564, i.e., polymer layer, between its standard commodity field-programmable-gate-array (FPGA) integrated-circuit (IC) chip or chiplet 200, or the second field-programmable-gate-array (FPGA) integrated-circuit (IC) chip or chiplet 200*b* of its first type of field programmable chip-on-chip module 400 in case of replacing its standard commodity field-programmable-gate-array (FPGA) integrated-circuit (IC) chip or chiplet 200, and its interposer 551, covering a sidewall of each of its metal contacts 563 between its standard commodity field-programmable-gate-array (FPGA) integrated-circuit (IC) chip or chiplet 200, or the second field-programmable-gate-array (FPGA) integrated-circuit (IC) chip or chiplet 200*b* of its first type of field programmable chip-on-chip module 400 in case of replacing its standard commodity field-programmable-gate-array (FPGA) integrated-circuit (IC) chip or chiplet 200, and its interposer 551, (2) a polymer layer 592, i.e., insulating dielectric layer, made of molding compound, epoxy-based material, polyimide or silicon oxide for example, over its interposer 551, wherein its polymer layer 592 may cover a top surface of its standard commodity field-programmable-gate-array (FPGA) integrated-circuit (IC) chip or chiplet 200, or a top surface of the first field-programmable-gate-array (FPGA) integrated-circuit (IC) chip or chiplet 200*a* of its first type of field programmable chip-on-chip module 400 in case of replacing its standard commodity field-programmable-gate-array (FPGA) integrated-circuit (IC) chip or chiplet 200, wherein its polymer layer 592 may have a sidewall coplanar with a sidewall of its interposer 551 in a vertical direction, and (3) multiple metal bumps, pillars or pads 570 each having one type of various types, i.e., first, second and third types, which may have the same specification as that of the first, second and third types of metal bumps, pillars or pads 570 respectively as illustrated in FIG. 28, wherein each of its metal bumps, pillars or pads 570 may have the adhesion layer 26*a* at a top end thereof formed on and under the backside of one of the through silicon vias 558 of its interposer 551, i.e., a backside of the copper layer 557 thereof, and have a bottom end bonded to one of the metal pads 529 of the ball-grid-array (BGA) substrate 537 of the fourth type of chip package 421.

Referring to FIG. 31, the cooperating or supporting (CS) integrated-circuit (IC) chip package 424 of the fourth type of chip package 421 may include (1) a circuit substrate 425, such as the interposer 551 as illustrated in FIG. 29 or a ball-grid-array (BGA) substrate, and (2) a cooperating and supporting (CS) IC chip 411 having the specification for the first type of semiconductor integrated-circuit (IC) chip 100 as illustrated in FIG. 26A to be turned upside down. For the cooperating or supporting (CS) integrated-circuit (IC) chip package 424 of the fourth type of chip package 421, its cooperating and supporting (CS) IC chip 411 may have the first, second, third or fourth type of micro-bumps, micro-pillars or micro-pads 34 bonded to its circuit substrate 425 to form multiple metal contacts 563 between its cooperating and supporting (CS) IC chip 411 and circuit substrate 425, wherein each of its metal contacts 563 may include (1) a copper layer having a thickness between 2 μm and 20 μm and a largest transverse dimension 1 μm and 15 μm between its cooperating and supporting (CS) IC chip 411 and circuit substrate 425 and (2) a solder cap, made of a tin-silver alloy, a tin-gold alloy, a tin-copper alloy, a tin-indium alloy, indium or tin, having a thickness of between 1 μm and 15 μm between the copper layer of said each of its metal contacts 563 and its circuit substrate 425. The cooperating or supporting (CS) integrated-circuit (IC) chip package 424 of the fourth type of chip package 421 may further include (1) an underfill 564, i.e., polymer layer, between its cooperating and supporting (CS) IC chip 411 and circuit substrate 425, covering a sidewall of each of its metal contacts 563 between its cooperating and supporting (CS) IC chip 411 and circuit substrate 425, (2) a polymer layer 592, i.e., insulating dielectric layer, made of molding compound, epoxy-based material, polyimide or silicon oxide for example, over its circuit substrate 425, wherein its polymer layer 592 may cover a top surface of its cooperating and supporting (CS) IC chip 411, wherein its polymer layer 592 may have a sidewall coplanar with a sidewall of its circuit substrate 425 in a vertical direction, and (3) multiple solder balls 571, made of a tin-lead alloy or tin-silver-copper alloy, on a bottom surface of its circuit substrate 425, wherein each of its solder balls 571 may have a bottom end bonded to one of the metal pads 529 of the ball-grid-array (BGA) substrate 537 of the twenty-fifth type of chip package 421. For the fourth type of chip package 421, its cooperating or supporting (CS) integrated-circuit (IC) chip package 424 may be arranged between its field-programmable integrated-circuit (IC) chip package 422 and non-volatile-memory (NVM) chip package 336.

Referring to FIG. 31, the fourth type of chip package 421 may further include (1) multiple passive devices 566, each of which may be a capacitor, resistor or inductor, mounted to both top and bottom sides of its ball-grid-array (BGA) substrate 537 via a tin-containing solder 567, (2) an underfill 565, i.e., polymer layer, between the circuit substrate 425 of its cooperating or supporting (CS) integrated-circuit (IC) chip package 424 and its ball-grid-array (BGA) substrate 537, between the interposer 551 of its field-programmable integrated-circuit (IC) chip package 422 and its ball-grid-array (BGA) substrate 537 and between the circuit board 335 of its non-volatile-memory (NVM) chip package 336 and its ball-grid-array (BGA) substrate 537, and (3) a polymer layer 593, i.e., insulating dielectric layer, made of molding compound, epoxy-based material, polyimide or silicon oxide for example, over its ball-grid-array (BGA) substrate 537, wherein its polymer layer 593 may cover a top surface of each of its field-programmable integrated-circuit (IC) chip package 422, cooperating or supporting (CS) integrated-circuit (IC) chip package 424 and non-volatile-memory (NVM) chip package 336, wherein its polymer layer 593 may have a sidewall coplanar with a sidewall of its ball-grid-array (BGA) substrate 537 in a vertical direction.

Referring to FIG. 31, the fourth type of chip package 421 may be formed to achieve the first type of configuration architecture as illustrated in FIG. 25A. For more elaboration, for the fourth type of chip package 421, its ball-grid-array (BGA) substrate 537 may include (1) a first metal interconnect 541 coupling one of the read-enable pins 2005 of the field-programmable-gate-array (FPGA) integrated-circuit (IC) chip or chiplet 200 of its field-programmable integrated-circuit (IC) chip package 422, or one of the read-enable pins 2005 of one of the field-programmable-gate-array (FPGA) integrated-circuit (IC) chips or chiplets 200*a* and 200*b* of the first type of field programmable chip-on-chip module 400 of its field-programmable integrated-circuit (IC) chip package 422 in case of replacing the field-programmable-gate-array (FPGA) integrated-circuit (IC) chip or chiplet 200 of its field-programmable integrated-circuit (IC) chip package 422, to one of the read-enable pins 2505 of one of the non-volatile memory IC chips 250 of its non-volatile-memory (NVM) chip package 336 for passing the read-enable signal from said one of the read-enable pins 2005 of the field-programmable-gate-array (FPGA) integrated-circuit (IC) chip or chiplet 200 of its field-programmable integrated-circuit (IC) chip package 422, or said one of the read-enable pins 2005 of said one of the field-programmable-gate-array (FPGA) integrated-circuit (IC) chips or chiplets 200*a* and 200*b* of the first type of field programmable chip-on-chip module 400 of its field-programmable integrated-circuit (IC) chip package 422 in case of replacing the field-programmable-gate-array (FPGA) integrated-circuit (IC) chip or chiplet 200 of its field-programmable integrated-circuit (IC) chip package 422, to said one of the read-enable pins 2505 of said one of the non-volatile memory IC chips 250 of its non-volatile-memory (NVM) chip package 336, wherein the first metal interconnect 541 of its ball-grid-array (BGA) substrate 537 may not couple to any of its solder balls 538, (2) a second metal interconnect 542 coupling one of the first signal input/output (I/O) pins 4111 of the cooperating and supporting (CS) IC chip 411 of its cooperating or supporting (CS) integrated-circuit (IC) chip package 424 to one of the signal input/output (I/O) pins 2501 of one of the non-volatile memory IC chips 250 of its non-volatile-memory (NVM) chip package 336 and to one of its solder balls 538 for passing the encrypted CPM data from said one of its solder balls 538 to said one of the signal input/output (I/O) pins 2501 of said one of the non-volatile memory IC chips 250 of its non-volatile-memory (NVM) chip package 336 and passing the encrypted CPM data from said one of the signal input/output (I/O) pins 2501 of said one of the non-volatile memory IC chips 250 of its non-volatile-memory (NVM) chip package 336 to said one of the first signal input/output (I/O) pins 4111 of the cooperating and supporting (CS) IC chip 411 of its cooperating or supporting (CS) integrated-circuit (IC) chip package 424, (3) a third metal interconnect 543 coupling one of the first signal input/output (I/O) pins 2001 of the field-programmable-gate-array (FPGA) integrated-circuit (IC) chip or chiplet 200 of its field-programmable integrated-circuit (IC) chip package 422, or one of the first signal input/output (I/O) pins 2001 of one of the field-programmable-gate-array (FPGA) integrated-circuit (IC) chips or chiplets 200*a* and 200*b* of the first type of field programmable chip-on-chip module 400 of its field-programmable integrated-circuit (IC) chip package 422 in case of replacing the field-programmable-gate-array (FPGA) integrated-circuit (IC) chip or chiplet 200 of its field-programmable integrated-circuit (IC) chip package 422, to one of the second signal input/output (I/O) pins 4112 of the cooperating or supporting (CS) IC chip 411 of its cooperating or supporting (CS) integrated-circuit (IC) chip package 424 for passing the decrypted CPM data from said one of the second signal input/output (I/O) pins 4112 of the cooperating or supporting (CS) IC chip 411 of its cooperating or supporting (CS) integrated-circuit (IC) chip package 424 to said one of the first signal input/output (I/O) pins 2001 of the field-programmable-gate-array (FPGA) integrated-circuit (IC) chip or chiplet 200 of its field-programmable integrated-circuit (IC) chip package 422, or said one of the first signal input/output (I/O) pins 2001 of said one of the field-programmable-gate-array (FPGA) integrated-circuit (IC) chips or chiplets 200*a* and 200*b* of the first type of field programmable chip-on-chip module 400 of its field-programmable integrated-circuit (IC) chip package 422 in case of replacing the field-programmable-gate-array (FPGA) integrated-circuit (IC) chip or chiplet 200 of its field-programmable integrated-circuit (IC) chip package 422, (4) a fourth metal interconnect 544 coupling one of the address pins 2006 of the field-programmable-gate-array (FPGA)

integrated-circuit (IC) chip or chiplet 200 of its field-programmable integrated-circuit (IC) chip package 422, or one of the address pins 2006 of one of the field-programmable-gate-array (FPGA) integrated-circuit (IC) chips or chiplets 200*a* and 200*b* of the first type of field programmable chip-on-chip module 400 of its field-programmable integrated-circuit (IC) chip package 422 in case of replacing the field-programmable-gate-array (FPGA) integrated-circuit (IC) chip or chiplet 200 of its field-programmable integrated-circuit (IC) chip package 422, to one of the signal input/output (I/O) pins 2501 of one of the non-volatile memory IC chips 250 of its non-volatile-memory (NVM) chip package 336 and to one of its solder balls 538 for passing the first address signals from said one of its solder balls 538 to said one of the signal input/output (I/O) pins 2501 of said one of the non-volatile memory IC chips 250 of its non-volatile-memory (NVM) chip package 336 and passing the second address signals from said one of the address pins 2006 of the field-programmable-gate-array (FPGA) integrated-circuit (IC) chip or chiplet 200 of its field-programmable integrated-circuit (IC) chip package 422, or said one of the address pins 2006 of said one of the field-programmable-gate-array (FPGA) integrated-circuit (IC) chips or chiplets 200*a* and 200*b* of the first type of field programmable chip-on-chip module 400 of its field-programmable integrated-circuit (IC) chip package 422 in case of replacing the field-programmable-gate-array (FPGA) integrated-circuit (IC) chip or chiplet 200 of its field-programmable integrated-circuit (IC) chip package 422, to said one of the signal input/output (I/O) pins 2501 of said one of the non-volatile memory IC chips 250 of its non-volatile-memory (NVM) chip package 336, (5) a fifth metal interconnect 546 coupling one of the second signal input/output (I/O) pins 2002 of the field-programmable-gate-array (FPGA) integrated-circuit (IC) chip or chiplet 200 of its field-programmable integrated-circuit (IC) chip package 422, or one of the second signal input/output (I/O) pins 2002 of one of the field-programmable-gate-array (FPGA) integrated-circuit (IC) chips or chiplets 200*a* and 200*b* of the first type of field programmable chip-on-chip module 400 of its field-programmable integrated-circuit (IC) chip package 422 in case of replacing the field-programmable-gate-array (FPGA) integrated-circuit (IC) chip or chiplet 200 of its field-programmable integrated-circuit (IC) chip package 422, to one of its solder balls 538 for passing the data, i.e., data information memory (DIM) stream, from said one of its solder balls 538 to said one of the second signal input/output (I/O) pins 2002 of the field-programmable-gate-array (FPGA) integrated-circuit (IC) chip or chiplet 200 of its field-programmable integrated-circuit (IC) chip package 422, or said one of the second signal input/output (I/O) pins 2002 of said one of the field-programmable-gate-array (FPGA) integrated-circuit (IC) chips or chiplets 200*a* and 200*b* of the first type of field programmable chip-on-chip module 400 of its field-programmable integrated-circuit (IC) chip package 422 in case of replacing the field-programmable-gate-array (FPGA) integrated-circuit (IC) chip or chiplet 200 of its field-programmable integrated-circuit (IC) chip package 422, and passing the data, i.e., data information memory (DIM) stream, from said one of the second signal input/output (I/O) pins 2002 of the field-programmable-gate-array (FPGA) integrated-circuit (IC) chip or chiplet 200 of its field-programmable integrated-circuit (IC) chip package 422, or said one of the second signal input/output (I/O) pins 2002 of said one of the field-programmable-gate-array (FPGA) integrated-circuit (IC) chips or chiplets 200*a* and 200*b* of the first type of field programmable chip-on-chip module 400 of its field-programmable integrated-circuit (IC) chip package 422 in case of replacing the field-programmable-gate-array (FPGA) integrated-circuit (IC) chip or chiplet 200 of its field-programmable integrated-circuit (IC) chip package 422, to said one of its solder balls 538, (6) a sixth metal interconnect 550 coupling one of the ground pins 2003 of the field-programmable-gate-array (FPGA) integrated-circuit (IC) chip or chiplet 200 of its field-programmable integrated-circuit (IC) chip package 422, or one of the ground pins 2003 of one of the field-programmable-gate-array (FPGA) integrated-circuit (IC) chips or chiplets 200*a* and 200*b* of the first type of field programmable chip-on-chip module 400 of its field-programmable integrated-circuit (IC) chip package 422 in case of replacing the field-programmable-gate-array (FPGA) integrated-circuit (IC) chip or chiplet 200 of its field-programmable integrated-circuit (IC) chip package 422, to one of its solder balls 538 for delivering a voltage (Vss) of ground reference, (7) a seventh metal interconnect 553 coupling one of the power pins 2003 of the field-programmable-gate-array (FPGA) integrated-circuit (IC) chip or chiplet 200 of its field-programmable integrated-circuit (IC) chip package 422, or one of the power pins 2003 of one of the field-programmable-gate-array (FPGA) integrated-circuit (IC) chips or chiplets 200*a* and 200*b* of the first type of field programmable chip-on-chip module 400 of its field-programmable integrated-circuit (IC) chip package 422 in case of replacing the field-programmable-gate-array (FPGA) integrated-circuit (IC) chip or chiplet 200 of its field-programmable integrated-circuit (IC) chip package 422, to one of its solder balls 538 for delivering a voltage (Vcc) of power supply, (8) an eighth metal interconnect 554 coupling one of the control pins 2004 of the field-programmable-gate-array (FPGA) integrated-circuit (IC) chip or chiplet 200 of its field-programmable integrated-circuit (IC) chip package 422, or one of the control pins 2004 of one of the field-programmable-gate-array (FPGA) integrated-circuit (IC) chips or chiplets 200*a* and 200*b* of the first type of field programmable chip-on-chip module 400 of its field-programmable integrated-circuit (IC) chip package 422 in case of replacing the field-programmable-gate-array (FPGA) integrated-circuit (IC) chip or chiplet 200 of its field-programmable integrated-circuit (IC) chip package 422, to one of its solder balls 538 for controlling, by said one of its solder balls 538, the field-programmable-gate-array (FPGA) integrated-circuit (IC) chip or chiplet 200 of its field-programmable integrated-circuit (IC) chip package 422, or said one of the field-programmable-gate-array (FPGA) integrated-circuit (IC) chips or chiplets 200*a* and 200*b* of the first type of field programmable chip-on-chip module 400 of its field-programmable integrated-circuit (IC) chip package 422 in case of replacing the field-programmable-gate-array (FPGA) integrated-circuit (IC) chip or chiplet 200 of its field-programmable integrated-circuit (IC) chip package 422, or for controlling, by the field-programmable-gate-array (FPGA) integrated-circuit (IC) chip or chiplet 200 of its field-programmable integrated-circuit (IC) chip package 422, or said one of the field-programmable-gate-array (FPGA) integrated-circuit (IC) chips or chiplets 200*a* and 200*b* of the first type of field programmable chip-on-chip module 400 of its field-programmable integrated-circuit (IC) chip package 422 in case of replacing the field-programmable-gate-array (FPGA) integrated-circuit (IC) chip or chiplet 200 of its field-programmable integrated-circuit (IC) chip package 422, said one of its solder balls 538, (9) a ninth metal interconnect 560 coupling one of the ground pins 2502 of one of the non-volatile memory IC chips 250 of its non-volatile-memory (NVM) chip package 336 to one of its solder balls 538 for delivering a voltage (Vss) of ground reference, (10) a tenth metal interconnect 561 coupling one of the power pins 2502 of one of the non-volatile memory IC chips 250 of its non-volatile-memory (NVM) chip package 336 to one of its solder balls 538 for delivering a voltage (Vcc) of power supply, and (11) an eleventh metal interconnect 562 coupling one of the control pins 2503 of one of the non-volatile memory IC chips 250 of its non-volatile-memory (NVM) chip package 336 to one of its solder balls 538 for controlling, by said one of its solder balls 538, said one of the non-volatile memory IC chips 250 of its non-volatile-memory (NVM) chip package 336.

Fifth Type of Chip Package

Figure 32:
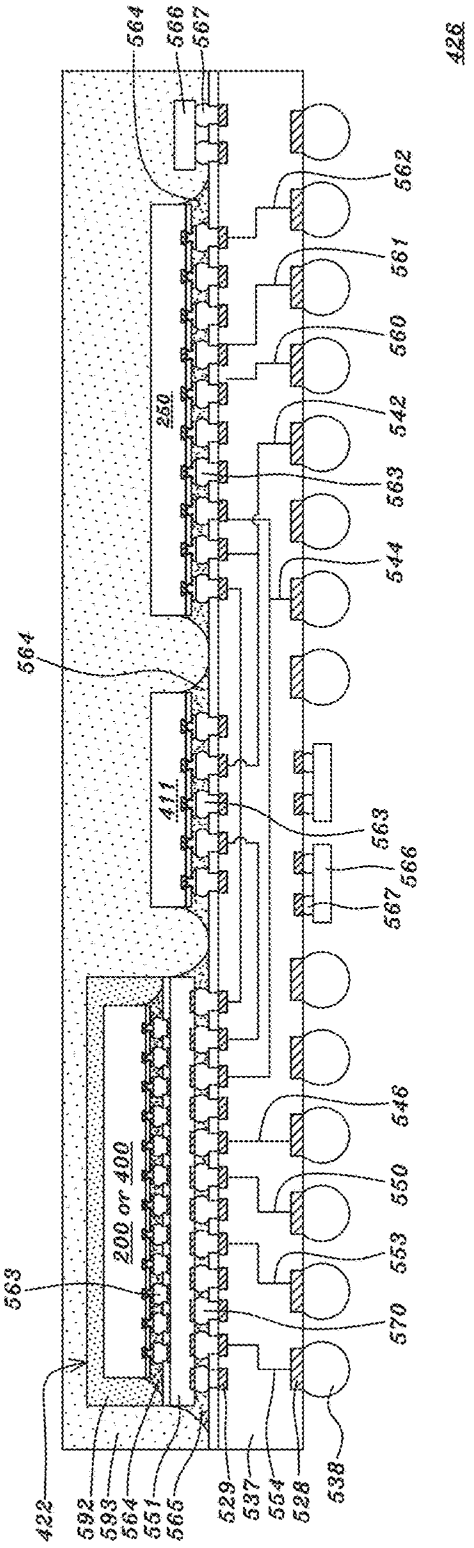

FIG. 32 is a schematically cross-sectional view showing a twenty-second type of chip package in accordance with an embodiment of the present application. The fifth type of chip package 426 as seen in FIG. 32 may have a similar structure to the fourth type of chip package 421 as seen in FIG. 31. For an element indicated by the same reference number shown in FIGS. 31 and 32, the specification of the element as seen in FIG. 32 may be referred to that of the element as illustrated in FIG. 31. The difference therebetween is that the cooperating or supporting (CS) integrated-circuit (IC) chip package 424 of the fourth type of chip package 421 may be replaced with the cooperating and supporting (CS) IC chip 411 as illustrated in FIG. 25A for the fifth type of chip package 426, wherein the cooperating and supporting (CS) IC chip 411 of the fifth type of chip package 426 may have the specification for the first type of semiconductor integrated-circuit (IC) chip 100 as illustrated in FIG. 26A to be turned upside down. The non-volatile-memory (NVM) chip package 336 of the fourth type of chip package 421 may be replaced with the non-volatile memory IC chip 250 for the fifth type of chip package 426, wherein the non-volatile memory IC chip 250 of the fifth type of chip package 426 may have the specification for the first type of semiconductor integrated-circuit (IC) chip 100 as illustrated in FIG. 26A to be turned upside down.

Referring to FIG. 32, for the fifth type of chip package 426, each of its cooperating and supporting (CS) IC chip 411 and non-volatile memory IC chip 250 may have the first, second, third or fourth type of micro-bumps, micro-pillars or micro-pads 34 bonded to its ball-grid-array (BGA) substrate 537 to form multiple metal contacts 563 between its cooperating and supporting (CS) IC chip 411 and ball-grid-array (BGA) substrate 537 and between its non-volatile memory IC chip 250 and ball-grid-array (BGA) substrate 537, wherein each of its metal contacts 563 may include (1) a copper layer having a thickness between 2 μm and 20 μm and a largest transverse dimension 1 μm and 15 μm between its cooperating and supporting (CS) IC chip 411 and ball-grid-array (BGA) substrate 537 or between its non-volatile memory IC chip 250 and ball-grid-array (BGA) substrate 537 and (2) a solder cap, made of a tin-silver alloy, a tin-gold alloy, a tin-copper alloy, a tin-indium alloy, indium or tin, having a thickness of between 1 μm and 15 μm between the copper layer of said each of its metal contacts 563 and its ball-grid-array (BGA) substrate 537. The fifth type of chip package 426 may further include an underfill 564, i.e., polymer layer, between its cooperating and supporting (CS) IC chip 411 and ball-grid-array (BGA) substrate 537 and between its non-volatile memory IC chip 250 and ball-grid-array (BGA) substrate 537, covering a sidewall of each of its metal contacts 563 between its cooperating and supporting (CS) IC chip 411 and ball-grid-array (BGA) substrate 537 and between its non-volatile memory IC chip 250 and ball-grid-array (BGA) substrate 537. For the fifth type of chip package 426, its polymer layer 593 may further cover a top surface of each of its cooperating and supporting (CS) IC chip 411 and non-volatile memory IC chip 250.

Referring to FIG. 32, the fifth type of chip package 426 may be formed to achieve the first type of configuration architecture as illustrated in FIG. 25A. The connection and functions of the first metal interconnect 541, 542, 543, 544, 546, 550, 553, 554, 560, 561 and 562 may be referred to those of the fourth type of chip package 421 as illustrated in FIG. 31.

Sixth Type of Chip Package

Figure 33:
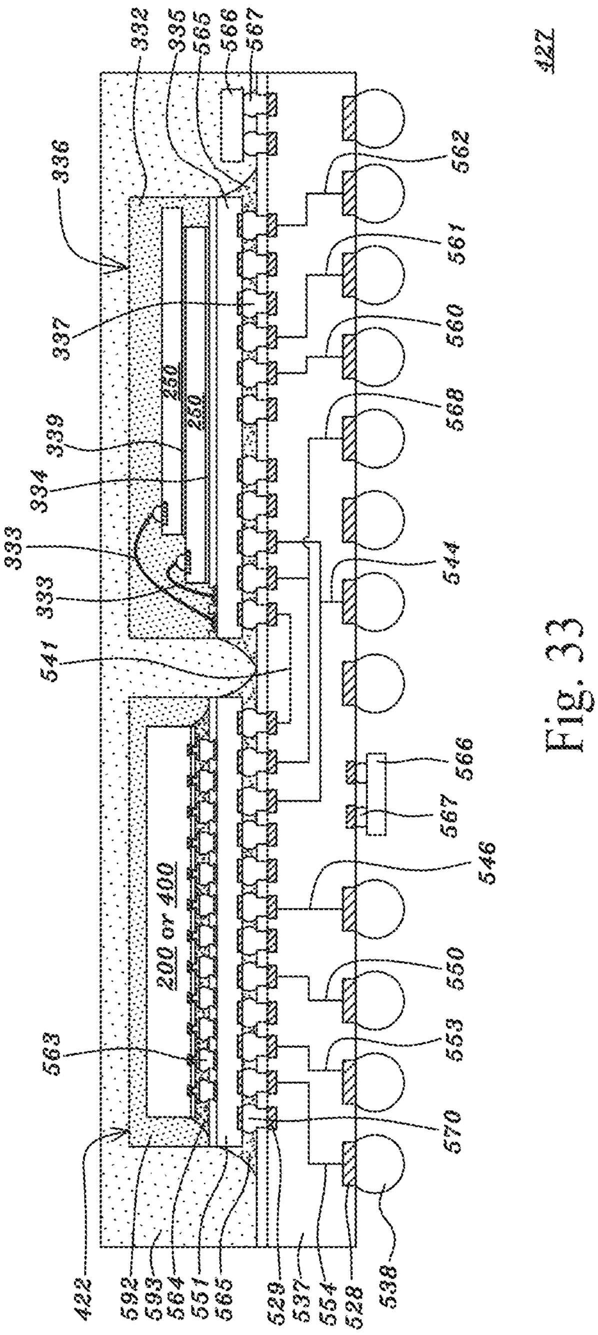
Figure 34:
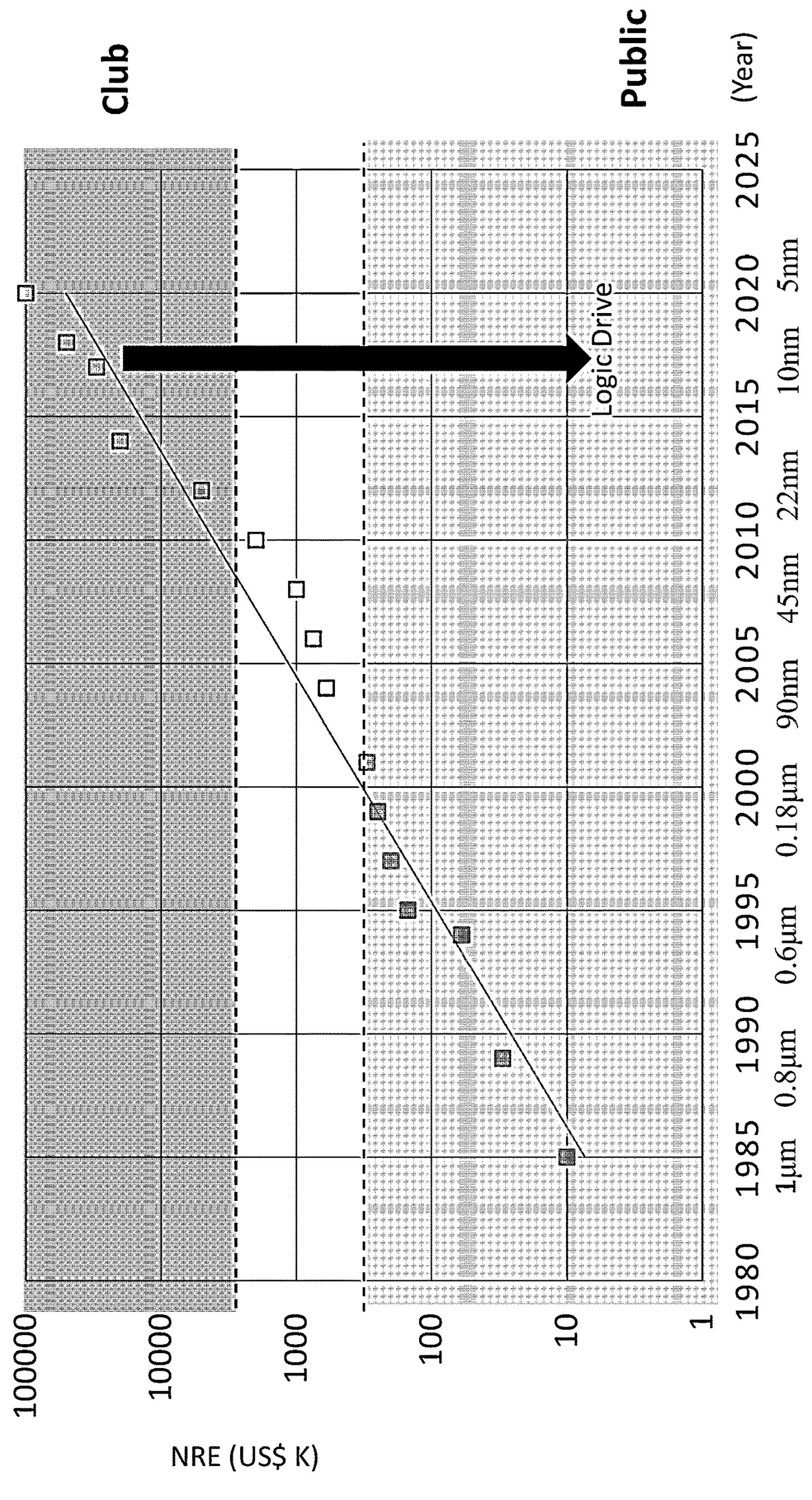
FIG. 34 is a chart showing a trend of relationship between non-recurring engineering (NRE) costs and technology nodes.

FIG. 33 is a schematically cross-sectional view showing a sixth type of chip package in accordance with an embodiment of the present application. A sixth type of chip package 427 as seen in FIG. 33 may have a similar structure to the fourth type of chip package 421 as seen in FIG. 33. For an element indicated by the same reference number shown in FIGS. 31 and 33, the specification of the element as seen in FIG. 33 may be referred to that of the element as illustrated in FIG. 31. The difference therebetween is that the cooperating or supporting (CS) integrated-circuit (IC) chip package 424 of the fourth type of chip package 421 may be saved for the sixth type of chip package 427 to achieve the second type of configuration architecture as illustrated in FIG. 25B. The second and third metal interconnects 542 and 543 of the ball-grid-array (BGA) substrate 537 of the fourth type of chip package 421 may be replaced with a twelfth metal interconnect 568 coupling one of the first signal input/output (I/O) pins 2001 of the field-programmable-gate-array (FPGA) integrated-circuit (IC) chip or chiplet 200 of its field-programmable integrated-circuit (IC) chip package 422, or one of the first signal input/output (I/O) pins 2001 of either of the field-programmable-gate-array (FPGA) integrated-circuit (IC) chips or chiplets 200*a* and 200*b* of the first type of field programmable chip-on-chip module 400 of its field-programmable integrated-circuit (IC) chip package 422 in case of replacing the field-programmable-gate-array (FPGA) integrated-circuit (IC) chip or chiplet 200 of its field-programmable integrated-circuit (IC) chip package 422, to one of the signal input/output (I/O) pins 2501 of either of the non-volatile memory IC chips 250 of its non-volatile-memory (NVM) chip package 336 and to one of its solder balls 538 for passing the CPM data from said one of its solder balls 538 to said one of the signal input/output (I/O) pins 2501 of said either of the non-volatile memory IC chips 250 of its non-volatile-memory (NVM) chip package 336 and passing the CPM data from said one of the signal input/output (I/O) pins 2501 of said either of the non-volatile memory IC chips 250 of its non-volatile-memory (NVM) chip package 336 to said one of the first signal input/output (I/O) pins 2001 of the field-programmable-gate-array (FPGA) integrated-circuit (IC) chip or chiplet 200 of its field-programmable integrated-circuit (IC) chip package 422, or said one of the first signal input/output (I/O) pins 2001 of said either of the field-programmable-gate-array (FPGA) integrated-circuit (IC) chips or chiplets 200*a* and 200*b* of the first type of field programmable chip-on-chip module 400 of its field-programmable integrated-circuit (IC) chip package 422 in case of replacing the field-programmable-gate-array (FPGA) integrated-circuit (IC) chip or chiplet 200 of its field-programmable integrated-circuit (IC) chip package 422.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A semiconductor integrated-circuit (IC) chip comprising:

a memory array comprising:

a plurality of first bit lines, a plurality of bit-bar lines, a plurality of second bit lines, a plurality of first word lines, a plurality of second word lines, and a plurality of dual-port memory cells arranged in an array of multiple columns by multiple rows, wherein each of the plurality of dual-port memory cells comprises:

a six-transistor (6T) static-random-access memory (SRAM) cell comprising a first and a second transfer transistor each having a gate terminal coupling to a first word line of the plurality of first word lines, a first latch node coupling to a first bit line of the plurality of first bit lines through the first transfer transistor and a second latch node coupling to a bit-bar line of the plurality of bit-bar lines through the second transfer transistor, and a third transfer transistor having a gate terminal coupling to a second word line of the plurality of second word lines, wherein the third transfer transistor is coupled between the first latch node and a second bit line of the plurality of second bit lines;

a first row decoder coupling to the plurality of first word lines, wherein the first row decoder is configured for switching on the first and second transfer transistors of the six-transistor (6T) static-random-access memory (SRAM) cell of said each of the plurality of dual-port memory cells arranged in one of the multiple rows of the array in accordance with first data at the first word line; and a first column decoder coupling to the plurality of first bit lines and the plurality of bit-bar lines, wherein the first column decoder is configured for writing second data into said each of the plurality of dual-port memory cells to be stored therein through the first bit line and bit-bar line.

2. The semiconductor integrated-circuit (IC) chip of claim 1, wherein each of the first and second transfer transistors is an N-type metal-oxide-semiconductor (MOS) transistor.

3. The semiconductor integrated-circuit (IC) chip of claim 1, wherein the third transfer transistor is a P-type metal-oxide-semiconductor (MOS) transistor.

4. The semiconductor integrated-circuit (IC) chip of claim 1, wherein the third transfer transistor is a fin field-effect transistor (finFET).

5. The semiconductor integrated-circuit (IC) chip of claim 1, wherein the third transfer transistor is a gate-all-around (GAA) field-effect transistor (FET).

6. The semiconductor integrated-circuit (IC) chip of claim 1, wherein a voltage of power supply applied to the six-transistor (6T) static-random-access memory (SRAM) cell is less than 0.5 volts.

7. The semiconductor integrated-circuit (IC) chip of claim 1 further comprising:

a second row decoder coupling to the plurality of second word lines, wherein the second row decoder is configured for switching on the third transfer transistor of said each of the plurality of dual-port memory cells arranged in said one of the multiple rows of the array in accordance with third data at the second word line; and a second column decoder coupling to the plurality of second bit lines, wherein the second column decoder is configured for reading the second data stored in said each of the plurality of dual-port memory cells through the second bit line as output data of the second column decoder.

8. The semiconductor integrated-circuit (IC) chip of claim 7 further comprising a selection circuit having first address data having k bits at its input points, wherein the first address data comprises row-address data having r bits and column-address data having c bits, wherein k, r and c are positive integers, wherein the selection circuit is configured for selecting the row-address data from the first address data as first output data to be passed to the second row decoder, and the second row decoder is configured for selecting, in accordance with the row-address data, the second word line from the plurality of second word lines to pass the third data at the second word line, and wherein the selection circuit is configured for selecting the column-address data from the first address data as second output data to be passed to the second column decoder, and the second column decoder is configured for selecting, in accordance with the column-address data, the second bit line from the plurality of second bit lines to read the second data stored in said each of the plurality of dual-port memory cells.

9. The semiconductor integrated-circuit (IC) chip of claim 7 further comprising a registering block configured for storing data associated with the output data of the second column decoder.

10. The semiconductor integrated-circuit (IC) chip of claim 7, wherein the second row decoder, second column decoder and memory array are configured for a multi-output look-up table (LUT).

11. The semiconductor integrated-circuit (IC) chip of claim 1, wherein the first column decoder is further configured for reading the second data stored in said each of the plurality of dual-port memory cells through the first bit line and bit-bar line.

12. The semiconductor integrated-circuit (IC) chip of claim 1 further comprising a sense amplifier coupling to the first bit line and bit-bar line to sense a first voltage at the first bit line and a second voltage at the bit-bar line and amplify a difference between the first and second voltages as a data output of the sense amplifier.

13. The semiconductor integrated-circuit (IC) chip of claim 1, wherein the six-transistor (6T) static-random-access memory (SRAM) cell comprises a latch circuit having a first and a second inverter coupling to each other, wherein the first latch node couples to an input point of the first inverter and an output point of the second inverter and the second latch node couples to an input point of the second inverter and an output point of the first inverter.

14. The semiconductor integrated-circuit (IC) chip of claim 1 is a field-programmable-gate-array (FPGA) integrated-circuit (IC) chip.

15. The semiconductor integrated-circuit (IC) chip of claim 1 is an application specific integrated-circuit (ASIC) chip.

16. The semiconductor integrated-circuit (IC) chip of claim 1 is a central processing unit (CPU) integrated-circuit (IC) chip.

17. A semiconductor integrated-circuit (IC) chip comprising:

a memory array comprising:

a plurality of first bit lines, a plurality of bit-bar lines, a plurality of second bit lines, a plurality of first word lines, a plurality of second word lines, and a plurality of memory cells arranged in an array of multiple columns by multiple rows, wherein each of the plurality of memory cells comprises:

a latch circuit comprising a first and a second inverter coupling to each other, a first latch node coupling to an input point of the first inverter and an output point of the second inverter and a second latch node coupling to an input point of the second inverter and an output point of the first inverter, a first N-type metal-oxide-semiconductor (MOS) transistor having a first terminal coupling to the first latch node, a second terminal coupling to a first point of said each of the plurality of memory cells, and a first gate terminal coupling to a first word line of the plurality of first word lines, wherein the first N-type metal-oxide-semiconductor (MOS) transistor is configured for controlling coupling between the first latch node and the first point of said each of the plurality of memory cells, a second N-type metal-oxide-semiconductor (MOS) transistor having a third terminal coupling to the second latch node, a fourth terminal coupling to a second point of said each of the plurality of memory cells, and a second gate terminal coupling to the first word line, wherein the second N-type metal-oxide-semiconductor (MOS) transistor is configured for controlling coupling between the second latch node and the second point of said each of the plurality of memory cells, wherein a first voltage level at the first point of said each of the plurality of memory cells is reversed to a second voltage level at the second point of said each of the plurality of memory cells, and a P-type metal-oxide-semiconductor (MOS) transistor having a fifth terminal coupling to the first latch node, a sixth terminal coupling to a third point of said each of the plurality of memory cells, and a third gate terminal coupling to a second word line of the plurality of second word lines, wherein the P-type metal-oxide-semiconductor (MOS) transistor is configured for controlling coupling between the first latch node and the third point of said each of the plurality of memory cells, wherein a third voltage level at the third point of said each of the plurality of memory cells is the same as the first voltage level;

a first row decoder coupling to the plurality of first word lines, wherein the first row decoder is configured for switching on the first and second N-type metal-oxide-semiconductor (MOS) transistors of said each of the plurality of memory cells arranged in one of the multiple rows of the array in accordance with first data at the first word line; and a first column decoder coupling to the plurality of first bit lines and the plurality of bit-bar lines, wherein the first column decoder is configured for writing second data into said each of the plurality of memory cells to be stored therein through the first bit line and bit-bar line.

18. The semiconductor integrated-circuit (IC) chip of claim 17, wherein the P-type metal-oxide-semiconductor (MOS) transistor is a fin field-effect transistor (finFET).

19. The semiconductor integrated-circuit (IC) chip of claim 17, wherein the P-type metal-oxide-semiconductor (MOS) transistor is a gate-all-around (GAA) field-effect transistor (FET).

20. The semiconductor integrated-circuit (IC) chip of claim 17, wherein a voltage of power supply applied to said each of the plurality of memory cells is less than 0.5 volts.

21. The semiconductor integrated-circuit (IC) chip of claim 17 is a field-programmable-gate-array (FPGA) integrated-circuit (IC) chip.

* * * * *